US006094370A

United States Patent [19]
Takashima

[11] Patent Number: 6,094,370
[45] Date of Patent: Jul. 25, 2000

[54] SEMICONDUCTOR MEMORY DEVICE AND VARIOUS SYSTEMS MOUNTING THEM

[75] Inventor: Daisaburo Takashima, Yokohama, Japan

[73] Assignee: Kabushiki Kaisha Toshiba, Kawasaki, Japan

[21] Appl. No.: 09/208,831

[22] Filed: Dec. 10, 1998

Related U.S. Application Data

[63] Continuation-in-part of application No. 08/872,874, Jun. 10, 1997, Pat. No. 5,903,492.

[30] Foreign Application Priority Data

| | | | |
|---|---|---|---|
| Jun. 10, 1996 | [JP] | Japan | 8-147452 |
| Jan. 8, 1997 | [JP] | Japan | 9-001115 |
| May 28, 1997 | [JP] | Japan | 9-153137 |
| Dec. 16, 1997 | [JP] | Japan | 9-346404 |

[51] Int. Cl.[7] .......... G11C 11/22
[52] U.S. Cl. .......... 365/145; 365/149
[58] Field of Search .......... 365/145, 149

[56] References Cited

U.S. PATENT DOCUMENTS

| | | | |
|---|---|---|---|
| 5,029,128 | 7/1991 | Toda | 365/145 |
| 5,303,182 | 4/1994 | Nakao et al. | 365/145 |
| 5,307,304 | 4/1994 | Saito et al. | 365/145 |
| 5,345,415 | 9/1994 | Nakao et al. | 365/145 |
| 5,373,463 | 12/1994 | Jones, Jr. | 365/145 |
| 5,383,150 | 1/1995 | Nakamura et al. | 365/145 |
| 5,592,646 | 1/1997 | Thomas | 365/145 |

*Primary Examiner*—Trong Phan
*Attorney, Agent, or Firm*—Oblon, Spivak, McClelland, Maier & Neustadt, P.C.

[57] ABSTRACT

A semiconductor memory device comprises a plurality of memory cells each having a source terminal and a drain terminal and a ferroelectric capacitor having a first terminal connected to the source terminal, wherein the plurality of memory cells are connected in series, and one or more selected transistors connected to at least one terminal of the series connected memory cells to constitute a memory cell block, the memory cell block having one terminal connected to a bitline and another terminal connected to a plate electrode, and wherein two memory cell blocks, which are respectively connected to two bit lines forming a bit line pair and also connected to the same word line, are respectively connected to a first plate electrode and a second plate electrode.

15 Claims, 218 Drawing Sheets

DIGITAL IMAGE INPUT DEVICE

| | CHIP SIZE (COST) | | | TRANSISTOR STRUCTURE (EASE FOR PROCESS) | READ/WRITE METHOD (FLEXIBILITY) | NOISE (RELIABILITY) | (NO-) NONVOLATILE (PORTABILITY) |
|---|---|---|---|---|---|---|---|
| | CELL SIZE | BL CAPACITY | CHIP SIZE (BL CAPACITY = CONSTANT) | | | | |
| CONVENTIONAL $4F^2$ CELL | ◎ $4F^2$ | △ LARGE (256WL/BL) | △ 75~90% | × STACK Tr TFT | ◎ RANDOM ACCESS | ◎ SMALL (2-LAYER FOLDED BL) | USABLE NONVOLATILE CELL |
| CONVENTIONAL NAND CELL | ◎ $4.5\sim5F^2$ (4~2NAND) | ○ MIDDLE (512WL/BL) | ○ 71~74% | ◎ PLANER Tr | × BLOCK ACCESS | ◎ SMALL (FOLDED BL BY ADDING BS) | USABLE NONVOLATILE CELL |
| PRESENT INVENTION | ◎ $4.5\sim5F^2$ | ◎ SMALL (1024WL/BL) | ◎ 62.5~64% | ◎ PLANER Tr | ◎ RANDOM ACCESS | ◎ SMALL | NONVOLATILE CELL |
| CONVENTIONAL $8F^2$ CELL | × $8F^2$ | ○ MIDDLE (512WL/BL) | × 100% | ◎ PLANER Tr | ◎ RANDOM ACCESS | ◎ SMALL (FOLDED BL) | USABLE NONVOLATILE CELL |

CONDITION IN 100% CHIP (MEMORY CELL 60%, SA 20%, PERIPHERAL CIRCUIT 20%)

NOTE) BL IS MADE TO DOUBLE LAYERED COST INCREASES 7%

NOTE) NESTING≦4

FIG. 37

| | | PLATE ELECTRODE DRIVING (SPEED, POWER) | REFRESH OPERATION (POWER, BUSY RATE) |
|---|---|---|---|
| CONVENTIONAL FRAM | CASE 1 | EXIST × | UNNECESSARY ◎ |
| | CASE 2 | $\frac{1}{2} V_{CC}$ FIXED ◎ | NECESSARY × |
| PRESENT INVENTION | | $\frac{1}{2} V_{CC}$ FIXED ◎ | UNNECESSARY ◎ |

FIG. 38

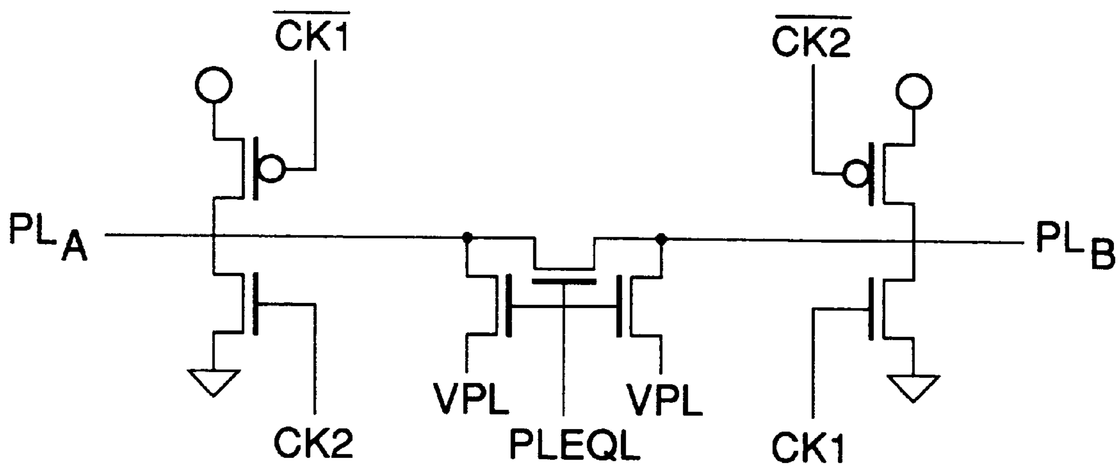
FIG. 120A
FIG. 120B
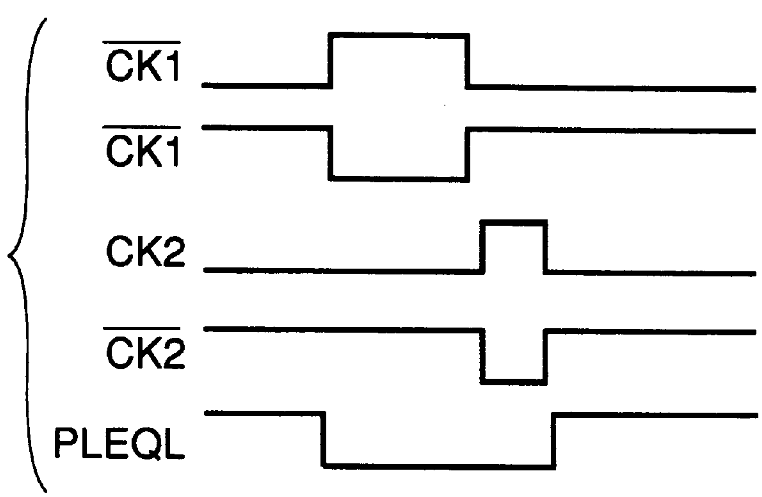

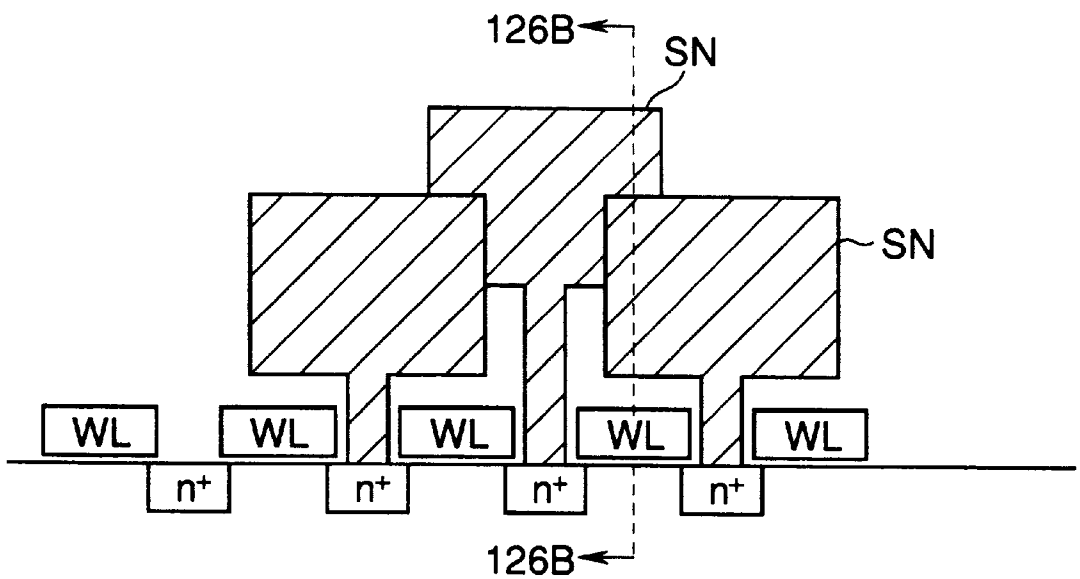
FIG. 127A
FIG. 127B
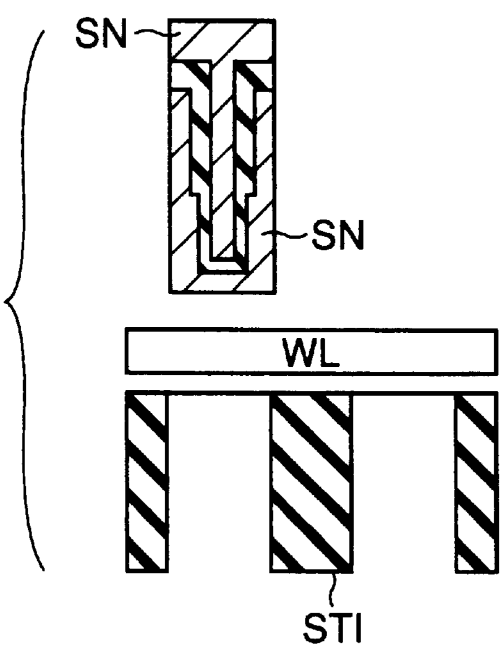

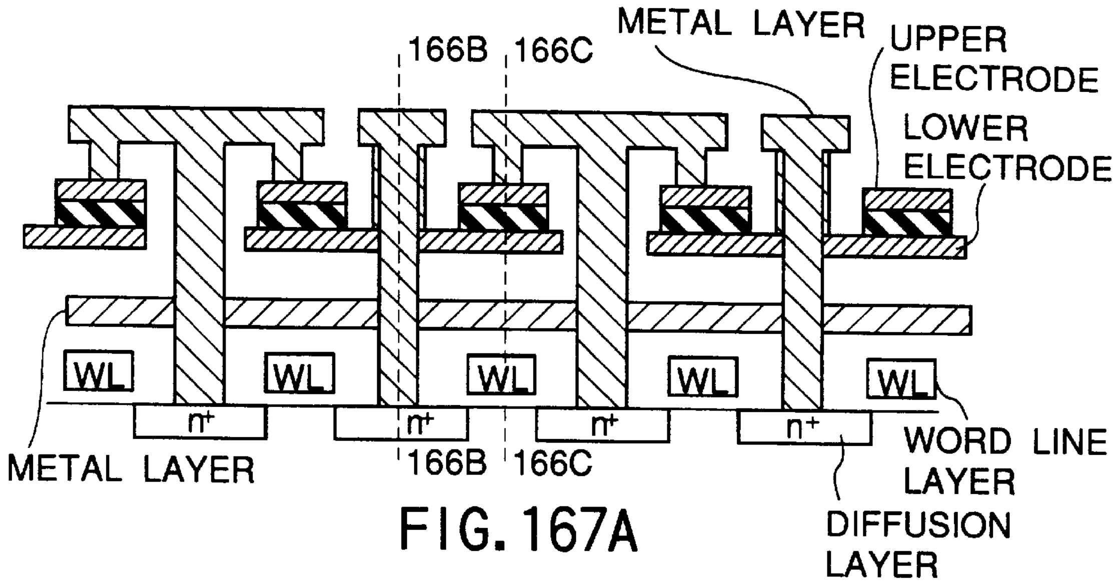
FIG. 167A
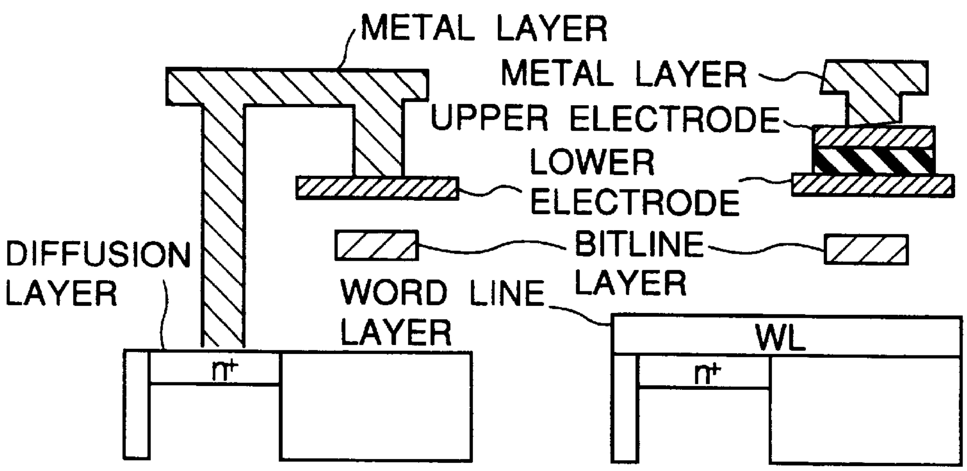
FIG. 167B
FIG. 167C
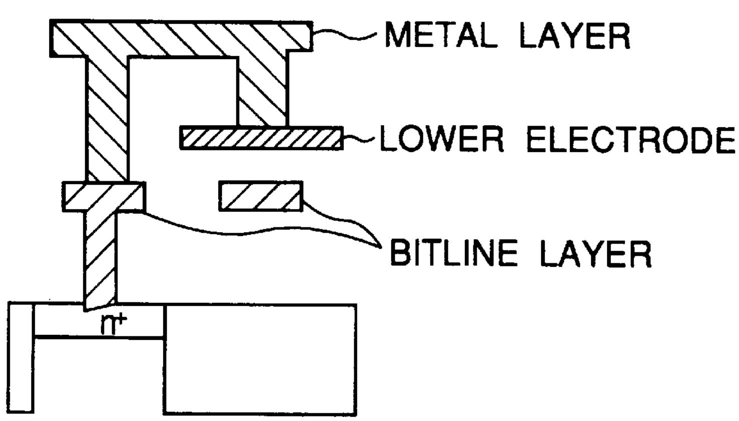
FIG. 167D

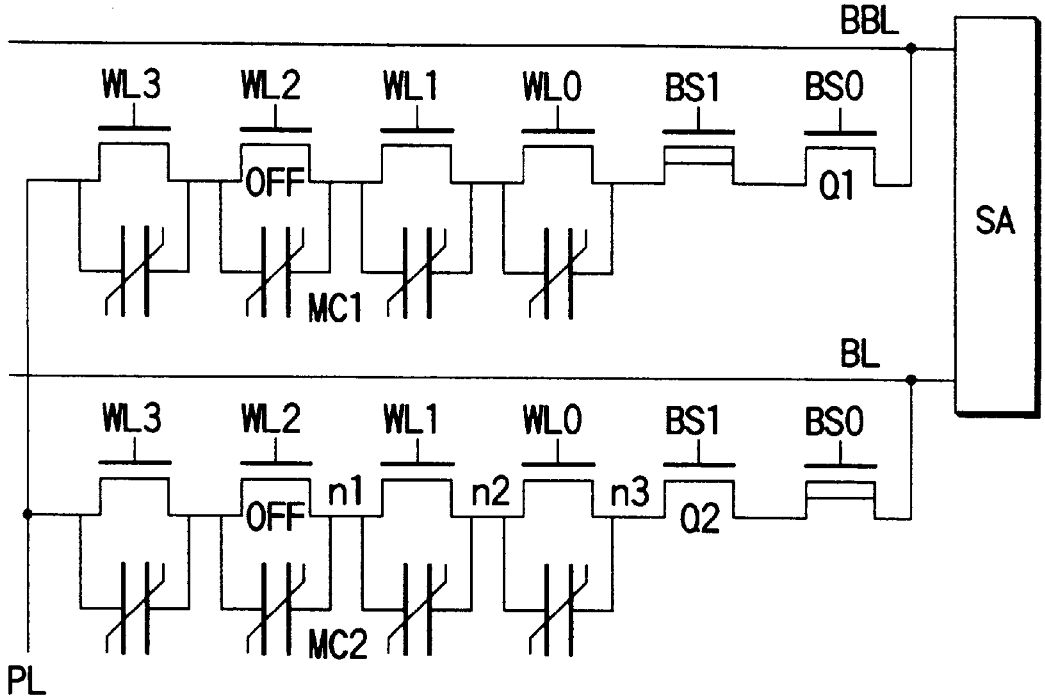
FIG. 171A
FIG. 171B
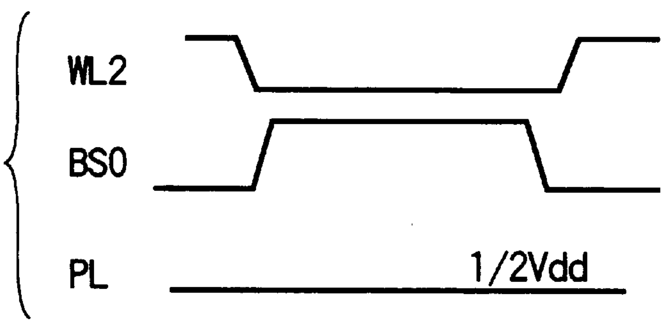
FIG. 171C
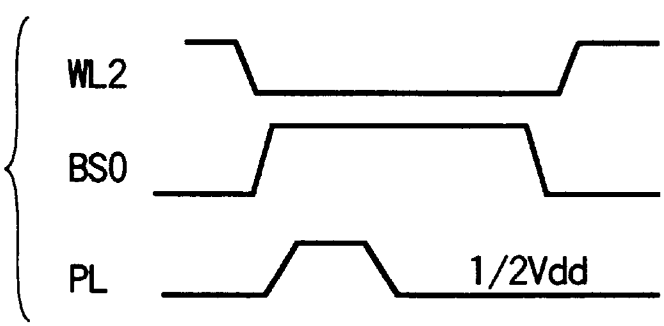

THCKNESS OF Cb>THCKNESS OF Ca

SEMICONDUCTOR MEMORY DEVICE AND VARIOUS SYSTEMS MOUNTING THEM

CROSS-REFERENCE TO RELATED APPLICATIONS

This application is a continuation-in-part of U.S. application Ser. No. 08/872,874 filed Jun. 10, 1997, U.S. Pat. No. 5,903,492, issued May 11, 1999.

BACKGROUND OF THE INVENTION

The present invention relates to a semiconductor memory device, especially, to a nonvolatile semiconductor memory device using a ferroelectric capacitor, a method of driving the same, and various systems each having the semiconductor memory device.

In recent years, a nonvolatile memory (FRAM) using a ferroelectric capacitor has received a great deal of attention as one of semiconductor memories. Since the FRAM is advantageous in that it is nonvolatile, the number of times of rewrite access is $10^{12}$, the read/write time almost equals that of a DRAM, and it can operate at a low voltage of 3 to 5V, the FRAMs may replace all memory markets. At present, in the Society, 1M bit FRAMs have been reported (H. Koike et al., 1996, IEEE International Solid-State Circuit Conference Digest of Technical Paper, pp. 368–369, February, 1996).

Along with developments, the cell size of the FRAM has been reduced by simplifying and micropatterning the cell structure, as in development of DRAMs, from the SRAM+Shadow Memory structure as initially developed to a 2-transistor/2-capacitor structure. FIG. 1A shows the memory cell of a conventional DRAM having a 1-transistor/1-capacitor structure. FIG. 1B shows the memory cell of a conventional FRAM having a 1-transistor/1-capacitor structure. Reference symbol WL denotes a word line; BL, a bit line; SN, a storage node; and PL, a plate electrode. Clearly, the memory cell of the conventional FRAM having a 1-transistor/1-capacitor structure is now the same as the DRAM having a 1-transistor/1-capacitor structure having a transistor and a capacitor that are series connected.

The FRAM memory cell basically has the same structure as that of the DRAM. The FRAM is different from the DRAM in the following two points. (1) Although the DRAM uses a dielectric without any spontaneous dielectric polarization as a capacitor, the FRAM uses a ferroelectric capacitor. (2) In the DRAM, the plate electrode at one terminal of the capacitor is fixed at (½)Vcc. However, in the FRAM, the plate electrode potential is changed within the range of 0V to Vcc.

For (2), however, the scheme of changing the plate electrode potential is being replaced with a scheme of fixing the plate electrode at (½)Vcc.

Therefore, the FRAM equals the DRAM except for (1). The FRAM also has the same cell array structure as that of the DRAM. The FRAM has a folded bit line (BL) structure as shown in FIG. 1C. The minimum cell size at this time is represented as follows:

$$2F\times 4F=8F^2$$

In FIG. 1C, reference symbol MC denotes a memory cell; SA, a sense amplifier; and F, a minimum processing size. $\overline{BL}$ and BL in FIG. 1C denote a bit line pair.

The principle of the operation of the FRAM will be briefly described with reference to FIG. 2A and FIG. 2B.

In the DRAM, the cell transistor is turned on, and Vcc or a voltage of 0V is applied to the cell capacitor to write charges, thereby storing store data “0” or “1”. In reading, the cell transistor is turned on to read out the charges. In the DRAM, the accumulated charges (polarization value [C]) are proportional to the voltage applied across the cell capacitor, as shown in FIG. 2A. For this reason, when the applied voltage becomes 0V due to a leakage current at the p-n junction of the cell transistor or the like, the polarization value also becomes 0 C, and the information is destroyed.

In the FRAM, however, the polarization characteristics have a hysteresis. A case wherein, after power-ON, the plate (PL) voltage is 0V, the storage node (SN) potential is 0V, and data “0” has been written in the cell will be considered. Since the plate electrode potential is 0V, and the storage node potential is 0V, the voltage applied to the ferroelectric capacitor is 0V, and the polarization value is at a position D of the remnant polarization (=−Pr) in FIG. 2B. When the memory cell data is to be read out, the bit line (BL) potential is precharged to 0V, the cell transistor is turned on, and the plate electrode voltage is raised to Vcc. Since the bit line capacity is larger than the storage node capacity, a voltage −Vcc is applied between the bit line and the plate electrode. The polarization value changes from the point D to a point C, so that a potential corresponding to the small saturation polarization difference Ps−Pr is read out to the bit line.

When data “1” has been written in the cell, the voltage −Vcc is applied between the bit line and the plate electrode, as in the above-described case. Accordingly, polarization inversion from a point B to the point C occurs, and charges in a large amount corresponding to Ps+Pr are read out to the bit line.

The reference bit line potential is raised to the potential at which charges corresponding to Ps are read out. In reading the data “1”, a potential difference corresponding to (Ps+Pr)−(Ps)=Pr is generated between the reference bit line and the bit line. In reading the data “0”, a potential difference corresponding to (Ps−Pr)−(Ps)=−Pr is generated between the reference bit line and the bit line. This result (potential difference) is amplified by the sense amplifier. The readout result is amplified by the sense amplifier. For the data “1”, the bit line is set at Vcc. For the data “0”, the bit line is set at 0V.

To rewrite the memory cell data, the plate electrode voltage is lowered to 0V again. At this time, the data “0” returns from the point C to the point D at BL−PL=0V, and the data “1” returns from the point C to the point D and then polarization-inverted to a point A at BL−PL=Vcc. Thereafter, the cell transistor is turned off. The data “1” moves from the point A to the point B when the storage node potential lowers to 0V due to the leakage current and stops at the point B. FIG. 3A shows the series of operations.

The largest difference between the operation of the FRAM and that of the DRAM is as follows. In the FRAM, no data is read out only by turning on the cell transistor and short-circuiting the bit line BL and the storage node SN. No charges are removed unless the direction of polarization is reversed to that for writing the charges between the bit line BL (storage node SN) and the plate electrode PL. Accordingly, a plate electrode operation with a large load capacity is required, and read/write access takes a long time. This is the disadvantage of the FRAM.

To solve this problem, the scheme of fixing the plate electrode potential at (½)Vcc is proposed, as described above. FIG. 3B and FIG. 3C show the operations of these schema. In recall after power-ON (on the left side of FIG. 3B and FIG. 3C), the plate electrode PL is precharged to (½)Vcc, and the bit line BL is precharged to 0V. The word line WL is selected to turn on the cell transistor. At this time, a voltage of –(½)Vcc is applied between the bit line BL and the plate electrode PL. As shown in FIG. 2B, the data "1" is polarization-inverted from the point B to the point C, the data "0" moves from the point D to the point C without polarization inversion, and the accumulated charges are read out to the bit line BL. The information "0" or "1" is read out depending on the presence/absence of polarization inversion. The readout result is amplified by the sense amplifier. For the data "1", the bit line BL is set at Vcc. For the data "0", the bit line BL is set at Vss. A voltage of (½)Vcc=BL–PL or a voltage of (–½)Vcc=BL–PL is applied to the cells. The data "1" moves from the point C to the point A, the data "0" stays at the point C, and the data is written.

The scheme shown in FIG. 3B slightly differs from that shown in FIG. 3C in the subsequent operation. In FIG. 3B, after the bit line BL is equalized to (½)Vcc (more specifically, the data "1" moves from the point A to the point B, and the data "0" moves from the point C to the point D), the word line WL is closed to return the bit line potential to 0V. Even when the bit line BL is equalized, the data stays at the point B or D, so the data is not destroyed. This operation reversely exploits the characteristics of the ferroelectric capacitor. In FIG. 3C, after the word line WL is closed, the bit line BL is equalized to (½)Vcc (more specifically, the data "1" stays at the point A, and the data "0" stays at the point C). For reading after recall, the charge difference (Ps–Pr) between the point A and the point B or between the point C and the point D is used, as in the DRAM (the degradation in the amount of the remnant polarization Pr due to the fatigue caused by polarization inversion in reading is suppressed).

The scheme shown in FIG. 3B or 3C is more advantageous than that shown in FIG. 3A in that the operation speed in access time or cycle time does not degrade unlike the scheme of changing the plate electrode potential, so that a high-speed operation is enabled. On the other hand, the scheme shown in FIG. 3B or 3C is more disadvantageous than that shown in FIG. 3A in that the voltage (coercive voltage Vc) necessary for polarization inversion must be (½)Vcc or less (this problem is solved by reducing the size of the ferroelectric film). Additionally, the FRAM has a large disadvantage in that a refresh operation is required, like the DRAM (the refresh operation increases the stand-by current or generates a busy rate).

In the scheme shown in FIG. 3B, the storage node SN of the cell is at (½)Vcc in the stand-by state. When the storage node potential becomes lower than (½)Vcc due to the leakage current at the p-n junction or the like, the data "1" moves from the point B to the point C, and the data is destroyed. Accordingly, the refresh operation must be performed to select the word line WL and write the potential of (½)Vcc in the storage node SN every a predetermined period in the stand-by state, as shown on the right side of FIG. 3B.

In the scheme shown in FIG. 3C, the storage node SN is set at Vcc or 0V in the stand-by state. When the storage node potential becomes lower than Vcc due to the leakage current at the p-n junction or the like, the data "1" moves from the point A to the point B, and then to the point C, and the data is destroyed. In this case, since the normal operation is the same as that of the DRAM, the data is destroyed upon moving to the point B. Accordingly, the refresh operation must be performed to select the word line WL and read/sense/rewrite the data every predetermined period in the stand-by state, like the DRAM, as shown on the right side of FIG. 3C.

In the scheme for driving the plate electrode between 0V and Vdd, a lot of memory cells are connected to the plate electrode, causing a large load capacity and a very long driving time; therefore, as compared with the conventional DRAM, the operations become slow in both access time and cycle time. The scheme for fixing the plate to (½)Vdd makes it possible to realize the same access time and cycle time as the DRAM since it does not need to drive the plate having a large load capacity.

However, as shown in FIG. 1B, the conventional memory cell of the FRAM has a structure in which a transistor and a ferroelectric capacitor are series connected in the same manner as the DRAM; therefore, the storage node (SN) becomes a floating state at stand-by after power has been applied. Consequently, when "1" data is maintained in the SN, the SN drops to Vss due to the junction leakage at the p-n junction, with the result that cell information is destroyed in the case of the plate electrode fixed to (½)Vdd. Therefore, in the (½)Vdd cell plate scheme, the refresh operation is required, resulting in the problem of power increase and the difficulty in production due to severe cell specifications.

As described above, the first problem with the conventional FRAM is that it is difficult to simultaneously achieve high-speed operations (PL potential fixed) and the omission of the refresh.

For the conventional DRAMs, various cells are developed to realize a cell size smaller than $8F^2$. A stacked-type transistor or stacked-type TFT (Thin Film Transistor) is used to realize a size of $4F^2$, or cell transistors are connected in series, and capacitors are connected between the cell transistors and the plate electrode PL, thereby realizing a size of about $4F^2$ (NAND cell).

Since the equivalent circuit of the FRAM is basically the same as that of the DRAM, an FRAM having a size of $4F^2$ can be realized with the same cell structure as that of the DRAM. The FRAM also has the same problems as those of the DRAM. The stacked-type transistor or stacked-type TFT can hardly be realized because the manufacturing process is more complex than that for a conventional planar transistor having a size of $8F^2$, which can be easily manufactured. In the FRAM, these cells are basically realized as trench cells in which a transistor is formed after the ferroelectric capacitor process. Therefore, the permittivity of the ferroelectric capacitor decreases due to the heat process in the transistor manufacturing process.

The NAND cell can be manufactured using a planar transistor and can have a stack cell structure in which the capacitor is formed after the transistor process. In the NAND cell, however, cell data must be sequentially read out from cells closer to the bit line BL or must be sequentially written in cells farther from the bit line BL. This degrades the random access properties as an important point of a general-purpose memory and allows only block read/write access.

As described above, in the conventional FRAM, when a memory cell having a size of $4F^2$ smaller than $8F^2$ is to be realized, the process becomes complex for, e.g., the stacked-type transistor, or the random access properties of a general-purpose memory degrade for, e.g., a NAND cell. Additionally, the conventional FRAM cannot simultaneously realize the high-speed operation of the scheme of fixing the plate electrode potential and omission of the refresh operation.

Consequently, the second problem with the conventional FRAM cell is that it is impossible to simultaneously achieve the following three points: (1) memory cells having a small size of $4F^2$, (2) planar transistors that are easily manufactured and (3) general-purpose random access function.

Furthermore, in the conventional FRAM, the following problem is also encountered. FIG. 4A shows a stand-by state of a conventional FRAM, FIG. 4B shows an operation of the PL driving scheme, and FIG. 4D shows a locus on a hysteresis curve upon read-out. In the conventional read-out scheme, assuming that the amount of saturation polarization is Ps and the amount of remnant polarization is Pr, "1" data is represented by Ps+Pr, and "0" data is represented by Ps−Pr as shown in FIG. 4D, and the difference represents the amount of signal (half in the case of 1T/1C). However, the ferroelectric capacitor has great dispersion in its paraelectric component due to dispersion in manufacturing processes, etc.; and this degrades the read-out margin to a great degree. For example, in "1" data, Ps−Pr component within Ps+Pr is a paraelectric component, and in "0" data, the entire signal forms a paraelectric component. In particular, in ferroelectric materials such as PZT, since the dielectric constant itself has a great value, causing a great absolute value in dispersion.

FIG. 4C shows a conventional scheme for solving this problem. Upon read-out, PL is raised from Vss to Vdd, and is lowered from Vdd to Vss, and then the sense amplifier is operated so as to amplify the signal. The locus on the hysteresis curve at the time of this read-out operation is shown in FIG. 4E. "1" data (point (2)) is once polarity-inverted, and comes to point (1); however, it comes to point (3) by reducing PL. Thus, "1" has its paraelectric component cut during the going and returning processes so that only the remnant polarization component: 2Pr is read out to the bit line as a signal. Sine "0" data only goes to point (1) from point (3), and then returns to point (3), no signal is read out. Consequently, only polarization component 2Pr, which is free from the paraelectric component with high dispersion, is used as a signal, thereby making it possible to eliminate noise.

However, in this scheme, as shown in FIG. 4C, PL is again raised, and then PL is lowered in order to rewrite data; consequently, PL has to be raised and lowered twice, with the result that read/write access and cycle take a very long time as compared with the case shown in FIG. 4B.

As described above, in the conventional FRAM, the first problem is that it is difficult to achieve both of the high-speed operation (PL potential fixed) and the omission of the refresh operation, and the second problem is that it is impossible to simultaneously achieve the following three points: memory cells having a small size of $4F^2$, planar transistors that are easily manufactured and general-purpose random access function. Moreover, when an attempt is made to suppress dispersion in the paraelectric component of a ferroelectric capacitor, the operation tends to become slow.

Various systems having semiconductor memories have examined replacement of the conventional DRAM with the FRAM. However, such examinations have not reached a practical level yet because of the above-described problems unique to the FRAM.

BRIEF SUMMARY OF THE INVENTION

It is an object of the present invention to provide a semiconductor memory device which can realize a memory cell having a size (e.g., $4F^2$) smaller than $8F^2$ without using any stacked-type transistor or the like and also maintain a random access function.

It is another object of the present invention to provide a semiconductor memory device which can simultaneously realize a high-speed operation by fixing the plate potential and the omission of a refresh operation.

It is still another object of the present invention to provide various systems which can improve the system performance by mounting the semiconductor memory device.

It is another object of the present invention to provide a semiconductor memory device which can suppress dispersion in the paraelectric component of a ferroelectric capacitor without causing a reduction in the operation speed.

To solve the above problems, the present invention employs the following arrangements.

(1) A computer system comprises: a microprocessor for performing various arithmetic processing operations; an input/output device connected to the microprocessor to send/receive data to/from an external device; and a semiconductor memory device connected to the microprocessor to store data, wherein the semiconductor memory device includes a plurality of memory cells each having a transistor having a source terminal and a drain terminal and a ferroelectric capacitor having a first terminal connected to the source terminal and a second terminal connected to the drain terminal, a predetermined number of memory cells are connected in series, and a select transistor is connected to at least one terminal of the series connected portion to constitute a memory cell block, and a plurality of memory cell blocks are arranged to constitute a cell array.

(1-1) The computer system includes a controller for the semiconductor memory device.

(2-1) The computer system includes a volatile RAM.

(1-3) The computer system includes a ROM.

(2) An IC card comprises an IC chip having a semiconductor memory device, wherein the semiconductor memory device includes a plurality of memory cells each having a transistor having a source terminal and a drain terminal and a ferroelectric capacitor having a first terminal connected to the source terminal and a second terminal connected to the drain terminal, a predetermined number of memory cells are connected in series, and a select transistor is connected to at least one terminal of the series connected portion to constitute a memory cell block, and a plurality of memory cell blocks are arranged to constitute a cell array.

(3) A digital image input system comprises: an image input device for inputting image data; a data compression device for compressing the input image data; a semiconductor memory device for storing the compressed image data; an output device for outputting the compressed image data; and a display device for displaying one of the input image data and the compressed image data, wherein the semiconductor memory device includes a plurality of memory cells each having a transistor having a source terminal and a drain terminal and a ferroelectric capacitor having a first terminal connected to the source terminal and a second terminal connected to the drain terminal, a predetermined number of memory cells are connected in series, and a select transistor is connected to at least one terminal of the series connected portion to constitute a memory cell block, and a plurality of memory cell blocks are arranged to constitute a cell array.

(3-1) The digital image input system has a function as a digital camera.

(3-2) The digital image input system has a function as a digital video camera.

(4) A memory system comprises: a semiconductor memory device for storing data; and an input/output device connected to the semiconductor memory device to send/receive data to/from an external device, wherein the semiconductor memory device includes a plurality of memory cells each having a transistor having a source terminal and a drain terminal and a ferroelectric capacitor having a first terminal connected to the source terminal and a second terminal connected to the drain terminal, a predetermined number of memory cells are connected in series, and a select transistor is connected to at least one terminal of the series connected portion to constitute a memory cell block, and a plurality of memory cell blocks are arranged to constitute a cell array.

(4-1) The memory system includes a controller for controlling the semiconductor memory device.

(4-2) Memory information includes images such as cinema, music and instruction, and game software, OA software, OS software, dictionaries, and map information.

(5) A system LSI chip comprises: a core section for performing various processing operations; and a semiconductor memory device for storing data, wherein the semiconductor memory device includes a plurality of memory cells each having a transistor having a source terminal and a drain terminal and a ferroelectric capacitor having a first terminal connected to the source terminal and a second terminal connected to the drain terminal, a predetermined number of memory cells are connected in series, and a select transistor is connected to at least one terminal of the series connected portion to constitute a memory cell block, and a plurality of memory cell blocks are arranged to constitute a cell array.

(5-1) The core section is an MPU.

(5-2) According to (5-1), the semiconductor memory device is used as a micro-code memory.

(5-3) According to (5-1), the semiconductor memory device is used as an instruction cache memory.

(5-4) According to (5-1), the semiconductor memory device is used as a data cache memory.

(5-5) According to (5-1), the semiconductor memory device is used as a data memory.

(5-6) The core section is an image processing section for performing image processing.

(5-7) According to (5-6), the semiconductor memory device is used as an image data memory.

(5-8) The core section is a logic section for performing various logic calculations.

(5-9) The LSI chip is a logic variable LSI chip.

(5-10) According to (5-9), the semiconductor memory device is used as a logic synthesis information memory.

(5-11) According to (5-9), the semiconductor memory device is used as a logic connection information storage memory.

(5-12) According to (5-9), the semiconductor memory device is used as an interconnection information storage memory.

(6) A mobile computer system comprises: a microprocessor for performing various arithmetic processing operations; an input device connected to the microprocessor to input data; a radio wave sending/receiving device connected to the microprocessor to send/receive data to/from an external device; an antenna connected to the sending/receiving device; a display device connected to the microprocessor to display necessary information; and a semiconductor memory device connected to the microprocessor to store data, wherein the semiconductor memory device includes a plurality of memory cells each having a transistor having a source terminal and a drain terminal and a ferroelectric capacitor having a first terminal connected to the source terminal and a second terminal connected to the drain terminal, a predetermined number of memory cells are connected in series, and a select transistor is connected to at least one terminal of the series connected portion to constitute a memory cell block, and a plurality of memory cell blocks are arranged to constitute a cell array.

(6-1) The mobile computer system has a function as a mobile phone.

(6-2) The mobile computer system has a function as a mobile TV phone.

(6-3) The mobile computer system has a function as a mobile TV and a mobile video.

(6-4) The mobile computer system has a function as a mobile computer display.

(7) A semiconductor memory device comprises: a plurality of memory cells each having a transistor having a source terminal and a drain terminal and a ferroelectric capacitor having a first terminal connected to the source terminal and a second terminal connected to the drain terminal, wherein the plurality of memory cells are arranged to constitute a cell array.

(8) A semiconductor memory device comprises: a plurality of memory cells each having a transistor having a source terminal and a drain terminal and a ferroelectric capacitor having a first terminal connected to the source terminal and a second terminal connected to the drain terminal, wherein the plurality of memory cells are connected in series to constitute a memory cell block, and a plurality of memory cell blocks are arranged to constitute a cell array.

(9) According to (8), the memory cell block includes a select transistor connected to at least one terminal of the plurality of series connected memory cells.

(9-1) The two terminals of the memory block are connected to adjacent bit lines, respectively.

(9-2) According to (9-1), the adjacent bit lines constitute a bit line pair and are connected to a sense amplifier.

(9-3) According to (9-1) and (9-2), the select transistor is constituted by a plurality of select transistors connected in series.

(10) A semiconductor memory device comprises: a plurality of memory cells each having a transistor having a source terminal and a drain terminal and a ferroelectric capacitor having a first terminal connected to the source terminal and a second terminal connected to the drain terminal, wherein the plurality of memory cells are connected in series, and a select transistor is connected to at least one terminal of the series connected portion to constitute a memory cell block, one terminal of the memory cell block is connected to a bit line, and the other terminal is connected to a plate electrode.

(10-1) An open bit line structure is formed by a bit line pair of adjacent cell arrays.

(10-2) One-bit information is stored in two memory cells connected to two bit lines of the same cell array, and a folded bit line structure is formed by a bit line pair.

(10-3) In the stand-by state after power-ON, all the plurality of transistors in the memory block are in ON state, and the select transistor is in OFF state.

(10-4) In selecting an arbitrary memory cell in the memory block, the select transistor is turned on while turning off the transistor of the selected cell, and keeping the transistors of the remaining cells ON.

(10-5) The plate electrode potential is fixed at (½)Vcc or a constant voltage after power-ON in both the stand-by state and active state. In addition, no cell data refresh operation is performed.

(10-6) The plate electrode potential is set at 0V in the stand-by state after power-ON and changed within the range of 0V and Vcc in reading/writing data from/into selecting a cell.

(10-7) The bit line is precharged to 0V before cell data is read out.

(10-8) The bit line is precharged to Vcc before cell data is read out.

(10-9) The dummy cell has the same circuit structure as that of the memory cell in the memory block.

(10-10) The capacitor area of the dummy cell is 1.5 to 3 times larger than that of a normal cell.

(10-11) The dummy cell uses a paraelectric capacitor.

(10-12) The ferroelectric capacitor of each memory cell is constituted by connecting a plurality of ferroelectric capacitors in parallel.

(10-13) The ferroelectric capacitor of each memory cell is constituted by connecting a plurality of ferroelectric capacitors having different thicknesses in parallel.

(10-14) The ferroelectric capacitor of each memory cell is constituted by connecting a plurality of ferroelectric capacitors having different coercive voltages in parallel.

(10-15) The ferroelectric capacitor of each memory cell is constituted by connecting a plurality of ferroelectric capacitors and at least one capacitor and p-n junction voltage drop element.

(10-16) The ferroelectric capacitor of each memory cell is constituted by connecting a plurality of ferroelectric capacitors and at least one resistance element.

(10-17) The ferroelectric capacitor of each memory cell is constituted by connecting a first ferroelectric capacitor and a resistance element in series, and connecting a second ferroelectric capacitor to the series connected elements in parallel.

(10-18) According to (10-12) to (10-17), each of the plurality of ferroelectric capacitors of each memory cell stores 1-bit information.

(10-19) According to (10-14) and (10-15), each of the plurality of ferroelectric capacitors of each memory cell stores 1-bit information, and 1-bit data is read out from or written in each of the plurality of ferroelectric capacitors by changing the voltage to be applied to the ferroelectric capacitor.

(10-20) According to (10-14) and (10-15), each of the plurality of ferroelectric capacitors of each memory cell stores 1-bit information. In reading, a low voltage is applied to the ferroelectric capacitor to read out polarization charges of one of the plurality of ferroelectric capacitors, and the readout information is stored outside the cell array. Next, the applied voltage is raised to read out polarization charges of one of the remaining ferroelectric capacitors. In writing, the voltage is sequentially lowered and applied to the ferroelectric capacitors in an opposite order to that in reading, thereby performing writing.

(10-21) According to (10-12) to (10-17), the sense amplifier has a temporary storage memory.

(10-22) According to (10-13), the difference in thickness among the ferroelectric capacitors is preferably 3 or more times.

(10-23) According to (10-14), the difference in coercive voltage among the ferroelectric capacitors is preferably 3 or more times.

(11) According to (10), wherein the select transistors includes first and second select transistors connected in series.

(11-1) An open bit line structure is formed by a bit line pair of adjacent cell arrays.

(11-2) A bit line pair of the same cell array are used to turn on only the first and second select transistors connected to one of the two bit lines in reading/writing cell data, thereby forming a folded bit line structure.

(11-3) In the stand-by state after power-ON, all the plurality of transistors in the memory blocks are ON, and one of the first and second select transistors is OFF.

(11-4) In selecting an arbitrary memory cell in the memory block, both the first and second select transistor are turned on while turning off the transistor of the selected cell, and keeping the transistors of the remaining cells ON.

(11-5) The plate electrode potential is fixed at (½)Vcc or a constant voltage after power-ON in both the stand-by state and active state. In addition, no cell data refresh operation is performed.

(11-6) The plate electrode potential is set at 0V in the stand-by state after power-ON and changed within the range of 0V and Vcc in reading/writing data in selecting a cell.

(11-7) The bit line is precharged to 0V before cell data is read out.

(11-8) The bit line is precharged to Vcc before cell data is read out.

(11-9) The dummy cell has the same circuit structure as that of the memory cell in the memory block.

(11-10) The capacitor area of the dummy cell is 1.5 to 3 times larger than that of a normal cell.

(11-11) The dummy cell uses a paraelectric capacitor.

(11-12) The ferroelectric capacitor of each memory cell is constituted by connecting a plurality of ferroelectric capacitors in parallel.

(11-13) The ferroelectric capacitor of each memory cell is constituted by connecting a plurality of ferroelectric capacitors having different thicknesses in parallel.

(11-14) The ferroelectric capacitor of each memory cell is constituted by connecting a plurality of ferroelectric capacitors having different coercive voltages in parallel.

(11-15) The ferroelectric capacitor of each memory cell is constituted by connecting a plurality of ferroelectric capacitors and at least one voltage drop element.

(11-16) The ferroelectric capacitor of each memory cell is constituted by connecting a plurality of ferroelectric capacitors and at least one resistance element.

(11-17) The ferroelectric capacitor of each memory cell is constituted by connecting a first ferroelectric capacitor and a resistance element in series, and connecting a second ferroelectric capacitor to the series connected elements in parallel.

(11-18) According to (11-12) to (11-17), each of the plurality of ferroelectric capacitors of each memory cell stores 1-bit information.

(11-19) According to (11-12) to (11-15), each of the plurality of ferroelectric capacitors of each memory cell stores 1-bit information, and 1-bit data is read out from or written in each of the plurality of 5 ferroelectric capacitors by changing the voltage to be applied to the ferroelectric capacitor.

(11-20) According to (11-13) and (11-14), each of the plurality of ferroelectric capacitors of each memory cell stores 1-bit information. In reading, a low voltage is applied to the ferroelectric capacitor to read out polarization charges of one of the plurality of ferroelectric capacitors, and the readout information is stored outside the cell array. Next, the applied voltage is raised to read out polarization charges of one of the remaining ferroelectric capacitors. In writing, the voltage is sequentially lowered and applied to the ferroelectric capacitors in an opposite order to that in reading, thereby performing writing.

(11-21) According to (11-12) to (11-17), the sense amplifier has a temporary storage memory.

(11-22) According to (11-13), the difference in thickness among the ferroelectric capacitors is preferably 3 or more times.

(11-23) According to (11-14), the difference in coercive voltage among the ferroelectric capacitors is preferably 3 or more times.

(12) According to (10), the select transistors includes first to fourth select transistors connected in series, one terminal of each of two memory cell blocks is connected to the same bit line, and the other terminal is connected to the plate electrode.

(12-1) A bit line pair of the same cell array are used to turn on all of four series connected select transistors only in one of four cell blocks connected to the bit line pair in reading/writing cell data, thereby forming a folded bit line structure.

(12-2) In the stand-by state after power-ON, all the plurality of transistors in the memory block are ON, and one of the first to fourth select transistors are OFF.

(12-3) In selecting an arbitrary memory cell in the memory block, all the first to fourth select transistors are turned on while turning off the transistor of the selected cell, and keeping the transistors of the remaining cells ON.

(12-4) The plate electrode potential is fixed at (½)Vcc or a constant voltage after power-ON in both the stand-by state and active state. In addition, no cell data refresh operation is performed.

(12-5) The plate electrode potential is set at 0V in the stand-by state after power-ON and changed within the range of 0V and Vcc in reading/writing data in selecting a cell.

(12-6) The bit line pitch is twice the cell pitch.

(12-7) The dummy cell has the same circuit structure as that of the memory cell in the memory block.

(12-8) The capacitor area of the dummy cell is 1.5 to 3 times larger than that of a normal cell.

(12-9) The dummy cell uses a paraelectric capacitor.

(12-10) The ferroelectric capacitor of each memory cell is constituted by connecting a plurality of ferroelectric capacitors in parallel.

(12-11) The ferroelectric capacitor of each memory cell is constituted by connecting a plurality of ferroelectric capacitors having different thicknesses in parallel.

(12-12) The ferroelectric capacitor of each memory cell is constituted by connecting a plurality of ferroelectric capacitors having different coercive voltages in parallel.

(12-13) The ferroelectric capacitor of each memory cell is constituted by connecting a plurality of ferroelectric capacitors and at least one voltage drop element.

(12-14) The ferroelectric capacitor of each memory cell is constituted by connecting a plurality of ferroelectric capacitors and at least one resistance element.

(12-15) The ferroelectric capacitor of each memory cell is constituted by connecting a first ferroelectric capacitor and a resistance element in series, and connecting a second ferroelectric capacitor to the series connected elements in parallel.

(12-16) According to (12-10) to (12-15), each of the plurality of ferroelectric capacitors of each memory cell stores 1-bit information.

(12-17) According to (12-10) to (12-13), each of the plurality of ferroelectric capacitors of each memory cell stores 1-bit information, and 1-bit data is read out from or written in each of the plurality of ferroelectric capacitors by changing the voltage to be applied to the ferroelectric capacitor.

(12-18) According to (12-10) and (12-13), each of the plurality of ferroelectric capacitors of each memory cell stores 1-bit information. In reading, a low voltage is applied to the ferroelectric capacitor to read out polarization charges of one of the plurality of ferroelectric capacitors, and the readout information is stored outside the cell array. Next, the applied voltage is raised to read out polarization charges of one of the remaining ferroelectric capacitors. In writing, the voltage is sequentially lowered and applied to the ferroelectric capacitors in an opposite order to that in reading, thereby performing writing.

(12-19) According to (12-10) to (12-15), the sense amplifier has a temporary storage memory.

(12-20) According to (12-11), the difference in thickness among the ferroelectric capacitors is at least 3 or more times.

(12-21) According to (12-12), the difference in coercive voltage among the ferroelectric capacitors is at least 3 or more times.

(13) A semiconductor memory device comprises: a plurality of memory cells, the memory cell being constituted by a first transistor having a source terminal and a drain terminal, a first ferroelectric capacitor which has a first terminal connected to the source terminal of the first transistor and a second terminal connected to the drain terminal and stores first data, a second transistor connected in series to the first transistor, and a second ferroelectric capacitor which is connected in parallel to a series connected portion of the first and second transistors and stores second data, the memory cell storing 2-bit data, wherein the plurality of memory cells are connected in series, and one or more select transistors are connected to at least one terminal of the series connected portion to constitute a memory cell block, and a plurality of memory cell blocks are arranged to constitute a cell array.

(14) According to any one of (7) to (14), a dummy cell in a dummy cell block corresponding to a memory cell block has a transistor, and a ferroelectric or paraelectric capacitor connected between a source and drain terminals of the transistor, the dummy cell block is constituted by connecting a plurality of dummy cells in series and connecting at least one first and at least one second select transistors connected in series to one terminal of the series connected portion, the other terminal of the first select transistor is connected to a first bit line, and the other terminal of the second select transistor is connected to a second bit line.

(14-1) An area of a capacitor of the dummy cell is 1.5 to 3 or more times.

(15) A method of driving a semiconductor memory device which comprises a plurality of memory cells each having a transistor having a source terminal and a drain terminal and a ferroelectric capacitor having a first terminal connected to the source terminal and a second terminal connected to the drain terminal, a predetermined number of memory cells being connected in series to constitute a memory cell block, and has a random access function, comprises the steps of: the first step of turning on transistors of the plurality of memory cells in the memory cell block; and the second step of setting a transistor of any one of the plurality of memory cells in the memory cell block in an OFF state to select the memory cell, and writing/reading data in/from the selected cell.

(16) A method of driving a semiconductor memory device which comprises a plurality of memory cells each having a transistor having a source terminal and a drain terminal and a ferroelectric capacitor having a first terminal connected to the source terminal and a second terminal connected to the drain terminal, a predetermined number of memory cells being connected in series to constitute a memory cell block, and has a random access function, comprises the steps of: the first step of turning on transistors of the plurality of memory cells in the memory cell block; the second step of setting a transistor of any one of the plurality of memory cells in the memory cell block in an OFF state to select the memory cell, and applying, to the selected memory cell, a voltage higher than a first minimum coercive voltage of coercive voltages of the ferroelectric capacitors, thereby reading out information stored in the ferroelectric capacitor having the first coercive voltage; the third step of writing a voltage higher than the first coercive voltage in the selected memory cell; the fourth step of applying a voltage higher than a second coercive voltage higher than the first coercive voltage to the selected memory cell, thereby reading out information stored in the ferroelectric capacitor having the second coercive voltage; and the fifth step of writing a voltage higher than the second coercive voltage in the selected memory cell.

(16-1) Reading/writing of data is performed in the order of the first step, the second step, the fourth step, the fifth step, the third step, and the first step.

(16-2) Writing of data is performed in the order of the first step, the fifth step, the third step, and the first step.

As a method of manufacturing a semiconductor memory device of the present invention, the following arrangement is preferably employed.

(1) Ferroelectric capacitors are formed after formation of cell transistors, and thereafter, bit lines are formed.

(2) Bit lines are formed after formation of cell transistors, and thereafter, ferroelectric capacitors are formed.

(3) In formation of the ferroelectric capacitor, a ferroelectric film is formed on a lower electrode, and an upper electrode is formed on the resultant structure.

(4) The lower electrode of the ferroelectric capacitor contains Pt, Ti, and the like.

(5) The ferroelectric capacitor contains Bi, Sr, Ta, O, and the like, Pb, Zr, Ti, O, and the like, or Ba, Sr, Ti, O, and the like.

(6) The electrode of the ferroelectric capacitor contains Ir or $IrO_2$, or Si, Ru, O, and the like.

(7) For the lower electrode of the ferroelectric capacitor, an Si plug is formed on a diffusion layer, and a Ti/TiN/Pt layer is formed on the resultant structure.

(8) A $TiO_2$ layer is formed on the upper electrode of the ferroelectric capacitor, and an $SiO_2$ layer is formed on the resultant structure.

(9) The ferroelectric capacitor has a single crystal structure.

(10) The lattice constants of the ferroelectric capacitor and the upper or lower electrode are different from each other, so that a distortion is generated therebetween.

(11) Electrode nodes at the two terminals of the ferroelectric capacitor are simultaneously formed, and the ferroelectric film is formed between the two electrode nodes. The ferroelectric film is formed by CVD or MOCVD.

(12) The ferroelectric film is formed in a direction perpendicular or parallel to the wafer surface.

In the present invention, the following arrangement is preferable.

(1) A plurality of ferroelectric capacitor layers are stacked on the Si surface.

(2) The memory cell transistor is a depletion-type transistor.

(3) According to (2), in the stand-by state or power-OFF state, the potential of a word line as the gate of the cell transistor is 0V.

(4) In turning on the power supply, a negative potential is applied to the substrate.

(5) A substrate bias generation circuit for applying a negative potential to the substrate in turning on the power supply is formed on the chip.

(6) In turning on the power supply, the word line potential is applied, and then the plate potential is raised to (½)Vcc.

(7) In turning off the power supply, the plate potential is lowered to 0V, and then the word line potential is lowered to 0V.

(8) In turning off the power supply, the plate potential is lowered to 0V, and then the word line potential is lowered to 0V. Thereafter, the power supply is turned off.

(9) Four electrode layers contacting the source/drain diffusion layer of the cell transistor are stacked above the word line. The first and third layers are connected. A capacitor is formed between the second electrode layer and a layer formed by the first and third electrode layers. Another capacitor is formed between the third and fourth electrode layers.

(10) The bit line consists of W, Al or Cu.

(11) The bit line is arranged between adjacent ferroelectric capacitors along the word line.

(12) The bit line is formed under the ferroelectric capacitor.

(13) The bit line is formed above the ferroelectric capacitor.

(14) The upper electrode of the ferroelectric capacitor is connected to the source or drain terminal of the cell transistor through an Al interconnection.

(15) A PL (plate) electrode of the normal cell is changed in a range of 0V to Vcc, and a PL of the dummy cell is fixed to Vcc/2 or a constant voltage.

(16) The plate electrode is changed in a constant voltage range.

(17) The plate electrode is snapped by the Al or Cu wiring.

The following advantages are obtained in accordance with the above arrangement.

The conventional FRAM has a structure as an extension of the conventional DRAM. In the present invention, the cell transistor and the ferroelectric capacitor are connected in parallel, unlike the prior art using a series connected structure. In addition, in the present invention, a plurality of memory cells are connected in series, one terminal of the series connected cells is connected to the plate electrode, and the other terminal is connected to the bit line through the select transistor.

With this structure, in the stand-by state, the gate of the cell transistor is ON, and two terminals of the ferroelectric capacitor are short-circuited because of the parallel connection and set at an equipotential. According to the conventional DRAM concept, this structure absolutely destroys accumulated information. In the ferroelectric memory, however, data is not destroyed even when the potential difference between the storage node SN and the plate electrode is set at 0V. That is, charges are not read out unless the polarization direction is reversed to that for writing. The present invention conversely exploits this unique problem of the FRAM as an advantage.

In the present invention, in the stand-by state, the two terminals of the ferroelectric capacitor are always short-circuited regardless of the operation of fixing the plate potential or changing the plate potential within the range of 0V to Vcc. Even in case of a leakage current at the p-n junction or the like, the potential difference between the two terminals of the ferroelectric capacitor is 0V, and charges corresponding to the remnant polarization amount are kept held. No polarization inversion occurs, so the data is not destroyed. Even when the cutoff current of the cell transistor or the leakage current of the ferroelectric capacitor has a large value, the cell information is not destroyed. As a result, a high-speed operation can be performed while fixing the plate potential, and simultaneously the refresh operation can be omitted, unlike the prior art.

A case wherein one of the plurality of series connected cells is to be selected will be considered. Assume that, from four series connected cells, the second cell from the plate electrode, i.e., the third cell from the bit line is to be selected. In this case, only the cell transistor of the selected memory cell is turned off, and the select transistor is turned on. The first, third, and fourth cell transistors from the plate electrode are equivalently kept ON. For this reason, one terminal of the ferroelectric capacitor of the selected memory cell is electrically connected to the plate electrode, and the other terminal is electrically connected to the bit line. Apparently, in the circuit of the present invention, the cell transistor of the conventional ferroelectric memory corresponds to the select transistor, and the ferroelectric capacitor directly corresponds to the ferroelectric capacitor. Therefore, the present invention can cope with both the conventional scheme of fixing the plate electrode at (½)Vcc and the scheme of changing the plate electrode potential within the range of 0V to Vcc.

When data is to be read/written in selecting the second memory cell from the plate electrode, the cell transistors of the unselected cell, i.e., the first, third, and fourth cells from the plate electrode are ON, and the potential between the two terminals of the ferroelectric capacitor is set at 0V, so the cell data is not destroyed. As a result, in the present invention, although the memory cells are connected in series, data can be read/written from/into an arbitrary cell. Not block access as in the conventional NAND cell but perfect random access is enabled.

In the conventional NAND cell, when the number of series connected cells increases, the bit line capacity can be decreased. However, when the number of series connected cells is too large, and data is to be read out from a cell far from the bit line, the bit line capacity increases by an amount corresponding to other cell capacities from the bit line to the target read cell. This conversely increases the bit line capacity.

In the present invention, however, the number of series connected cells can be considerably increased, and the bit line capacity can be largely decreased. This is because the two terminals of the ferroelectric capacitor of an unselected cell are short-circuited, and the capacity of the ferroelectric capacitor does not electrically appear. In addition, when the gate of the select transistor is connected to a signal line different from that of the gate of a select transistor connected to the other one of the bit line pair, no cell data is read out to the reference bit line, so that a folded bit line structure capable of reducing noise can be realized. As described above, according to the present invention, random read/write access is enabled, the bit line capacity can be decreased, and the array noise can be reduced.

For the cell structure, the gate of the cell transistor can be formed in the minimum processing size (F), and the diffusion layer and the active region for channel formation can be formed in the minimum processing size (F). Therefore, a planar transistor which can be easily manufactured can be used, and the cell size can be reduced to a size represented as follows:

$$2F \times 2F = 4F^2.$$

The ferroelectric capacitor is formed by extracting source and drain electrodes of the cell transistor upward from the diffusion layer region between the gates after formation of the transistor. One of the electrodes is used as the lower electrode of the ferroelectric capacitor, and the other is used as the upper electrode of the ferroelectric capacitor. With this structure, the ferroelectric capacitor can be connected in parallel to the cell transistor in a stack structure.

The above effects will be summarized. In the conventional nonvolatile FRAM, facilitation of manufacturing and realization of high integration cannot be simultaneously realized while maintaining the random access function, like the conventional DRAM. However, the present invention can simultaneously realize all these functions. In addition, reduction of the bit line capacity and noise reduction are also enabled. Furthermore, the high-speed operation can be maintained while employing the scheme of fixing the plate potential at (½)Vcc, and simultaneously, the refresh operation can be omitted, although it is impossible in the conventional FRAM.

When the semiconductor memory device of the present invention is applied to various systems such as a computer system, an IC card, a digital image input system, a memory system, a system LSI chip, and a mobile computer system, the performance of each system can be improved using the advantages of the semiconductor memory device. More specifically, the semiconductor memory device of the present invention can omit the refresh operation and perform a high-speed operation, and also increase the density. Therefore, the semiconductor memory device can be applied to a high-speed system having low power consumption, or a high-speed system which requires a high-temperature operation. The semiconductor memory device can also be applied to a system in a heavy stress environment or a system which requires a large-capacity memory.

As has been described above in detail, according to the present invention, the transistor and the ferroelectric capacitor are connected in parallel to constitute a memory cell of the FRAM. With this structure, a memory cell having a size (e.g., $4F^2$) smaller than $8F^2$ without using any stacked-type transistor can be realized, and simultaneously, the random access function can be maintained.

In addition, using the scheme of fixing the plate potential at (½)Vcc, a high-speed operation as in the DRAM can be maintained, and simultaneously, the refresh operation can be omitted.

Furthermore, the bit line capacity can be decreased. In modifications, noise reduction, relaxation of the bit line rule or sense amplifier rule, reduction of the number of sense amplifiers, an increase in readout signal amount, and storage of multi-bit data in a cell with a size of $4F^2$ are enabled.

The ferroelectric memory of the present invention can operate at a high speed and omit the refresh operation. Therefore, the ferroelectric memory can be applied to a high-speed system having low power consumption, or a high-speed system which requires a high-temperature operation. The semiconductor memory device can also be applied to a system which requires a high density in a heavy stress environment or a system which requires a large-capacity memory.

Moreover, another structure of the present invention is described as follows:

(1) A semiconductor memory device comprises: a plurality of memory cells each having a source terminal and a drain terminal and a ferroelectric capacitor having a first terminal connected to the source terminal, wherein the plurality of memory cells are connected in series, and one or more selected transistors connected to at least one terminal of the series connected memory cells to constitute a memory cell block, the memory cell block having one terminal connected to a bitline and another terminal connected to a plate electrode, and wherein two memory cell blocks, which are respectively connected to two bit lines forming a bit line pair and also connected to the same word line, are respectively connected to a first plate electrode and a second plate electrode.

(2) A gate electrode of the transistor is connected to the word lines, and a predetermined number of the memory cell blocks are arranged in a word-line direction to constitute a cell block unit; the first plate electrode and second plate electrode are connected to the memory cell blocks of the cell block unit alternately for every one or for every two memory cell blocks. Where, the first and second plate electrodes are respectively connected to two memory cell blocks which are connected to the same bit line.

With the structure in the above-mentioned (1) and (2), by dividing a PL line, in the 1T/1C structure, even if the PL driving scheme is adopted, a block select transistor is not turned on while being connected to the selected word line and the PL line connected to a cell block from which no cell data is read is not driven; therefore, the potential of the floating node within the cell block from which no cell data is read does not change so that no reduction in polarization data occurs.

(3) A semiconductor memory device comprises: a memory cell constituted by parallel-connecting a ferroelectric capacitor between source and drain terminals of a transistor; and a memory cell block constituted by series-connecting the plural memory cells, with at least one end of the series connected portion being connected to a select transistor, one end of the memory cell block being connected to a bit line, the other end being connected to a plate electrode, wherein, at stand-by after application of power, the plate electrode is set at Vss and the bit line is set at Vdd or High level.

(4) A semiconductor memory device comprises: a memory cell constituted by parallel-connecting a ferroelectric capacitor between source and drain terminals of a transistor; and a memory cell block constituted by series-connecting the plural memory cells, with at least one end of the series connected portion being connected to a select transistor, one end of the memory cell block being connected to a bit line, the other end being connected to a plate electrode, wherein, at stand-by after application of power, the plate electrode is set at Vdd or High level and the bit line is set at Vss.

With the structure of the above-mentioned (3) and (4), upon active operation, the difference between the PL potential and the BL potential has already been set at Vdd; therefore, only by turning the word line OFF and turning the block selection line ON, the polarization information of the cell is read out by the bit line, and when PL is raised (or lowered) once, the paraelectric component having dispersion can be cancelled, thereby making it possible to improve the reading reliability. Then, after amplified by a sense amplifier, PL is lowered (or raised), thereby completing the re-writing process of cell data. Therefore, only by raising (or lowering) PL once, it is possible to cancel the paraelectric component having dispersion, thereby making it possible to simultaneously realize the high-speed operation and high reliability.

(5) A semiconductor memory device comprises: a memory cell constituted by parallel-connecting a ferroelectric capacitor between source and drain terminals of a transistor; a memory cell block constituted by series-connecting the plural memory cells, with at least one end of the series connected portion being connected to a select transistor, one end of the memory cell block being connected to a bit line, the other end being connected to a plate electrode; and a memory cell array constituted by arranging the plural memory cell blocks, each cell being provided with a write-in buffer for writing data from external portion, wherein the write-in buffer consists of a first write-in transistor having a small size and a second write-in transistor having a large size, and upon writing data, the time at which the second write-in transistor is started to be driven is set slower than the time at which the first write-in transistor is started to be driven.

With the structure of the above-mentioned (5), since the writing speed is slow, noise at the time of writing, which is inherently caused in the ferroelectric capacitor, can be reduced. (6) A semiconductor memory device comprises: a plurality of memory cells each having a source terminal and a drain terminal and a ferroelectric capacitor having a first terminal connected to the source terminal, wherein the plurality of memory cells are connected in series, and one or more selected transistors connected to at least one terminal of the series connected memory cells to constitute a memory cell block, the memory cell block having one terminal connected to a bitline and another terminal connected to a plate electrode, and wherein a wiring of the plate electrode is formed by the same metal wiring layer such as Al and Cu that constitutes a wiring for connecting the cell transistor and the ferroelectric capacitor of the memory cell.

With the structure of the above-mentioned (6), the PL wire is formed by using the metal wire connecting the cell transistor and the ferroelectric capacitor; therefore, the resistance in the PL wire is reduced and RC delay in the PL wire in the PL driving scheme can be shortened.

(7) A semiconductor device comprises: a plurality of memory cells each having a source terminal and a drain terminal and a ferroelectric capacitor having a first terminal connected to the source terminal and a second terminal connected to the drain terminal, and a gate electrode of the cell transistor connected to a word line, wherein the plurality of memory cells are connected in series, and one or more selected transistors connected to at least one terminal of the series connected memory cells to constitute a memory cell block, the memory cell block having one terminal connected to a bitline and another terminal connected to a plate electrode, and wherein a metal wiring layer connected with the plate electrode via a contact hole is the same layer as metal wiring layer connected with the word line via a contact hole with predetermined interval.

With the structure of the above-mentioned (7), the PL wire is formed by using the metal wire for use in ward line snap; therefore, the resistance in the PL wire is reduced and RC delay in the PL wire in the PL driving scheme can be shortened.

(8) A semiconductor memory device comprises: a plurality of memory cells each having a source terminal and a drain terminal and a ferroelectric capacitor having a first terminal connected to the source terminal, wherein the plurality of memory cells are connected in series, and one or more selected transistors connected to at least one terminal of the series connected memory cells to constitute a memory cell block, the memory cell block having one terminal connected to a bitline and another terminal connected to a plate electrode, and wherein a driving circuit for driving the plate electrode is placed in a bit line direction for every one or for every two memory cell blocks.

With the structure of the above-mentioned (8), it is possible to allow the plate-line driving transistor in the plate-line driving circuit to have a large size, the ON resistance of the transistor is reduced, and RC delay in the PL wire in the PL driving scheme can be shortened.

(9) A semiconductor memory device comprises: a memory cell constituted by parallel-connecting an nMOS transistor, a pMOS transistor and a ferroelectric capacitor; and a memory cell block constituted by series-connecting at least one selection switch constituted by series-connecting the plural memory cells with at least one end of the series connected portion being parallel-connected to the nMOS transistor and pMOS transistor, one end of the memory cell block being connected to a bit line, the other end being connected to a plate electrode.

With the structure of the above-mentioned (9), the memory transistor and the block select transistor are fully formed by CMOS, voltage drop at the threshold value is eliminated, the data read/write operations are carried out without raising the voltage of the word line and the block selection line to not less than Vdd, the voltage-raising circuit is eliminated, and it becomes possible to improve the reliability and also to allow for mixed installation, etc.

Here, the following arrangements are listed as preferred modes for carrying out the present invention.

(a) In (1) and (2), in one cycle during an active operation, only either the first plate electrode or the second electrode is operated between Vss and Vdd, while the other remains at Vss.

(b) In (2), the first and second plate electrodes are respectively shared by the memory cell block adjacent thereto in the bit-line direction.

(c) In (3), in one cycle upon operation, the plate electrode drops from Vss to Vdd or High level of the bit line only once, and returns to Vss.

(d) In (4), in one cycle upon operation, the plate electrode drops from Vdd or High level of the bit line to Vss only once, and returns to Vdd or High level of the bit line.

(e) In (3) and (4), the ferroelectric capacitor of the memory cell is constituted by parallel-connecting two or more ferroelectric capacitors having different coercive voltages.

(f) In (6), the metal wiring layer is placed as a top layer after formation of the upper electrode and the lower electrode of the ferroelectric capacitor, and the upper electrode and the lower electrode are connected with a contact interpolated in between.

(g) In (7), the contact gap between the first metal wiring layer and the plate wiring layer is set at every 1 bit line, every two bit lines, every four bit lines, or every word line snap gap.

As described above in detail, the present invention makes it possible to provide the following advantages: easy production is available by using nonvolatile planar transistors, high integrity having a size of $4F^2$ is realized with random access properties, and (1) in the 1T/1C type, the plate driving scheme is adopted, which makes it possible to carry out a high-density operation with low voltage. Moreover, (2) high-speed operation is achieved while suppressing dispersion in the paraelectric component in the ferroelectric capacitor. Furthermore, (3) noise at the time of writing is reduced. (4) High-speed operation is achieved in the plate driving scheme while reducing process costs and chip sizes. (5) Since cells are formed by using CMOS, it is possible to eliminate voltage raising processes to the word line and the block selection line.

A semiconductor memory device may comprise: a plurality of memory cells each having a first transistor having a first source terminal and a first drain terminal and a ferroelectric capacitor having a first terminal connected to the firs source terminal and a second terminal connected to the first drain terminal, wherein the plurality of memory cells are connected in series; and a dummy cell having a second transistor having a second source terminal and a second drain terminal and a ferroelectric capacitor or paraelectric capacitor having a third terminal connected to the second source terminal and a fourth terminal connected to the second drain terminal.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 37 is a table summarizing the major effects of the present invention;

FIG. 38 is a table summarizing the major effects of the present invention;

FIG. 119A and FIG. 119B are circuit diagrams showing another plate electrode driving scheme applicable to the cells shown in FIG. 102 to FIG. 107;

FIG. 120A and FIG. 120B are a detailed circuit diagram and a timing chart, respectively, of the plate electrode driving scheme shown in FIG. 119A and FIG. 119B;

FIG. 121A and FIG. 121B are a detailed circuit diagram and a timing chart, respectively, of the plate electrode driving scheme shown in FIG. 119A and FIG. 119B;

FIG. 122A and FIG. 122B are charts showing operations applicable to the plate electrode driving scheme shown in FIG. 119A to FIG. 121B;

FIG. 123A and FIG. 123B are circuit diagrams of sense amplifiers applicable to the plate electrode driving scheme shown in FIG. 119A to FIG. 121B;

FIG. 124A and FIG. 124B are charts showing operations applicable to the plate electrode driving scheme shown in FIG. 119A to FIG. 121B;

FIG. 125 is a sectional view showing the device structure of an FRAM according to the 82nd embodiment;

FIG. 126 is a sectional view showing the device structure of an FRAM according to the 83rd embodiment;

FIG. 127A and FIG. 127B are sectional views showing the device structure of an FRAM according to the 84th embodiment;

FIG. 128A and FIG. 128B are an equivalent circuit diagram of an FRAM according to the 85th embodiment and a sectional view of the device structure, respectively;

FIG. 129 is an equivalent circuit diagram of an FRAM according to the 86th embodiment;

FIG. 130 is a sectional view showing the device structure of an FRAM according to the 87th embodiment;

Figure 102:
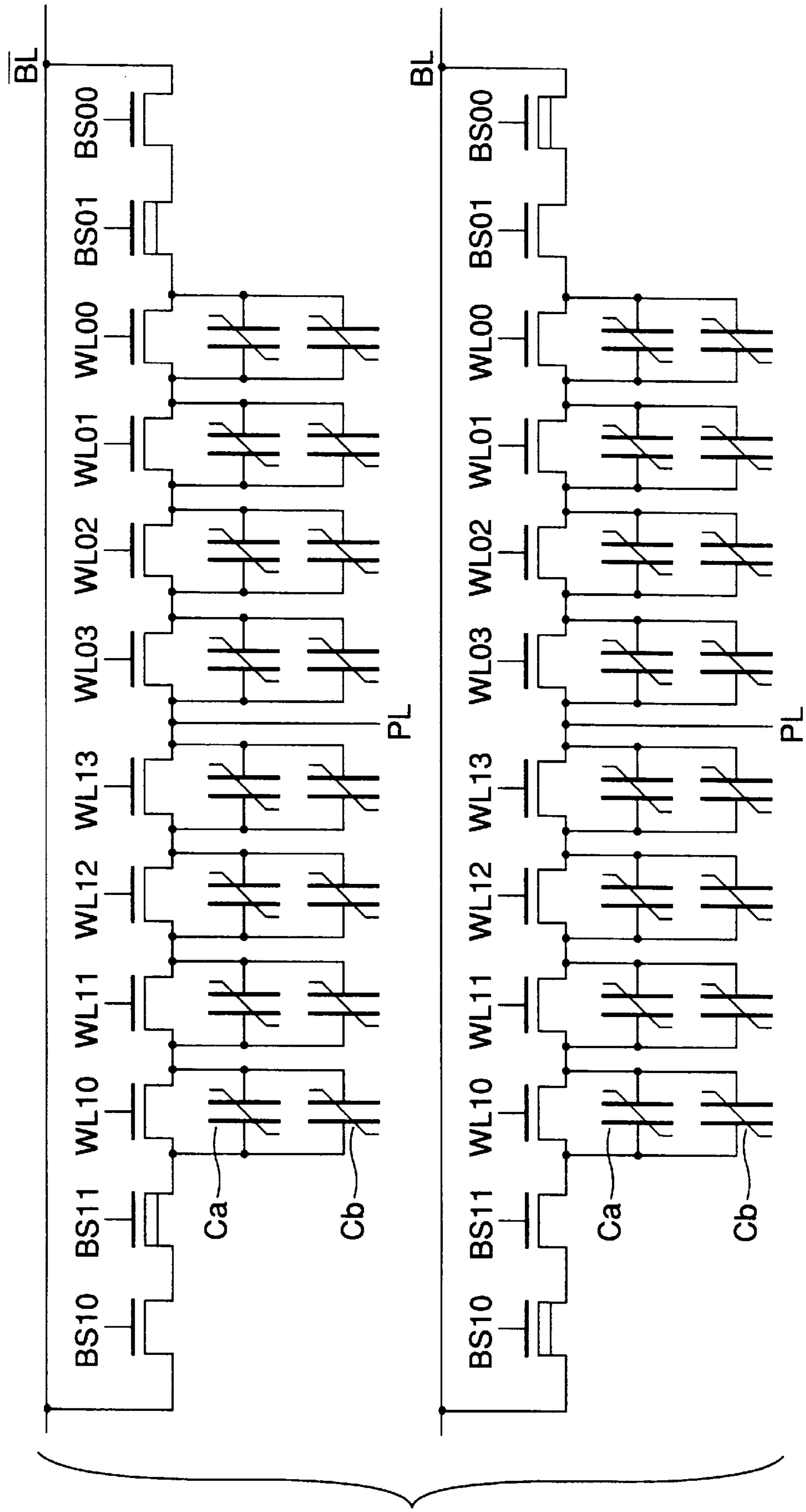
FIG. 102 is an equivalent circuit diagram of an FRAM according to the 68th embodiment.
Figure 131:
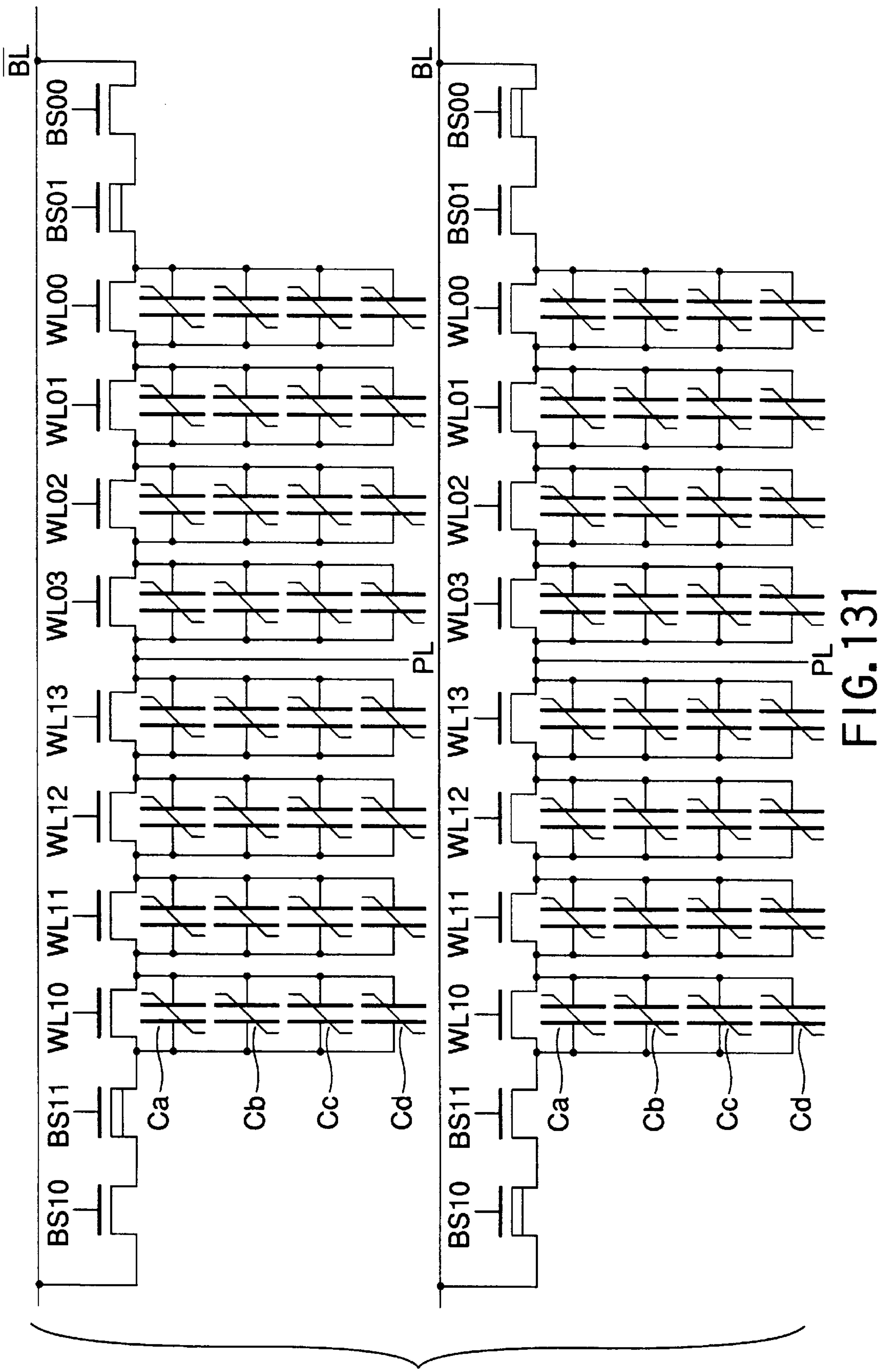
Figure 132:
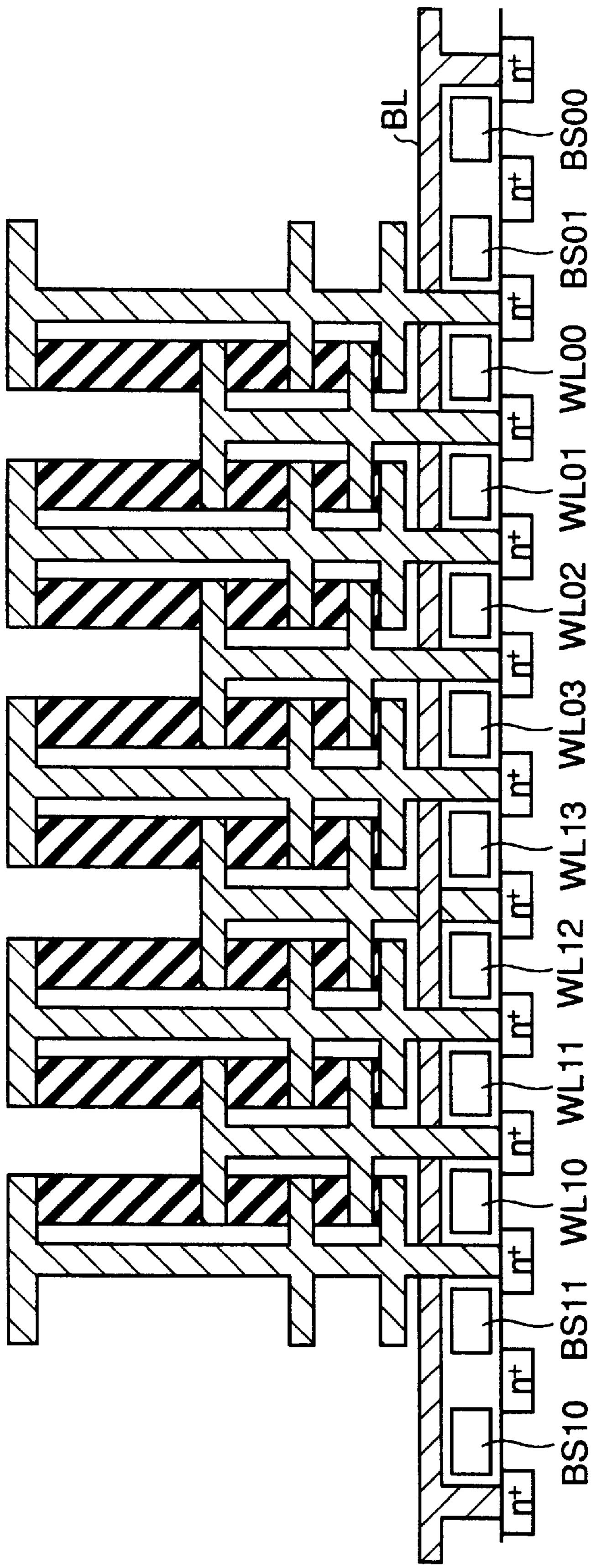
Figure 133:
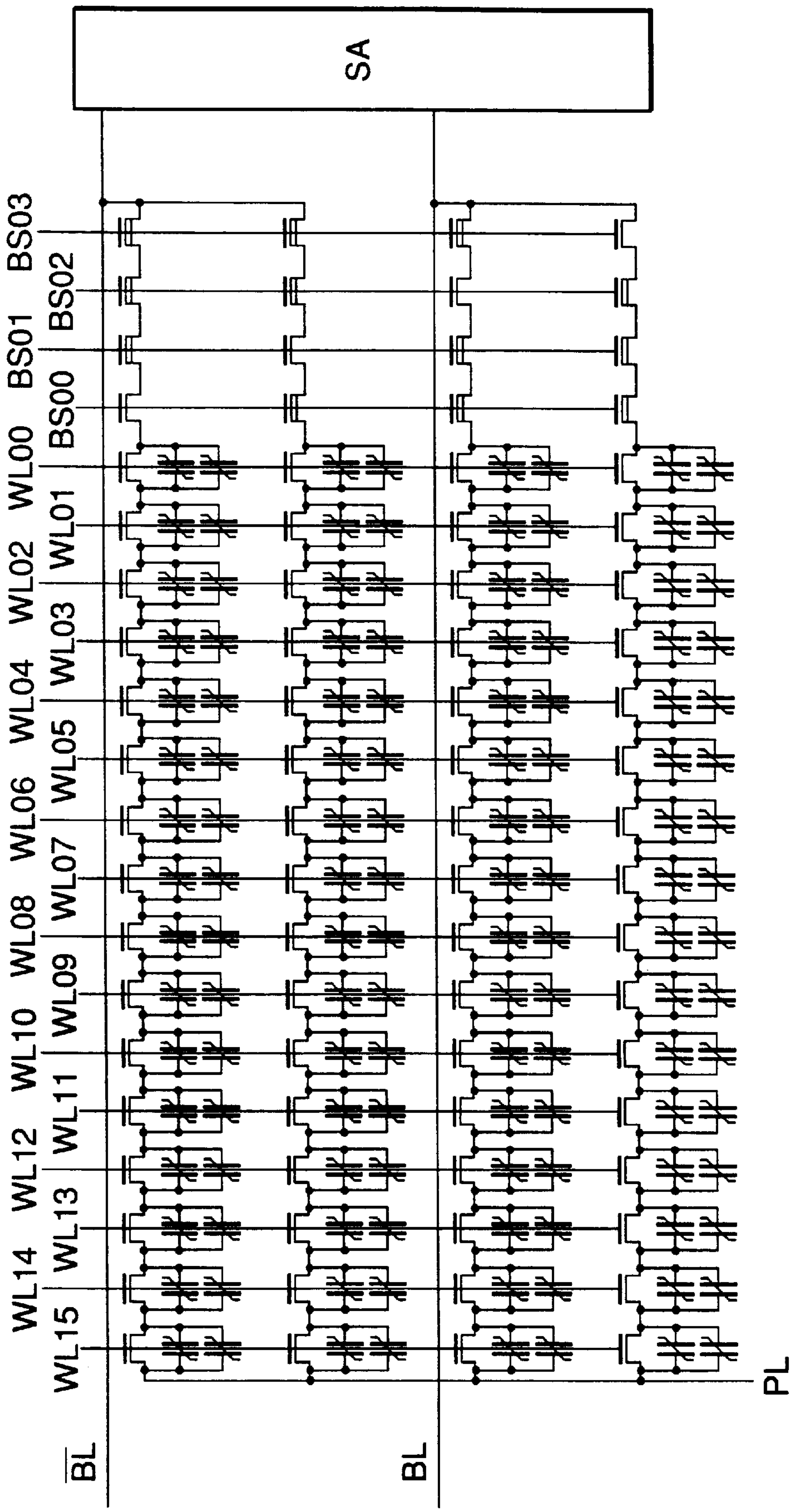
Figures 134A, 134B:
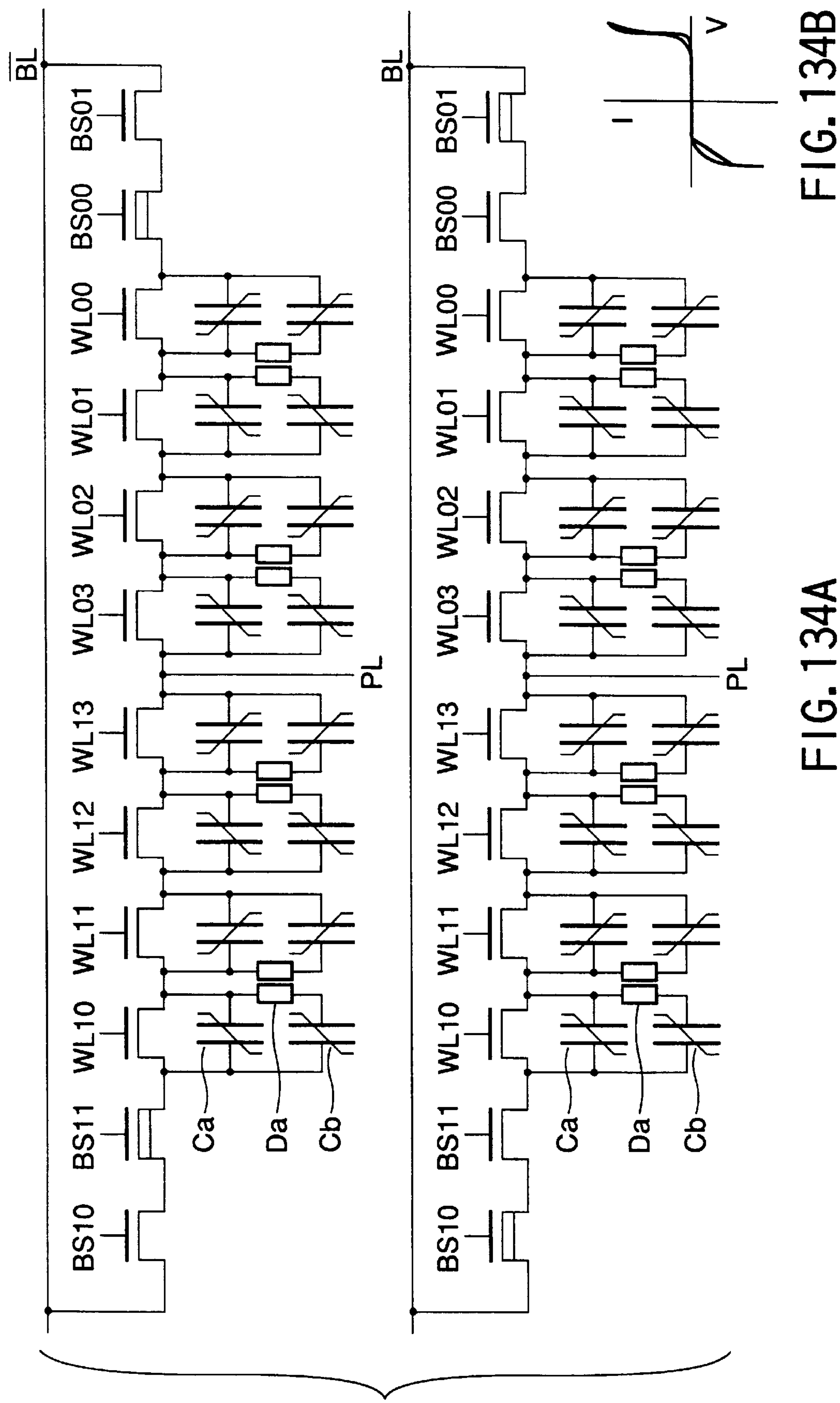
Figure 136:
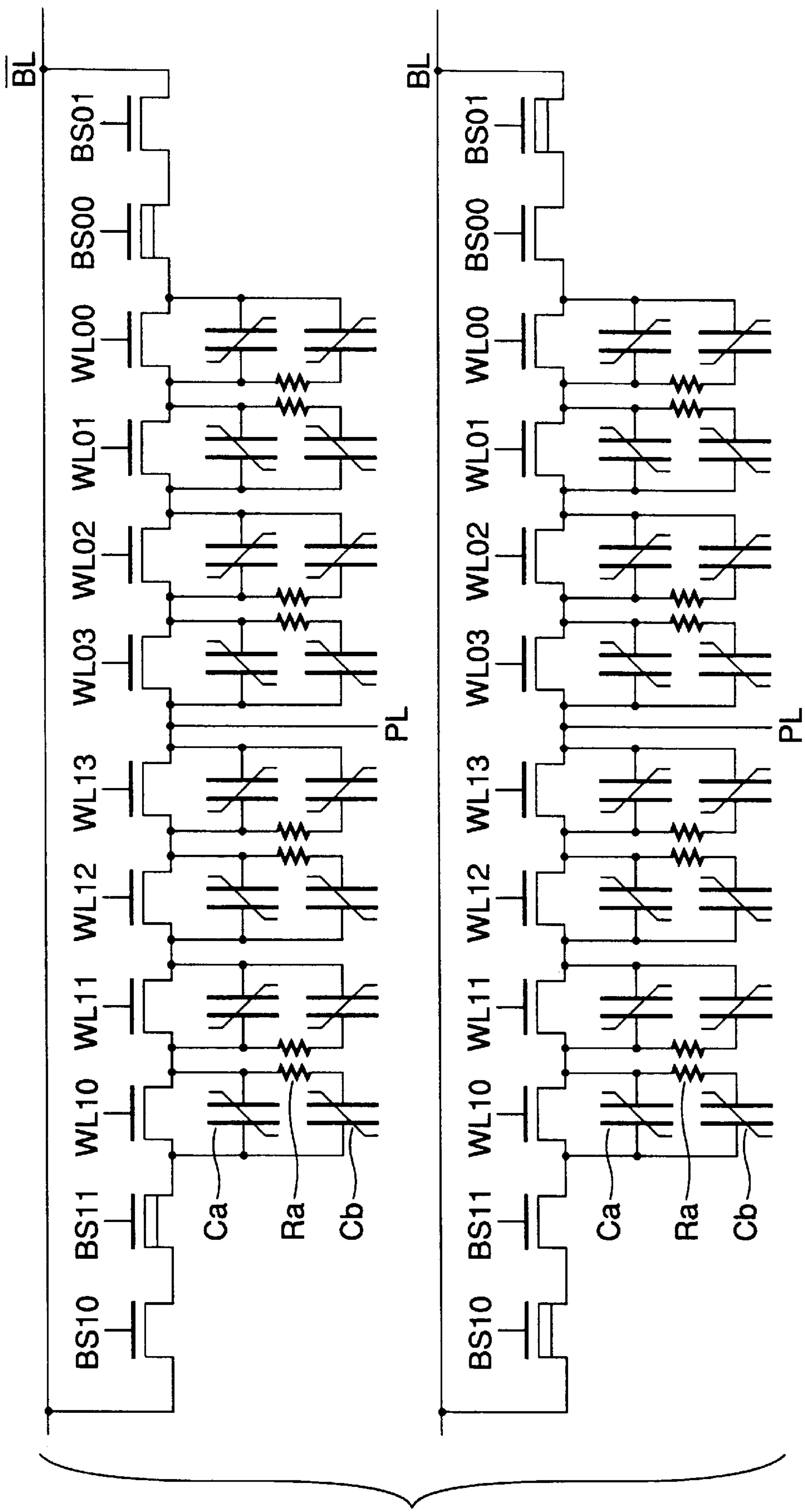
Figure 137:
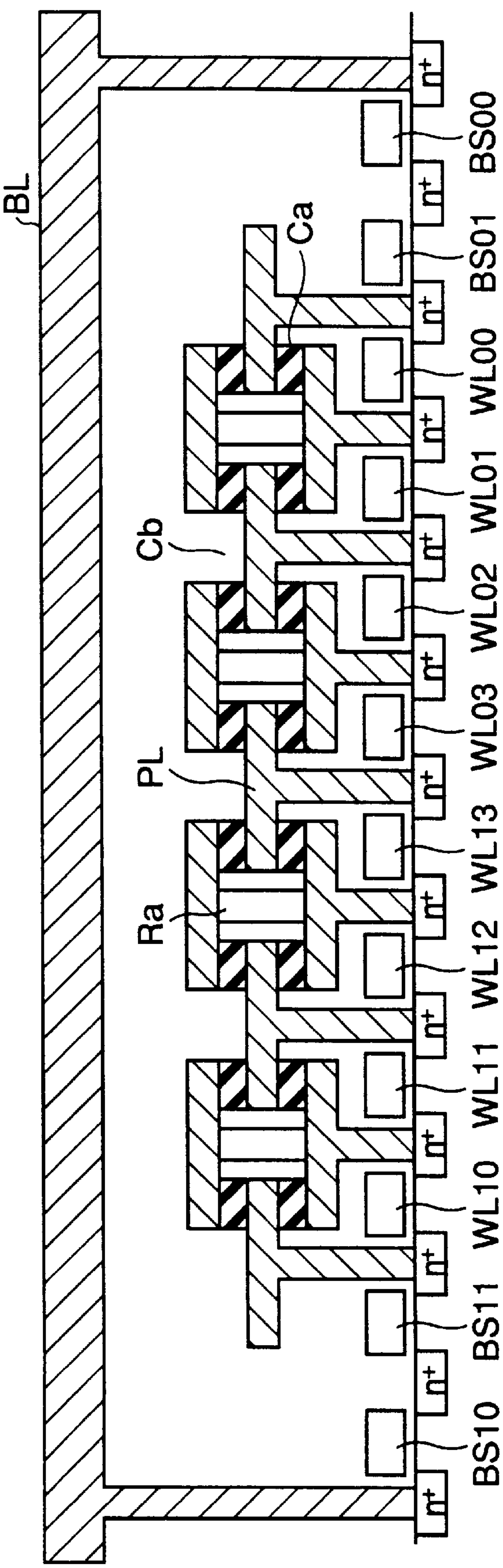
Figure 138:
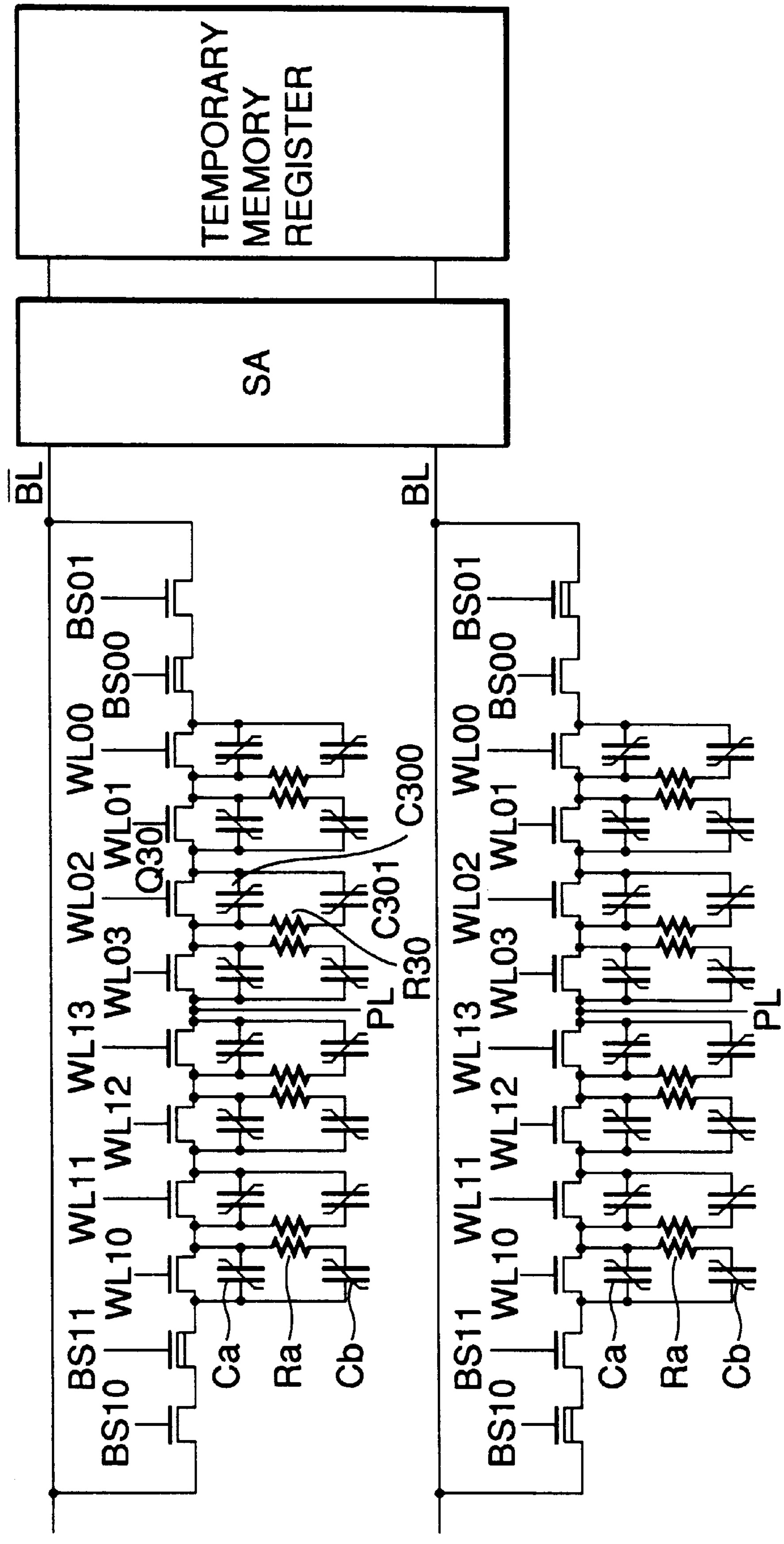
Figure 139:
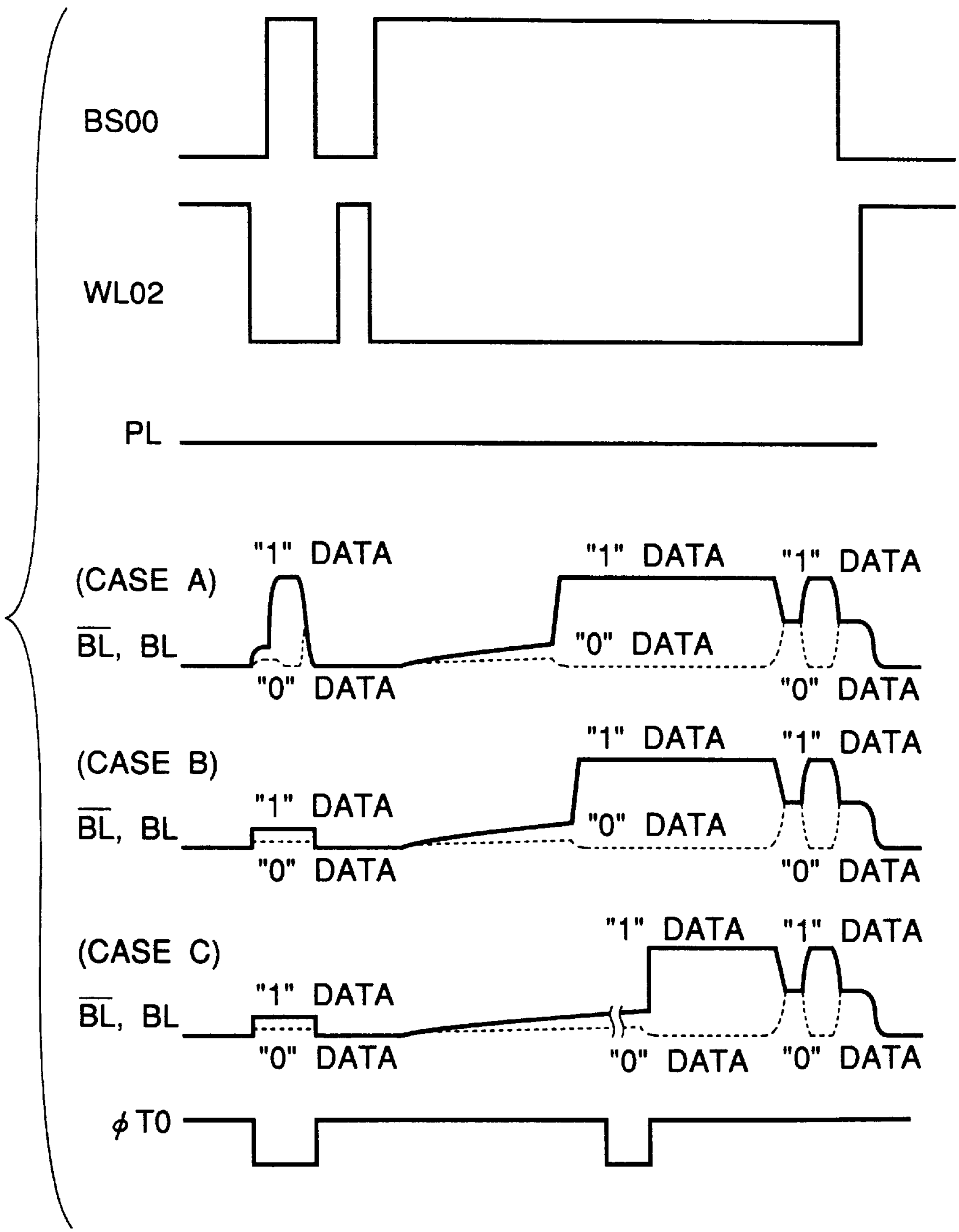
Figure 140A:
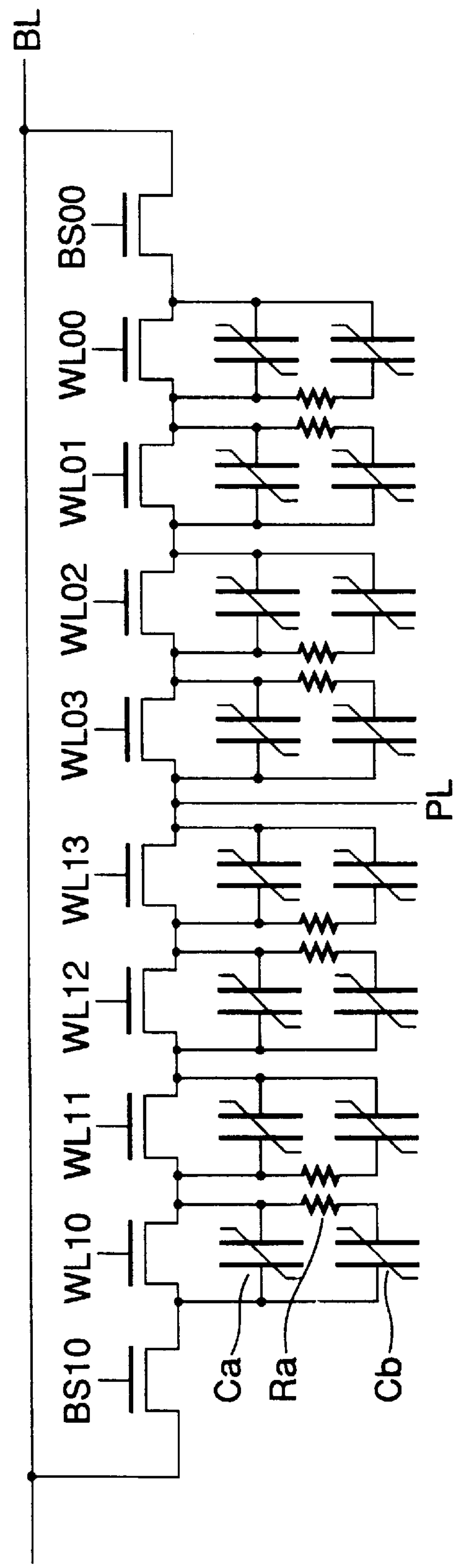
Figure 140B:
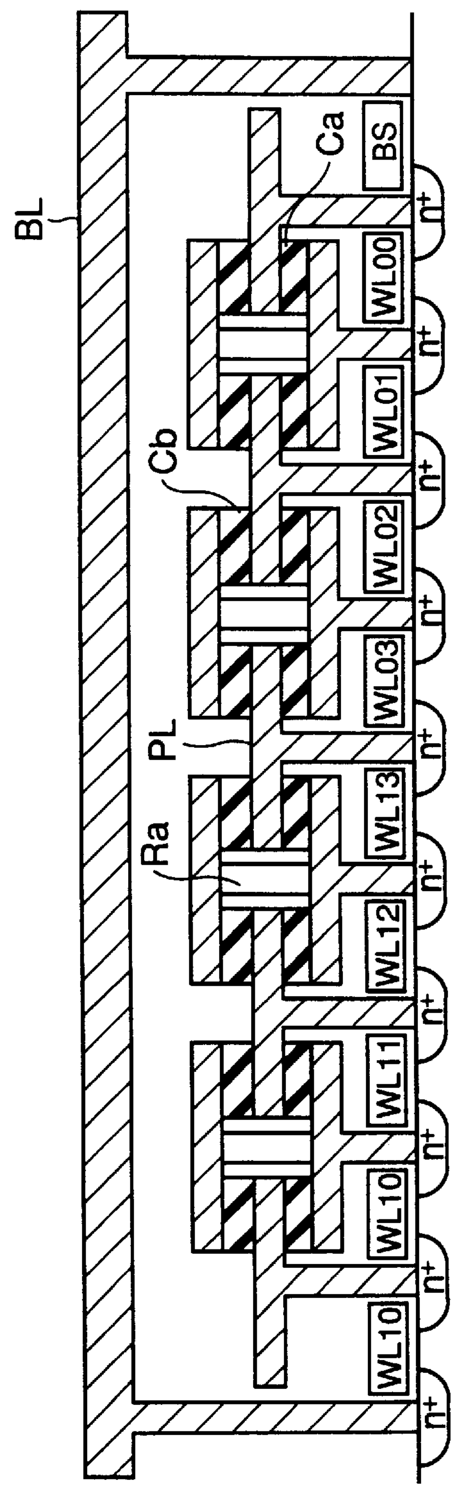
Figure 141A:
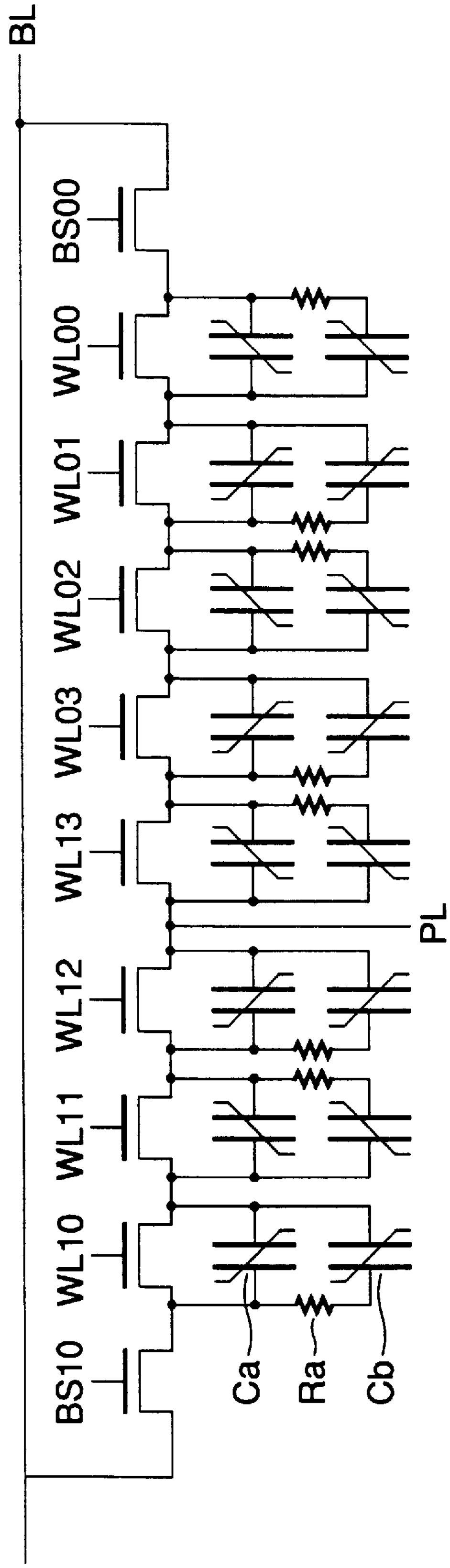
Figure 141B:
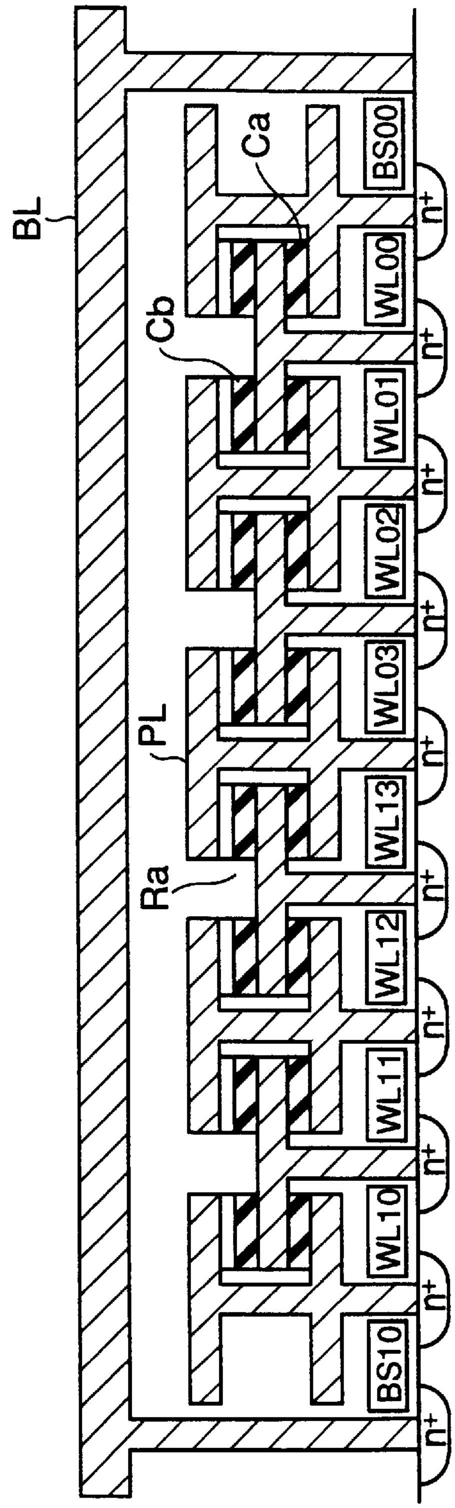
Figure 142A:
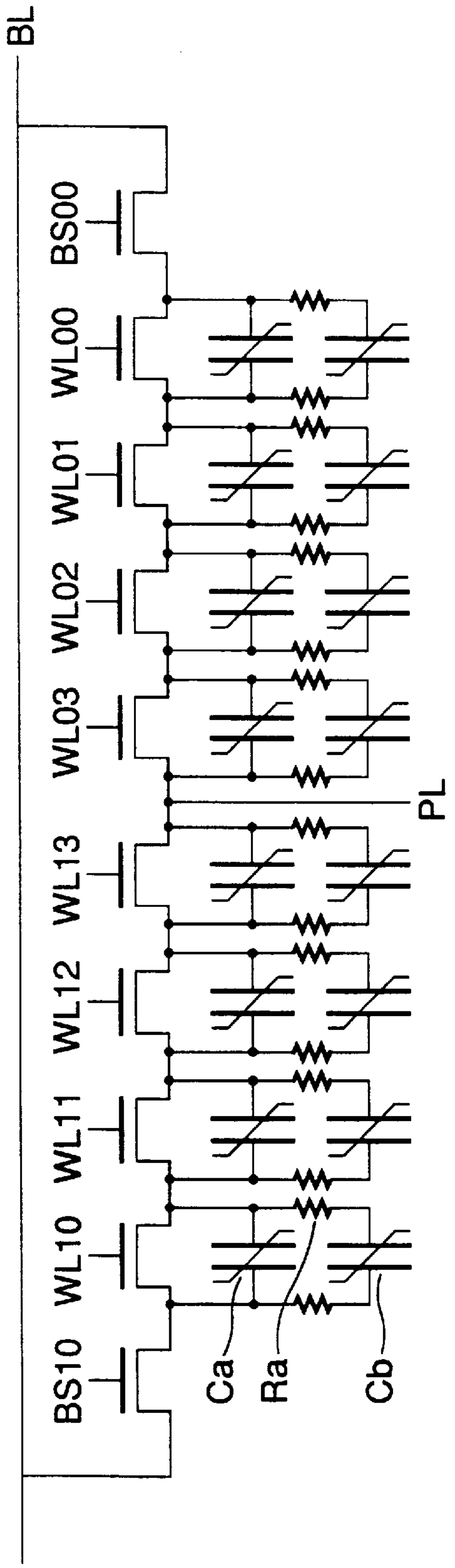
Figure 142B:
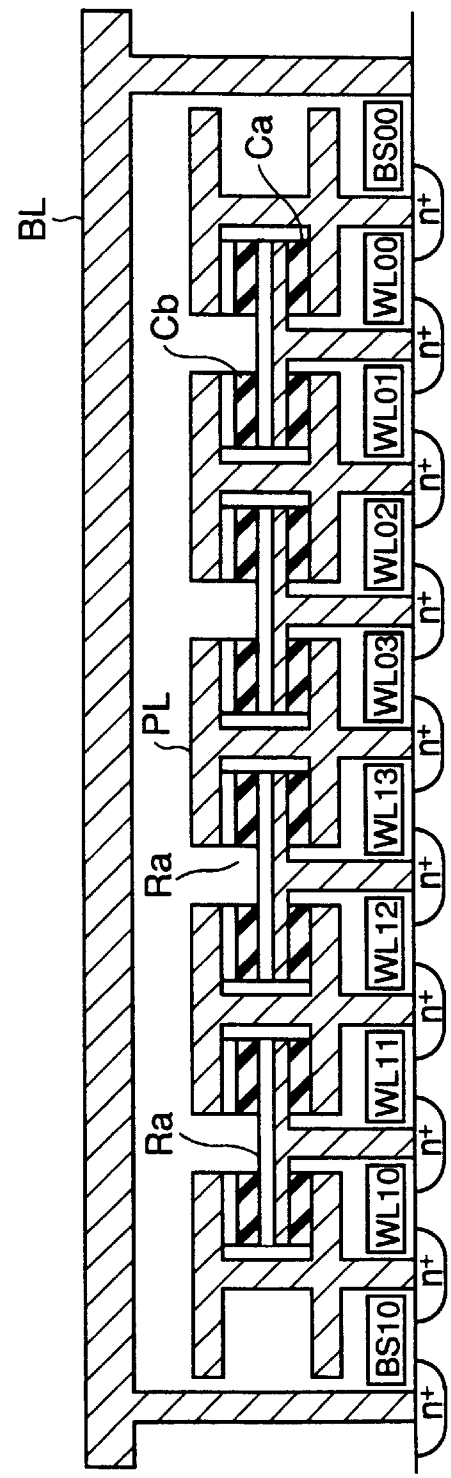
Figure 143:
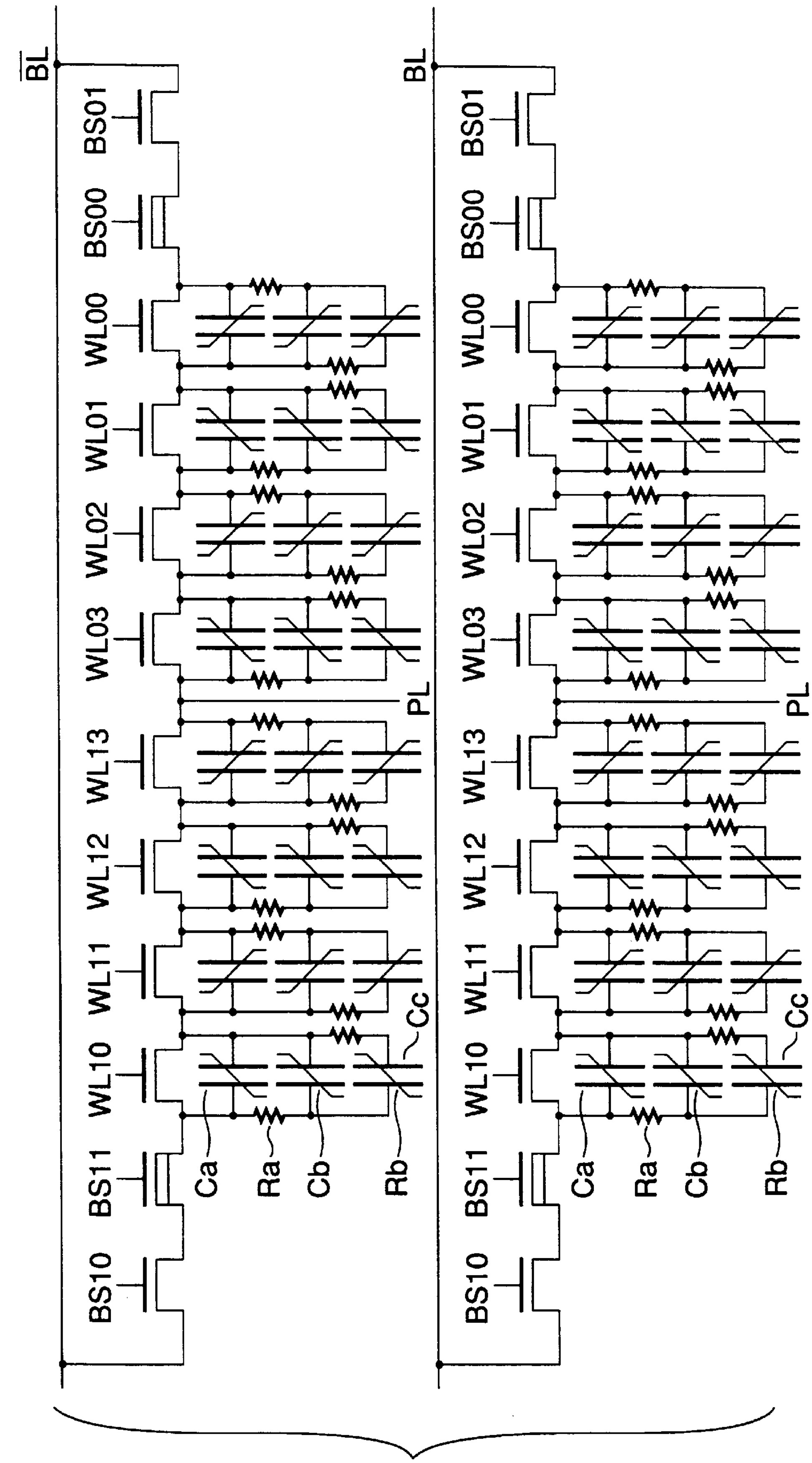
Figure 144:
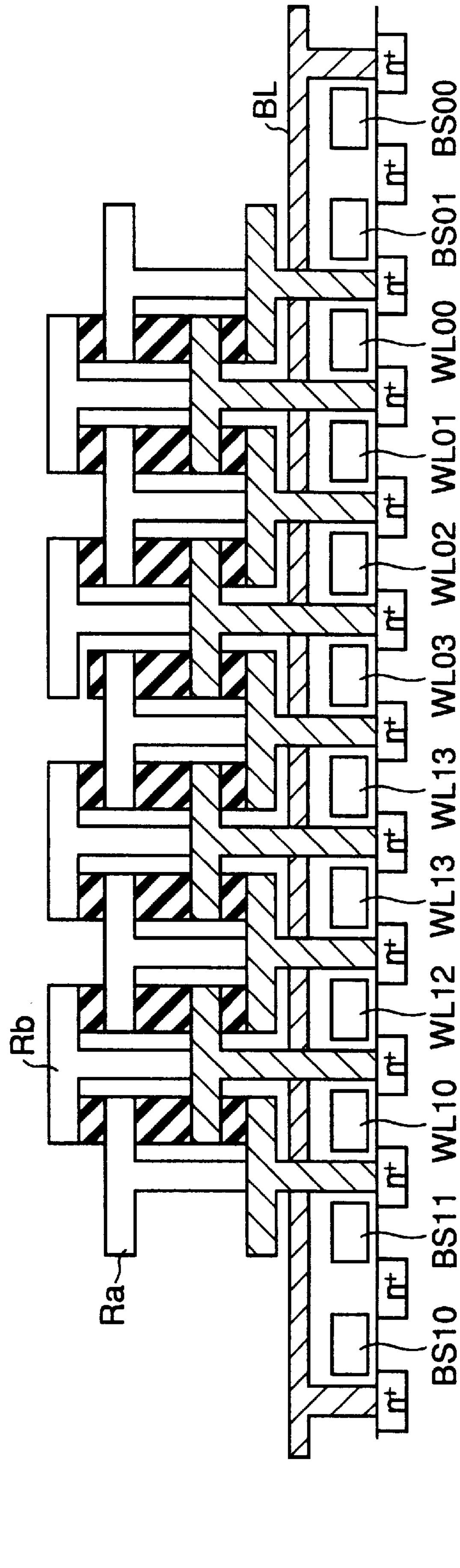
Figure 145:
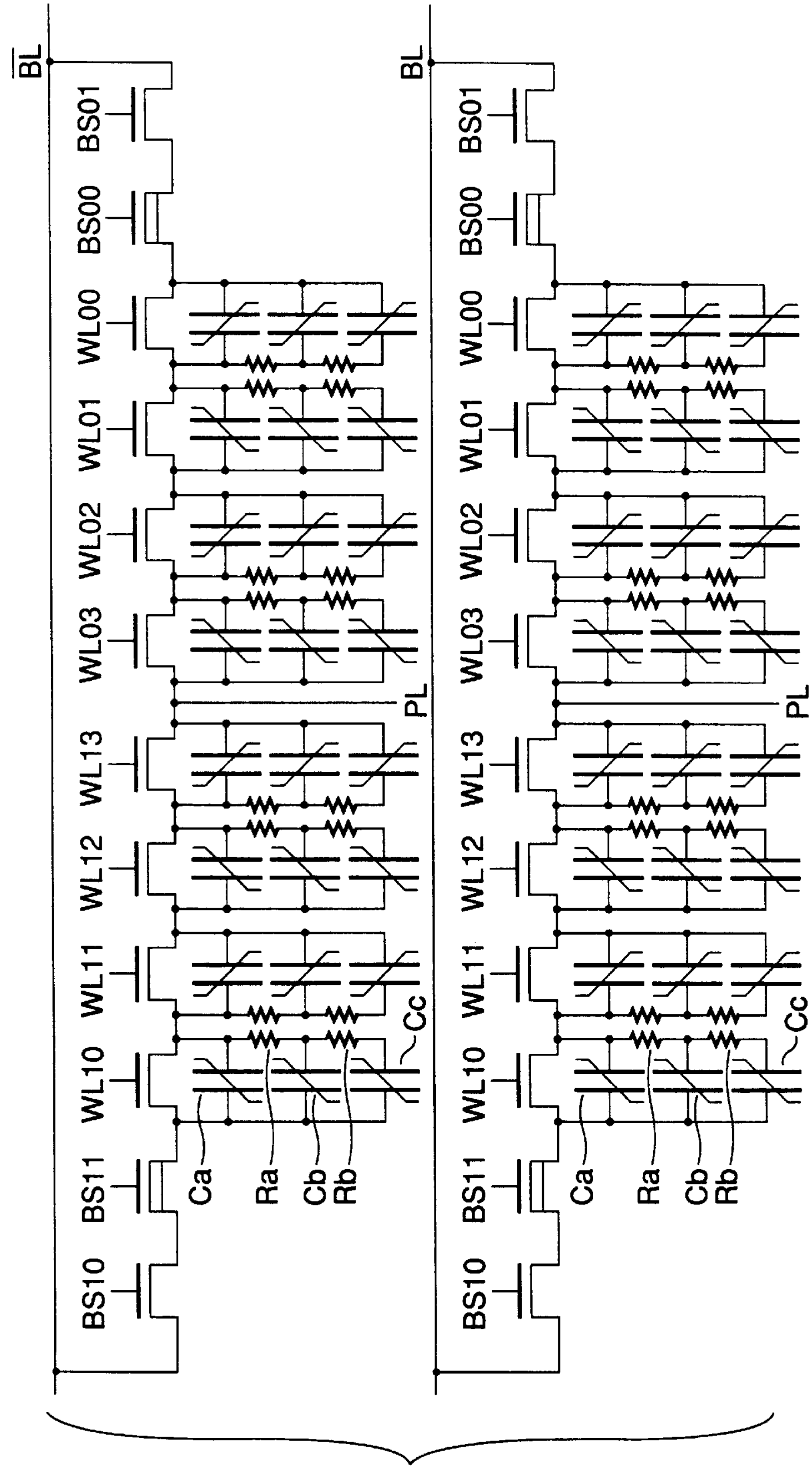
Figure 146:
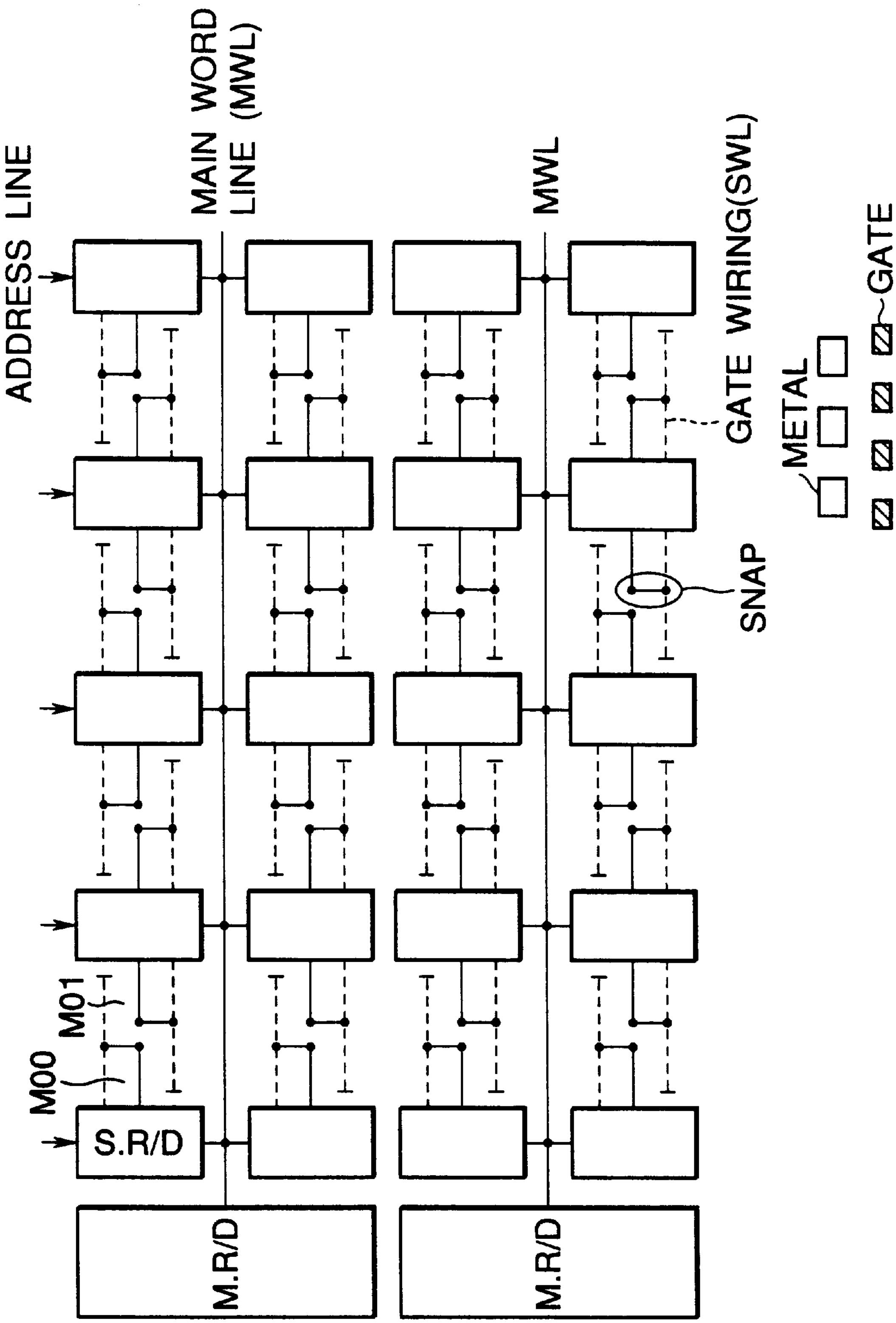
Figure 147:
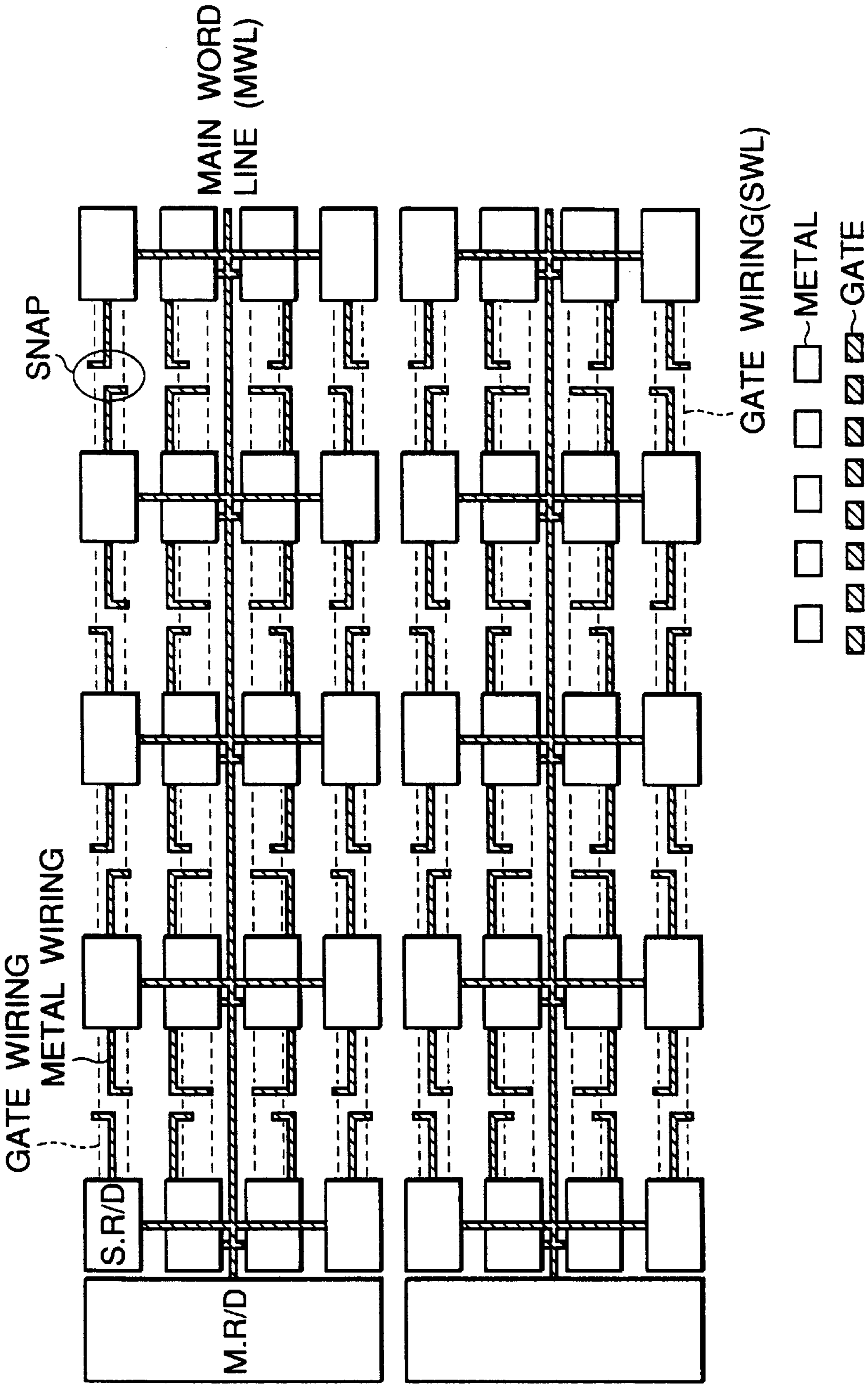
Figure 148B:
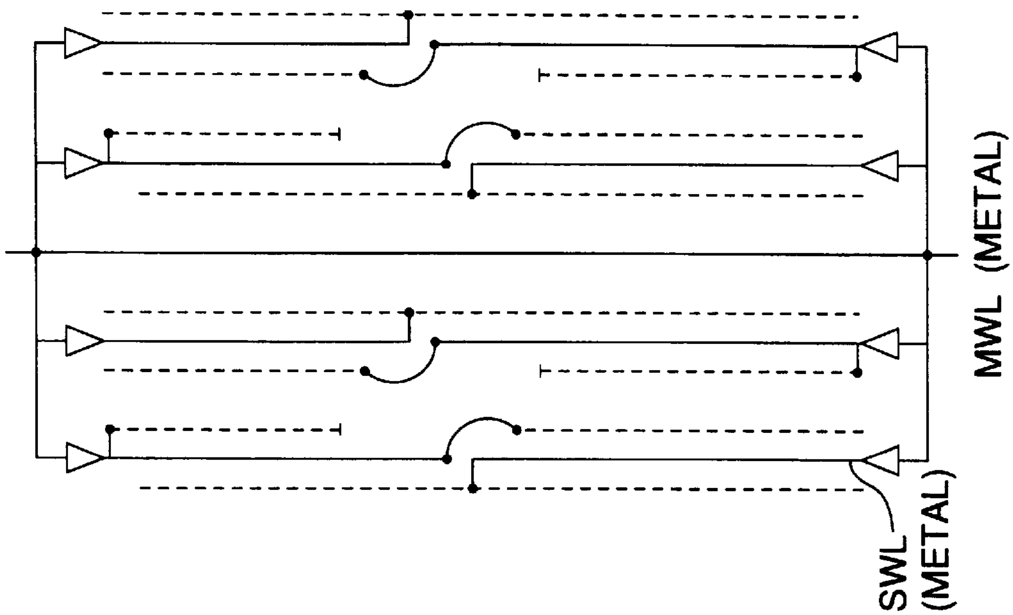
Figure 148A:
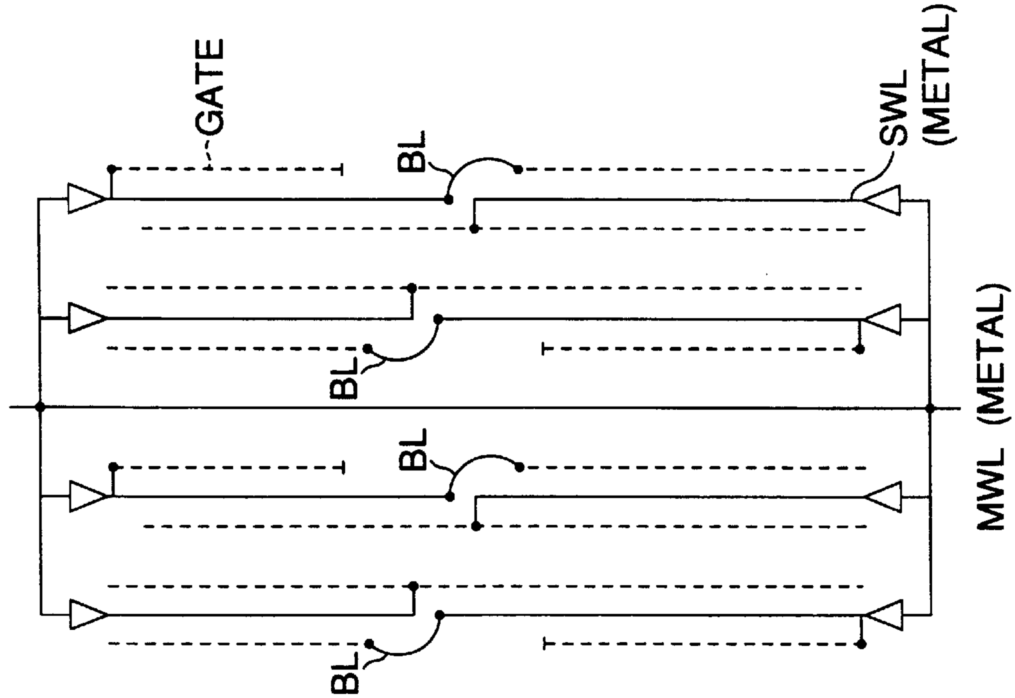
Figure 149A:
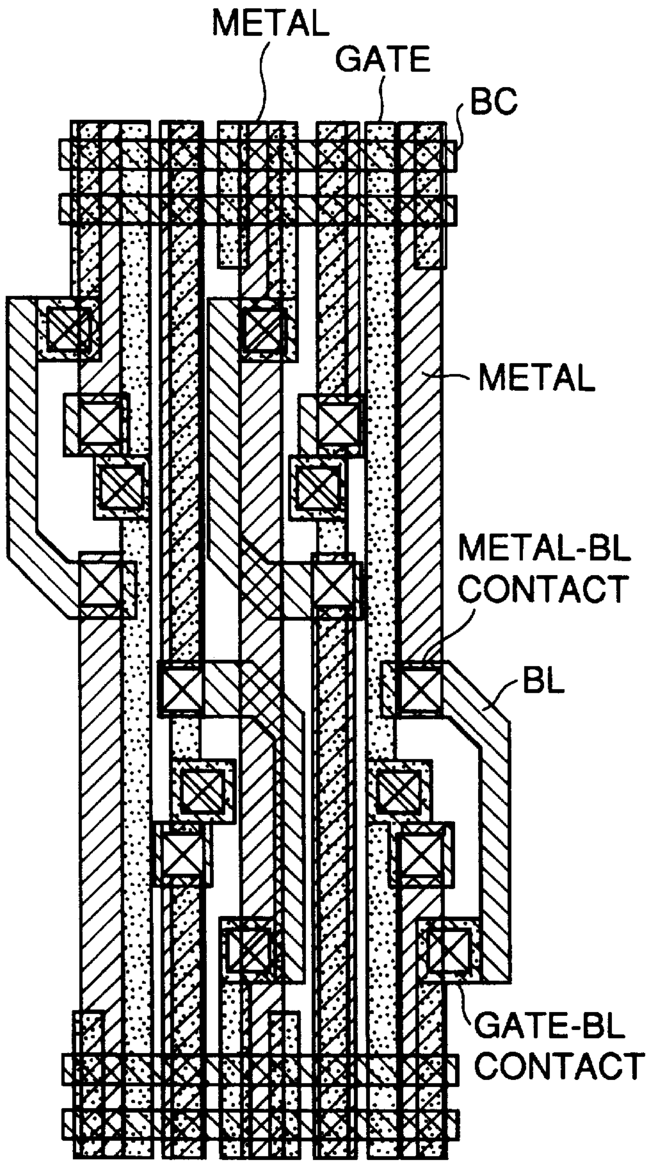
Figure 149B:
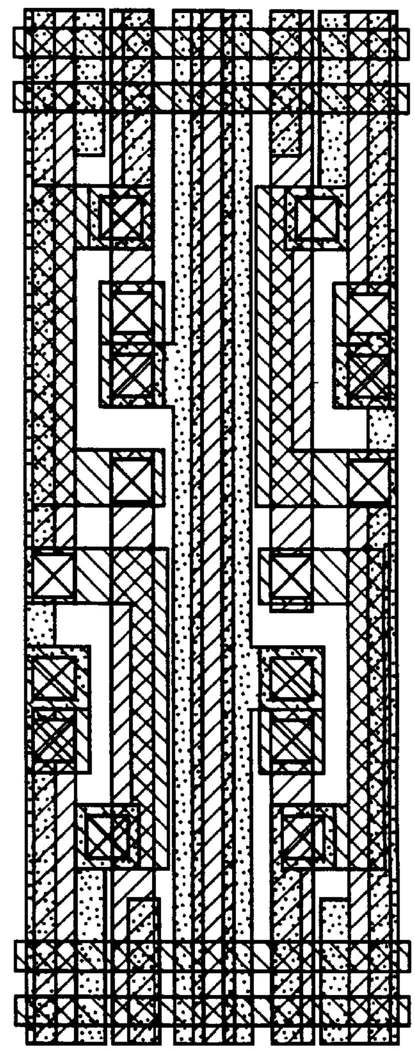
Figure 150A:
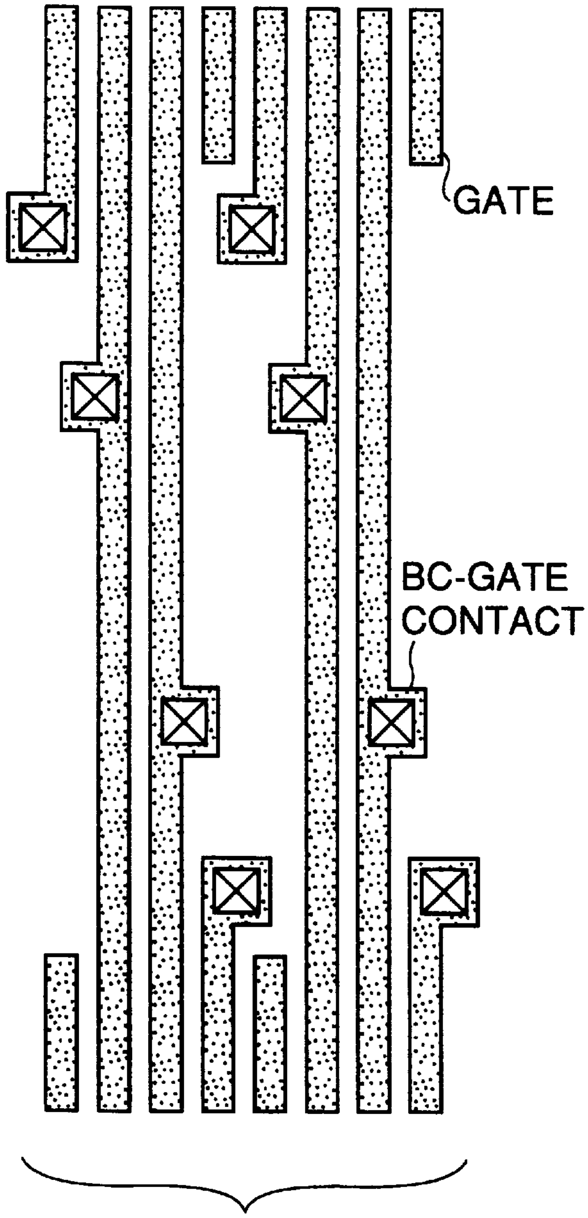
Figure 150B:
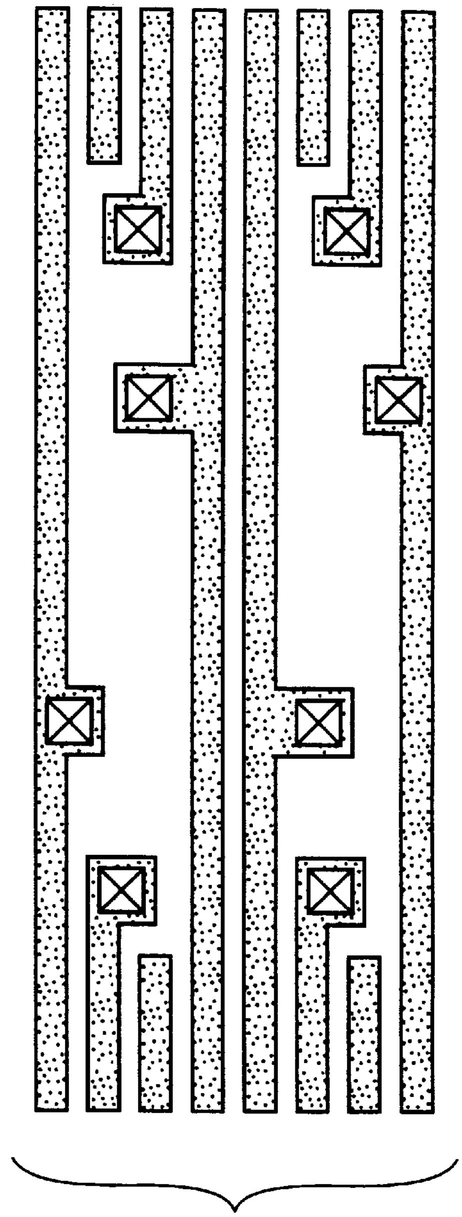
Figure 151A:
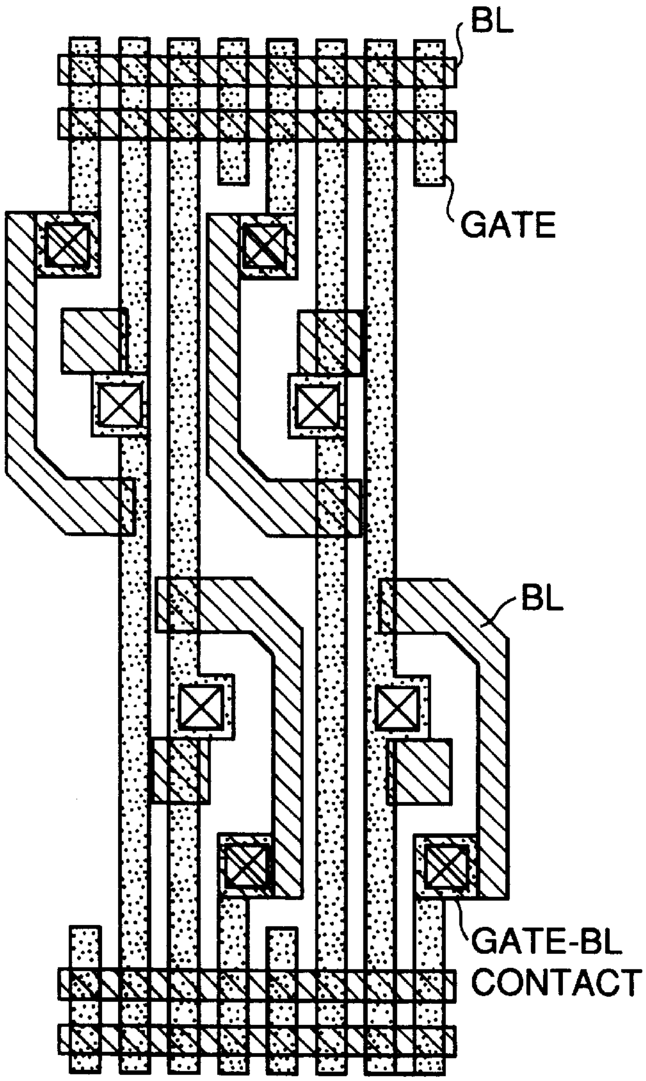
Figure 151B:
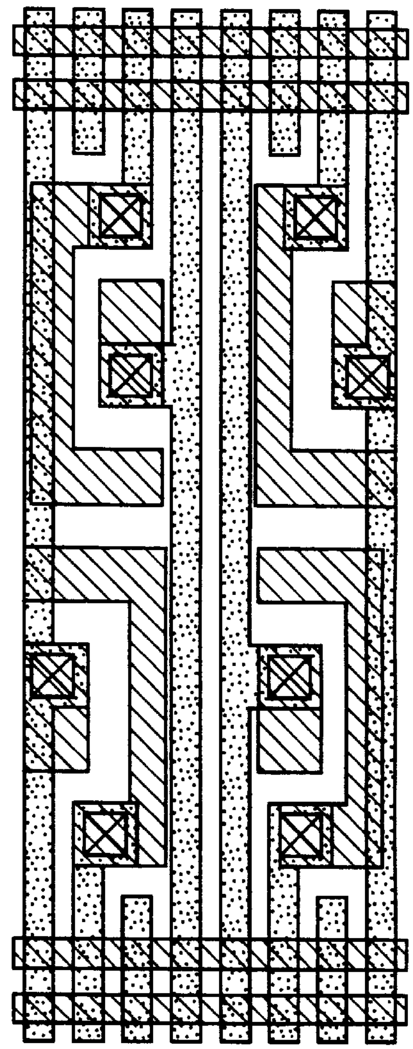
Figure 152A:
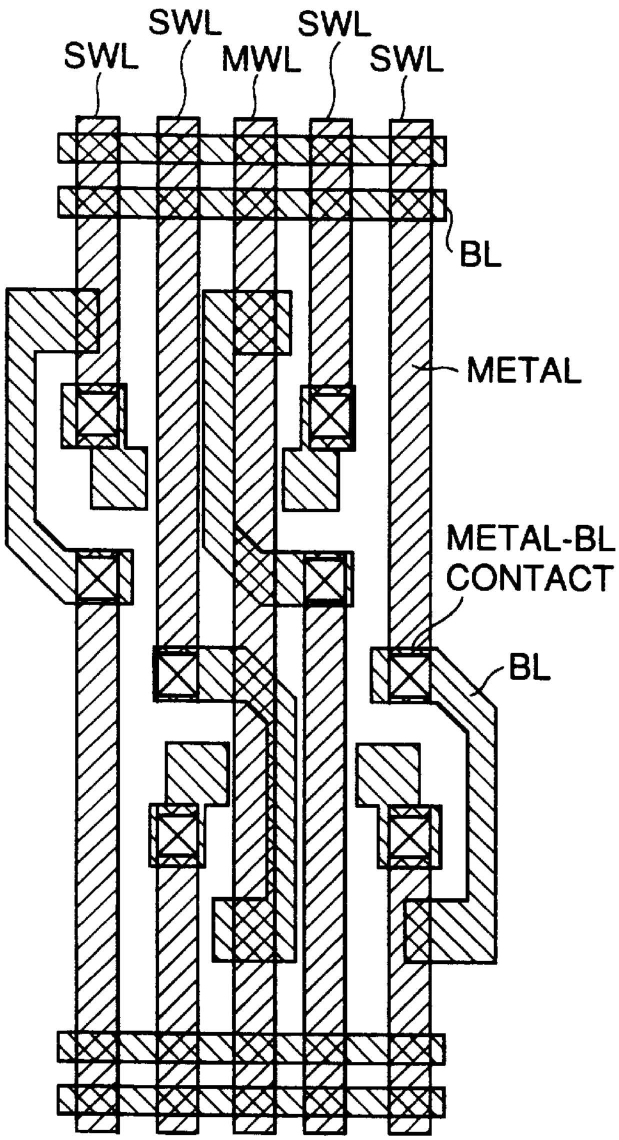
Figure 152B:
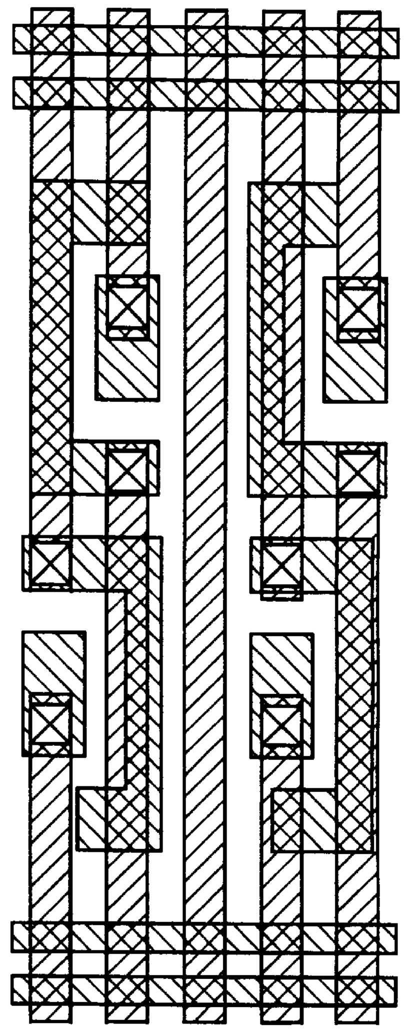
Figure 153:
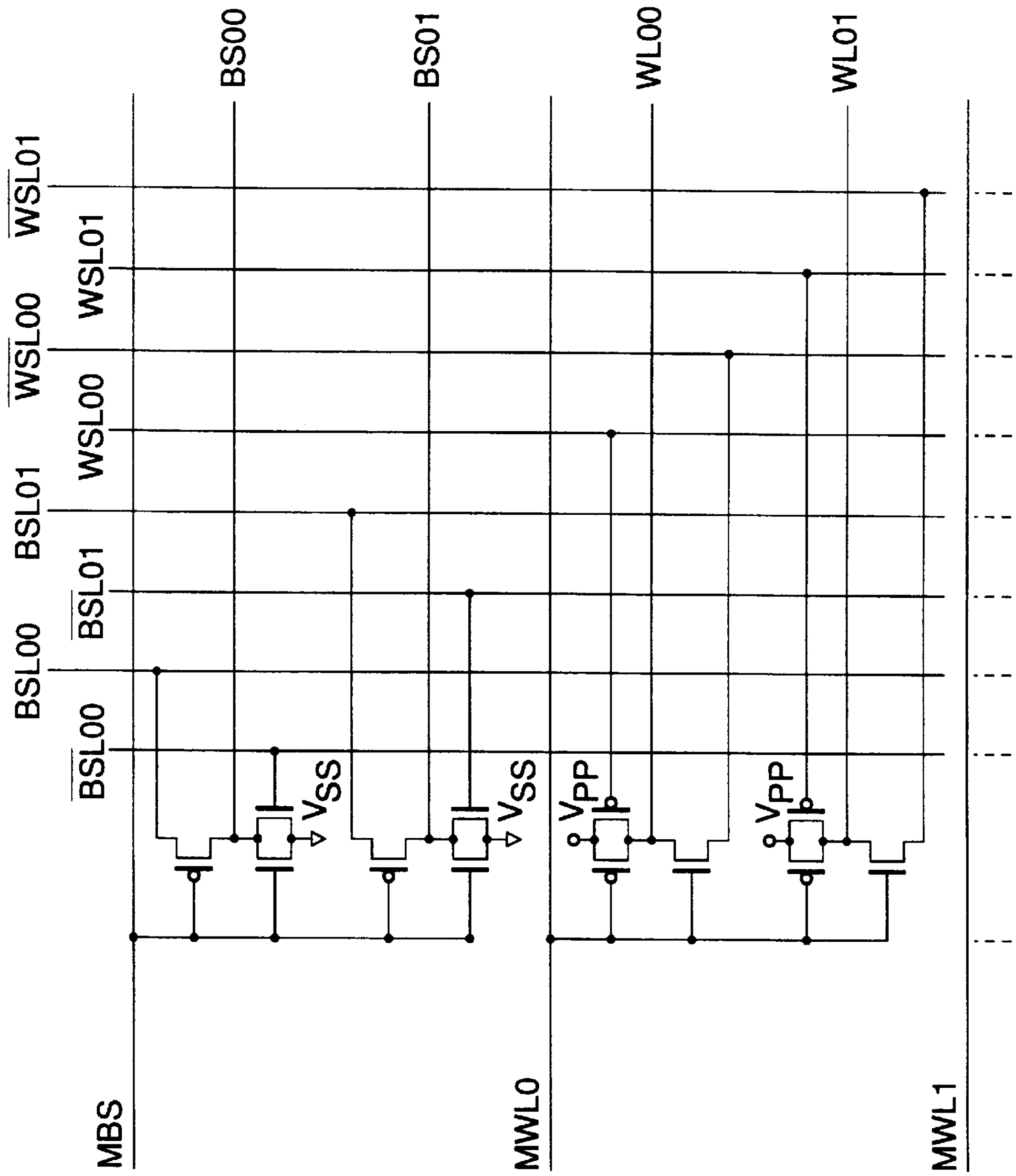
Figure 154:
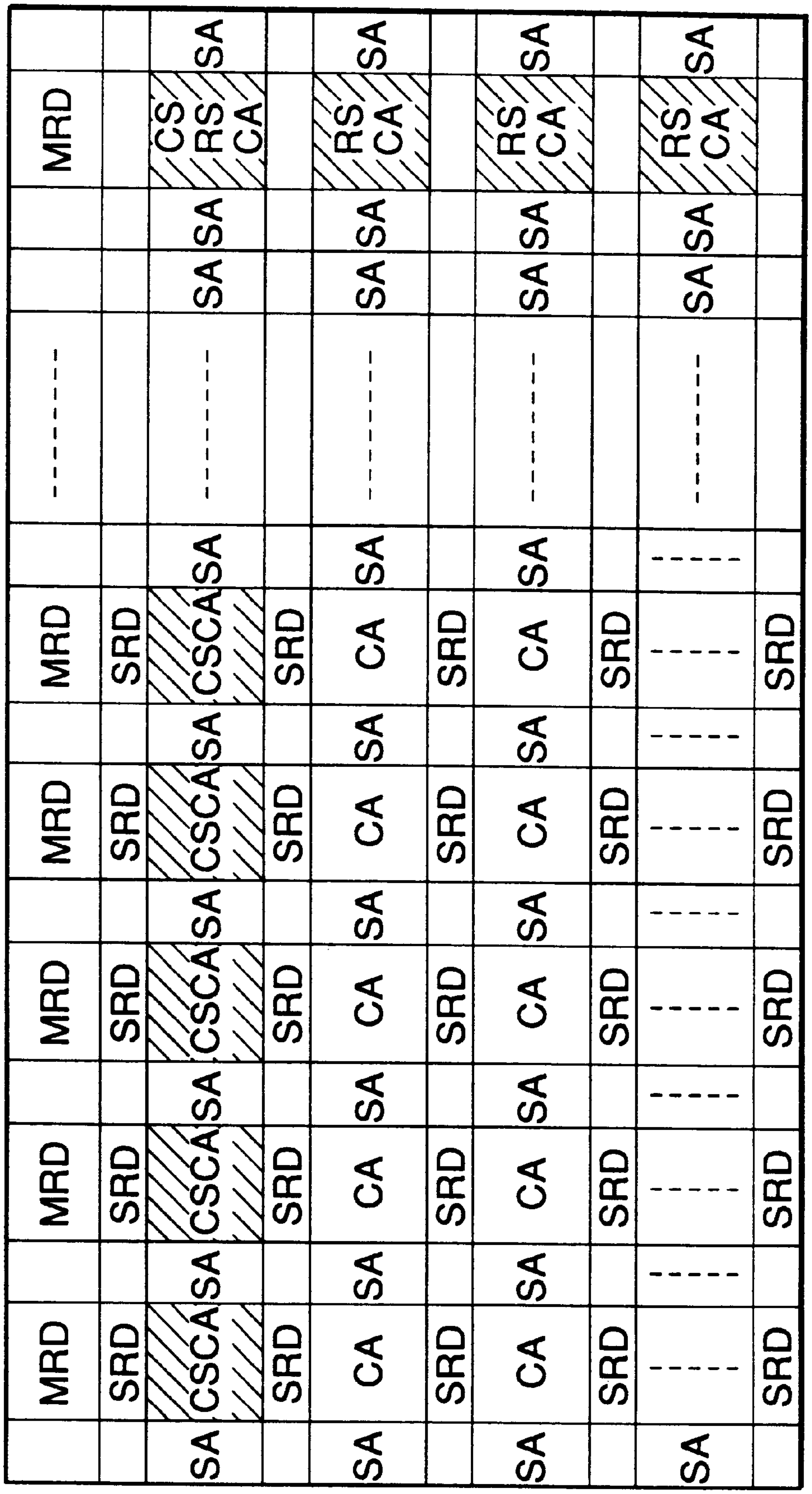
Figure 155:
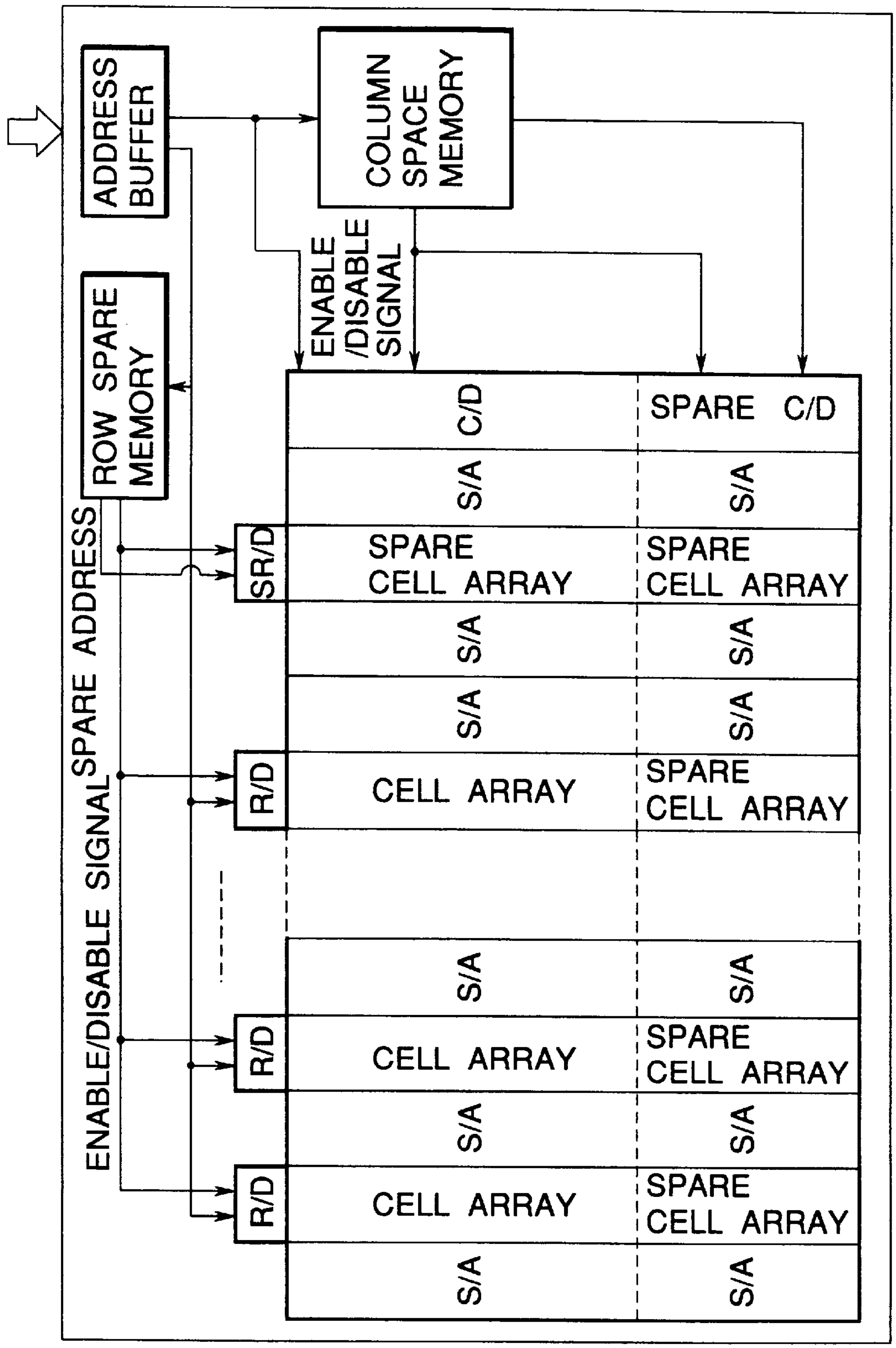
Figure 156:
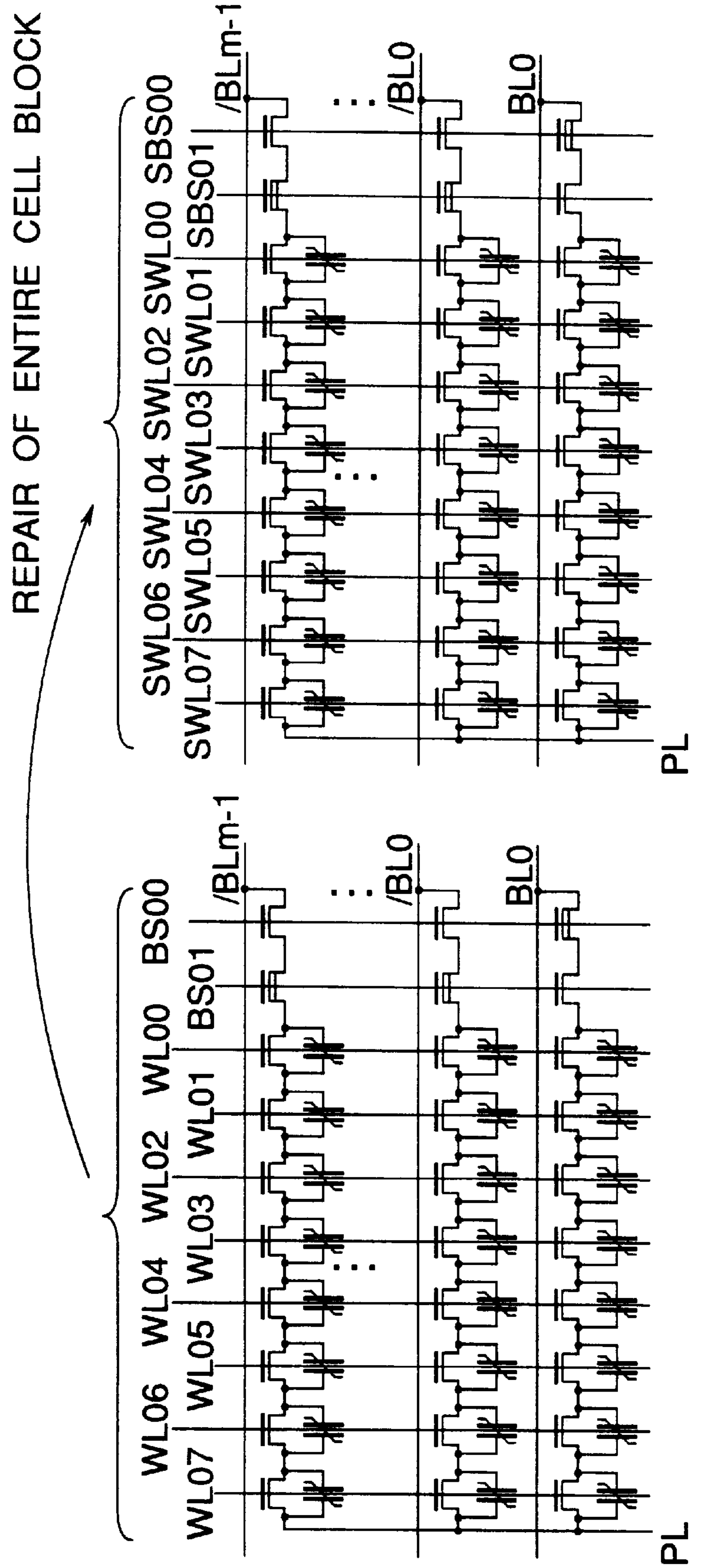
Figure 157:
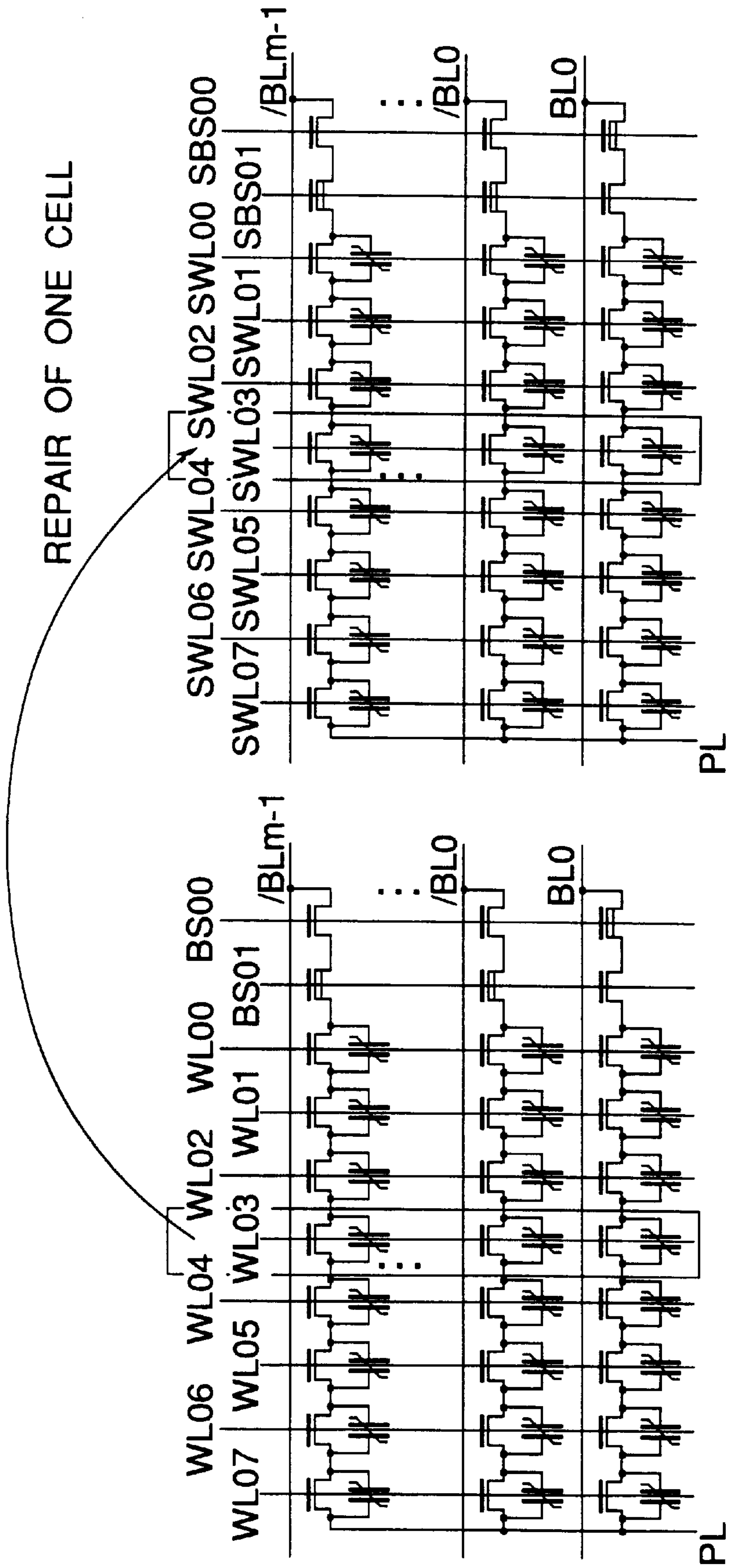
Figure 158:
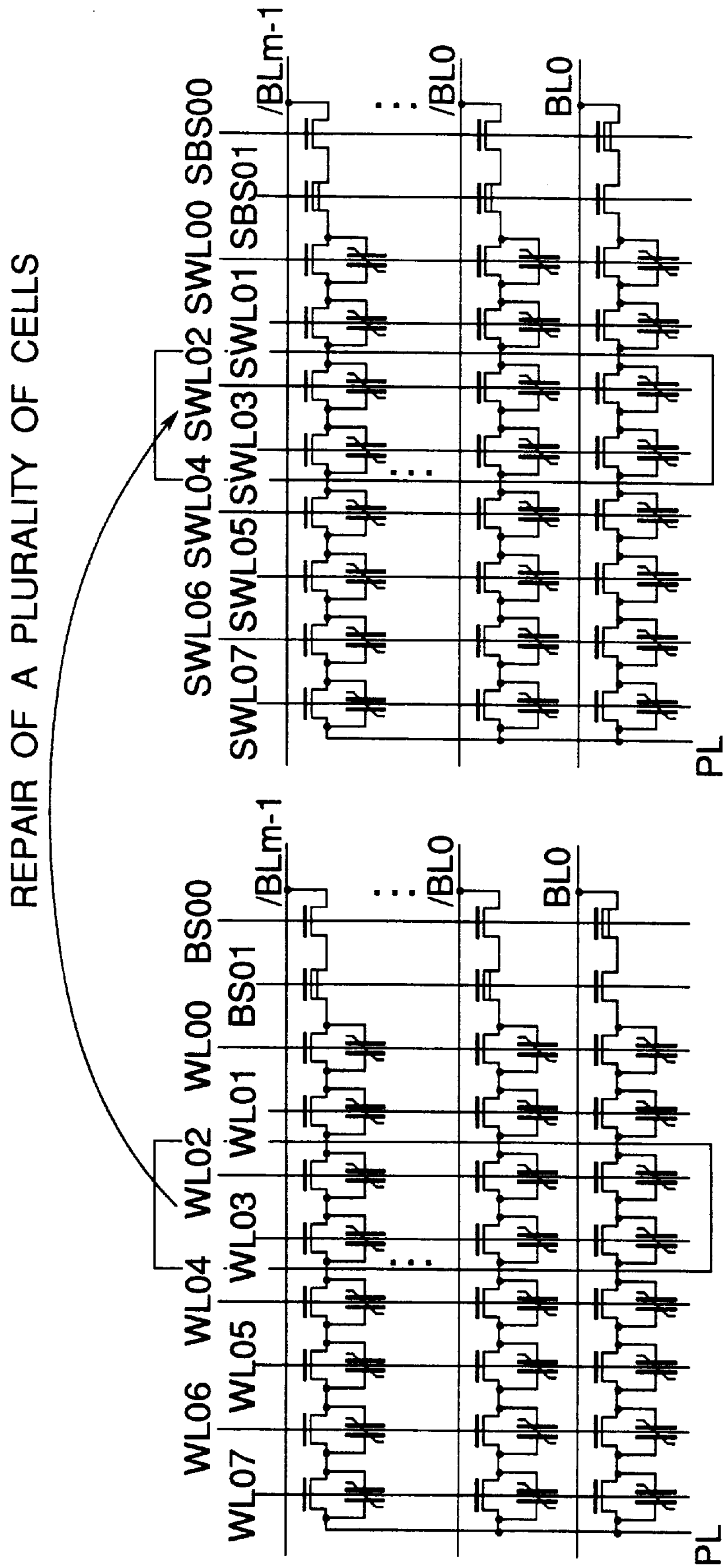
Figure 159:
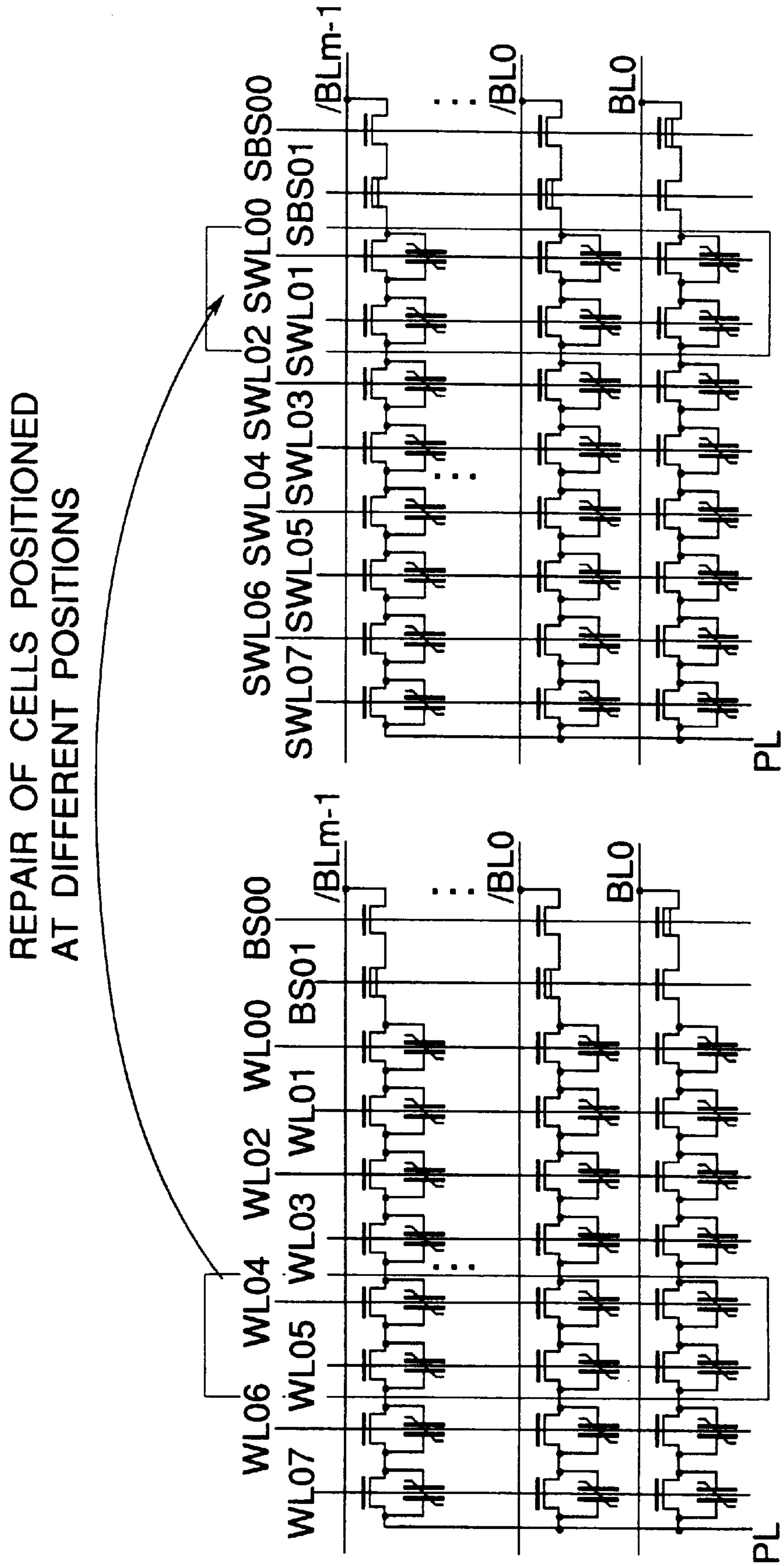
Figure 160:
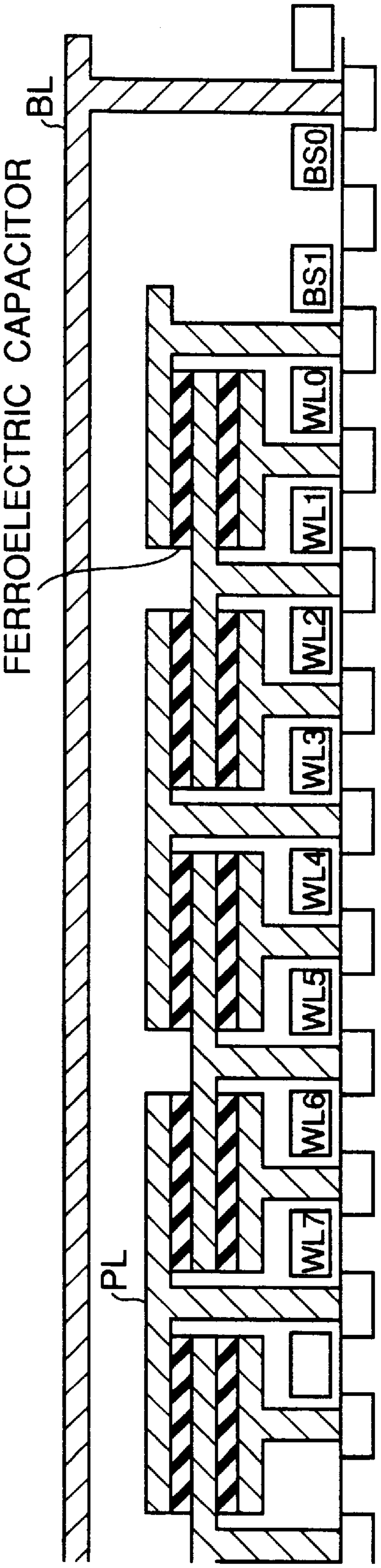
Figure 161:
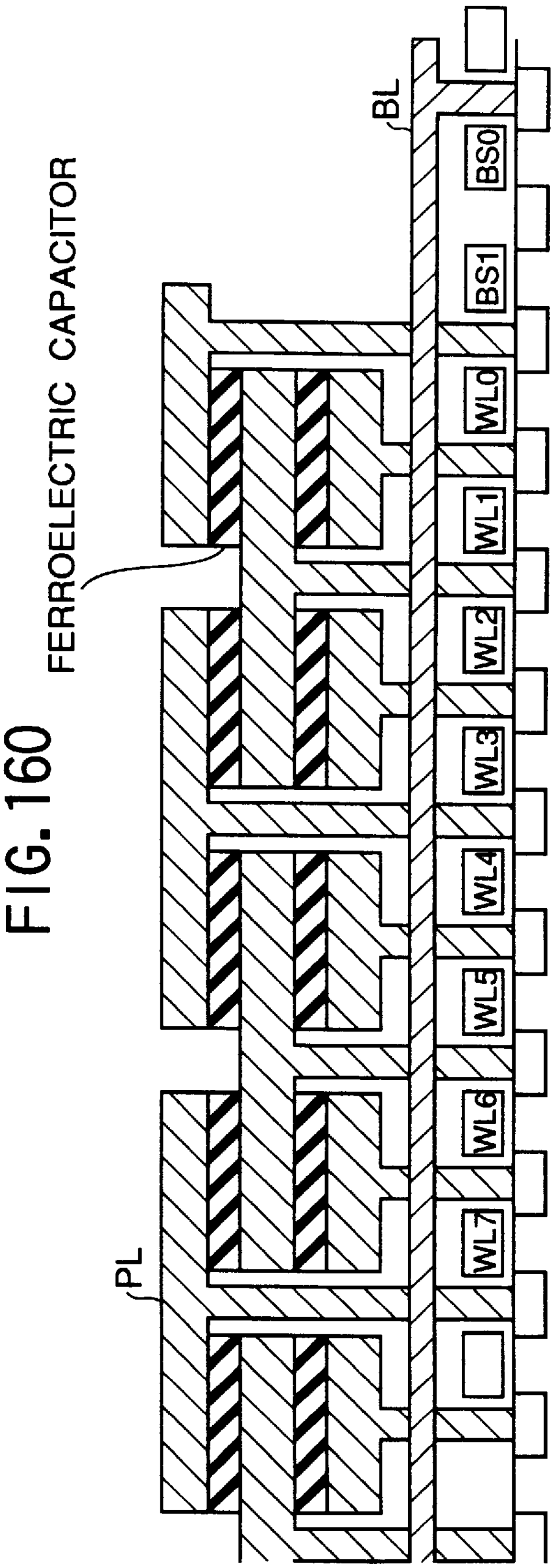
Figure 162:
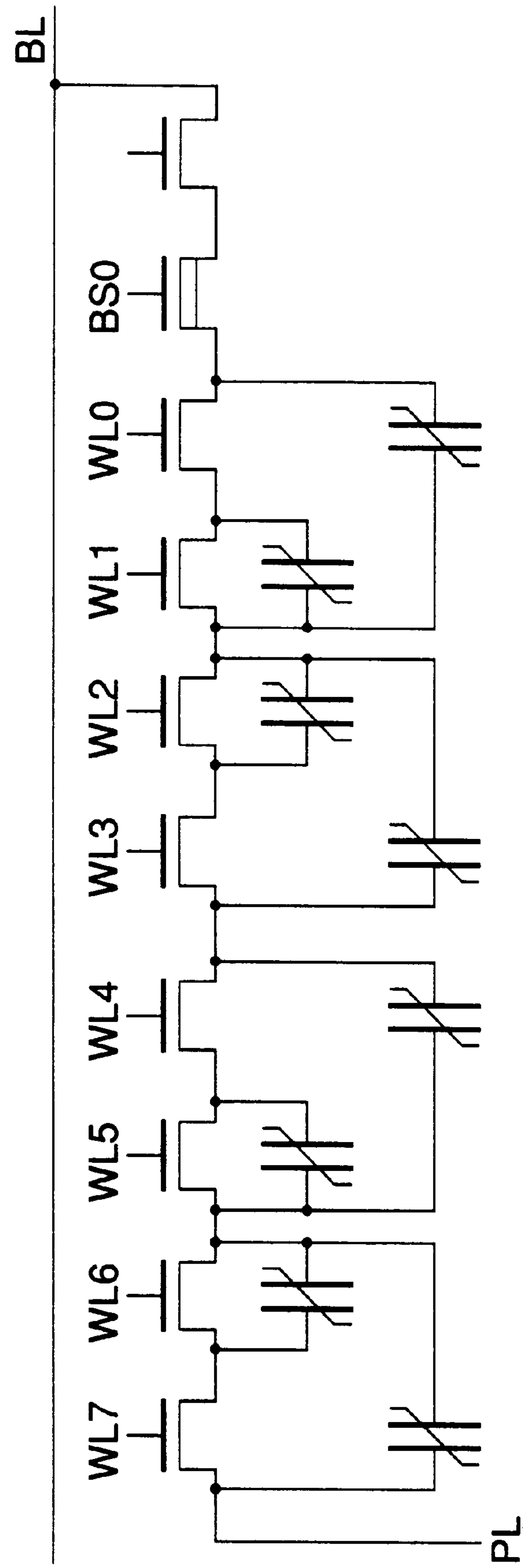
Figure 163:
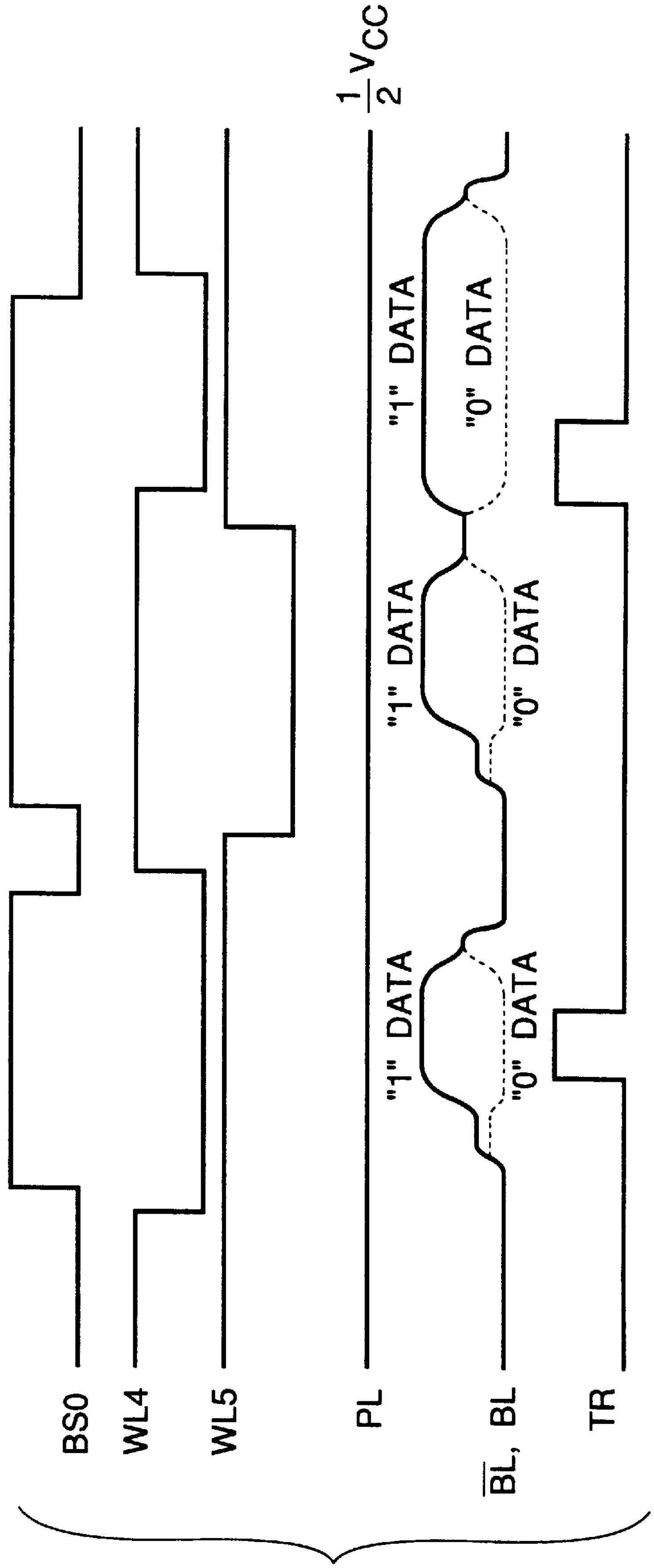
Figure 168:
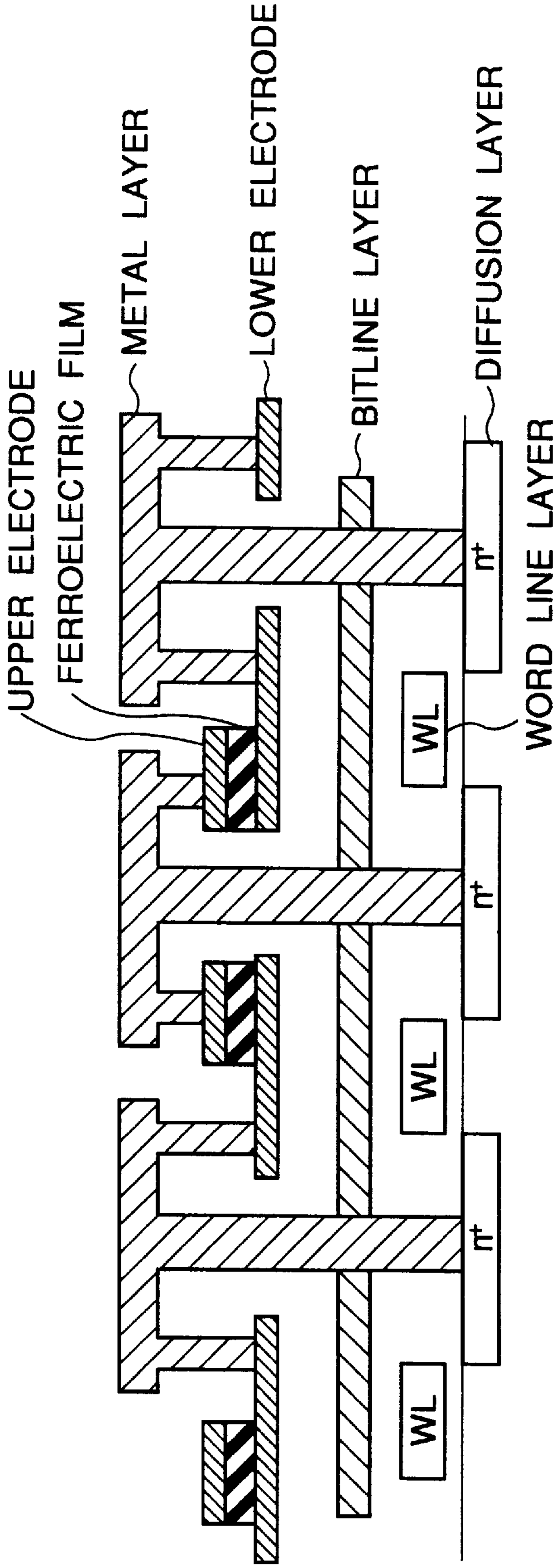
Figure 169A:
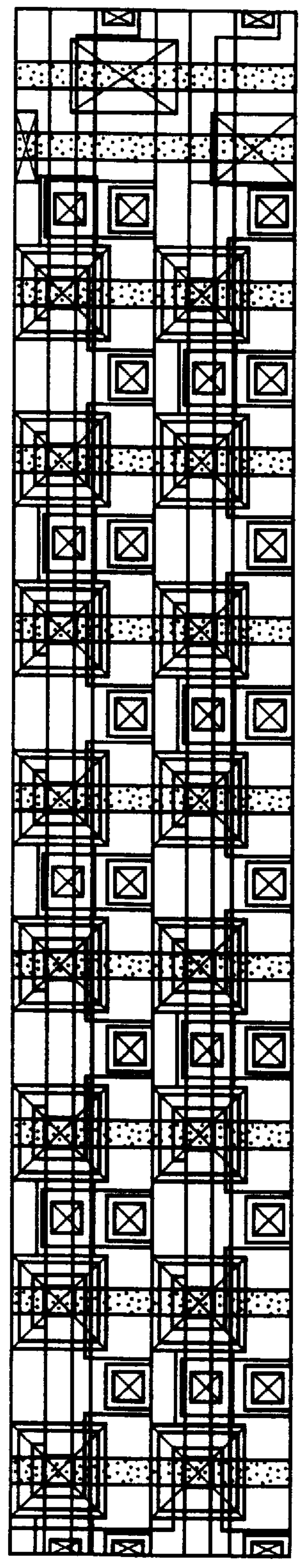
Figure 169B:
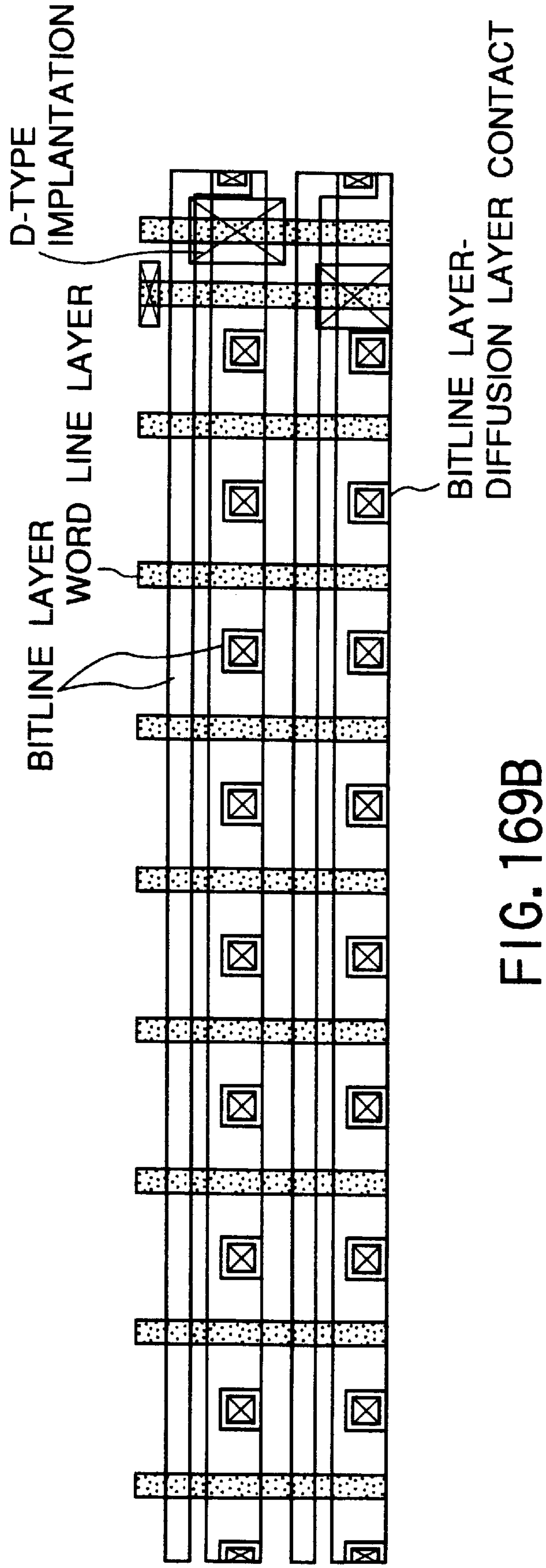
Figure 169C:
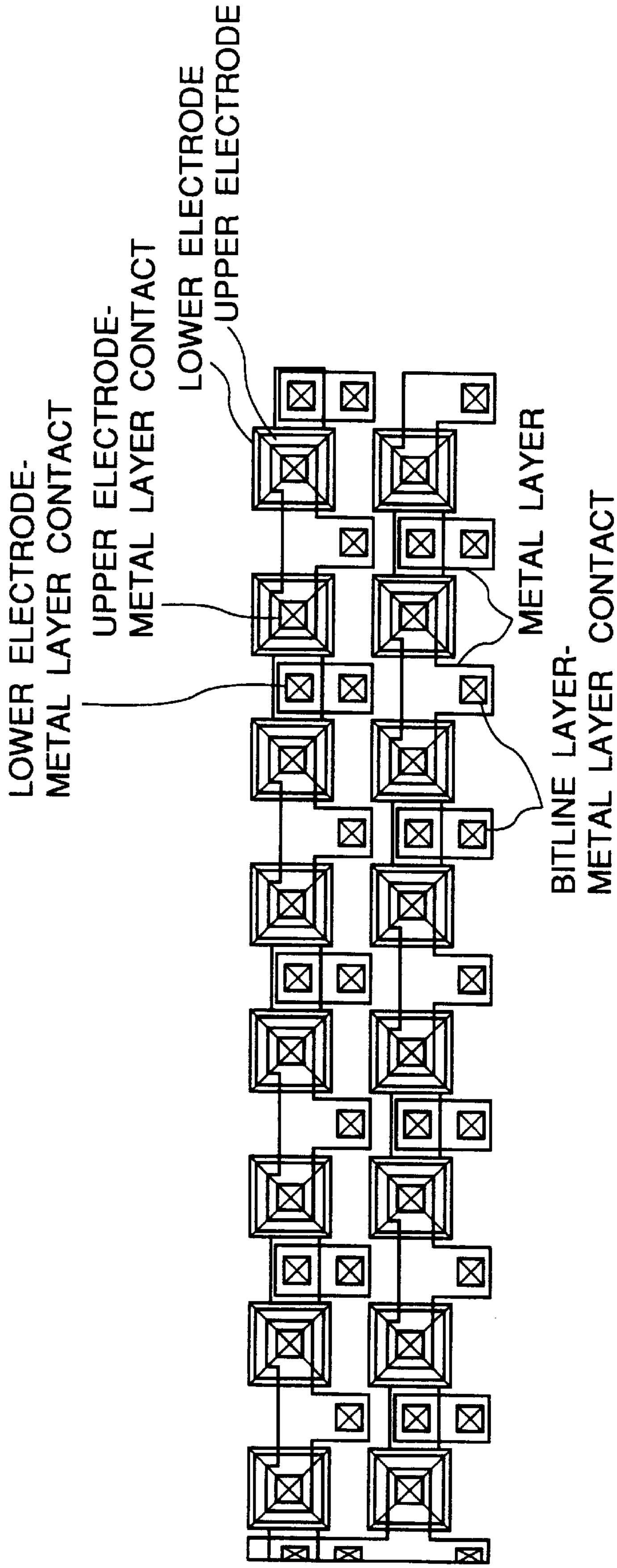
Figure 170A:
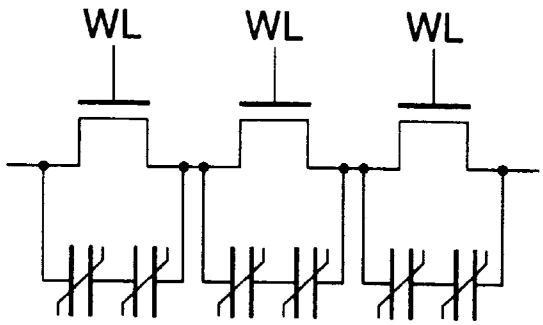
Figure 170B:
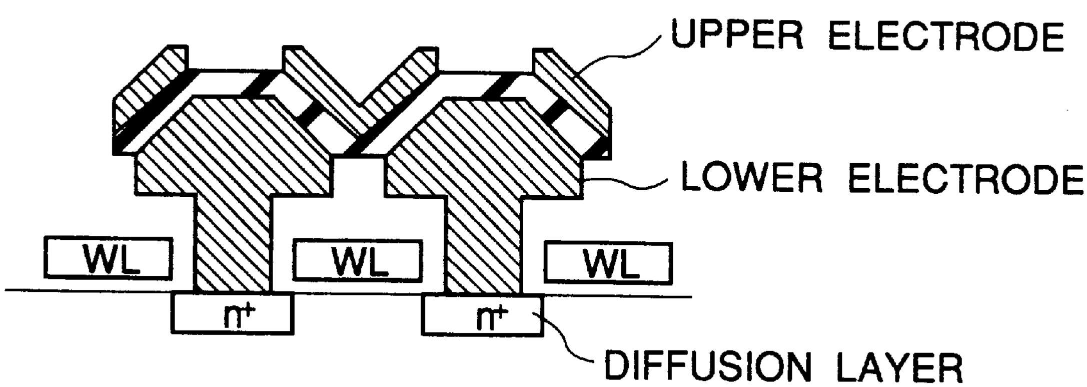
Figure 172:
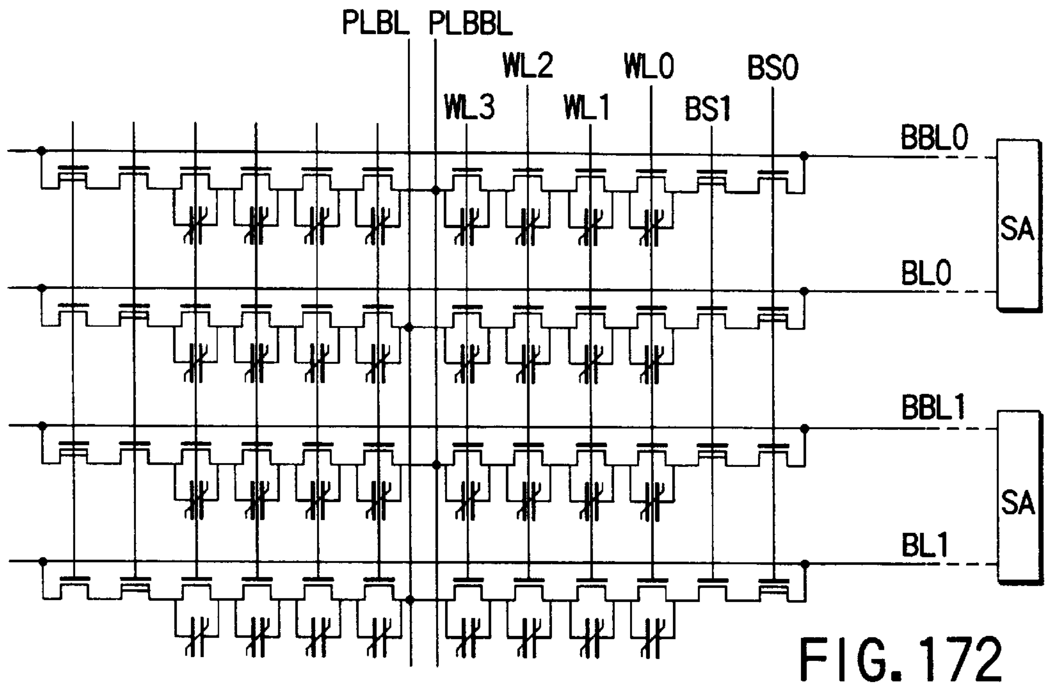
Figure 173A:
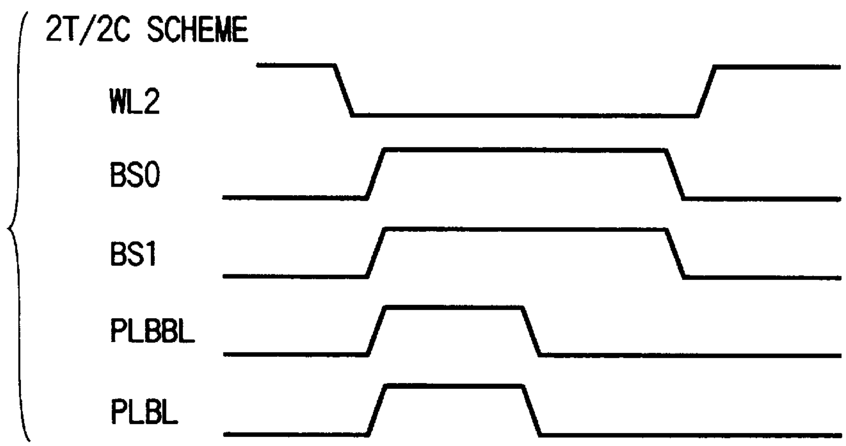
Figure 173B:
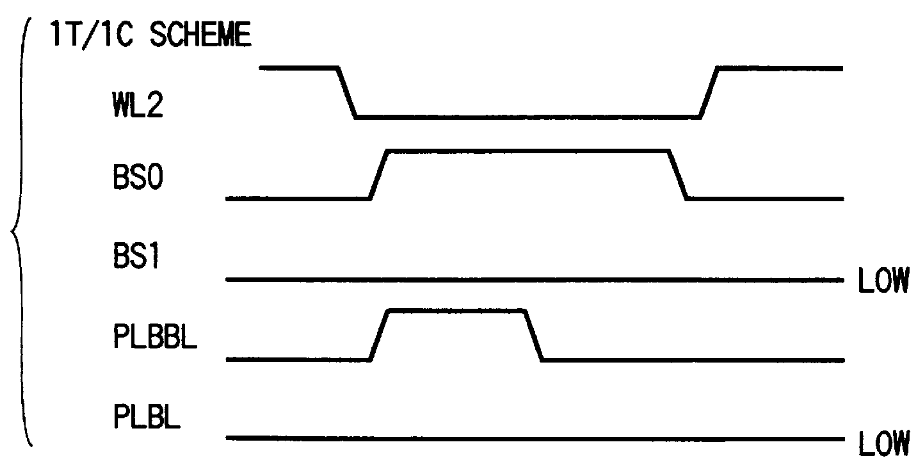
Figure 174:
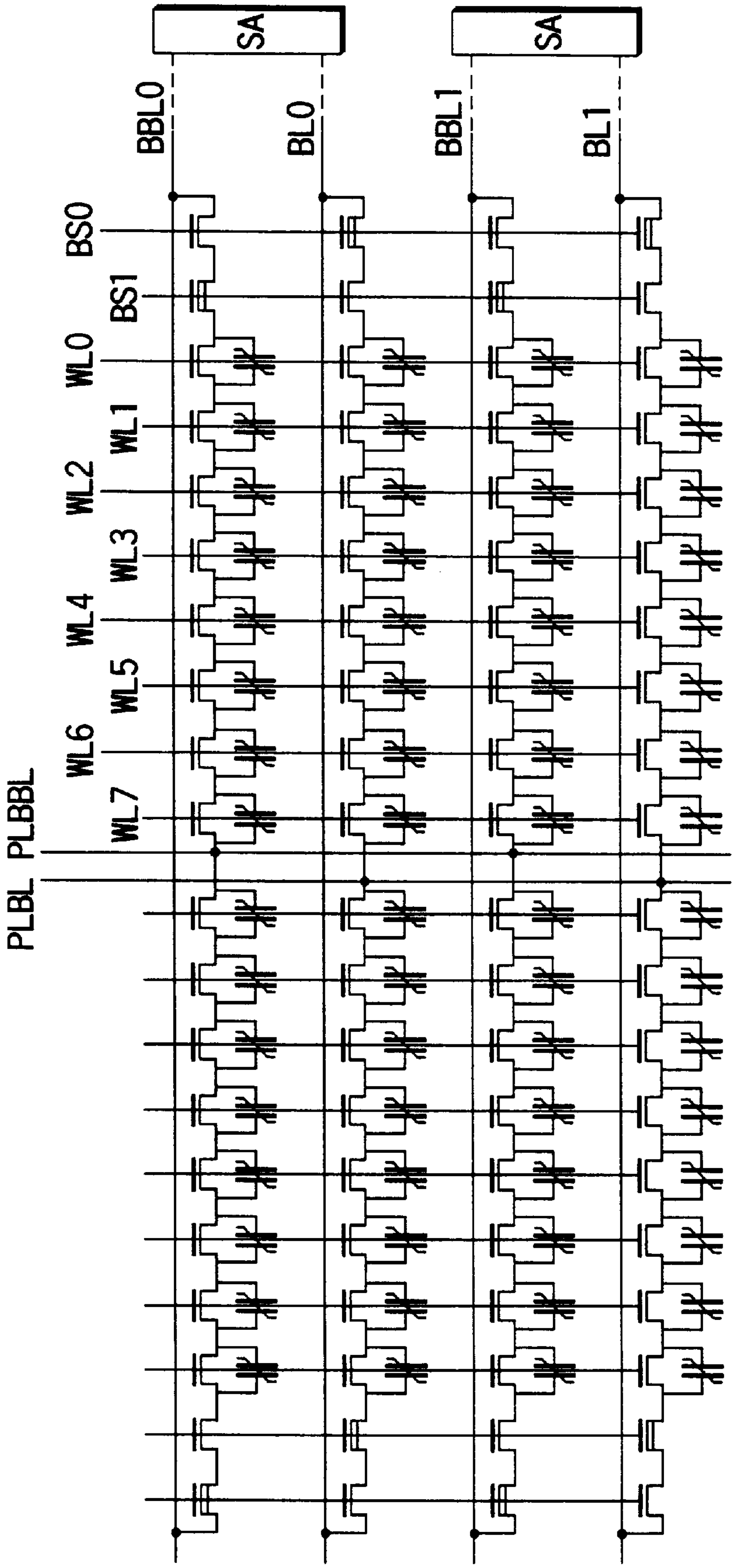
Figure 175:
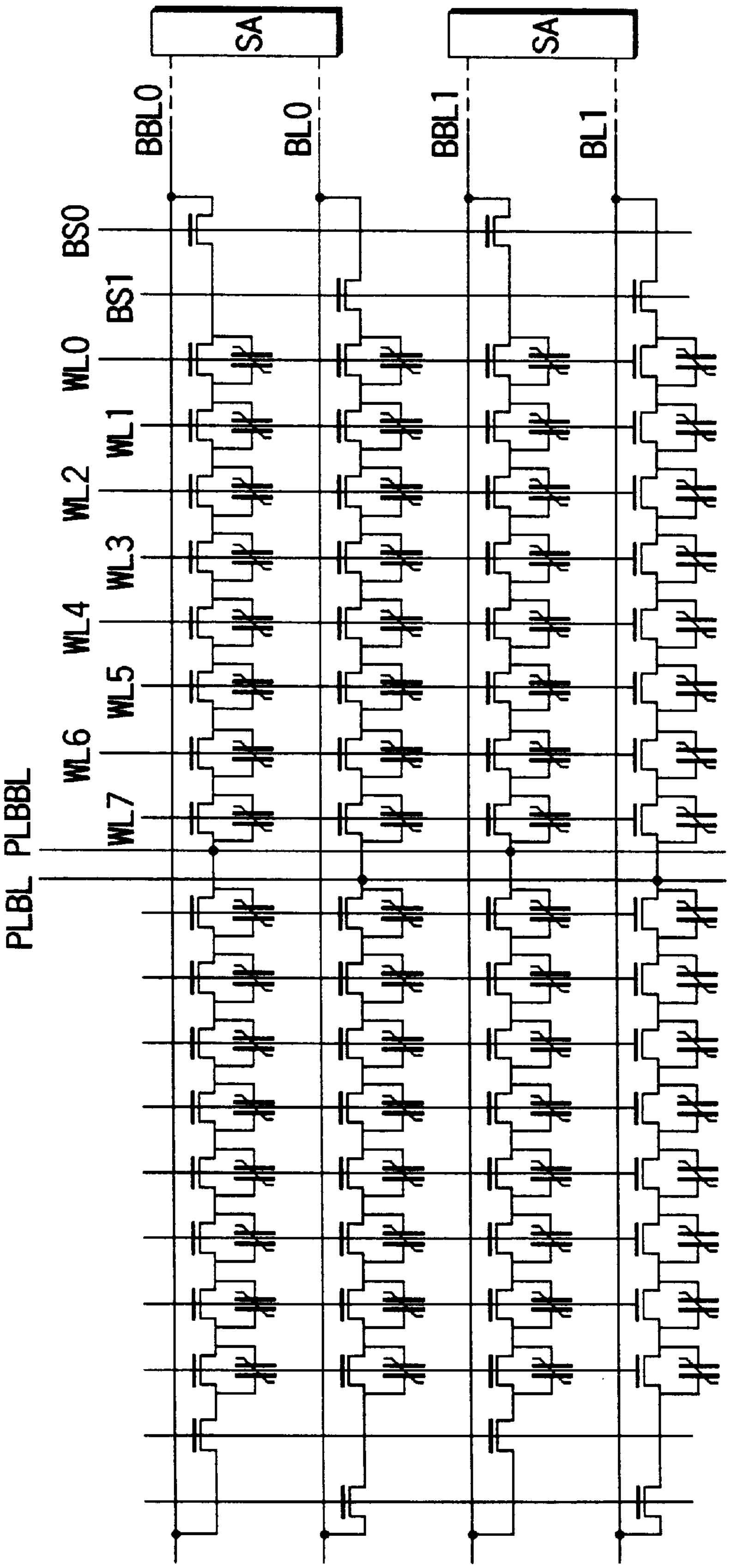
Figure 176:
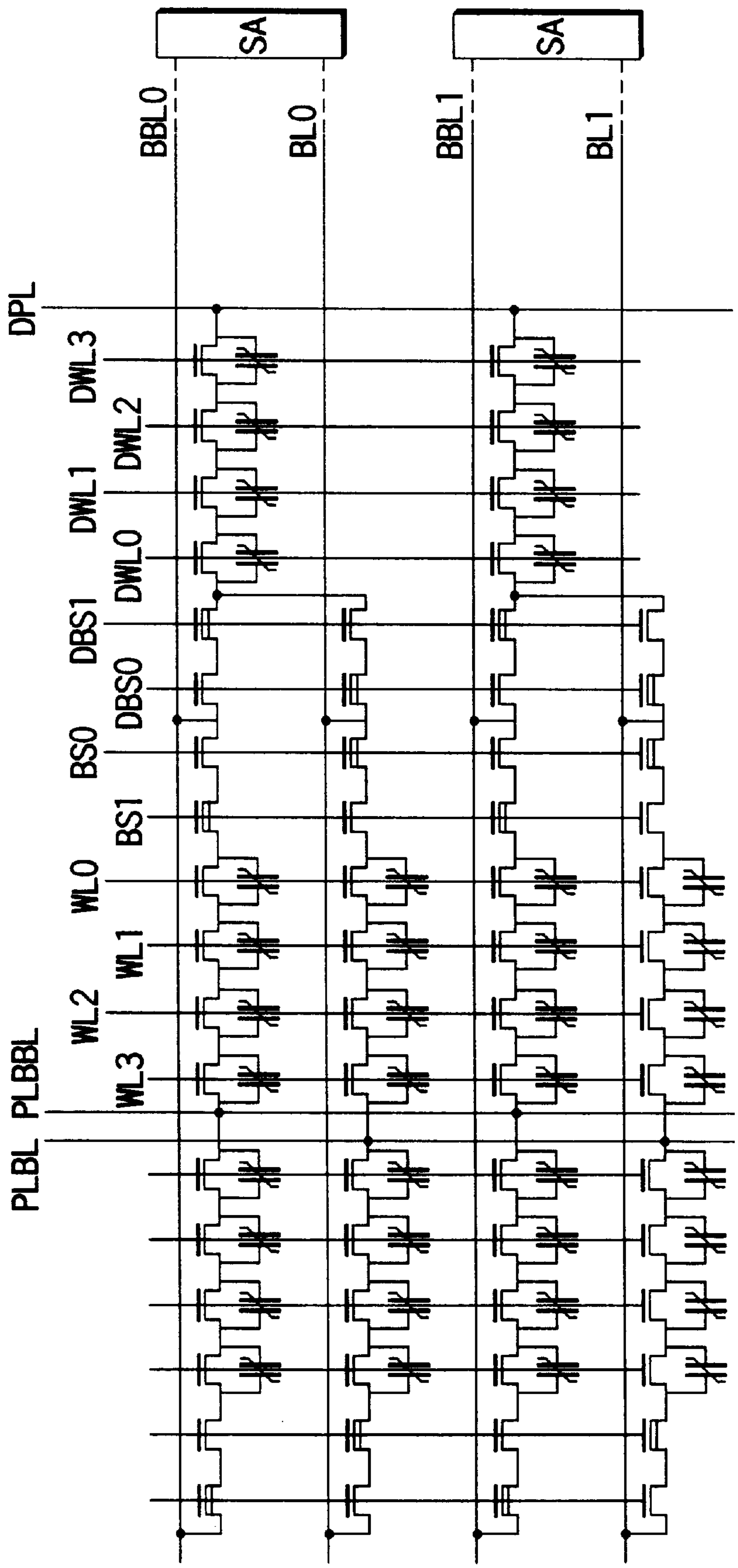
Figure 177A:
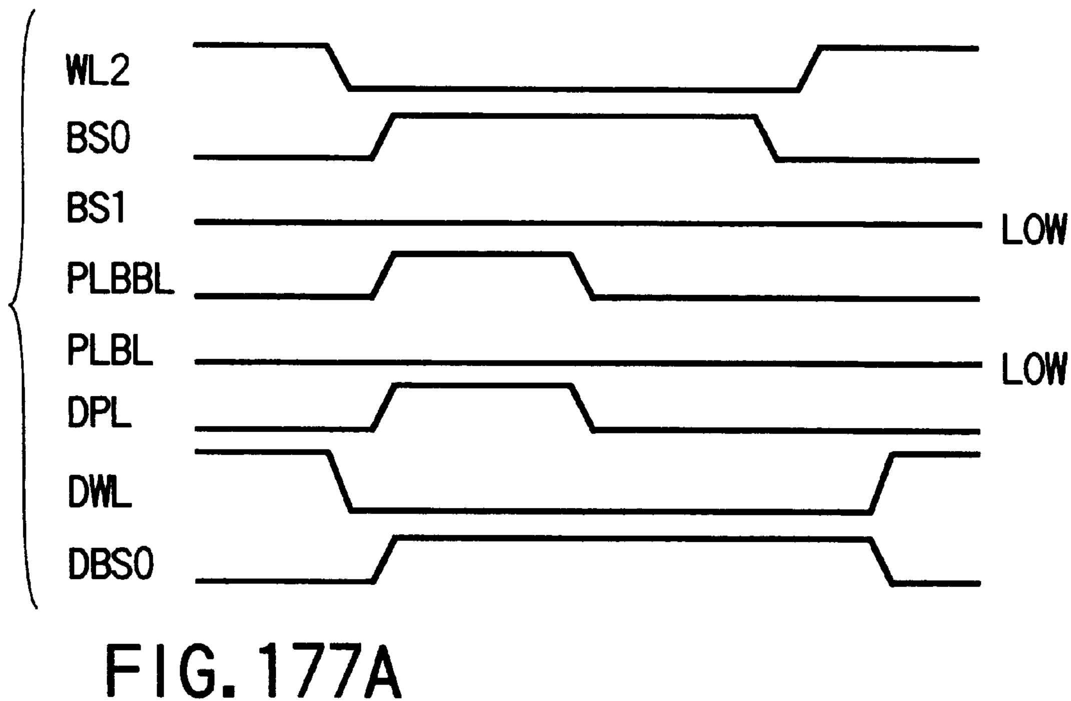
Figure 177B:
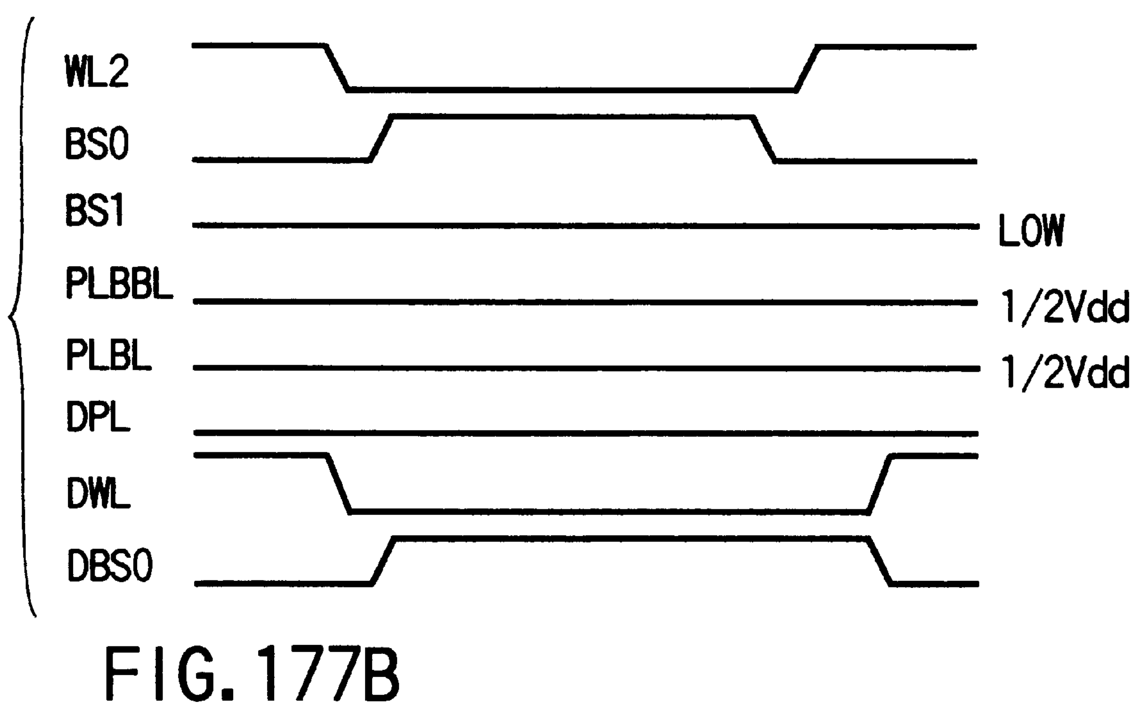
Figure 178:
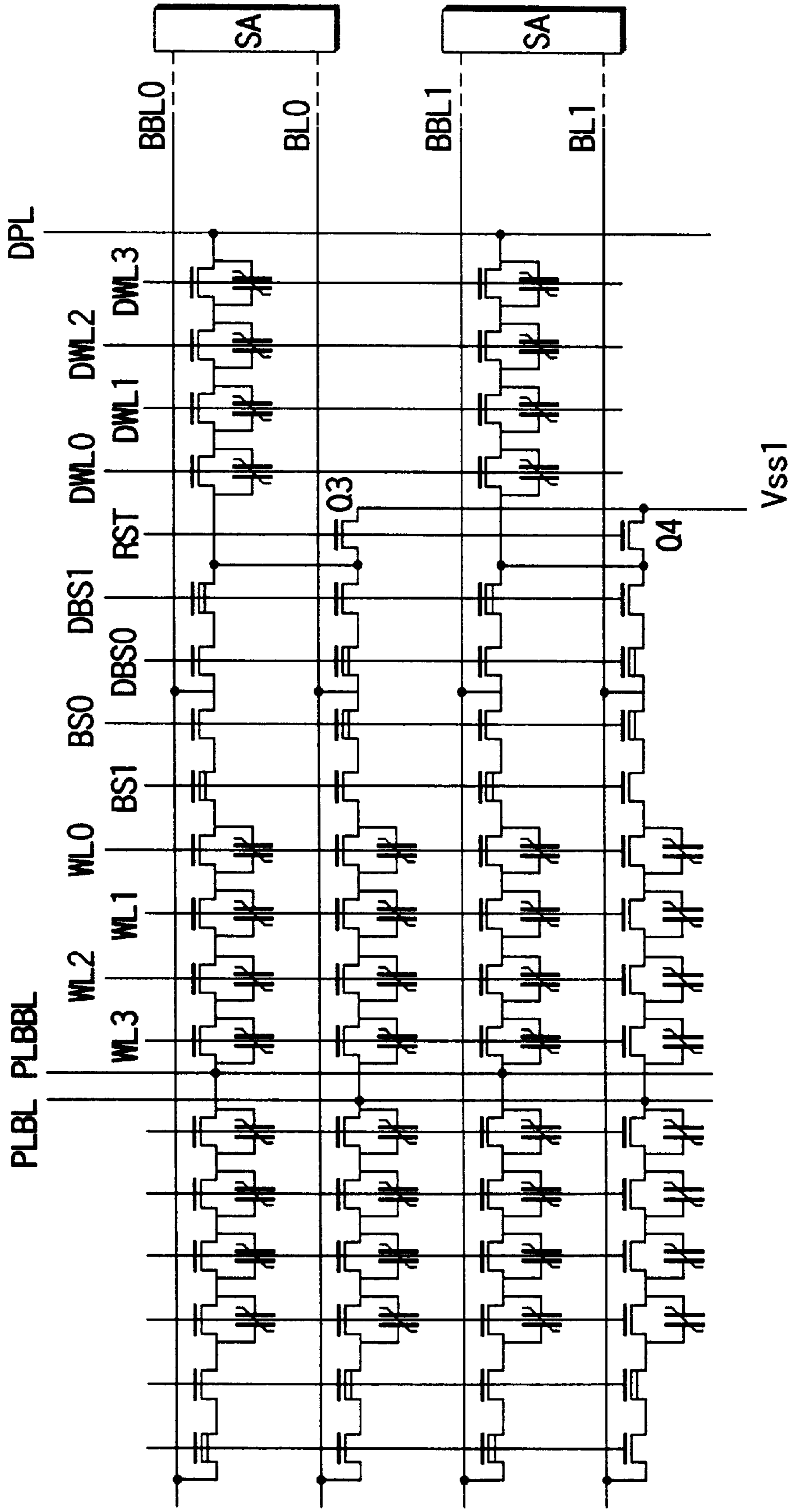
Figure 179A:
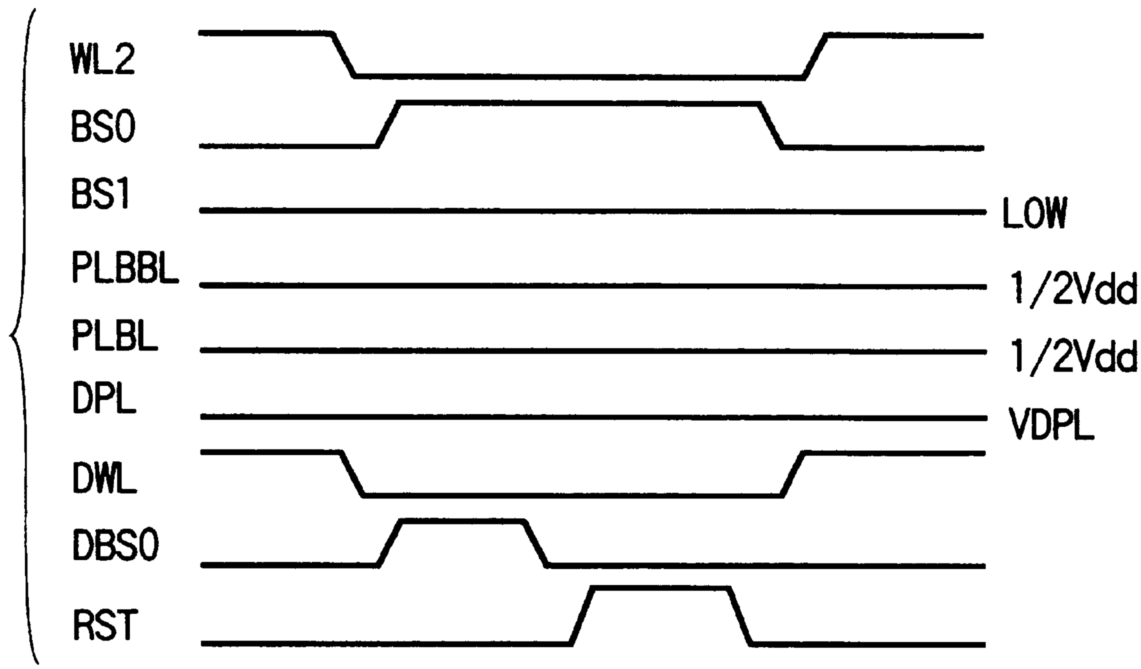
Figure 179B:
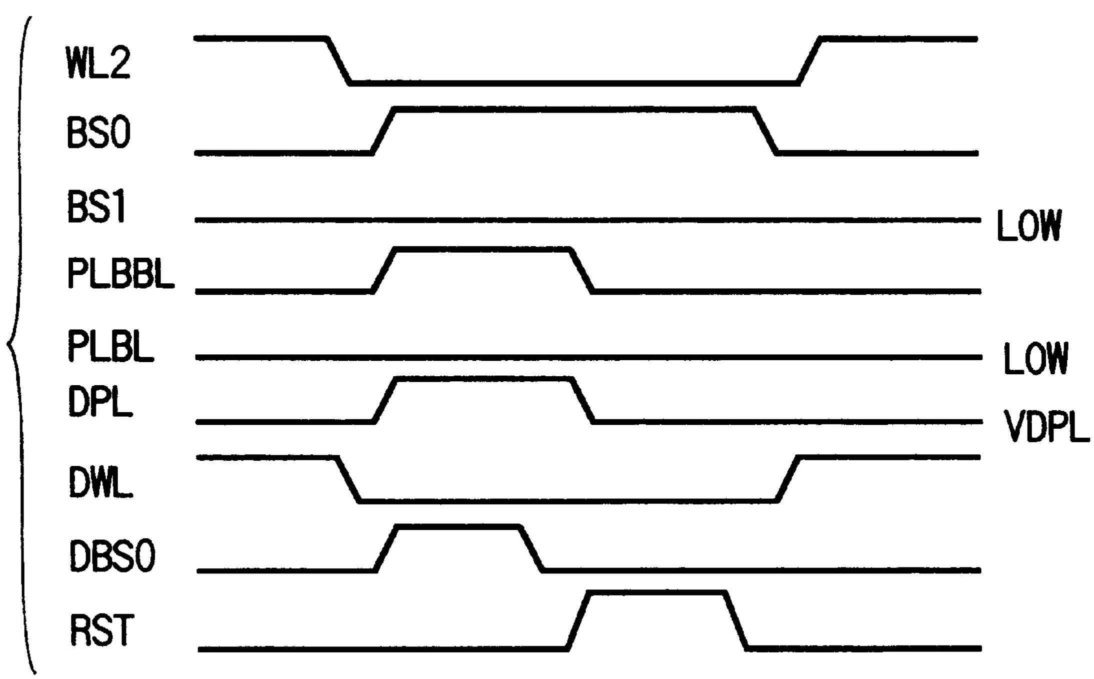
Figure 180:
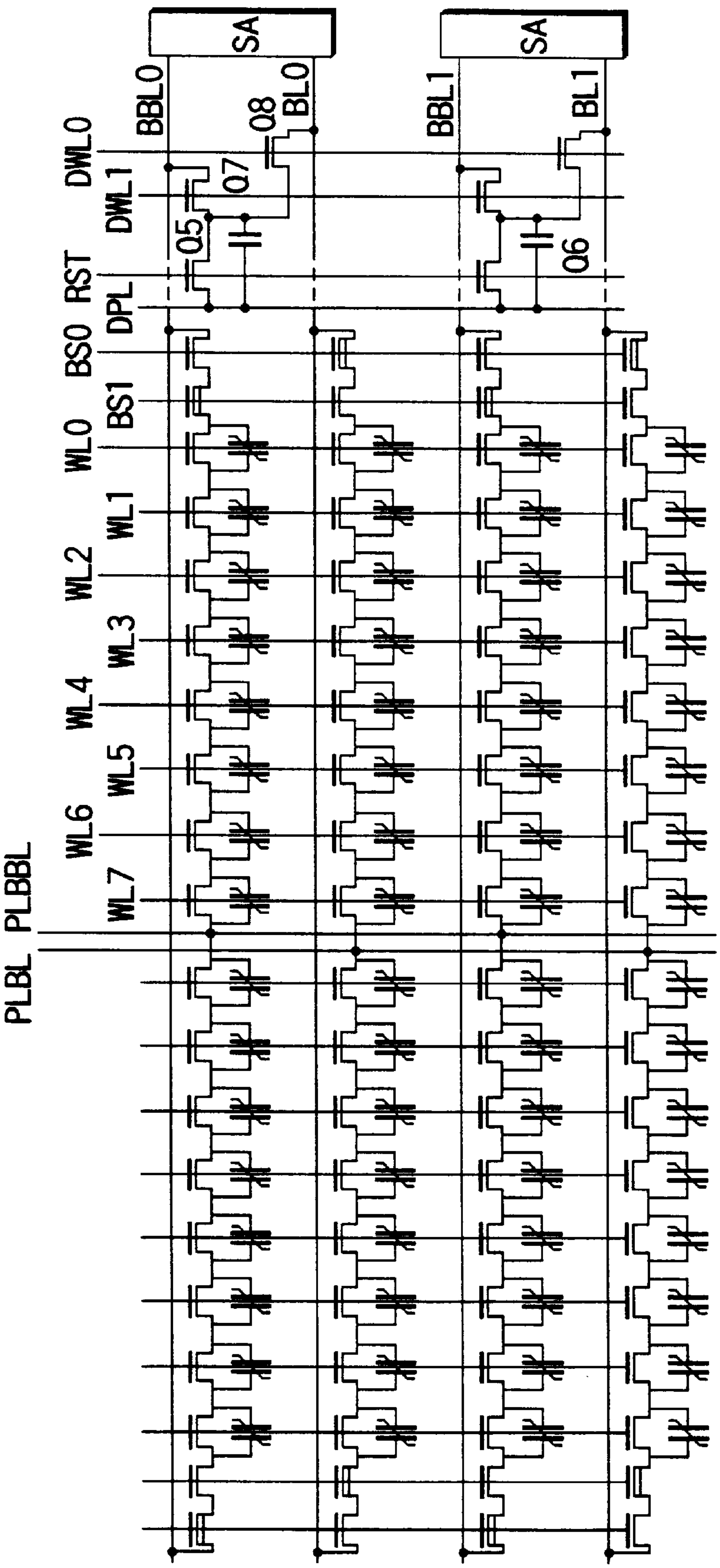
Figure 181:
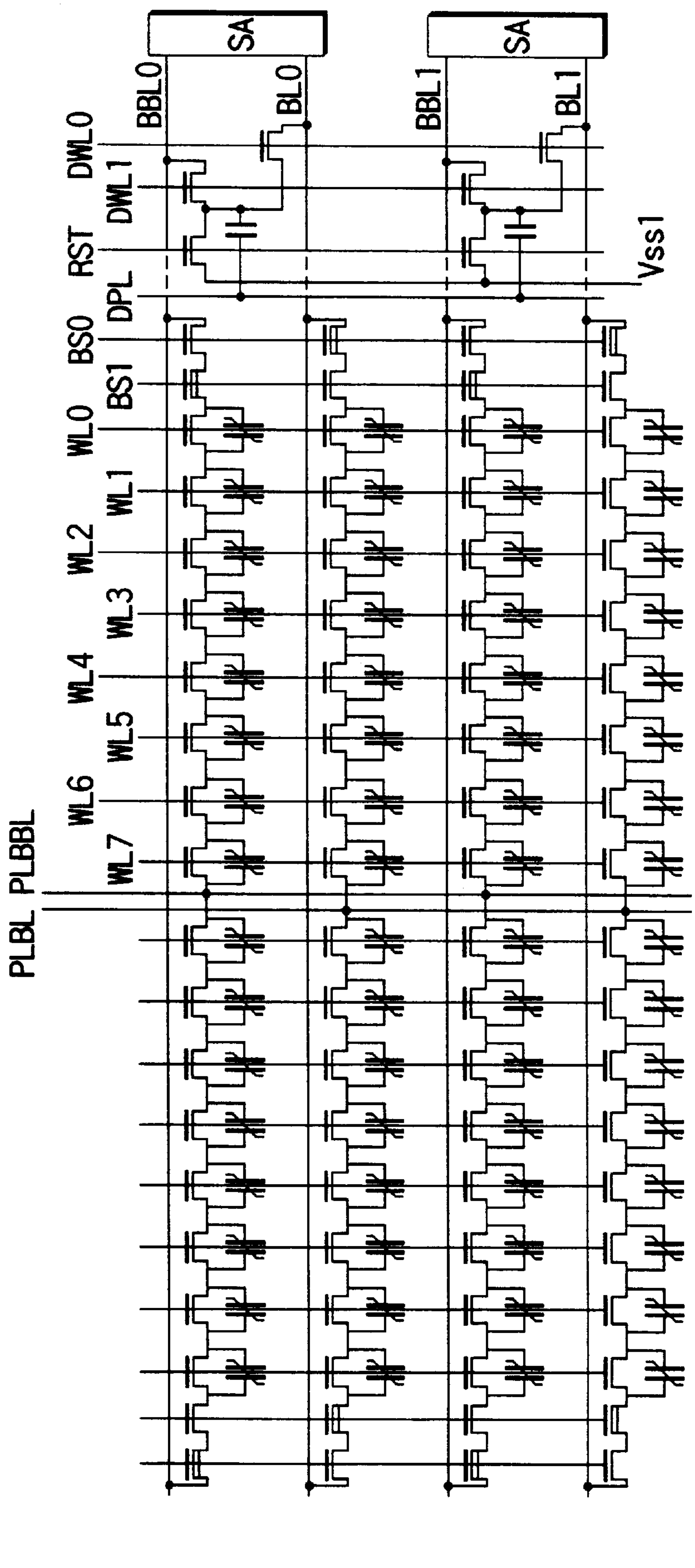
Figure 182A:
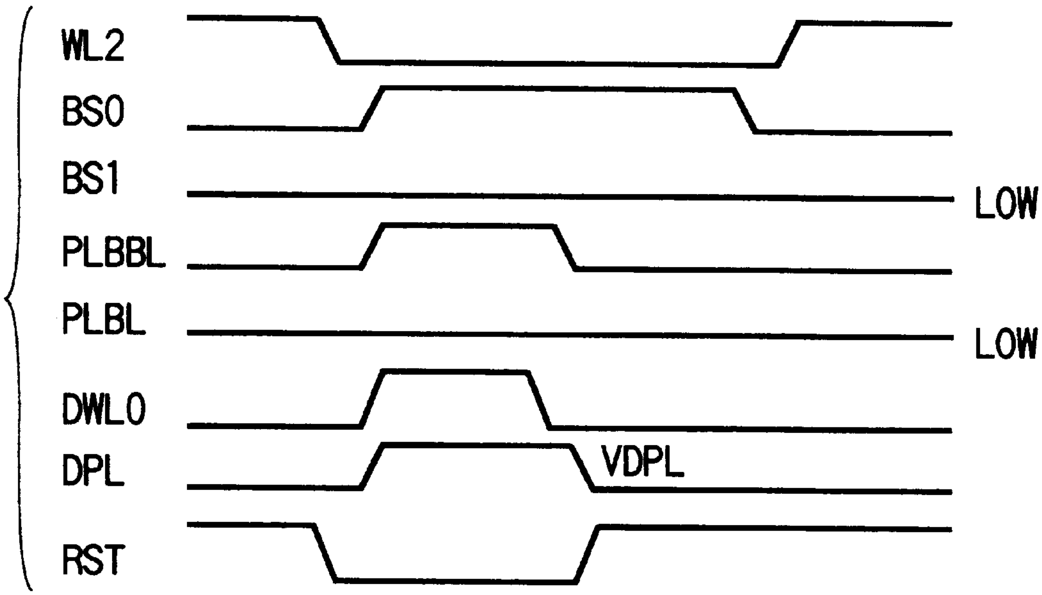
Figure 182B:
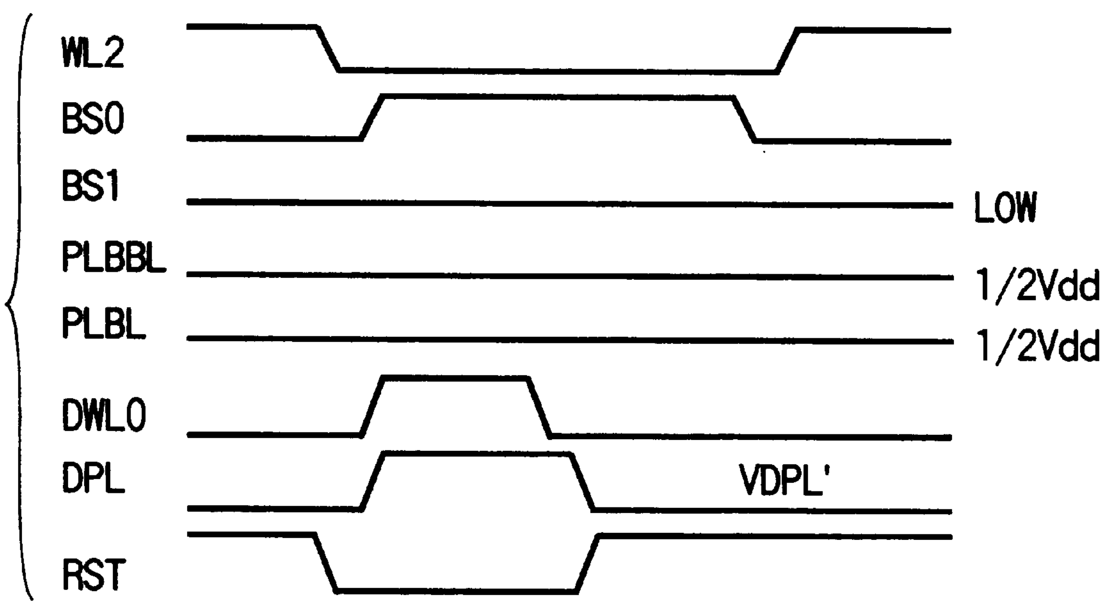
Figure 183:
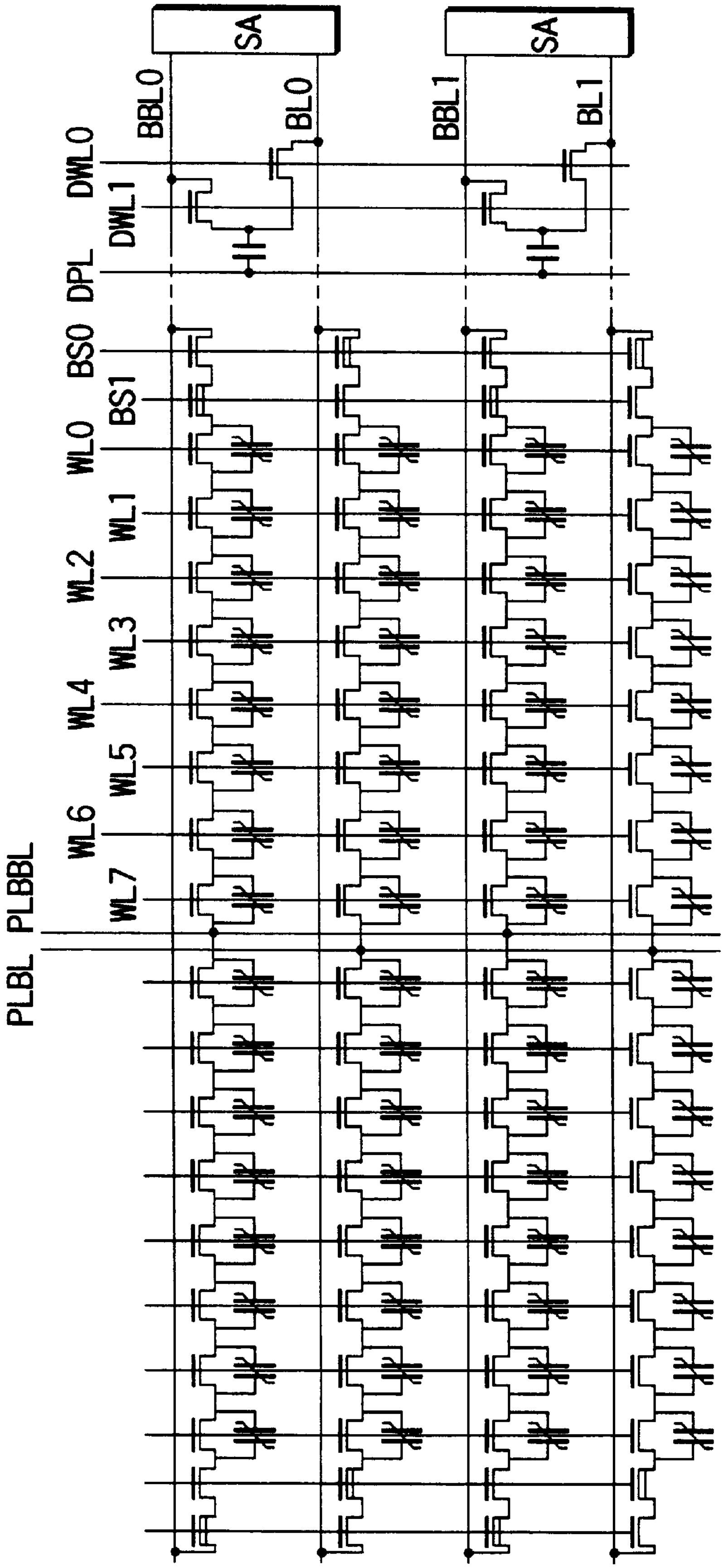
Figure 184A:
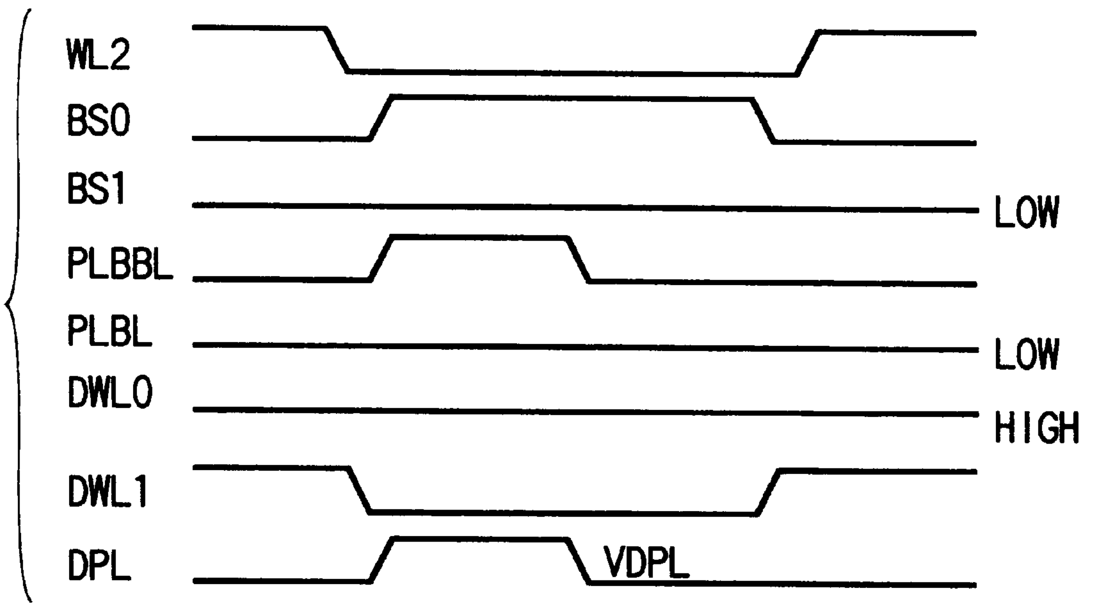
Figure 184B:
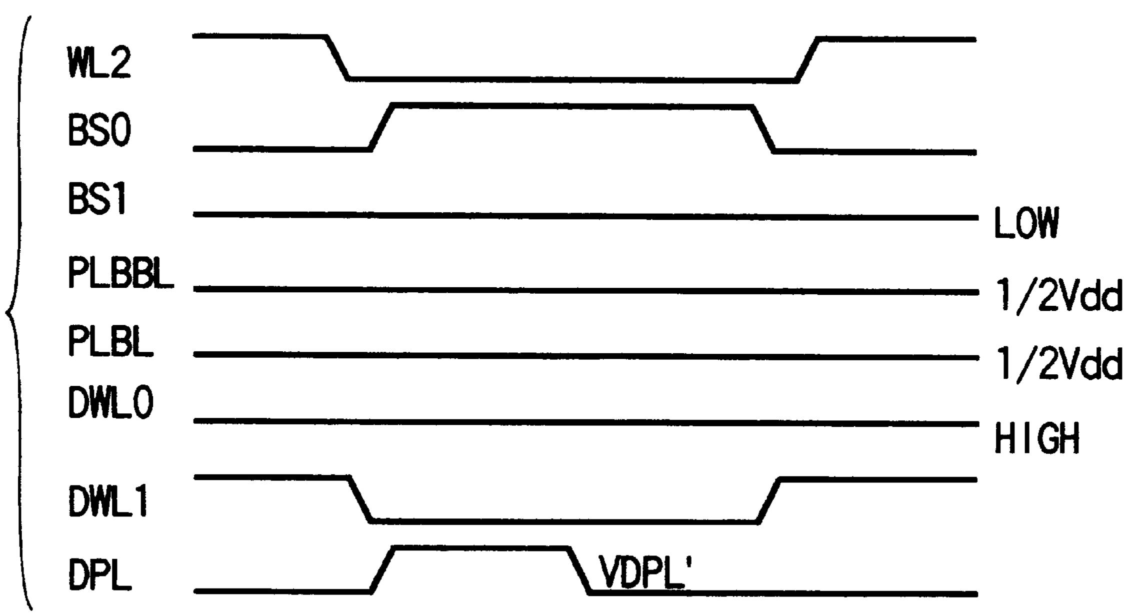
Figure 185A:
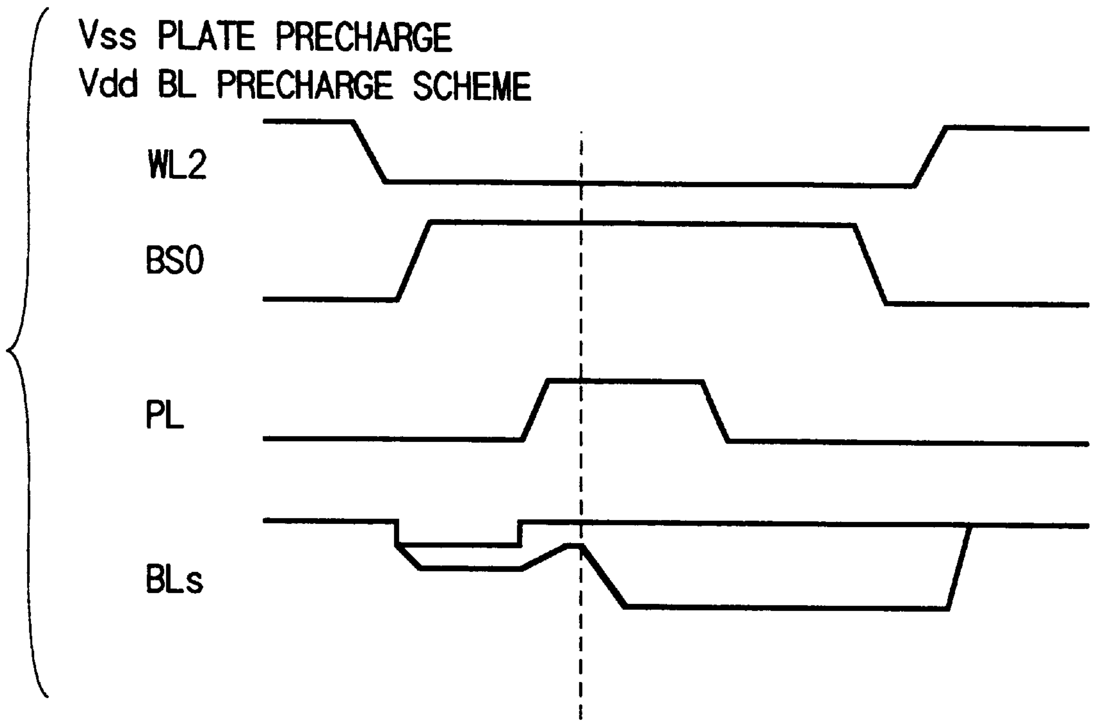
Figure 185B:
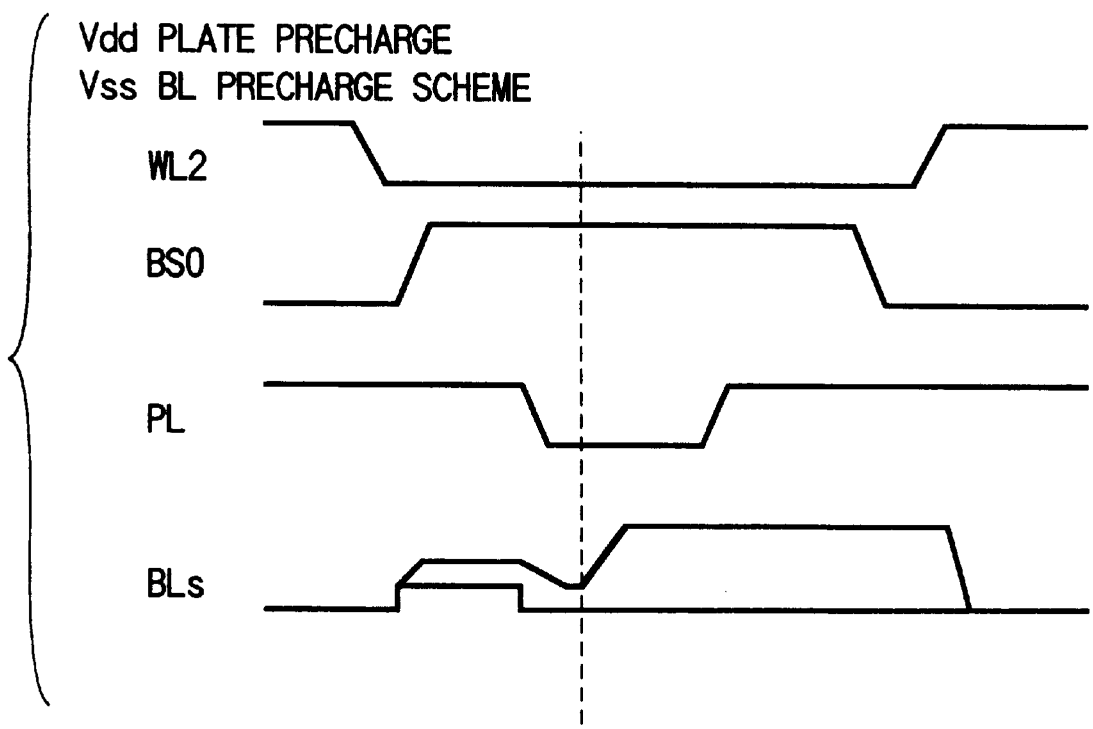
Figure 186A:
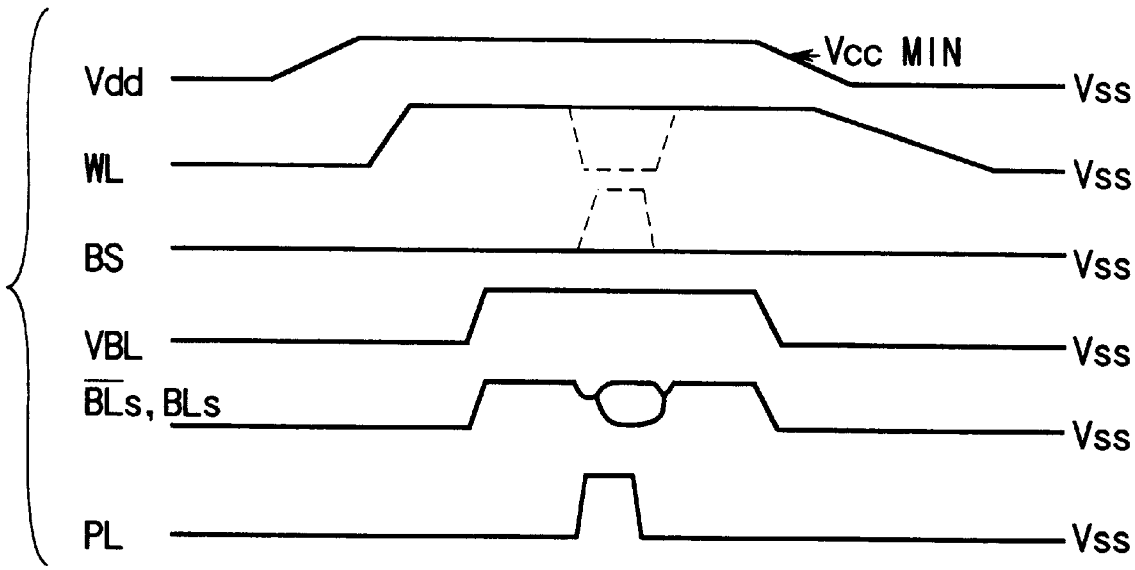
Figure 186B:
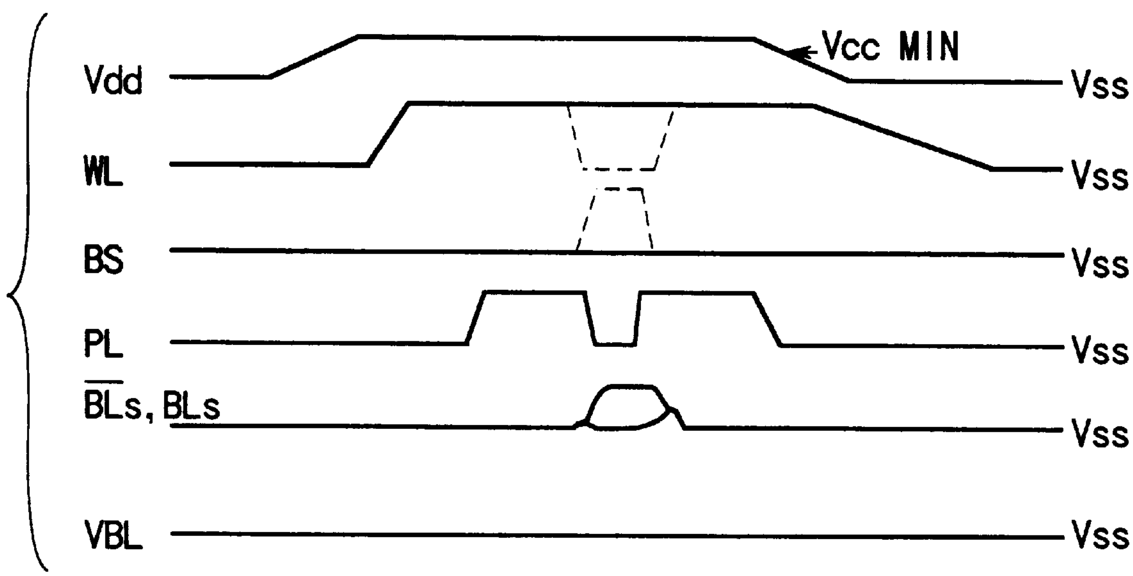
Figure 187:
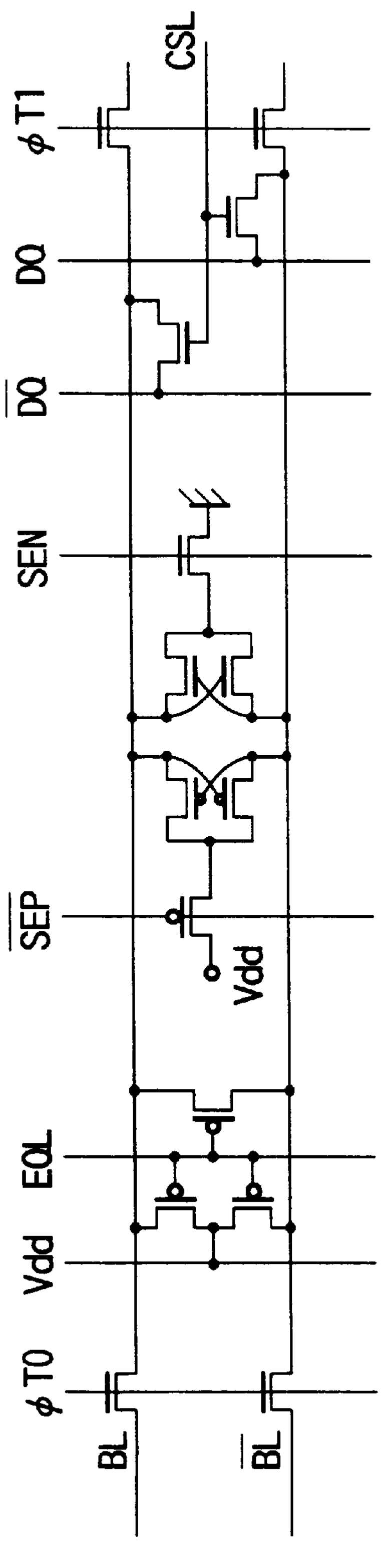
Figure 188:
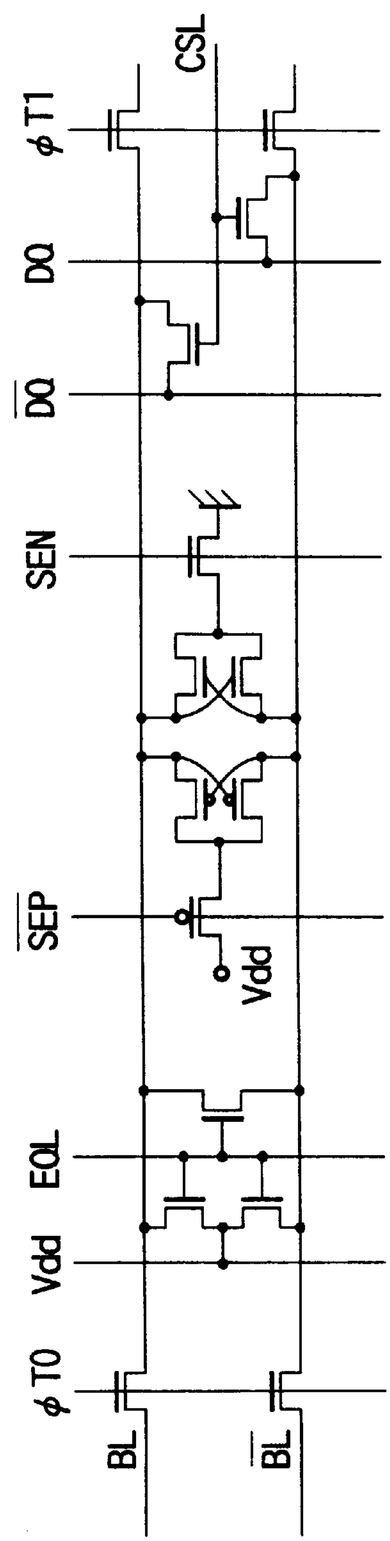
Figure 189:
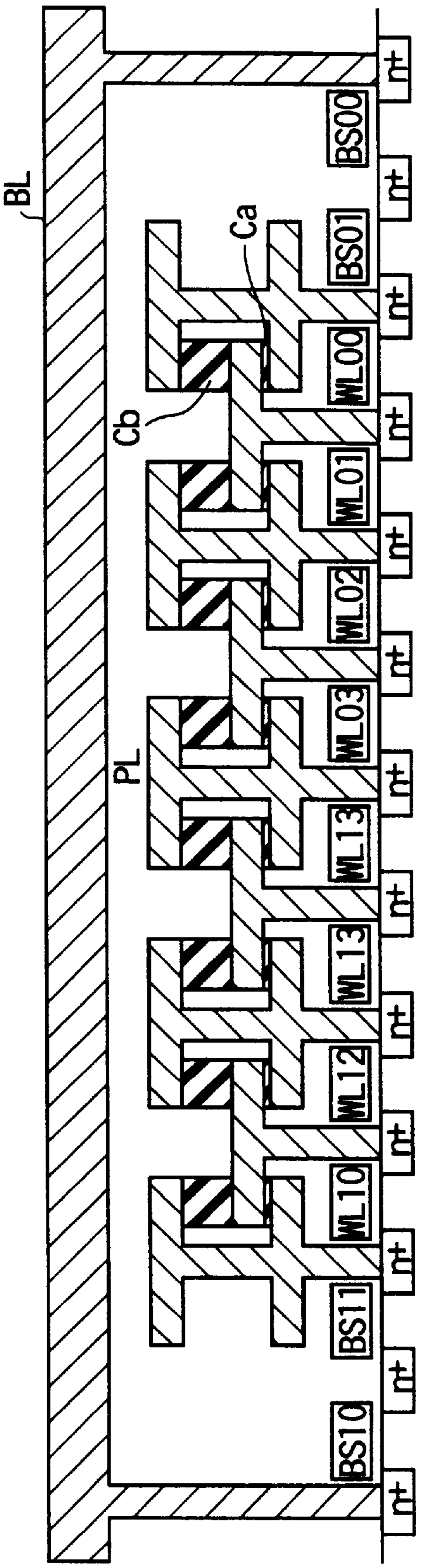
Figure 190A:
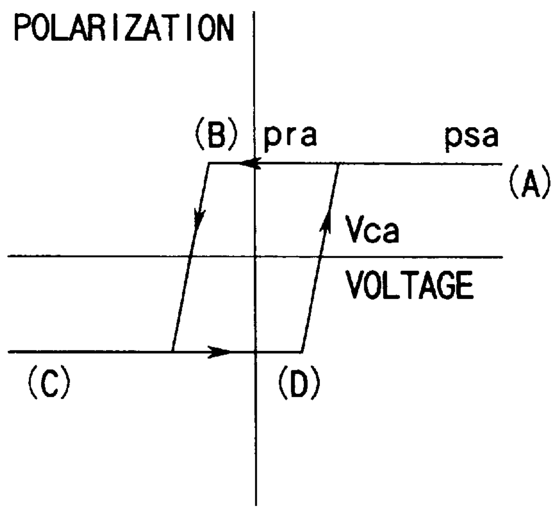
Figure 190B:
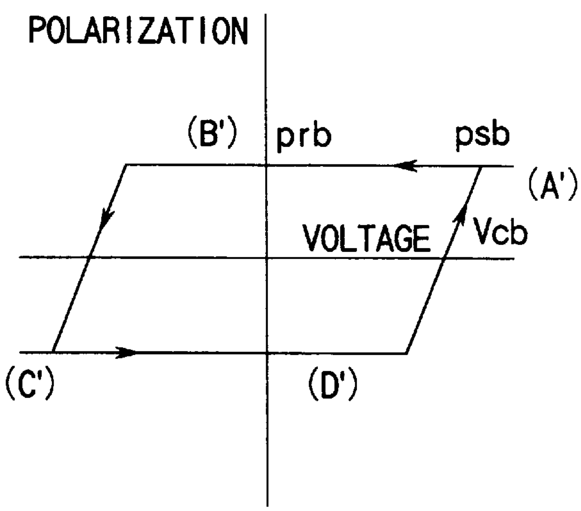
Figure 190C:
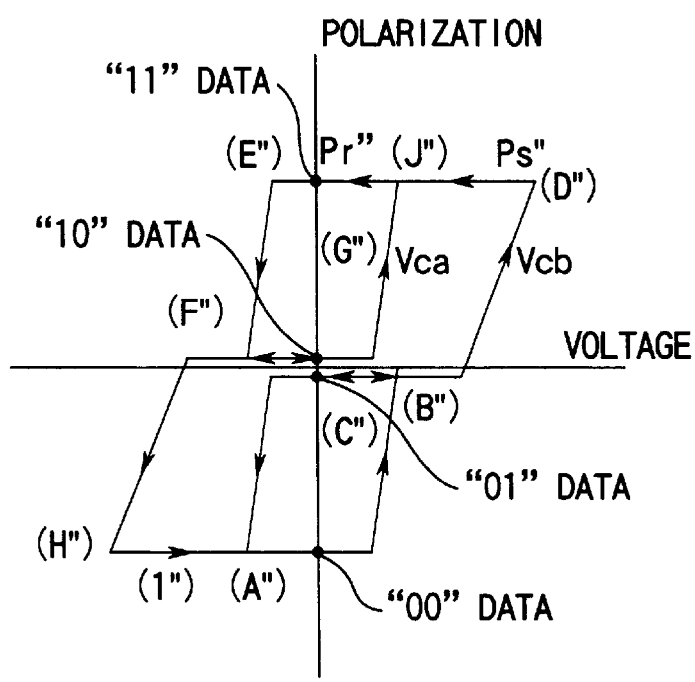
Figure 191A:
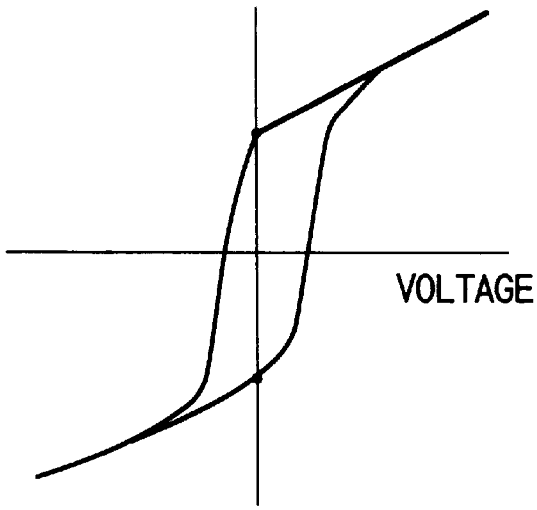
Figure 191B:
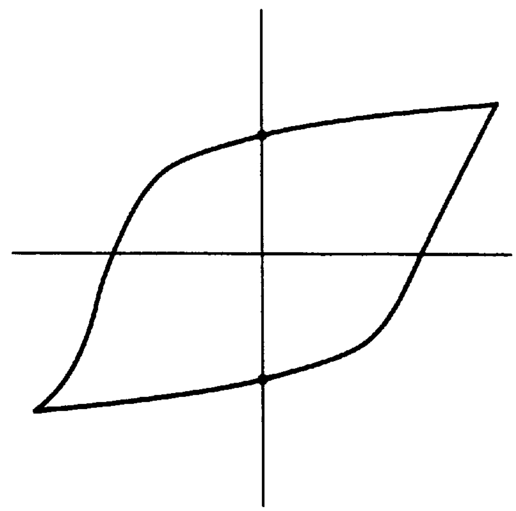
Figure 191C:
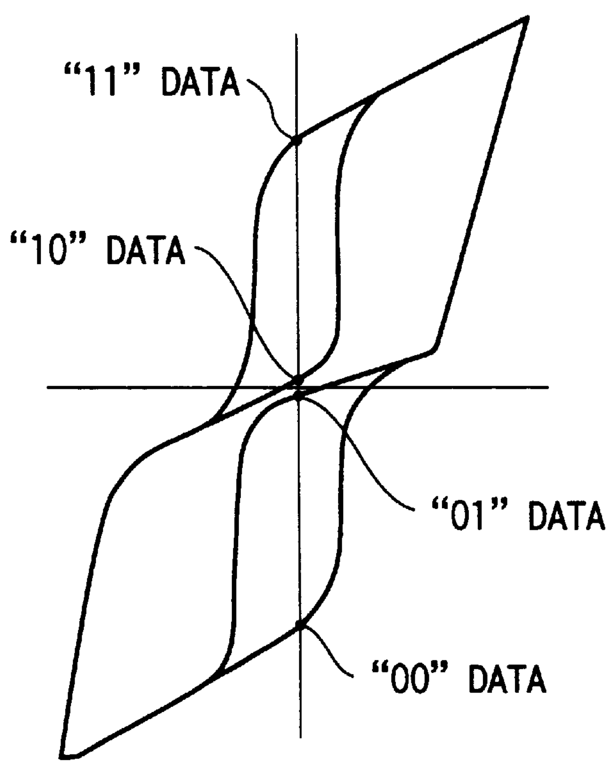
Figure 192:
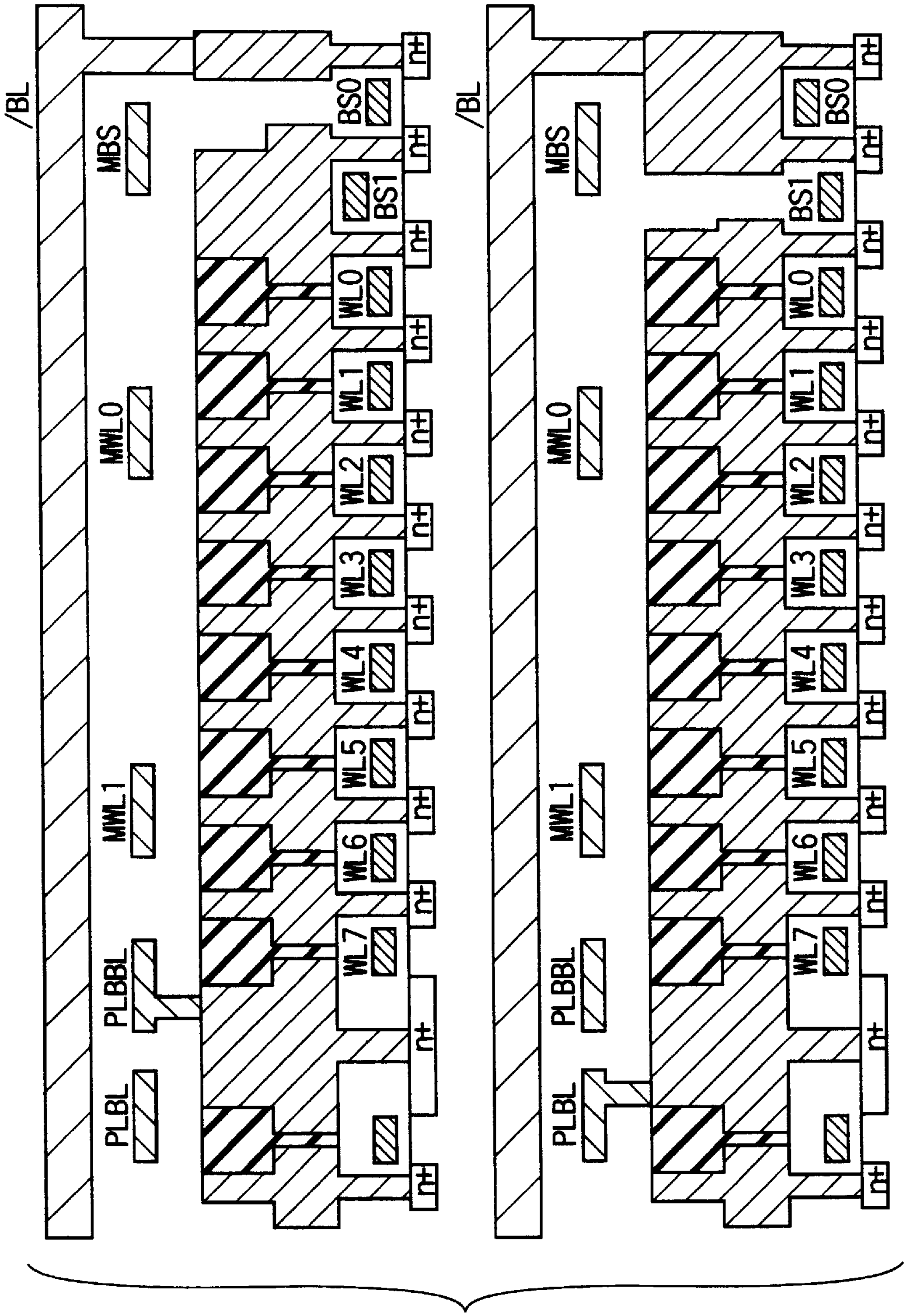
Figure 193:
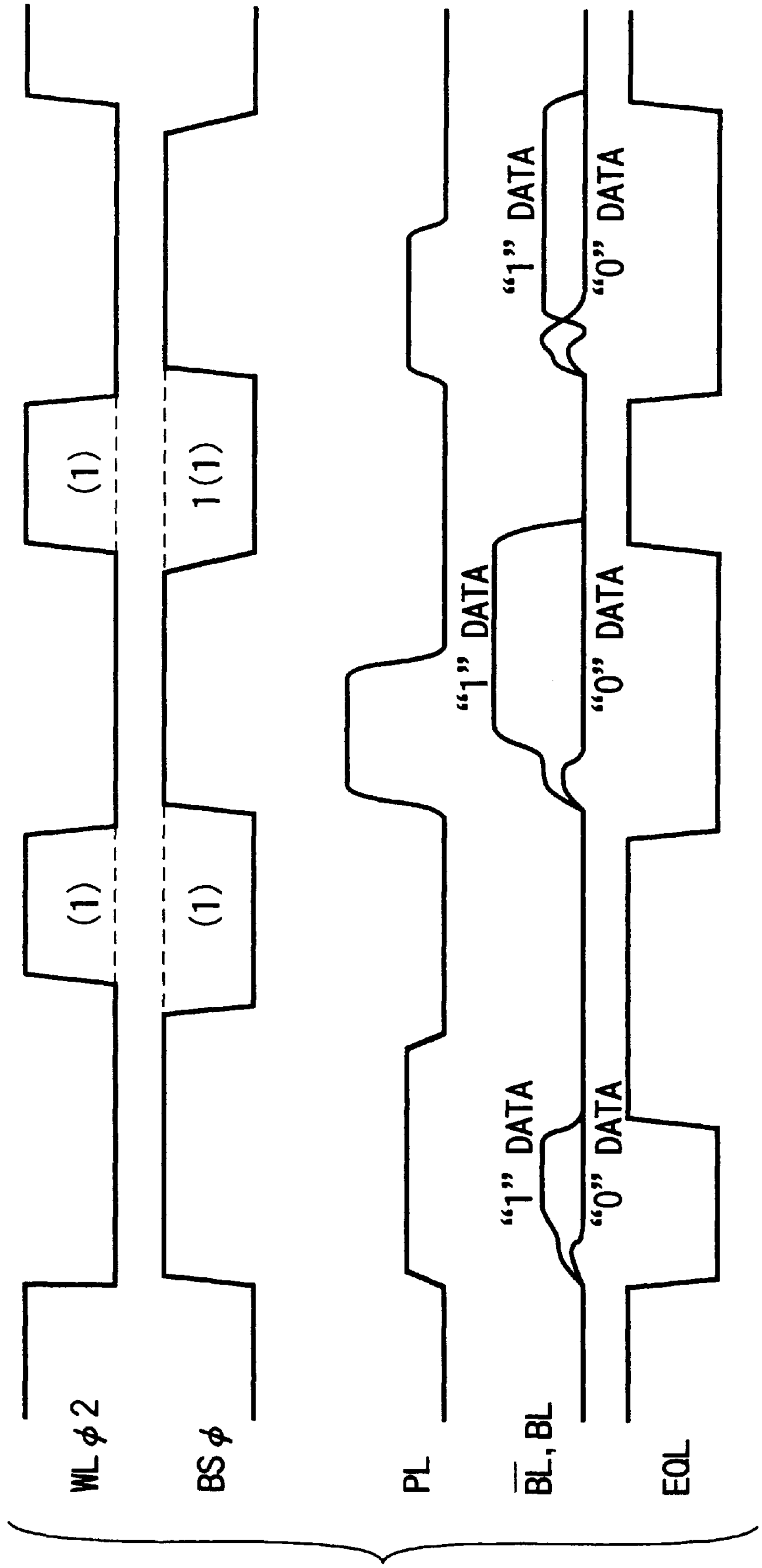
Figure 194:
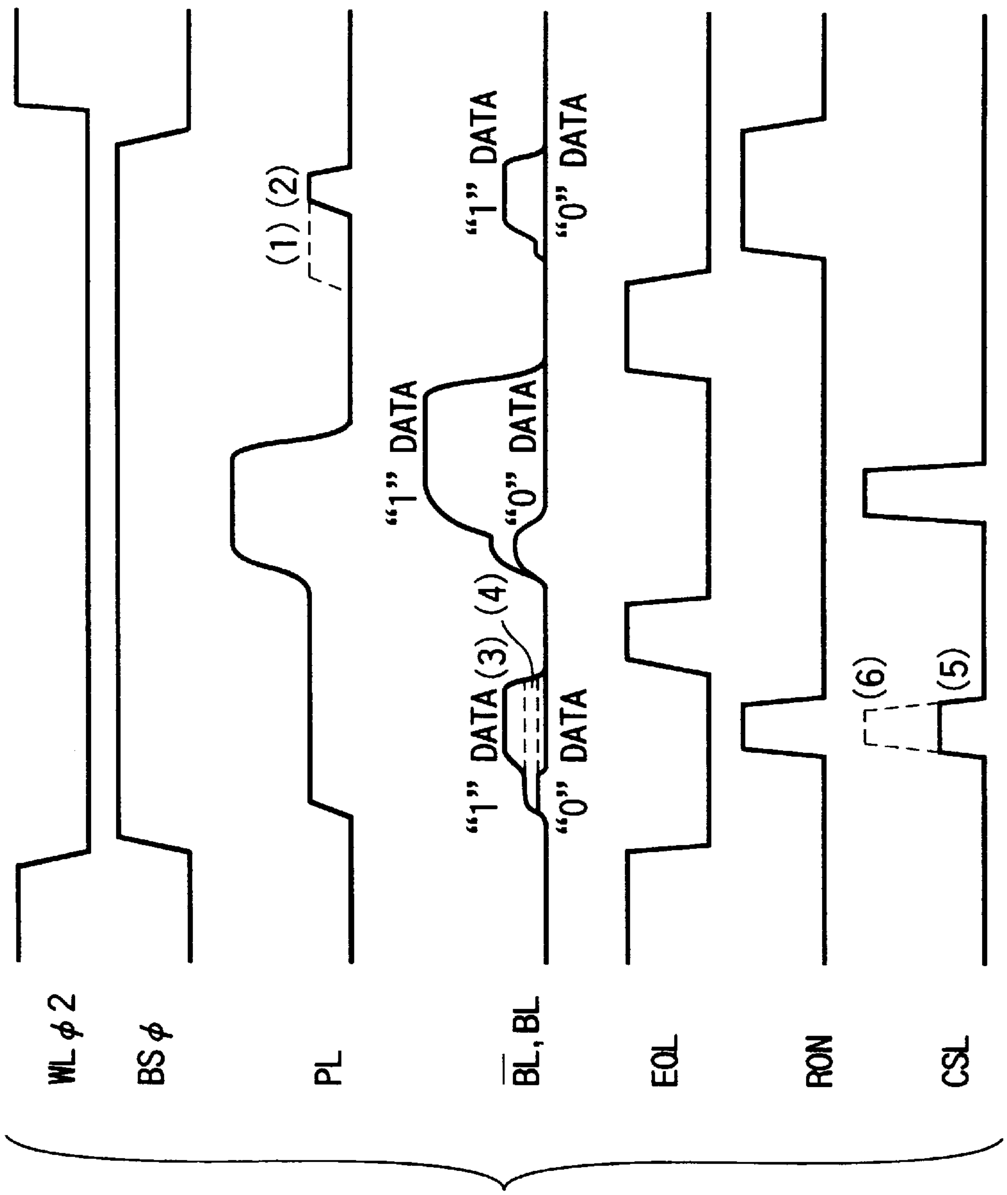
Figure 196:
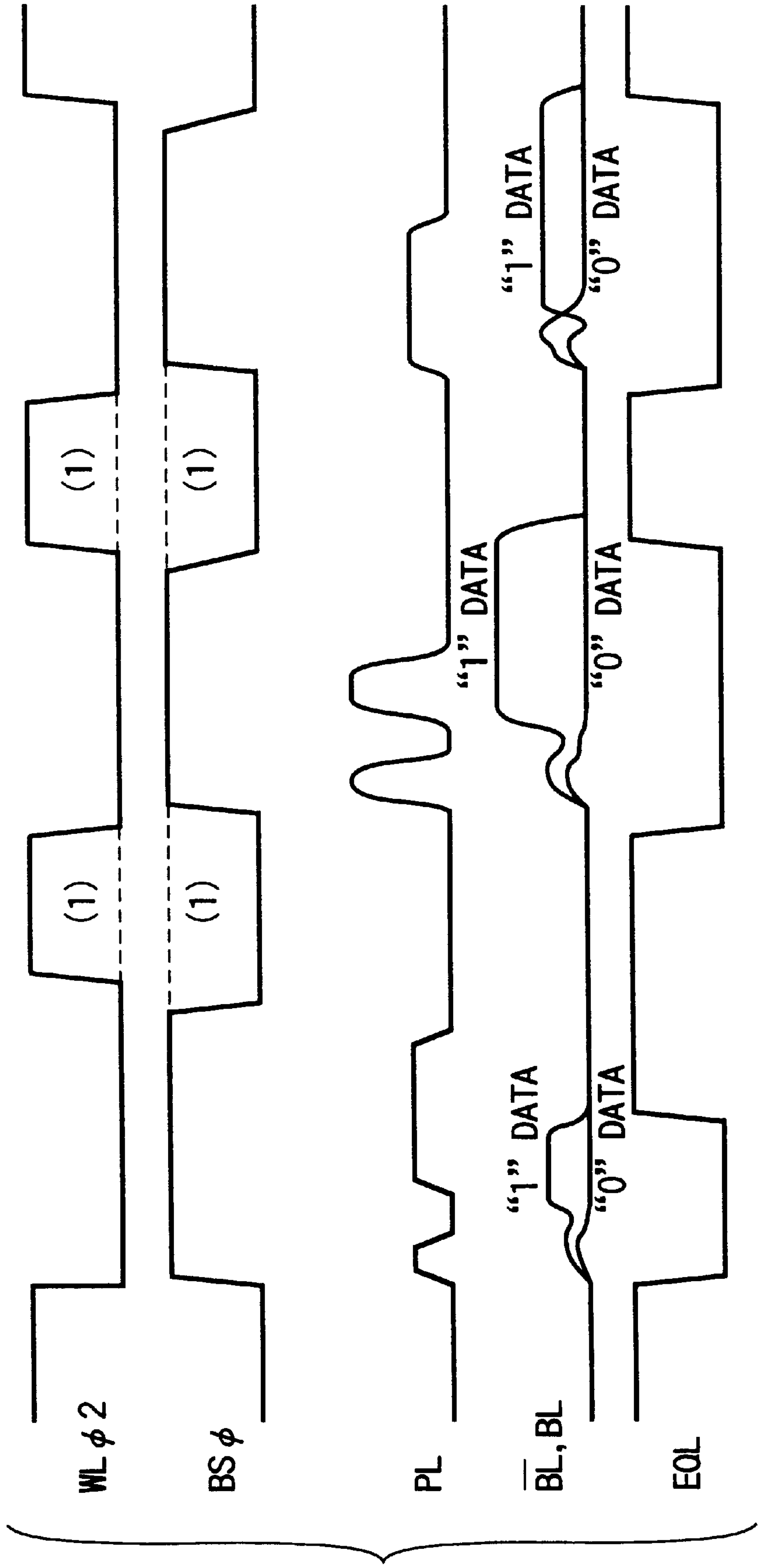
Figure 197:
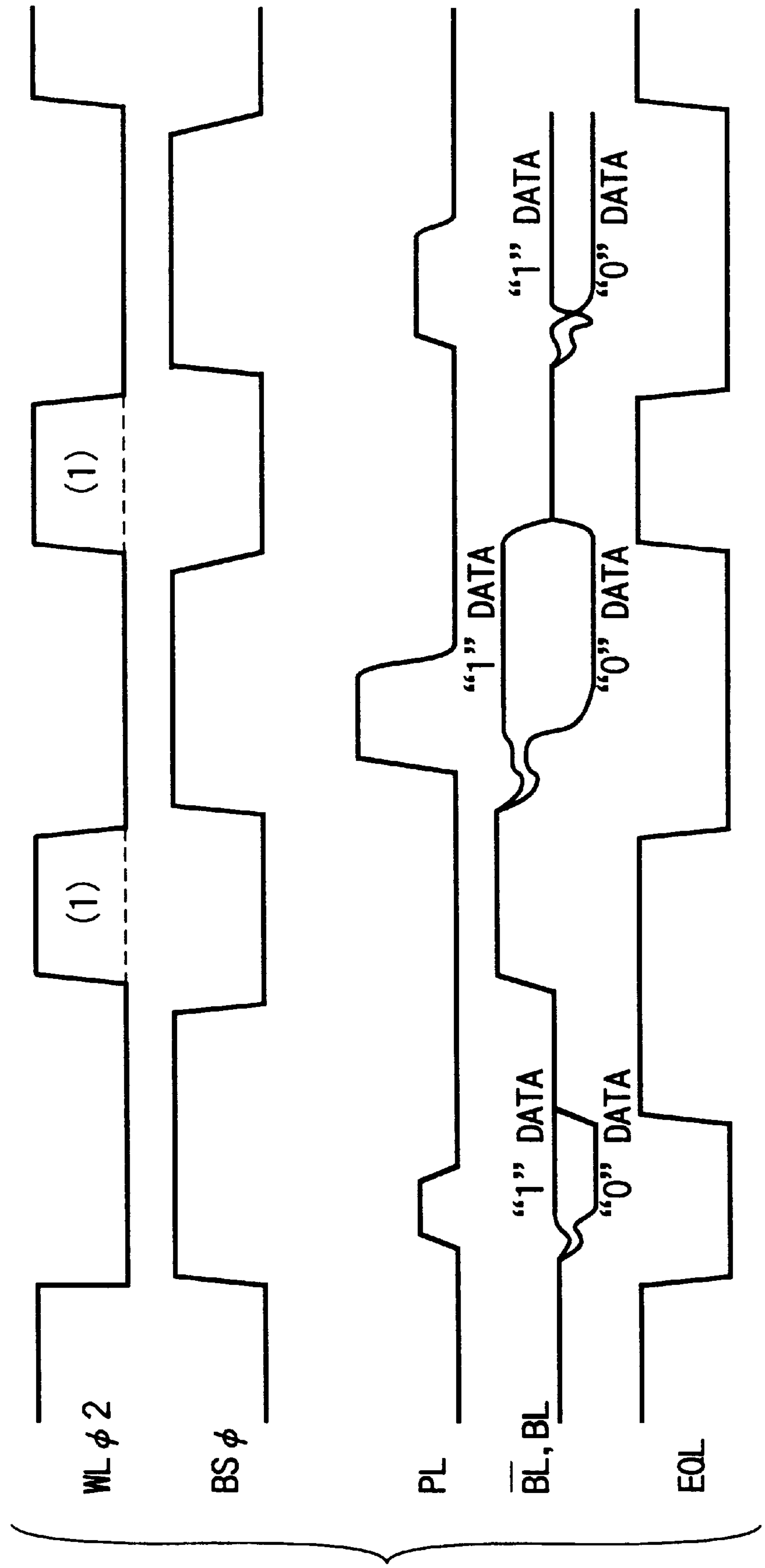
Figure 198:
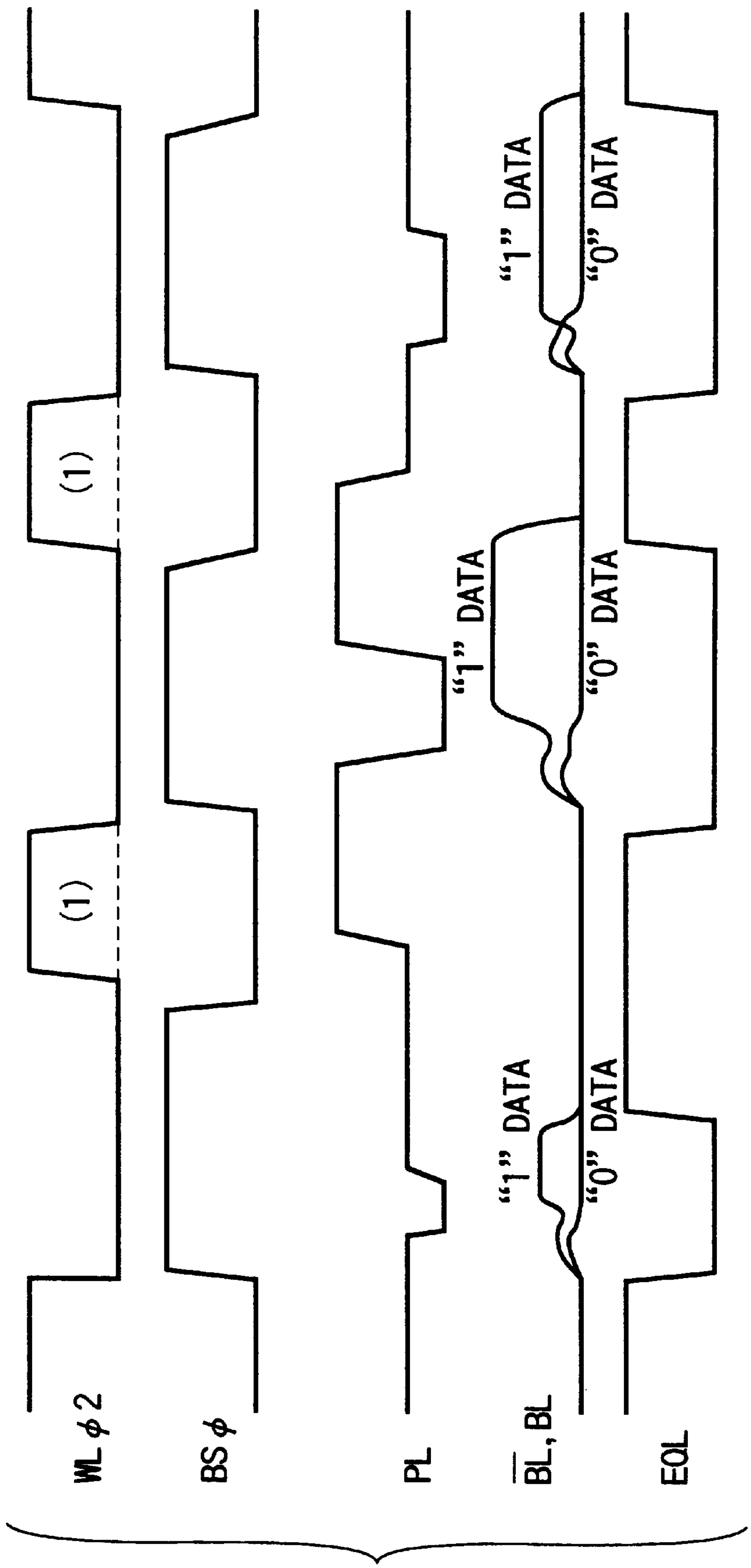
Figure 199:
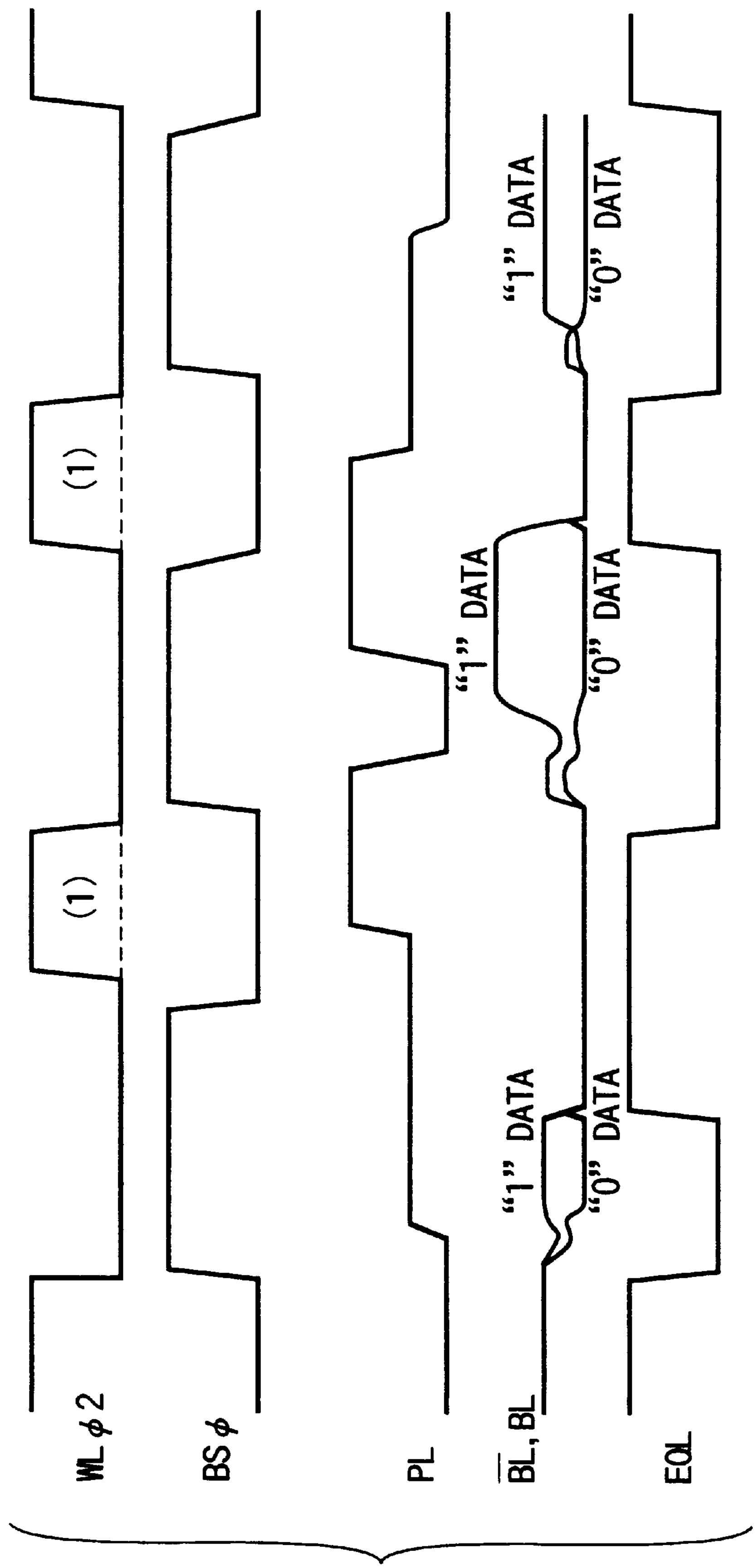
Figure 200:
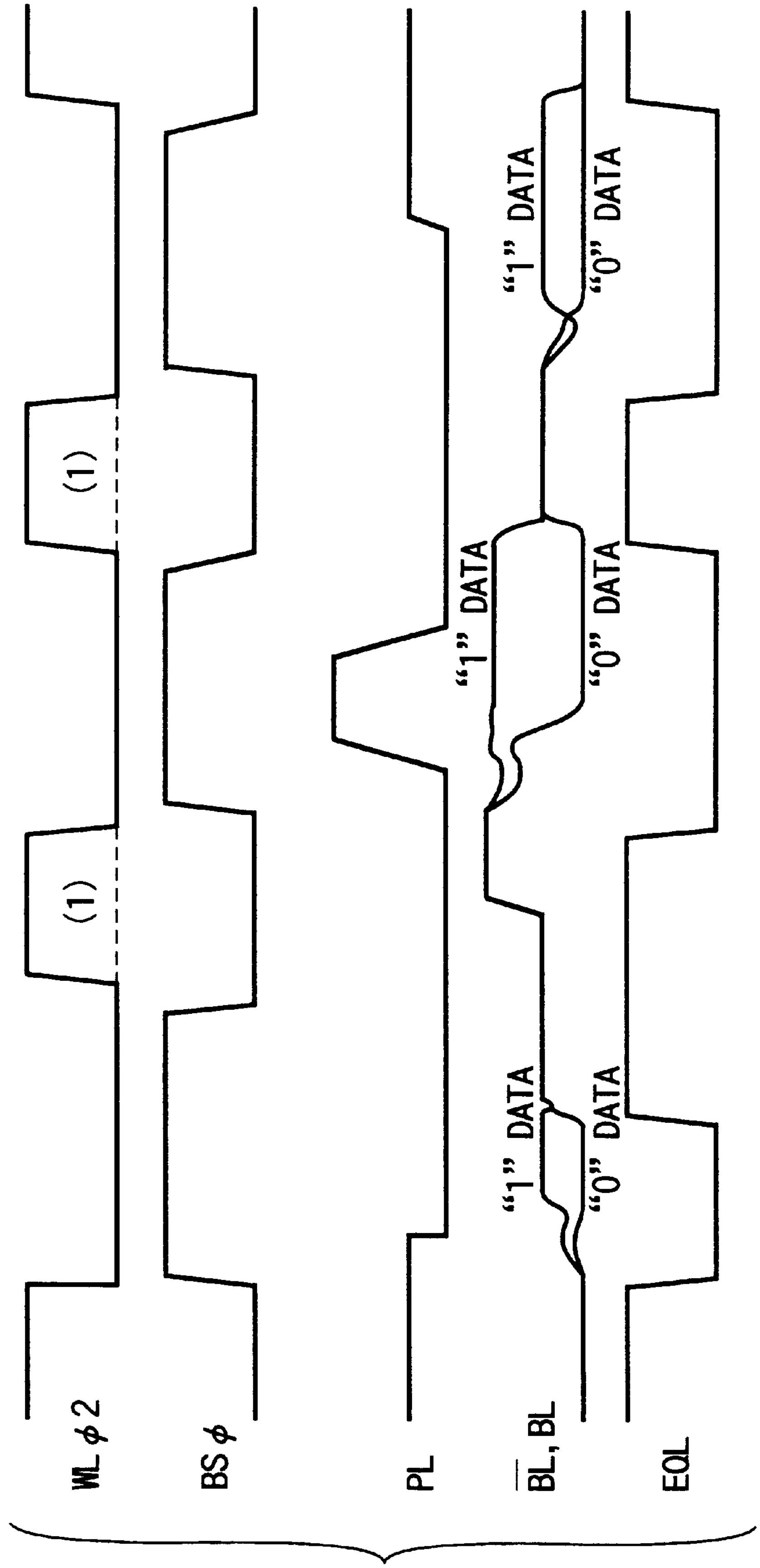
Figure 201:
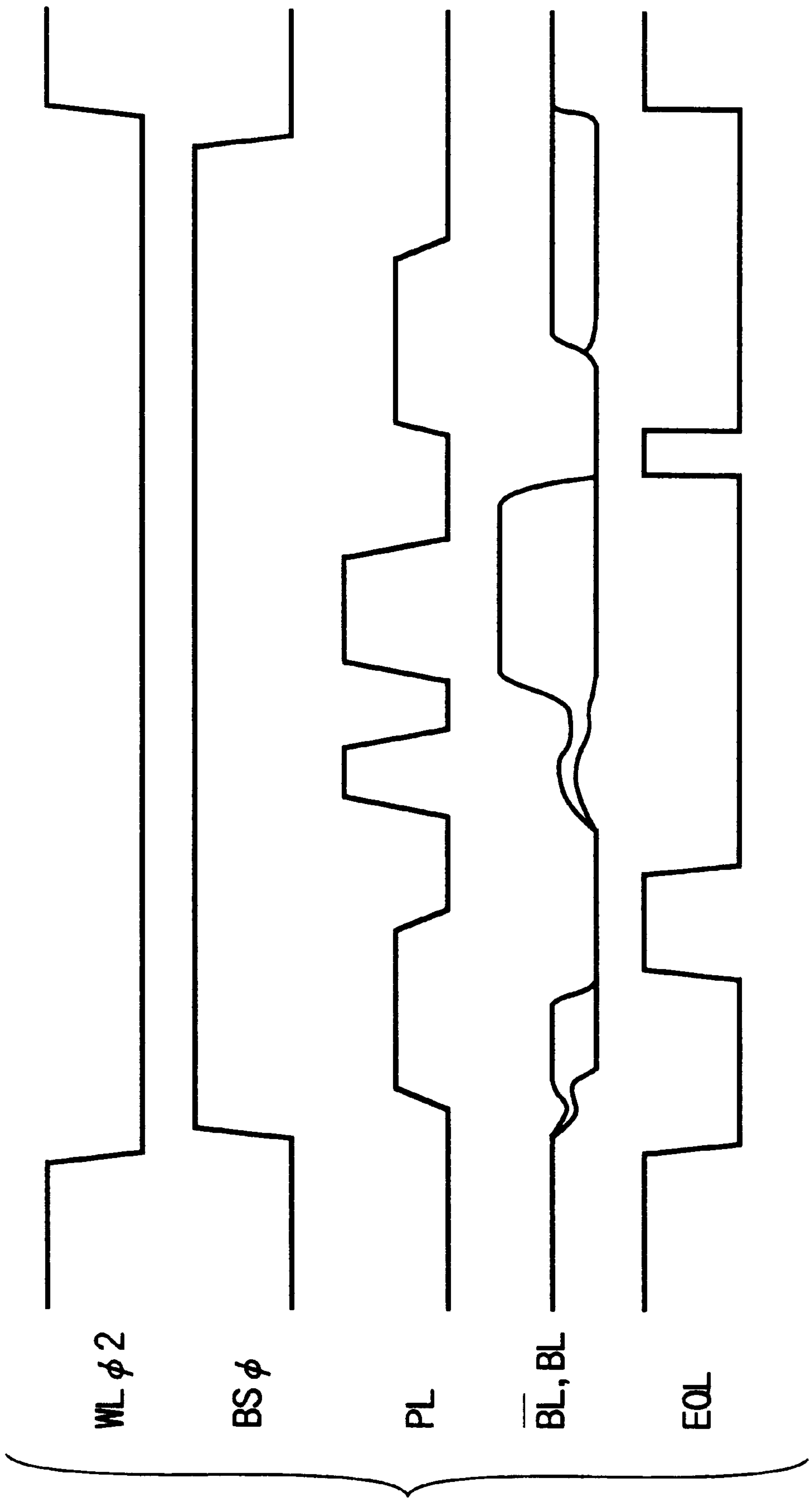
Figure 202:
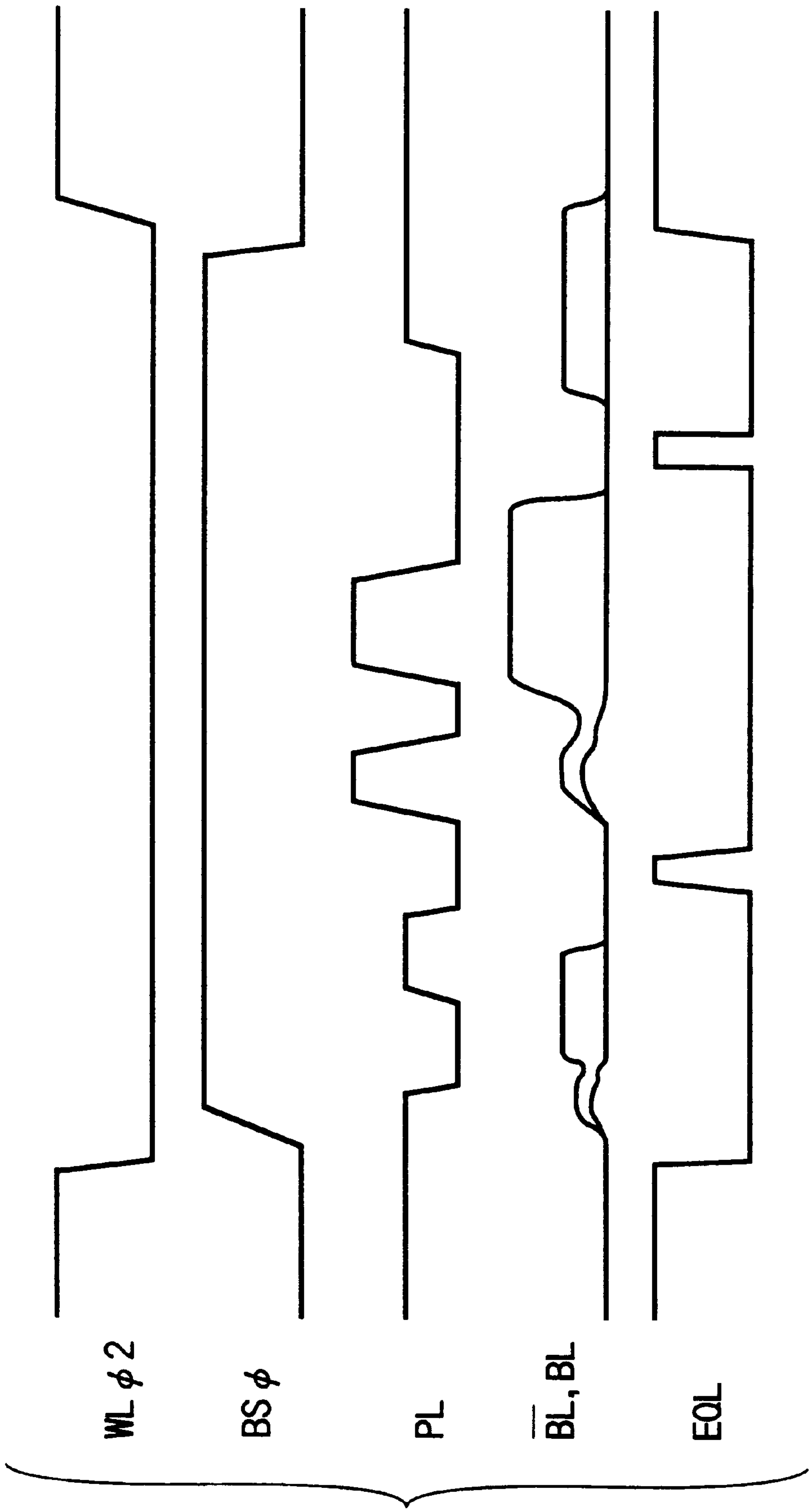
Figure 203:
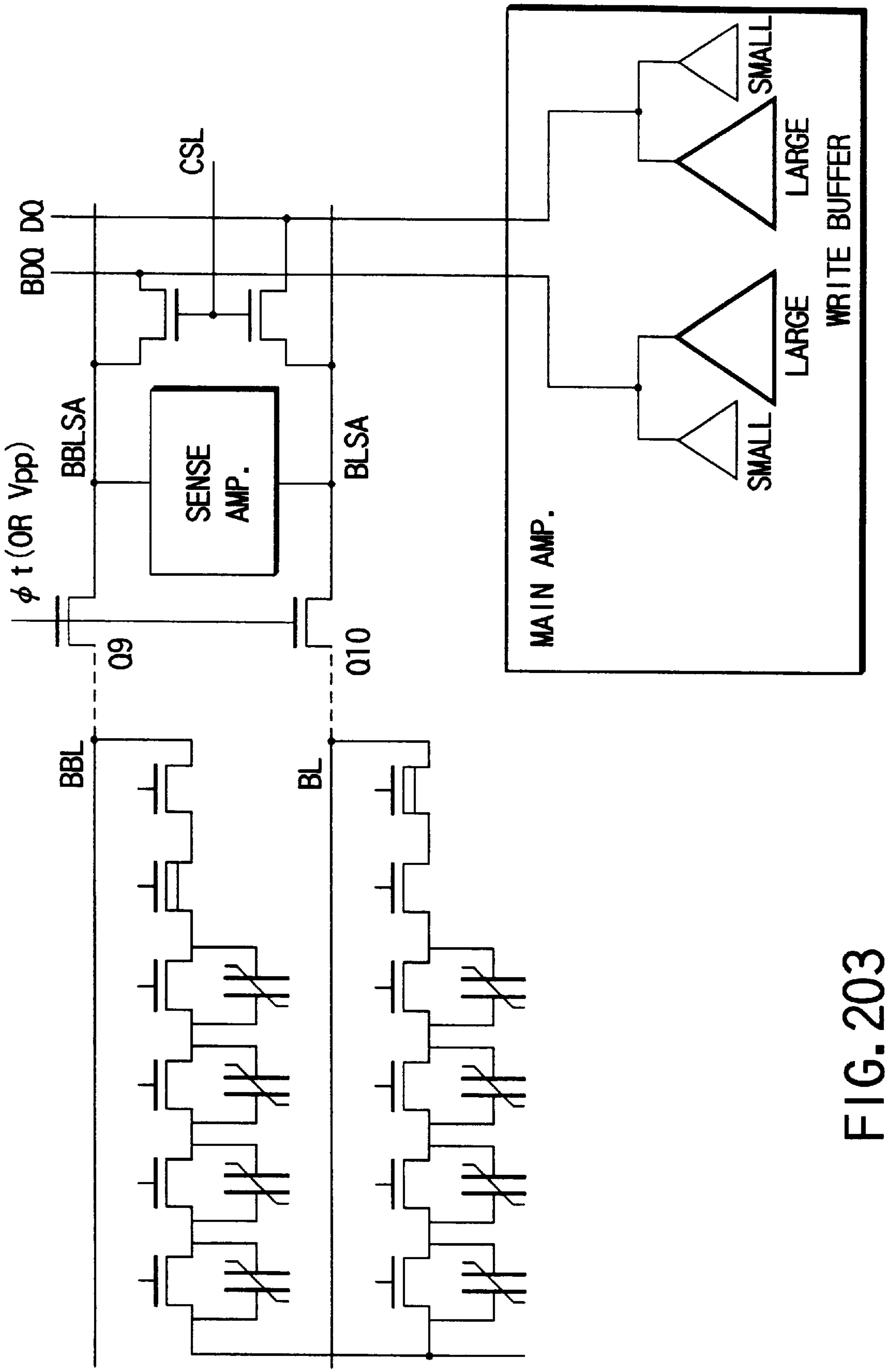
Figure 204C:
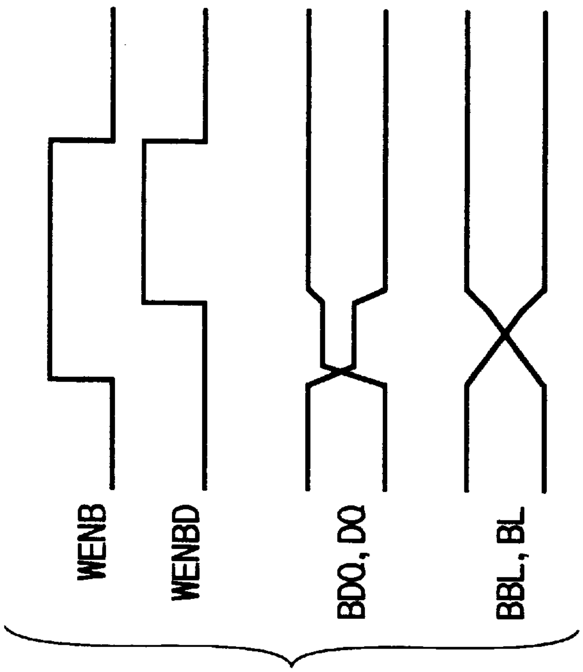
Figure 204A:
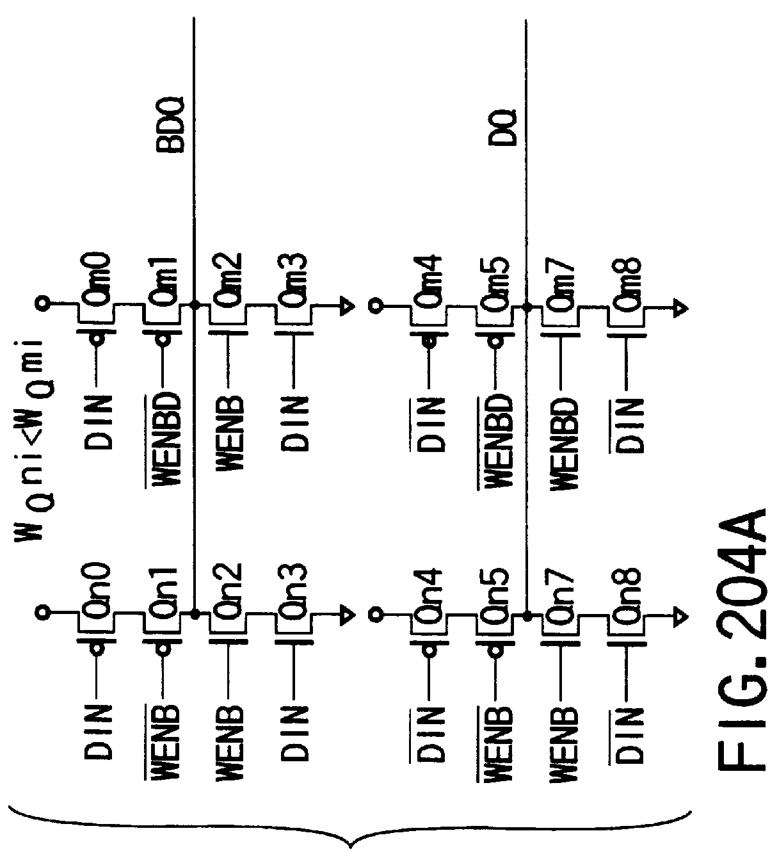
Figure 204B:
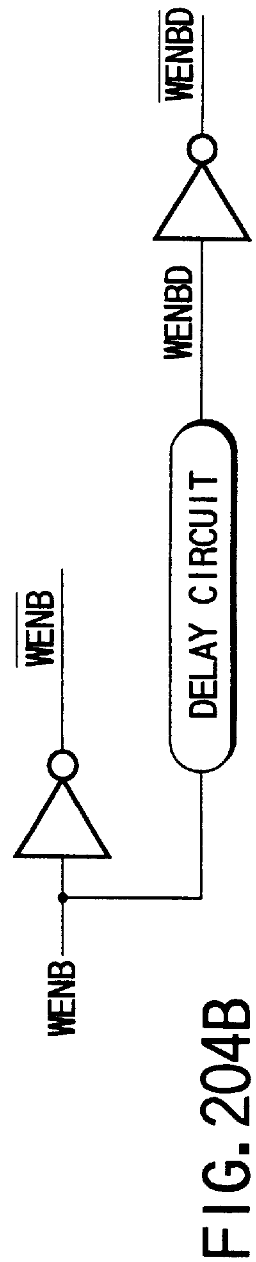
Figure 205:
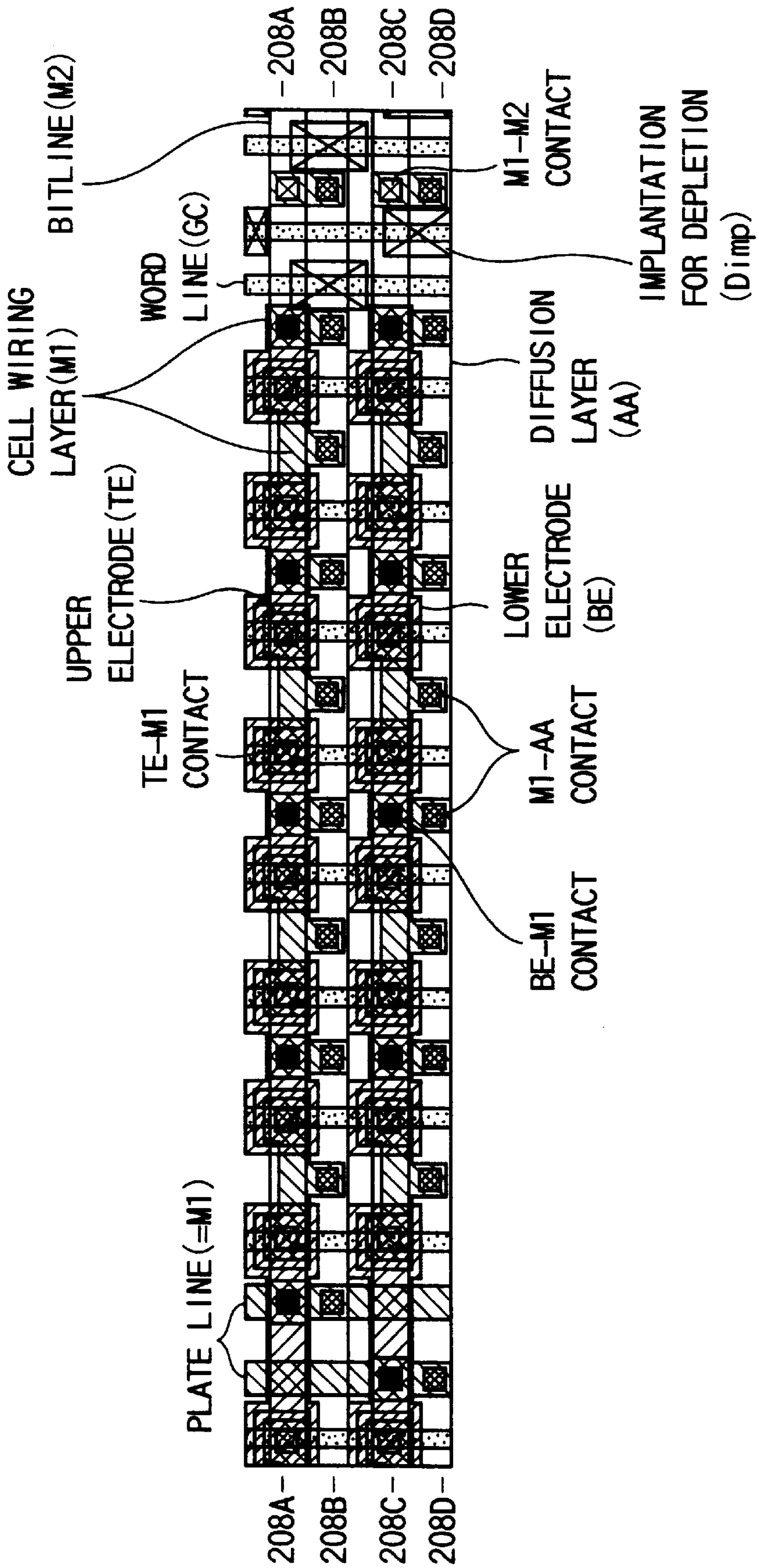
Figure 206:
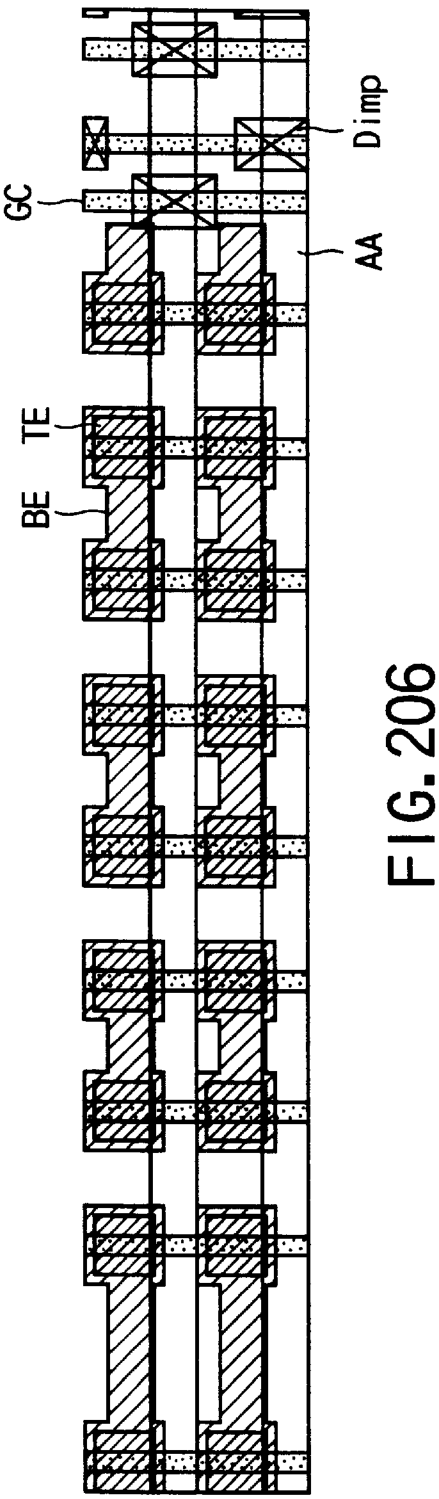
Figure 207:
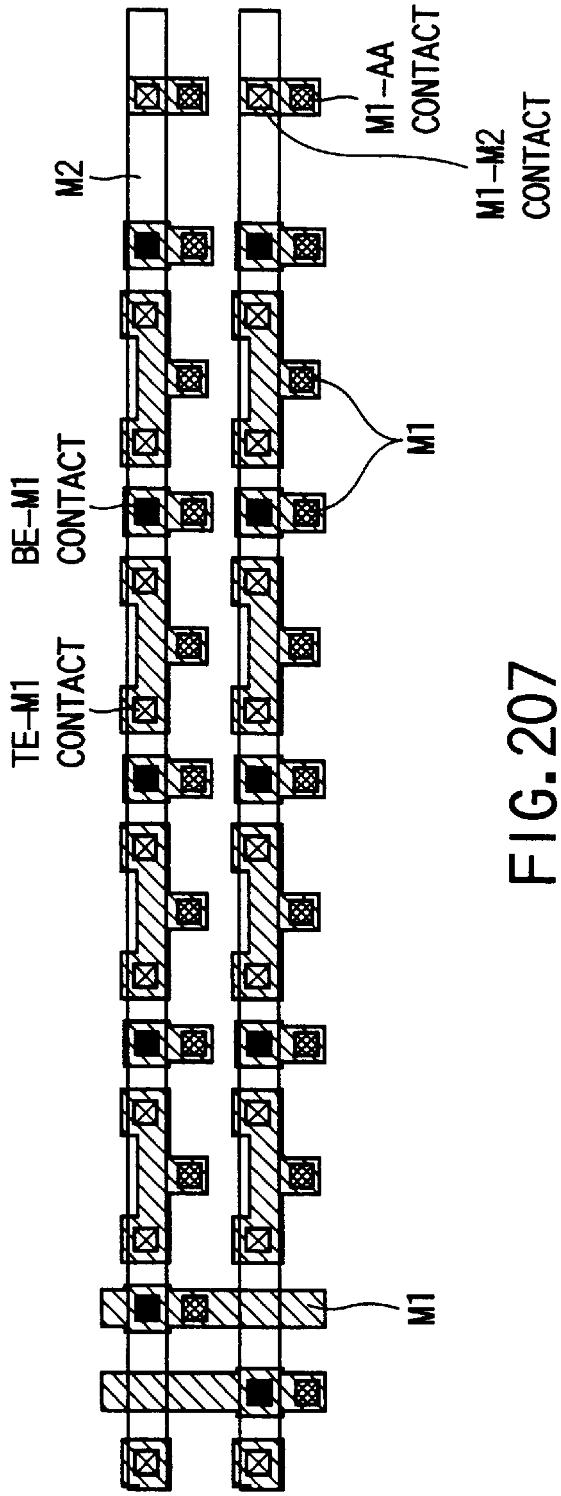
Figure 208A:
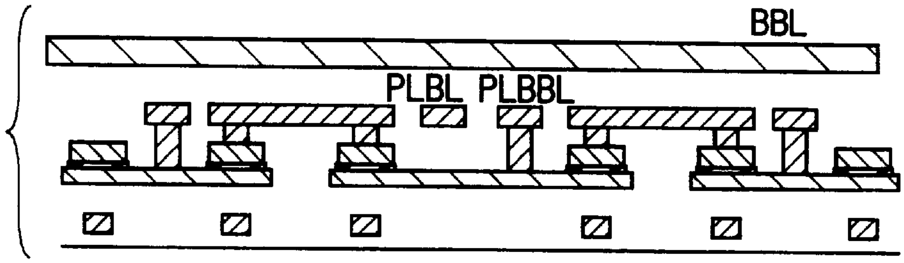
Figure 208B:
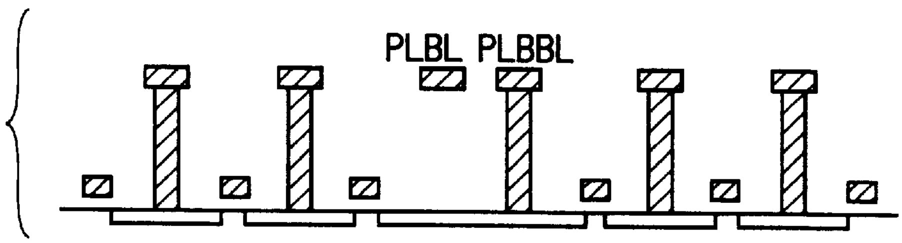
Figure 208C:
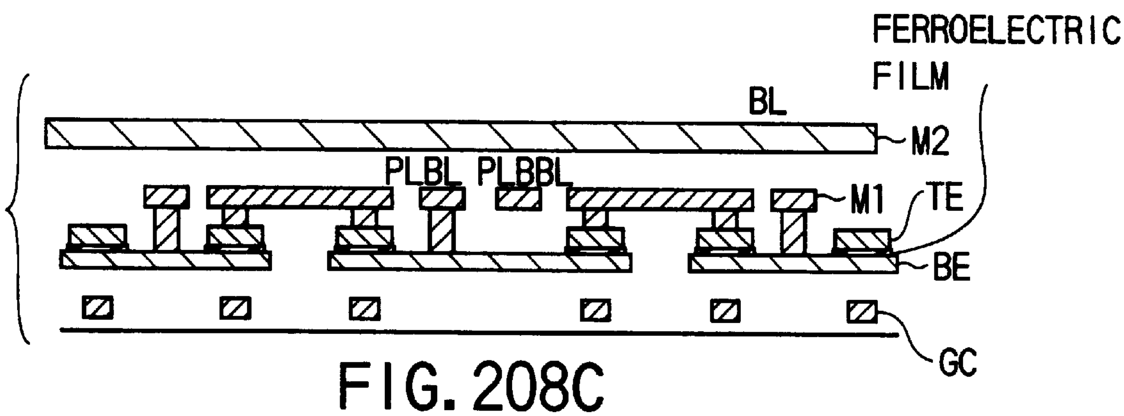
Figure 208D:
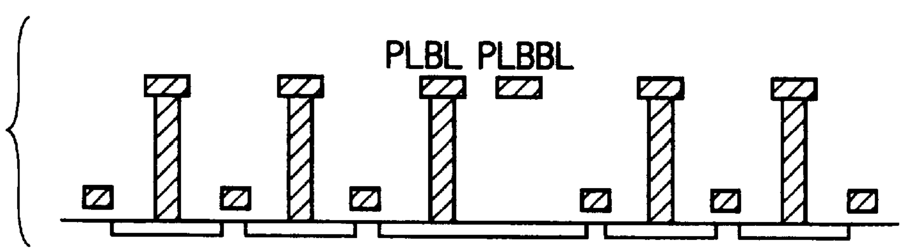
Figure 209:
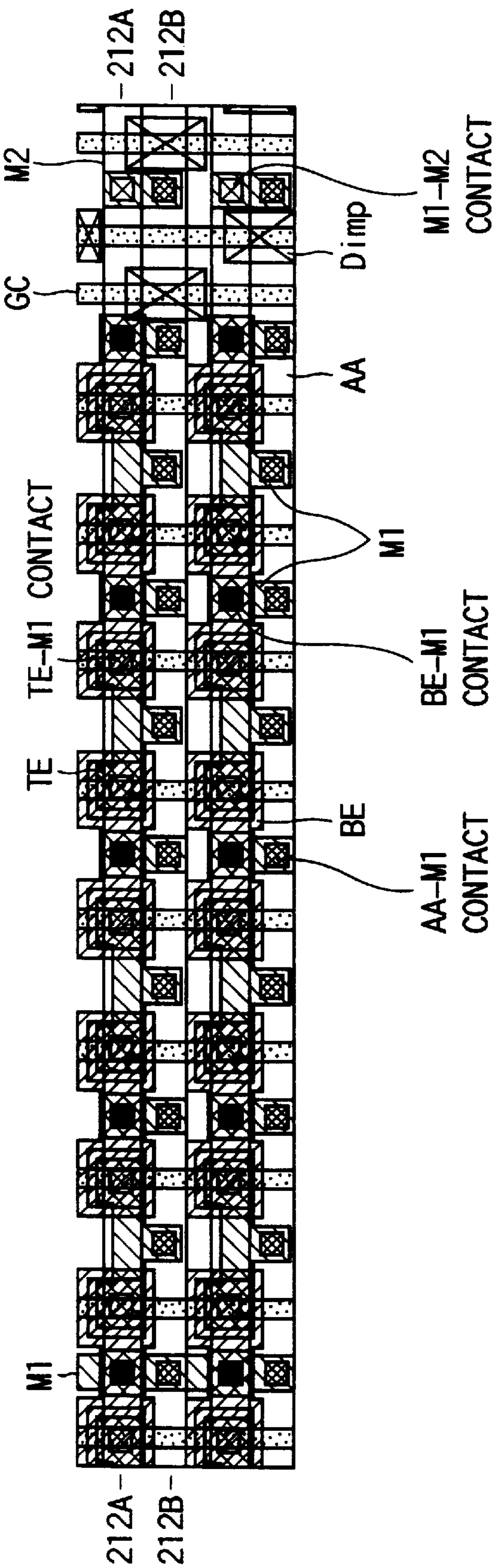
Figure 210:
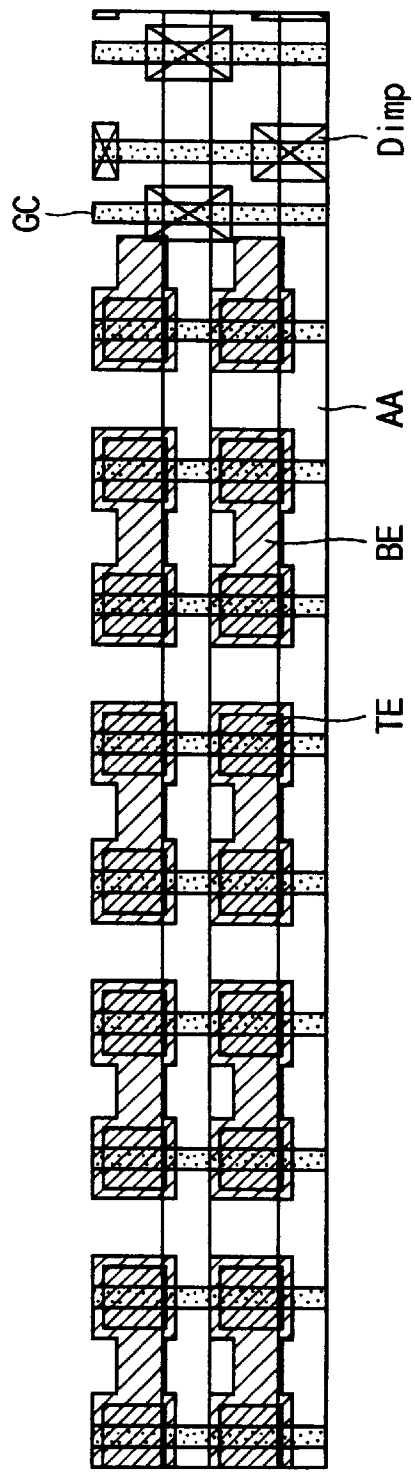
Figure 211:
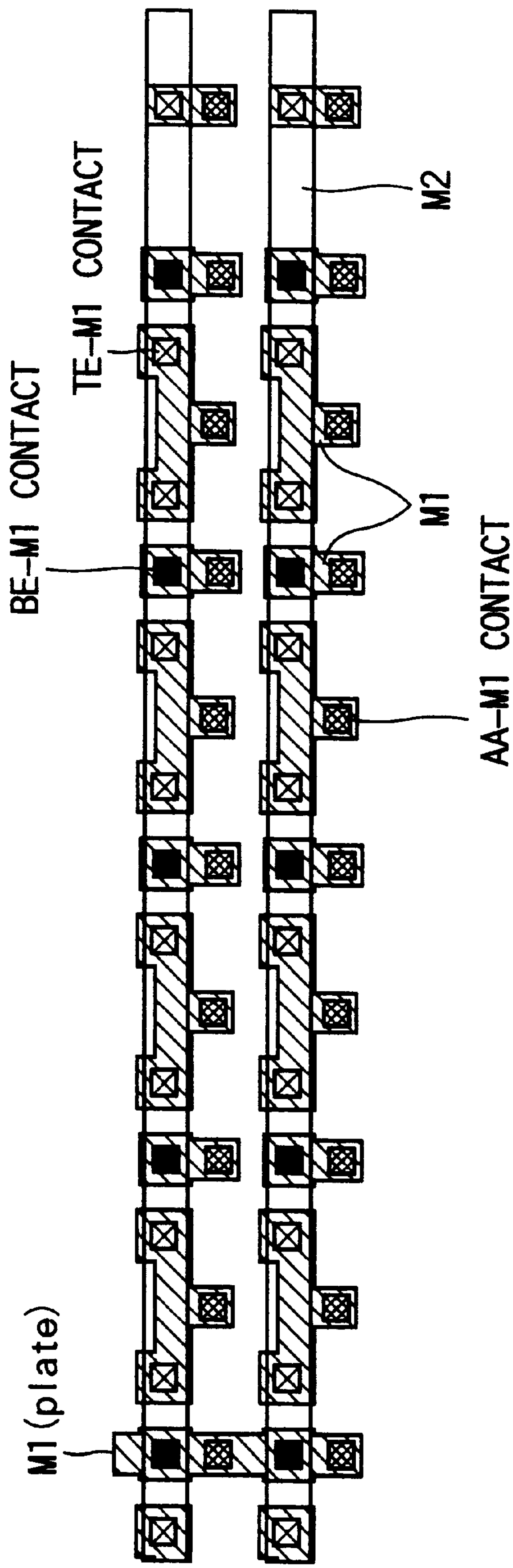
Figure 212A:
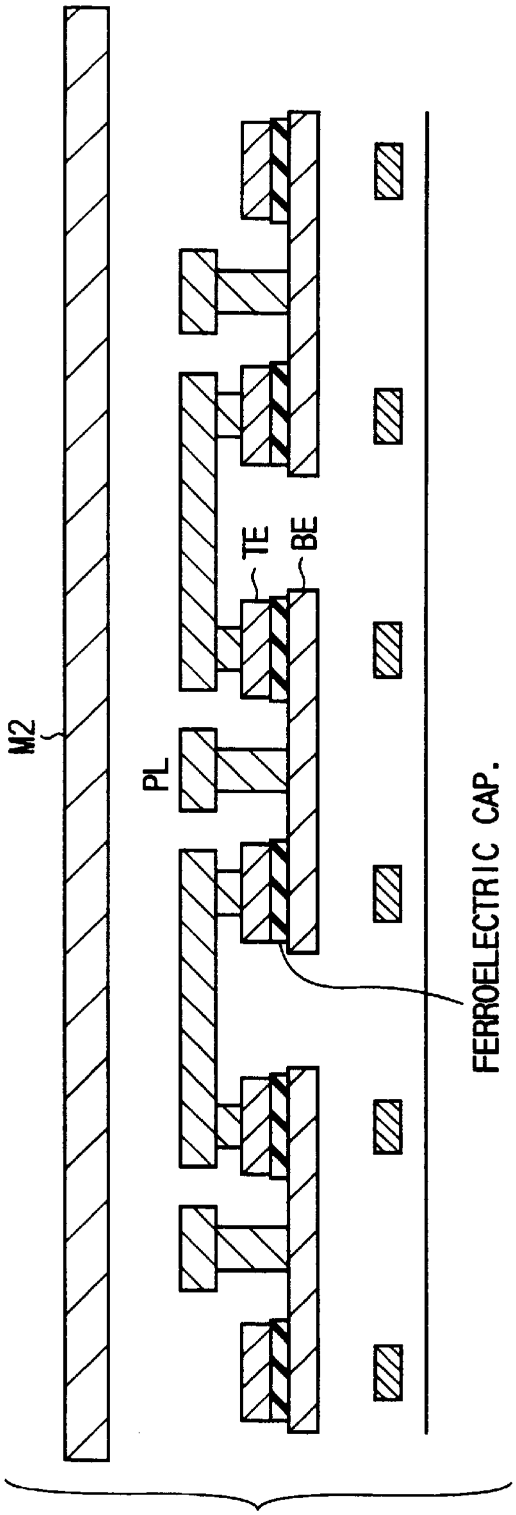
Figure 212B:
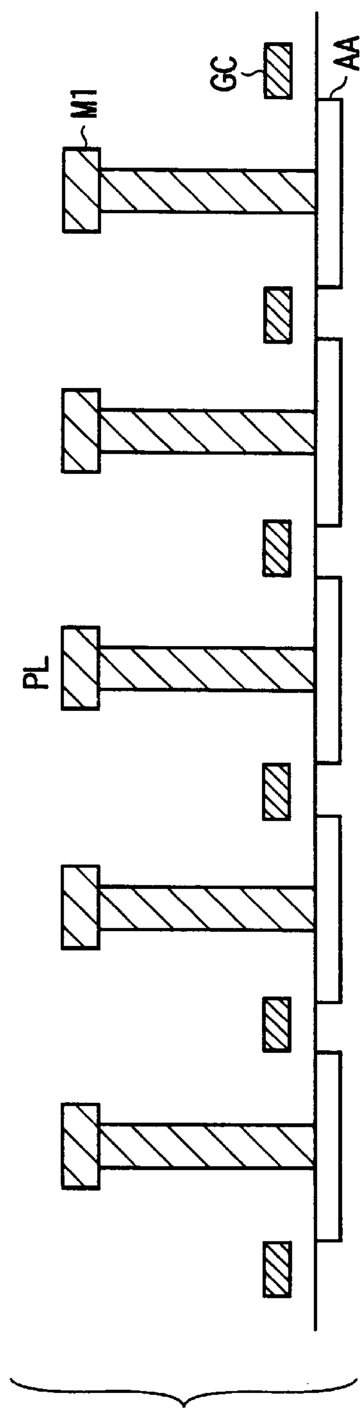
Figure 213:
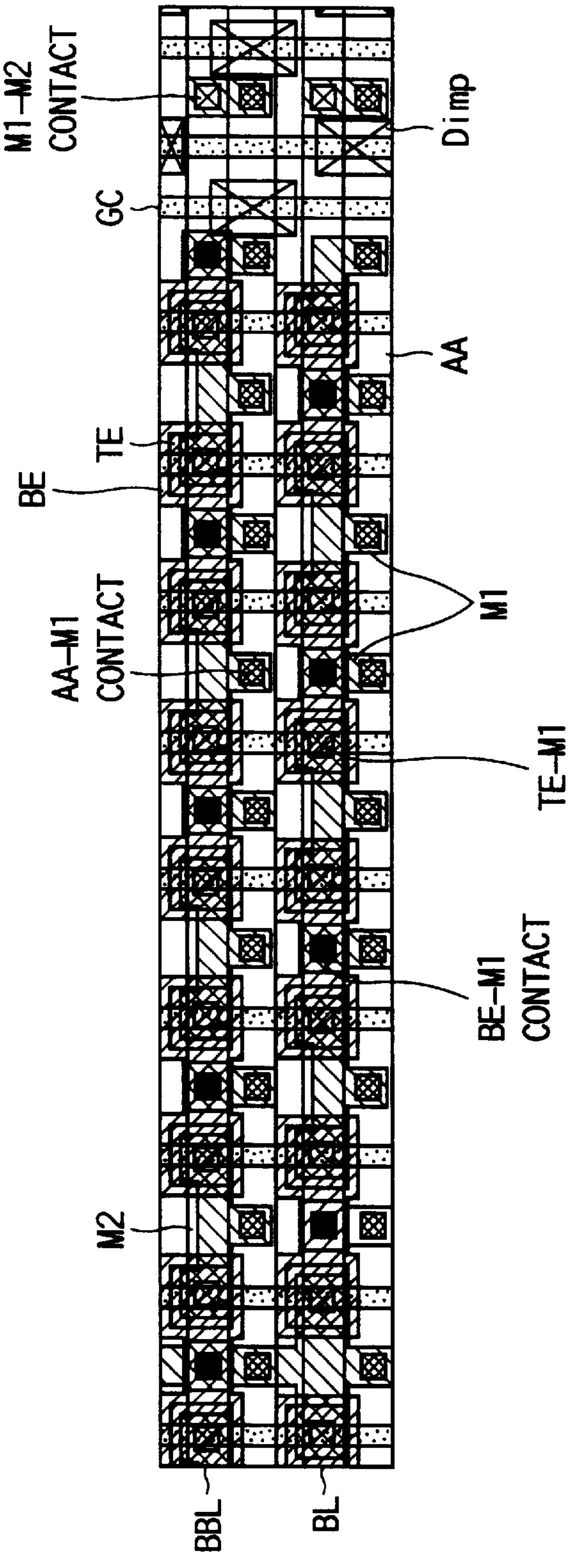
Figure 214:
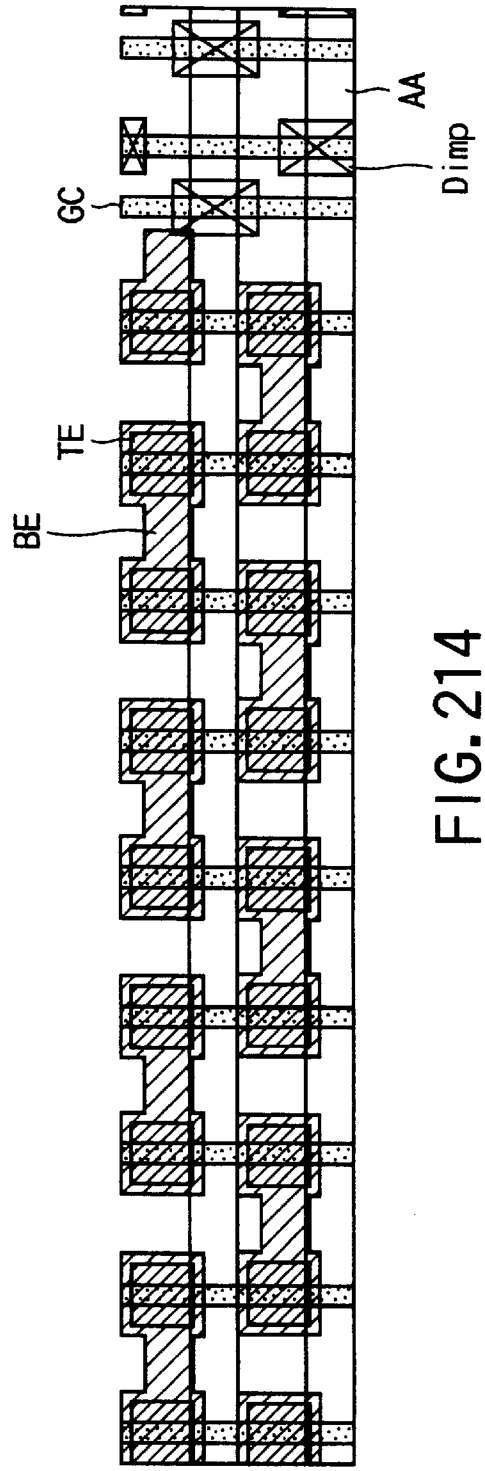
Figure 215:
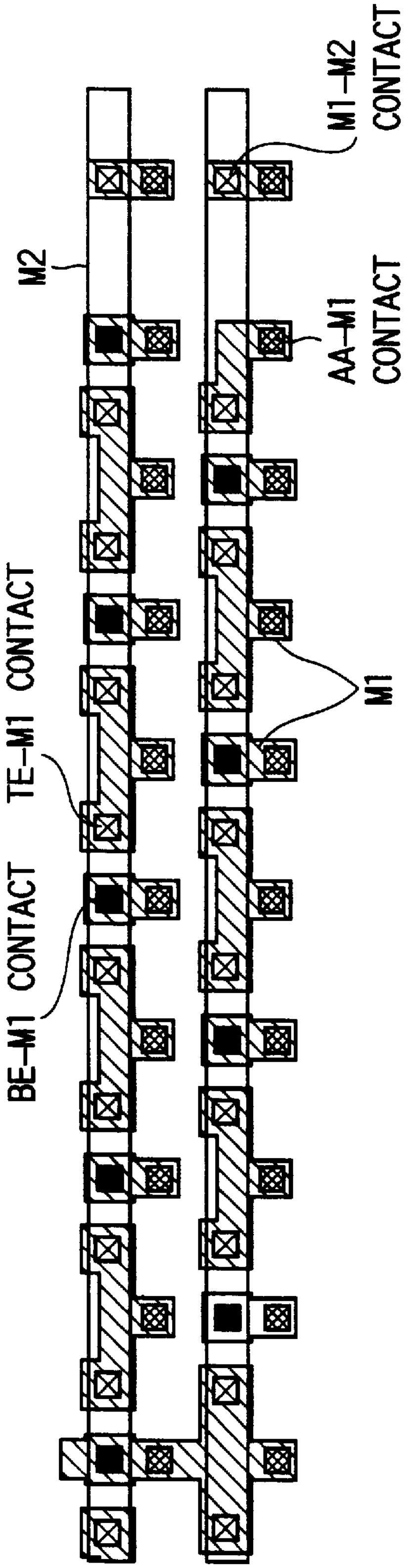
Figure 216:
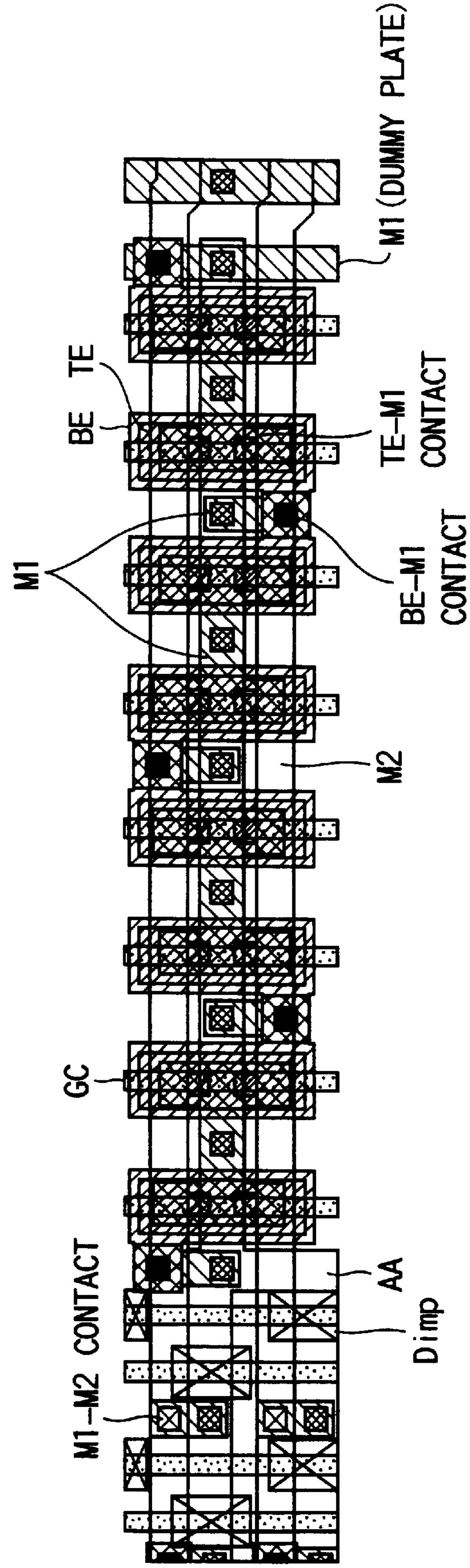
Figure 217:
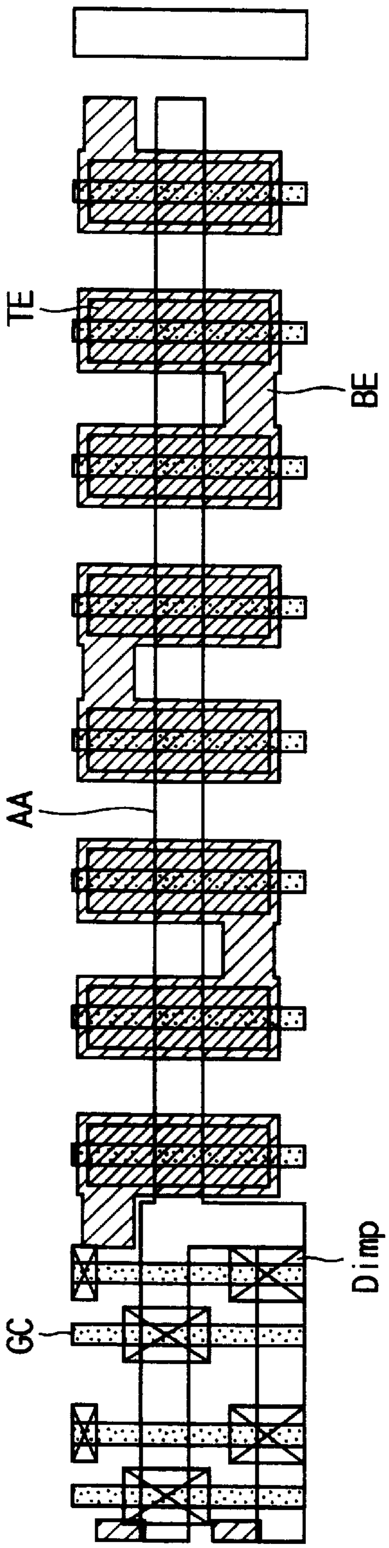
Figure 218:
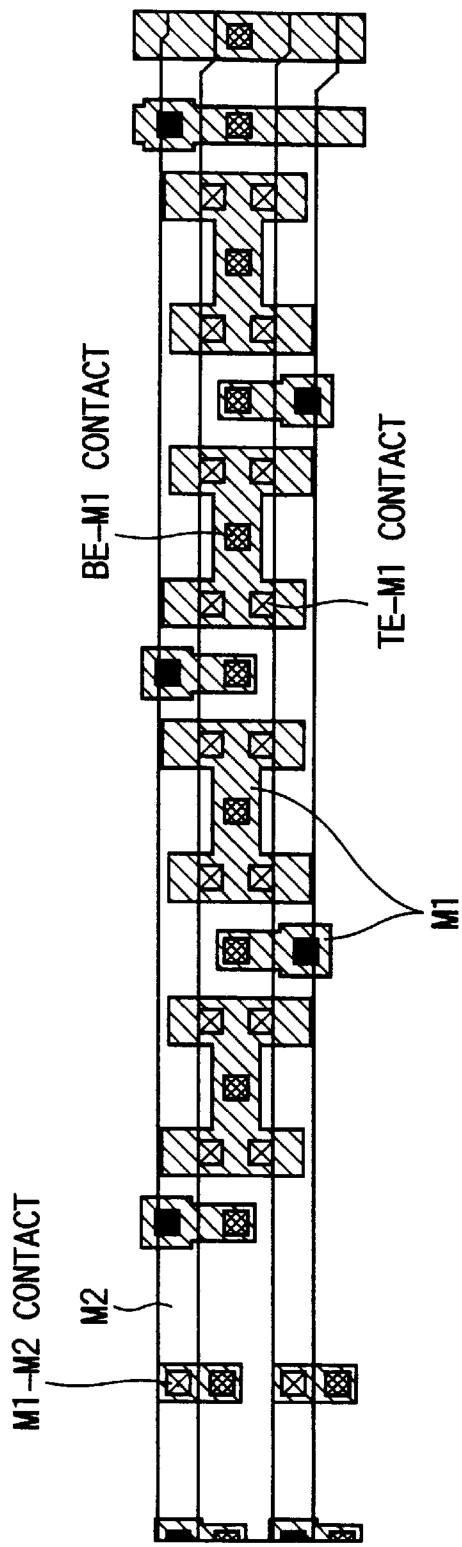
Figure 219:
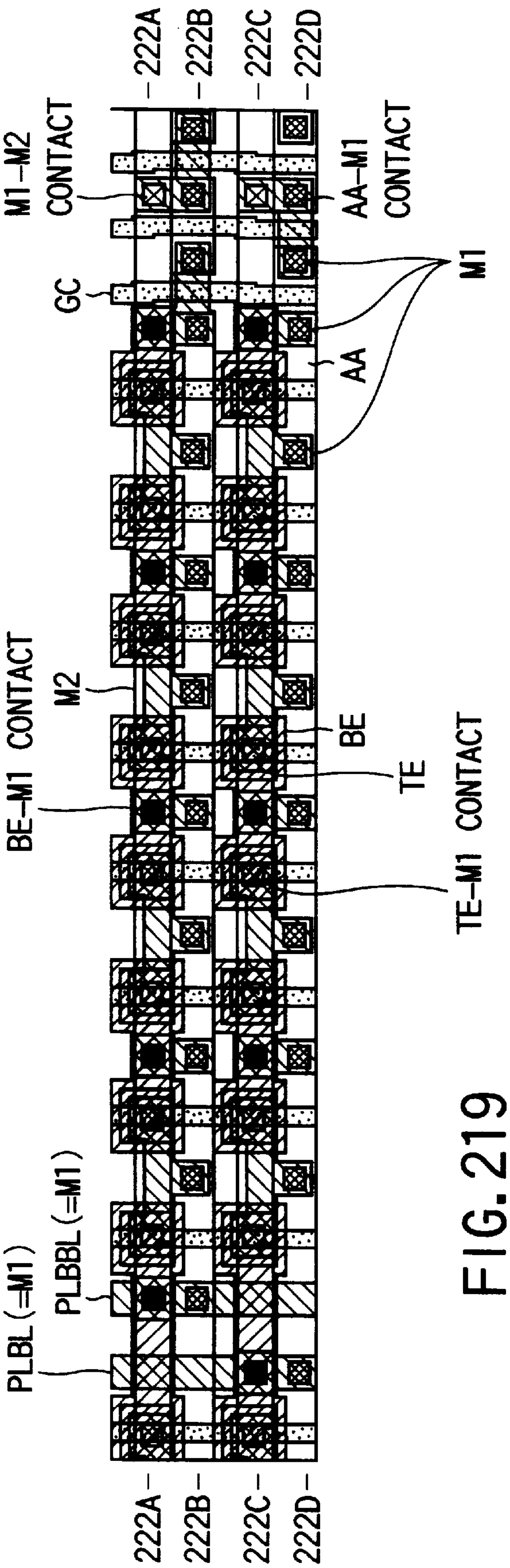
Figure 220:
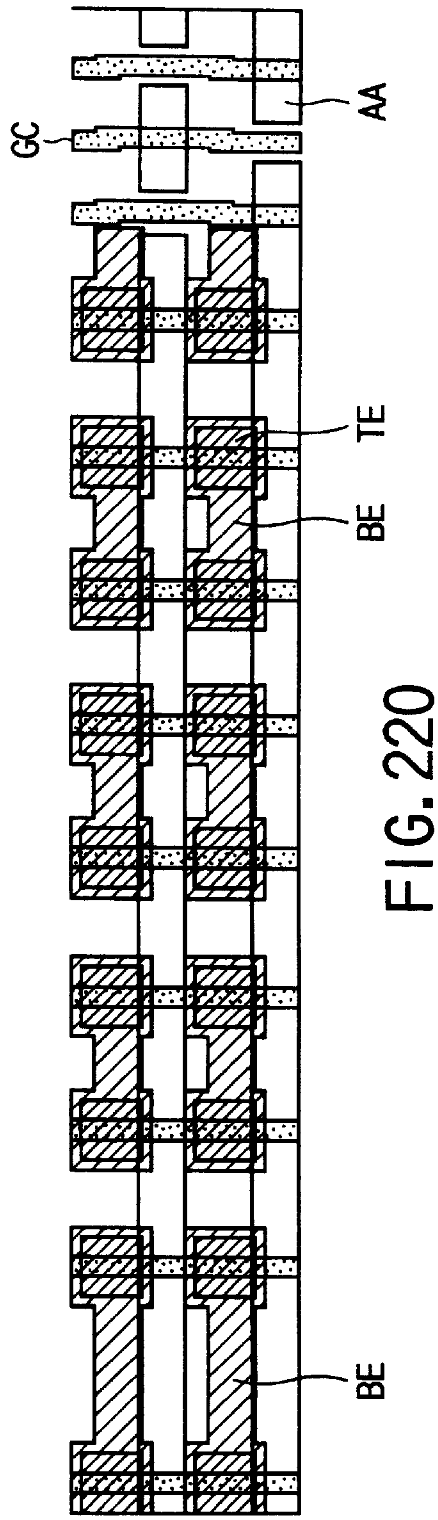
Figure 221:
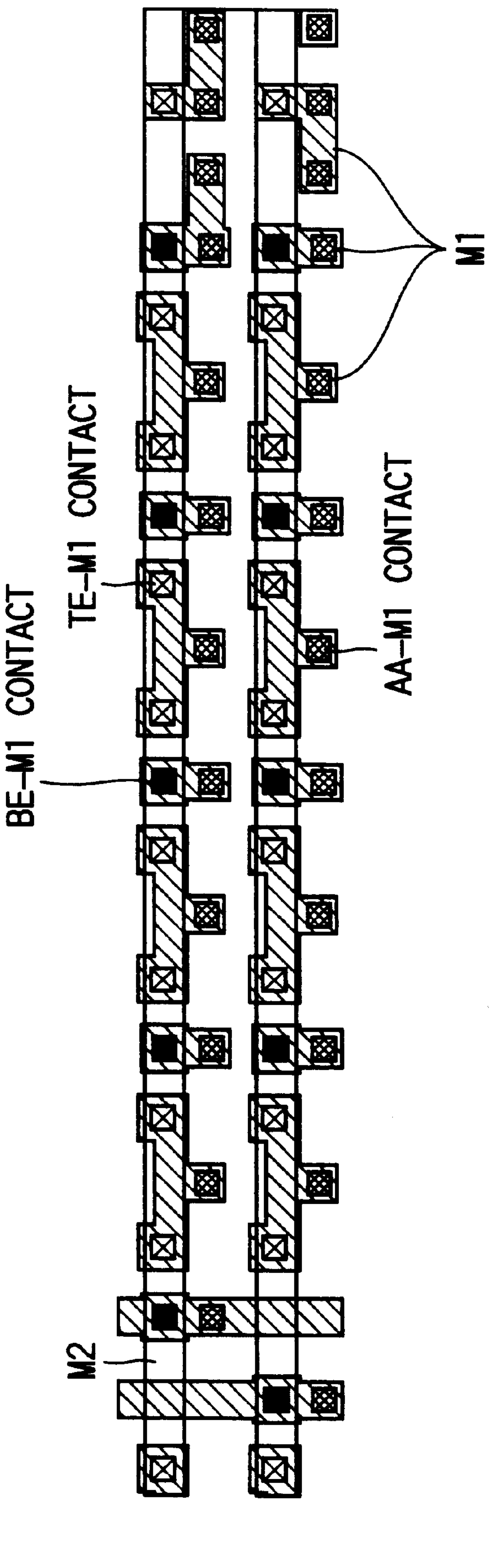
Figure 222A:
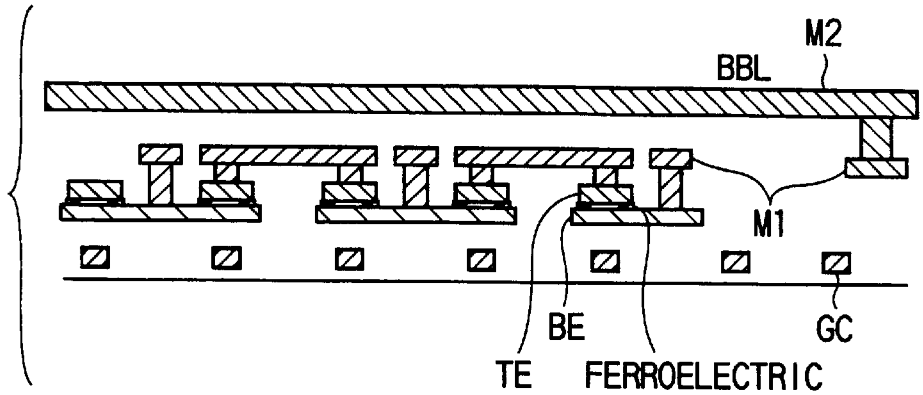
Figure 222B:
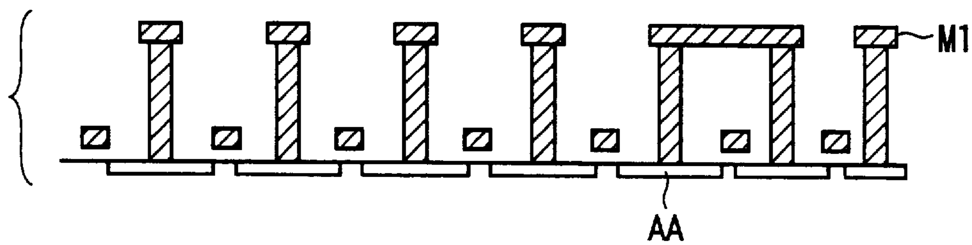
Figure 222C:
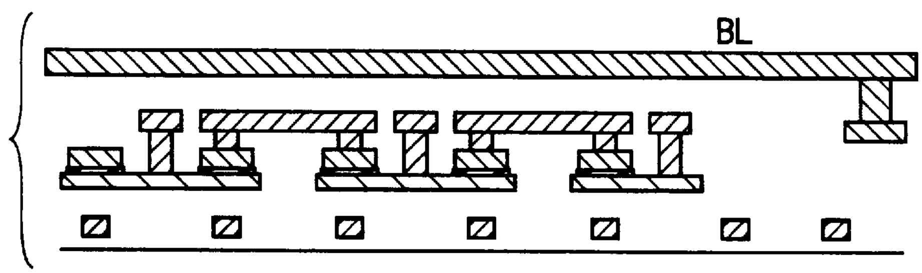
Figure 222D:
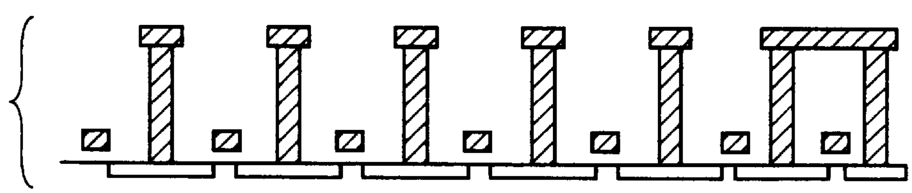
Figure 223A:
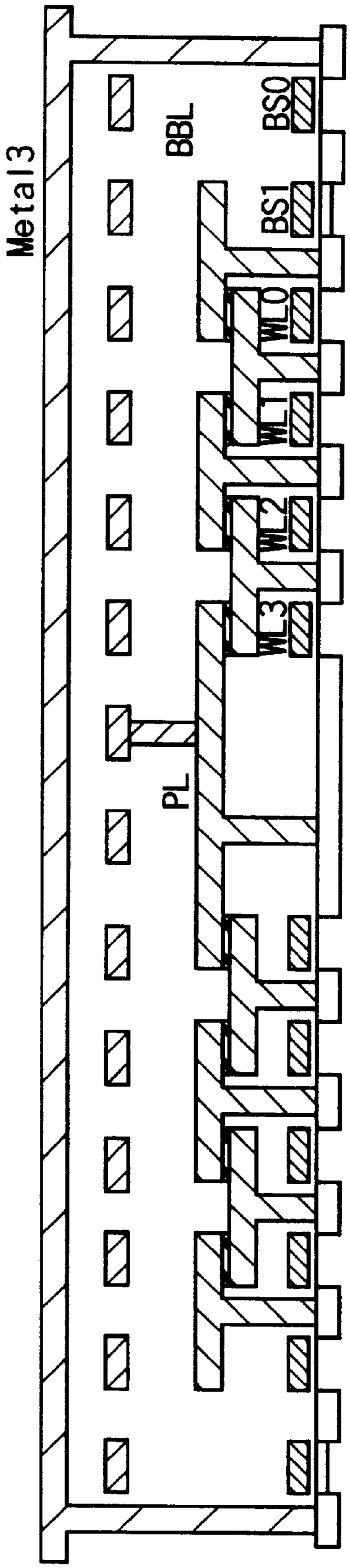
Figure 223B:
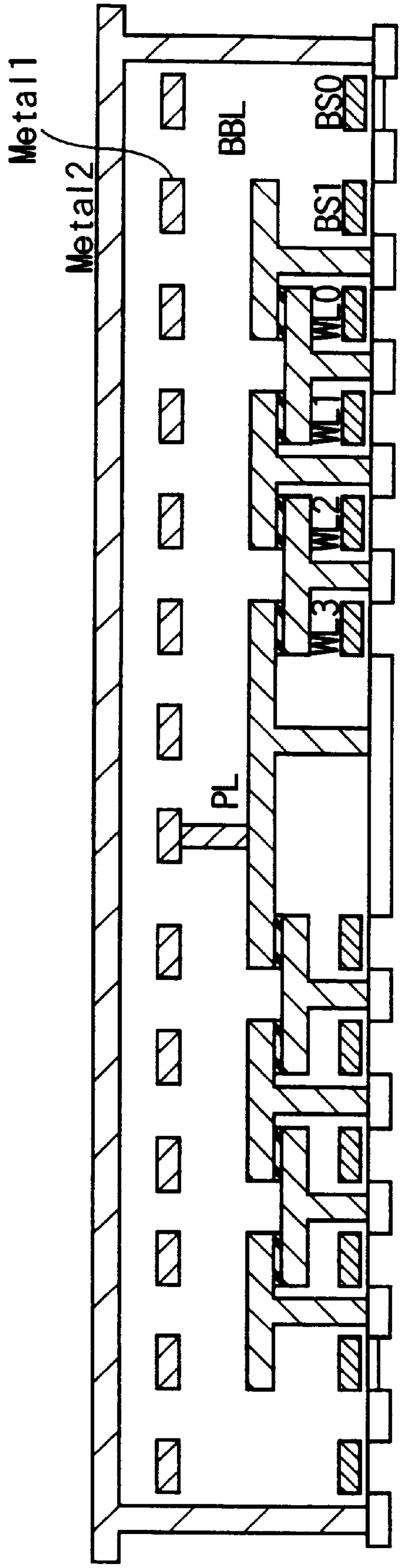
Figure 224A:
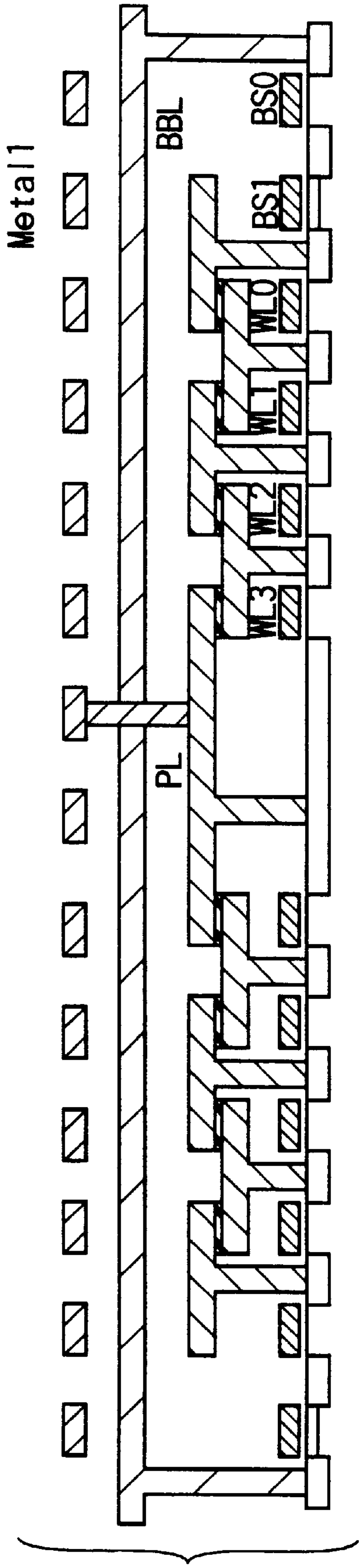
Figure 224B:
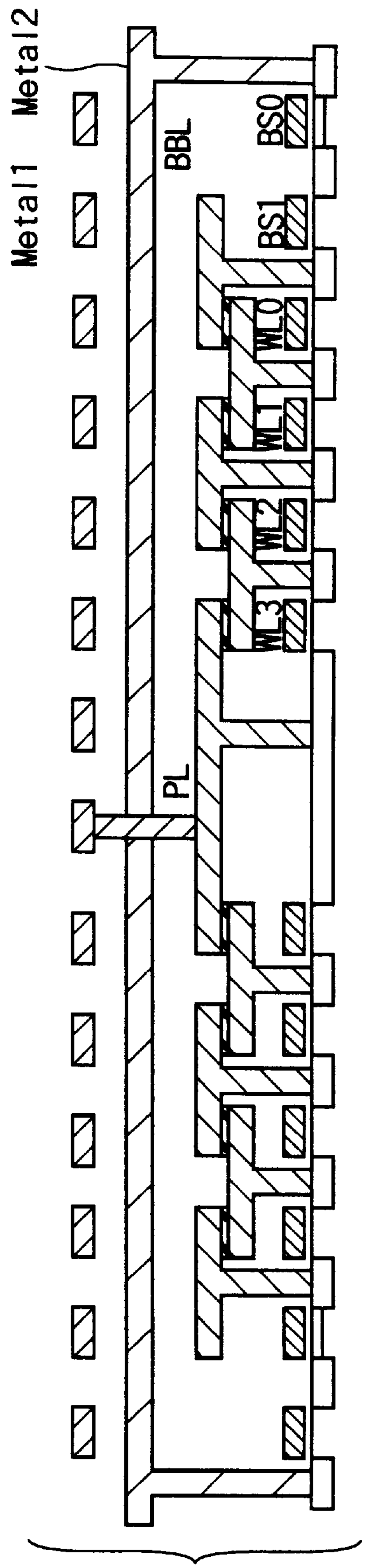
Figure 225A:
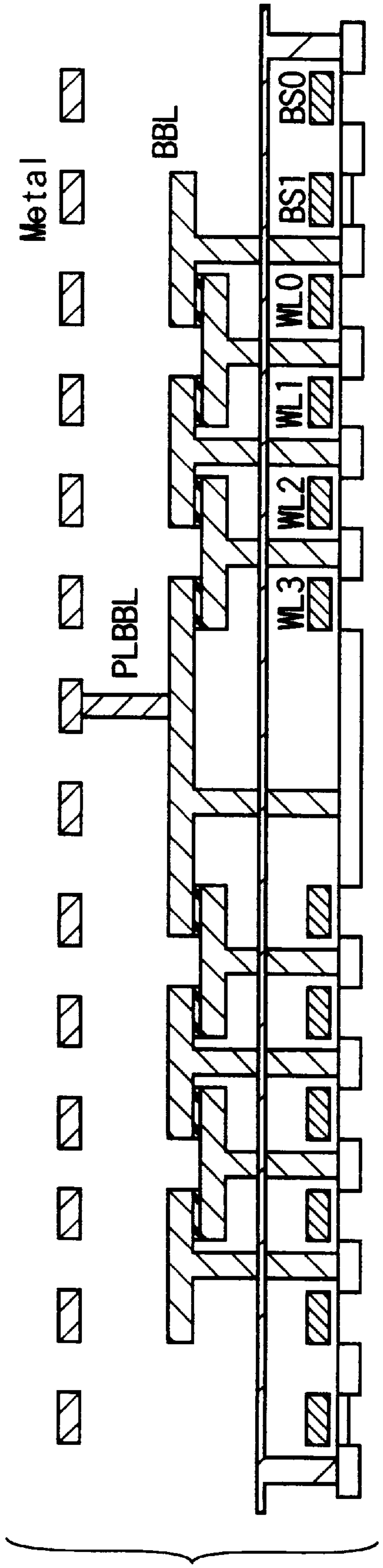
Figure 225B:
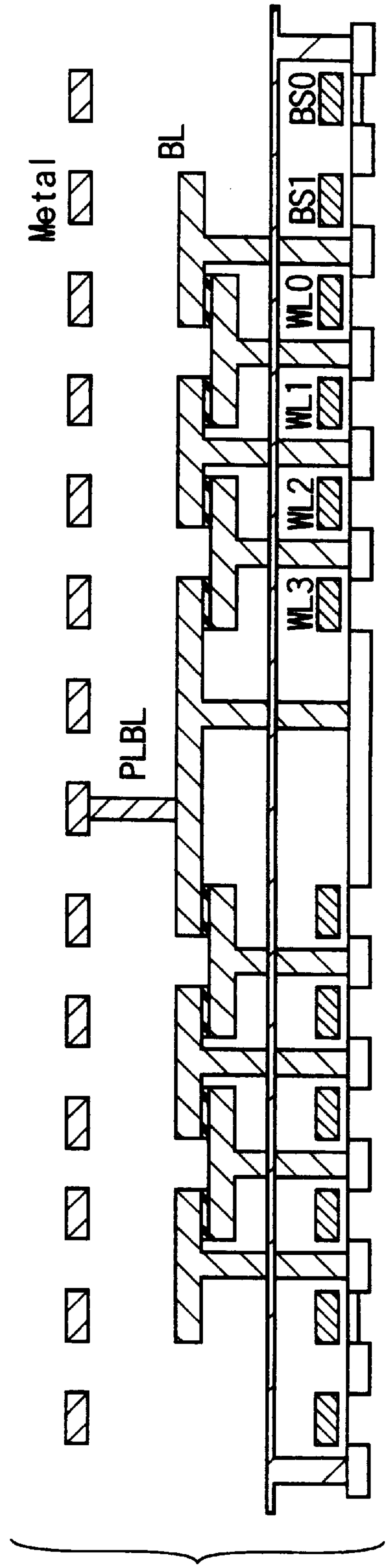
Figure 226A:
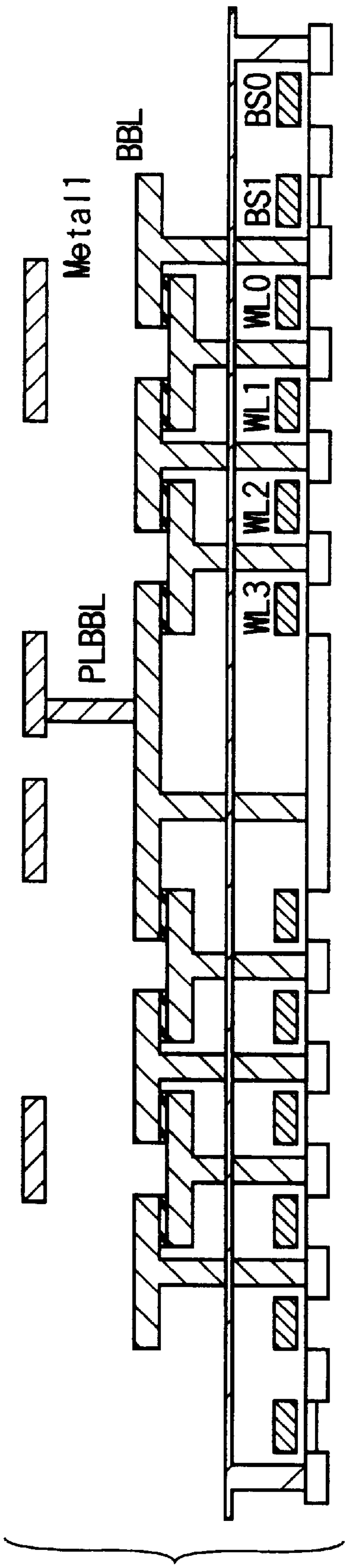
Figure 226B:
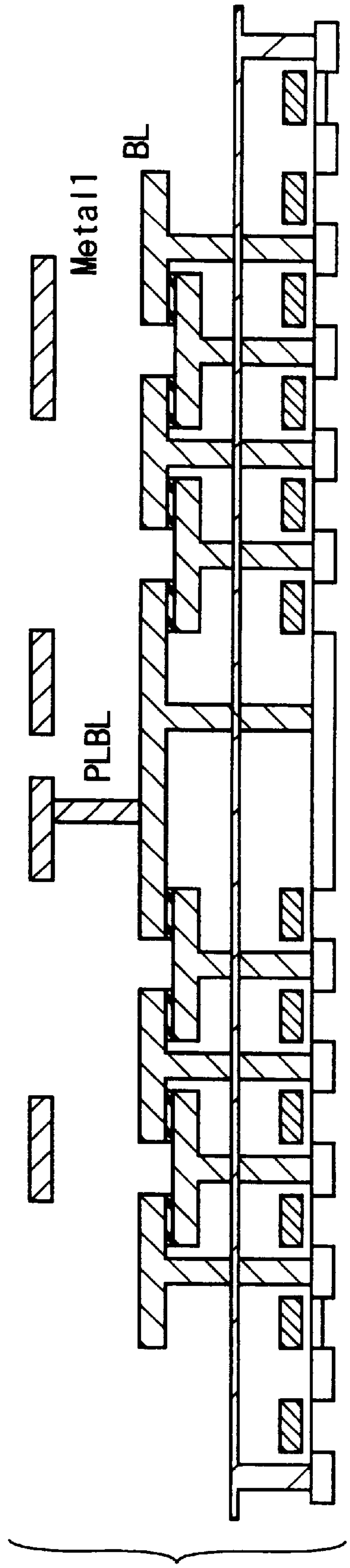
Figure 227A:
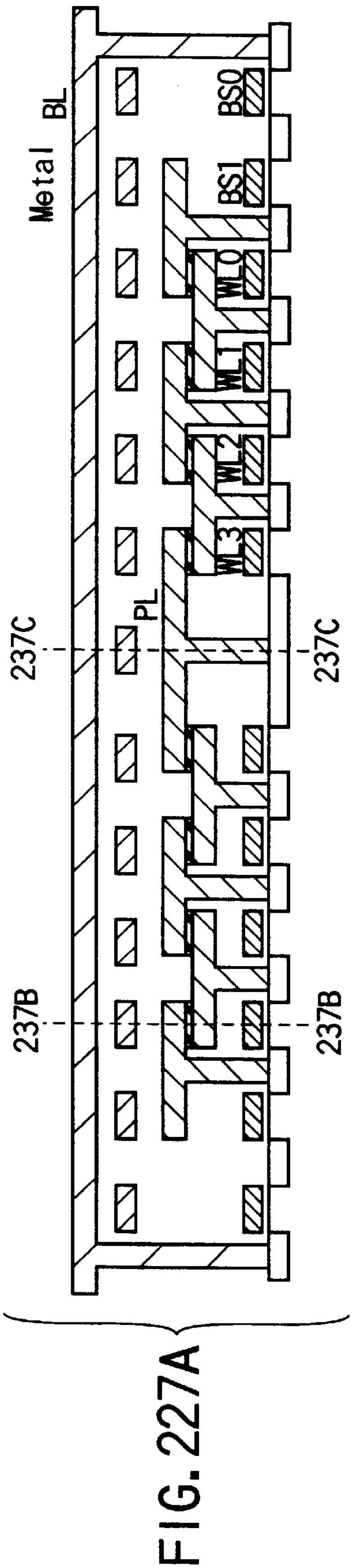
Figure 227B:
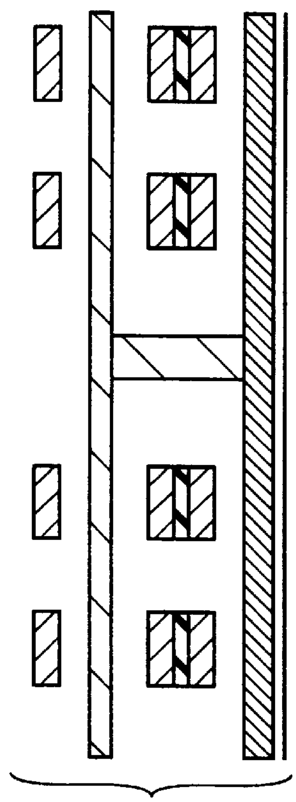
Figure 227C:
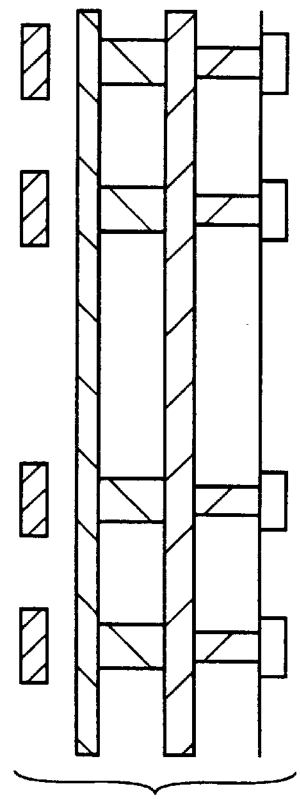
Figure 228A:
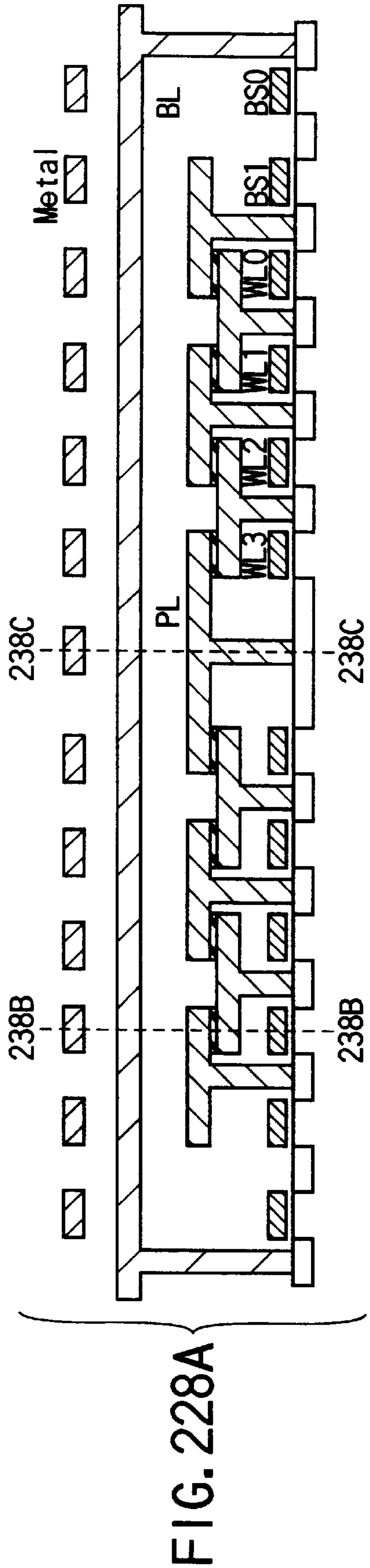
Figure 228B:
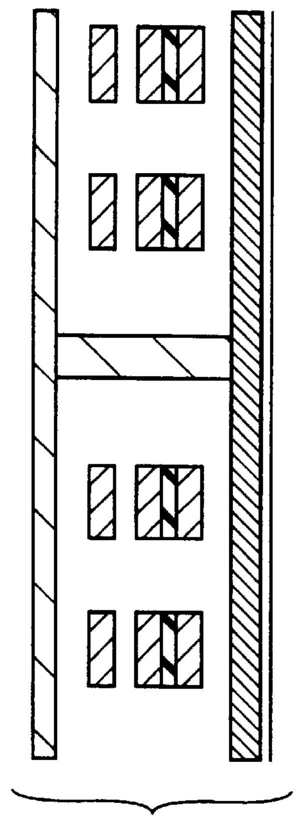
Figure 228C:
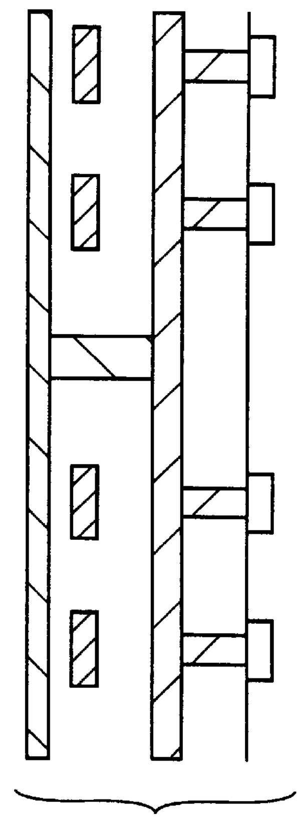
Figure 229:
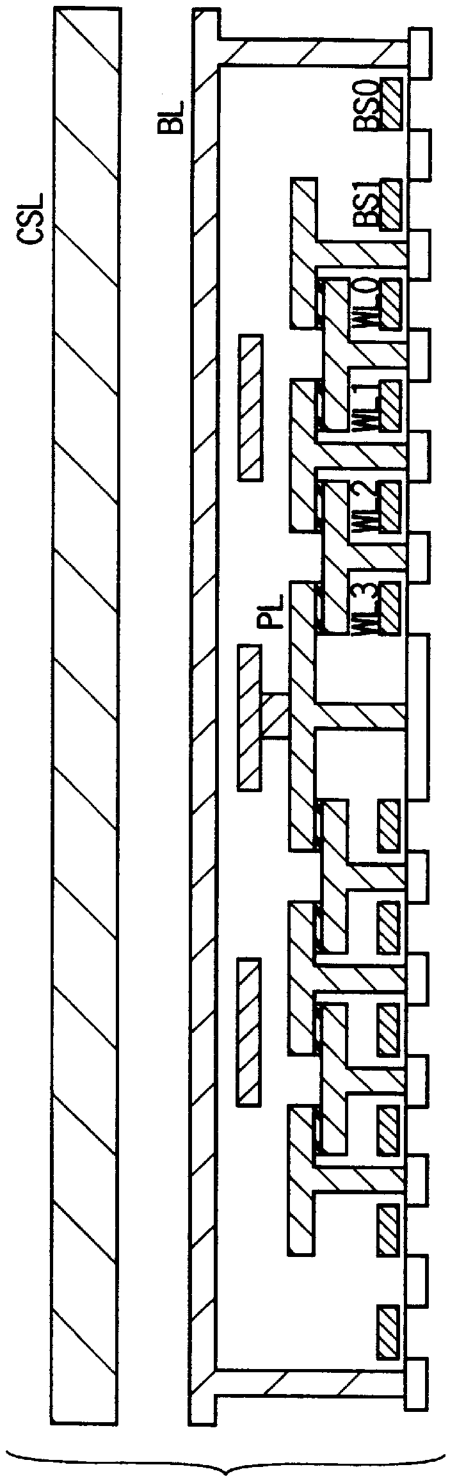
Figure 230:
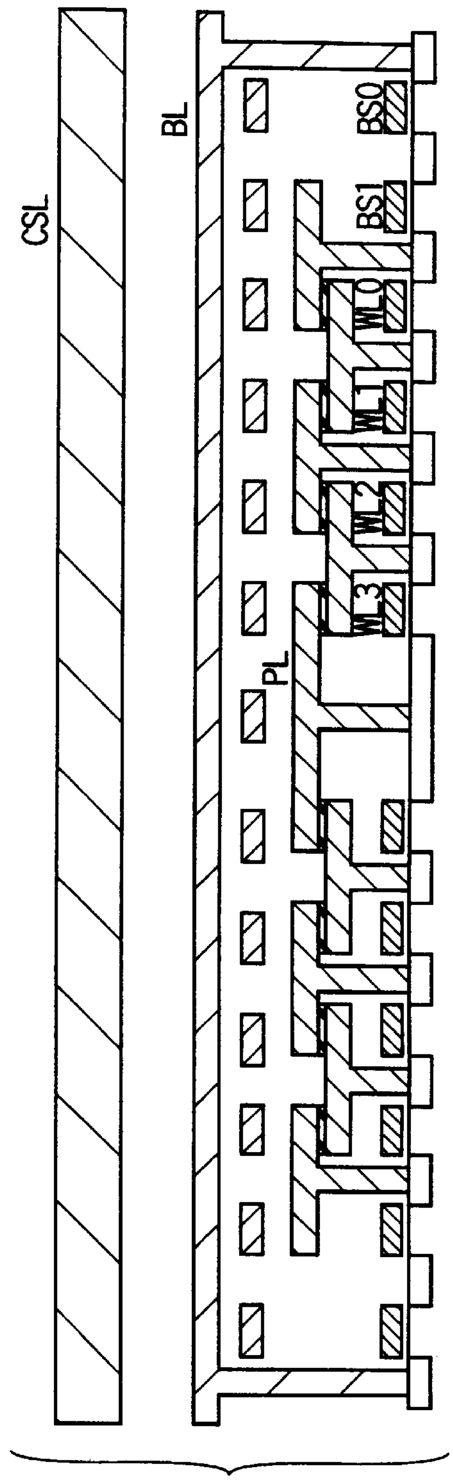
Figure 233:
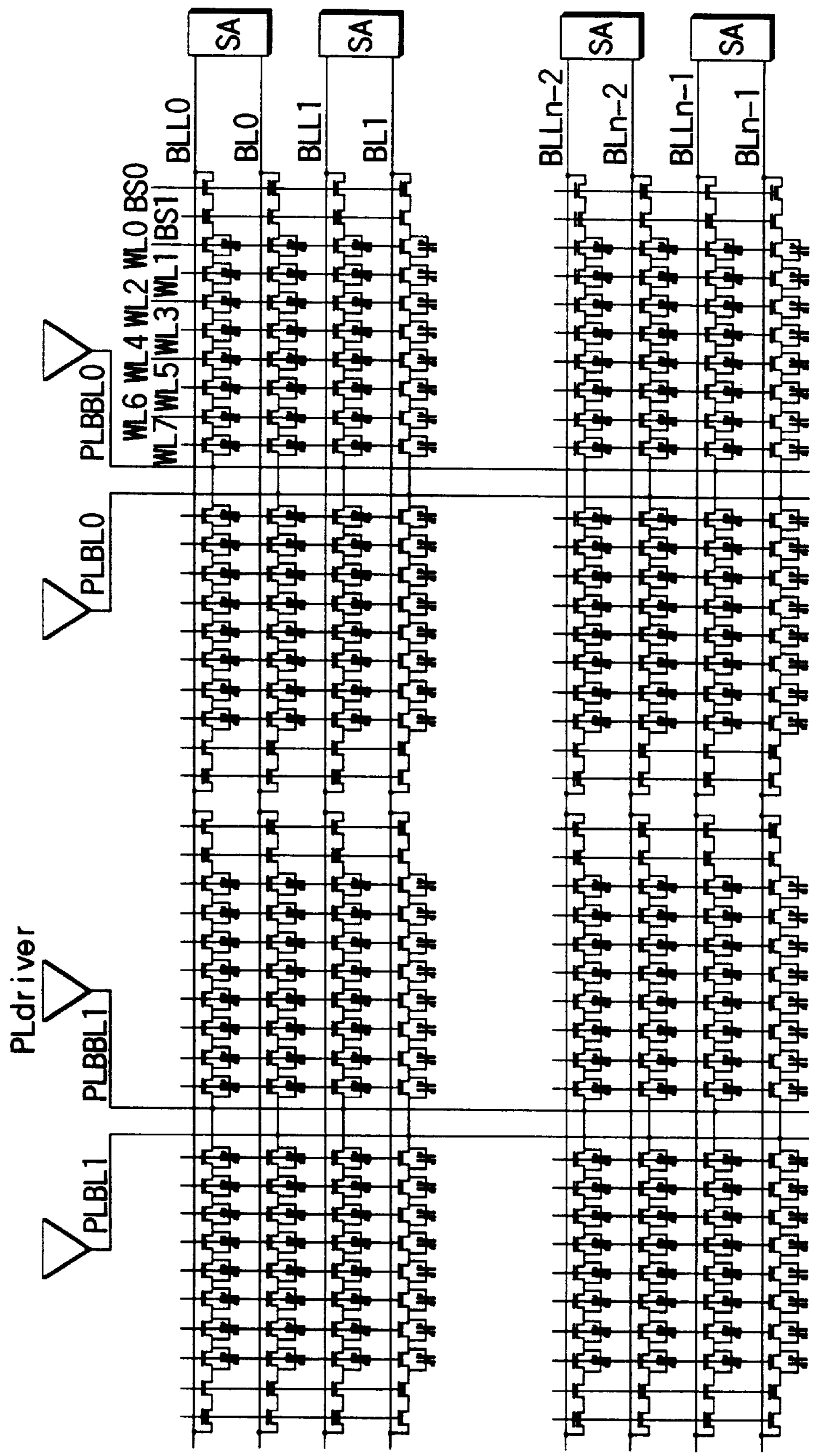
Figure 234:
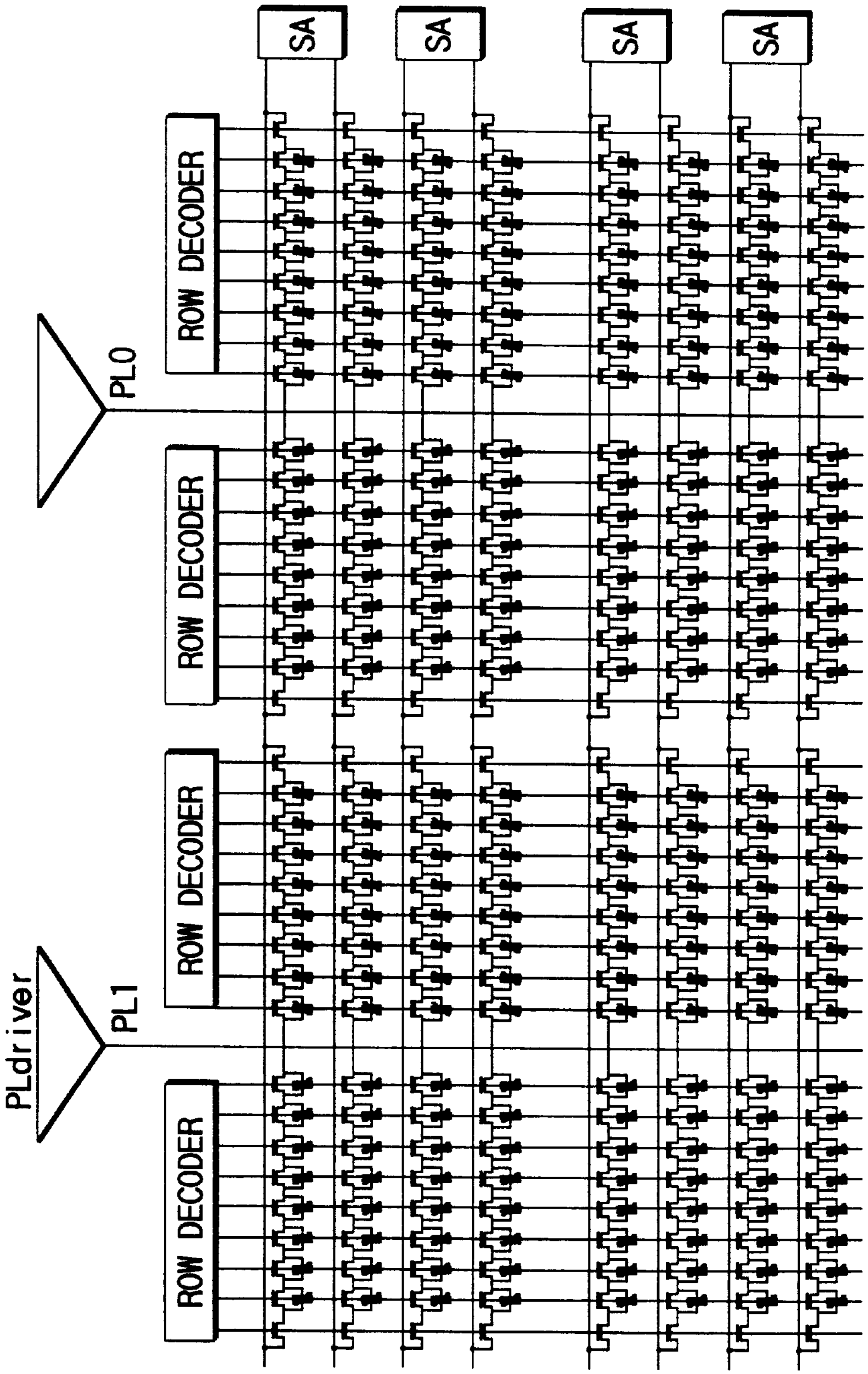
Figure 235:
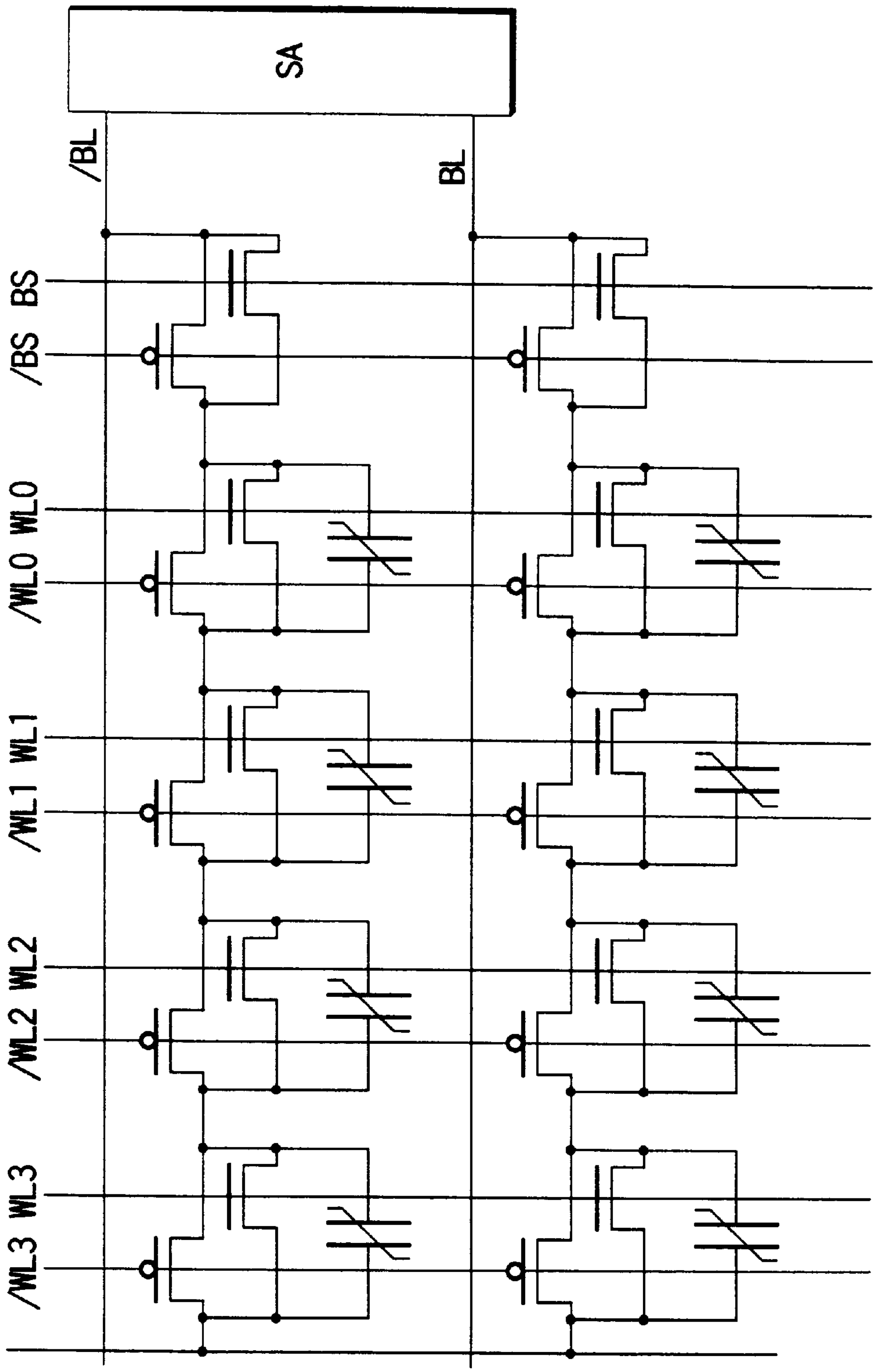
Figure 236:
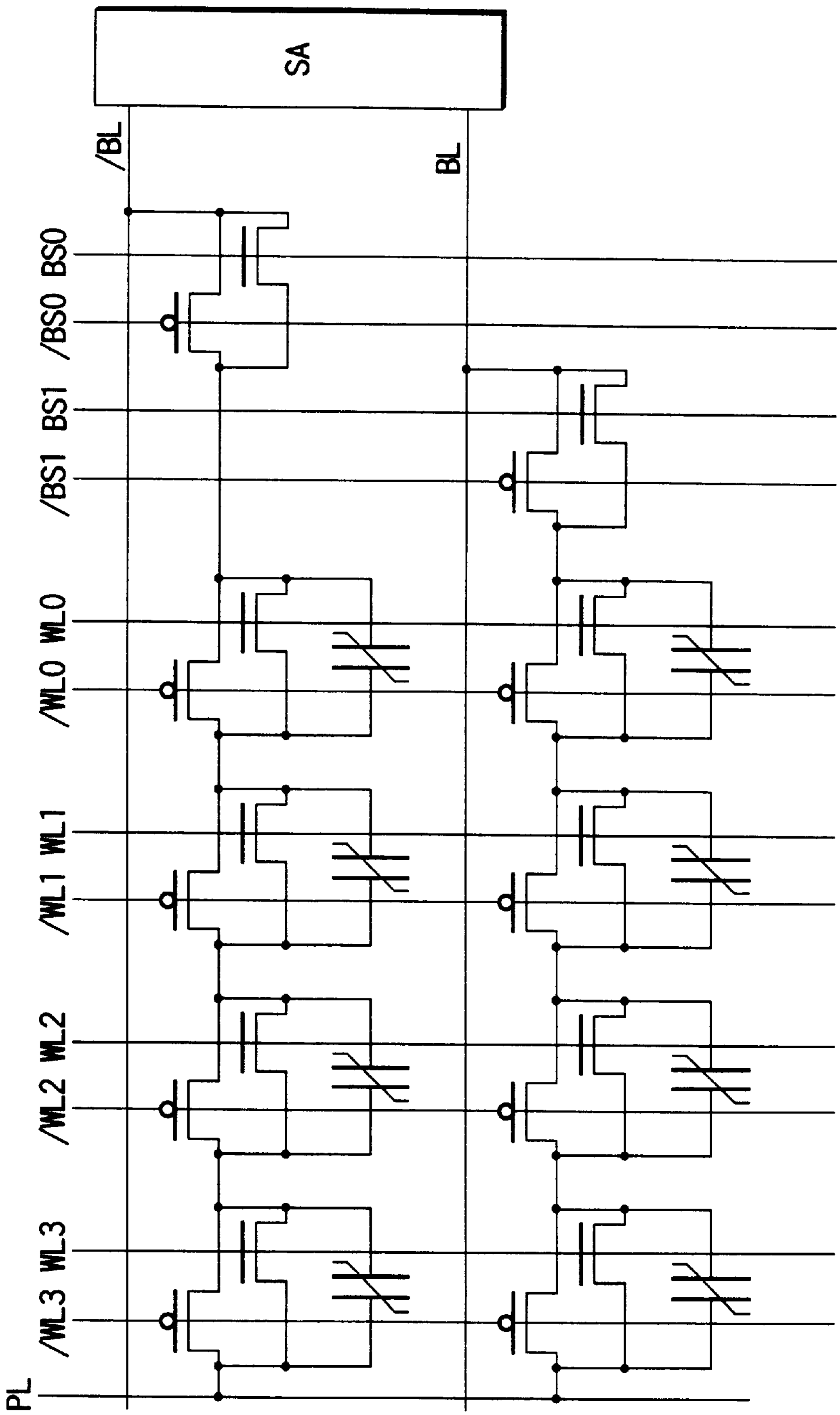
Figure 237A:
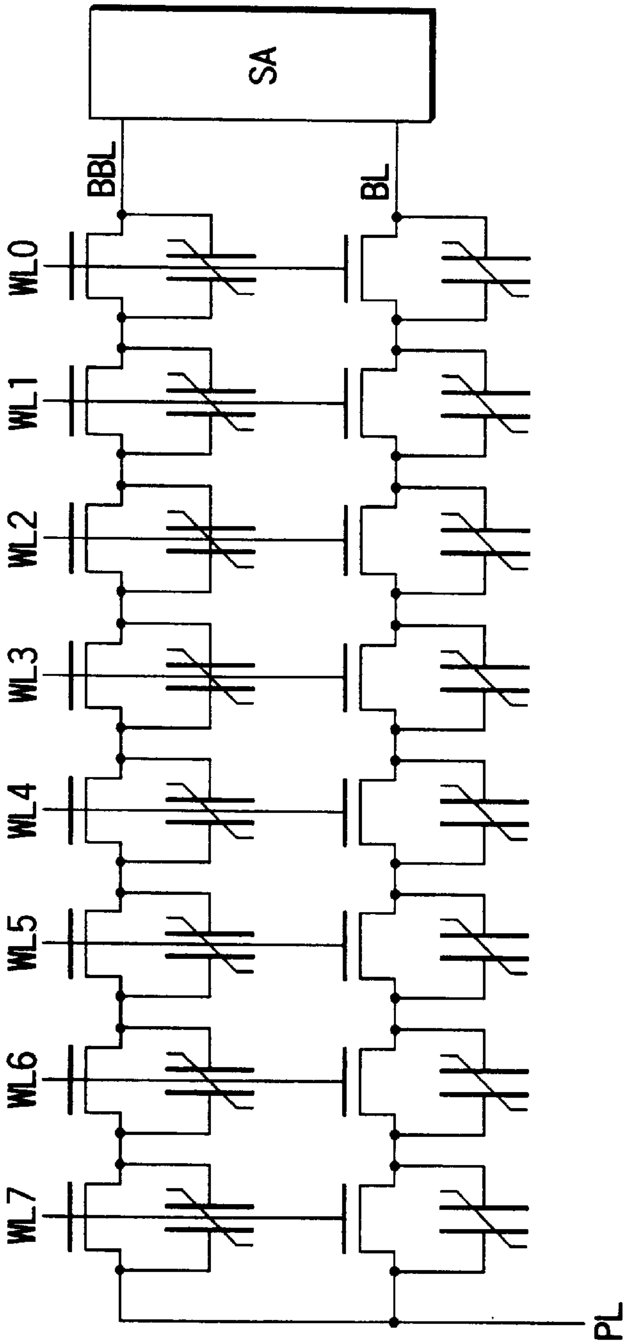
Figure 237B:
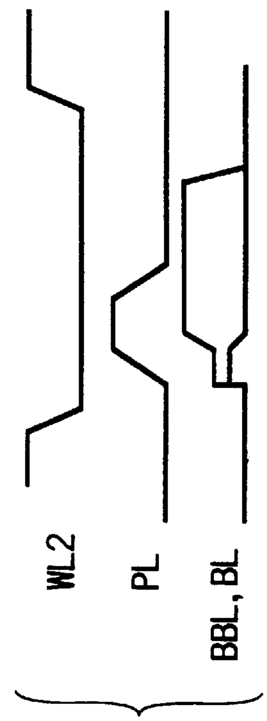

FIG. 131 is an equivalent circuit diagram of an FRAM according to the 88th embodiment;

FIG. 132 is a sectional view showing the device structure of an FRAM according to the 89th embodiment;

FIG. 133 is an equivalent circuit diagram of an FRAM according to the 90th embodiment;

FIG. 134A and FIG. 134B are an equivalent circuit diagram and a graph, respectively, showing an FRAM according to the 91st embodiment;

FIG. 135A to FIG. 135E are sectional views showing the device structure of an FRAM according to the 92nd embodiment;

FIG. 136 is an equivalent circuit diagram of an FRAM according to the 93rd embodiment;

FIG. 137 is a sectional view showing the device structure of an FRAM according to the 94th embodiment;

FIG. 138 is an equivalent circuit diagram of an FRAM according to the 95th embodiment;

FIG. 139 is a timing chart showing the operation of an FRAM according to the 96th embodiment;

FIG. 140A and FIG. 140B are an equivalent circuit diagram of an FRAM according to the 97th embodiment and a sectional view of the device structure, respectively;

FIG. 141A and FIG. 141B are an equivalent circuit diagram of an FRAM according to the 98th embodiment and a sectional view of the device structure, respectively;

FIG. 142A and FIG. 142B are an equivalent circuit diagram of an FRAM according to the 99th embodiment and a sectional view of the device structure, respectively;

FIG. 143 is an equivalent circuit diagram of an FRAM according to the 100th embodiment;

FIG. 144 is a sectional view showing the device structure of an FRAM according to the 101st embodiment;

FIG. 145 is an equivalent circuit diagram of an FRAM according to the 102nd embodiment;

FIG. 146 is a circuit diagram showing the word line structure of an FRAM according to the 103rd embodiment;

FIG. 147 is a circuit diagram showing the word line structure of an FRAM according to the 104th embodiment;

FIG. 148A and FIG. 148B are circuit diagrams showing connection of the word line structure of an FRAM according to the 105th embodiment;

FIG. 149A and FIG. 149B are plan views showing the layout of the subarray central portion of the word line structure of an FRAM according to the 106th embodiment;

FIG. 150A and FIG. 150B are plan views showing part of the layout of the subarray central portion of the word line structure of the FRAM according to the 106th embodiment;

FIG. 151A and FIG. 151B are plan views showing part of the layout of the subarray central portion of the word line structure of the FRAM according to the 106th embodiment;

FIG. 152A and FIG. 152B are plan views showing part of the layout of the subarray central portion of the word line structure of the FRAM according to the 106th embodiment;

FIG. 153 is a circuit diagram showing the circuit of the sub-row decoder of the word line structure of an FRAM according to the 107th embodiment;

FIG. 154 is a block diagram of a cell array block including a spare array in an FRAM according to the 108th embodiment;

FIG. 155 is a block diagram of a cell array block including a redundancy spare circuit in an FRAM according to the 109th embodiment;

FIG. 156 is an equivalent circuit diagram of an FRAM according to the 110th embodiment;

FIG. 157 is a circuit diagram for explaining a method of replacing a defect memory cell in an FRAM according to the 111th embodiment;

FIG. 158 is a circuit diagram for explaining a method of replacing a defect memory cell in an FRAM according to the 112th embodiment;

FIG. 159 is a circuit diagram for explaining a method of replacing a defect memory cell in an FRAM according to the 113th embodiment;

FIG. 160 is a sectional view showing the device structure of an FRAM according to the 114th embodiment;

FIG. 161 is a sectional view showing another device structure of the FRAM according to the 114th embodiment;

FIG. 162 is an equivalent circuit diagram of the FRAM according to the 114th embodiment;

FIG. 163 is a timing chart showing the operation of the FRAM according to the 114th embodiment;

FIG. 164A to FIG. 164D are plan views of memory cells of an FRAM according to the 115th embodiment;

FIG. 165A to FIG. 165D are plan views showing the partial layouts of the memory cells shown in FIG. 164A to FIG. 164D, respectively;

FIG. 166A to FIG. 166D are plan views showing the partial layouts of the memory cells shown in FIG. 164A to FIG. 164D, respectively;

FIG. 167A to FIG. 167D are sectional views of the memory cells shown in FIG. 164A to FIG. 164D, respectively;

FIG. 168 is a sectional view of the memory cells shown in FIG. 164A to FIG. 164D;

FIG. 169A is a plan view of a memory cell of an FRAM according to the 116th embodiment;

FIG. 169B is a plan view showing partial layout of the memory cell shown in FIG. 169A;

FIG. 169C is a plan view showing partial layout of the memory cell shown in FIG. 169A;

FIG. 170A and FIG. 170B are an equivalent circuit diagram and a sectional view, respectively, showing a memory cell structure according to the 117th embodiment;

FIG. 171A through FIG. 171C show a structure of the circuit and an operation of memory cell explained in previous embodiments;

FIG. 172 is a circuit diagram showing an FRAM according to the 118th embodiment;

FIG. 173A and FIG. 173B are timing charts showing a specific example of the operation according to the 118th embodiment;

FIG. 174 is a circuit diagram showing an FRAM according to the 119th embodiment;

FIG. 175 is a circuit diagram showing an modified example of FIG. 174;

FIG. 176 is a circuit diagram showing an FRAM according to the 120th embodiment;

FIG. 177A and FIG. 177B are timing charts showing the operation of the structure of FIG. 176;

FIG. 178 is a circuit diagram showing an FRAM according to the 121st embodiment;

FIG. 179A and FIG. 179B are timing charts showing the operation of the structure of FIG. 178;

FIG. 180 is a circuit diagram showing an FRAM according to the 122nd embodiment;

FIG. 181 is a circuit diagram showing an FRAM according to the 123rd embodiment;

FIG. 182A and FIG. 182B are timing charts showing the operations of the structures of FIG. 180 and FIG. 181;

FIG. 183 is a circuit diagram showing an FRAM according to the 124th embodiment;

FIG. 184A and FIG. 184B are timing charts showing the operation of the structure of FIG. 183;

FIG. 185A and FIG. 185B are timing charts showing the operation scheme of an FRAM according to the 125th embodiment;

FIG. 186A and FIG. 186B are timing charts showing the operation of the 126th embodiment;

FIG. 187 is a circuit diagram showing the structure of a sense amplifier portion of an FRAM according to the 127th embodiment;

FIG. 188 is a circuit diagram showing the structure of a sense amplifier portion of an FRAM according to the 128th embodiment;

FIG. 189 is a drawing that shows one example of the cross section of the cell structure of FIG. 102;

FIG. 190A to FIG. 190C are drawings that show hysteresis curves in the operation of the multi-bit/cell scheme of FIG. 102;

FIG. 191A to FIG. 191C are drawings that show actual hysteresis curves;

FIG. 192 is a sectional view that shows the memory cell block construction of an FRAM according to the 129th embodiment;

FIG. 193 is a timing chart showing a specific operational example of the operation of a multi-bit/cell in the case when the plate driving scheme as explained as mentioned above is applied;

FIG. 194 is a timing chart that shows the operation of the 130th embodiment;

FIG. 195A to FIG. 195D are drawings that show the circuit construction of a core portion for explaining the 131st embodiment;

FIG. 196 is a timing chart showing the operation of the 131st embodiment;

FIG. 197 is a timing chart showing the operation of the 132nd embodiment;

FIG. 198 is a timing chart showing the operation of the 132nd embodiment;

FIG. 199 is a timing chart showing the operation of the 133rd embodiment;

FIG. 200 is a timing chart showing the operation of the 133rd embodiment;

FIG. 201 is a timing chart showing the operation of the 134th embodiment;

FIG. 202 is a timing chart showing the operation of the 135th embodiment;

FIG. 203 is a drawing that shows a writing time alleviating scheme according to the 136th embodiment;

FIG. 204A to FIG. 204C is drawings that show specific structural examples of a write buffer according to the 137th embodiment;

FIG. 205, which explains the 138th embodiment, is a drawing that shows a specific layout of a memory cell block for realizing the equivalent circuit of the embodiment shown in FIG. 174;

FIG. 206 is a drawing that shows the layout of FIG. 205 in a divided manner for ease of understanding;

FIG. 207 is a drawing that shows the layout of FIG. 205 in a divided manner for ease of understanding;

FIG. 208A to FIG. 208D are drawings that respectively show examples of cross sections taken along 208A—208A, 208B—208B, 208C—208C and 208D—208D of the layout of FIG. 205;

FIG. 209 is a drawing that shows a specific layout of a memory cell block according to the 139th embodiment;

FIG. 210 is a drawing that shows the layout of FIG. 209 in a divided manner for ease of understanding;

FIG. 211 is a drawing that shows the layout of FIG. 209 in a divided manner for ease of understanding;

FIG. 212A and FIG. 212B are drawings that respectively show examples of cross sections taken along 212A—212A and 212B—212B of the layout of FIG. 209;

FIG. 213 is a drawing that shows a specific layout of a memory cell block according to the 140th embodiment;

FIG. 214 is a drawing that shows the layout of FIG. 213 in a divided manner for ease of understanding;

FIG. 215 is a drawing that shows the layout of FIG. 213 in a divided manner for ease of understanding;

FIG. 216, which explains an FRAM according to the 141st embodiment, is a drawing that shows a specific layout for realizing an equivalent circuit for the dummy cell block of FIG. 176;

FIG. 217 is a drawing that shows the layout of FIG. 216 in a divided manner for ease of understanding;

FIG. 218 is a drawing that shows the layout of FIG. 216 in a divided manner for ease of understanding;

FIG. 219, which explains an FRAM according to 142nd embodiment, is a drawing that shows a specific layout of a memory cell block for realizing the equivalent circuit of FIG. 175;

FIG. 220 is a drawing that shows the layout of FIG. 219 in a divided manner for ease of understanding;

FIG. 221 is a drawing that shows the layout of FIG. 219 in a divided manner for ease of understanding;

FIG. 222A to FIG. 222D are drawings that respectively show examples of cross sections taken along 222A—222A, 222B—222B, 222C—222C and 222D—222D of the layout of FIG. 219;

FIG. 223A and FIG. 223B are cross sections that show structural examples of an FRAM according to the 143rd embodiment;

FIG. 224A and FIG. 224B are sectional views that show structural examples of an FRAM according to the 144th embodiment;

FIG. 225A and FIG. 225B are sectional views that show structural examples of an FRAM according to the 145th embodiment;

FIG. 226A and FIG. 226B are sectional views that show structural examples of an FRAM according to the 146th embodiment;

FIG. 227A and FIG. 227C are sectional views that show structural examples of an FRAM according to the 147th embodiment;

FIG. 228A and FIG. 228C are sectional views that show structural examples of an FRAM according to the 148th embodiment;

FIG. 229 is a sectional view showing a structural example of a memory cell block of an FRAM according to the 149th embodiment;

FIG. 230 is a sectional view showing a structural example of a memory cell block of an FRAM according to the 149th embodiment;

FIG. 231A to FIG. 231F are sectional views showing cell constructions of an FRAM according to the 150th embodiment;

FIG. 232A to FIG. 232H are sectional views showing structural examples of memory cell blocks of an FRAM according to the 151st embodiment;

FIG. 233 is a drawing that shows structures of a memory cell array and a plate driving circuit of an FRAM according to the 152nd embodiment;

FIG. 234 is a drawing that shows structures of a memory array, a row decoder and a plate driving circuit of an FRAM according to the 153rd embodiment;

FIG. 235 is a circuit diagram that shows an FRAM according to the 154th embodiment;

FIG. 236 is a circuit diagram that shows an FRAM according to the 155th embodiment; and FIG. 237A and FIG. 237B are circuit diagrams showing an FRAM according to the 156th embodiment.

DETAILED DESCRIPTION OF THE INVENTION

The embodiments of the present invention will be described below with reference to the accompanying drawing.

First Embodiment

Figure 5:
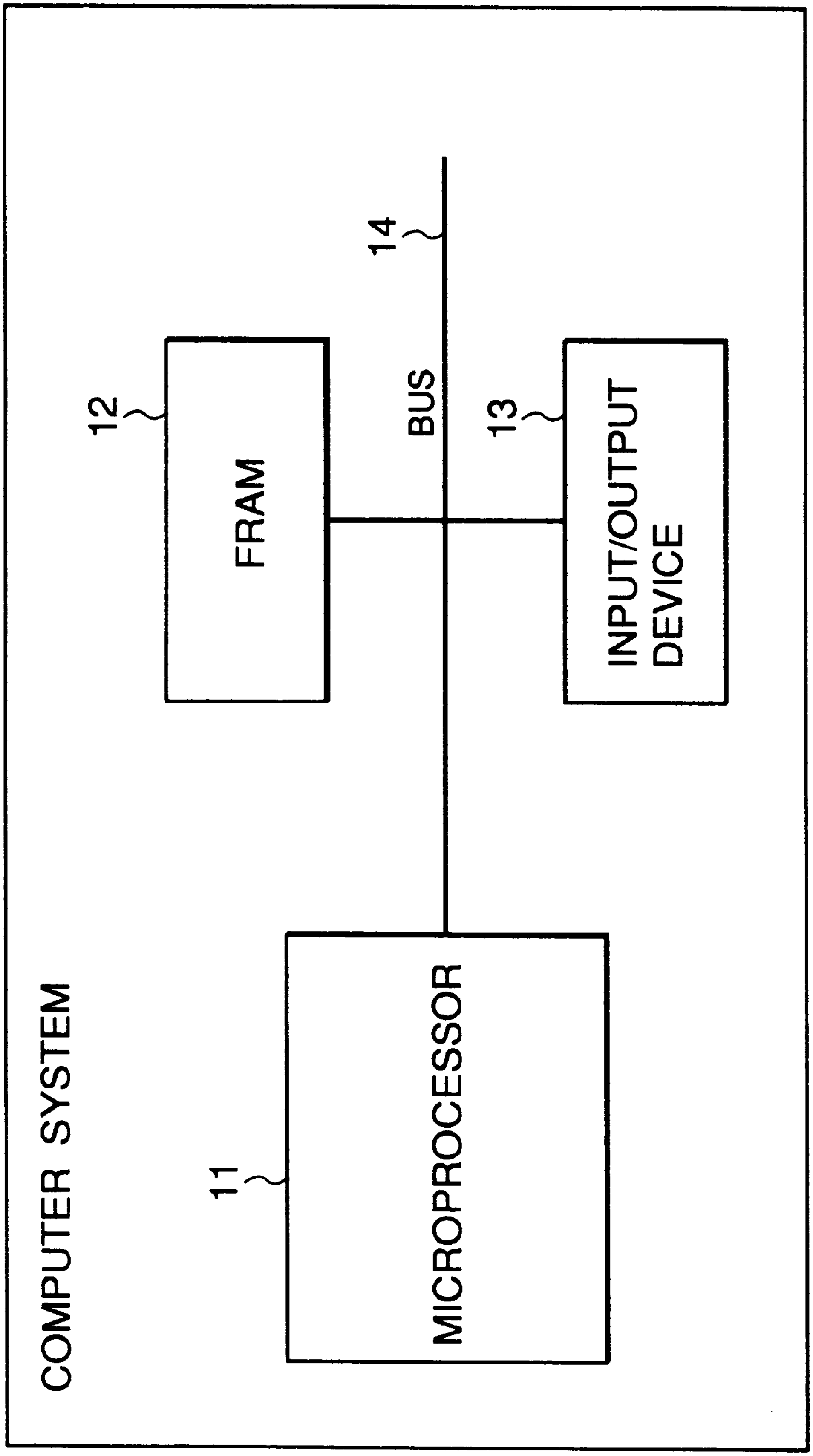
FIG. 5 is a block diagram showing a computer system having an FRAM according to the first embodiment.

FIG. 5 is a block diagram showing the basic structure of a computer system according to the first embodiment of the present invention;

This system is constituted by a microprocessor 11 for performing various arithmetic processing operations, a non-volatile semiconductor memory device 12 connected to the microprocessor 11 through a bus 14 to store data, and an input/output device 13 connected to the micro-processor 11 through the bus 14 to transmit/receive data to/from an external device.

In this embodiment, the semiconductor memory device (FRAM) of the present invention is mounted in the computer system. The FRAM used in this embodiment will be described below in detail.

Figure 6A:
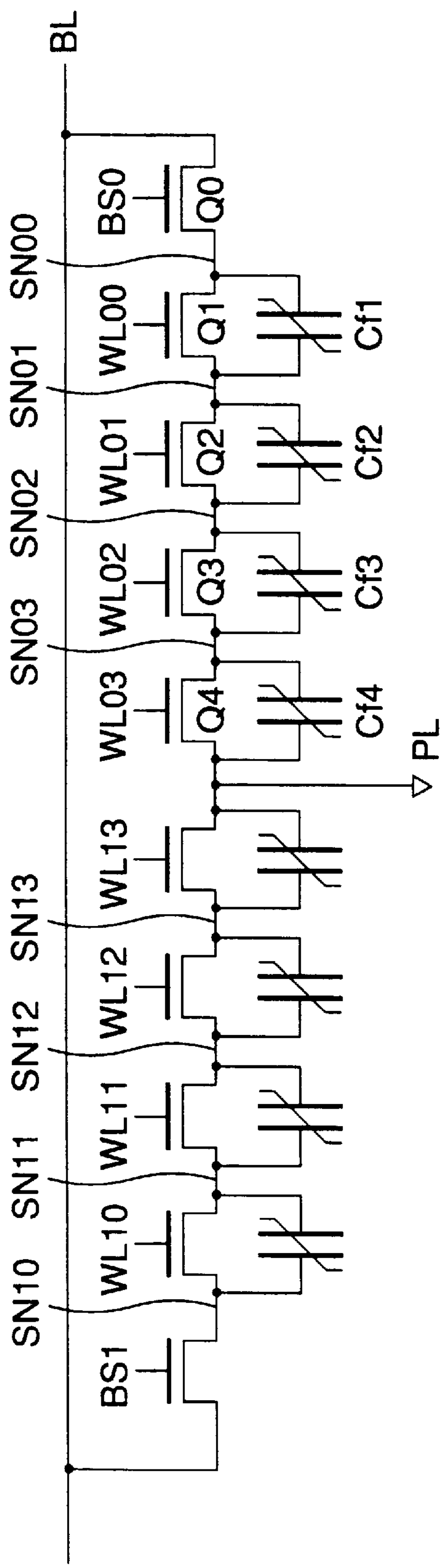
FIG. 6A and FIG. 6B are equivalent circuit diagrams showing the basic structures of the FRAM according to the first embodiment.
Figure 6B:
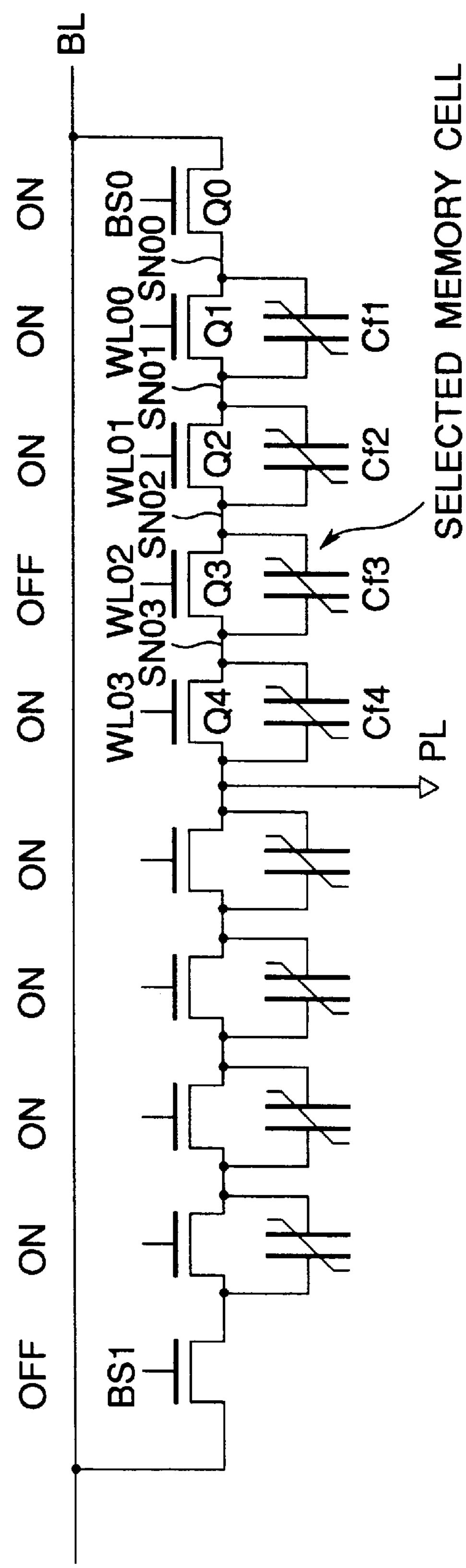

FIG. 6A and FIG. 6B are circuit diagrams showing the basic structure of the FRAM used in this embodiment. FIG. 6A and FIG. 6B show an equivalent circuit corresponding to eight memory cells. Referring to FIG. 6A, reference symbol BL denotes a bit line; PL, a plate electrode; WLij, a word line; and SNij, a cell node. Q0 denotes a select transistor, and a signal BSi of the gate of the select transistor Q0 represents a block selection line. Q1 to Q4 denote memory cell transistors. Cf1 to Cf4 each represented by adding a hook mark to a normal capacitor mark denote ferroelectric capacitors. Note that a memory using a ferroelectric capacitor according to the present invention will be referred to as a ferroelectric memory hereinafter.

In a memory cell of the conventional FRAM, a cell transistor as an extension of the conventional DRAM and a ferroelectric capacitor are connected in series with each other. In this embodiment, this concept is largely changed. More specifically, the cell transistor is connected to the ferroelectric capacitor in parallel to constitute a memory cell. For example, the cell transistor Q3 and the ferroelectric capacitor Cf3 are connected to constitute a memory cell, thereby storing information “0” or “1”. Similarly, the cell transistor Q1 and the ferroelectric capacitor Cf1, the cell transistor Q2 and the ferroelectric capacitor Cf2, and the cell transistor Q4 and the ferroelectric capacitor Cf4 are connected to constitute memory cells.

The four memory cells are connected in series to form a memory group (memory block). One terminal of this memory block is connected to the cell plate electrode PL, and the other terminal is connected, via the select transistor for selecting this block, to the bit line BL for reading/writing data.

FIG. 6A shows two memory blocks on the left and right sides, respectively. One memory cell may be used to store binary data “0” or “1”. Alternatively, multivalued data or analog data may be stored without any problem.

The operation of the FRAM of this embodiment will be described. In the stand-by state, all word lines WL00 to WL03 and WL10 to WL13 are set at “H” level. Block selection lines BS0 and BS1 are set at “L” level. At this time, the gates of all the cell transistors are ON. The two terminals of each ferroelectric capacitor are electrically short-circuited by the cell transistor connected in parallel to the capacitor and set at an equipotential. For example, in the cell constituted by the cell transistor Q3 and the ferroelectric capacitor Cf3, cell nodes SN03 and SN02 are set at an equipotential.

If the conventional DRAM has the above structure, accumulated information is destroyed. However, in the ferroelectric memory, the data is not destroyed even when the potential difference between the accumulation node SN and the plate electrode PL is set at 0V. This embodiment reversely exploits at maximum the problem unique to the ferroelectric memory that charges are not read out unless the direction of polarization at which the data has been written is reversed. More specifically, in FIG. 2B, the data “1” does not move from the point B where the remnant polarization Pr is present, and the data “0” does not move from the point D where the remnant polarization −Pr is present.

In term of electrical properties, all cell nodes SN00 to SN03 and SN10 to SN13 are set at the same potential as the plate (PL) potential in the stand-by state. In this embodiment, regardless of fixing the plate electrode potential at (½)Vcc or changing the potential within the range of 0V to Vcc, the two terminals of each ferroelectric capacitor are always short-circuited in the stand-by state for a long time. Therefore, even when there is a leakage current at the p-n junction of the cell transistor, the potential difference between the two terminals of the ferroelectric capacitor is 0V. Charges corresponding to the remnant polarization amount are kept held, so the ferroelectric capacitor never cause polarization inversion to destroy the data.

In the FRAM of the present invention, the cell transistor may have a cutoff current larger than that of the conventional DRAM or FRAM having a DRAM mode. This facilitates manufacturing of the transistor. In addition, the leakage current of the ferroelectric capacitor may also be large. In the conventional FRAM having only the FRAM mode, when the bit line potential varies within the range of 0V to Vcc, the potential of the cell node of an unselected memory cell varies through the cell transistor, and the data is destroyed. In this embodiment, however, no problem is posed because the cell transistor is ON at that time. Even when the cutoff current of the select transistor is large, the data is never destroyed.

When the transistor is ON in the unselected state, a software error caused by the potential difference between the ferroelectric capacitors due to collected charges generated upon irradiation of a radiation such as an α-ray is less likely to take place because the ferroelectric capacitors are short-circuited by the cell transistor in the ON state, unlike the conventional cell, so that the reliability can be largely improved. In the conventional cell, the storage node is floating. Therefore, when the cell transistor is ON in the unselected state, the device is influenced by noise such as a parasitic capacity coupling caused by the operation of the selected memory cell. However, such an influence can be prevented by the present invention.

As described above, in this embodiment, even when the scheme of fixing the plate electrode potential at (½)Vcc is employed to realize the high-speed operation, the cell node potential does not lower due to the leakage current. Consequently, the refresh operation can be omitted, unlike the prior art. Additionally, even when the cutoff current of the cell transistor is large, i.e., when the threshold value is lowered, pieces of information in the remaining cells are not destroyed.

A case wherein one of the plurality of series connected cells is to be selected will be considered. Assume that, of the four series connected cells of the memory block on the right side of FIG. 6A, the second cell from the plate electrode PL, i.e., the third cell (Q3, Cf3) from the bit line BL is to be selected. This operation is shown in FIG. 6B. First, the word line WL02 of the selected memory cell (Q3, Cf3) is set at "L" to turn off only the cell transistor Q3. Next, the block selection line BS0 of the selected memory block is set at "H" to turn on only the select transistor Q0.

In term of equivalent circuit, the first, third, and fourth cell transistors Q4, Q2, and Q1 from the plate electrode PL are ON, and the selected second cell transistor Q3 is OFF. One terminal of the ferroelectric capacitor Cf3 of the selected memory cell is electrically connected to the plate electrode PL, and the other terminal is electrically connected to the bit line BL through the select transistor Q0. In the circuit of this embodiment, apparently in term of equivalent circuit, the cell transistor of the conventional ferroelectric memory corresponds to the select transistor Q0, and the conventional ferroelectric capacitor directly corresponds to the cell transistor Q3.

More specifically, in reading/writing, this one memory block corresponds to the conventional one cell constituted by one transistor and one ferroelectric capacitor. The remaining cell transistors or the remaining ferroelectric capacitors in the memory block appear to be invisible. For this reason, the same structure as that of the prior art can be employed for reading/writing in portions other than the memory block. This structure corresponds to both the conventional scheme of fixing the plate electrode at (½)Vcc and the conventional scheme of changing the plate electrode potential within the range of 0V to Vcc.

Figure 1A:
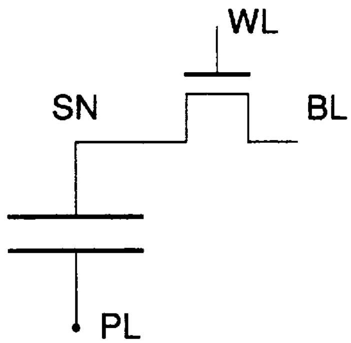
FIG. 1A to FIG. 1C are circuit diagrams showing the memory cell structures of conventional DRAM and FRAM.
Figure 1B:
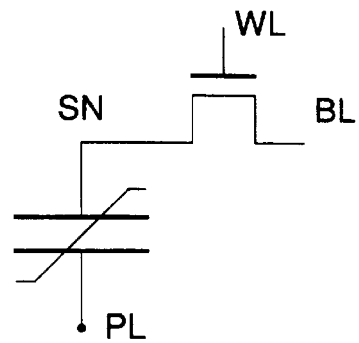
Figure 1C:
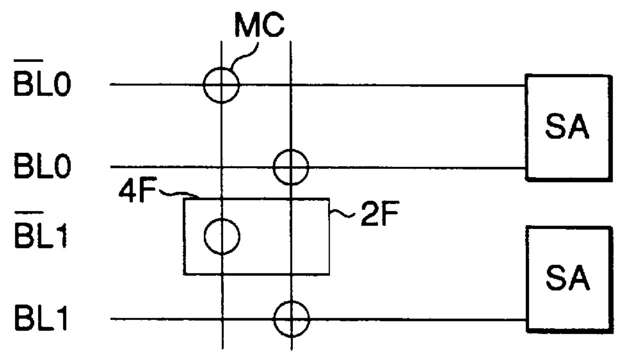
Figure 2A:
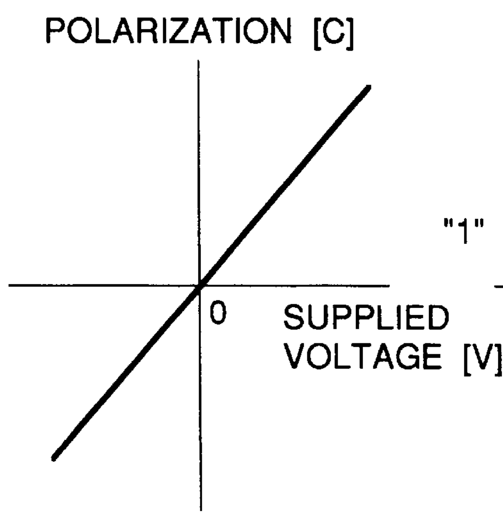
FIG. 2A and FIG. 2B are graphs showing the polarization characteristics of the DRAM and FRAM, respectively, with respect to an applied voltage.
Figure 2B:
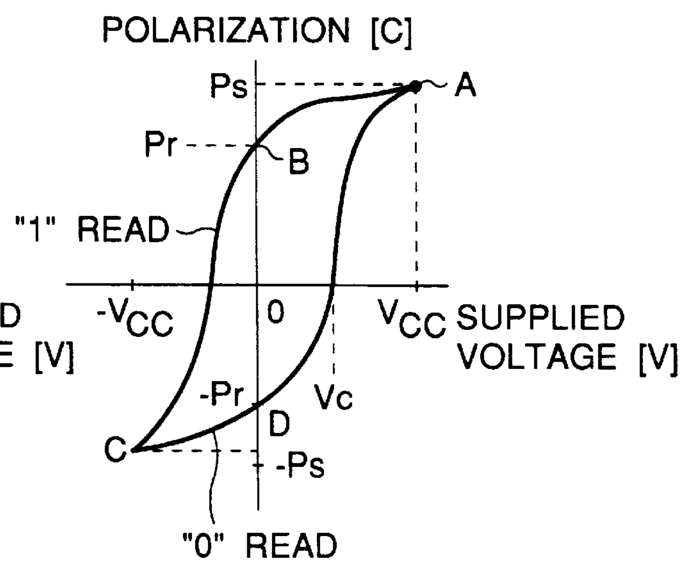
Figure 3A:
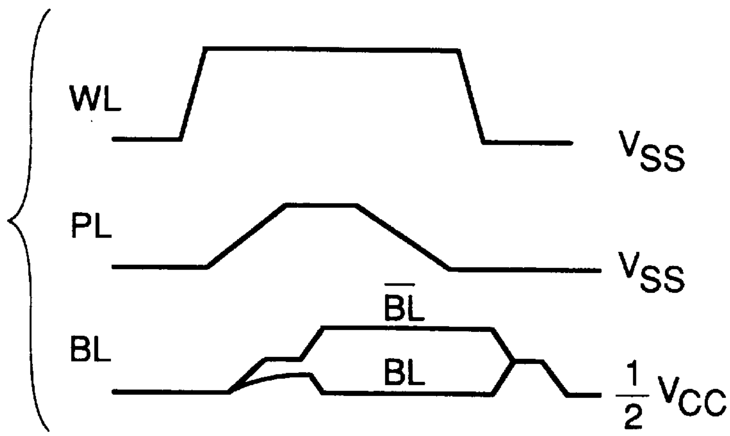
FIG. 3A to FIG. 3C are charts showing signal waveforms so as to explain the operation of the conventional FRAM.
Figure 3B:
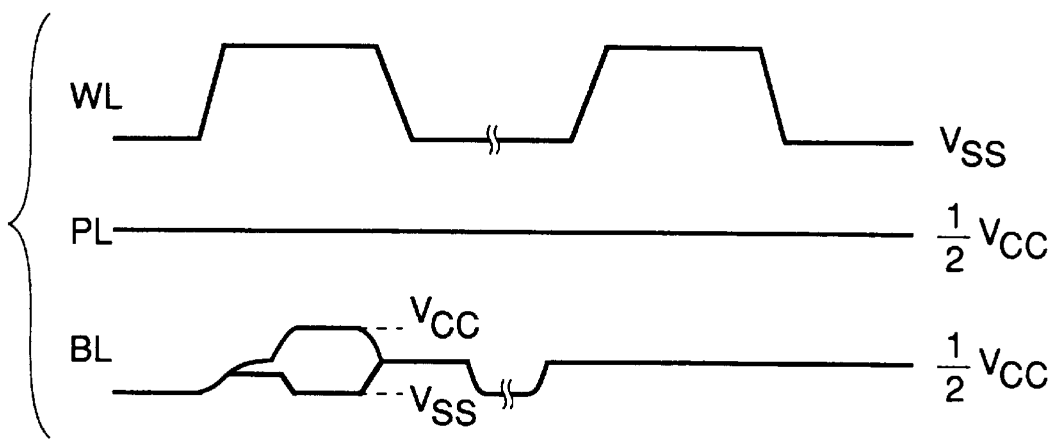
Figure 3C:
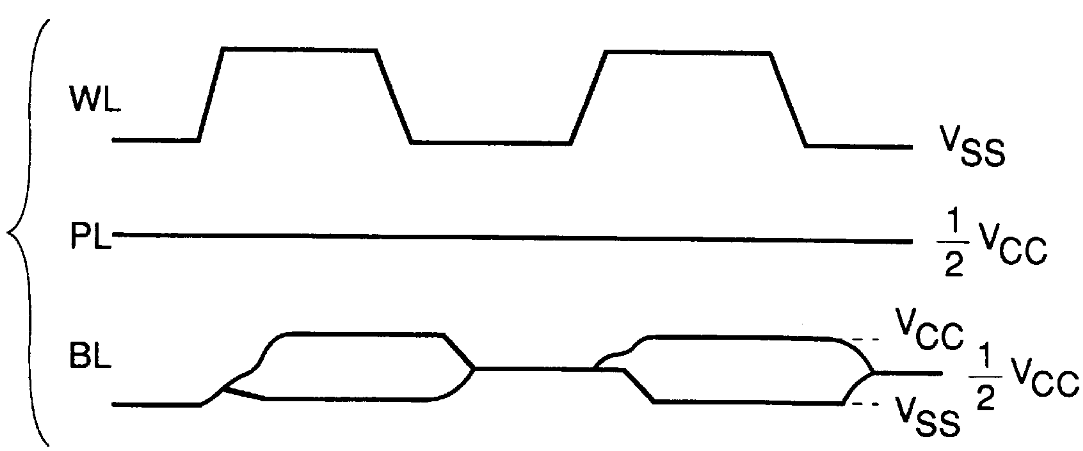

For example, when the scheme of fixing the plate electrode at (½)Vcc is employed, and cell data is to be read out, the bit line BL is precharged to 0V in advance. Since a bit line capacity Cb is larger than the cell capacity (capacity of the ferroelectric capacitor Cf3), a voltage of about (−½) Vcc=(bit line voltage)−(plate electrode voltage) is applied across the ferroelectric capacitor Cf3. In FIG. 2B, the data "1" moves from the point B to the point C with polarization inversion, and the data "0" moves from the point D to the point C without polarization inversion.

For the data "1", charges corresponding to Ps+Pr are read out to the bit line BL. For the data "0", charges corresponding to Ps−Pr are read out to the bit line BL. The potential of the reference bit line constituting the bit line pair is raised by a potential equal to the potential at which charges corresponding to Ps are read out. For the data "1", a potential difference corresponding to Ps+Pr−Ps=Pr is generated between the bit line pair. For the data "0", a potential difference corresponding to Ps−Pr−Ps=−Pr is generated between the bit line pair. This potential difference is amplified by the sense amplifier. For the data "1", the bit line BL is set at Vcc. For the data "0", the bit line BL is set at Vss. This result is rewritten in the ferroelectric capacitor of the selected memory cell.

At this time, the data "0" stays at the point C, and the data "1" moves from the point C to the point D, and then to the point A with polarization inversion. Thereafter, the block selection line BS0 is set at "L" to turn off the select transistor Q0, and the word line WL02 is set at "H". The two terminals of the ferroelectric capacitor of the selected memory cell (Q3, Cf3) are short-circuited. The data "1" returns from the point A to the point B, and the data "0" returns from the point C to the point D.

In reading/writing in the memory selected state, the cell transistors of the first, third, and fourth unselected memory cells (Q4 and Cf4, Q2 and Cf2, Q1 and Cf1) from the plate electrode PL are ON to set the two terminals of the ferroelectric capacitors at 0V. For this reason, the data is not destroyed. As a result, in this embodiment, reading/writing from/in an arbitrary one of the cells is enabled although the cells are connected in series. This allows not block access as in the conventional NAND cell but perfect random access.

Figure 7A:
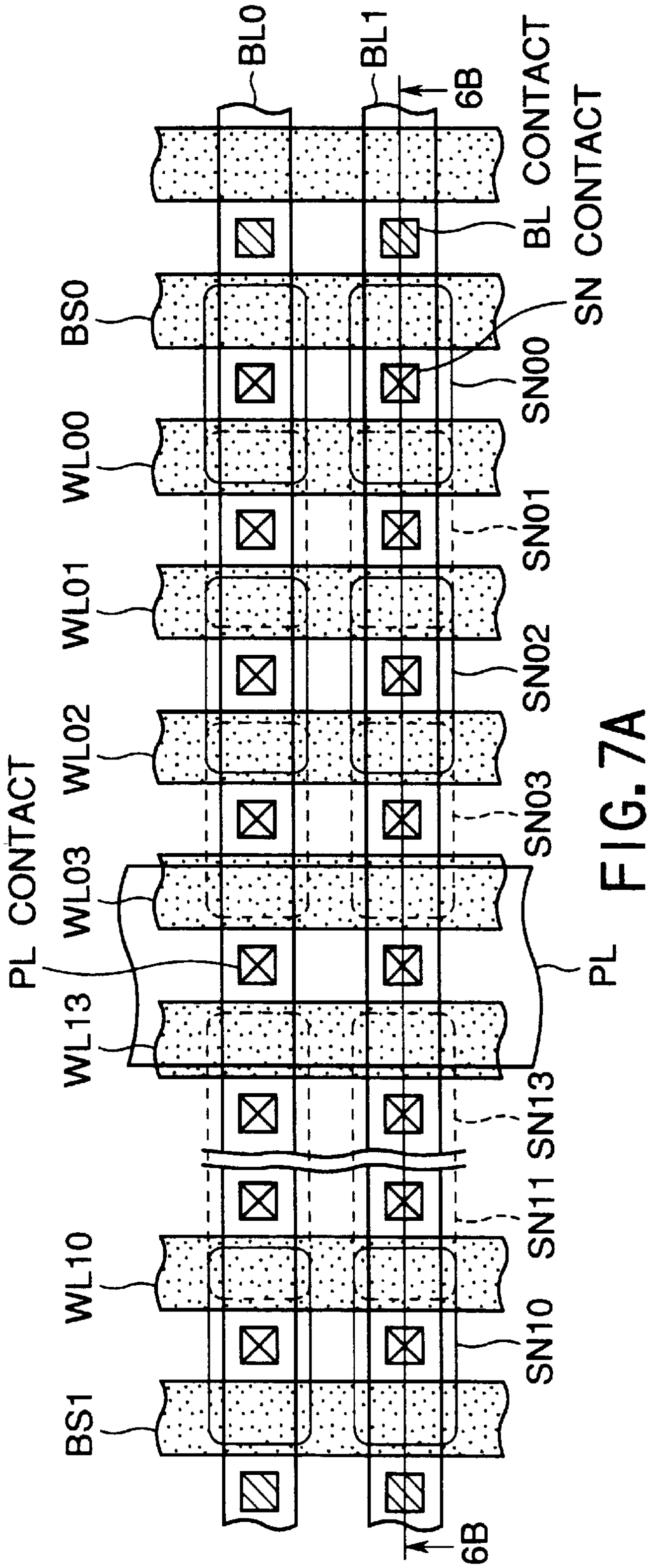
FIG. 7A and FIG. 7B are plan and sectional views, respectively, showing a cell structure for realizing the circuit structure shown in FIG. 5.
Figure 7B:
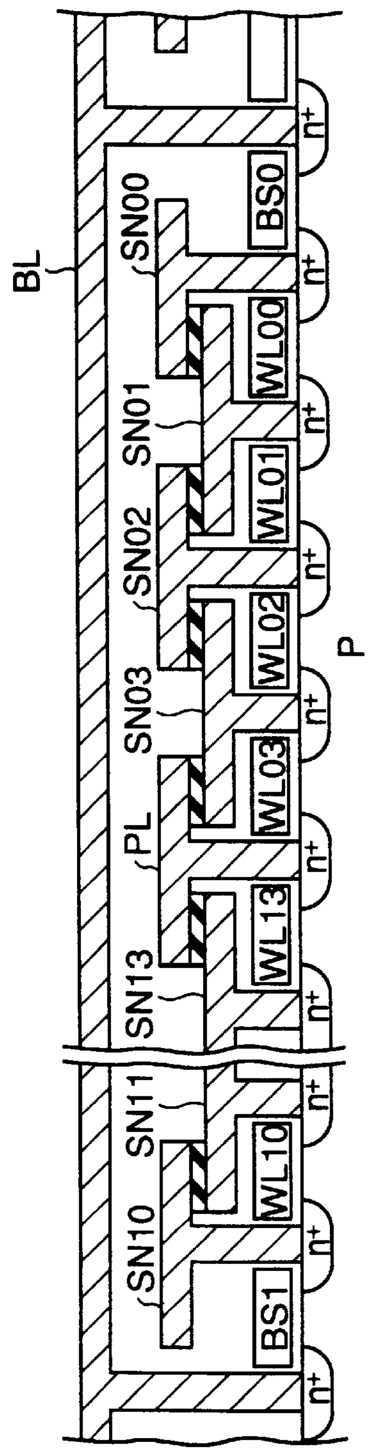

FIG. 7A and FIG. 7B show a cell structure for realizing the circuit structure shown in FIG. 6A and FIG. 6B. FIG. 7A is a plan view, and FIG. 7B is a sectional view taken along a line 6B—6B in FIG. 7A. This is a stack cell structure in which the ferroelectric capacitors are formed after formation of the cell transistors, and more particularly, a bit line post-forming cell structure in which the bit lines are formed after formation of the ferroelectric capacitors.

In this cell structure, the gate layer of the cell transistor can be formed in the minimum processing size (F), and the diffusion layer or the active region for channel formation can also be formed in the minimum processing size (F). Therefore, a planar transistor which can be easily manufactured is formed. In addition, the cell size can be reduced a size represented below:

$$2F\times2F=4F^2$$

Each cell node has a size of 3F×1F. The ferroelectric capacitor is formed in a region having a size of F×F where adjacent cell nodes SN overlap each other. The plate electrode PL has a width of 3F and is extended along the word line. The cell size including the selection gate is as follows:

$$(10F\times2F)/4=5F^2$$

The cell transistor is formed on a p-type substrate or a p-type well. For the ferroelectric capacitor, after the transistor is formed, the source and drain electrodes of the cell transistor are formed above the $n^+$-type diffusion layer region ($n^-$-type region may be used) between the gates. One of the electrodes is used as the lower electrode of the ferroelectric capacitor, and the other is used as the upper electrode. The memory cell (Q3, Cf3) uses the electrode on the storage node SN03 side as the lower electrode, and the electrode on the storage node SN02 side as the upper electrode. This relationship is reversed for the adjacent cell. That is, the relationship between the upper and lower electrodes is alternately reversed.

With this stack cell structure, the ferroelectric capacitor and the cell transistor can be connected in parallel. The plate electrode PL at the end of the memory block may be formed by extending the same upper electrode interconnection as that of the storage node SN02 or SN00. The process cost does not increase, unlike the conventional FRAM. Note that various modifications can be made. For example, the positions of the upper and lower electrodes may be changed, a PMOS cell transistor may be used, or the shape of the ferroelectric capacitor of the cell constituted by SOI may be changed. In the conventional FRAM, a snap of the WL and the like by the Al and Cu wiring can be performed. In this case, it is difficult to snap the WL by the Al and Cu wiring because the WL is arranged near the PL in the conventional FRAM. In the present invention, since the PL is arranged in a part of the cell region, by broadening the PL region, the WL and PL can be snapped by the single layer of the Al or Cu wiring, thereby an RC delay can be extremely reduced when the PL driving method is employed.

Figure 8A:
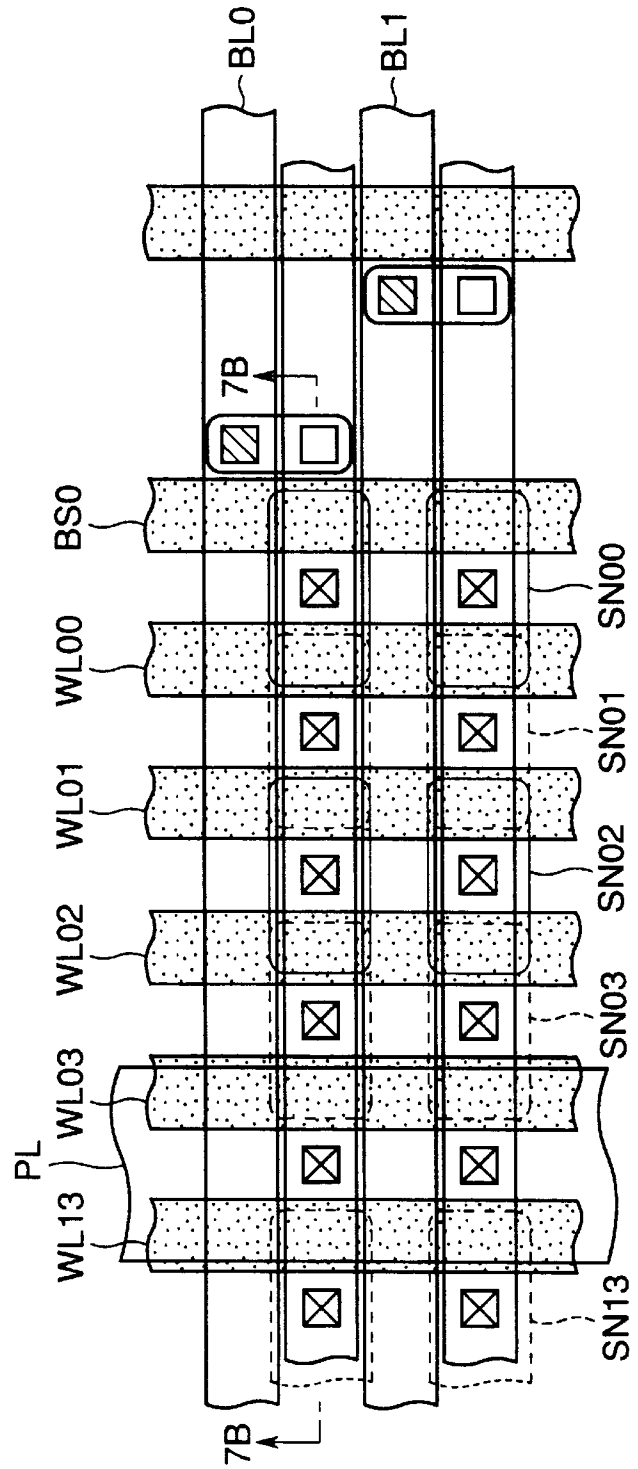
FIG. 8A and FIG. 8B are plan and sectional views, respectively, showing a cell structure for realizing the circuit structure shown in FIG. 5.
Figure 8B:
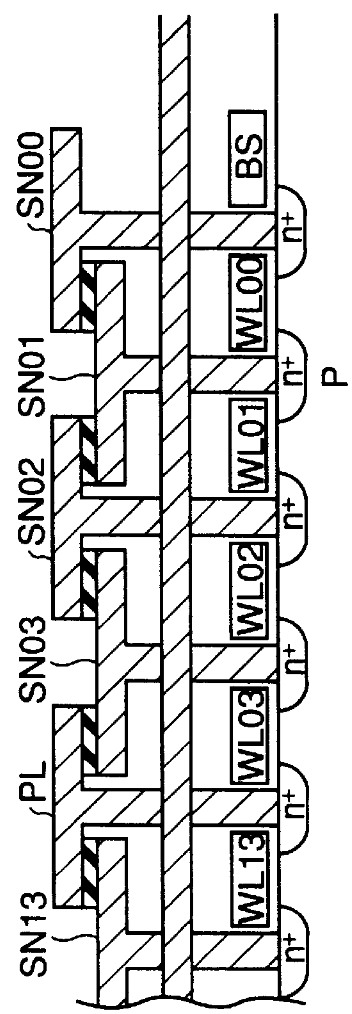

FIG. 8A and FIG. 8B show another cell structure for realizing the circuit structure shown in FIG. 6A and FIG. 6B. FIG. 8A is a plan view, and FIG. 8B is a sectional view taken along a line 7B—7B in FIG. 8A. This is a stack cell structure in which the ferroelectric capacitors are formed after formation of the cell transistors, and more particularly, a bit line pre-forming cell structure in which the bit lines are formed before formation of the ferroelectric capacitors.

Each cell node has a size of 3F×1F. The ferroelectric capacitor is formed in a region having a size of F×F where the cell nodes SN overlap each other. The plate electrode PL has a width of 3F and is extended along the word line. To form the ferroelectric capacitors after formation of the bit lines, the cell nodes must be pulled up from portions between the bit lines BL.

In this example, an extension pad is used at a bit line die conductor (the connection portion between the bit line BL and the select transistor), and the active area (diffusion layer, channel portion) is formed to be shifted by a ½ pitch with respect to the bit line BL. Consequently, the cell size is represented as follows:

$$2F\times 2F=4F^2$$

The size including the selection gate is represented as follows:

$$(11F\times 2F)/4=5.5F^2$$

When the select transistor is formed to be oblique with respect to the bit line BL, the size becomes close to $5F^2$.

The computer system shown in FIG. 5, which uses the FRAM having the new structure, can obtain the following effects.

(1) Since the cell size can be ½ the conventional cell size, a memory with a large capacity can be mounted at the same cost.

(2) At the same memory capacity, the space can be saved because of the small chip size, and the density can be increased.

(3) Since the chip size is small, the device is resistant to a stress.

(4) Even when the plate potential fixing scheme which enables an operation at a speed as high as that of the conventional DRAM is employed, no refresh operation is required. For this reason, a high-speed operation can be performed at a low power consumption.

(5) Even when the specifications such as the ferroelectric capacitor leakage or p-n junction leakage are too strict, the high-speed operation can be easily realized because the refresh operation is not required to hold the data for a long time.

(6) Since the refresh operation can be omitted, the leakage need not be worried about. Since an operation in a high-temperature environment is enabled, a high-speed operation in the high-temperature environment can be expected.

(7) Since the ferroelectric capacitor of an unselected memory cell is always ON through the cell transistor, the device is resistant to a sudden power failure.

In the conventional FRAM, data holding can hardly be realized. When the plate driving scheme is employed, the high-speed operation can hardly be performed, so it is difficult to employ the conventional FRAM as the main memory of a computer. However, the FRAM of this embodiment enables an application as, e.g., a main memory which requires the high-speed operation on the basis of (5). On the basis of (4), the FRAM can be applied to the main memory of a mobile computer system which requires a low power consumption and high-speed operation. In addition, the FRAM can be applied to the main memory of a small computer system which is poor in heat dissipation properties due to (6). On the basis of (1) and (2), a compact main memory having a large capacity can be realized.

Problems such as a large degradation in performance, an increase in cost, and an increase in system size are posed in a system to which the conventional FRAM can hardly be applied or the conventional FRAM is forcibly applied. However, all such problems can be solved by using the FRAM of the present invention. The conventional computer system has three memories, i.e., a RAM, a ROM, and a nonvolatile memory. However, since the FRAM of this embodiment is nonvolatile and operates at a high speed, all necessary memories can be replaced with the FRAM of this embodiment. In addition, since the FRAM of the present invention is nonvolatile and realizes the same operation speed as that of the conventional DRAM, the DRAM can be replaced with the FRAM.

Second Embodiment

Figure 9:
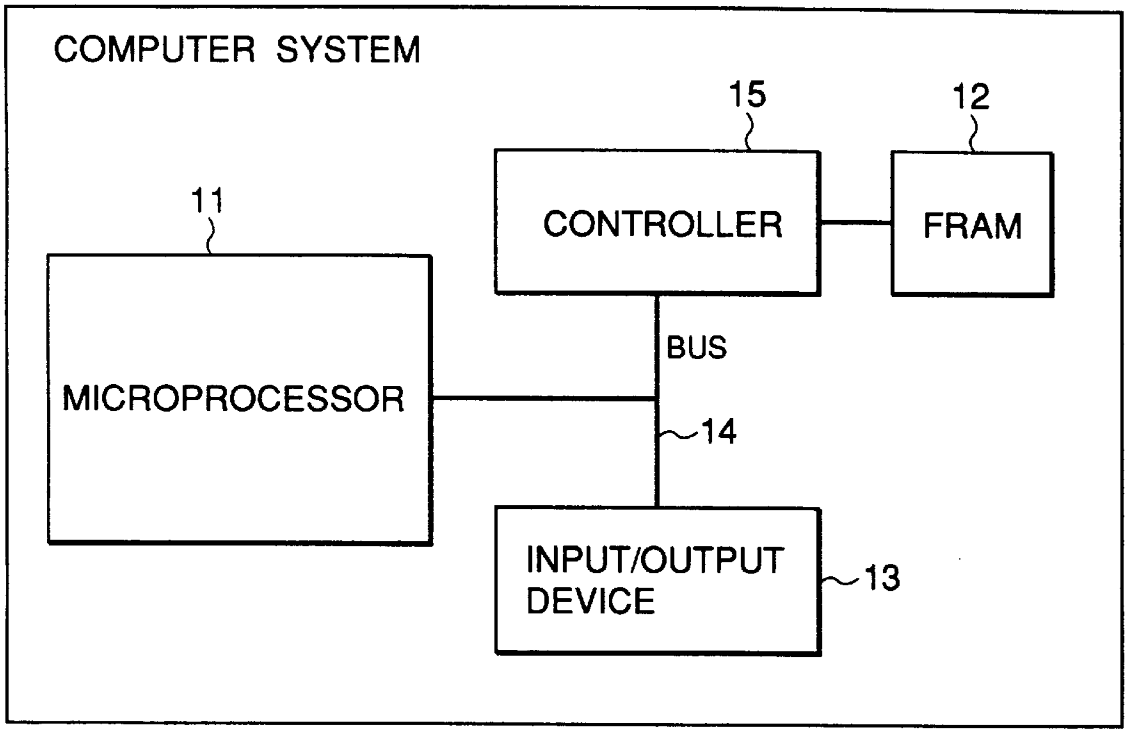
FIG. 9 is a block diagram showing a computer system according to the second embodiment.

FIG. 9 is a block diagram showing the basic structure of a computer system according to the second embodiment. The same reference numerals as in FIG. 5 denote the same parts in FIG. 9, and a detailed description thereof will be omitted.

In this embodiment, a controller 15 for controlling an FRAM 12 is added to the structure shown in FIG. 5. More specifically, the FRAM 12 is connected to a bus 14 through the controller 15.

In this structure as well, the same effects as in the first embodiment can be obtained. The controller 15 of this embodiment allows to omit a refresh control signal generation circuit, so that the cost can be reduced.

Third Embodiment

Figure 10:
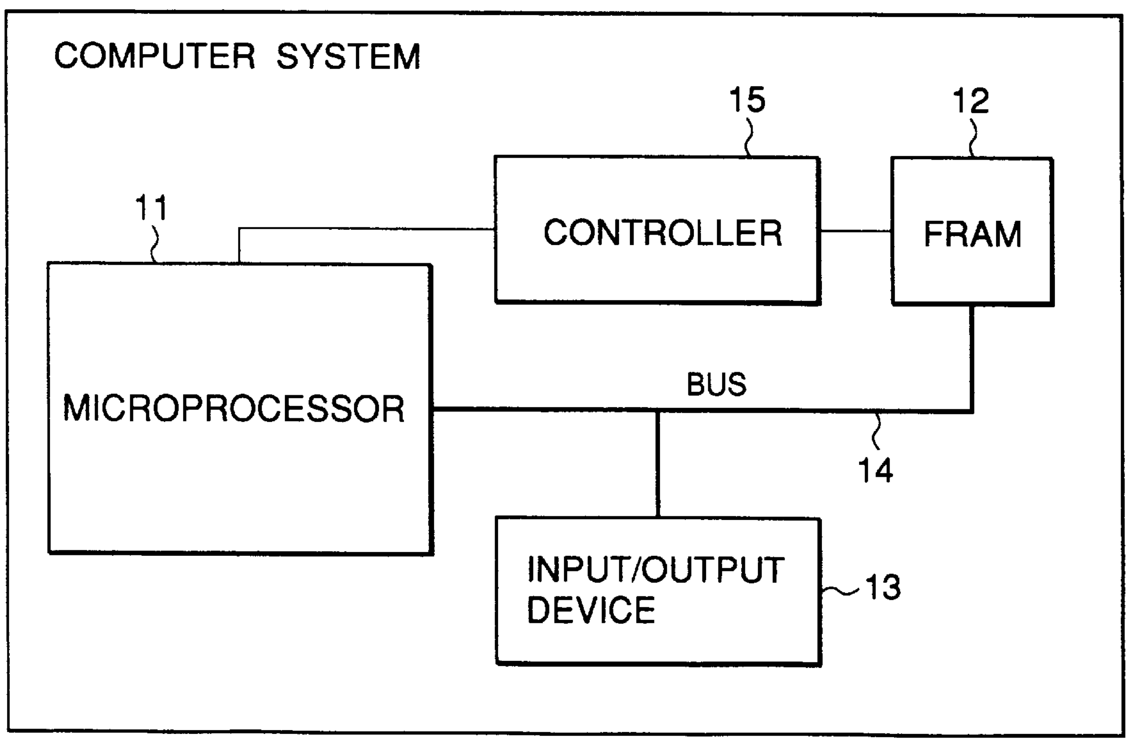
FIG. 10 is a block diagram showing a computer system according to the third embodiment.

FIG. 10 is a block diagram showing the basic structure of a computer system according to the third embodiment. The same reference numerals as in FIG. 9 denote the same parts in FIG. 10, and a detailed description thereof will be omitted.

This embodiment is different from the second embodiment in that the I/O of an FRAM 12 is directly connected to a system bus 14. The system can be freely constituted.

In this structure as well, the same effects as in the first embodiment can be obtained. A controller 15 of this embodiment allows to omit a refresh control signal generation circuit, so that the cost can be reduced.

Fourth Embodiment

Figure 11:
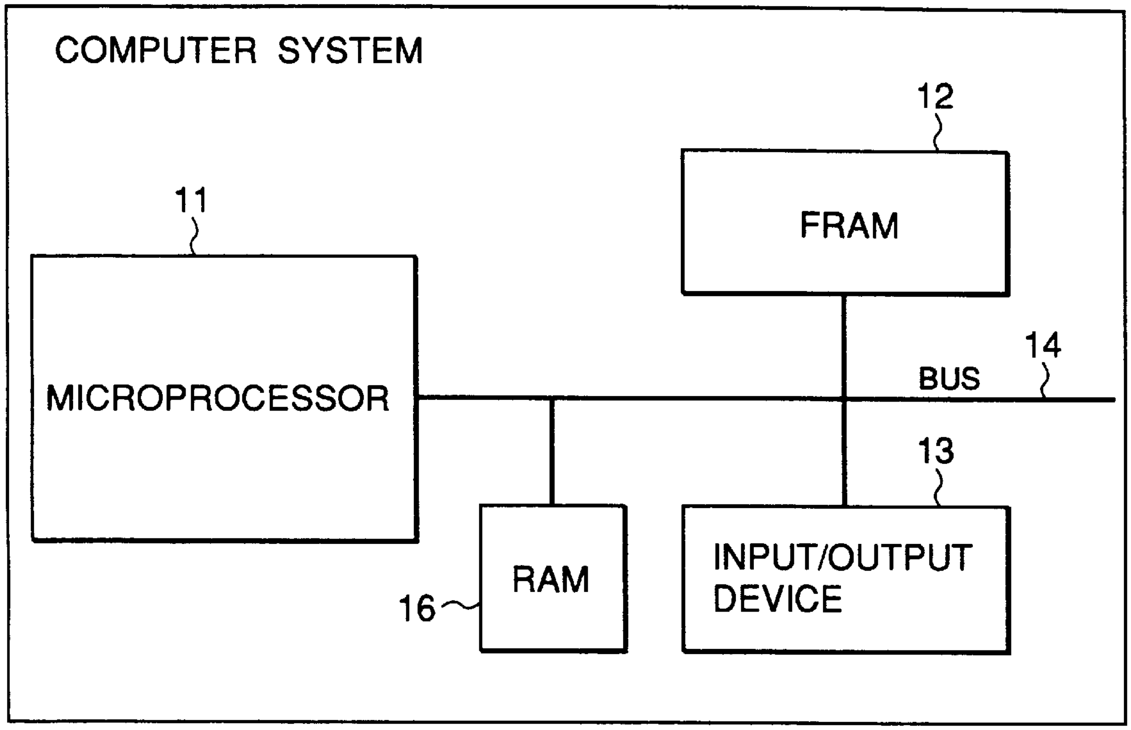
FIG. 11 is a block diagram showing a computer system according to the fourth embodiment.

FIG. 11 is a block diagram showing the basic structure of a computer system according to the fourth embodiment. The same reference numerals as in FIG. 5 denote the same parts in FIG. 11, and a detailed description thereof will be omitted.

In this embodiment, a RAM 16 is arranged in addition to the structure shown in FIG. 5. More specifically, the RAM 16 is connected to a bus 14.

In this structure as well, the same effects as in the first embodiment can be obtained. In this embodiment, the RAM 16 is arranged. Therefore, this embodiment can be applied even when the number of times of rewrite access in an FRAM 12 is limited, and a RAM is required, or a high-speed SRAM or high-speed DRAM is used as a RAM.

Fifth Embodiment

Figure 12:
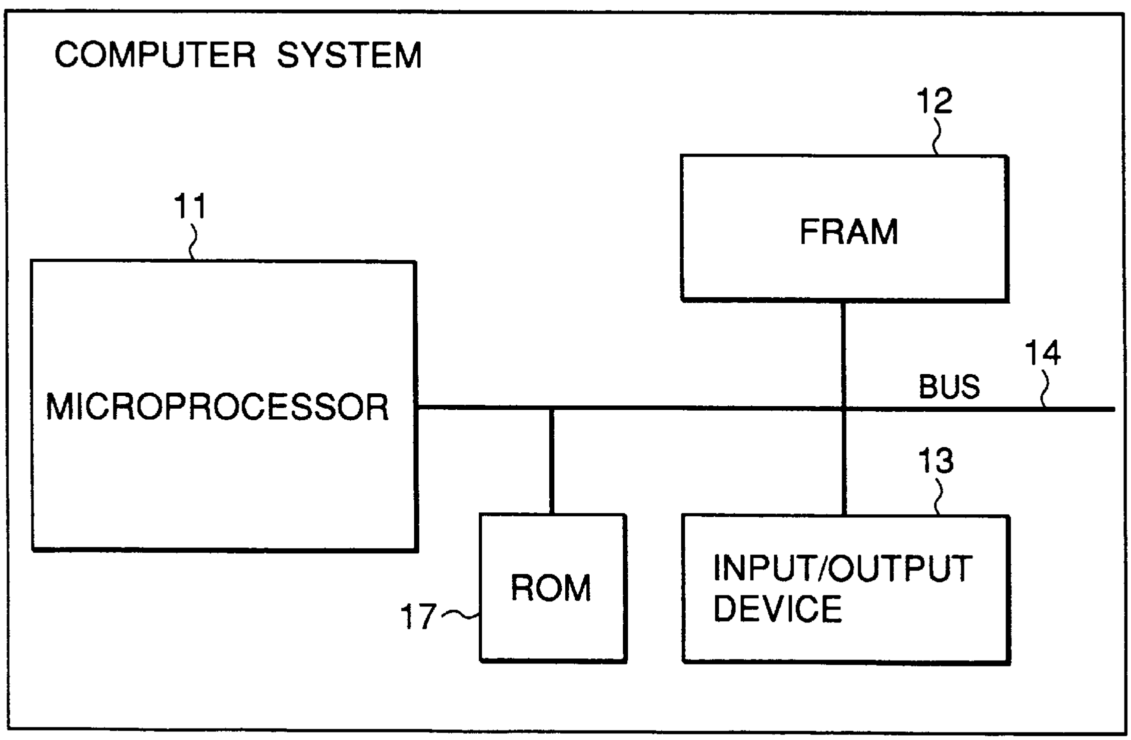
FIG. 12 is a block diagram showing a computer system according to the fifth embodiment.

FIG. 12 is a block diagram showing the basic structure of a computer system according to the fifth embodiment of the present invention. The same reference numerals as in FIG. 5 denote the same parts in FIG. 12, and a detailed description thereof will be omitted.

In this embodiment, a ROM 17 is arranged in addition to the structure shown in FIG. 5. More specifically, the ROM 17 is connected to a bus 14.

In this structure as well, the same effects as in the first embodiment can be obtained. In this embodiment, the ROM 17 is arranged. Therefore, when OS or kanji data which need not be rewritten is stored in the ROM 17, the cost can be reduced.

Sixth Embodiment

Figure 13:
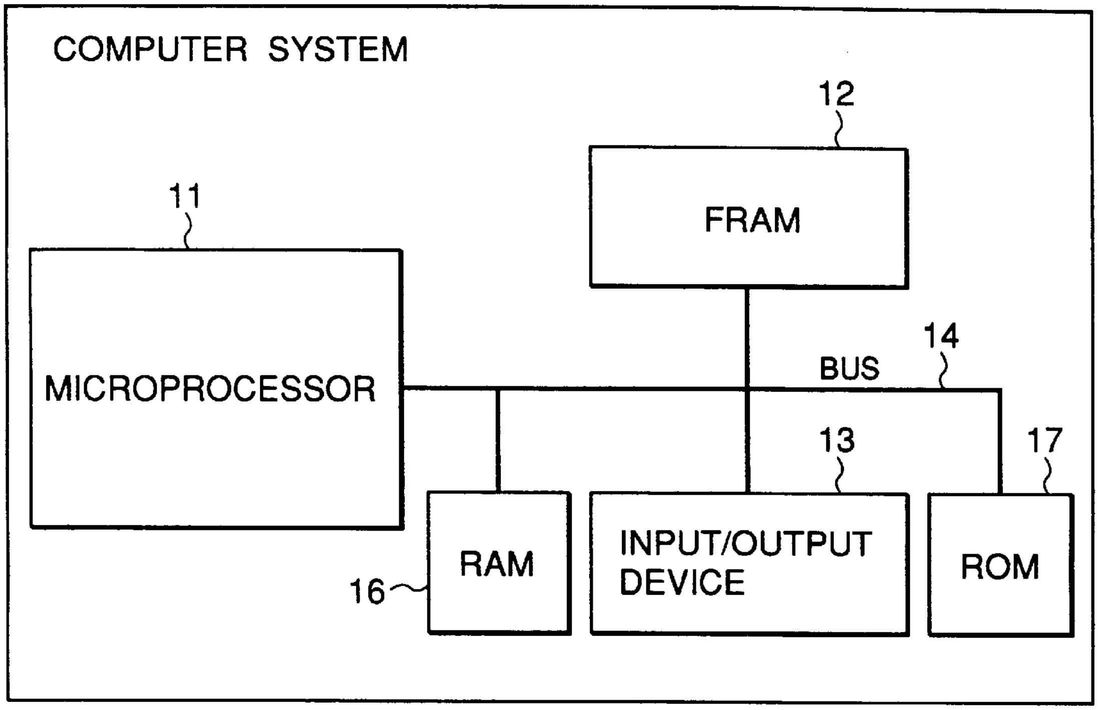
FIG. 13 is a block diagram showing a computer system according to the sixth embodiment.

FIG. 13 is a block diagram showing the basic structure of a computer system according to the sixth embodiment of the present invention. The same reference numerals as in FIG. 5 denote the same parts in FIG. 13, and a detailed description thereof will be omitted.

In this embodiment, a RAM 16 and a ROM 17 are arranged in addition to the structure in FIG. 5. More specifically, the RAM 16 and the ROM 17 are connected to a bus 14.

In this structure as well, the same effects as in the first embodiment can be obtained. As in the fourth embodiment, the RAM 16 is arranged. For this reason, this embodiment can be applied even when the number of times of rewrite access in an FRAM 12 is limited, and a RAM is required, or a high-speed SRAM or high-speed DRAM is used as a RAM. As in the fifth embodiment, the ROM 17 is also arranged. Therefore, when OS or kanji data which need not be rewritten is stored in the ROM 17, the cost can be reduced.

Seventh Embodiment

Figure 14:
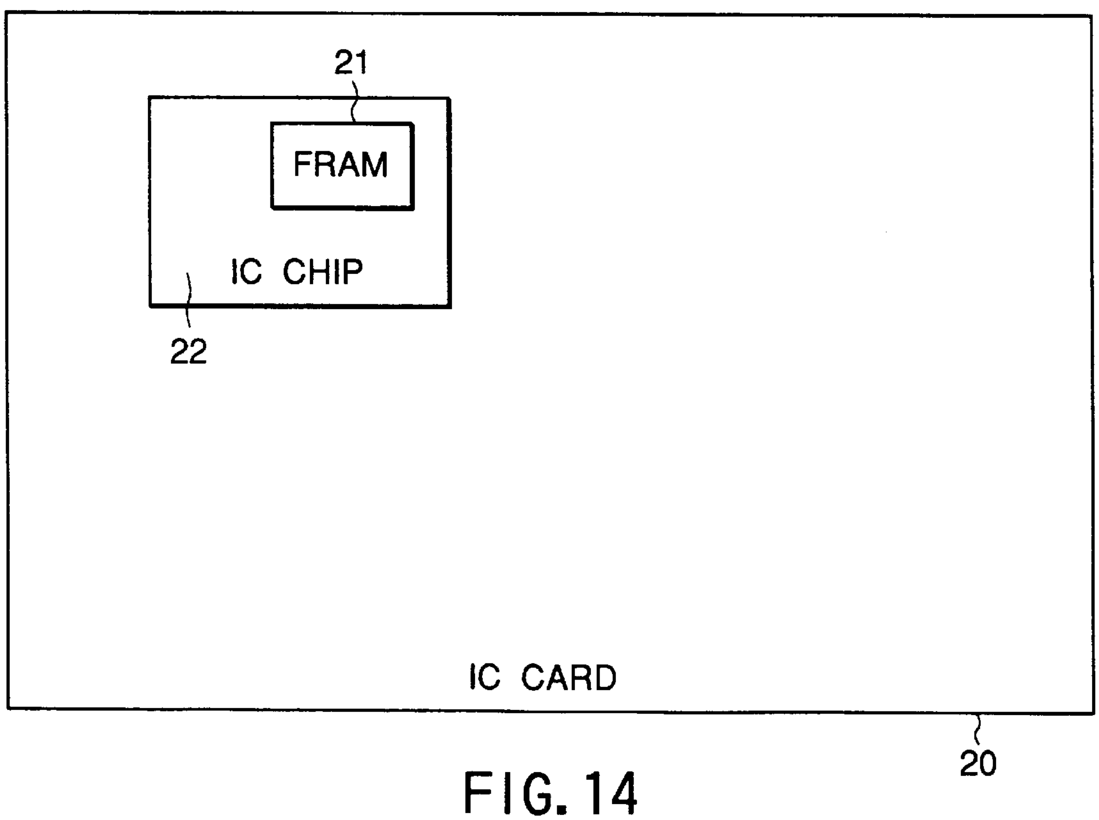
FIG. 14 is a schematic view showing an IC card having an FRAM according to the seventh embodiment.

FIG. 14 is a schematic view showing the basic structure of an IC card according to the seventh embodiment.

This IC card is constituted by setting an IC chip 22 having an FRAM 21 on an IC card main body 20.

In this embodiment, the semiconductor memory device (FRAM) of the present invention is mounted in an IC card. Details of the FRAM used in this embodiment are the same as in the first embodiment, and a detailed description thereof will be omitted.

In the IC card having the FRAM of the present invention, the reliability of the IC card with respect to a stress can be largely increased, or large-capacity data storage can be realized under the same stress/pressure resistance conditions on the basis of (3) described in the first embodiment. For a normal IC card, the IC chip size cannot be 25 $mm^2$ or more because of the stress limitation, and a solution to this problem is very important.

It is important for the IC card to realize a low power consumption, high reliability, and a high-speed operation. When the present invention is applied, the performance can be improved on the basis of (4) to (7) of the first embodiment. In the conventional FRAM, a large time lag is generated after power-ON or at the time of power-OFF for the recall operation. This embodiment also provides the following effect: (8) The time lag is not generated so that a high-speed response is enabled. Therefore, the speed of response of the IC card after insertion or the speed of response of card removal can be increased.

Eighth Embodiment

Figure 15:
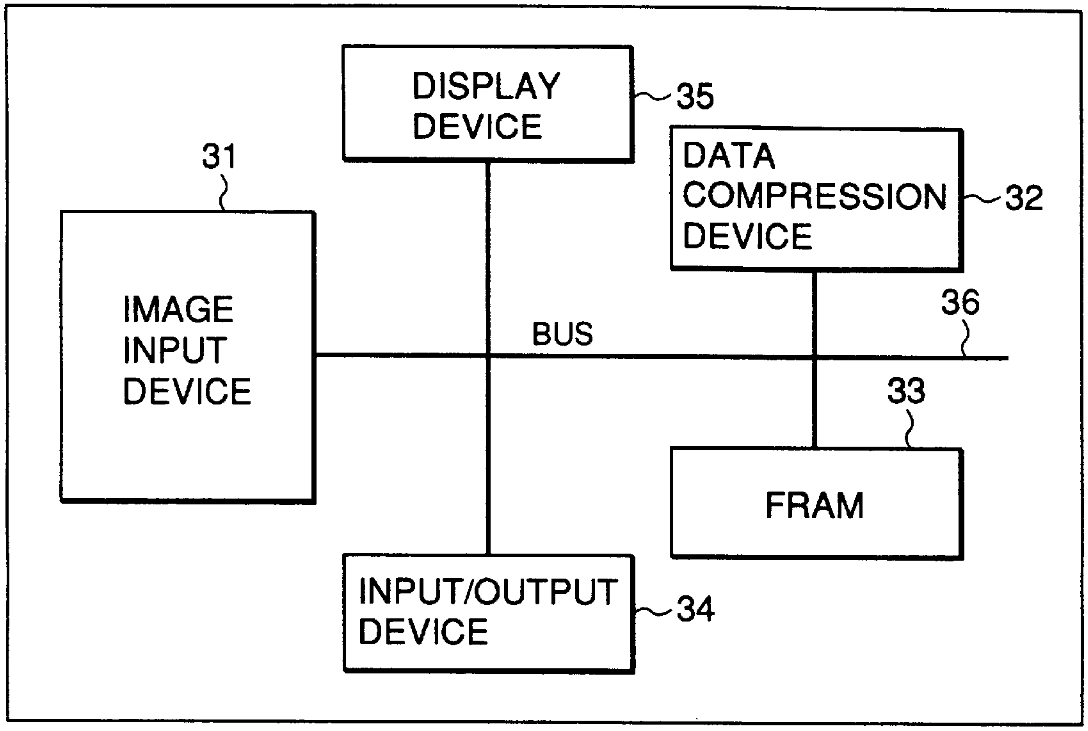
FIG. 15 is a block diagram showing a digital image input system having an FRAM according to the eighth embodiment.

FIG. 15 is a block diagram showing the basic structure of a digital image input system according to the eighth embodiment of the present invention.

This system is constituted by an image input device 31 such as a CCD image pickup device and a CMOS sensor for inputting image data, a data compression device 32 for compressing the input image data, an FRAM 33 for storing the compressed image data, an input/output device 34 for outputting the compressed image data or inputting image data, a display device 35 such as an LCD for displaying the input image data or compressed image data, and a system bus 36 for connecting these devices.

In this embodiment, the semiconductor memory device (FRAM) of the present invention is mounted in a digital image input system such as a digital camera or digital video camera. Details of the FRAM used in this embodiment are the same as in the first embodiment, and a detailed description thereof will be omitted.

The digital image input system using the FRAM of the present invention can store large-volume image data due to (1) and (2) described in the first embodiment. On the basis of (4) and (5) of the first embodiment, compressed data can be stored at a high speed while a low power consumption which is important for a mobile system is achieved to prolong the service life of the battery. Conventionally, a high-speed primary RAM such as a buffer is necessary. However, when the FRAM of the present invention is used, the RAM such as a buffer can be omitted. Due to (6) of the first embodiment, the reliability of a high-temperature operation performed outdoors in fine weather can also be improved.

Ninth Embodiment

Figure 16:
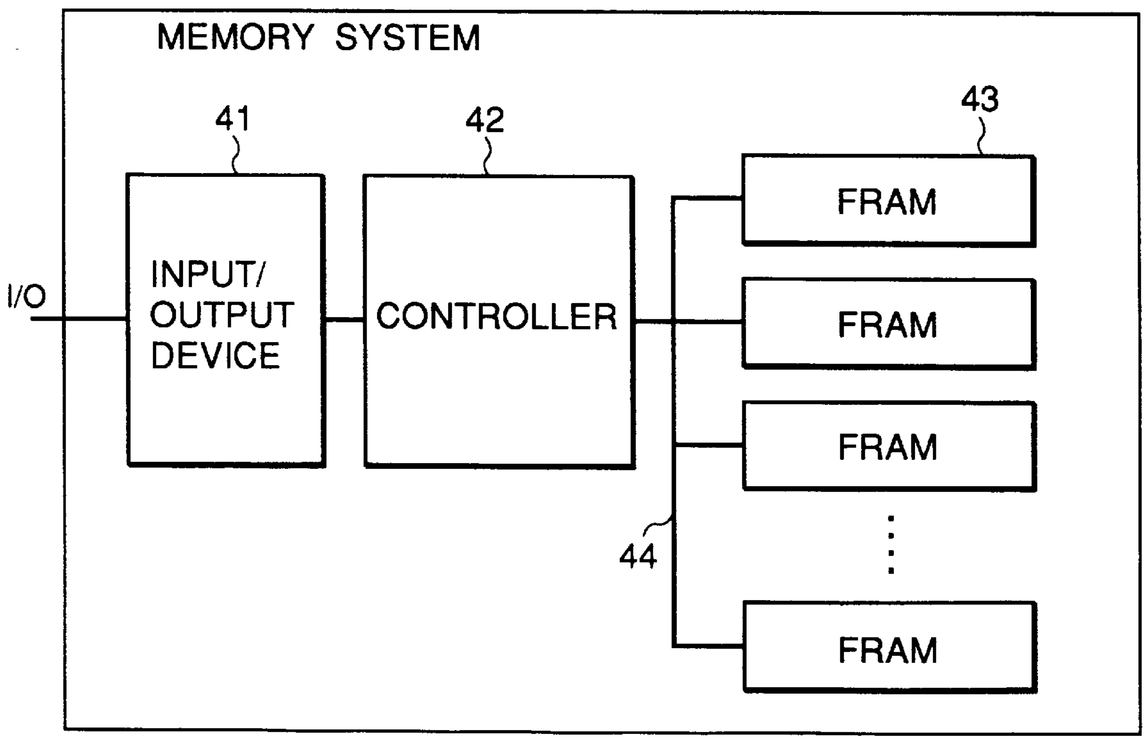
FIG. 16 is a block diagram showing a memory system having an FRAM according to the ninth embodiment.

FIG. 16 is a block diagram showing the basic structure of a memory system according to the ninth embodiment of the present invention.

This system is constituted by a plurality of FRAMs 43 for storing data, an input/output device 41 for transmitting data between these FRAMs 43 and an external device, a controller 42 arranged between the FRAMs 43 and the input/output device 41, and a system bus 44.

In this embodiment, the semiconductor memory device (FRAM) of the present invention is applied to a memory system as a substitute of a memory card or a hard disk. Details of the FRAM used in this embodiment are the same as in the first embodiment, and a detailed description thereof will be omitted.

In the memory system using the FRAM of the present invention, because of (1) and (2) described in the first embodiment, large-volume image data can be stored in a compact device. The FRAM achieves a high-speed operation and a low power consumption on the basis of (4) and (5) of the first embodiment. When the FRAM is used as a memory or an expanded memory of a mobile device or the like, the service life of the battery can be prolonged. In accordance with (7) of the first embodiment, the memory system is resistant to a sudden power failure. In addition, ECC control is enabled by the controller.

10th Embodiment

Figure 17:
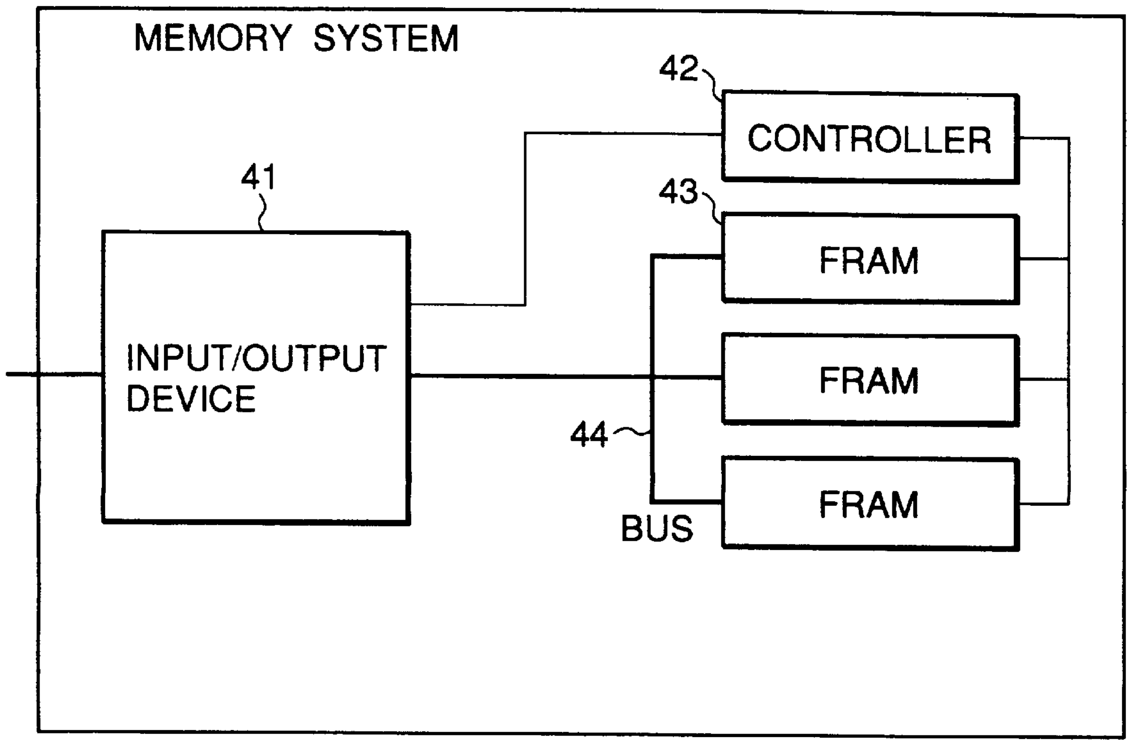
FIG. 17 is a block diagram showing a memory system according to the 10th embodiment.

FIG. 17 is a block diagram showing the basic structure of a memory system according to the 10th embodiment of the present invention. The same reference numerals as in FIG. 16 denote the same parts in FIG. 17, and a detailed description thereof will be omitted.

This embodiment is different from the ninth embodiment in that FRAMs 43 are directly connected to an input/output device 41, and a controller 42 is arranged independently of a bus 44. In this structure as well, the same effects as in the ninth embodiment can be obtained.

11th Embodiment

Figure 18:
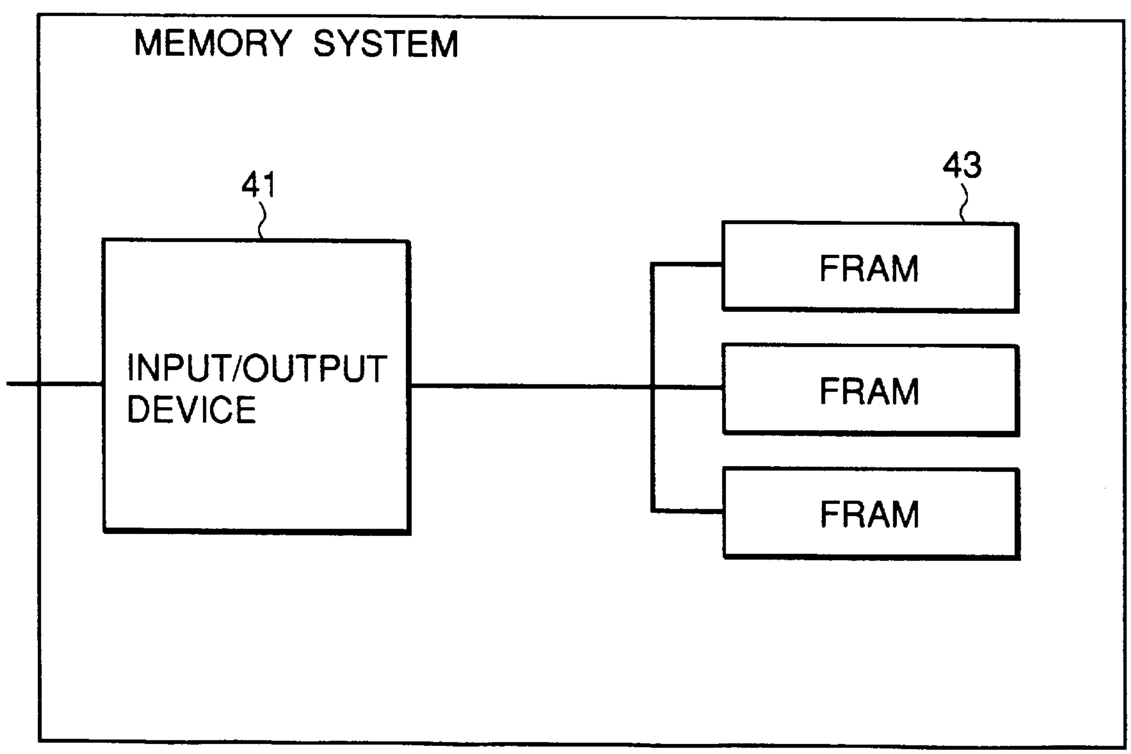
FIG. 18 is a block diagram showing a memory system according to the 11th embodiment.

FIG. 18 is a block diagram showing the basic structure of a memory system according to the 11th embodiment of the present invention. The same reference numerals as in FIG. 16 denote the same parts in FIG. 18, and a detailed description thereof will be omitted.

This embodiment is different from the ninth embodiment in that the controller 42 is omitted, and the memory system is realized with the minimum structure of an input/output device 41 and FRAMs 43.

In this structure as well, the same effects as in the ninth embodiment can be obtained. In addition, since the system structure is simple, the cost can be further reduced.

12th Embodiment

Figure 19:
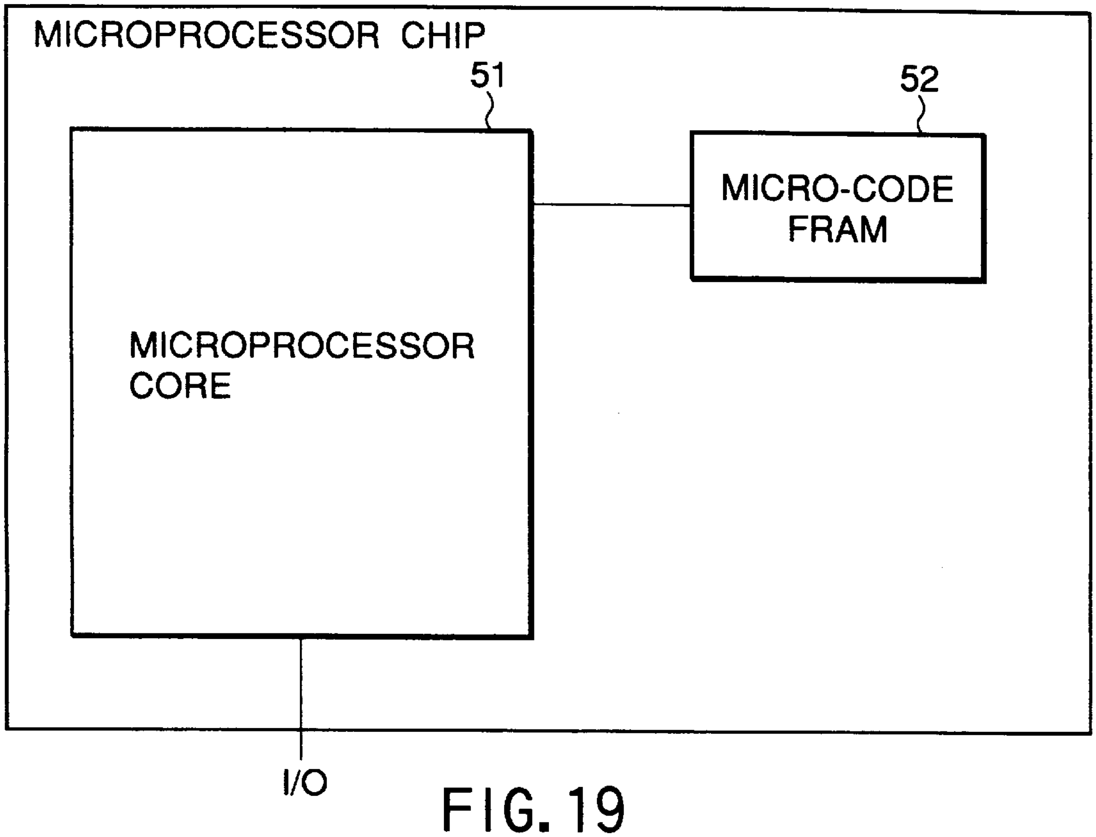
FIG. 19 is a schematic view showing an MPU chip having an FRAM according to the 12th embodiment.

FIG. 19 is a block diagram showing the basic structure of a microprocessor chip according to the 12th embodiment of the present invention.

This system is constituted by forming, on the same chip, a microprocessor core unit (MPU) 51 for performing various arithmetic processing operations and an FRAM 52 for storing data. The FRAM 52 is used as the micro-code memory of the MPU 51.

In this embodiment, the semiconductor memory device (FRAM) of the present invention is mounted in a system LSI such as an MPU. Details of the FRAM used in this embodiment are the same as in the first embodiment, and a detailed description thereof will be omitted.

In the microprocessor chip in which the FRAM of the present invention is mounted, the instruction from the MPU can be easily changed by changing the micro-code stored in the FRAM.

Because of (1) and (2) described in the first embodiment, a large-volume micro-code can be stored in a compact device. When the micro-code is replaced in a normal FRAM, no high-performance MPU can be realized because the FRAM operates at a low speed. However, due to (4) and (5) of the first embodiment, a high-speed MPU with a low power consumption can be realized.

Since the MPU has a very large power consumption and operates at a high temperature, the conventional FRAM which requires the refresh operation cannot be mounted.

However, according to (6) of the first embodiment, even the high-temperature MPU can have the high-speed nonvolatile micro-code memory. In addition, because of (7) of the first embodiment, the microprocessor chip is resistant to noise from the digital section of the MPU.

13th Embodiment

Figure 20:
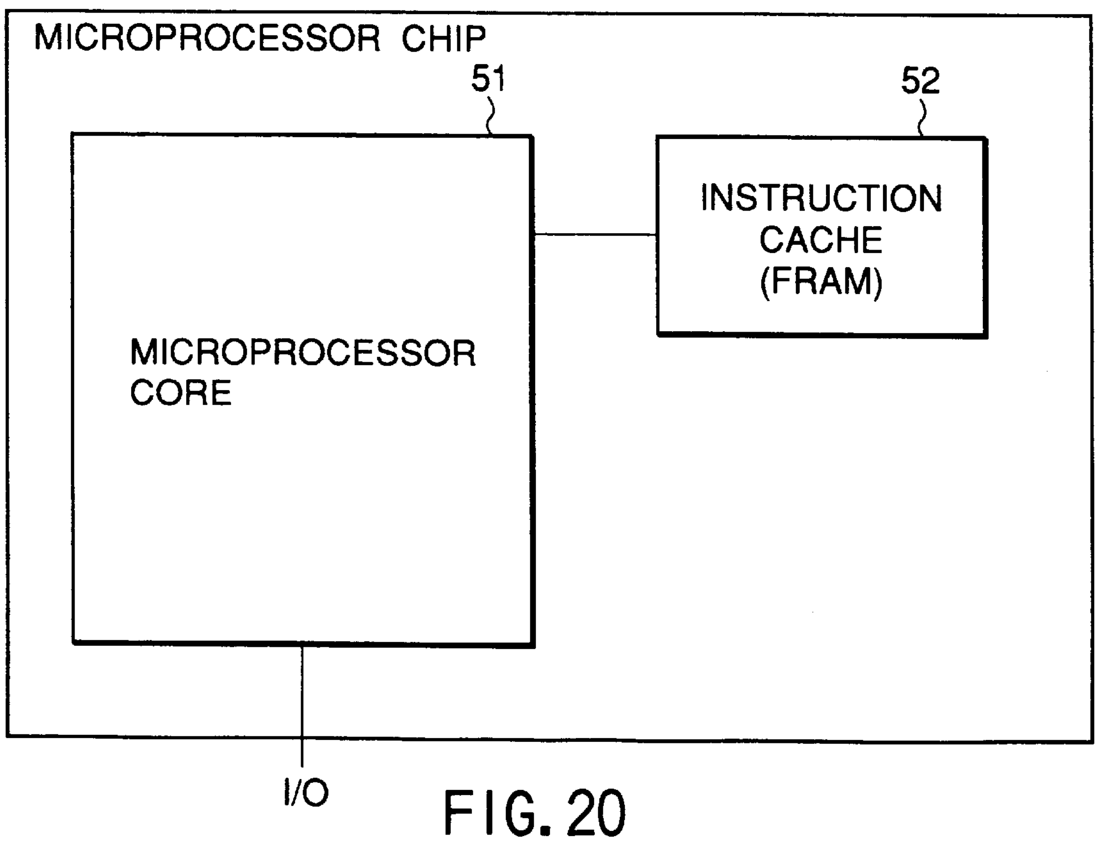
FIG. 20 is a schematic view showing an MPU chip having an FRAM according to the 13th embodiment.

FIG. 20 is a block diagram showing the basic structure of a microprocessor chip according to the 13th embodiment. The same reference numerals as in FIG. 19 denote the same parts in FIG. 20, and a detailed description thereof will be omitted.

This embodiment is different from the 12th embodiment in that an FRAM 52 is used as an instruction cache memory in an MPU 51. When the FRAM 52 is mounted as an instruction cache memory in the MPU 51, a high-speed nonvolatile cache memory can be realized.

Because of (1) and (2) described in the first embodiment, a compact and large-capacity instruction cache memory can be mounted. When the instruction cache memory is replaced with a normal FRAM, no high-performance MPU can be realized because the FRAM operates at a low speed. However, due to (4) and (5) of the first embodiment, a high-speed MPU with a low power consumption can be realized. Since the MPU has a very large power consumption and operates at a high temperature, the conventional FRAM which requires the refresh operation cannot be mounted. However, according to (6) of the first embodiment, even the high-temperature MPU can have the high-speed nonvolatile instruction cache memory. In addition, because of (7) of the first embodiment, the micro-processor chip is resistant to noise from the digital section of the MPU.

14th Embodiment

Figure 21:
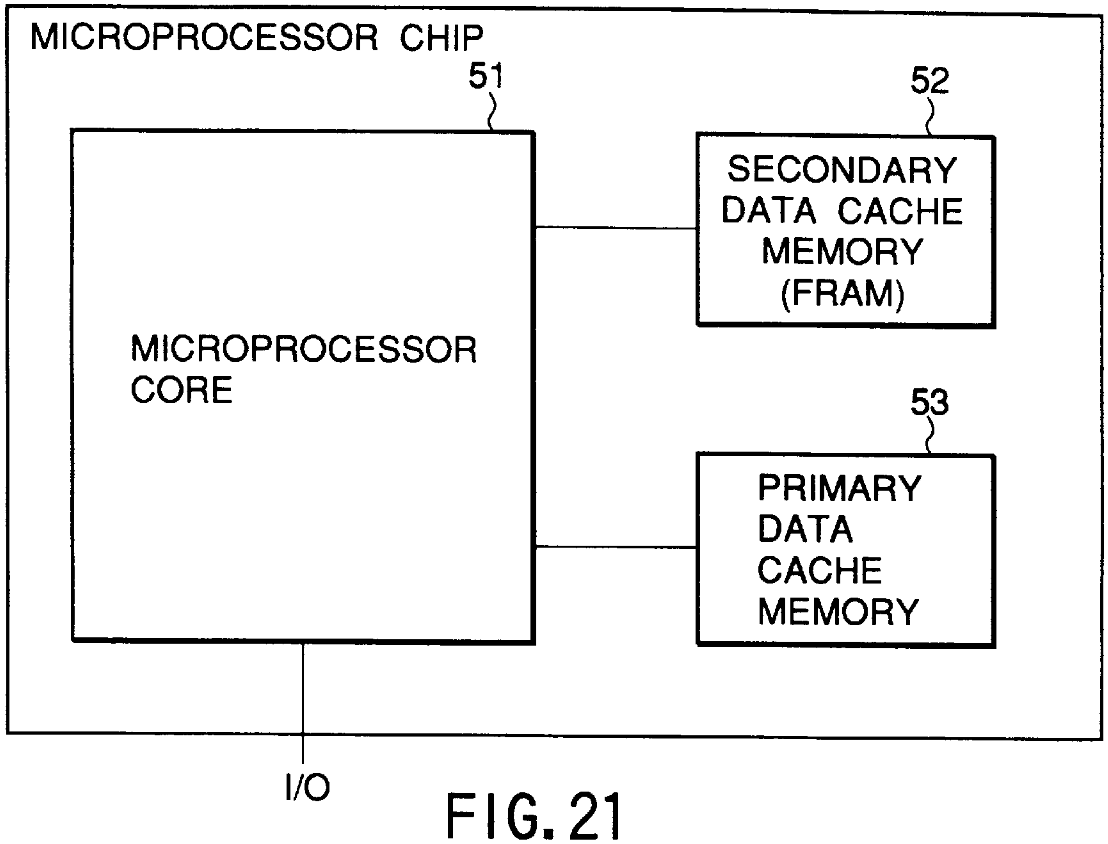
FIG. 21 is a schematic view showing an MPU chip having an FRAM according to the 14th embodiment.

FIG. 21 is a block diagram showing the basic structure of a microprocessor chip according to the 14th embodiment. The same reference numerals as in FIG. 19 denote the same parts in FIG. 21, and a detailed description thereof will be omitted.

This embodiment is different from the 12th embodiment in that an FRAM 52 is used as a secondary data cache memory in an MPU 51. In this embodiment, a high-speed memory 53 such as an SRAM is used as a primary data cache memory. Both the primary and secondary cache memories may be used as the FRAM of the present invention. Alternatively, the MPU and the FRAM of the present invention may be used for an arbitrary purpose.

When the FRAM 52 is mounted as the secondary data cache memory of the MPU 51, a high-speed nonvolatile cache memory can be realized.

Because of (1) and (2) described in the first embodiment, a compact and large-capacity data cache memory can be mounted. When the data cache memory is replaced with a normal FRAM, no high-performance MPU can be realized because the FRAM operates at a low speed. However, due to (4) and (5) of the first embodiment, a high-speed MPU with a low power consumption can be realized. Since the MPU has a very large power consumption and operates at a high temperature, the conventional FRAM which requires the refresh operation cannot be mounted. However, according to (6) of the first embodiment, even the high-temperature MPU can have the high-speed nonvolatile instruction cache memory. In addition, because of (7) of the first embodiment, the microprocessor chip is resistant to noise from the digital section of the MPU.

15th Embodiment

Figure 22:
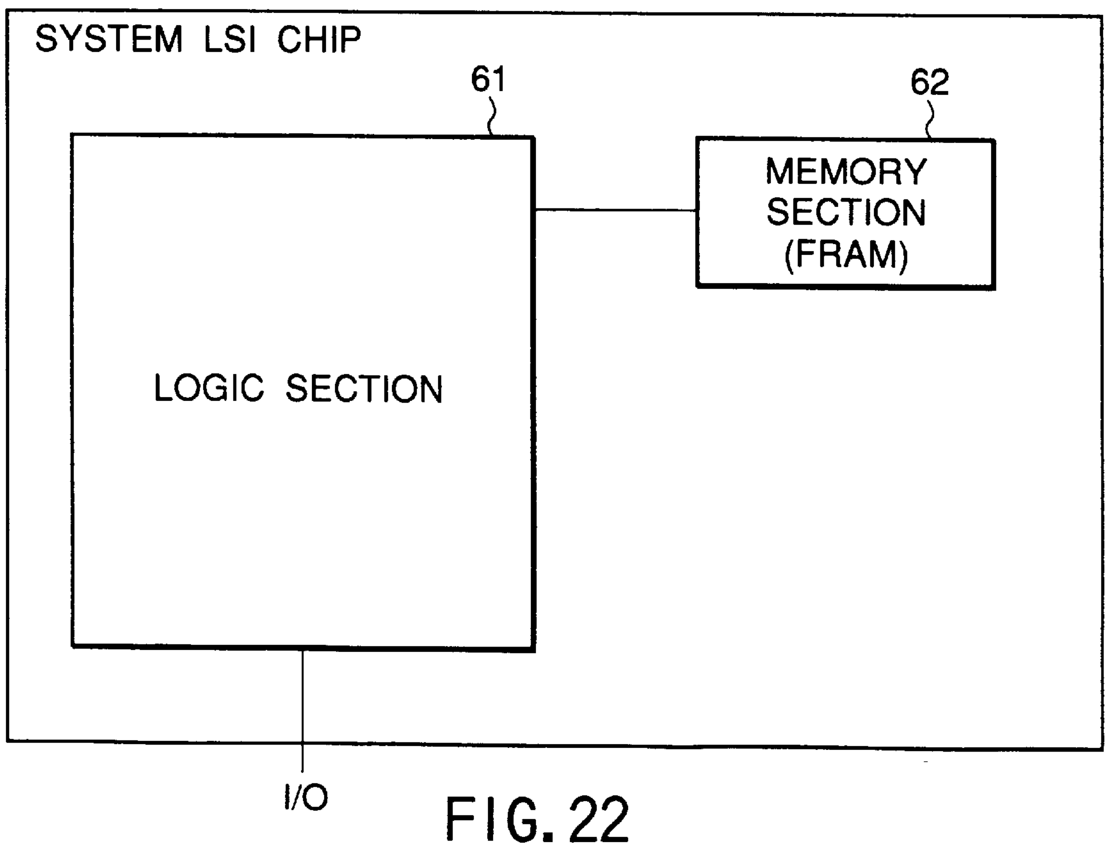
FIG. 22 is a block diagram showing a system LSI chip having an FRAM according to the 15th embodiment.

FIG. 22 is a block diagram showing the basic structure of a system LSI chip according to the 15th embodiment of the present invention.

This system is constituted by mounting, on the same chip, a logic section 61 for performing various calculations and an FRAM 62 for storing data.

In this embodiment, the semiconductor memory device (FRAM) of the present invention is mounted in a system LSI. Details of the FRAM used in this embodiment are the same as in the first embodiment, and a detailed description thereof will be omitted.

In the system LSI chip having the FRAM of the present invention, a small-area large-capacity chip can be realized because of (1) and (2) described in the first embodiment. Since the LSI chip is adaptive to a high-speed operation, a low power consumption, and a high-temperature environment due to (4) to (6) of the first embodiment, the performance of the system LSI can be largely improved. In addition, the system LSI is resistant to digital noise because of (7) of the first embodiment.

16th Embodiment

Figure 23:
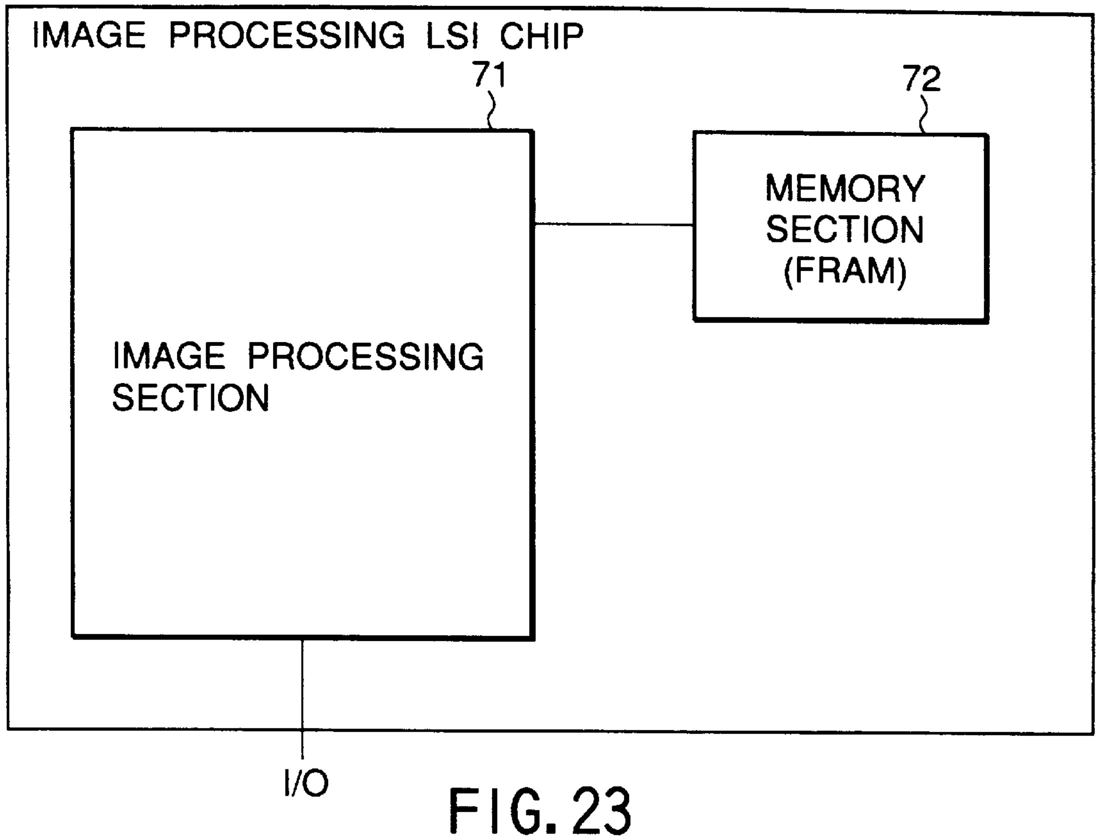
FIG. 23 is a block diagram showing an image processing LSI chip having an FRAM according to the 16th embodiment.

FIG. 23 is a block diagram showing the basic structure of an image processing LSI chip according to the 16th embodiment of the present invention.

This system is constituted by mounting, on the same chip, an image processing unit 71 for performing various image processing operations and an FRAM 72 for storing data.

In this embodiment, the semiconductor memory device (FRAM) of the present invention is mounted in an image processing LSI. Details of the FRAM used in this embodiment are the same as in the first embodiment, and a detailed description thereof will be omitted.

In the image processing LSI chip having the FRAM of the present invention, a small-area large-capacity chip can be realized because of (1) and (2) described in the first embodiment. Since the LSI chip is adaptive to a high-speed operation, a low power consumption, and a high-temperature environment due to (4) to (6) of the first embodiment, image processing data or compressed data can be quickly written in or read out. In addition, the image processing LSI is resistant to digital noise because of (7) of the first embodiment.

17th Embodiment

Figure 24:
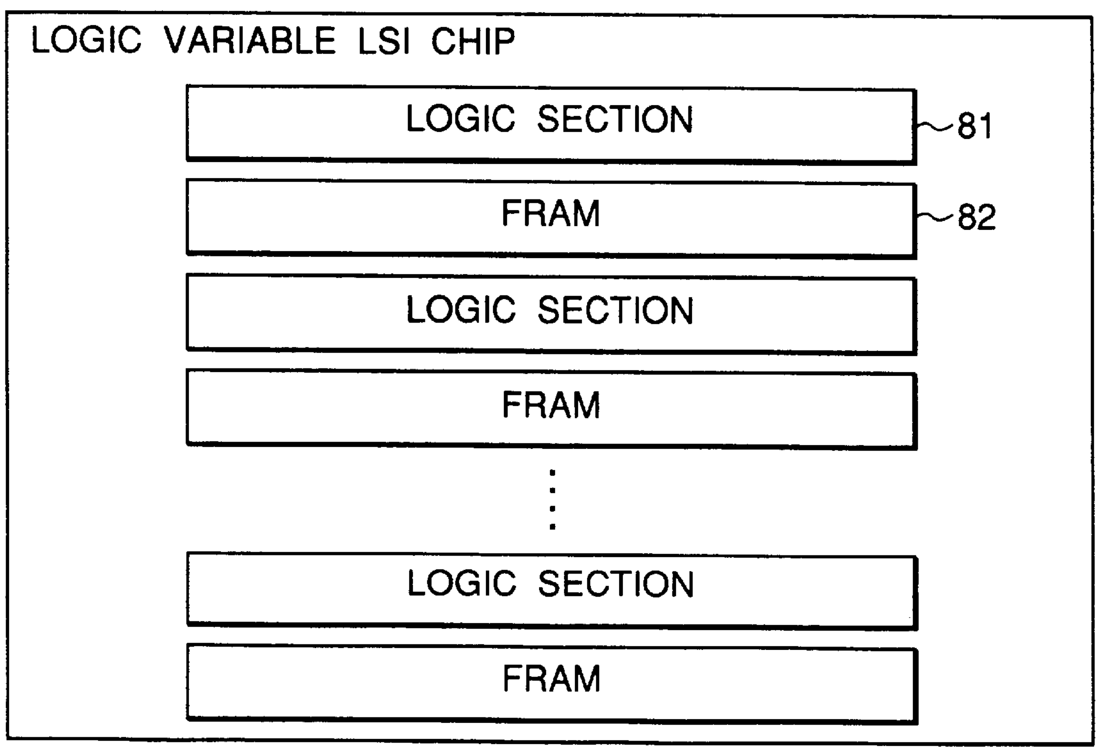
FIG. 24 is a block diagram showing a logic variable LSI chip having an FRAM according to the 17th embodiment.

FIG. 24 is a block diagram showing the basic structure of a logic variable LSI chip according to the 17th embodiment of the present invention.

This system is constituted by mounting, on the same chip, a plurality of logic sections 81 for performing different logic calculations and FRAMs 82 respectively corresponding to the logic sections 81.

In this embodiment, the FRAM of the present invention is mounted as a memory for changing the logic of a logic variable LSI. Details of the FRAM used in this embodiment are the same as in the first embodiment, and a detailed description thereof will be omitted.

In an FPD, an FPGA, or a logic whose logic calculation is reconfigurable, the combinations of logics must be quickly changed using a nonvolatile chip having a small area. The FRAM of the present invention can realize a small-area large-capacity chip on the basis of (1) and (2) described in the first embodiment. The LSI chip is optimum because it is adaptive to a high-speed operation, a low power consumption, and a high-temperature environment due to (4) to (6) of the first embodiment. In addition, the memory is resistant to digital noise because of (7) of the first embodiment. Furthermore, a quick ON/OFF response is obtained due to (8) of the seventh embodiment.

In the logic variable LSI of this embodiment, the FRAMs may be arranged at one position. The FRAMs may be distributed, as shown in FIG. 24, or distributed in units of modules.

18th Embodiment

Figure 25:
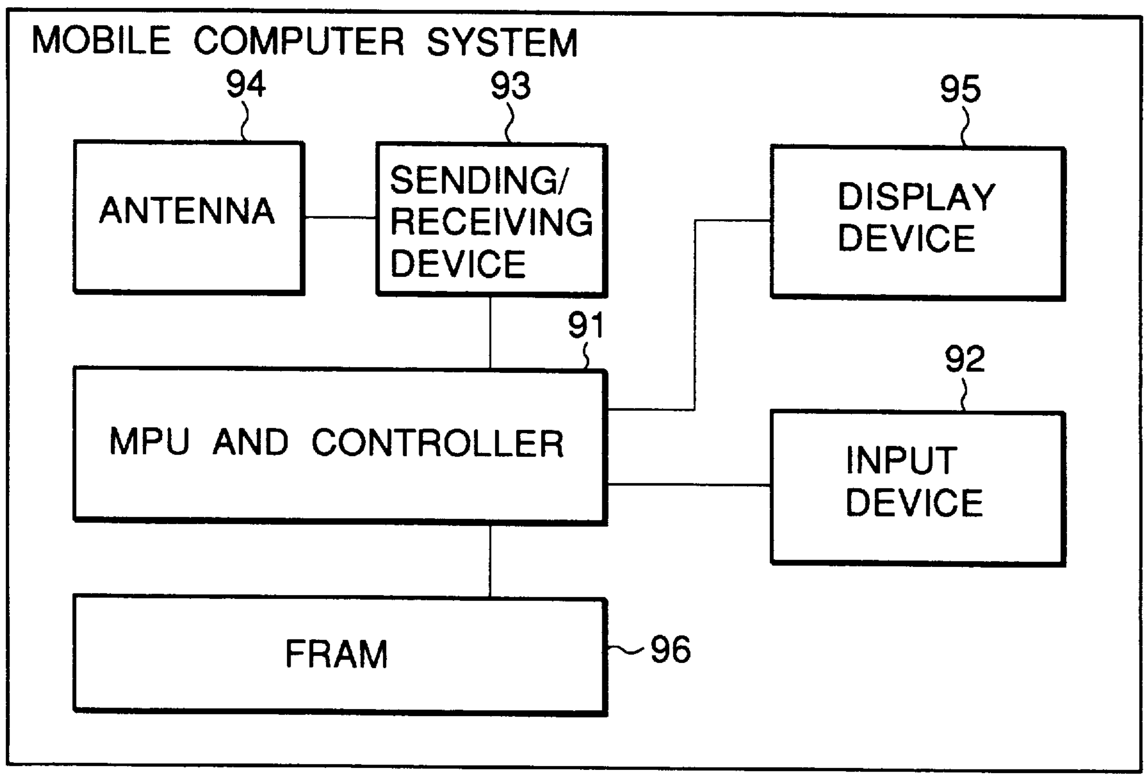
FIG. 25 is a block diagram showing a mobile computer system having an FRAM according to the 18th embodiment.

FIG. 25 is a block diagram showing the basic structure of a mobile computer system according to the 18th embodiment of the present invention.

This system is constituted by a microprocessor (an MPU and a controller: to be abbreviated as an "MPU" hereinafter) 91 for performing various arithmetic processing operations, an input device 92 connected to the MPU 91 to input data, a sending/receiving device 93 connected to the MPU 91 to send/receive data to/from an external device, an antenna 94 connected to the sending/receiving device 93, a display device 95 such as an LCD connected to the MPU 91 to display necessary information, and an FRAM 96 connected to the MPU 91 to store data.

The sending/receiving device 93 has a radio wave sending/receiving function used for a mobile phone or the like. As the display device 95, an LCD or a plasma display may be used. A hand touch device, a key input device, a voice input device, an image input device such as CCD or the like can be applied to the input device 92.

In this embodiment, the semiconductor memory device (FRAM) of the present invention is mounted in a mobile computer system. Details of the FRAM used in this embodiment are the same as in the first embodiment, and a detailed description thereof will be omitted.

In the mobile computer system in which the FRAM of the present invention is mounted, a small-area large-capacity memory unit can be realized because of (1) and (2) described in the first embodiment, and data processing, data storage, and data reading at a high speed are enabled due to (4) to (6) of the first embodiment. In addition, the low power consumption prolongs the service life of the battery, and the system is adaptive to a high-temperature environment. The system is resistant to digital noise or electromagnetic noise because of (7) of the first embodiment. Furthermore, a quick ON/OFF response is obtained due to (8) of the seventh embodiment. Therefore, an excellent mobile computer system can be realized.

The embodiments of various systems using the FRAMs of the present invention have been described above. Various embodiments of FRAMs of the present invention will be described below.

19th Embodiment

Figure 26:
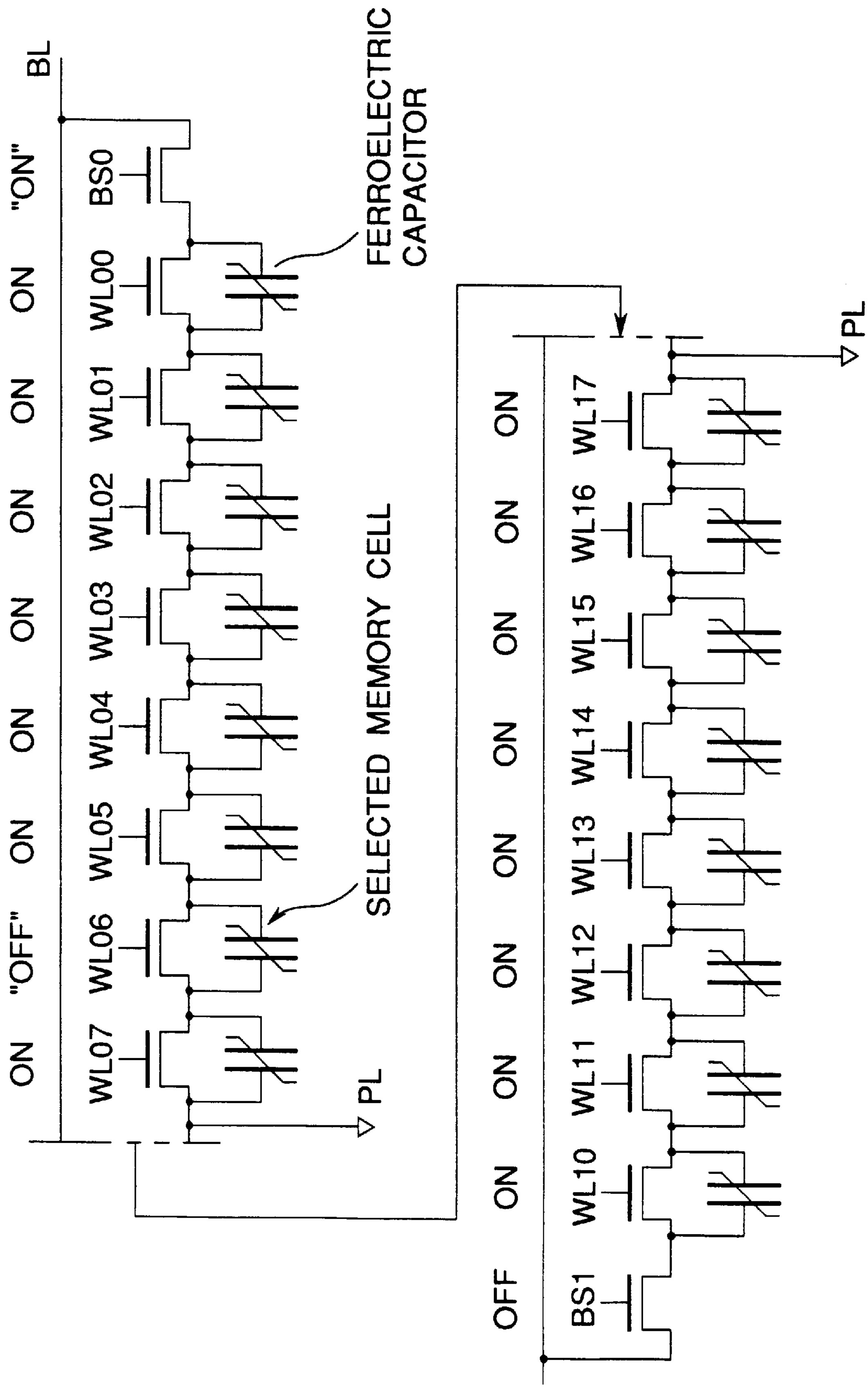
FIG. 26 is an equivalent circuit diagram showing the basic structure of an FRAM according to the 19th embodiment.

FIG. 26 is an equivalent circuit diagram showing the basic structure of an FRAM according to the 19th embodiment of the present invention. This embodiment is different from the first embodiment shown in FIG. 6A and FIG. 6B in that the number of series connected cells in one memory block is eight, i.e., twice that shown in FIG. 6A and FIG. 6B.

In the conventional NAND cell, when the number of series connected cells is increased, the bit line capacity can be decreased. However, when the number of cells is excessively increased, and data is to be read out from a cell far from the bit line, the bit line capacity increases by an amount corresponding to other cell capacities from the bit line to the target read cell. For this reason, the number of series connected cells is limited to about four.

In the present invention, the number of series connected cells can be further increased, and simultaneously, the bit line capacity can be largely decreased. When the number of series connected cells increases, the capacity on the drain side of a select transistor or the diffusion layer capacity can be reduced to 1/n (n is the number of series connected cells) because of the decrease in the number of bit line die conductor portions. Even when n increases, the two terminals of a ferroelectric capacitor of an unselected memory cell in a selected block are short-circuited in reading cell data, and the capacity of the ferroelectric capacitor electrically disappears. Therefore, only a small capacity corresponding to the inverted capacity and diffusion layer capacity of the gate of the select transistor is added in correspondence with the increase in the number of cells. Therefore, the number of series connected cells can be increased to 8 (FIG. 26), 16, or 32.

When the number of series connected cells increases, a problem of read/write time is posed. Assume that the ON resistance of a transistor is 12 kΩ, the resistance of a diffusion layer is 1 kΩ, and the capacity of a ferroelectric capacitor is 30 fF. In this case, the RC time constant per stage is 13 k×30 f=0.4 ns. The RC time constant is 1.6 ns for four stages, and 3.2 ns for eight stages. Normally, the read delay of a word line (and a block selection line) is 5 to 10 ns, and the data rewrite time is 20 to 30 ns. In consideration of this fact, the above RC time is almost no problem.

When the cells are connected in series, a small voltage is applied across the ferroelectric capacitor due to the ON resistance of the cell transistor of an unselected memory cell. However, the delay of the block selection line is 5 to 10 ns and larger than the RC time constant due to the ON resistance of the cell transistor by at least one order of magnitude. On the basis of this fact, when the number of series-connected stages increases, the voltage instantaneously applied at the time of rising of the block selection line per cell decreases, so no problem is posed.

When eight stages are connected, as in this embodiment, and the bit line post-forming cell structure shown in FIG. 7A and FIG. 7B is employed, the cell size including the select transistor is represented as follows:

$$(18F\times 2F)/8=4.5F^2$$

When the bit line pre-forming cell structure shown in FIG. 8A and FIG. 8B is employed, the cell size is represented as follows:

$$(19F\times 2F)/8=4.75F^2$$

That is, as the number of stages increases, the cell size approaches to $4F^2$.

20th Embodiment

Figure 27:
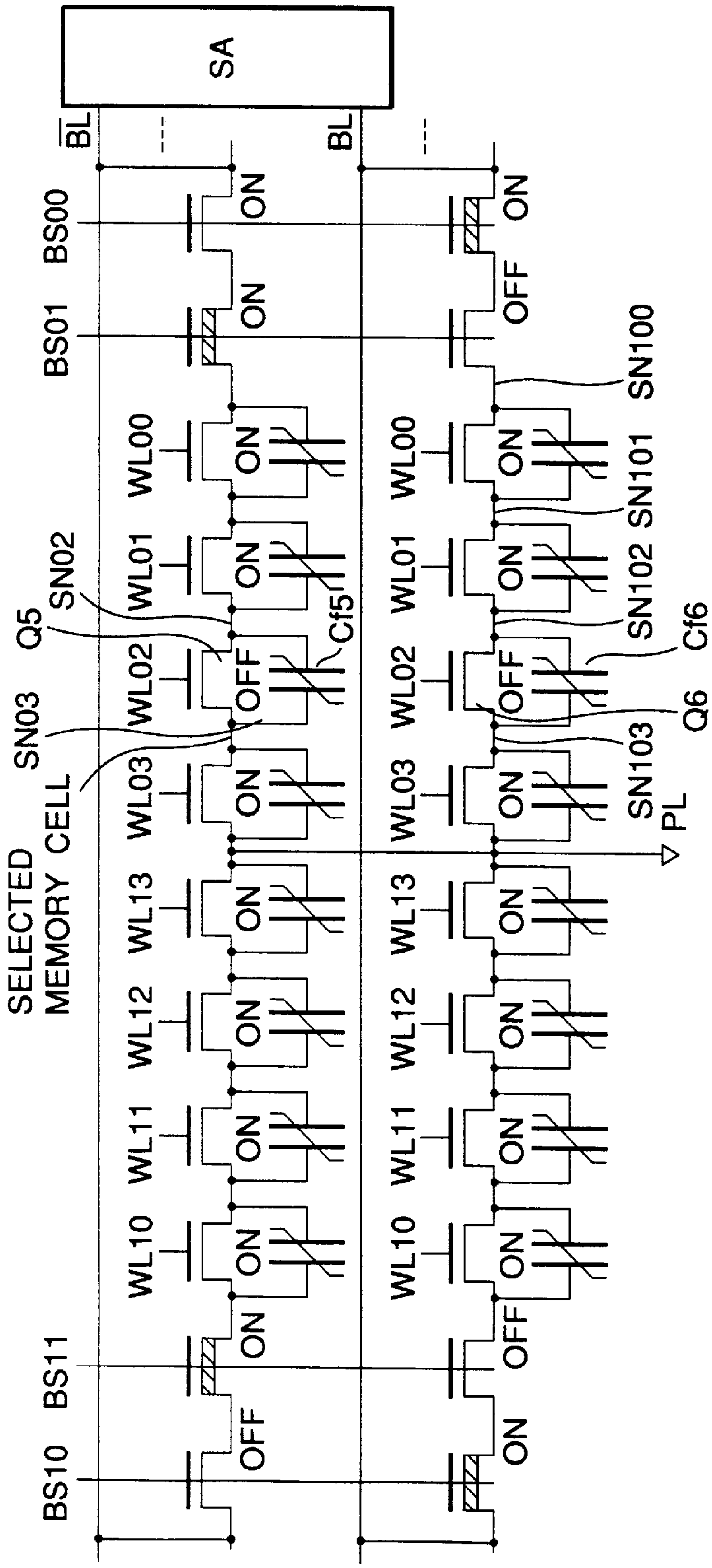
FIG. 27 is an equivalent circuit diagram showing the basic structure of an FRAM according to the 20th embodiment.

FIG. 27 is an equivalent circuit diagram showing the basic structure of an FRAM according to the 20th embodiment of the present invention.

In this embodiment, one more select transistor is added to the structure shown in FIG. 6A and FIG. 6B. A pair of adjacent bit lines BL and $\overline{BL}$ of the same cell array are connected to a sense amplifier SA, thereby forming a folded bit line structure. One of the select transistors is a D-type (Depletion-type) transistor, and the other select transistor is an E-type (Enhancement-type) transistor. With this structure, one of the select transistors is ON regardless of the voltage of the block selection line, so that a short-circuit state is equivalently set. Therefore, the other select transistor is controlled by the remaining block selection lines.

More specifically, for a memory block connected to the bit line $\overline{BL}$ through two select transistors, the select transistor on the bit line $\overline{BL}$ side is an E-type transistor, and the select transistor on the memory block side is a D-type transistor. Similarly, for a memory block connected to the bit line BL through two select transistors, the select transistor on the bit line BL side is a D-type transistor, and the select transistor on the memory block side is an E-type transistor.

Consider a case wherein an arbitrary memory cell (Q5, Cf5) in FIG. 27 is to be selected. A word line WL02 is set at "L", and only a block selection line BS00 is set at "H".

Both the select transistors connected to the bit line $\overline{BL}$ side are turned on, and one of the select transistors connected to the bit line BL side is kept OFF. Therefore, cell data is read/written only on the bit line $\overline{BL}$ side. The bit line BL serves as a reference bit line. The folded bit line structure is formed, and the array noise is reduced, as in the DRAM.

With the folded bit line structure, a cell transistor Q6 of a cell (Q6, Cf6) in the memory block on the unselected side is turned off in the active state. A storage node SN103 is short-circuited to a plate electrode PL and set at an equipotential. Storage nodes SN100 to SN102 are also set at an equipotential because of the short-circuit of the cell transistors. When a leakage current such as a p-n junction leakage current is generated in any one of the storage nodes SN100 to SN102, the potential of the storage nodes SN100 to SN102 becomes lower than that of the storage node SN103, so the accumulated polarization is destroyed.

However, this problem is posed only when the ferroelectric memory is in the active state. In a normal memory such as a DRAM, the maximum active time (tRASmax) is limited to 10 $\mu$s. This time is shorter than the maximum refresh time (tREFmax: 64 ms for a 64-Mbit DRAM) of the normal DRAM. The specifications can be relaxed, and no problem is posed. More specifically, the original short-circuit state is set at the end of the active time to restore the data. To further relax the specifications, the specifications for tRAS, tCE, and the like may be tightened. This problem is not posed in the circuit shown in FIG. 6A and FIG. 6B, as a matter of course.

The substantial difference between the FRAM of this embodiment and the conventional FRAM will be described. In the conventional FRAM, since one terminal of the ferroelectric capacitor is floating, the stand-by time is infinite, and the refresh operation is necessary. In this embodiment, since one terminal and the other terminal are always short-circuited, the refresh operation is unnecessary. In the folded bit line structure, some cells are floating only for the active time. However, the active time is finite, and no problem is posed.

Figure 28A:
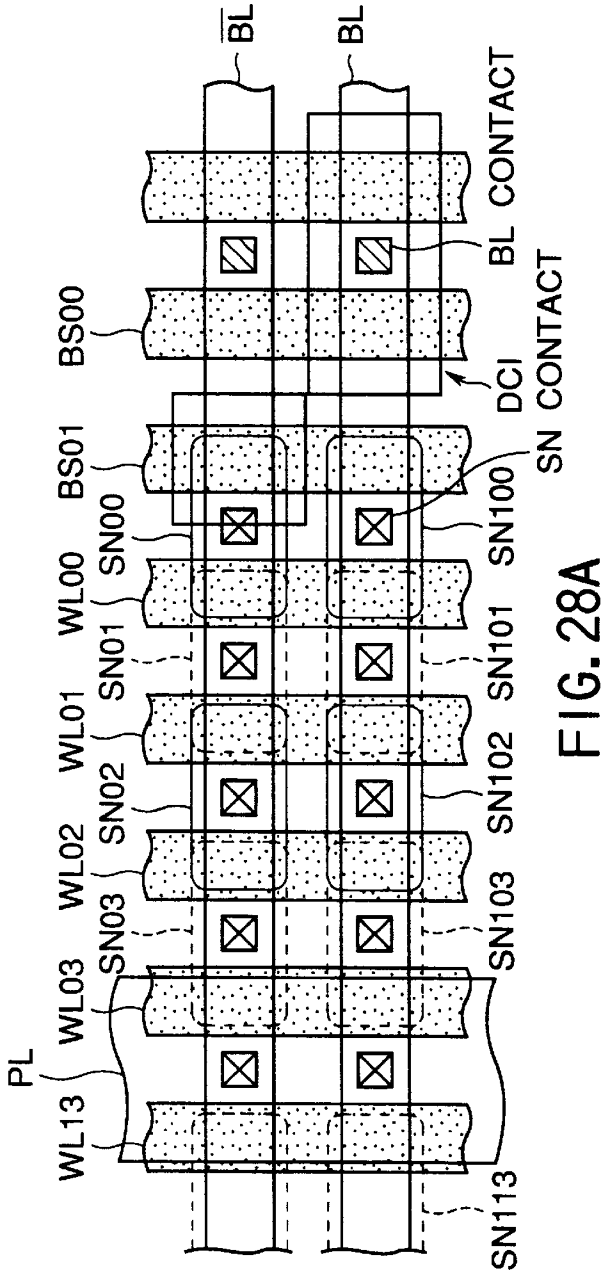
FIG. 28A and FIG. 28B are plan and sectional views, respectively, showing a cell structure for realizing the circuit structure shown in FIG. 27.
Figure 28B:
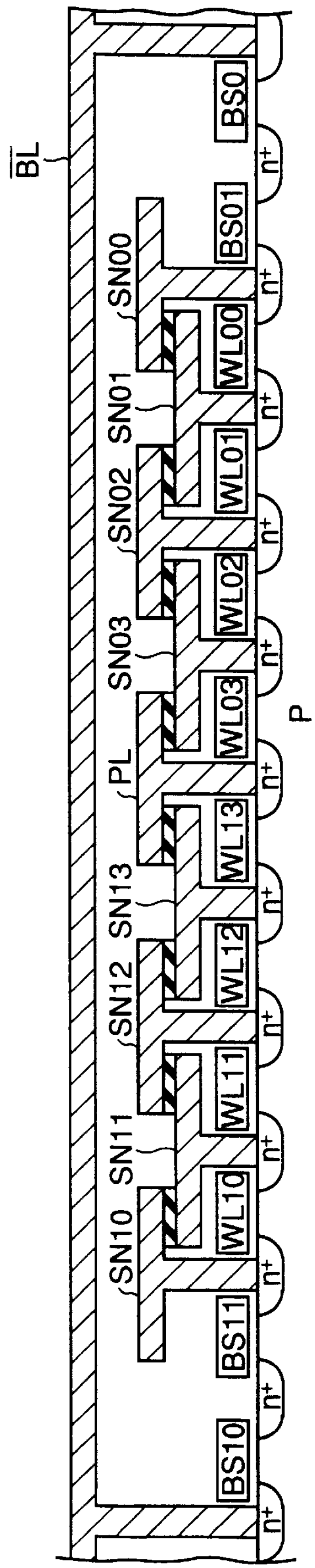

FIG. 28A and FIG. 28B show a cell structure for realizing the circuit structure shown in FIG. 27. FIG. 28A is a plan view showing a part from the plate electrode PL to a bit line contact at one terminal. FIG. 28B is a sectional view showing a part from a bit line contact at one terminal to that at the other terminal. This is a stack cell structure in which the ferroelectric capacitors are formed after formation of the cell transistors and, more particularly, a bit line post-forming cell structure in which the bit lines are formed after formation of the ferroelectric capacitors. This structure is different from that shown in FIG. 7A and FIG. 7B in that a block selection line is added, and a mask for D-type channel ion implantation (DCI) is added.

Figure 29A:
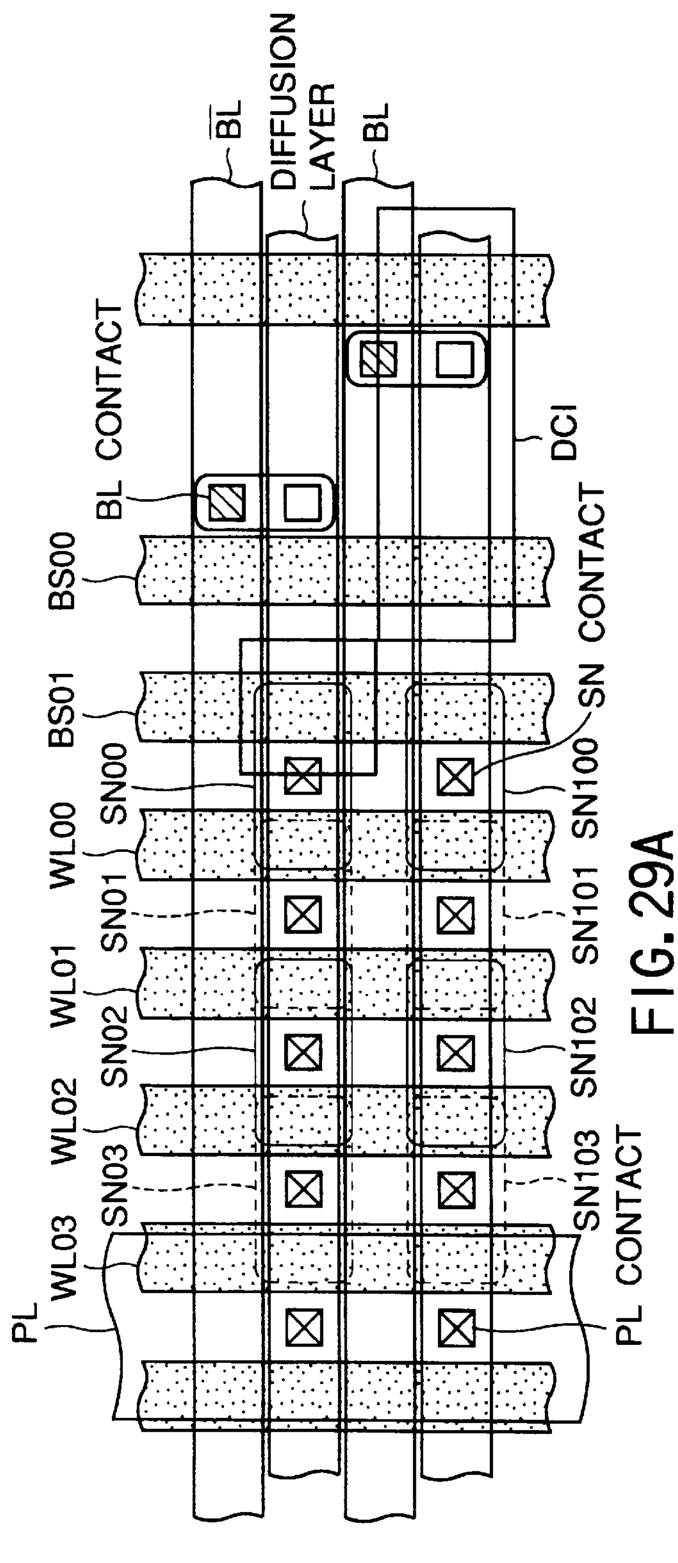
FIG. 29A and FIG. 29B are plan and sectional views, respectively, showing another cell structure for realizing the circuit structure shown in FIG. 27.
Figure 29B:
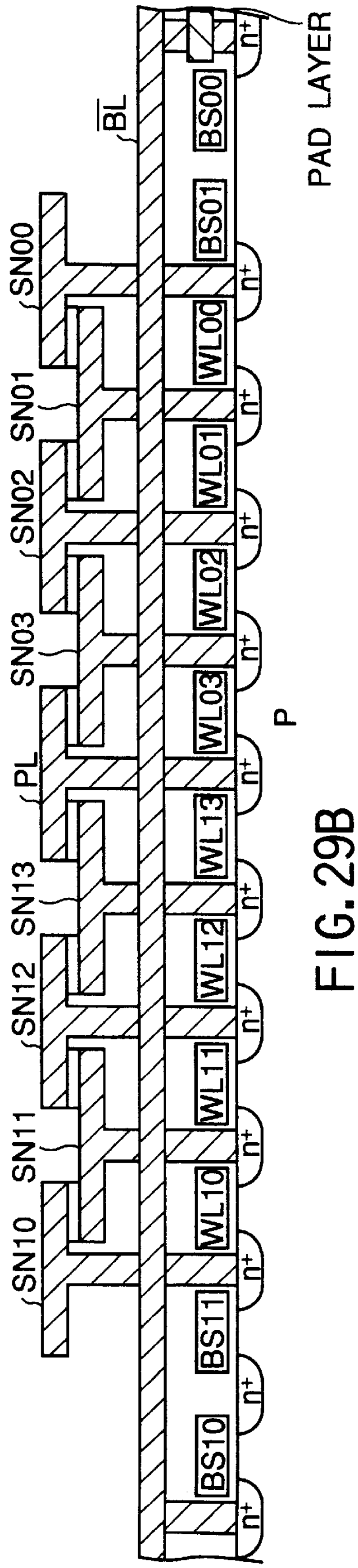

FIG. 29A and FIG. 29B show another cell structure for realizing the circuit structure shown in FIG. 27. FIG. 29A is a plan view showing a part from the plate electrode PL to the bit line contact at one terminal. FIG. 29B is a sectional view showing a part from the bit line contact at one terminal to that at the other terminal. This is a stack cell structure in which the ferroelectric capacitors are formed after formation of the cell transistors and, more particularly, a bit line pre-forming cell structure in which the bit lines are formed before formation of the ferroelectric capacitors. This structure is different from that shown in FIG. 8 in that a block selection line is added, and a mask for D-type channel ion implantation (DCI) is added.

When the bit line post-forming cell structure shown in FIG. 28A and FIG. 28B is employed for a folded bit line structure with eight stages, the cell size including the select transistor is represented as follows:

$$(20F\times2F)/8=5F^2$$

For the bit line pre-forming cell structure shown in FIG. 29A and FIG. 29B, the cell size is represented as follows:

$$(21F\times2F)/8=5.25F^2$$

That is, as the number of stages increases, the cell size approaches to the ideal size of $4F^2$.

Figure 30A:
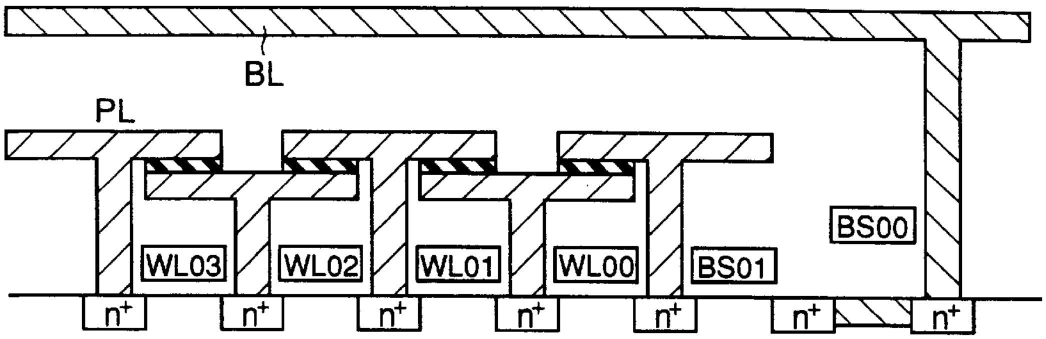
FIG. 30A to FIG. 30D are sectional views, respectively, showing still another memory cell structure for realizing the circuit structure shown in FIG. 27.
Figure 30B:
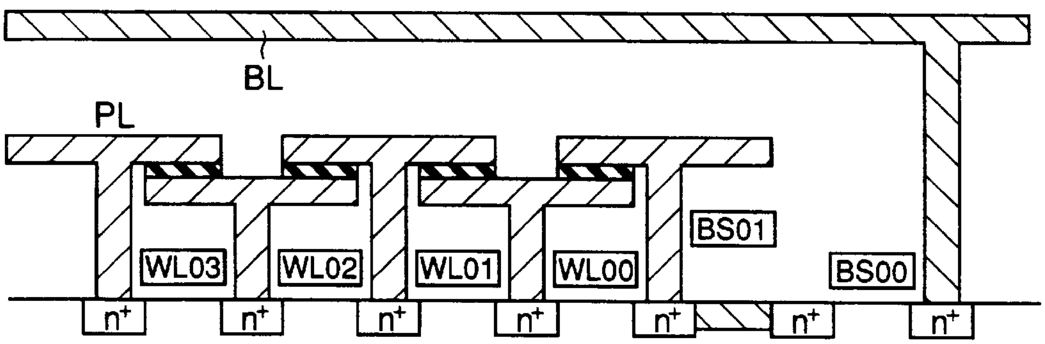

In FIG. 27, instead of using the D-type transistor, a block selection line passing through the transistor portion may be arranged to form a field transistor, as shown in FIG. 30A and FIG. 30B. An $n^+$-type layer is formed under a field oxide film, and regions which originally serve as a source and a drain may be connected to each other. In FIG. 30A, the field transistor is formed on the side of the block selection line BS0. In FIG. 30B, the field transistor is formed on the side of the block selection line BS1 side. Another interconnection formed above the block selection line may be used to connect the regions which originally serve as a source and a drain.

Figure 30C:
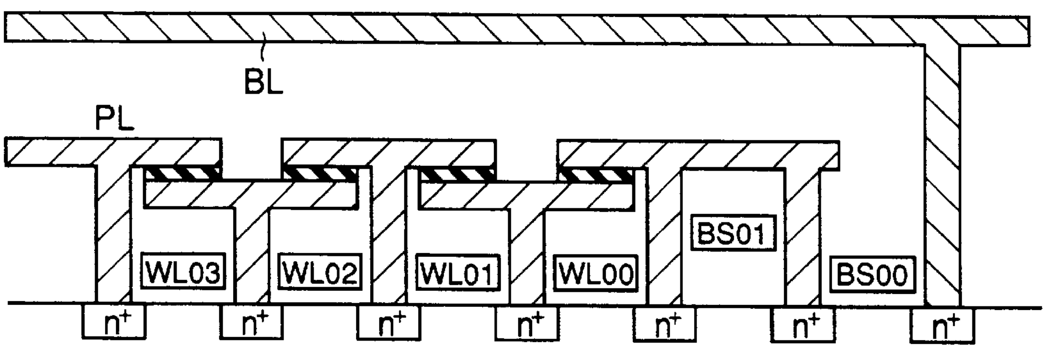
Figure 30D:
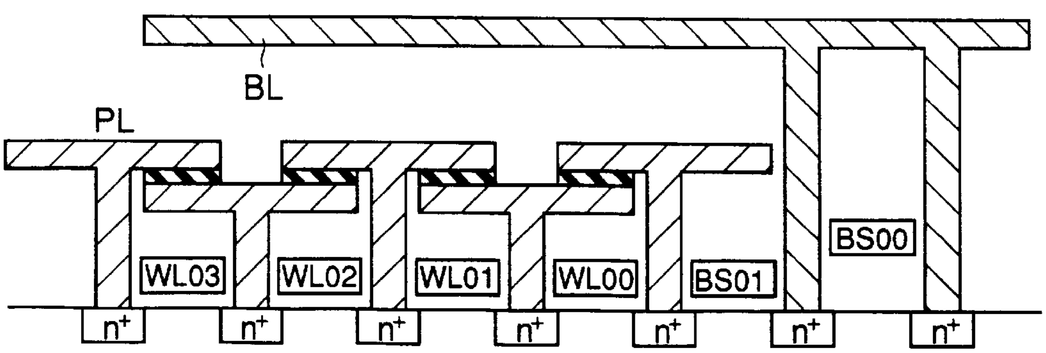

As shown in FIG. 30C, the storage node layers may be properly connected to each other. Alternatively, the number of bit line die conductors may be increased, as shown in FIG. 30D. When a D-type transistor is used, the capacity of the inverted layer of the channel of the D-type transistor appears as a bit line capacity, so that the bit line capacity increases. This problem can be solved by a structure without any D-type transistor, as shown in FIG. 30A to FIG. 30D. This applies to all embodiments using a D-type block select transistor.

21st Embodiment

Figure 31A:
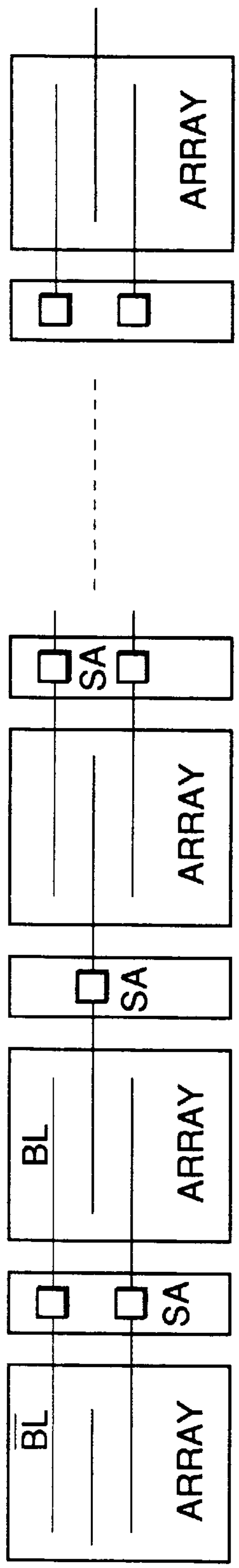
FIG. 31A to FIG. 31C are block diagrams showing the schematic structure of an FRAM according to the 21st embodiment.
Figure 31C:
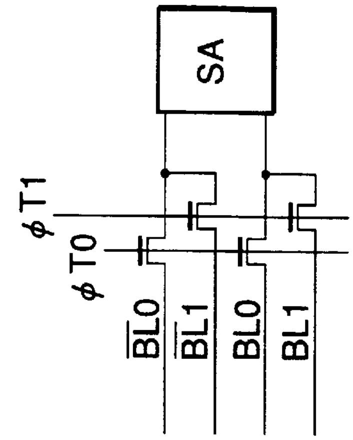
Figure 31B:
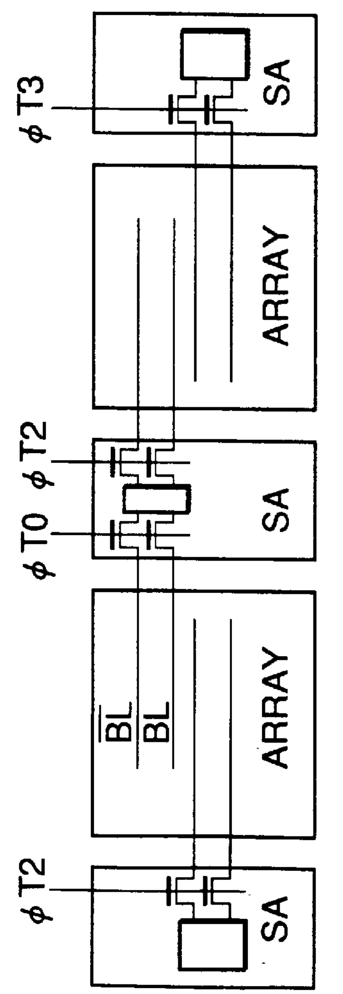

FIG. 31A to FIG. 31C are views showing the schematic structure of an FRAM according to the 21st embodiment of the present invention. In this embodiment, the memory of the present invention is formed by a plurality of cell array blocks and a plurality of sense amplifier blocks.

FIG. 31A shows an open bit line structure to which the embodiment shown in FIG. 6A and FIG. 6B can be applied. Bit lines BL are alternately extracted to sense amplifiers SA at cell array terminals, thereby relaxing the sense amplifier rule.

FIG. 31B shows a folded bit line structure to which the embodiment shown in FIG. 27 can be applied. When a signal ϕti is to be read out, the potential of the unselected one of the left and right cell arrays is lowered. With this structure, the sense amplifier SA can be shared, and the number of sense amplifiers can be halved.

Figure 32:
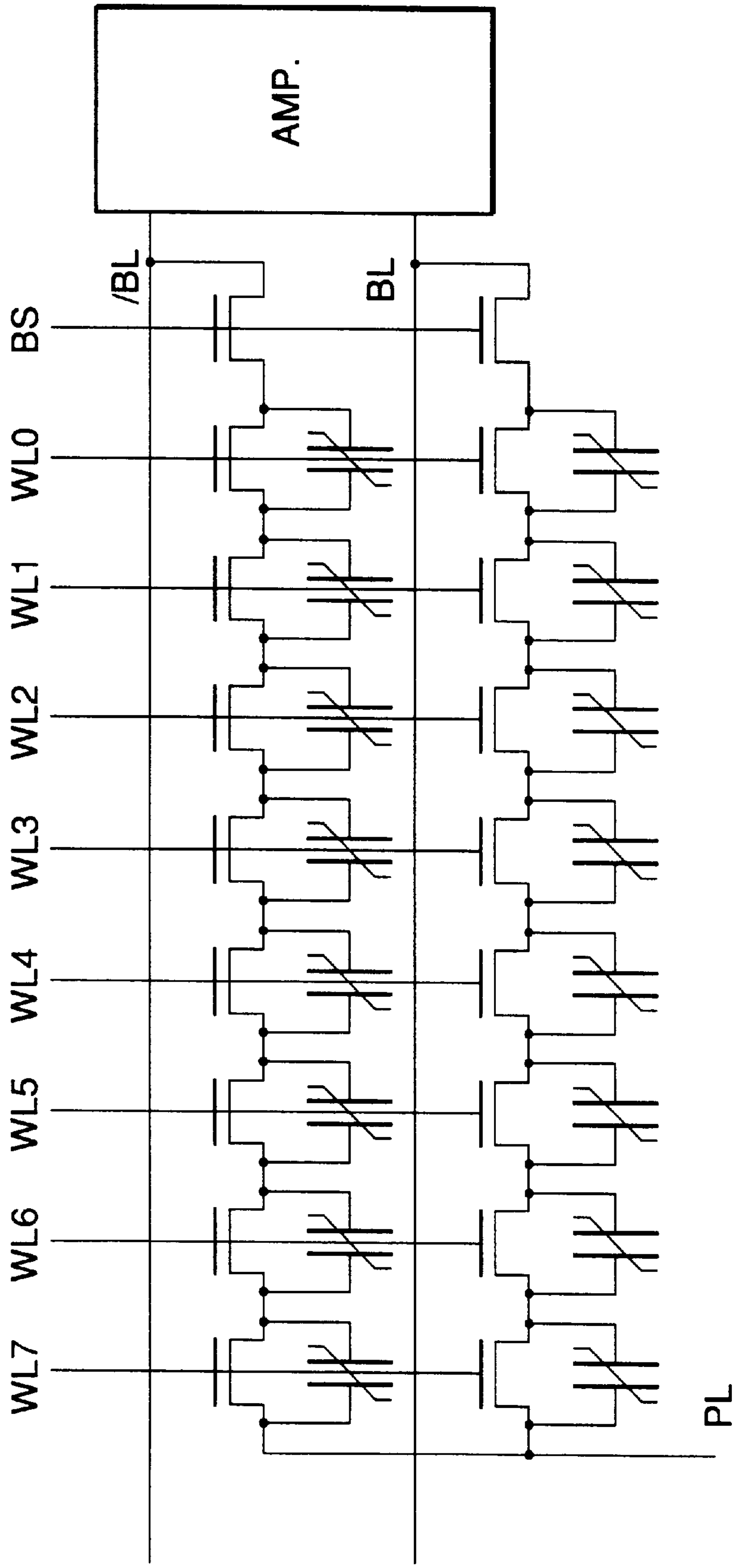
FIG. 32 is a circuit diagram showing an example wherein a folded bit line structure is realized in the circuit shown in FIG. 6A and FIG. 6B.

In the circuit shown in FIG. 6A and FIG. 6B as well, when 1-bit data is stored in two cells, data "1" ("0") is written on the bit line BL side, and data "0" ("1") is written on a bit line $\overline{BL}$ side, the folded bit line structure can be easily realized, as shown in FIG. 31B, detailed in FIG. 32. In this case, the conventional cell size of $8F^2$ can be halved to $4F^2$. Therefore, the read reliability can be improved, and dummy cells can be omitted without changing the chip size, unlike the conventional 1-transistor/1-ferroelectric capacitor structure.

FIG. 31C shows a structure in which the bit lines BL and the sense amplifier SA are time-divisionally connected, to which both embodiments shown in FIG. 6A and FIG. 6A and FIG. 27 can be applied.

22nd Embodiment

Figure 33A:
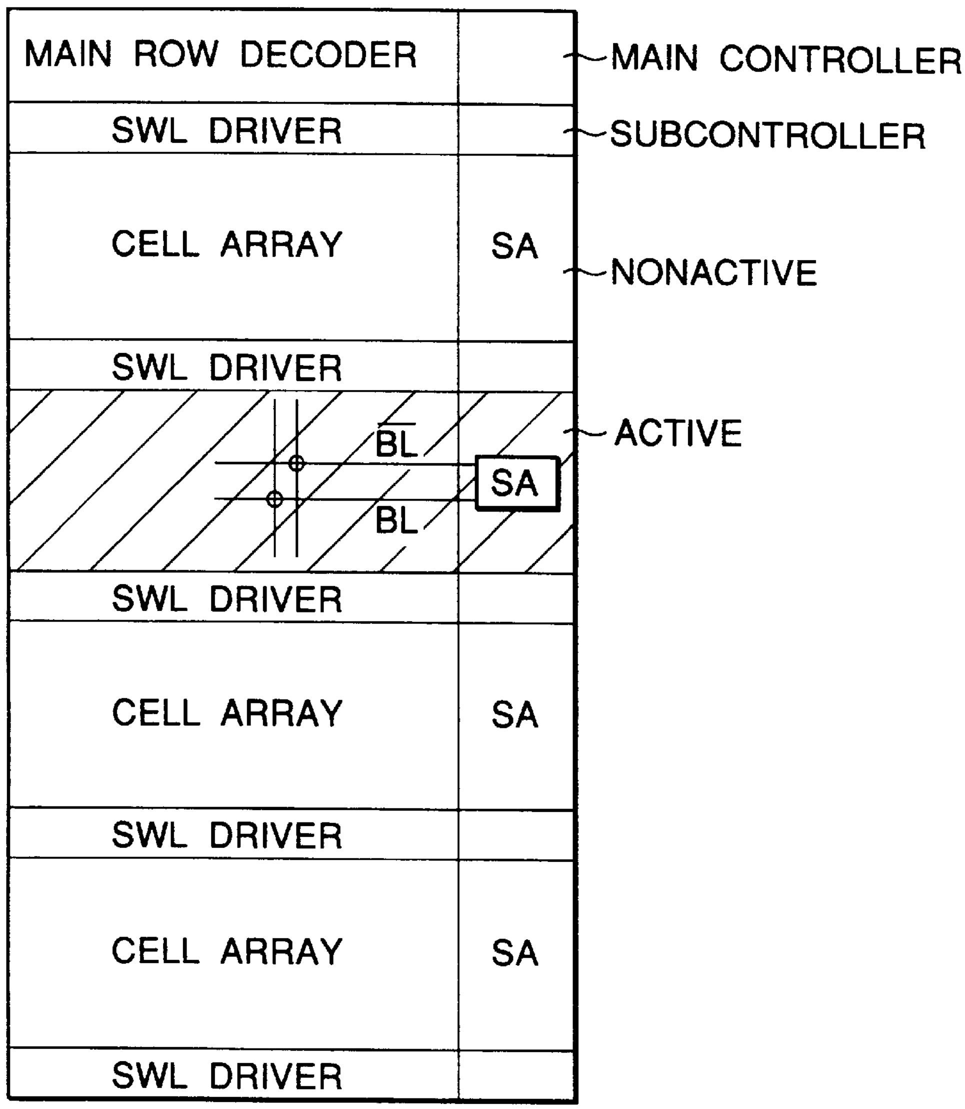
FIG. 33A and FIG. 33B are block diagrams showing the schematic structure of an FRAM according to the 22nd embodiment.
Figure 33B:
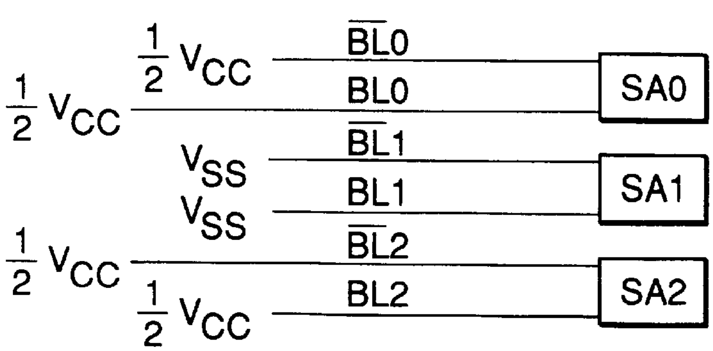

FIG. 33A and FIG. 33B are block diagrams showing the schematic structure of an FRAM according to the 22nd embodiment of the present invention. To this structure as well, both embodiments shown in FIG. 6A and FIG. 6B and FIG. 27 can be applied.

In FIG. 33A, each of a cell array block and a sense amplifier block is divided into a plurality of subblocks along the word line. By activating some subblocks or only one subblock of all subblocks, the active current can be largely decreased. This structure is normally used for the scheme of changing the potential of a plate electrode PL from 0V to Vcc because the load capacity of PL driving is large. In the scheme of fixing the plate electrode at (1/12)Vcc, the refresh operation is necessary. For this reason, the number of subblocks cannot be optionally increased to reduce the number of columns to be activated. In this embodiment, however, the refresh operation can be omitted. Therefore, even in the scheme of fixing the plate electrode at (1/12)Vcc, the number of subblocks can be sufficiently increased to reduce the number of columns to be activated, thereby reducing the current consumption.

In the scheme of fixing the plate electrode at (½)Vcc, only the bit lines of columns ($\overline{BL1}$, BL1) where data is to be read or written are precharged to Vss to operate the sense amplifier, as shown in FIG. 33B. The remaining columns are precharged to (½)Vcc not to operate the sense amplifiers. In this case, only one column can be operated. This also utilizes the fact that, for an unselected column, even when the word line and the block selection line are operated while the bit line and the plate electrode PL are fixed at (½)Vcc, the data is not destroyed.

In the scheme of fixing the plate electrode at (½)Vcc, only the bit lines of columns ($\overline{BL}$, BL) where data is to be read or written are precharged to Vcc to operate the sense amplifier. The remaining columns are precharged to (½)Vcc not to operate the sense amplifiers. In this case, only one column can be operated. In the scheme of changing the plate electrode potential from 0V to Vcc as well, the bit line can be precharged to Vcc to read/write data.

More Detailed Description of Operation

Figure 34:
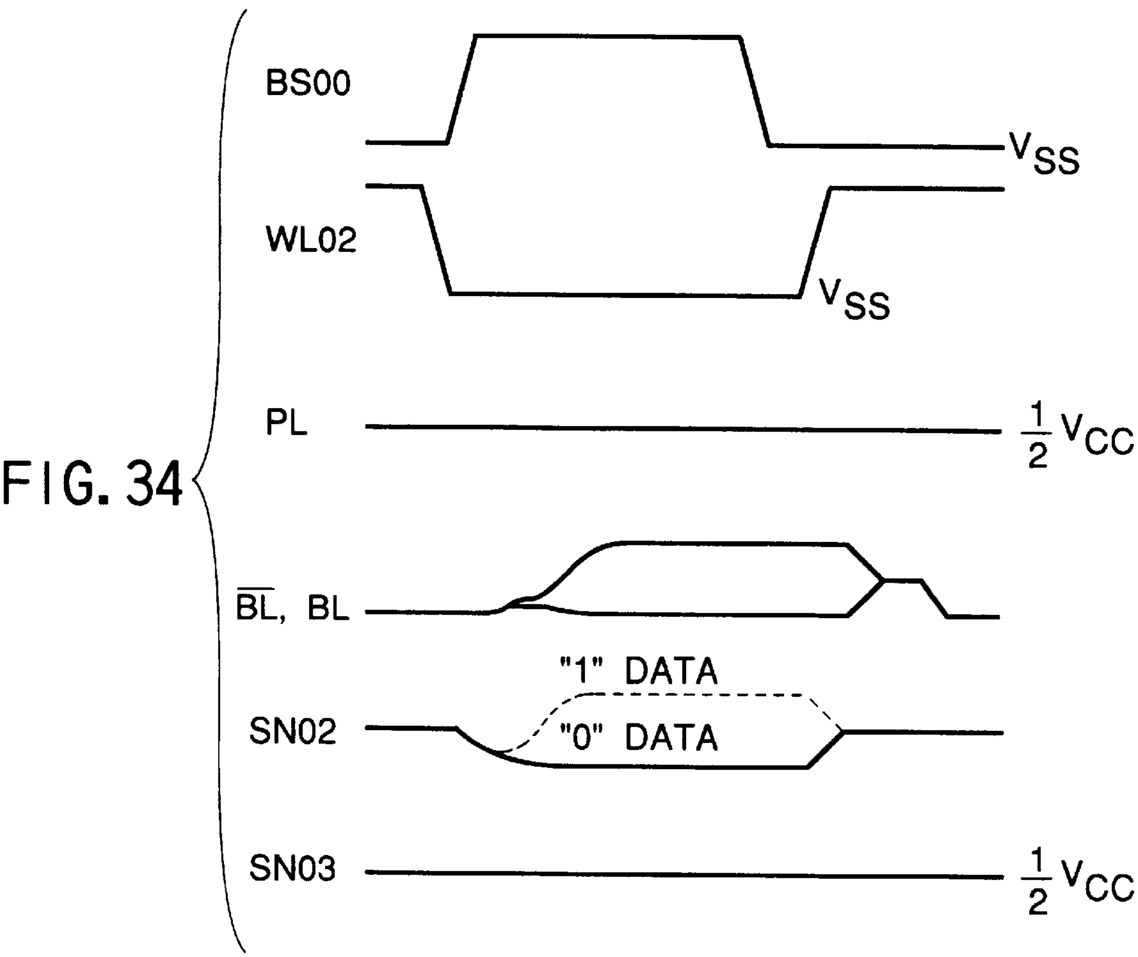
FIG. 34 is a chart showing signal waveforms so as to explain an operation example of each embodiment.
Figure 35:
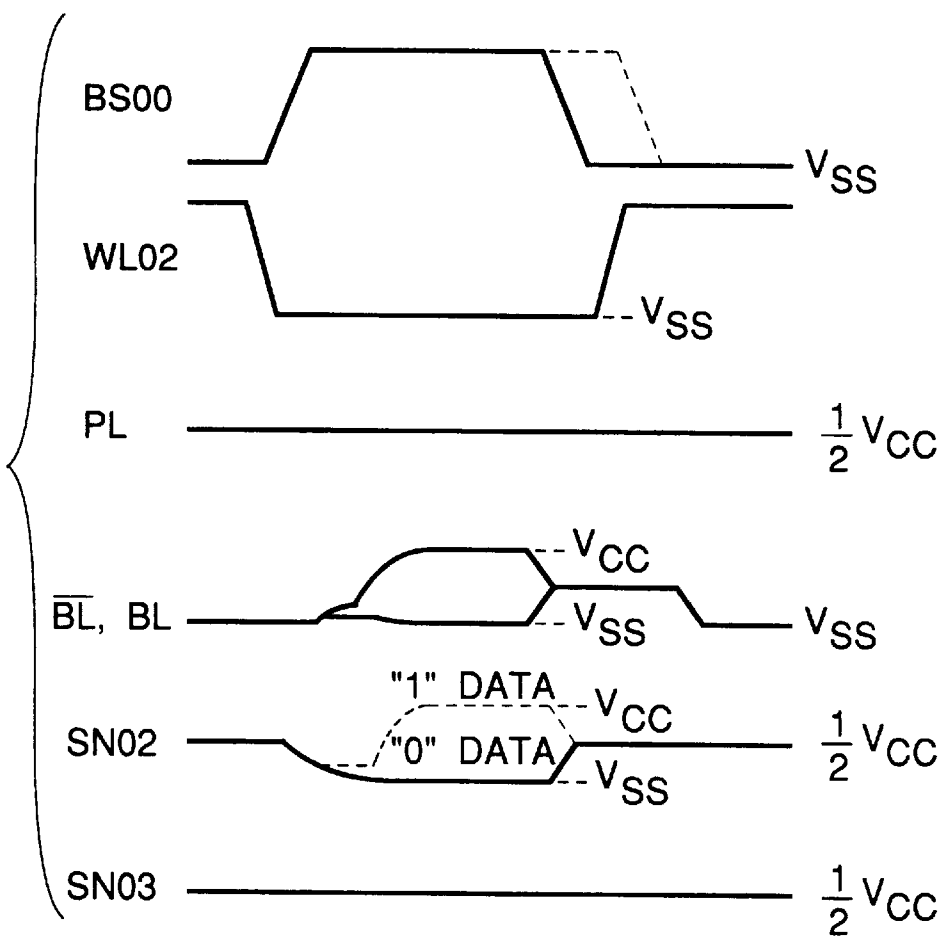
FIG. 35 is a chart showing signal waveforms so as to explain an operation example of each embodiment.
Figure 36:
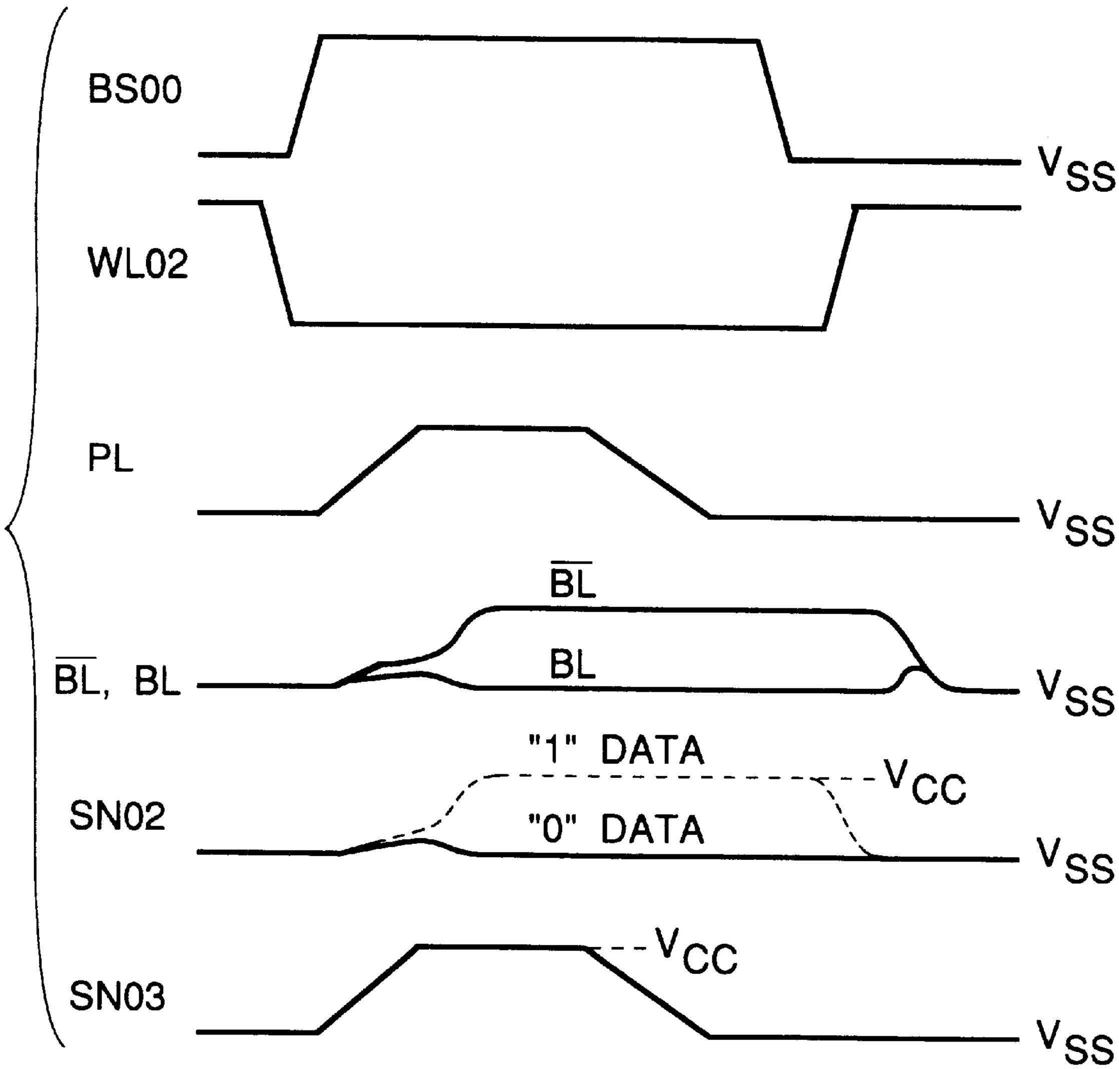
FIG. 36 is a chart showing signal waveform so as to explain an operation example of each embodiment.

The operations of the embodiments shown in FIG. 6A and FIG. 6B, FIG. 27, FIG. 31A to FIG. 31C, FIG. 32, and FIG. 33A and FIG. 33B will be described below with reference to FIG. 34, FIG. 35, and FIG. 36. The signal names are based on the case wherein the cell constituted by the cell transistor Q5 and the ferroelectric capacitor Cf5 is selected in FIG. 27. FIG. 34 and FIG. 35 show the scheme of fixing the plate electrode at (½)Vcc. The operation shown in FIG. 34 is slightly different from that shown in FIG. 35 at the latter half part. FIG. 36 shows the scheme of changing the plate electrode potential from 0V to Vcc.

In FIG. 34, the bit lines $\overline{BL}$ and BL are precharged to Vss. The word line WL02 is set at "L" to turn off the cell transistor Q5. The block selection line BS00 is set at "H" to connect the cell and the bit line. A potential difference of (½)Vcc is generated between the bit line BL and the plate electrode PL, and cell charges are read out. The potentials of the bit lines $\overline{BL}$ and BL are amplified to Vss and Vcc by the sense amplifier, respectively. The data is rewritten in the cell. At this time, while keeping the bit lines $\overline{BL}$ and BL at Vss and Vcc, respectively, the block selection line BS00 is closed (set at "L"), and the potential of the word line WL02 is raised (set at "H") to turn on the cell transistor Q5. Upon turning on the cell transistor Q5, the potential difference between the two terminals of the ferroelectric capacitor Cf5 automatically becomes 0V, and writing is ended.

After the block selection line BS00 is closed, simultaneously the bit lines $\overline{BL}$ and BL are short-circuited and set at (½)Vcc. Then, the bit lines $\overline{BL}$ and BL are set at 0V to prepare the next active operation. As a modification of this operation, instead of short-circuiting the bit lines $\overline{BL}$ and BL, the bit lines may be directly set at 0V. Alternatively, the bit lines may be short-circuited and simultaneously set at 0V.

The example shown in FIG. 35 is partially different from that shown in FIG. 34. More specifically, after the bit lines $\overline{BL}$ and BL are short-circuited, the block selection line BS00 is closed, and the word line WL02 is set at "H" to turn on the cell transistor Q5. In FIG. 34, the word line WL02 is set at "H" to short-circuit the two terminals of the ferroelectric capacitor Cf5. In FIG. 35, however, when the bit lines $\overline{BL}$ and BL are short-circuited, both the plate electrode PL and the bit lines $\overline{BL}$ and BL are set at (½)Vcc to cancel the potential difference between the two terminals of the ferroelectric capacitor Cf5. In this case, the block selection line BS00 may be set at "L" first, or the word line WL02 may be set at "H" first. Thereafter, the potentials of the bit lines $\overline{BL}$ and BL are lowered to Vss.

FIG. 36 shows a modification of the scheme of changing the plate electrode potential. After the bit lines $\overline{BL}$ and BL are precharged to 0V, the word line WL02 is set at "L", and the block selection line BS00 is set at "H". At this time, since BL=PL=0V, no data is read out. Next, the plate electrode potential is raised from 0V to Vcc, data "1" is polarization-inverted from the point B to the point C in FIG. 2B, so that a potential difference is generated in reading the data "1" and "0".

When the sense amplifier operates to set the bit line at 0V, the data "0" returns to the point C, and the data "1" moves to the point D. When the plate electrode potential is lowered to 0V, the data "0" moves to the point D, and the data "1" returns to the point A. Thereafter, when block selection line BS00 is set at "L", and the word line WL02 is set at "H", the data "0" stays at the point D, and the data "1" moves to the point B, so the state before reading is restored. Thereafter, the bit lines $\overline{BL}$ and BL are short-circuited and then returned to Vss.

FIG. 37 and FIG. 38 summarize the major effects of the present invention. In FIG. 37, the conventional cell with a size of $8F^2$, the stacked-type transistor with a cell size of $4F^2$, the NAND cell, and the present invention are compared. According to the present invention, the cell size is small, like other cells with a size of $4F^2$, and the bit line capacity can be decreased, so that a lot of cells can be connected to a bit line. Since this allows to reduce the number of sense amplifiers, the chip size is minimized.

In addition, the structure can be easily realized by a planar transistor, and random access is enabled. Conventionally, these advantages cannot be simultaneously obtained. Furthermore, a folded bit line structure can be realized, and noise can be reduced. It is needless to say that a nonvolatile cell can be realized.

As for noise, when two bit line layers are formed, a folded bit line structure can be realized in the conventional stacked-type transistor with a cell size of $4F^2$, as has been proposed by the present inventors. However, this increases the cost.

When a folded bit line structure is to be realized in the NAND cell, a block selection line may be added, as has already been proposed by the present inventors. In this case, however, the folded bit line structure does not allow perfect random access, unlike the present invention. The reason for this is as follows. Even when a block selection line is added to prevent cell data on the reference side from being read out to the bit line BL, the data on the source side of the selection gate transistor of the block selection line has already been read out because of the NAND cell connection. As a result, unless this data is read out in the next access, the data is destroyed.

In FIG. 38, the conventional FRAM is compared with the present invention. As described above, in the present invention, a high-speed operation can be realized, and simultaneously, the refresh operation can be omitted for the scheme of fixing the plate electrode at (½)Vcc. The conventional FRAM cannot realize these effects simultaneously. More specifically, in the scheme of changing the plate electrode potential within the range of 0V and Vcc, the refresh operation can be omitted. However, the scheme of fixing the plate electrode at (½)Vcc absolutely requires the refresh operation.

23rd Embodiment

Figure 39A:
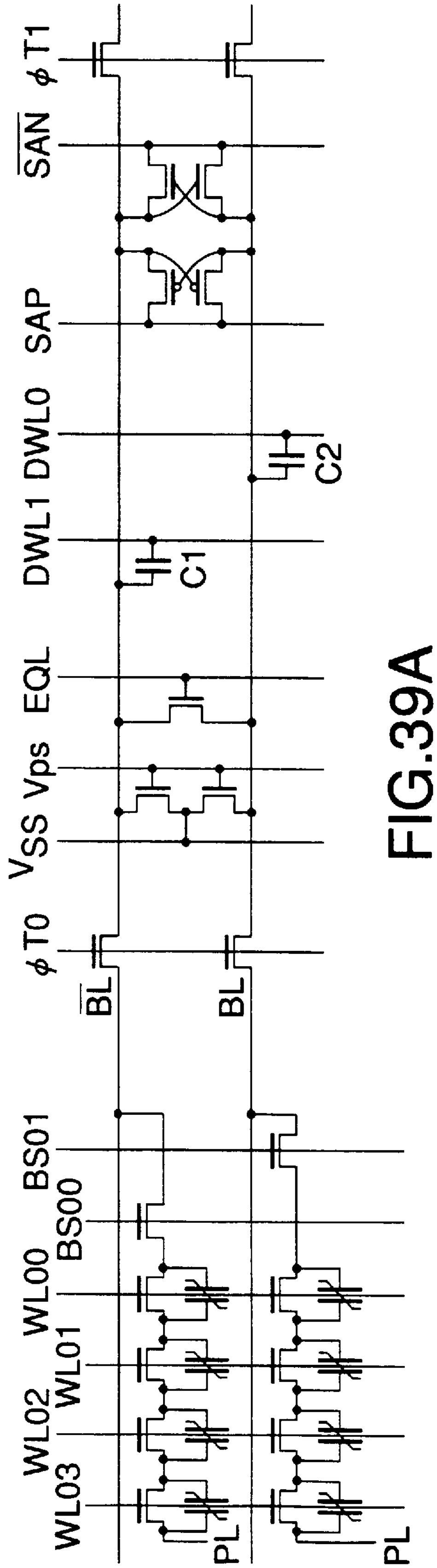
FIG. 39A and FIG. 39B are circuit diagrams showing the structure of a sense amplifier portion so as to explain an FRAM according to the 23rd embodiment.
Figure 39B:
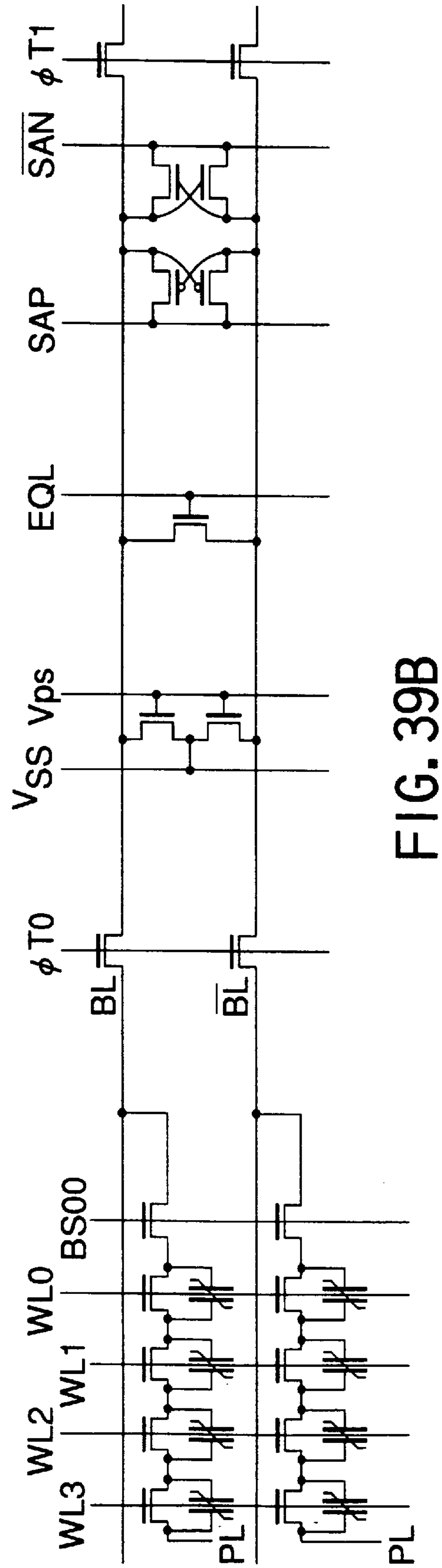

FIG. 39A and FIG. 39B are circuit diagrams for explaining an FRAM according to the 23rd embodiment of the present invention and, more particularly, showing a sense amplifier circuit using a dummy cell structure. Note that the D-type select transistor shown in FIG. 27 is regarded as short-circuited because it is always ON, and omitted in these circuit diagrams.

Figure 40:
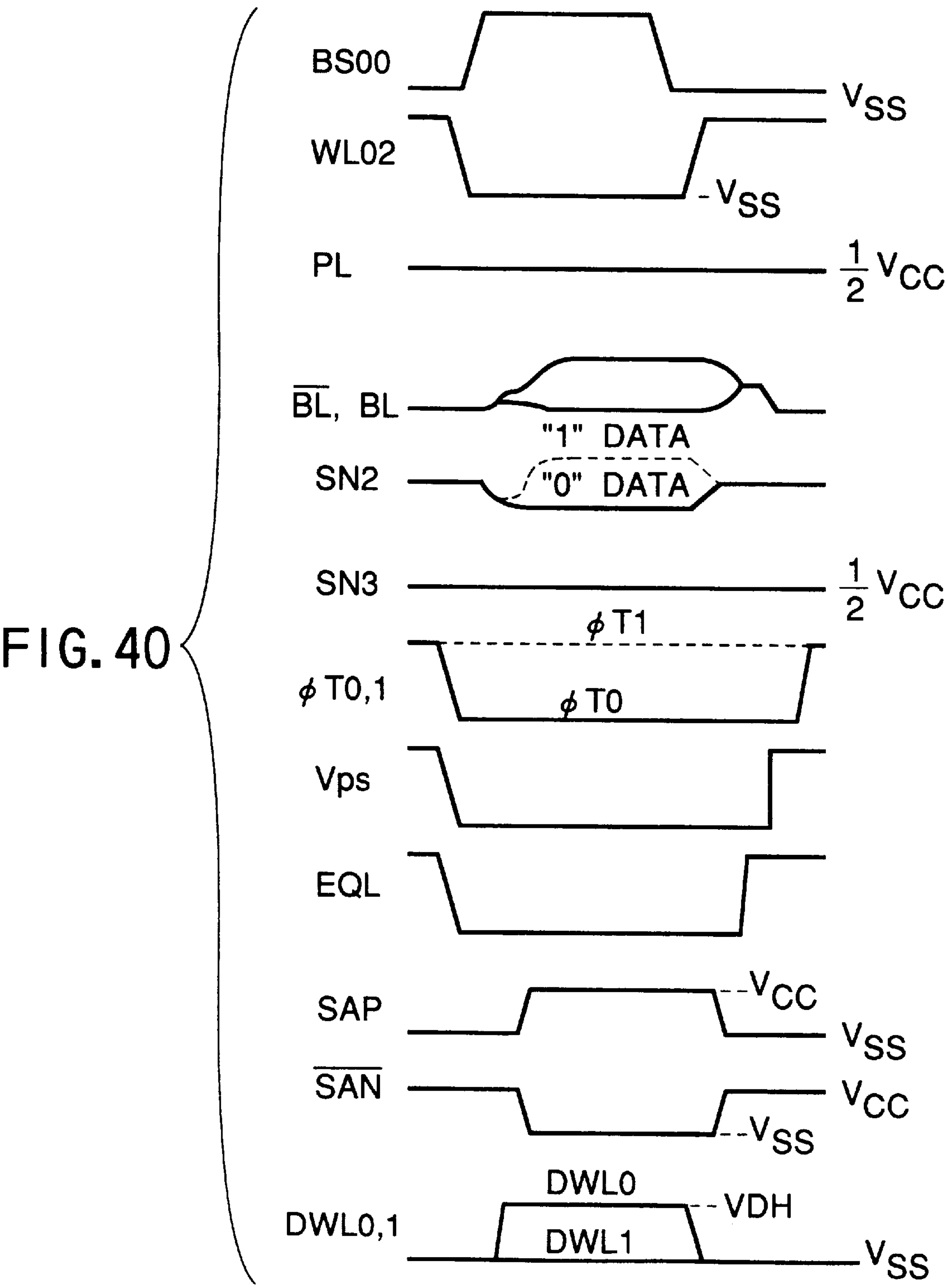
FIG. 40 is a chart showing signal waveforms so as to explain the operation of the 23rd embodiment.

FIG. 39A shows a coupling dummy cell structure. FIG. 40 shows the operation of this cell structure. In FIG. 40, the operation of the scheme of fixing the plate electrode at (½)Vcc shown in FIG. 34 is explained in more detail.

In the stand-by state, a signal VPS is kept at "H", and a bit line is set at Vss. In the active state, the signal VPS is set at "L", a signal EQL is set at "L", and the bit line is set at 0V in the floating state. Only a signal ϕt1 is set at "L" to select the cell array on the left side of the sense amplifier. Thereafter, a word line WL02 is set at "L", and a block selection line BS00 is set at "H" to read out cell data to the bit line. On the reference bit line side, a dummy word line DWL0 may be set at "H" to read out data on the side of a bit line BL by a coupling capacitor C2, so that the potential on the side of the bit line BL is raised by an equal potential at which charges corresponding to a saturation polarization Ps are read out. This can be realized by adjusting the amplitude amount (VDH) of the dummy word line DWL0 and the capacity of the coupling capacitor C2.

Thereafter, an NMOS sense amplifier driving line $\overline{SAN}$ is set at "L", and a PMOS sense amplifier driving line SAP is set at "H" to operate the sense amplifier. The bit lines are set at Vss and Vcc, respectively, and cell data rewriting is ended. Thereafter, the block selection line BS00 is set at "L", and the word line WL02 is set at "H". Next, the signal EQL is set at "H" to short-circuit the bit lines $\overline{BL}$ and BL. When the signal VPS is set at "H", the bit lines $\overline{BL}$ and BL are set at 0V. this embodiment can also be applied to the scheme of changing the PL voltage 0V to Vcc.

FIG. 39B shows a case wherein 1-bit data is stored in two cells having the structure shown in FIG. 6A and FIG. 6B. In this case, no dummy cells are required.

24th Embodiment

Figure 41A:
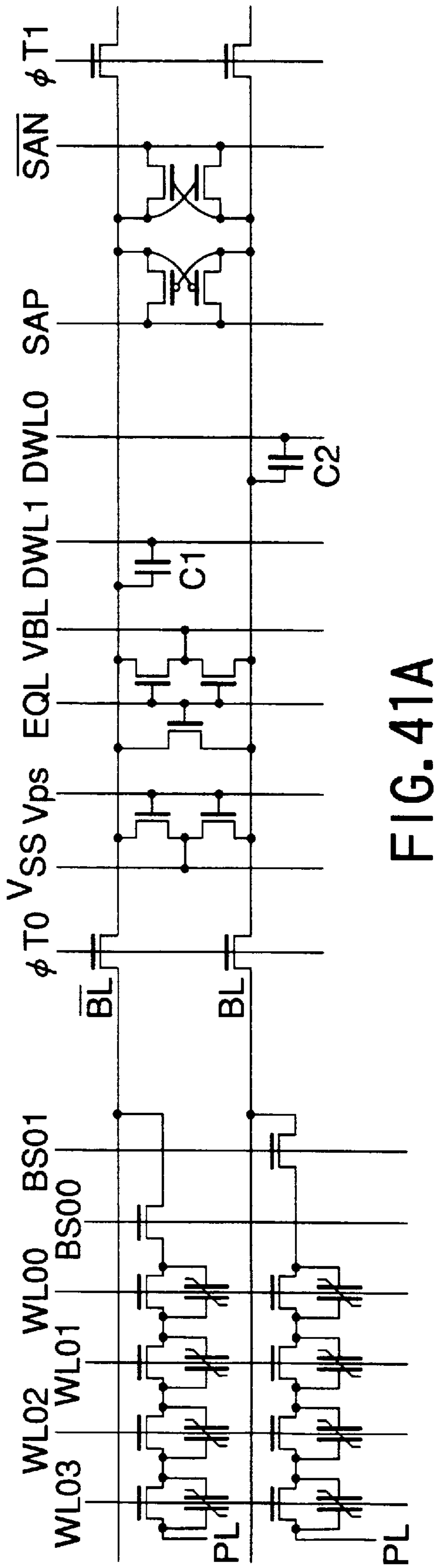
FIG. 41A and FIG. 41B are circuit diagrams showing the structure of a sense amplifier portion so as to explain an FRAM according to the 24th embodiment.
Figure 41B:
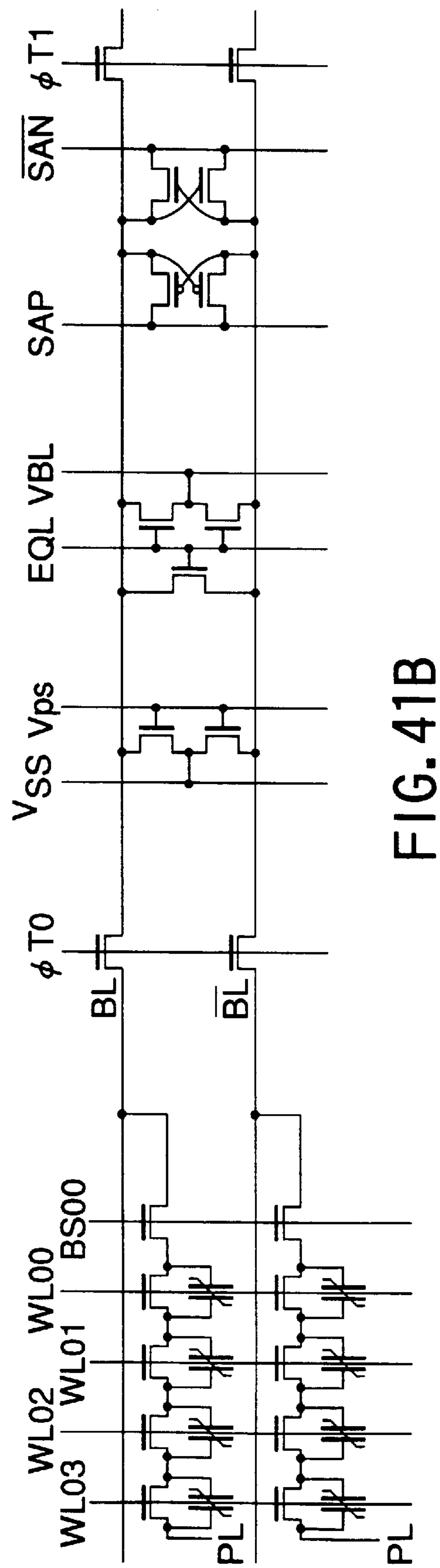

FIG. 41A and FIG. 41B are circuit diagrams for explaining an FRAM according to the 24th embodiment of the present invention and, more particularly, showing a sense amplifier circuit using a dummy cell structure. Note that the D-type select transistor shown in FIG. 27 is regarded as short-circuited because it is always ON, and omitted in these circuit diagrams.

FIG. 41A is partially different from FIG. 39A. More specifically, when bit lines $\overline{BL}$ and BL are to be equalized to (½)Vcc, a VBL potential (=(½)Vcc) is set in setting a signal EQL at "H", thereby more properly fixing the potential. With this arrangement, when the bit lines $\overline{BL}$ and BL are equalized to set the two terminals of a ferroelectric capacitor Cf5 at an equipotential, and the plate electrode potential shifts from the potential of the bit lines $\overline{BL}$ and BL because of, e.g., a leakage current, as in the operation shown in FIG. 35, the accumulated charge loss can be prevented.

Figure 42:
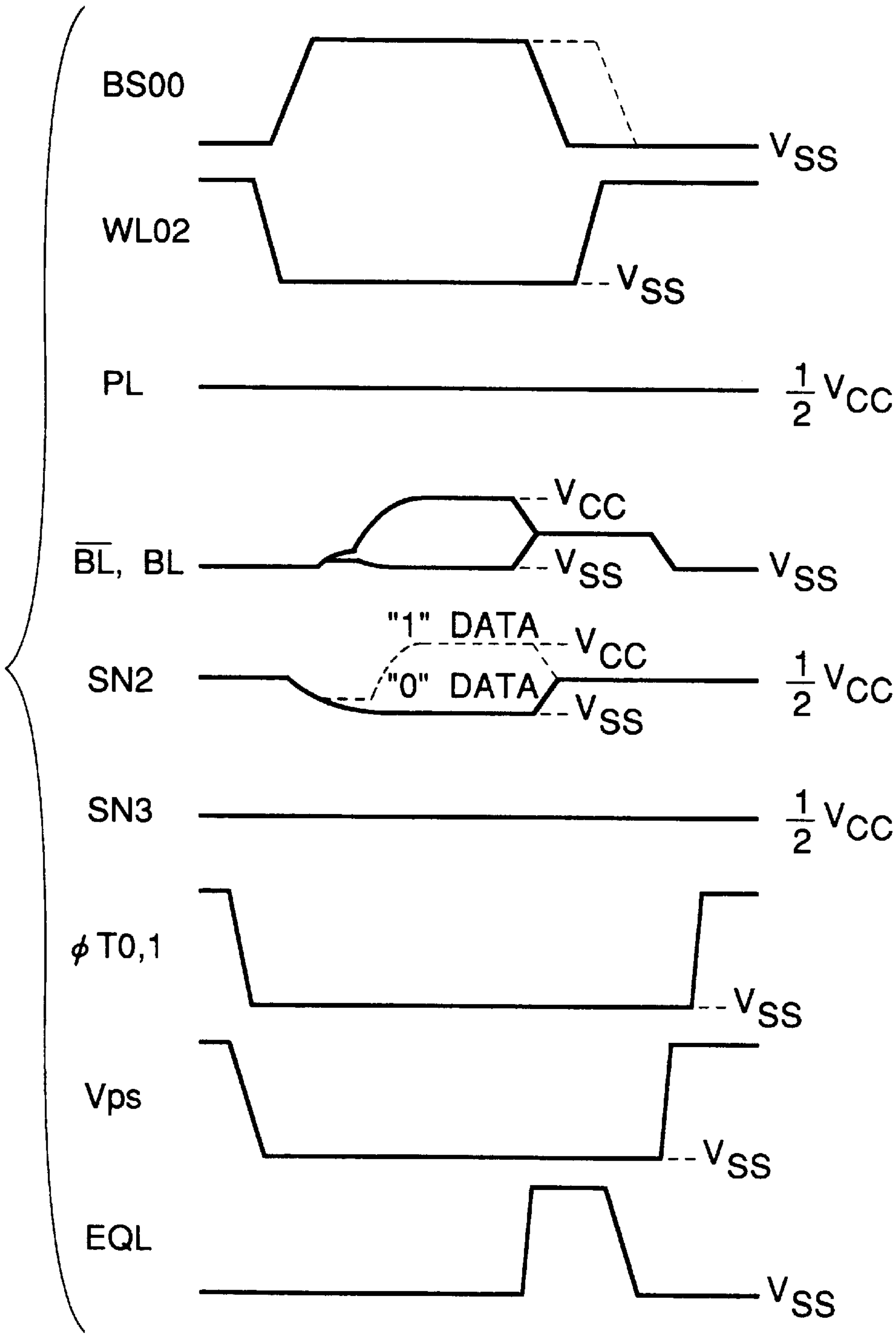
FIG. 42 is a chart showing signal waveforms so as to explain the operation of the 24th embodiment.

FIG. 42 shows the detailed operation in this case. The signal EQL is set at "H" to short-circuit the bit lines $\overline{BL}$ and BL. A block selection line BS00 is set at "L", and a word line WL02 is set at "H". Before the signal VPS is set at "H", the signal EQL is set at "L". The reason why the signal EQL is set at "L" is that the short-circuit between VBL and Vss is prevented.

FIG. 41B shows an example in which a VBL circuit is added to the structure shown in FIG. 39B.

25th Embodiment

Figure 43A:
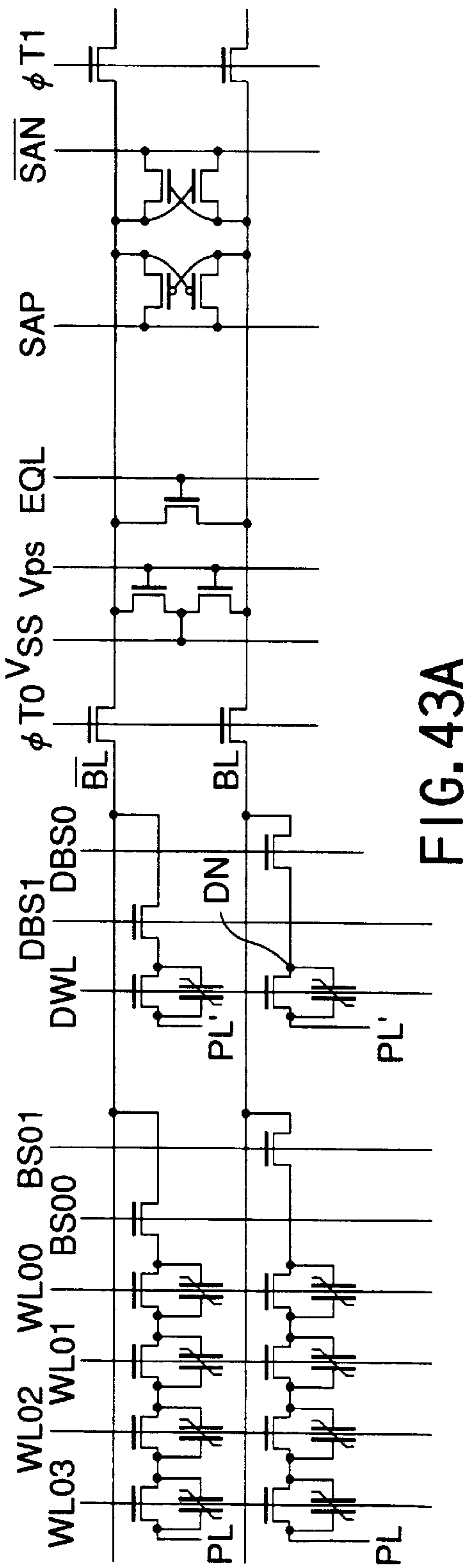
FIG. 43A and FIG. 43B are circuit diagrams showing the structure of a sense amplifier portion so as to explain an FRAM according to the 25th embodiment.
Figure 43B:
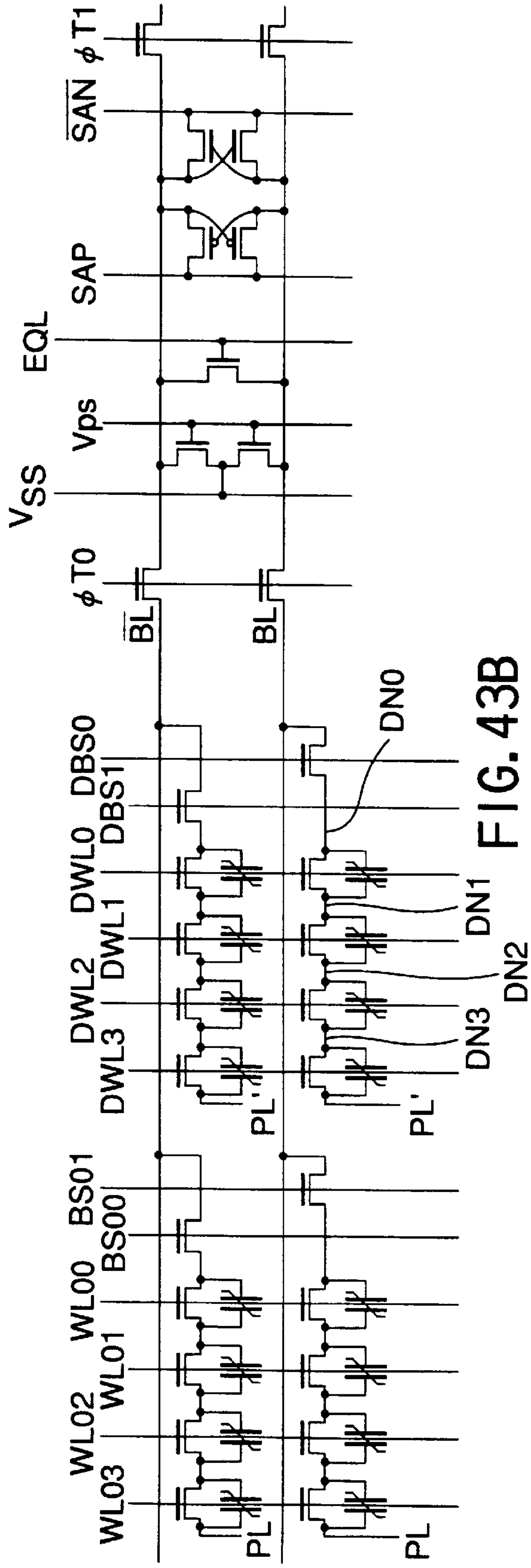

FIG. 43A and FIG. 43B are circuit diagrams for explaining an FRAM according to the 25th embodiment of the present invention and, more particularly, showing a sense amplifier circuit using a dummy cell structure. Note that the D-type select transistor shown in FIG. 27 is regarded as short-circuited because it is always ON, and omitted in these circuit diagrams.

Figure 44:
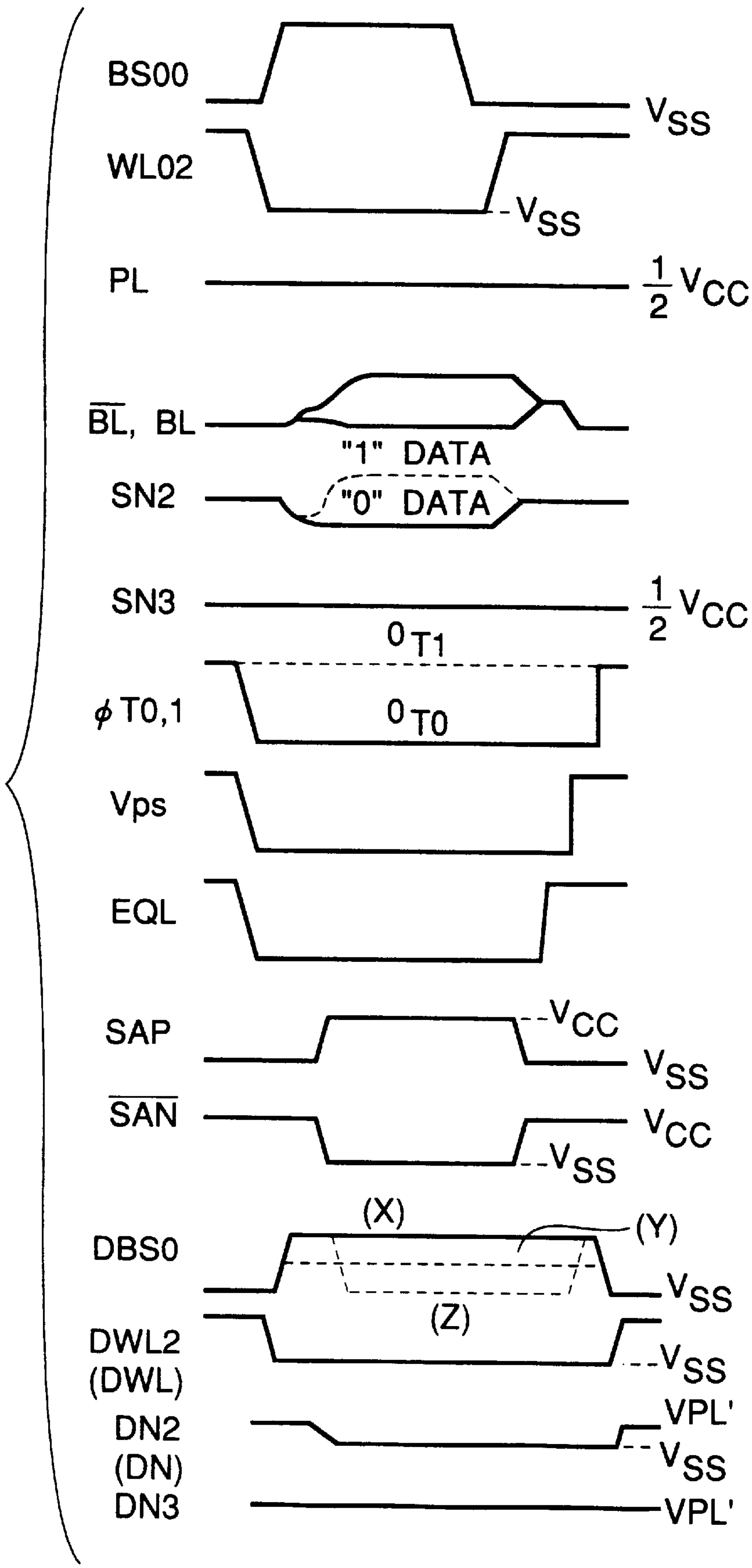
FIG. 44 is a chart showing signal waveforms so as to explain the operation of the 25th embodiment.

FIG. 43A is different from FIG. 39A only in the dummy cell structure. In FIG. 43A, the dummy cell is constituted by a ferroelectric capacitor. FIG. 44 shows the operation of this embodiment. FIG. 44 is different from FIG. 40 only in the operation of the dummy cell.

The dummy cell structure shown in FIG. 43A is equivalent to a structure in which the number of series connected cells in the memory cell having the folded bit line structure shown in FIG. 27 is 1. The dummy cell can perform various operations. For (X) of a block selection line DBS0 for dummy cell in FIG. 44, data is located at the point D in FIG. 2B in the stand-by state. In FIG. 44, a word line WL02 is set at "L", and a block selection line BS00 is set at "H" to read out cell data to a bit line $\overline{BL}$. At the same time, a dummy word line DWL is set at "L", and the block selection line DBS0 for dummy cell is set at "H" to read out dummy cell data to a bit line BL. Thereafter, the sense amplifier operation and rewriting are performed. The block selection line BS00 is closed, and the word line WL02 is set at "H" to restore the original state, and then, the bit lines $\overline{BL}$ and BL are short-circuited to lower the potential of the bit line $\overline{BL}$ to BLVss. At this time, a cell node DN for dummy cell is set at 0V almost at the point C in FIG. 2B. Thereafter, the selection bit line DBS0 for dummy cell is set at "L", and the dummy work line DWL is set at "H" to return the data to the original point D. the PL of the normal memory cell may be used by fixing the PL' of the dummy cell in a 0V to Vcc driving because of needless of polarization inversion.

In this embodiment, charges corresponding to Ps'−Pr' are read out, like data "0". The capacity of the ferroelectric capacitor may be increased to (Ps of cell)=(Ps'−Pr') of dummy cell. Alternatively, the potential of a dummy cell PL' may be adjusted to be relatively higher than (½)Vcc. In this embodiment, when the data "0" has been written in the cell, data on the dummy cell side is "1". Since the data "1" temporarily moves to the point A, then to the point C, and returns to the point D, polarization inversion occurs.

The dummy cell operates every time a cell in the cell array is selected. Therefore, the number of times of polarization inversion increases to result in a conspicuous fatigue. To avoid this problem, the "H"-side voltage of the block selection line DBS0 for dummy cell in FIG. 44 is lowered, as represented by (Y). In this case, even when the bit line BL on the dummy cell side is set at Vcc in reading out the cell data "0", the cell node DN for dummy cell is set at a potential corresponding to (DBS0 voltage-Vt). When the signal PL' is designed to satisfy a condition DBS0 voltage-Vt≦PL', no polarization inversion occurs, and the fatigue can be minimized. Even when the DBS0 potential is changed as represented by (X), PL'=Vcc. Alternatively, the DBS0 potential is raised to almost that level, no polarization inversion occurs, and the fatigue is minimized. Alternatively, the DBS0 potential is temporarily lowered, as represented by (Z), after the dummy cell data is read out. When the bit lines $\overline{BL}$ and BL are set at 0V, the block selection line DBS0 for dummy cell is set at "H" or "L". At this time, the data moves from the point D to the point C without polarization inversion. Thereafter, when the dummy word line DWL is set at "H", the data returns to the point D.

When a dummy cell is formed in the conventionally cell structure in which one cell transistor and one ferroelectric capacitor are connected in series, the cell node for dummy cell is floating. For this reason, the potential may change due to a leakage current or the like, resulting in a change in read potential of the dummy cell. To avoid this problem, the conventional dummy cell circuit has a complex circuit structure different from a normal cell, in which, for example, the data is temporarily moved to the point D and returned to the point C. In this embodiment, the same cell structure or circuit structure as that of the normal cell can be used.

FIG. 43B is a circuit diagram showing a circuit structure for solving the problem of FIG. 43A. In FIG. 43A, the bit line capacity slightly changes depending on whether the selected memory cell in the memory block is close to or far from the bit line. This change decreases the margin for the sense amplifier operation although the change amount is small.

The structure shown in FIG. 43B solves this problem. More specifically, when a dummy cell block having the same structure as that of a normal cell portion is formed, as in FIG. 43B, and a dummy cell in a dummy cell block at a position corresponding to the selected memory cell in the memory block is selected, the unbalance in capacity between the bit line pair can be solved. The operation is the same as that of the structure shown in FIG. 43A except that the dummy word line to be selected is different. Various modifications of the operation are also the same as those described above.

Figure 45A:
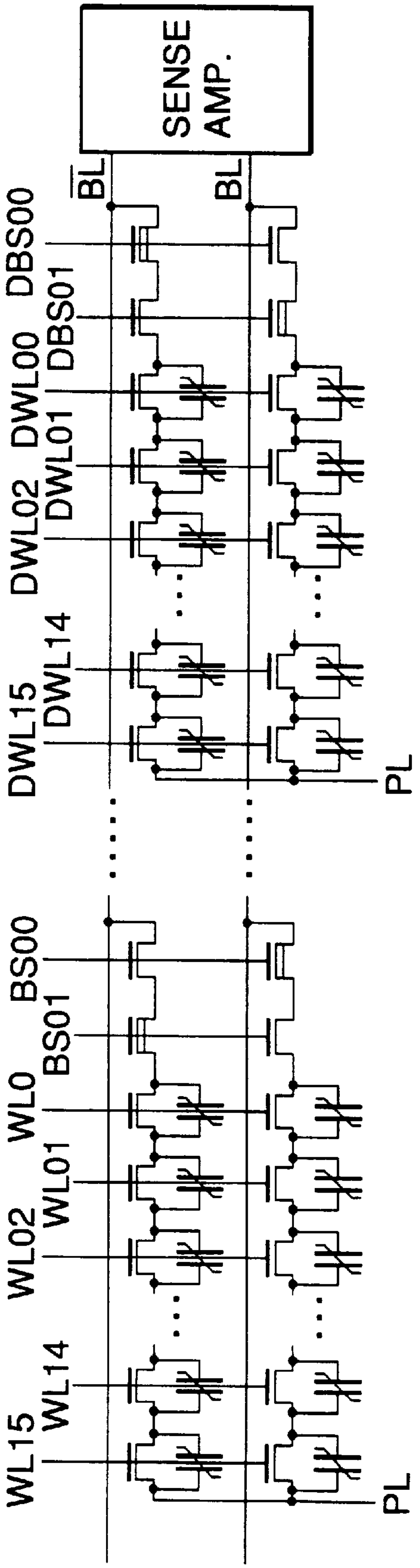
FIG. 45A and FIG. 45B are views showing another structure of a dummy cell block shown in FIG. 43A and FIG. 43B.
Figure 45B:
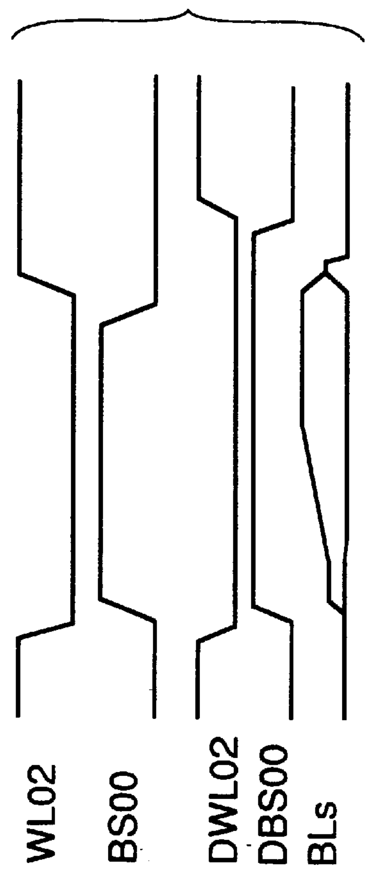

The select transistor of the dummy cell block shown in FIG. 43A or 42B may be actually omitted, as shown in FIG. 30A to FIG. 30D, although the D-type transistor which is always ON is not illustrated, as is apparent from the description of FIG. 40. As shown in FIG. 45A, the D-type transistor may be actually used.

Figure 46:
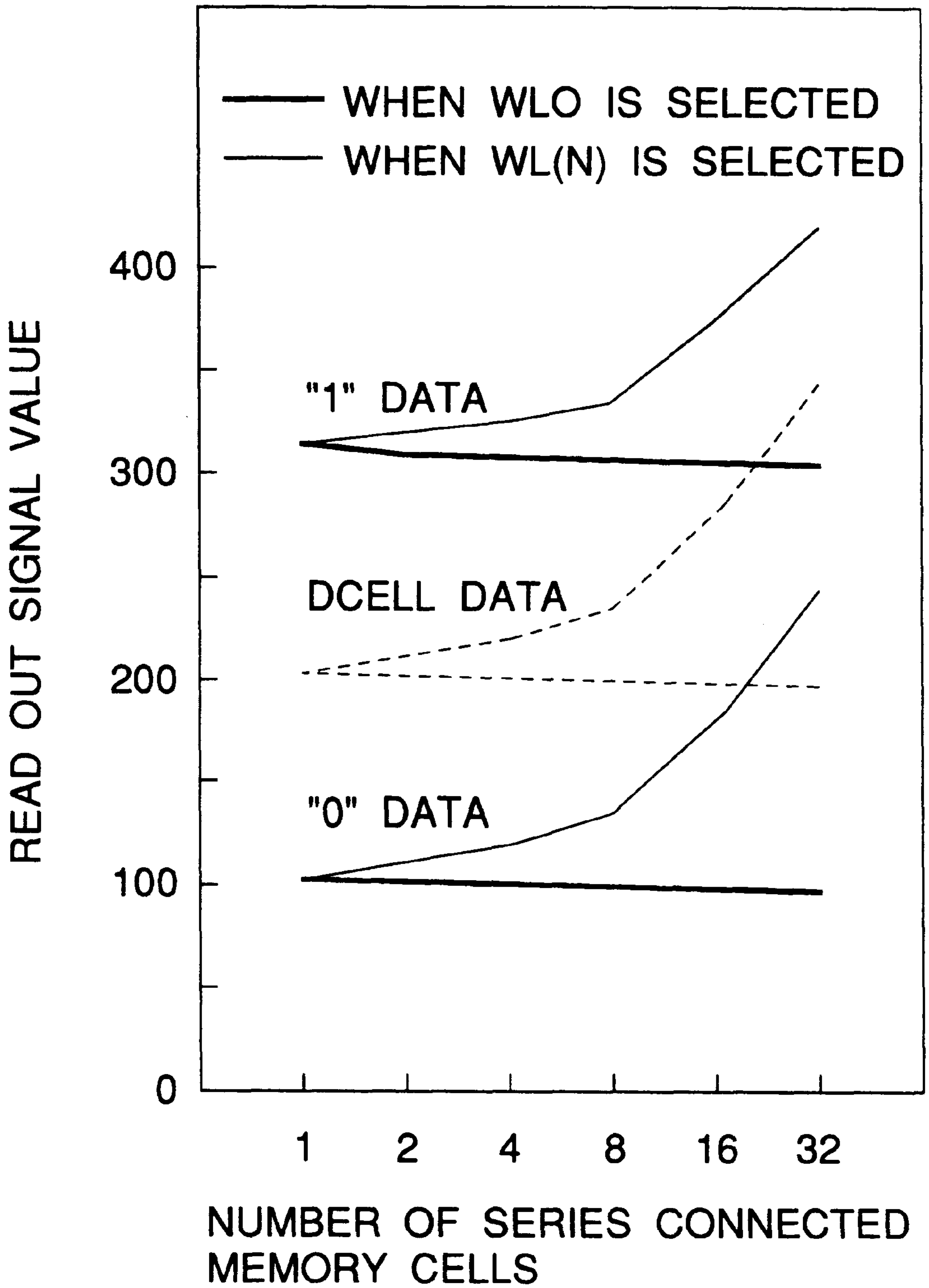
FIG. 46 is a graph showing the relationship between the number of series connected cells and a readout signal value in the 25th embodiment.

Another reason why the dummy cells are also connected in series is shown in FIG. 46. FIG. 46 shows bit line potentials with respect to the number (N) of series connected cells after the actual cell data "1" and "0" are read out to the bit line. A case wherein a word line WL0 closest to the bit line contact is selected and a case wherein the farthest word line WL(N) is selected are shown as parameters.

For the farthest cell, the signal difference between the data "1" and the data "0" becomes slightly smaller than that for the closest cell by the an amount corresponding to the parasitic capacity such as the gate channel capacity in the series-connected cell. The most serious problem is that, when the farthest cell is selected, the readout values of both the data "1" and data "0" are shifted to the Vdd side. This is because the potential of the node in the series-connected cell, which has been (½)Vdd in the stand-by state, lowers to Vss after reading, and the readout value shifts to the Vdd side due to coupling of the parasitic capacity in the series-connected cell. This problem becomes more conspicuous as the number of series connected cells increases.

When the dummy cells are also connected in series, as shown in FIG. 43B or 44A, and a series-connected dummy cell at a position corresponding to the normal cell is selected, the dummy cell (Dcell in FIG. 46) side is similarly influenced, so that the problem of shift disappears when viewed from the sense amplifier. When the dummy cell is constituted using a paraelectric capacitor, a plurality of types of coupling capacitors may be prepared in the sense amplifier, as shown in FIG. 39A, or the amplitude voltage of the dummy word line DWL0 or DWL1 in FIG. 39A may be changed in correspondence with the position of the selected memory cell in the series connection. The problem of the shift to the Vdd side is not occurred in the 0V to Vdd PL driving scheme. The reason is why these nodes are pre-charged to 0V.

26th Embodiment

Figure 47A:
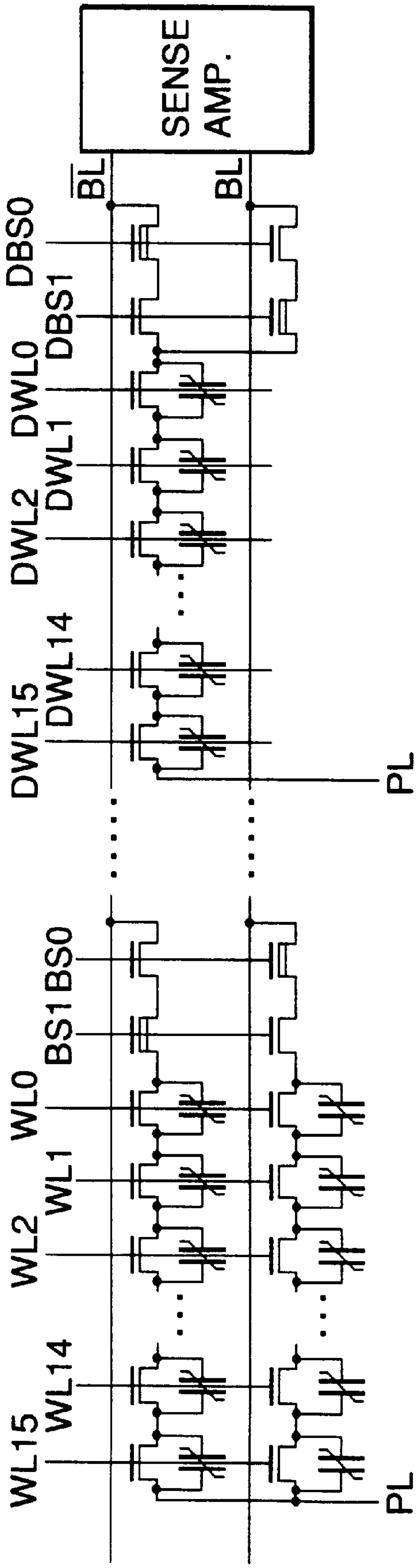
FIG. 47A and FIG. 47B are a circuit diagram and a timing chart, respectively, showing a cell array equivalent circuit including a dummy cell according to the 26th embodiment.
Figure 47B:
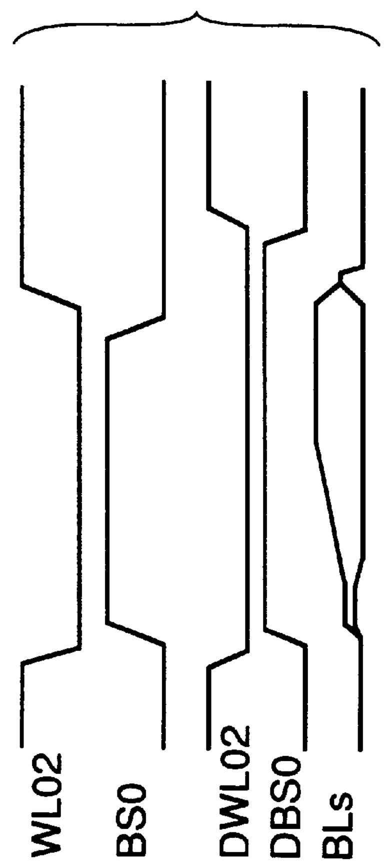

FIG. 47A is a circuit diagram showing a cell array equivalent circuit including dummy cells according to the 26th embodiment of the present invention. FIG. 47B is a chart showing signal waveforms of the operation of the 26th embodiment.

Referring to FIG. 47A, the dummy cells of a bit line pair ($\overline{BL}$ and BL) are shared. When a word line WL2 and a block selection line BS0 are selected to read out cell data to the bit line $\overline{BL}$ side, a block selection line DBS0 for dummy cell and a dummy word line DWL2 are selected to read out the ferroelectric capacitor information of the dummy cell connected to the dummy word line DWL2 is read out to the bit line BL side.

When the word line WL2 and a block selection line BS1 are selected to read out cell data to the bit line BL side, a block selection line DBS1 for dummy cell and the dummy word line DWL2 are selected to read out the ferroelectric capacitor information of the dummy cell connected to the dummy word line DWL2 to the bit line $\overline{BL}$ side.

In reading shown in FIG. 47B, data "0" is always read out from the dummy cell, as shown in FIG. 43B. Accordingly, the ferroelectric capacity of the dummy cell must be 1.5 to 3 times that of a normal cell (the optimum value is about twice) such that an intermediate value Ps between data "1" (=Pr+Ps) and the data "0" (=Ps−Pr) almost equals (Ps'−Pr') of the dummy cell. In the structure shown in FIG. 43B, the word line interval must be increased (extended along the bit line) to increase the ferroelectric capacitor area of the dummy cell. However, when the circuit shown in FIG. 47A is used, the interval between the cells along the word line becomes large because the dummy cell is shared, so that the ferroelectric capacitor area can be increased without increasing the word line interval.

Figure 48A:
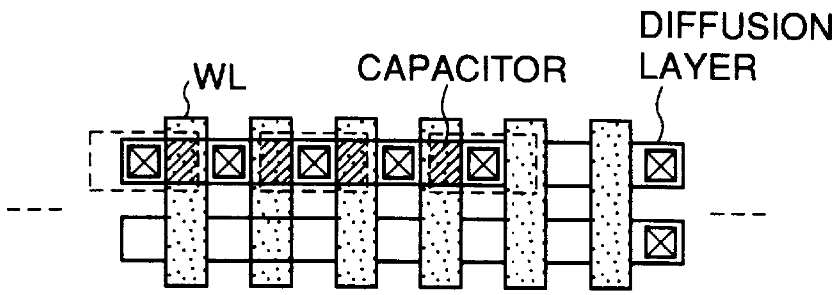
FIG. 48A to FIG. 48D are views showing layout examples for realizing the equivalent circuit shown in FIG. 47A and FIG. 47B.
Figure 48B:
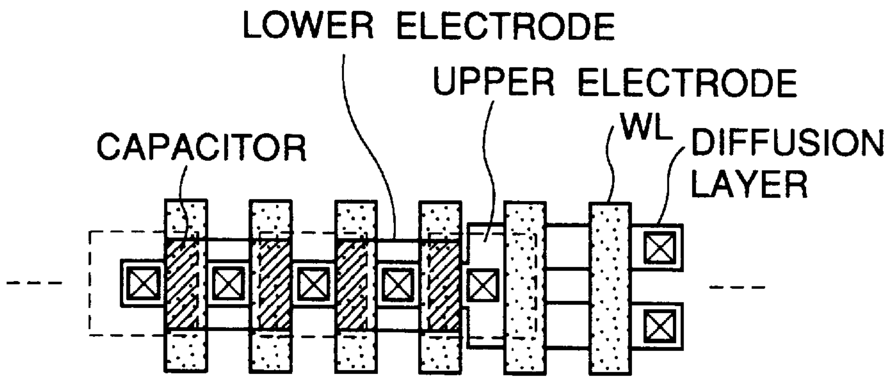
Figure 48C:
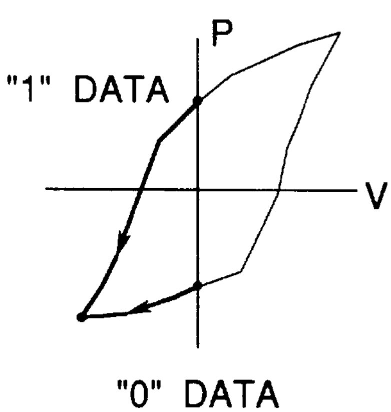
Figure 48D:
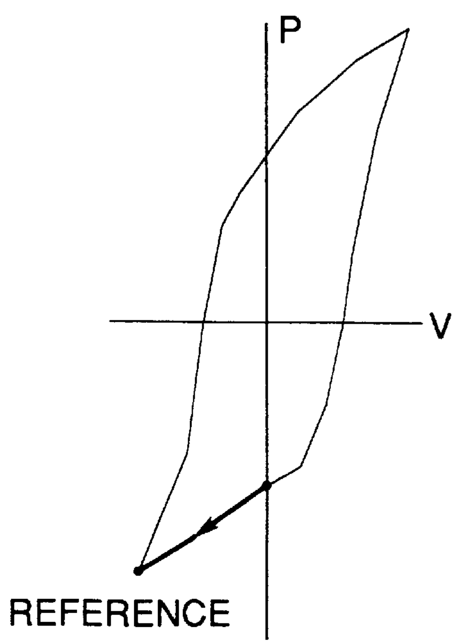

FIG. 48A to FIG. 48D are views showing examples of layouts for realizing the equivalent circuit shown in FIG. 47A. FIG. 48A shows a normal cell layout. FIG. 48B shows a dummy cell layout. For the dummy cells, when the element isolation region between the cells has a minimum size F, the ferroelectric capacitor area can be increased to $3F^2$ while keeping the word line interval at F, although the ferroelectric capacitor of the normal cell is $F^2$, as is apparent from FIG. 48A and FIG. 48B. For this reason, the ferroelectric capacitor area of the dummy cell can be set at an arbitrary value of $F^2$ to $3F^2$. As shown in FIG. 48C and FIG. 48D, the read charge amount on the reference side can be set at the intermediate value between the data "1" and data "0" of the normal cell. The readout potential of the dummy cell can be adjusted by both of the capacitor area and an area of the PL of the dummy cell.

When the cell transistor size of the dummy cell is set to be the same as that of the normal cell while increasing the ferroelectric capacitor area, as shown in FIG. 38B, the inverted capacity of the cell transistor channel of the dummy cell can be equalized to that of the cell transistor of the normal cell. The shift amount of the dummy cell portion can be almost equalized to that of the normal cell portion. Therefore, the shift amount is canceled and does not appear in the difference between the read bit line and the reference bit line.

27th Embodiment

Figure 49:
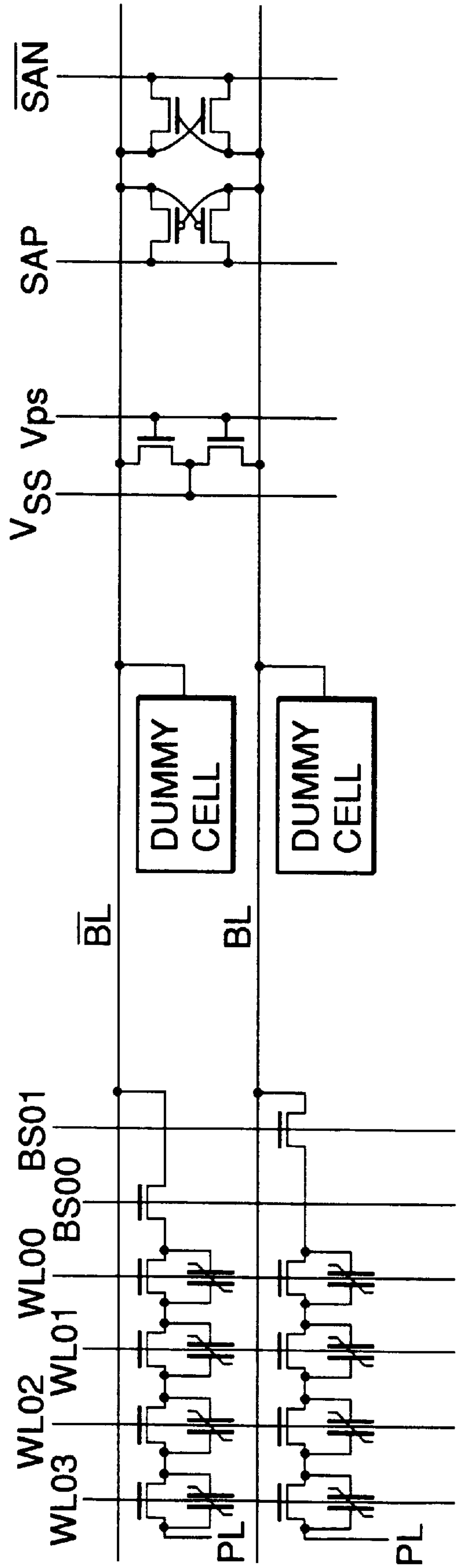
FIG. 49 is a circuit diagram showing the structure of a sense amplifier portion so as to explain an FRAM according to the 27th embodiment.

FIG. 49 is a circuit diagram for explaining an FRAM according to the 27th embodiment of the present invention and, more particularly, showing a sense amplifier circuit using a dummy cell structure. Note that the D-type select transistor shown in FIG. 27 is regarded as short-circuited because it is always ON, and omitted in this circuit diagram.

In this embodiment, the EQL circuit is removed from the circuit shown in FIG. 39A, 42A, or 42B. This means that a signal VPS is directly set at "H" and lowered to Vss without equalizing bit lines $\overline{BL}$ and BL in, e.g., FIG. 34. With this structure, the sense amplifier area can be reduced.

28th Embodiment

Figure 50:
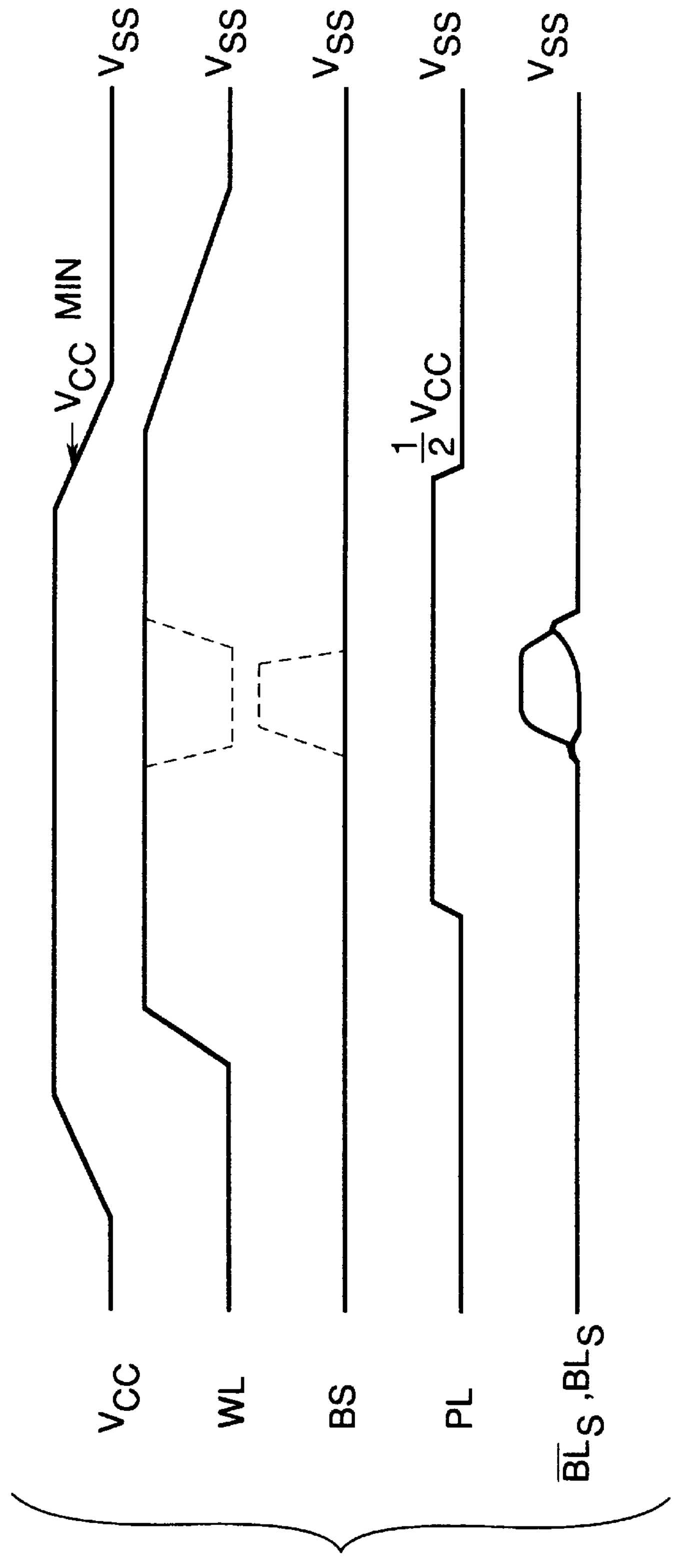
FIG. 50 is a chart showing signal waveforms so as to explain the 28th embodiment.

FIG. 50 is a chart showing signal waveforms so as to explain the 28th embodiment of the present invention. This embodiment presents desired procedures of turning on/off the power supply.

In this embodiment, a power supply Vcc is turned on first. When the power supply Vcc has completely risen, all word lines WL are set at "H" by a power-ON reset circuit. Thereafter, the plate potential is raised from 0V to (½)Vcc. If the order of raising the word line potential and the plate electrode potential is reversed, cell data tends to be destroyed. At this time, a bit line BL and a block selection line BS are kept at 0V. Thereafter, a normal memory operation is performed.

In falling of the power supply, when Vcc becomes lower than Vssmin (the lower limit value of Vcc), the plate electrode PL is set at 0V by a power-OFF reset circuit or a power-OFF signal. If the bit line BL is at 0V, or if the block selection line BS is at 0V, the data is not destroyed even when the word line potential lowers thereafter.

29th Embodiment

Figure 51:
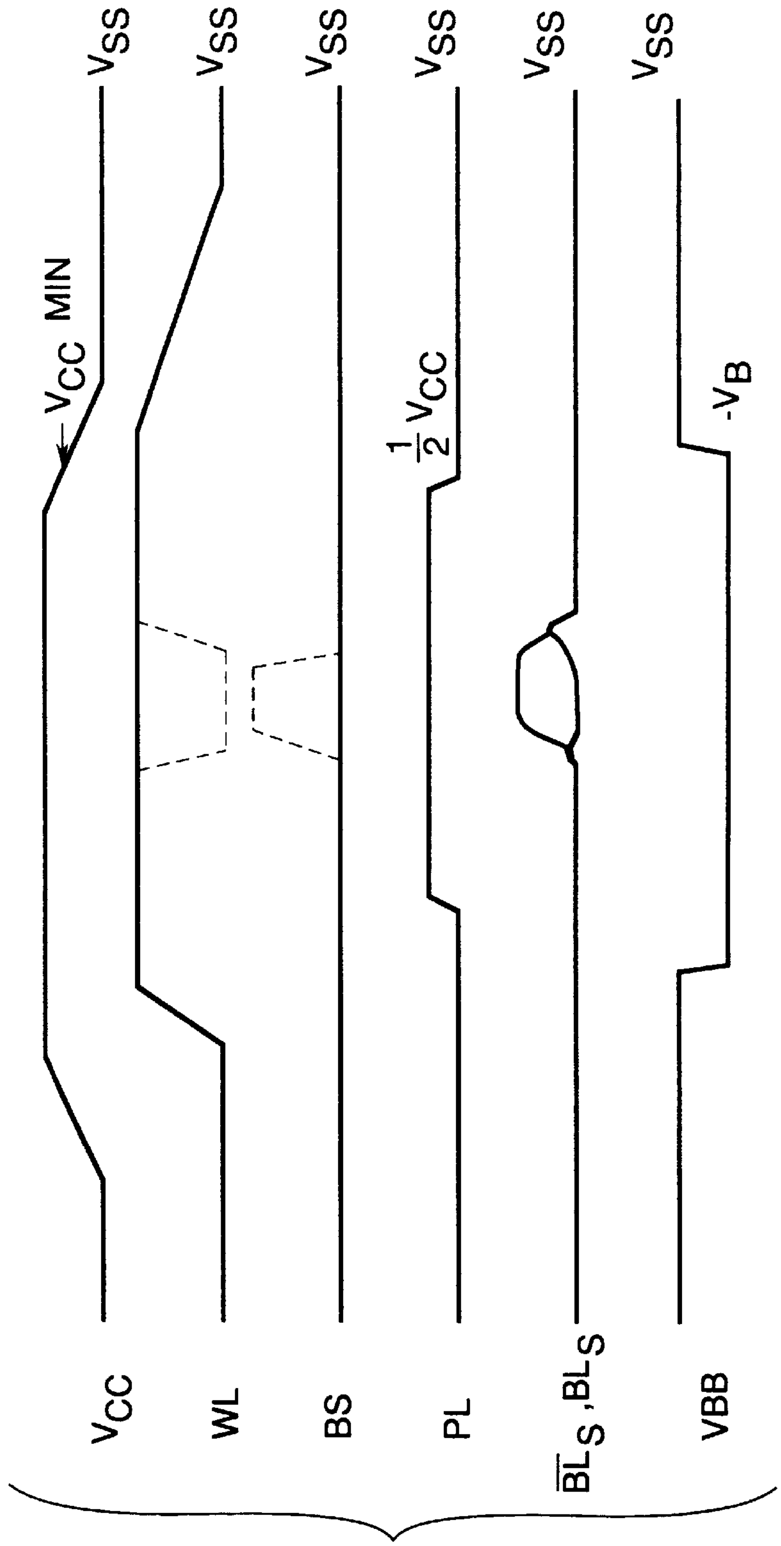
FIG. 51 is a chart showing signal waveforms so as to explain the 29th embodiment.

FIG. 51 is a chart showing signal waveforms so as to explain the 29th embodiment of the present invention. This embodiment presents desired procedures of turning on/off the power supply. More specifically, in addition to FIG. 50, procedures of applying a negative substrate bias voltage VBB to a cell array are presented.

In the conventional FRAM using the scheme of fixing the plate electrode at (½)Vdd, cell data is destroyed, and the plate electrode is set at 0V in the stand-by state. In the plate driving scheme in which the plate electrode potential is changed from 0V to Vdd as well, when a negative substrate bias voltage is applied to the cell array, data "1" is destroyed because the storage node potential lowers to 0V or less in the stand-by state. Therefore, in the conventional FRAM, the substrate bias voltage of the cell array is set at 0V. In this embodiment, however, the substrate bias voltage VBB of the cell array is set to be negative (=−VB) not only in the active state but also in the stand-by state. Since the ferroelectric capacitor is short-circuited by the cell transistor, the data is not destroyed.

Accordingly, the following effects can be expected. (1) Since the region between the diffusion layer and the cell well can be reverse-biased, the bit line capacity can be reduced by decreasing the p-n junction capacity, so that the read signal amount increases. (2) The threshold voltage of the ferroelectric capacitor can match the bias voltage −VB so that the substrate bias effect can be reduced. (3) The element isolation breakdown voltage can increase. The VBB application timing is shown in FIG. 51. When a word line WL is set at "H" at the time of turning on the power supply to short-circuit the ferroelectric capacitor, and then the voltage VBB is lowered, the cell information is not destroyed. At the time of turning off the power supply, when the voltage VBB is returned to 0V before the word line WL is set at "L", no problem is posed.

30th Embodiment

Figure 52:
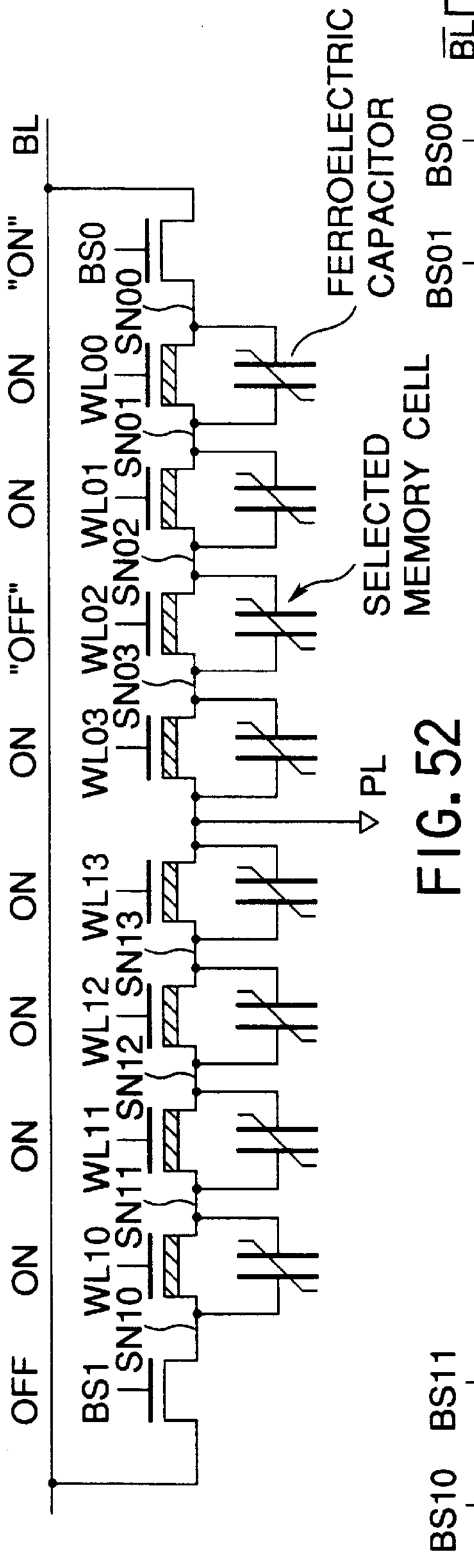
FIG. 52 is an equivalent circuit diagram showing the basic structure of an FRAM according to the 30th embodiment.

FIG. 52 is a circuit diagram showing the basic structure of an FRAM according to the 30th embodiment of the present invention and, more particularly, an equivalent circuit corresponding to eight memory cells.

Figure 54:
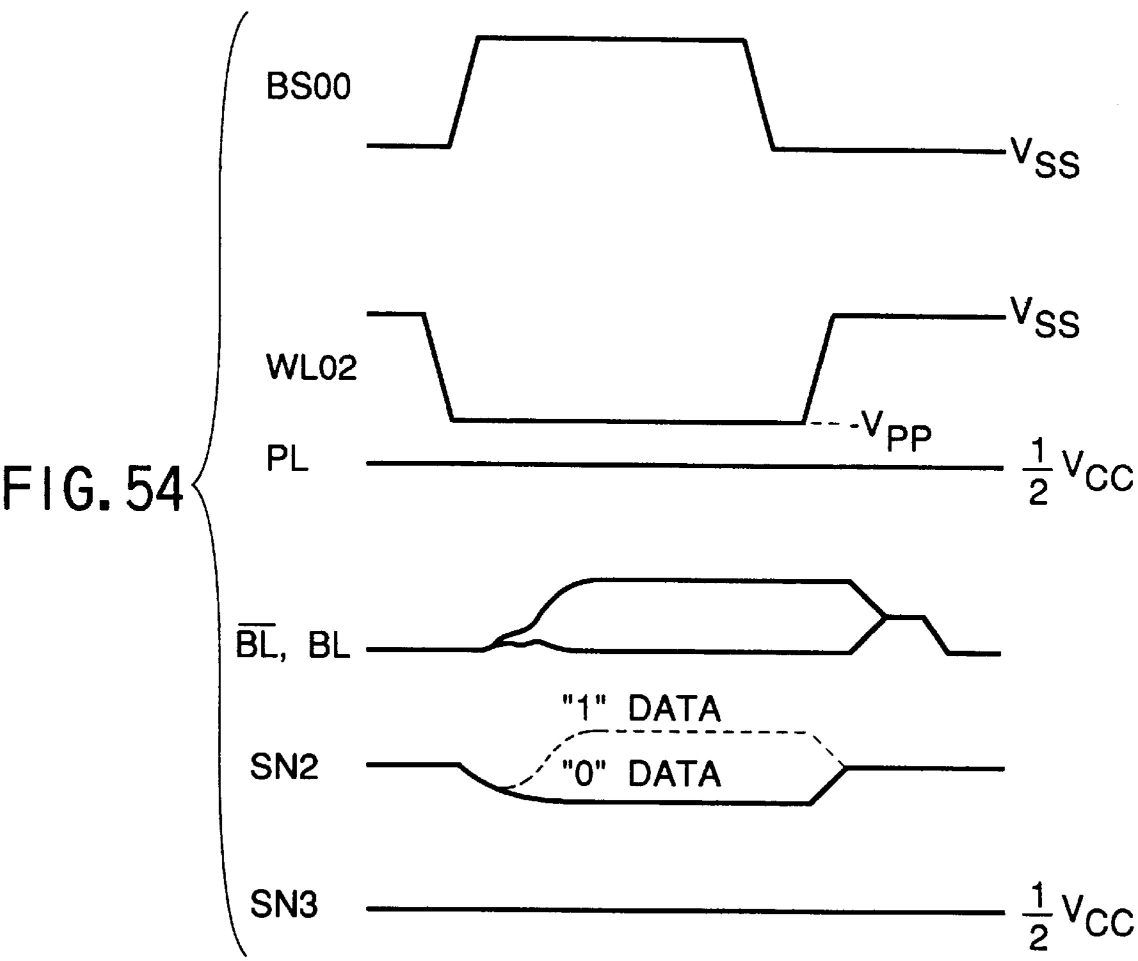
FIG. 54 is a chart showing signal waveforms so as to explain the operations of the 30th and 31st embodiments.

The structure of this embodiment is basically the same as that shown in FIG. 6A and FIG. 6B except that the cell transistor shown in FIG. 5 is changed to a D-type transistor, and the threshold voltage has a negative value. The operation is shown in FIG. 54. In the power-OFF state or the stand-by state, the word line voltage is set at 0V to turn on the cell transistor. Only the word line of a selected memory cell is set at a negative potential to turn off the cell transistor.

The advantages of this embodiment are as follows.

(1) Since the word line is at 0V in the stand-by state, the word line leakage poses no problem.

(2) Since no high word line voltage is applied in the stand-by state, the reliability of the device increases.

(3) The largest advantage is that the device is resistant to noise. While the power supply is OFF, cell data is properly held because the cell transistor is always ON. The device is also resistant to a sudden power failure.

When the threshold voltage is set to have a small negative value to set the word line/bit line amplitude within the range of −Vpp' to Vcc, the step-up potential can be prevented from lowering due to the word line leakage in the stand-by state. This is because Vcc is the power supply voltage, and the current can be sufficiently supplied.

31st Embodiment

Figure 53:
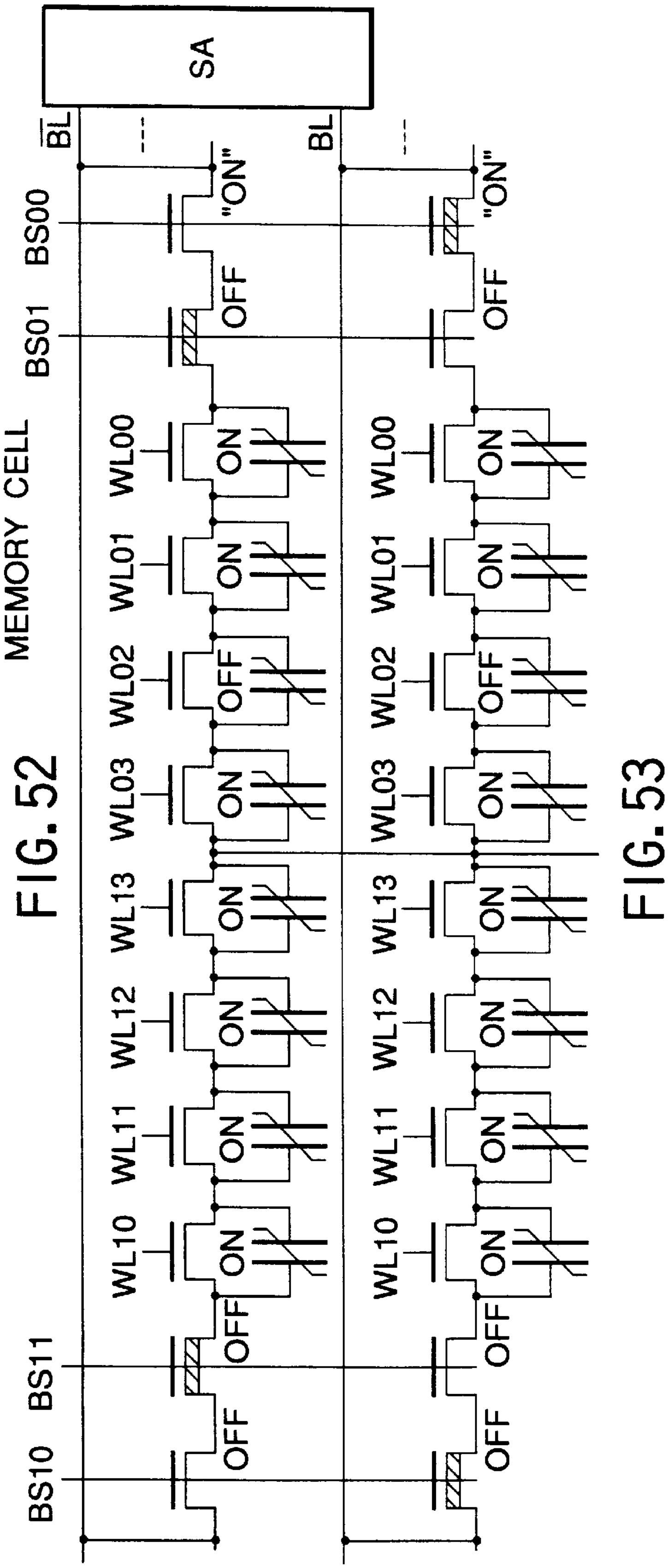
FIG. 53 is an equivalent circuit diagram showing the basic structure of an FRAM according to the 31st embodiment.

FIG. 53 is a circuit diagram showing the basic structure of an FRAM according to the 31st embodiment of the present invention.

In this embodiment, the cell transistor shown in FIG. 27 is changed to a D-type transistor, and the threshold voltage has a negative value. The operation is shown in FIG. 54. In the power-OFF state or standby state, the word line voltage is set at 0V to turn on the cell transistor. Only the word line of a selected memory cell is set at a negative potential to turn off the cell transistor.

As in the 30th embodiment, this embodiment is advantageous in that the word line leakage is not a problem, the reliability of the device increases, and the device is resistant to noise.

In FIG. 52 and FIG. 53, the cell transistor is ON both in the power-OFF state and in the unselected state with the power turned ON. For this reason, even when a radiation such as an ray is irradiated on the cell, a software error caused by the potential difference between the ferroelectric capacitors due to collected charges generated by the irradiation is less likely to take place because the ferroelectric capacitors are short-circuited by the cell transistor in the ON state, unlike the conventional cell, so that the reliability can be largely improved. In the conventional cell, the storage node is floating. Therefore, when the cell transistor is ON in the unselected state, the device is influenced by noise such as a parasitic capacity coupling caused by the operation of the selected memory cell. However, such an influence can be prevented by the present invention. FIG. 54 shows an example of this operation.

32nd Embodiment

FIG. 55A to FIG. 55I are sectional views showing various memory structures so as to explain the 32nd embodiment of the present invention.

Figure 55A:
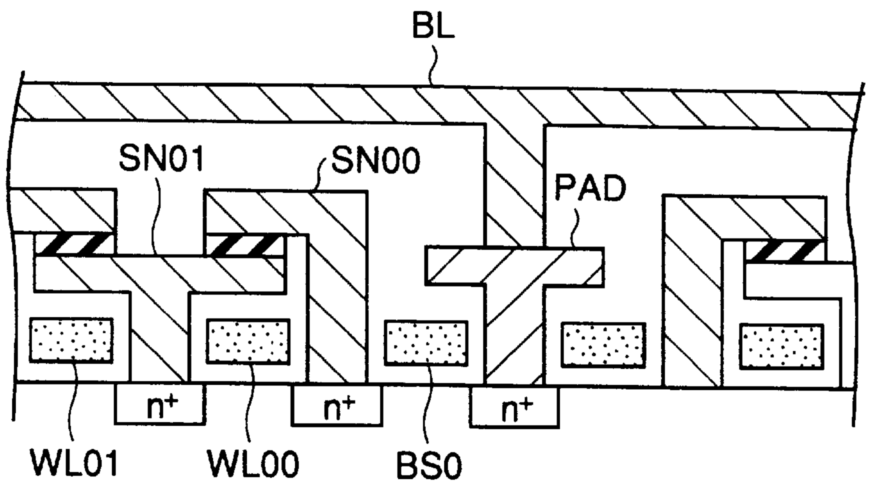
FIG. 55A to FIG. 55I are sectional views showing the structures of various memory cells so as to explain the 32nd embodiment.

In FIG. 55A, no deep bit line contact is formed at the bit line die conductor portion where a bit line BL and a select transistor are connected, unlike FIG. 7A and FIG. 7B. Instead, the select transistor is connected to the bit line BL through a pad layer PAD. The pad layer PAD may be commonly used as the lower or upper electrode interconnection of a cell node, as a matter of course. In this case, since no deep bit line contact need be formed, the device can be easily manufactured.

Figure 55B:
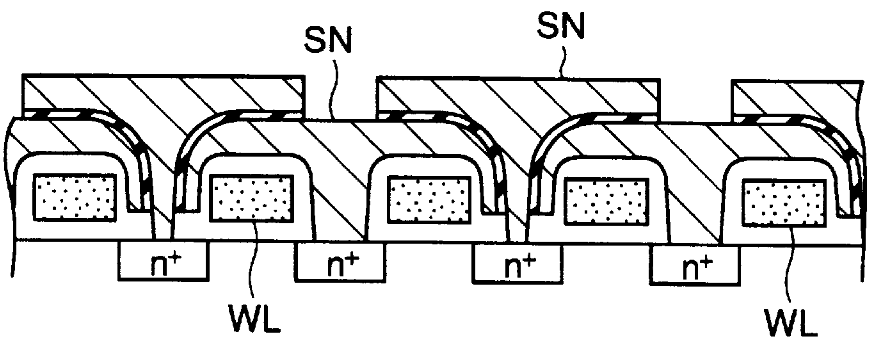

In FIG. 55B, a ferroelectric capacitor is also formed at a gate side wall portion. In this case, the capacitor area can be increased.

Figure 55C:
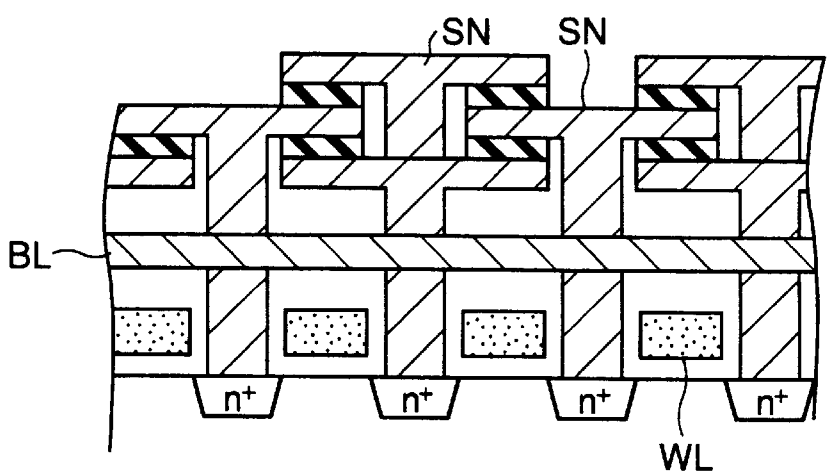
Figure 55D:
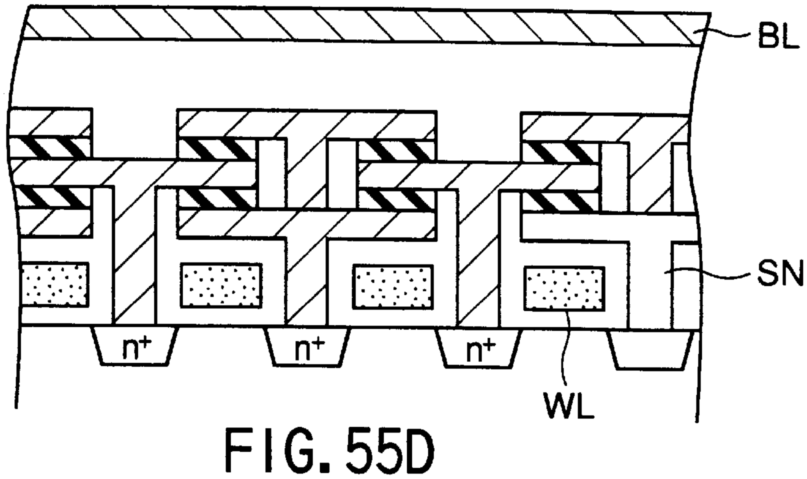

In FIG. 55C and FIG. 55D, the ferroelectric capacitors are stacked using a fin structure. In this case as well, the capacitor area can be increased. The fin structure is also used for the conventional DRAM in which a plate electrode is sandwiched between fins. In this embodiment, however, the plate electrode is not sandwiched between fins.

Figure 55E:
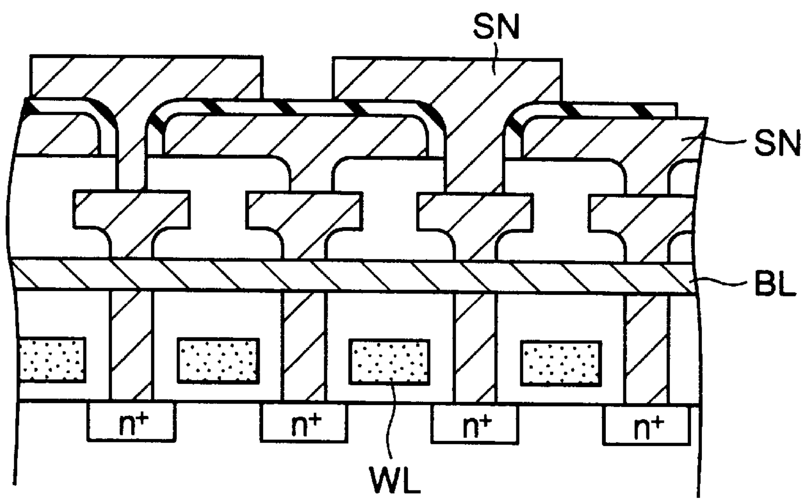
Figure 55F:
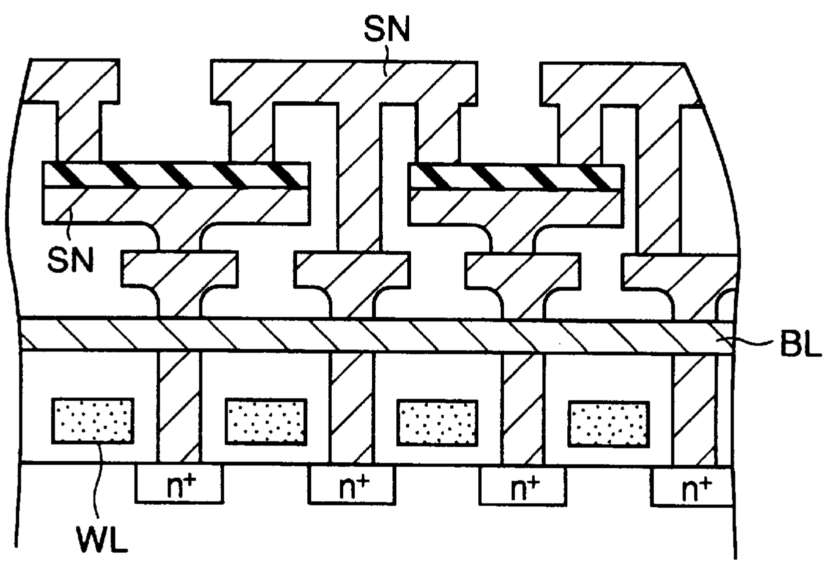

In FIG. 55E, after a cell node is formed above the bit line BL, the ferroelectric capacitor is formed. In FIG. 55F, an insulating film is formed after formation of a ferroelectric film, and an upper electrode is formed after formation of a contact hole, as in FIG. 55E. As shown in FIG. 55E, the ferroelectric capacitor may be formed to be perpendicular to the substrate.

Figure 55G:
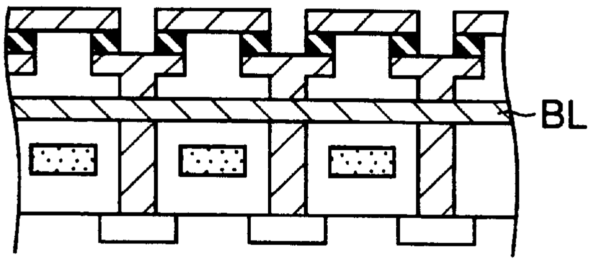

FIG. 55G is slightly different from the above examples in that, in any cell node, the ferroelectric film is formed after formation of a lower electrode, and thereafter, adjacent cell nodes are connected through the upper electrode. This structure is equivalent to a structure in which two ferroelectric capacitors are connected in series. Although the cell capacity is halved, the device can be easily manufactured because the upper electrode need only be connected to the ferroelectric film.

Figure 55H:
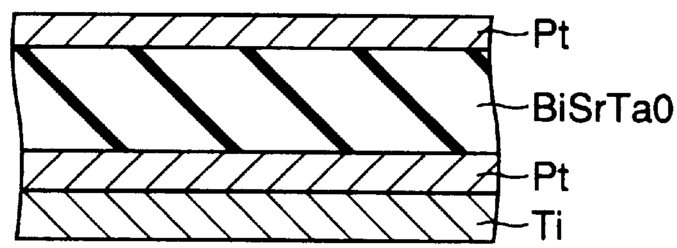
Figure 55I:
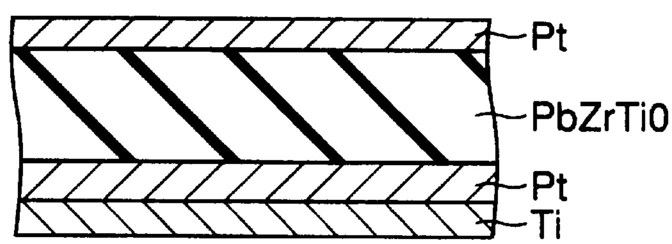

FIG. 55H and FIG. 55I are enlarged sectional views of a capacitor portion. A ferroelectric film and upper and lower electrodes contacting the ferroelectric film are shown. In FIG. 55H, a Pt film serving as a lower electrode is formed on a Ti layer, a composite film of a ferroelectric film (SrBiTaO) is formed on the resultant structure, and a Pt film is formed as an upper electrode. In FIG. 55I, a Pt film serving as a lower electrode is formed on a Ti layer, a composite film of a ferroelectric film (PbZrTiO) is formed on the resultant structure, and a Pt film is formed as an upper electrode.

An Si layer or another metal layer may be formed on the upper electrode. An Si layer or a metal layer may be connected to the lower surface of the lower electrode. The two stages of plugs of a cell node in, e.g., FIG. 55E are formed of polysilicon layers. A ferroelectric film is formed on the polysilicon layer through a barrier metal layer of TiPi, and a Pt layer is formed on the ferroelectric film. An Al layer may be formed on the Pt layer. Ir, $IrO_2$, or the like may be used as the electrode of the cell.

As a modification of FIG. 55E, an Si plug may be formed on a diffusion layer, a Ti layer/TiN layer/Pt layer may be formed on the resultant structure, and a ferroelectric film may be formed on the Ti layer/TiN layer/Pt layer. A BaSrTiO-based material may be used to form the ferroelectric film. A BaSrTiO-based material containing Sr in an amount larger than that of Bs can be used for a ferroelectric capacitor. SrRuO may be used as the electrode of this ferroelectric capacitor such that the lattice constant of the ferroelectric capacitor does not match that of the electrode. With this distortion, the polarization amount may be increased. Ru, RuO, or the like may be used as the electrode material. After formation of the upper electrode, a $TiO_2$ film/$SiO_2$ film may formed. In this case, the polarization amount can be prevented from decreasing due to various subsequent heat treatments based on reduction of H in which oxygen is removed from the ferroelectric capacitor. The ferroelectric capacitor can be formed using any one of a sol-gel process, sputtering, CVD and MOCVD.

33rd Embodiment

Figure 56:
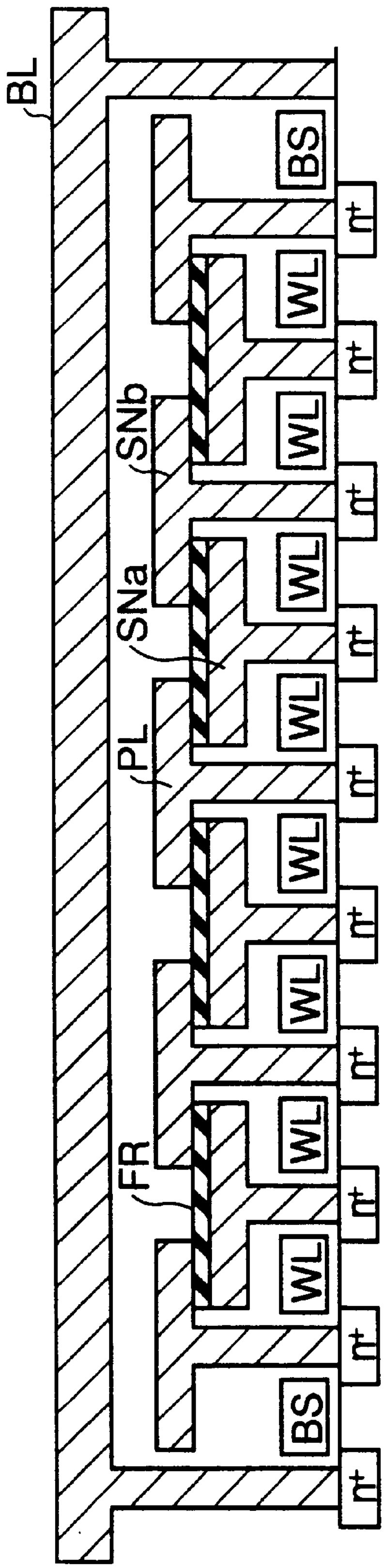
FIG. 56 is a sectional view showing the device structure of an FRAM according to the 33rd embodiment.

FIG. 56 is a sectional view showing the memory cell structure of an FRAM according to the 33rd embodiment of the present invention.

After a lower electrode SNa and a ferroelectric film FR of a capacitor are formed, the ferroelectric film FR is not entirely but partially processed to form an upper electrode SNb of the capacitor. That is, the ferroelectric film FR is partially connected. The ferroelectric film has an anisotropy in the direction of film formation. In this example, polarization mainly occurs in a direction perpendicular to the Si surface and not in the horizontal direction. For this reason, no problem is posed even in the above structure. All the above-described examples of a cell can also have the same structure. Even when an isotropic material is used, no problem is posed as far as the ferroelectric films are sufficiently separated from each other.

34th Embodiment

Figure 57A:
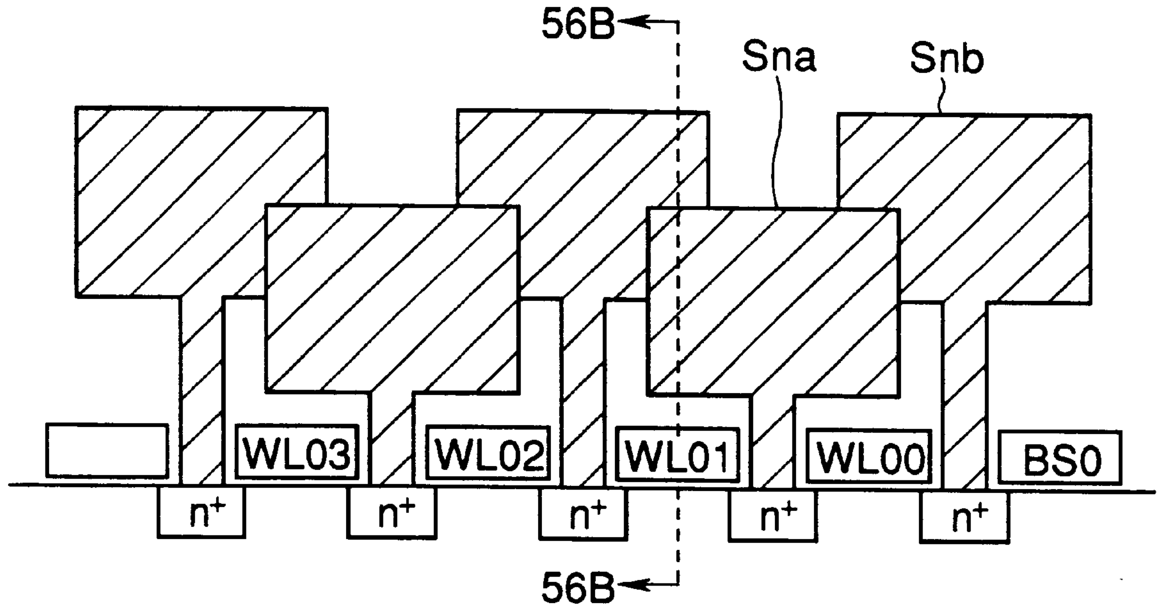
FIG. 57A and FIG. 57B are sectional views showing the device structure of an FRAM according to the 34th embodiment.
Figure 57B:
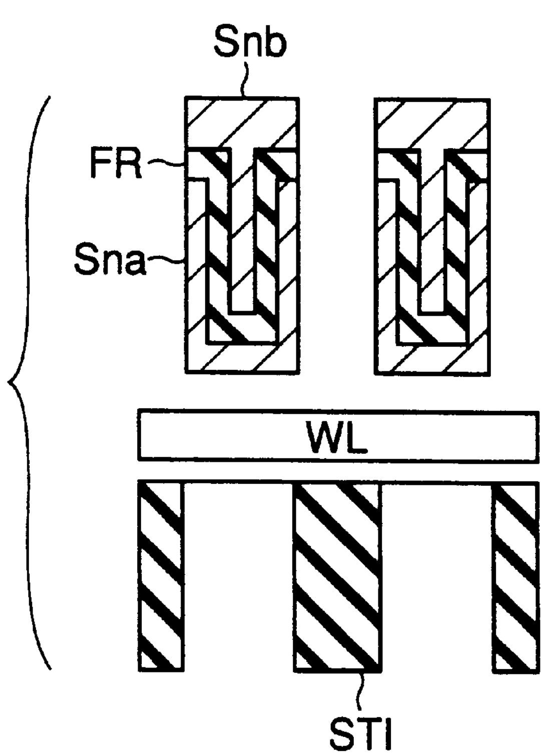

FIG. 57A and FIG. 57B are sectional views showing the memory cell structure of an FRAM according to the 35th embodiment of the present invention. FIG. 57A is a sectional view taken along a bit line, and FIG. 57B shows a section along a word line, i.e., taken along a line 56B—56B in FIG. 57A.

A lower electrode SNa of a capacitor is formed as a groove (or a hole). An ferroelectric film FR is formed in the groove, and an upper electrode SNb is formed. With this structure, the area of the ferroelectric film FR can be increased, and the polarization amount of the memory cell can be increased.

35th Embodiment

Figure 58:
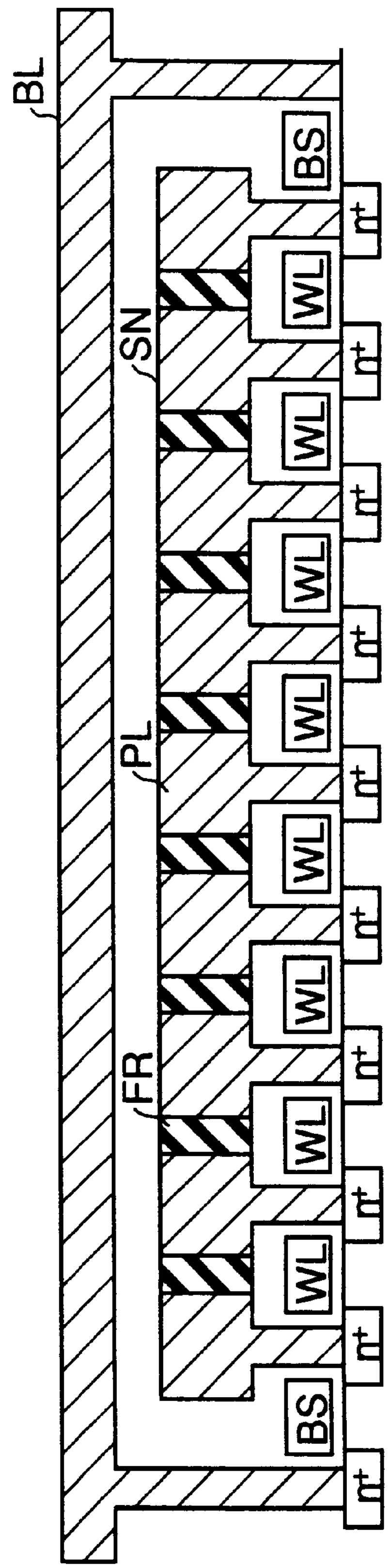
FIG. 58 is a sectional view showing the device structure of an FRAM according to the 35th embodiment.

FIG. 58 is a sectional view showing the memory cell structure of an FRAM according to the 35th embodiment of the present invention. Unlike the above-described cell structure, all storage nodes (SN) are simultaneously formed, and thereafter, ferroelectric films FR are deposited between the adjacent storage nodes SN, thereby realizing the equivalent circuit of the present invention.

The characteristic features of this embodiment are as follows. (1) Since the upper and lower electrodes can be simultaneously formed, the process cost can be reduced. A plate electrode PL need not be independently formed, unlike the conventional cell having a 1-transistor/1-capacitor structure, resulting in cost merit. (2) When the upper electrode is to be formed, the node is extracted from the diffusion layer of the cell transistor. For this reason, the ferroelectric films must be separated to extract the node. This problem is also solved by this embodiment. (3) When the storage node SN is made thicker, the cell polarization amount can be freely increased. (4) When the thickness of the ferroelectric film is decreased, the paraelectric component of the ferroelectric film increases. However, the remnant polarization amount as an important factor of the nonvolatile device does not depend on the thickness. When the thickness is decreased, only the coercive voltage lowers. As a result, when only the coercive voltage can be sufficiently lowered, the thickness need not be decreased. In fact, an increase in thickness increases only the paraelectric component, resulting in a decrease in read margin.

As is apparent from this result, when the cell size is reduced, e.g., when a 256-Mbit FRAM having a small size of 0.25 $\mu$m is to be manufactured, the ferroelectric film may have a thickness of about 250 nm. If the distance between the storage nodes SN is 0.25 $\mu$m, the distance between the storage nodes SN before formation of the ferroelectric film matches the required ferroelectric film thickness even in this cell structure, so the distance between the storage nodes SN, i.e., the distance smaller than the design rule need not be forcibly maintained.

Figure 59:
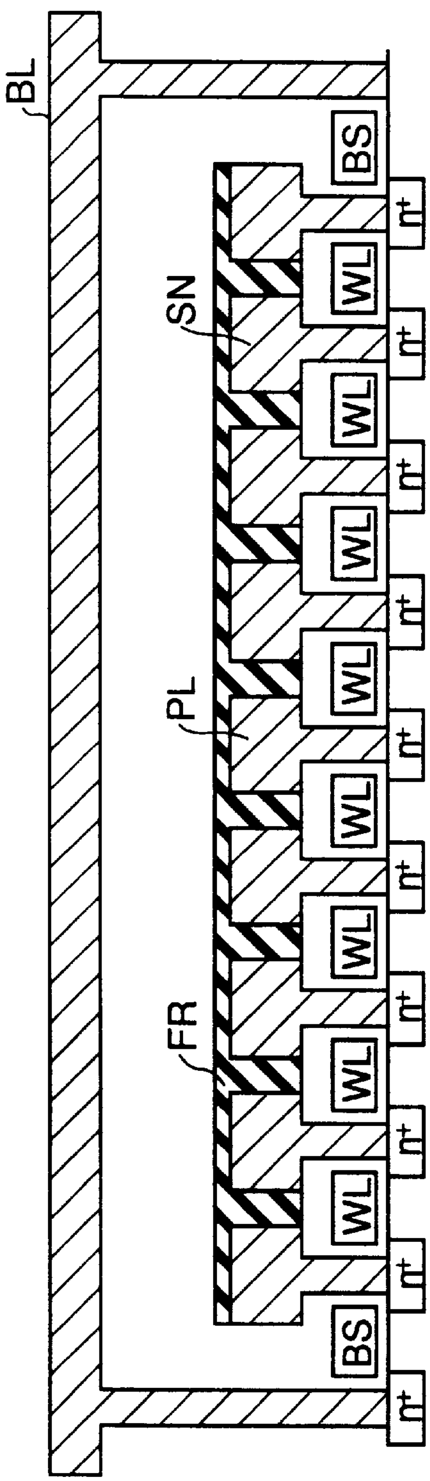
FIG. 59 is a sectional view showing a modification of the FRAM according to the 35th embodiment.

FIG. 59 is a sectional view showing a modification of this embodiment. In FIG. 59, in formation of the cell shown in FIG. 58, the ferroelectric film FR is left not only between the nodes SN but also on the storage nodes SN. Even when the ferroelectric film FR is formed on the storage node SN (even when the ferroelectric film FR is inevitably formed on the storage node SN because of the process of burying the ferroelectric film between the storage nodes SN), the ferroelectric film FR on the storage node SN has no counter electrodes as far as an insulating film of $SiO_2$ or the like is formed on the ferroelectric film FR. Therefore, the ferroelectric film FR can be neglected in term of operation.

36th Embodiment

Figure 60:
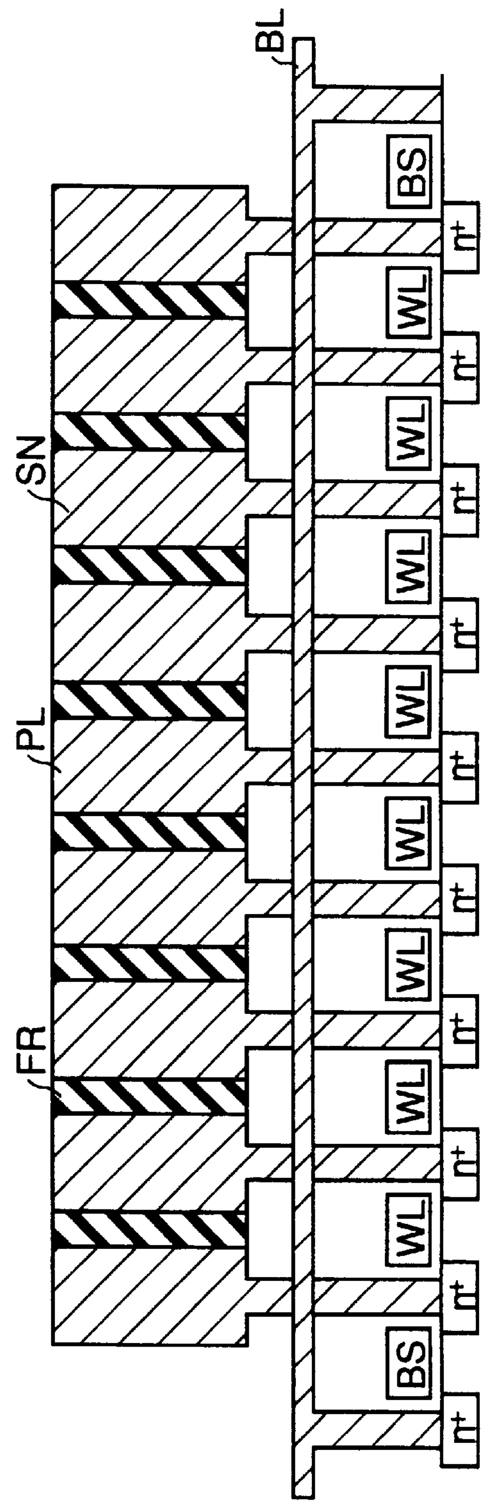
FIG. 60 is a sectional view showing the device structure of an FRAM according to the 36th embodiment.

FIG. 60 is a sectional view showing the memory cell structure of an FRAM according to the 36th embodiment of the present invention. In this embodiment, a ferroelectric film FR and an electrode SN are formed after formation of a bit line BL in the cell shown in FIG. 59. In this case, the influence of the cell step formed by the storage node thickness in formation of the bit line BL is eliminated. For this reason, the storage node thickness can be increased to increase the remnant polarization amount of the cell.

Note that CVD or MOCVD is suitably used to form the three-dimensional ferroelectric capacitor in FIG. 57A and FIG. 57B or bury the ferroelectric capacitor film between the electrodes in FIG. 58, FIG. 59, and FIG. 60.

37th Embodiment

Figure 61:
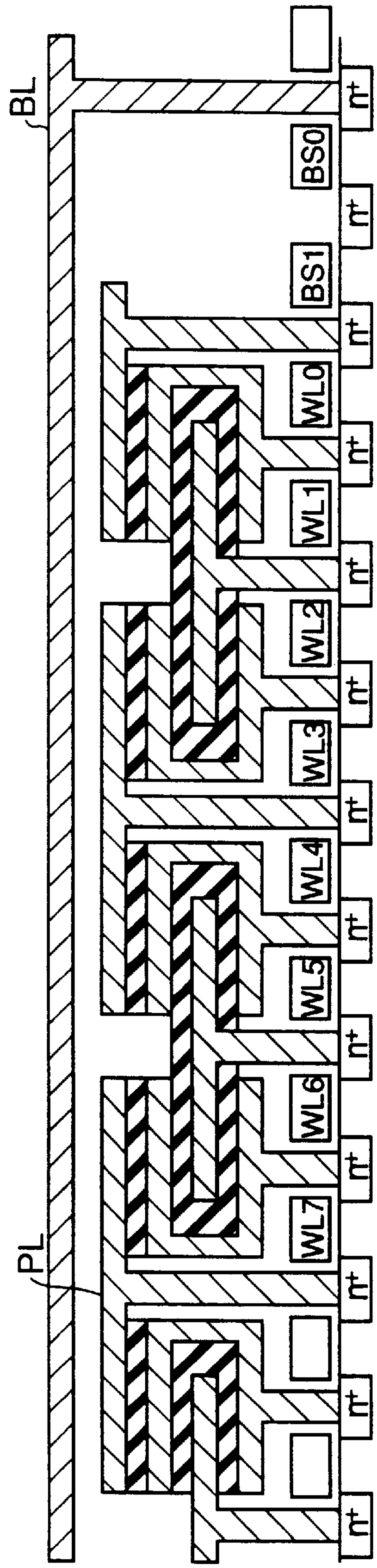
FIG. 61 is a sectional view showing the device structure of an FRAM according to the 37th embodiment.

FIG. 61 is a sectional view showing the memory cell structure of an FRAM according to the 37th embodiment of the present invention.

In the cell structure shown in FIG. 7A and FIG. 7B, when, in a cell having a size of $4F^2$, the ferroelectric capacitor is formed as a planar capacitor, the ferroelectric capacitor area becomes $1F^2$, thus decreasing the polarization amount per cell, although the ferroelectric capacitor area of the conventional cell having a size of $8F^2$ is $2F^2$ to $3F^2$.

This problem can be solved by using, e.g., four capacitor electrode layers, as shown in FIG. 61. Four conductive layers serving as capacitor electrodes are formed above a word line WL, and the electrodes are connected to the sources and drains of cell transistors. The first electrode layer and the third electrode layer are electrically connected.

The first and third electrode layers are connected to a certain node (source/drain of a cell transistor) of the series connected cells. The second electrode layer is connected to one of the adjacent nodes, and the fourth electrode layer is connected to the other of the adjacent nodes. A ferroelectric capacitor film is formed between the first and third electrode layers and the second electrode layer. Another ferroelectric capacitor film is formed between the third and fourth electrode layers.

The ferroelectric film between the third and fourth electrode layers can be formed to have a size of $3F^2$. The ferroelectric film between the first and third electrode layers and the second electrode layer can be formed to have a size of $3F^2$ or more. Therefore, a capacitor area of $3F^2$ can be obtained even in the cell having the size of $4F^2$, so that the same polarization amount as in the prior art can be ensured. In this cell, not only the planar ferroelectric film but also a three-dimensional ferroelectric film can be formed, as shown in FIG. 57A and FIG. 57B, to obtain a larger cell area.

Figure 62:
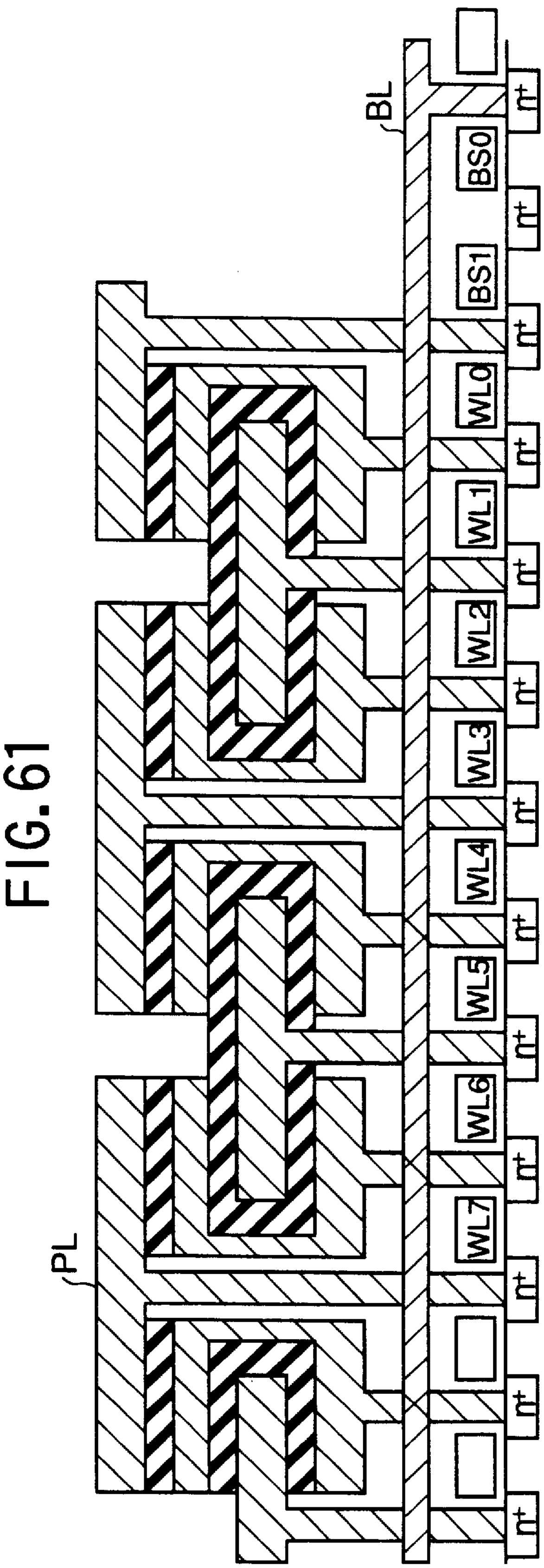
FIG. 62 is a sectional view showing a modification of the 37th embodiment.

FIG. 62 shows a modification of this embodiment in which the ferroelectric capacitors are formed after formation of bit lines, unlike FIG. 61.

38th Embodiment

Figure 63A:
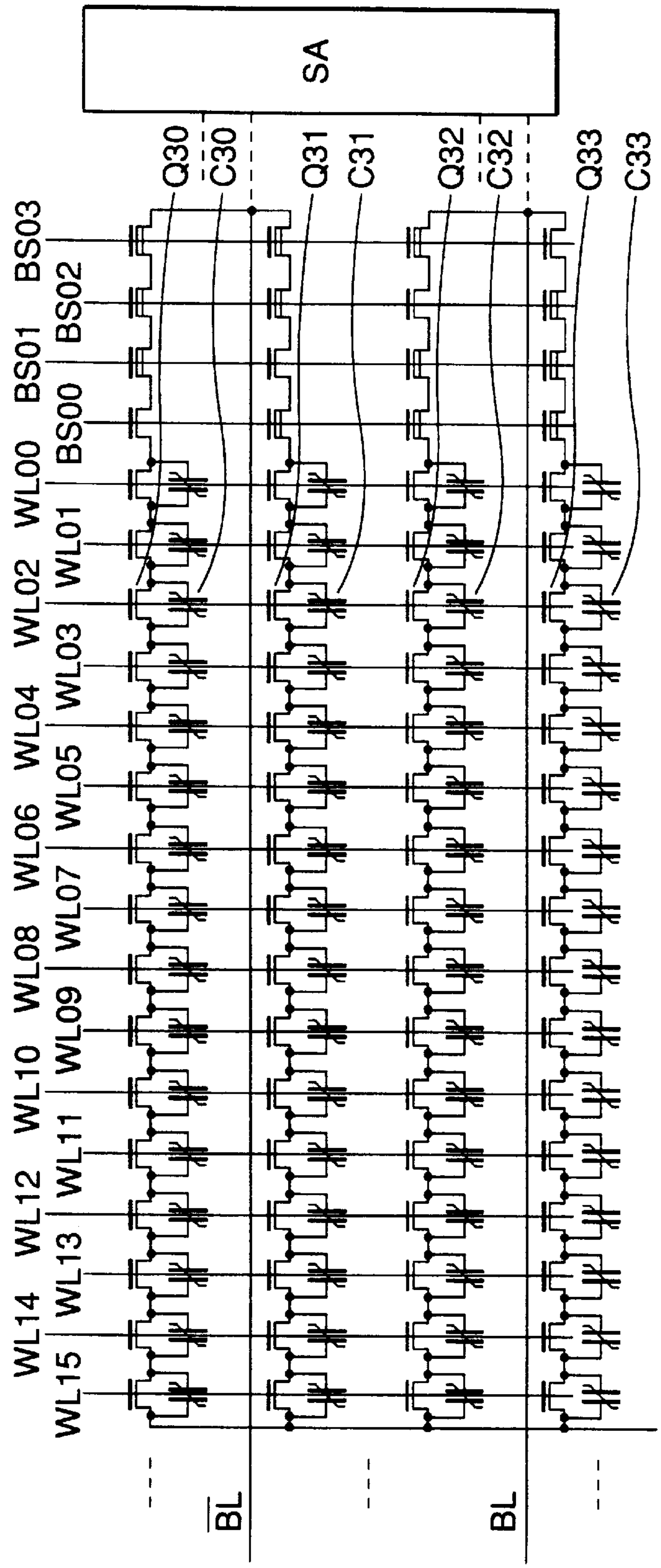
FIG. 63A and FIG. 63B are a circuit diagram and a timing chart, respectively, showing an equivalent circuit of an FRAM according to the 38th embodiment.
Figure 63B:
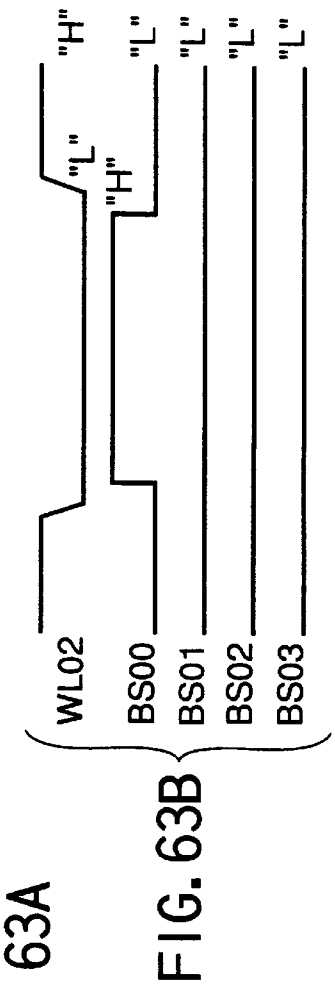

FIG. 63A and FIG. 63B are an equivalent circuit diagram and a timing chart, respectively, showing the memory cell structure of an FRAM according to the 38th embodiment of the present invention.

As shown in FIG. 63A, a ferroelectric capacitor and a cell transistor (WL00 to WL15) are connected in parallel to constitute one cell. A plurality of cells are connected in series. Four select transistors controlled by four block selection lines (BS00 to BS03) are connected in series with each other and also connected to the cells, thereby constituting cell blocks. One terminal of a cell block is connected to a plate (PL) electrode. The other terminal is connected to a bit line BL. One terminal of the first cell block including a cell (Q30, C30) and one terminal of the second cell block including a cell (Q31, C31) are connected to a common bit line $\overline{BL}$. One terminal of the third cell block including a cell (Q32, C32) and one terminal of the fourth cell block including a cell (Q33, C33) are connected to the common bit line BL.

As the selection block transistors, one transistor having a positive threshold value and three transistors each having a negative threshold value are used for each cell block, as shown in FIG. 63A. In selecting a memory cell, only one of the first to fourth cell blocks can be selected by the four block selection lines (BS00 to BS03).

As is apparent from the timing chart of FIG. 63B, when only the block selection line BS00 is set at "H", only the first cell block can be selected. This is because, only in the first cell block, all the four series-connected select transistors are turned on. As a result, when the word line WL02 is selected, only the cell (Q30, C30) is selected. The cell data is read out not to bit line BL side but to the bit line $\overline{BL}$ side, so that a folded bit line structure can be realized. As in FIG. 27, the number of sense amplifiers can be half that of an open bit line structure because of advantages including low noise, relaxation of the sense amplifier pitch, and sharing of a sense amplifier by cell arrays on both sides of the sense amplifier (shared sense amplifier).

In this embodiment, the bit line pitch can be increased to twice that shown in FIG. 27, so that a bit line pitch relaxation type folded bit line structure can be realized. With this structure, the bit lines can be easily manufactured. Since the bit lines are separated in terms of characteristics, coupling noise between the bit lines can be reduced. In addition, the sense amplifier pitch can also be increased to twice that shown in FIG. 27. The sense amplifier circuits can be easily formed, and the number of sense amplifiers can be ½ that shown in FIG. 27, so that the chip size can be reduced.

When a sense amplifier is shared by a plurality of bit lines, as shown in FIG. 31C, the bit line pitch cannot be increased, although the number of sense amplifiers decreases. Additionally, another bit line must be selected later. In the combination of the structure shown in FIG. 31C and that shown in FIG. 33B, a sense amplifier can be shared, and cell data need not be read out to another bit line which is not selected. However, the bit line pitch cannot be increased. In addition, before reading, only the selected bit line potential must be lowered (or raised) to Vss, as shown in FIG. 33B, resulting in a decrease in access speed. To the contrary, the scheme shown in FIG. 63A and FIG. 63B can prevent such penalty in access speed.

39th Embodiment

Figure 64A:
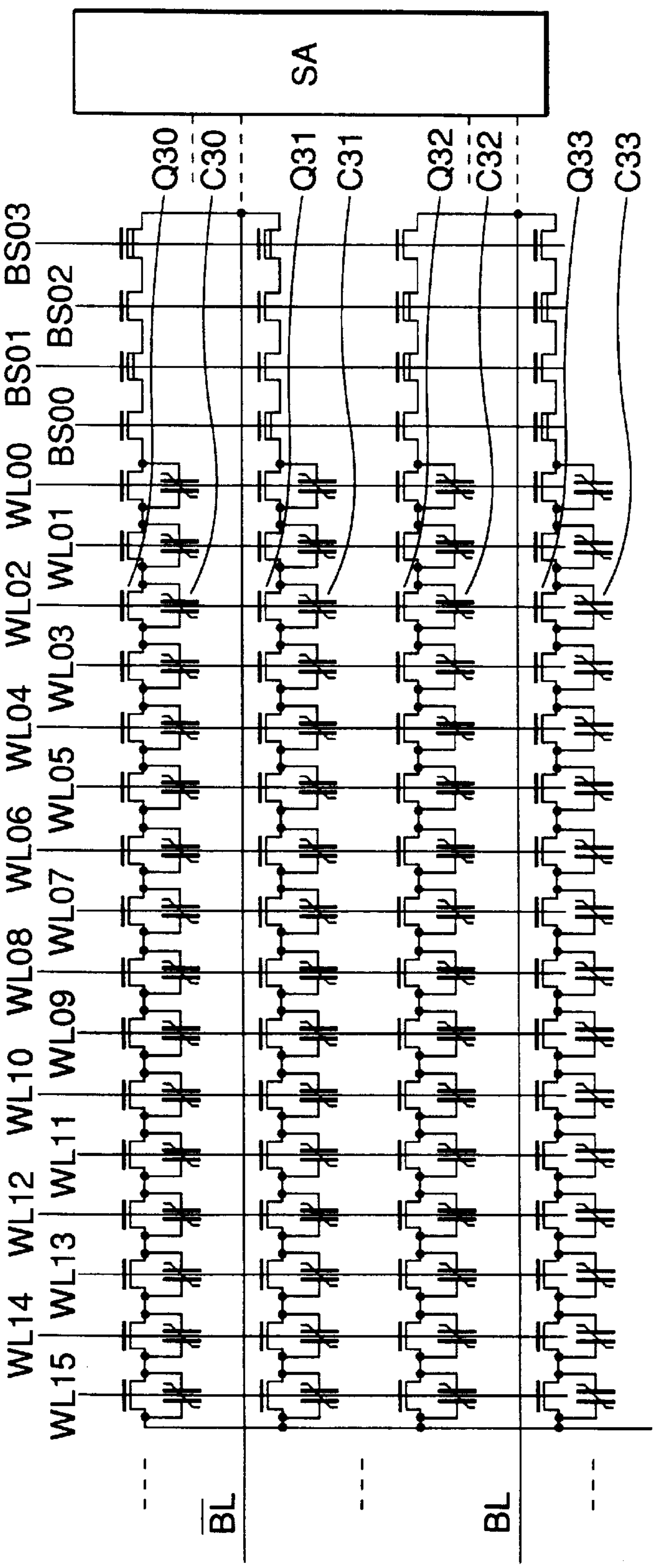
FIG. 64A and FIG. 64B are a circuit diagram and a timing chart, respectively, showing an equivalent circuit of an FRAM according to the 39th embodiment.
Figure 64B:
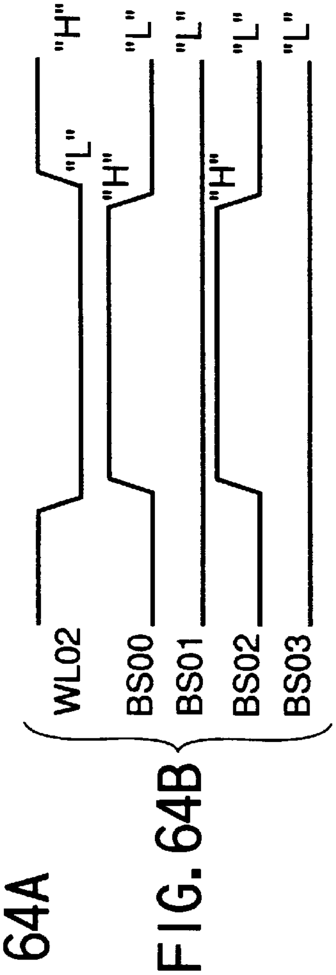

FIG. 64A and FIG. 64B are an equivalent circuit diagram and a timing chart, respectively, showing the memory cell structure of an FRAM according to the 39th embodiment of the present invention.

This embodiment has almost the same structure and effects as those in FIG. 63A and FIG. 63B except that, as selection block transistors, two transistors each having a positive threshold value and two transistors each having a negative threshold value are used for each cell block.

In selecting a memory cell, two of four selection block lines (BS00 to BS03) are set at "H" so that only one of the first to fourth cell blocks can be selected. More specifically, the selection block line BS02 or BS03 is selected to select the two upper or lower cell blocks, and then, one of the two cell blocks is selected by the block selection line BS00 or BS01.

40th Embodiment

Figures 65A, 65B:
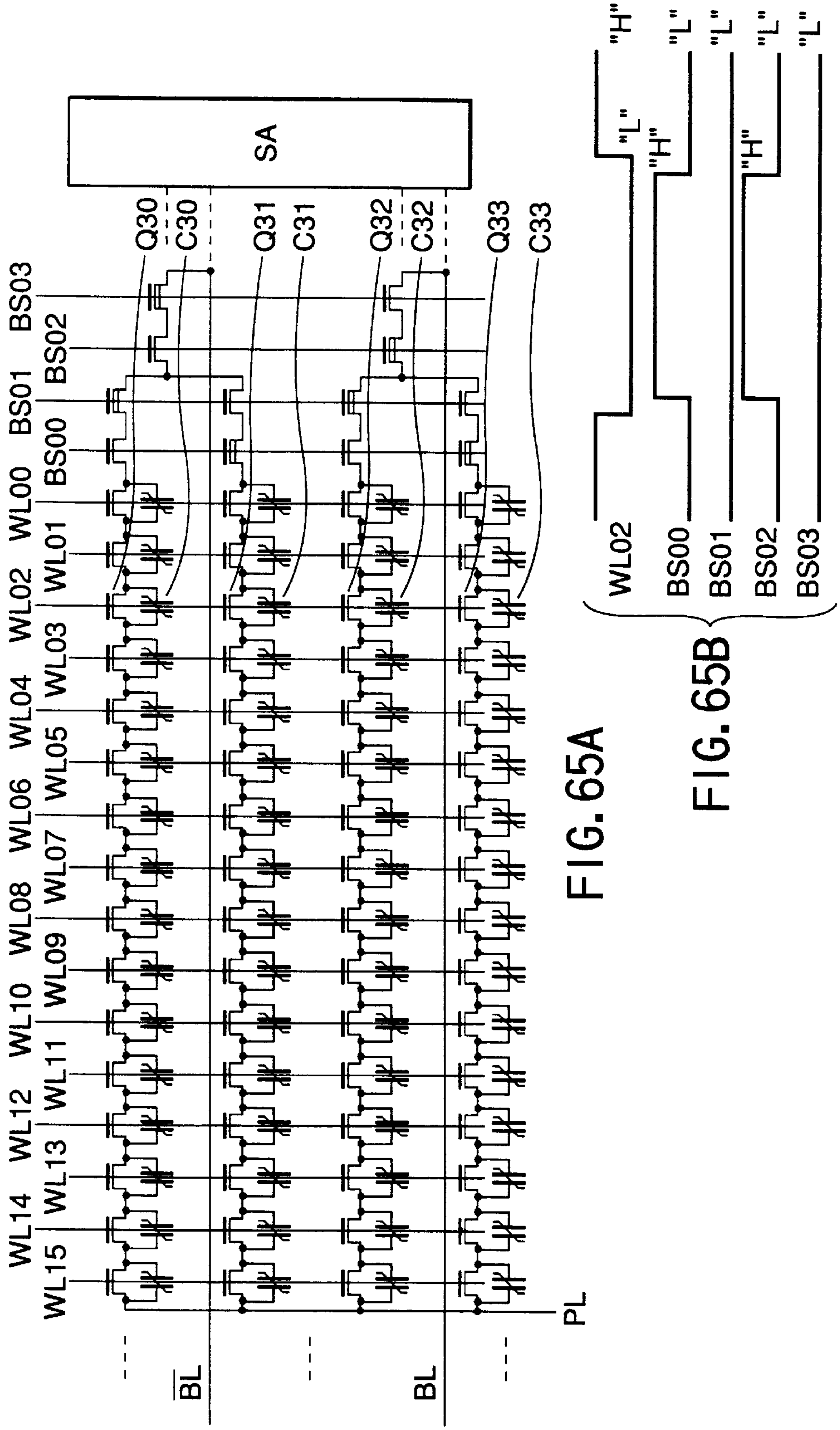
FIG. 65A and FIG. 65B are a circuit diagram and a timing chart, respectively, showing an equivalent circuit of an FRAM according to the 40th embodiment.

FIG. 65A and FIG. 65B are an equivalent circuit diagram and a timing chart, respectively, showing the memory cell structure of an FRAM according to the 40th embodiment of the present invention.

This embodiment has almost the same structure and effects as those in FIG. 64A and FIG. 64B. As an additional effect, the number of selection block transistors is reduced. The operation is the same as that shown in FIG. 64A and FIG. 64B. In selecting a memory cell, two of four selection block lines (BS00 to BS03) are set at "H" so that only one of the first to fourth cell blocks can be selected.

More specifically, the selection block line BS02 or BS03 is selected to select the two upper or lower cell blocks, and then, one of the two cell blocks is selected by the block selection line BS00 or BS01. With this structure, the gate capacities of the block selection lines BS02 and BS03 can be reduced, the bit line capacity can be reduced, and the rule for the selection block transistor can be relaxed.

41st Embodiment

Figure 66A:
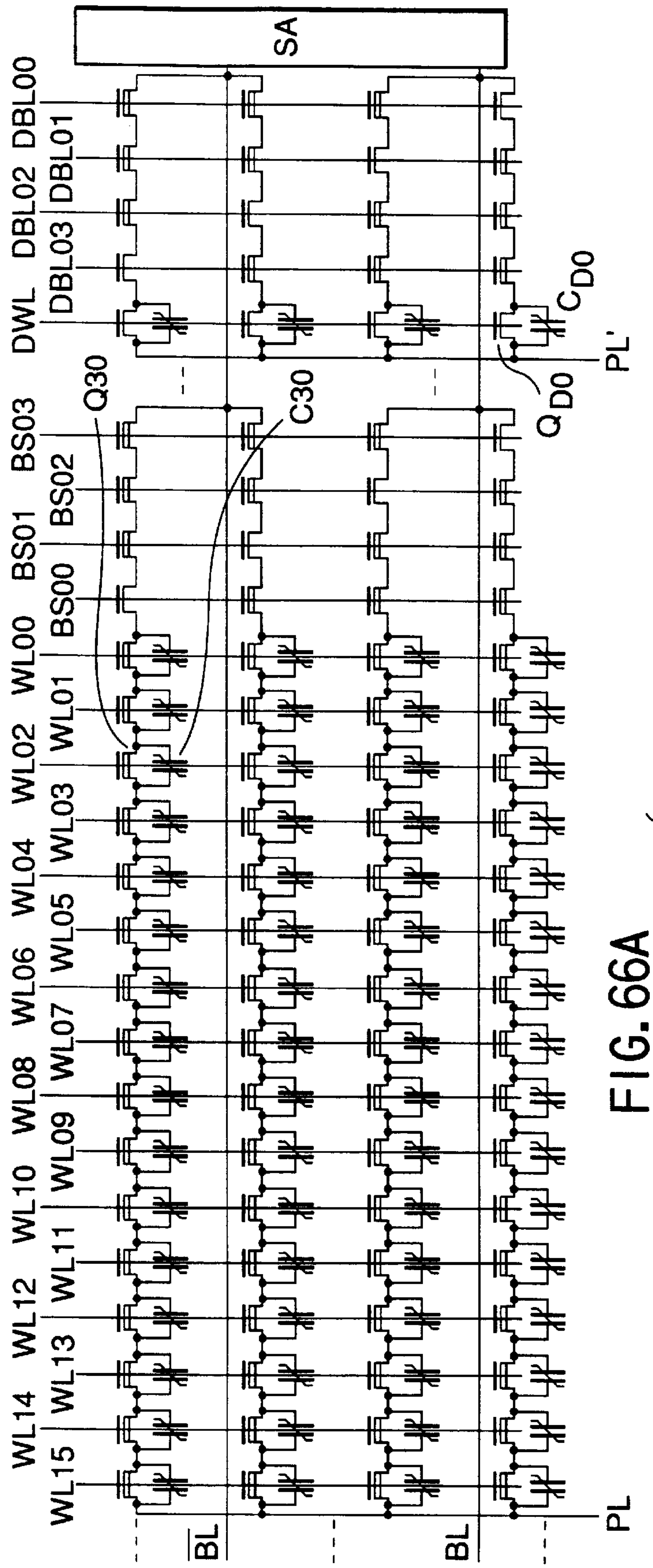
FIG. 66A and FIG. 66B are a circuit diagram and a timing chart, respectively, showing an equivalent circuit of an FRAM according to the 41st embodiment.
Figure 66B:
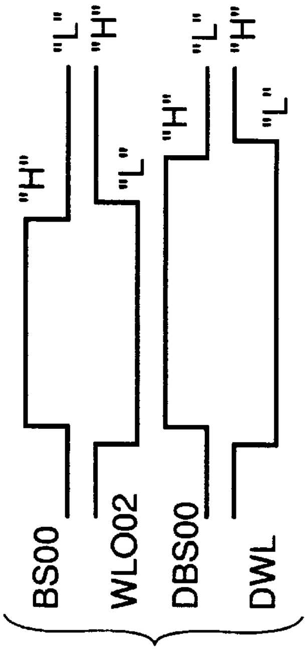

FIG. 66A and FIG. 66B are an equivalent circuit diagram and a timing chart, respectively, showing the memory cell structure of an FRAM according to the 41st embodiment of the present invention.

The dummy cell can also realize the same structure as that of the memory cell except that the number of series connected dummy cells is 1. For the operation, in selecting a memory cell (Q30, C30), the cell data is read out to a bit line $\overline{BL}$, as shown in FIG. 66B. Simultaneously, a block selection line DBS00 for dummy cell is set at "H", and a dummy word line DWL is set at "L". With this operation, the dummy cell data is also read out to a reference bit line (BL). The detailed operation is the same as that shown in FIG. 44, and a fatigue according to polarization inversion of the dummy cell can be suppressed.

42nd Embodiment

Figure 67A:
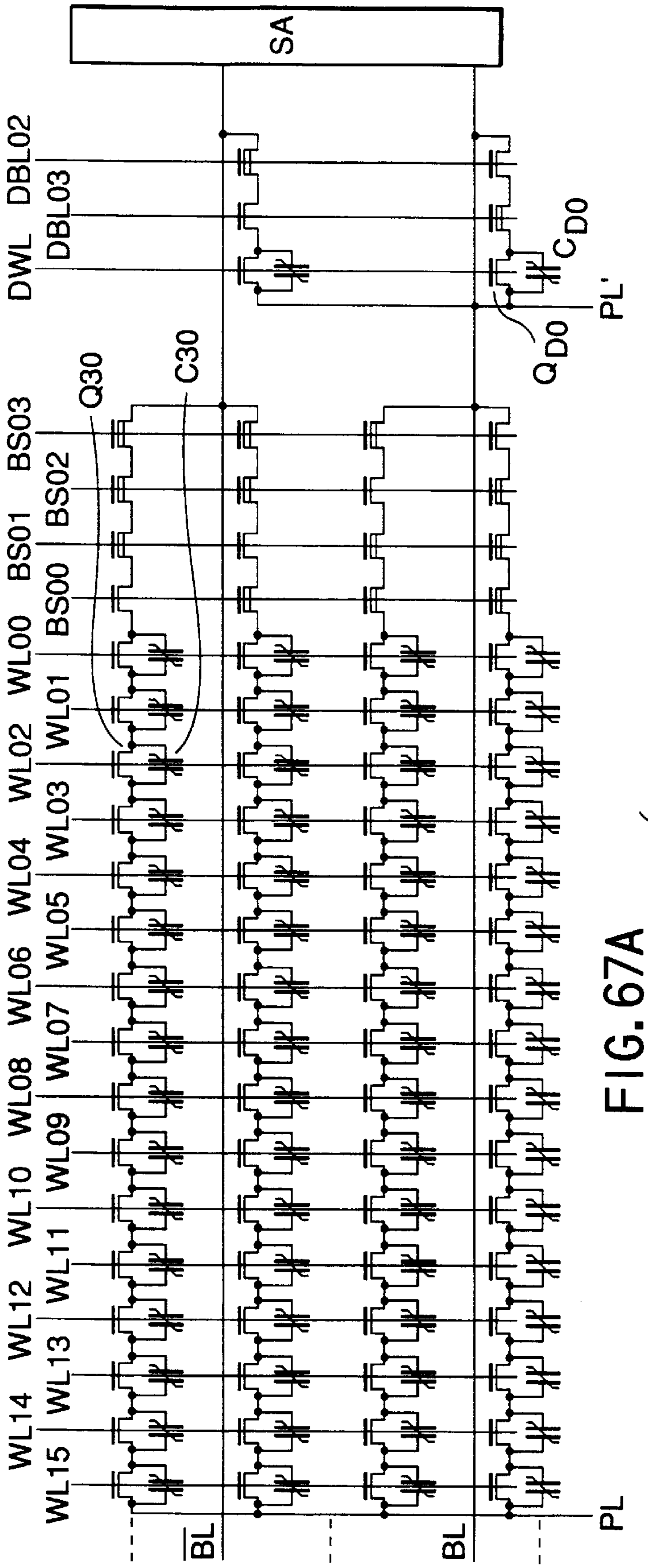
FIG. 67A and FIG. 67B are a circuit diagram and a timing chart, respectively, showing an equivalent circuit of an FRAM according to the 42nd embodiment.
Figure 67B:
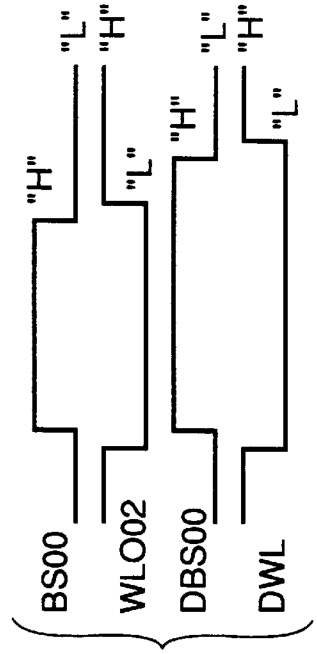

FIG. 67A and FIG. 67B are an equivalent circuit diagram and a timing chart, respectively, showing the memory cell structure of an FRAM according to the 42nd embodiment of the present invention.

In FIG. 67A, another example of the dummy cell structure shown in the embodiment shown in FIG. 63A is added. The number of dummy cells is reduced, as compared to the structure shown in FIG. 66A, and the rule can be relaxed. For the operation, in selecting a memory cell (Q30, C30), the cell data is read out to a bit line $\overline{BL}$, as shown in FIG. 67B. Simultaneously, a block selection line DBS02 for dummy cell is set at "H", and a dummy word line DWL is set at "L". With this operation, the dummy cell data is also read out to a reference bit line (BL). The detailed operation is the same as that shown in FIG. 44, and a fatigue according to polarization inversion of the dummy cell can be suppressed.

Figure 68:
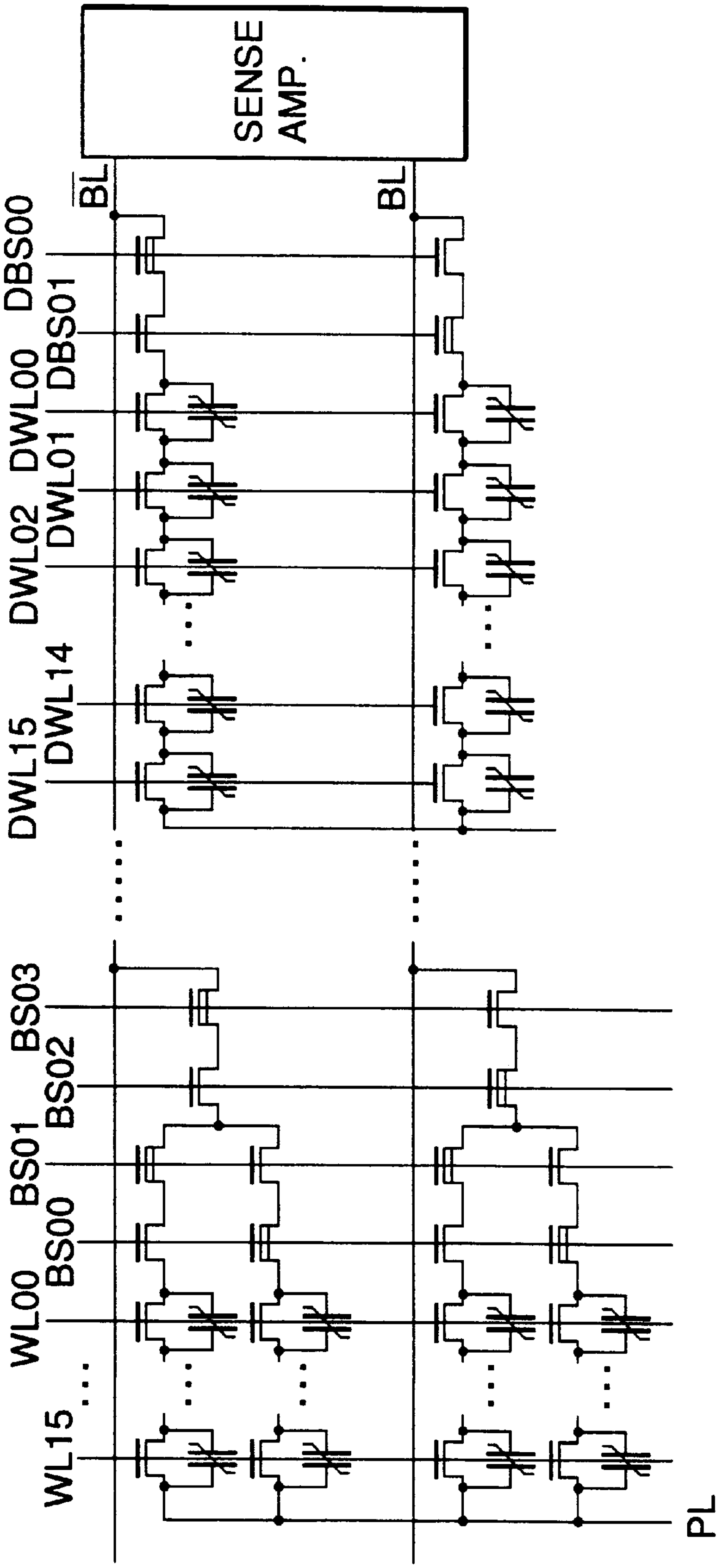
FIG. 68 is a circuit diagram showing a structure in which a plurality of dummy cells according to the embodiment shown in FIG. 67A and FIG. 67B are connected in series.
Figure 69:
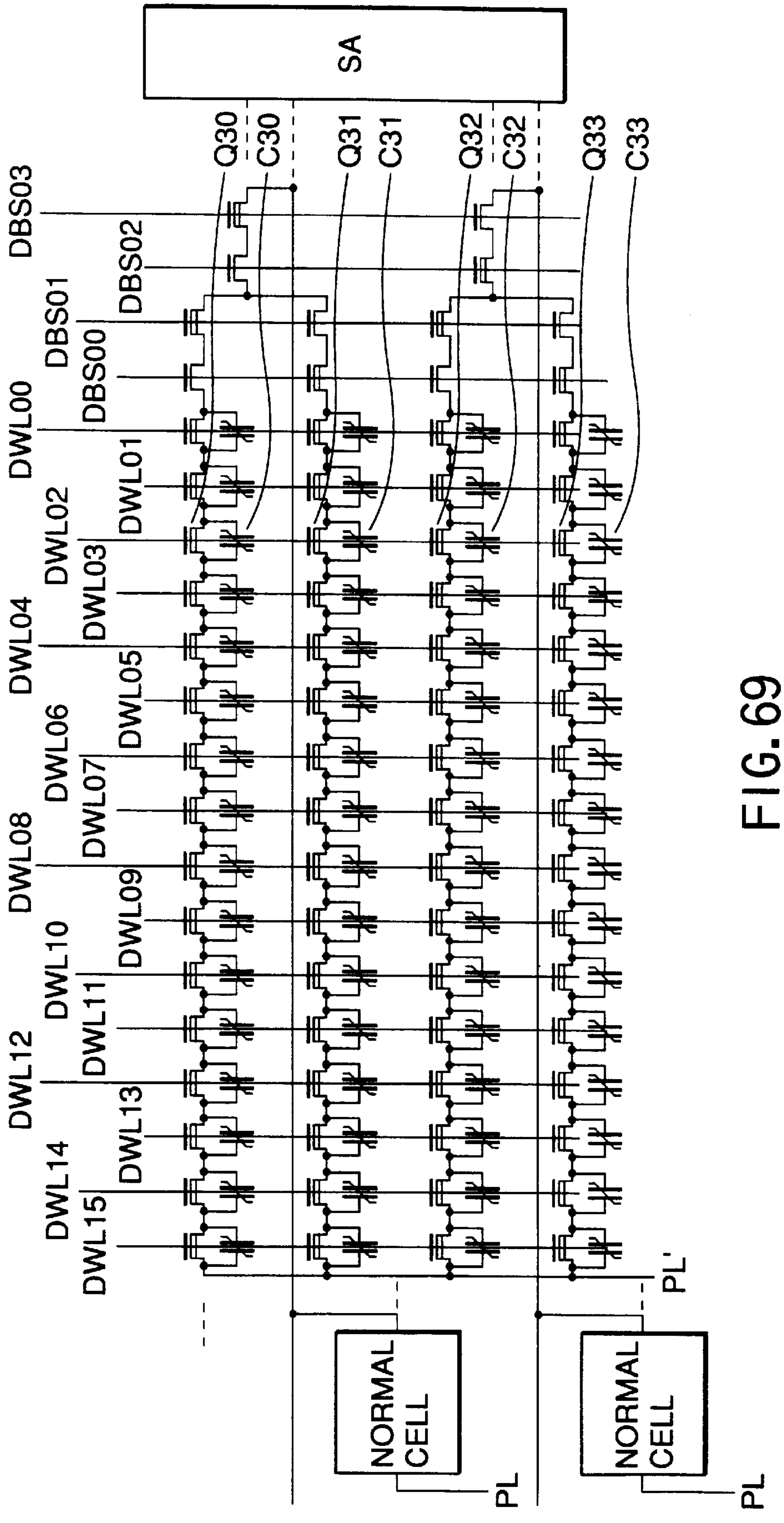
FIG. 69 is a circuit diagram showing a structure in which a plurality of dummy cells connectable to the embodiment shown in FIG. 65A and FIG. 65B are connected in series.

FIG. 68 shows a structure in which a plurality of dummy cells of the embodiment shown in FIG. 67A are connected in series. With this structure, the same effects as those in FIG. 43B and FIG. 45A can be obtained. FIG. 69 shows a structure in which a plurality of dummy cells connectable to the embodiment shown in FIG. 65A are connected in series. With this structure, the same effects as those in FIG. 43B and FIG. 45A can be obtained.

43rd Embodiment

Figure 70A:
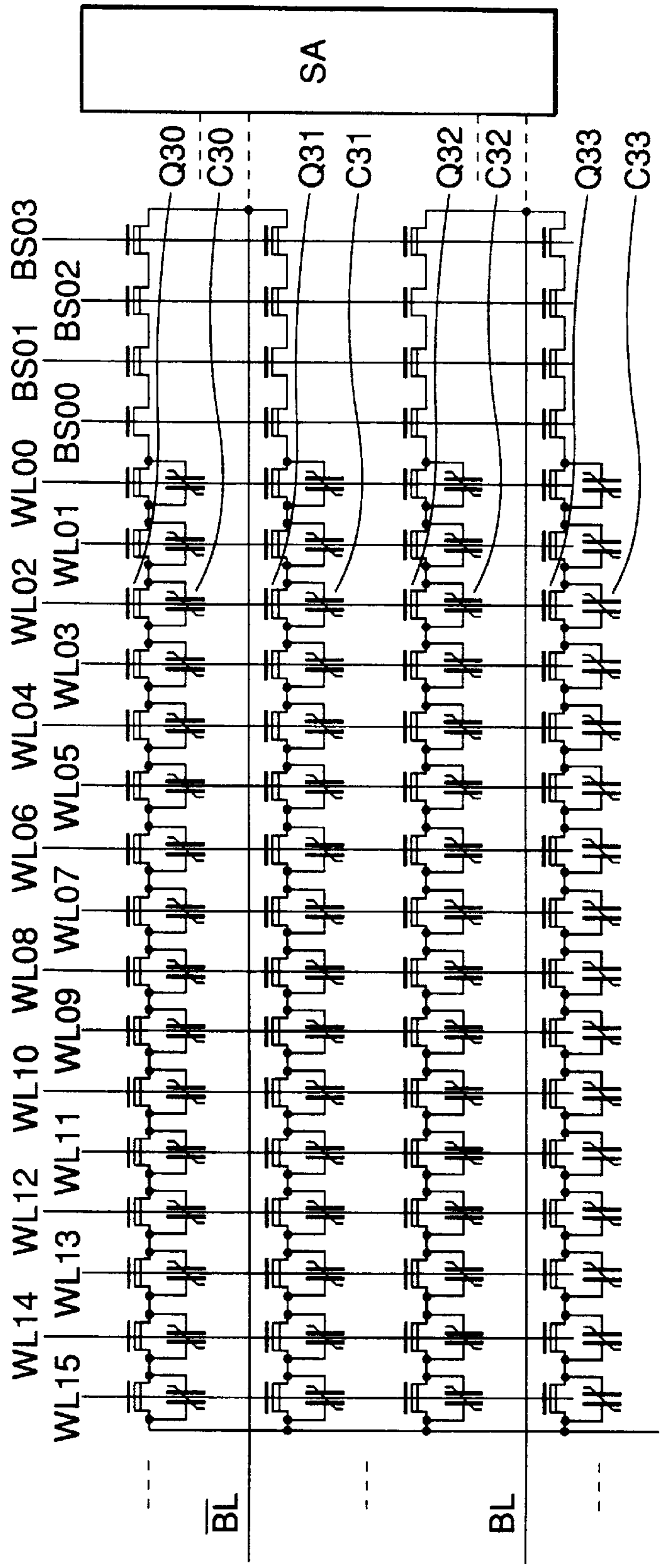
FIG. 70A and FIG. 70B are a circuit diagram and a timing chart, respectively, showing an equivalent circuit of an FRAM according to the 43rd embodiment.
Figure 70B:
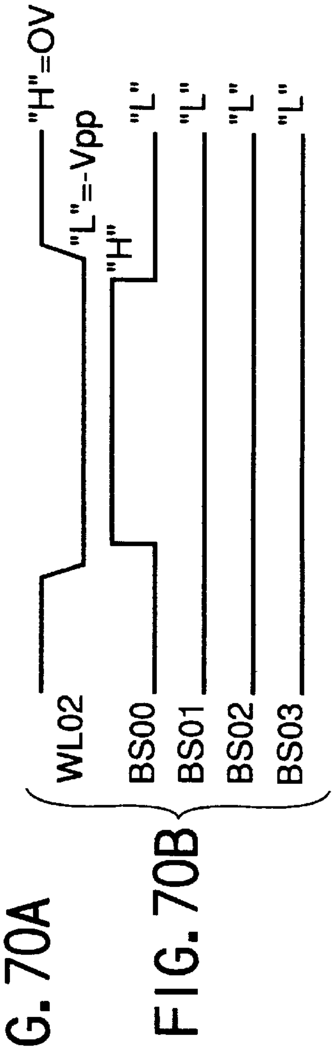

FIG. 70A and FIG. 70B are an equivalent circuit diagram and a timing chart, respectively, showing the memory cell structure of an FRAM according to the 43rd embodiment of the present invention.

In FIG. 70A, a depletion-type transistor is employed as the memory cell transistor of the embodiment shown in FIG. 63A. For the operation, in the power-OFF state or in the stand-by state, the word line voltage is set at 0V to turn on the cell transistor, and only the potential of the word line of a selected memory cell is lowered to a negative potential to turn off the cell transistor, as shown in FIG. 70B.

In this embodiment, the following effects can be obtained in addition to the effects of the embodiment shown in FIG. 63A and FIG. 63B, as in FIG. 52 and FIG. 51. (1) The word line leakage in the stand-by state poses no problem. (2) No high voltage is applied in the stand-by state. The device is resistant to noise and sudden power OFF. (3) In both the power-OFF state and the stand-by state, the device is resistant to a software error due to a radiation.

44th Embodiment

Figure 71A:
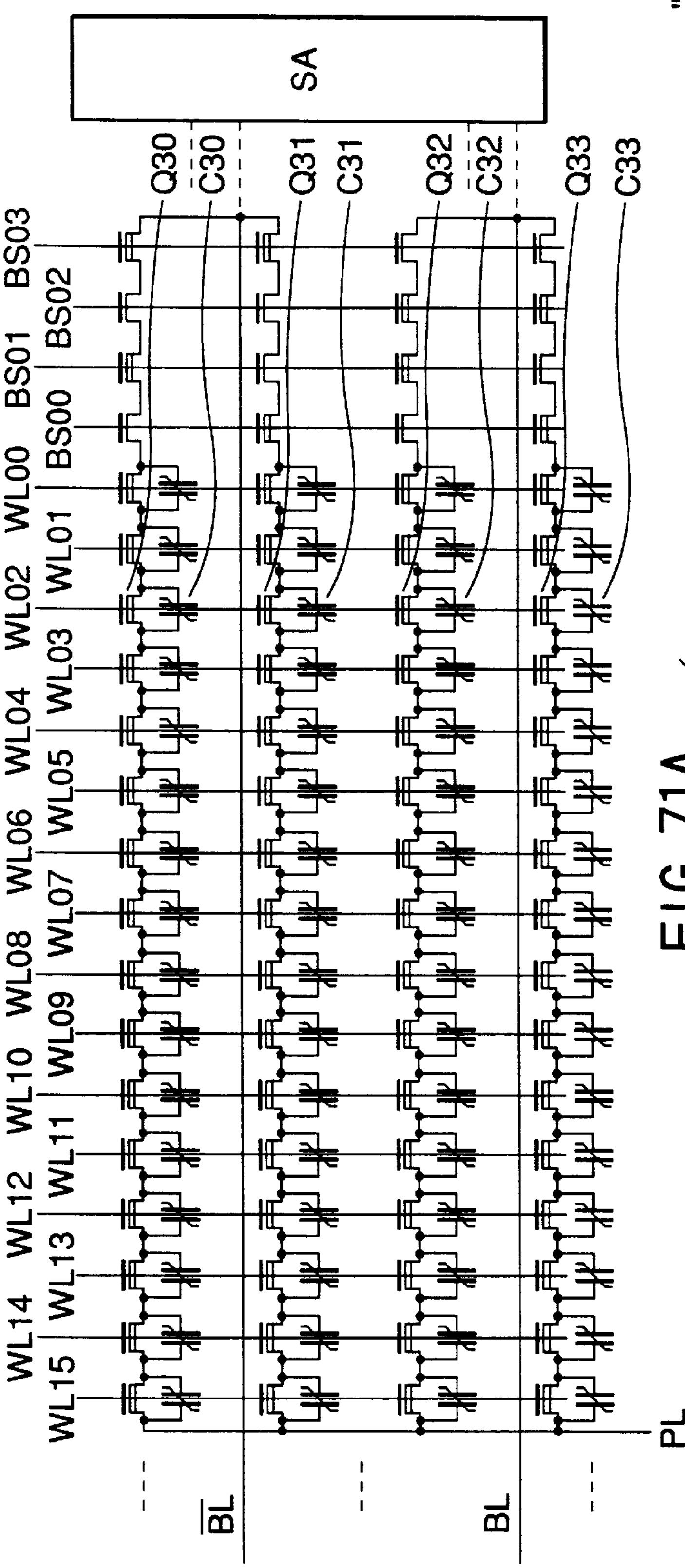
FIG. 71A and FIG. 71B are a circuit diagram and a timing chart, respectively, showing an equivalent circuit of an FRAM according to the 44th embodiment.
Figure 71B:
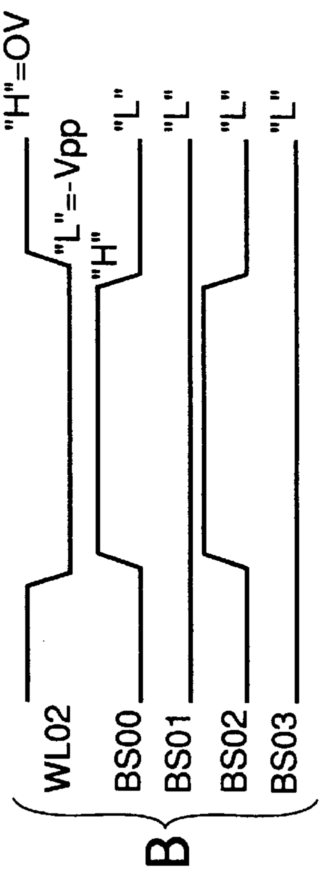

FIG. 71A and FIG. 71B are an equivalent circuit diagram a timing chart, respectively, showing the memory cell structure of an FRAM according to the 44th embodiment of the present invention.

In FIG. 71A, a depletion-type transistor is employed as the memory cell transistor of the embodiment shown in FIG. 64A. In this embodiment, the following effects can be obtained in addition to the effects of the embodiment shown in FIG. 64A and FIG. 64B, as in FIG. 52 and FIG. 51. (1) The word line leakage in the stand-by state poses no problem. (2) No high voltage is applied in the stand-by state. (3) The device is resistant to noise and sudden power OFF. (4) In both the power-OFF state and the stand-by state, the device is resistant to a software error caused by a radiation.

45th Embodiment

Figure 72A:
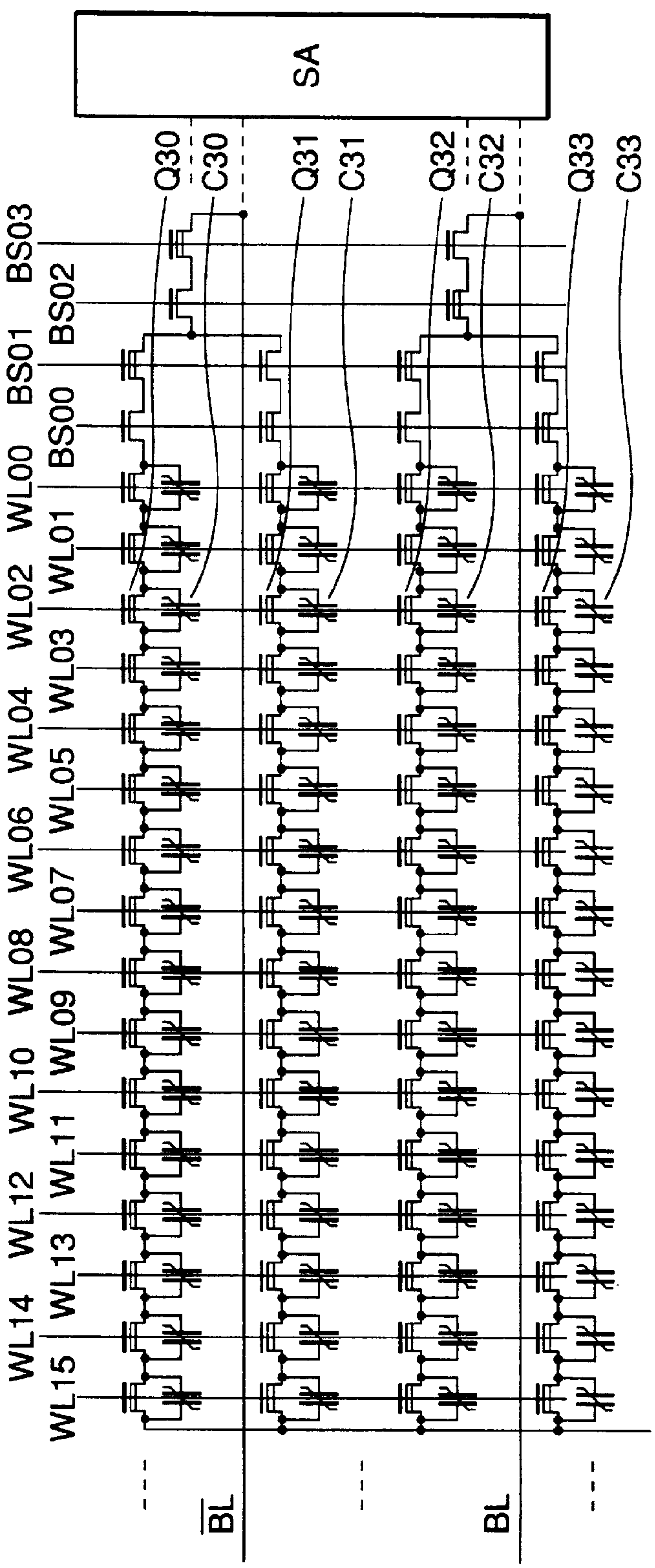
FIG. 72A and FIG. 72B are a circuit diagram and a timing chart, respectively, showing an equivalent circuit of an FRAM according to the 45th embodiment.
Figure 72B:
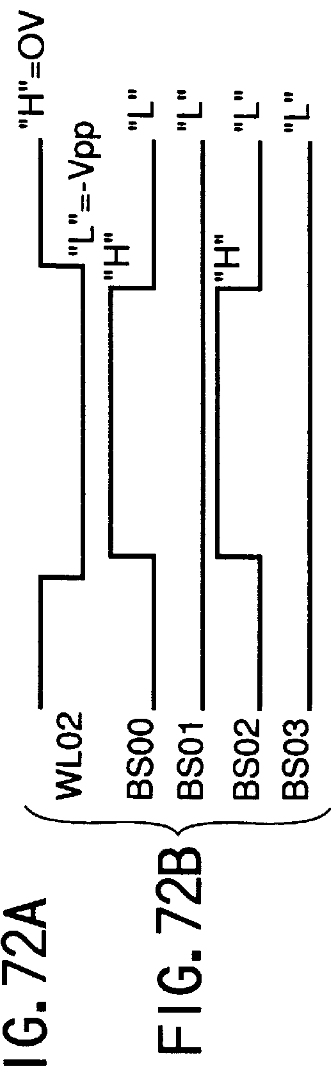

FIG. 72A and FIG. 72B are an equivalent circuit diagram a timing chart, respectively, showing the memory cell structure of an FRAM according to the 45th embodiment of the present invention.

In FIG. 72A, a depletion-type transistor is employed as the memory cell transistor of the embodiment shown in FIG. 65A. In this embodiment, the following effects can be obtained in addition to the effects of the embodiment shown in FIG. 65A and FIG. 65B, as in FIG. 52 and FIG. 51. (1) The word line leakage in the stand-by state poses no problem. (2) No high voltage is applied in the stand-by state. (3) The device is resistant to noise and sudden power OFF. (4) In both the power-OFF state and the stand-by state, the device is resistant to a software error caused by a radiation.

46th Embodiment

Figure 73A:
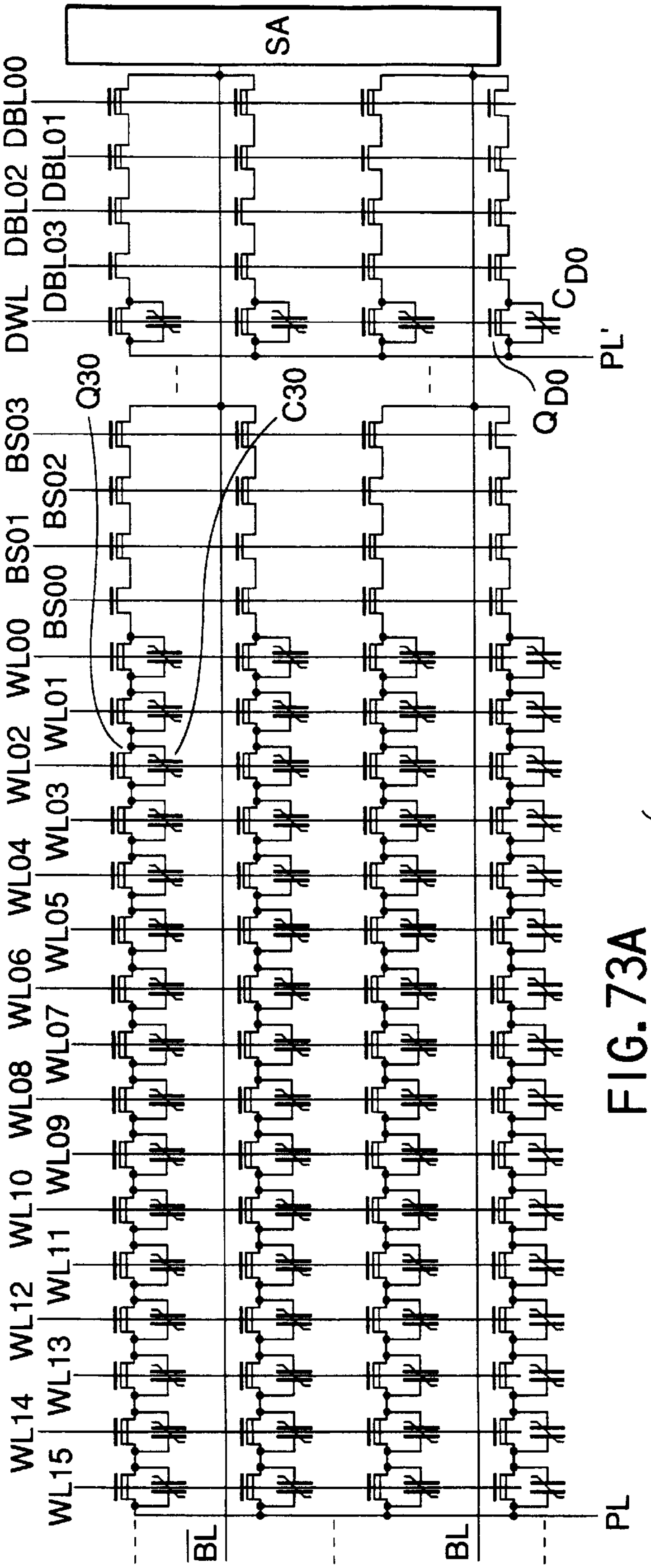
FIG. 73A and FIG. 73B are a circuit diagram and a timing chart, respectively, showing an equivalent circuit of an FRAM according to the 46th embodiment.
Figure 73B:
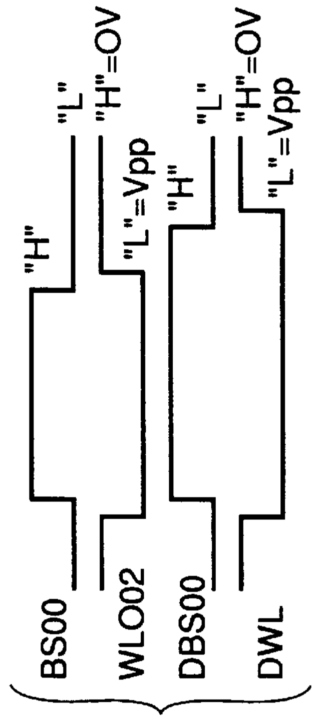

FIG. 73A and FIG. 73B are an equivalent circuit diagram a timing chart, respectively, showing the memory cell structure of an FRAM according to the 46th embodiment of the present invention.

In FIG. 73A, a depletion-type transistor is employed as the memory cell transistor of the embodiment shown in FIG. 66A. The dummy cell transistor also uses a depletion-type transistor.

In this embodiment, the following effects can be obtained in addition to the effects of the embodiment shown in FIG. 66A and FIG. 66B, as in FIG. 52 and FIG. 51. (1) The word line leakage in the stand-by state poses no problem. (2) No high voltage is applied in the stand-by state. (3) The device is resistant to noise and sudden power OFF. (4) In both the power-OFF state and the stand-by state, the device is resistant to a software error caused by a radiation.

47th Embodiment

Figure 74A:
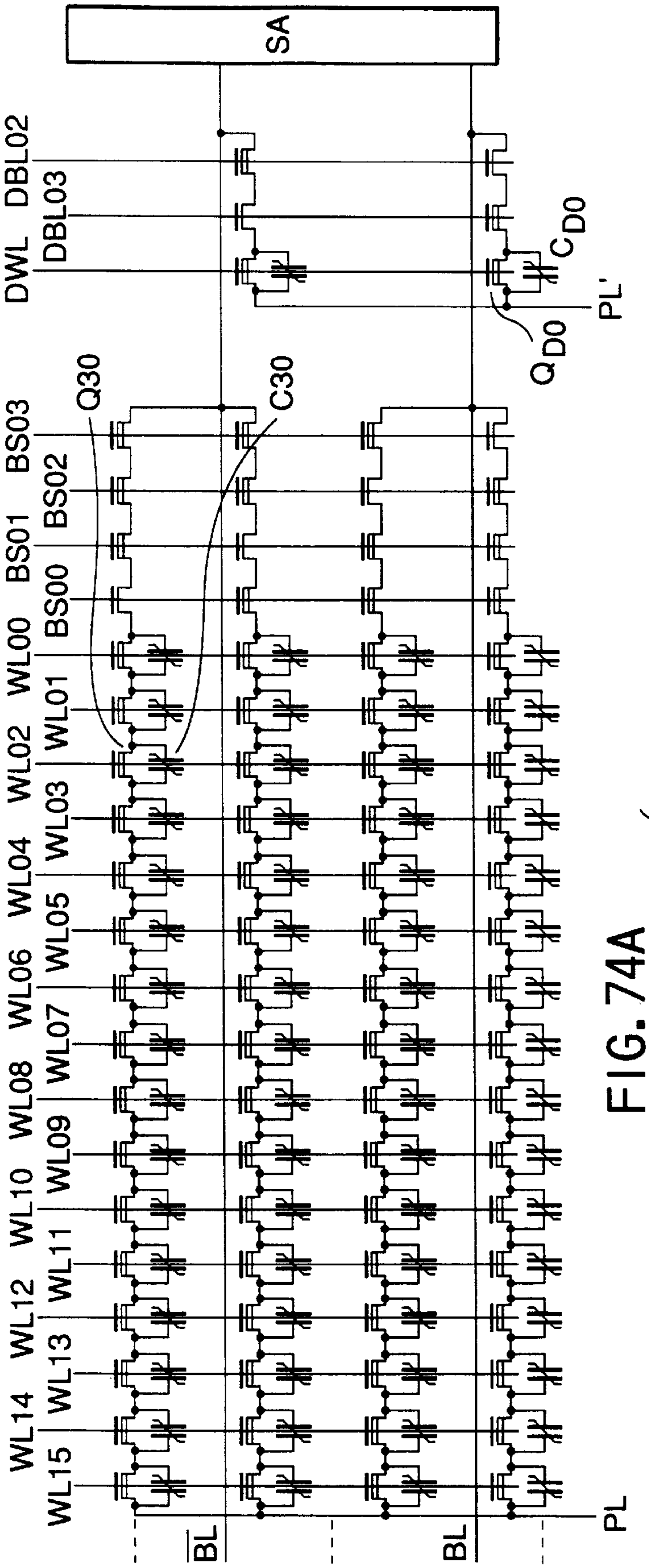
FIG. 74A and FIG. 74B are a circuit diagram and a timing chart, respectively, showing an equivalent circuit of an FRAM according to the 47th embodiment.
Figure 74B:
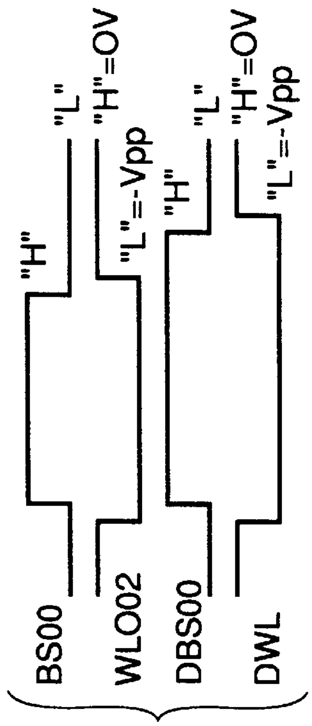

FIG. 74A and FIG. 74B are an equivalent circuit diagram a timing chart, respectively, showing the memory cell structure of an FRAM according to the 47th embodiment of the present invention.

In FIG. 74A, a depletion-type transistor is employed as the memory cell transistor of the embodiment shown in FIG. 67A. The dummy cell transistor also uses a depletion-type transistor.

In this embodiment, the following effects can be obtained in addition to the effects of the embodiment shown in FIG.

67A and FIG. 67B, as in FIG. 52 and FIG. 51. (1) The word line leakage in the stand-by state poses no problem. (2) No high voltage is applied in the stand-by state. (3) The device is resistant to noise and sudden power OFF. (4) In both the power-OFF state and the stand-by state, the device is resistant to a software error caused by a radiation.

48th Embodiment

Figure 75A:
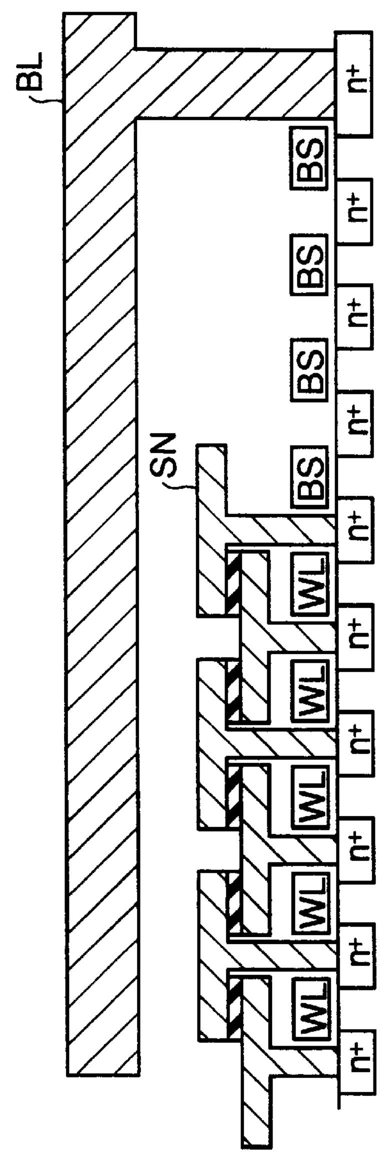
FIG. 75A and FIG. 75B are sectional and plan views, respectively, showing the device structure of an FRAM according to the 48th embodiment.
Figure 75B:
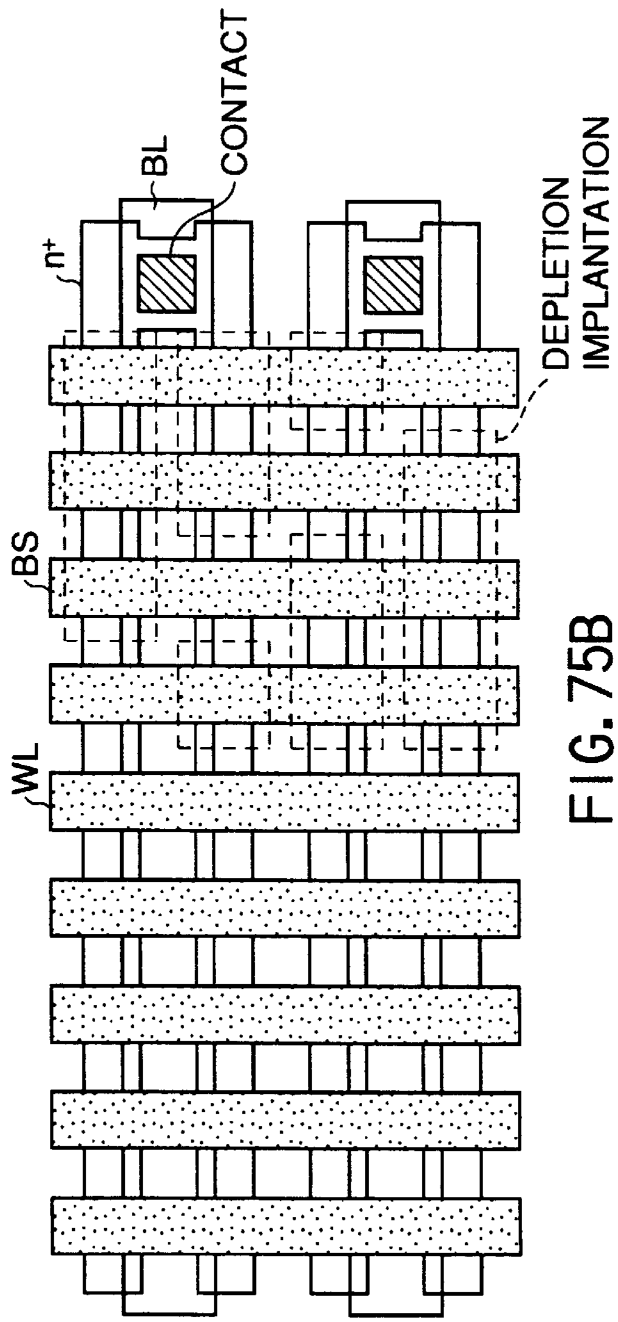

FIG. 75A and FIG. 75B are sectional and plan views, respectively, showing the memory cell structure of an FRAm according to the 48th embodiment of the present invention. This structure equivalently corresponds to that shown in FIG. 63A.

Four block selection lines are constituted by gate interconnection. Three of four select transistors connected in series are formed as depletion-type transistors by performing ion implantation using an ion implantation mask for D-type transistor formation. In this case, the bit line pitch is largely relaxed to twice the cell pitch.

49th Embodiment

Figure 76A:
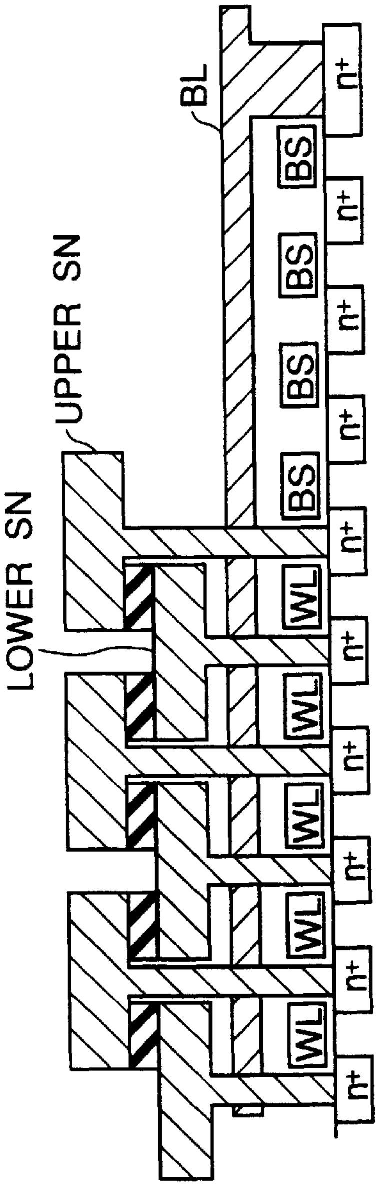
FIG. 76A and FIG. 76B are sectional and plan views, respectively, showing the device structure of an FRAM according to the 49th embodiment.
Figure 76B:
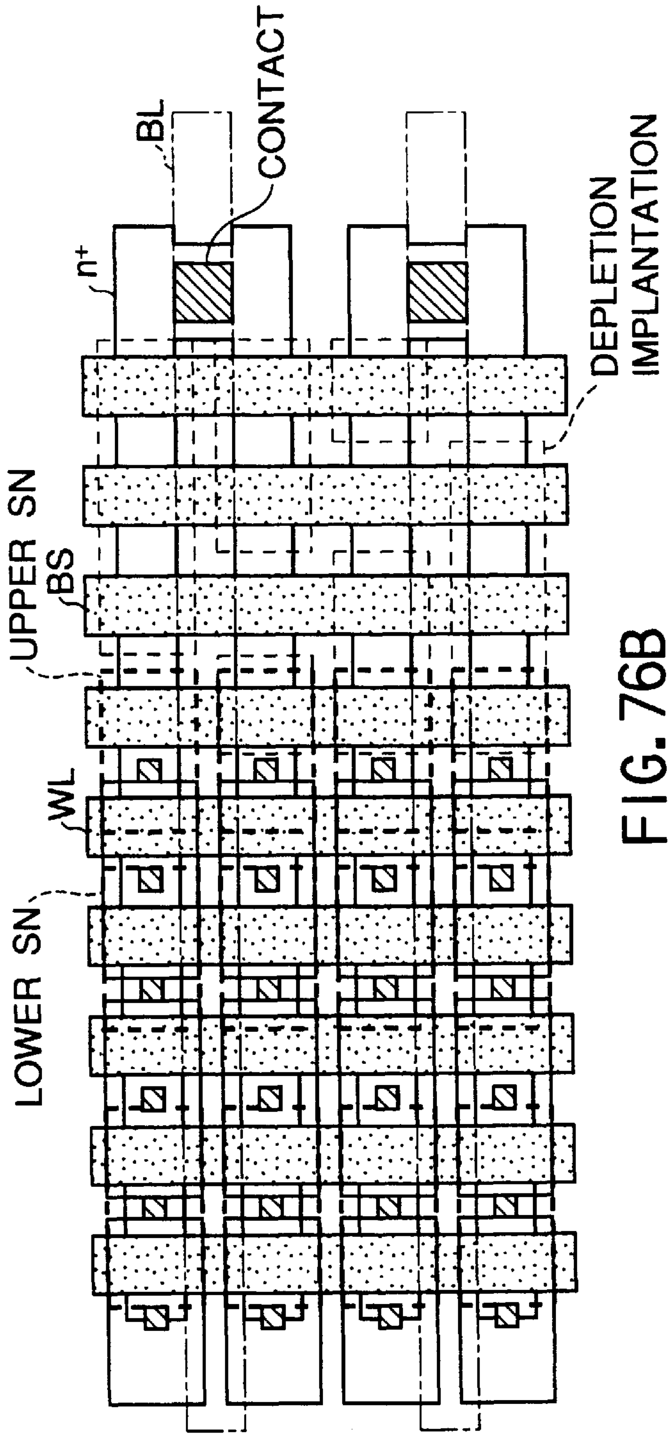

FIG. 76A and FIG. 76B are sectional and plan views, respectively, showing the memory cell structure of an FRAM according to the 49th embodiment of the present invention. This structure equivalently corresponds to that shown in FIG. 63A. In FIG. 75A and FIG. 75B, bit lines are formed after formation of ferroelectric capacitors. However, in FIG. 76A and FIG. 76B, ferroelectric capacitors are formed after formation of bit lines.

In a cell structure in which bit lines are formed after formation of ferroelectric capacitors, an storage node SN must be extended from the region between bit line interconnections. This requires to shift the bit line contacts by a ½ pitch, so that an excess area is necessary at the bit line portion. In FIG. 76A and FIG. 76B, a bit line is shared by two cell blocks. For this reason, the bit line can be extended between cells of two cell blocks, as shown in FIG. 76A and FIG. 76B. The bit line and the cell node are automatically shifted by a ½ pitch, so that the storage node can be extended to the above portion from the region between the bit line interconnections without any overhead area.

As an additional advantage, the design rule for the bit line contact portion is doubled. As shown in FIG. 76A and FIG. 76B, the bit line contact size and the alignment margin can be increased.

50th Embodiment

Figure 77A:
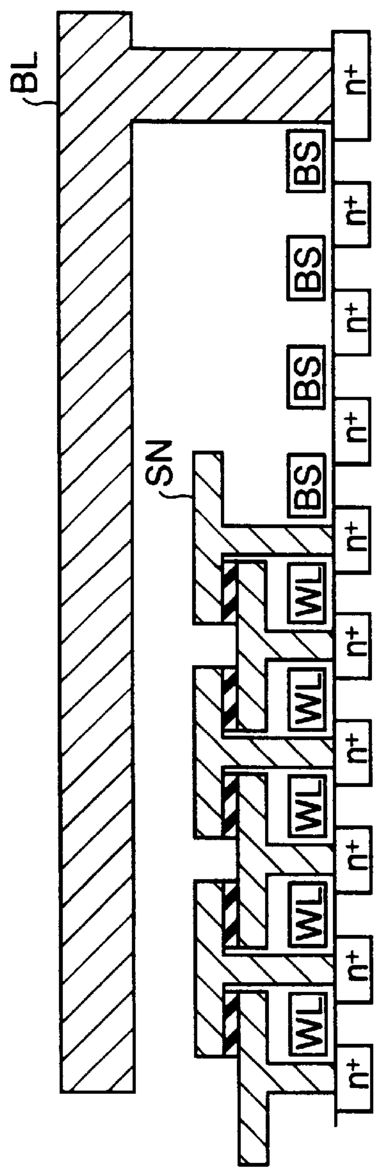
FIG. 77A and FIG. 77B are sectional and plan views, respectively, showing the device structure of an FRAM according to the 50th embodiment.
Figure 77B:
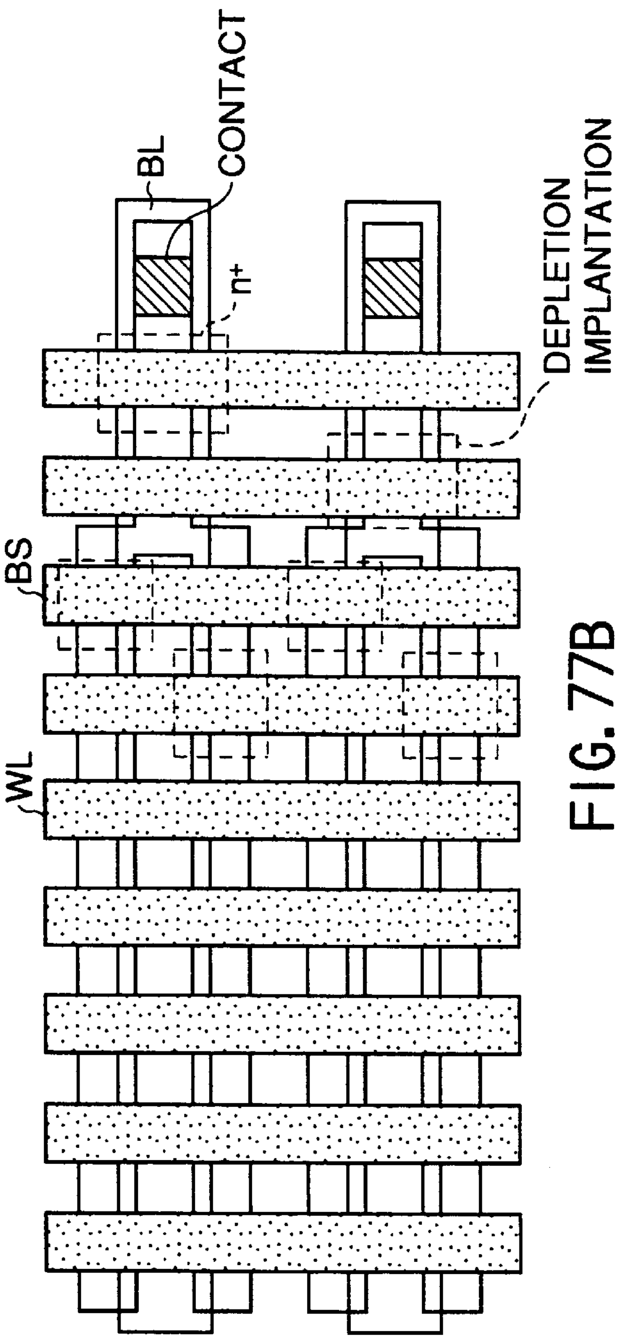

FIG. 77A and FIG. 77B are sectional and plan views, respectively, showing the memory cell structure of an FRAM according to the 50th embodiment of the present invention. This structure equivalently corresponds to that shown in FIG. 72A.

Four block selection lines are constituted by gate interconnection, and the rule of two select transistors close to the bit line is relaxed to twice. In this embodiment, the two select transistors close to the bit line have the same size. The rule of interval is relaxed to three times to reduce the gate capacity of the select transistor. In this embodiment as well, the bit line pitch and the bit line contact pitch are largely relaxed to twice the cell pitch.

51st Embodiment

Figure 78A:
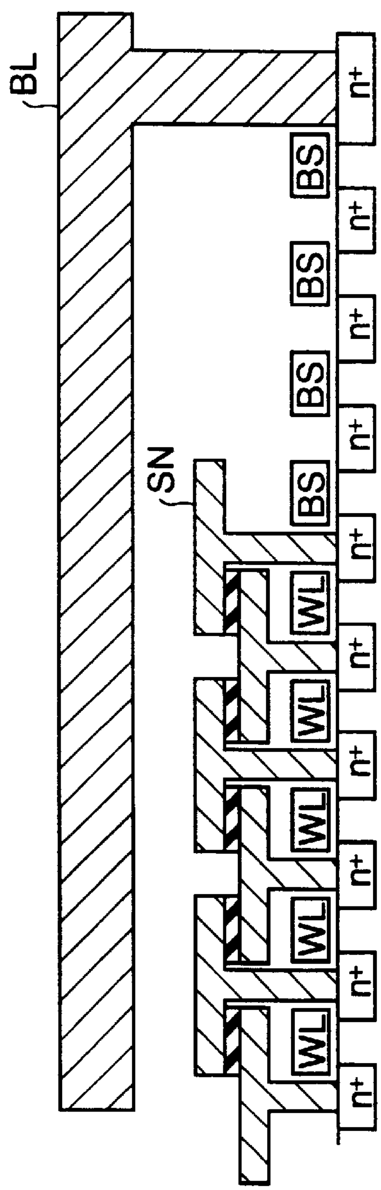
FIG. 78A and FIG. 78B are sectional and plan views, respectively, showing the device structure of an FRAM according to the 51st embodiment.
Figure 78B:
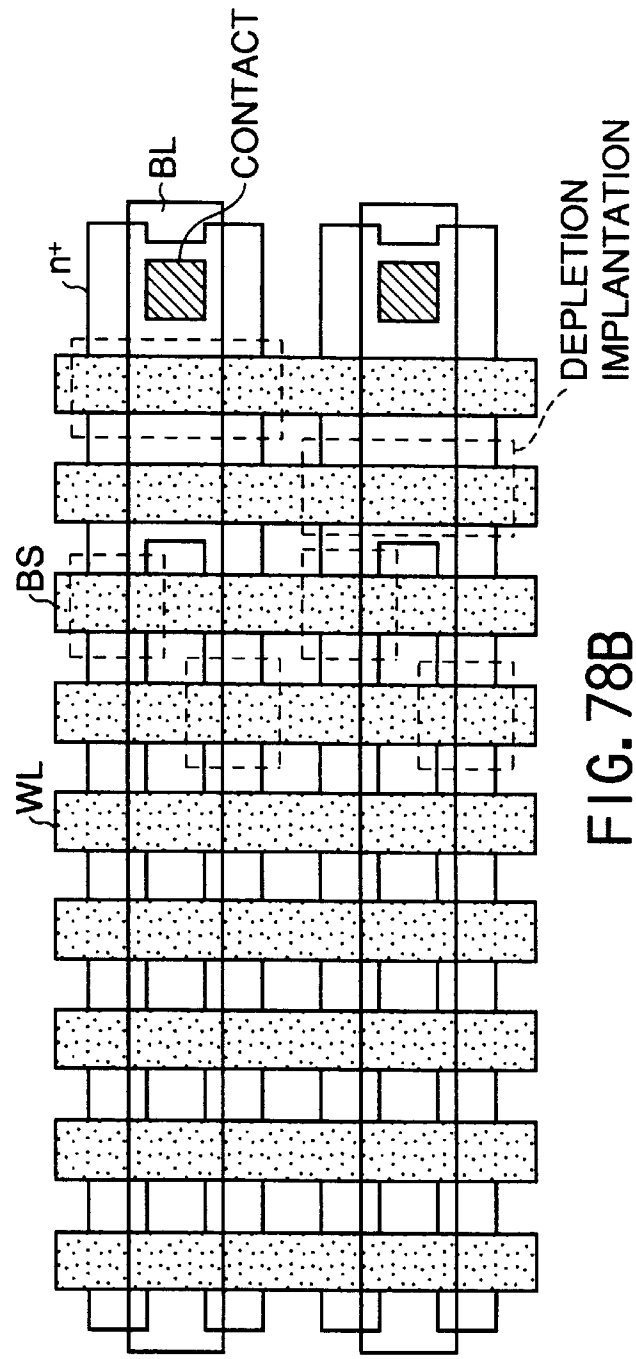

FIG. 78A and FIG. 78B are sectional and plan views, respectively, showing the memory cell structure of an FRAm according to the 51st embodiment of the present invention. This structure equivalently corresponds to that shown in FIG. 72A.

Four block selection lines are constituted by gate interconnections, and the rule of two select transistors close to the bit line is relaxed to twice. In this embodiment, the size of the two select transistors close to the bit line is relaxed to three times, so that the rule of interval is the same as that of the prior art. In this embodiment as well, the bit line pitch and the bit line contact pitch are largely relaxed to twice the cell pitch.

FIG. 79A to FIG. 81B show simulation/evaluation results quantitatively representing the effects of the present invention.

Figure 79B:
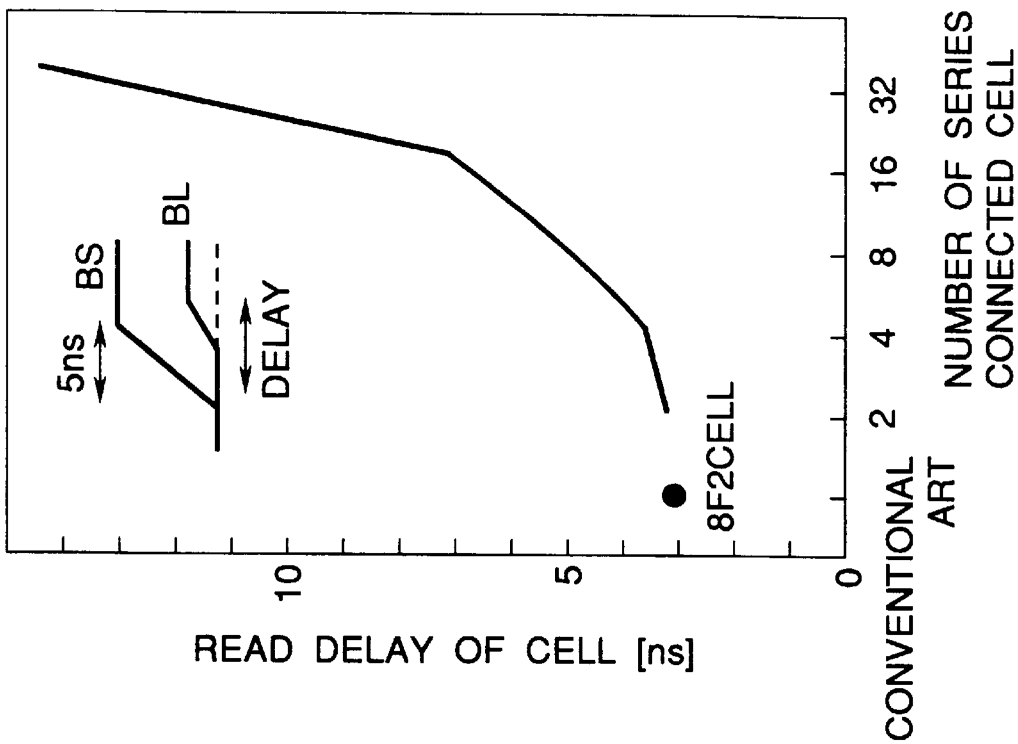
FIG. 79A and FIG. 79B are graphs showing the dependencies of the bit line capacity and read delay of the FRAM on the number of series connected cells in the present invention.
Figure 79A:
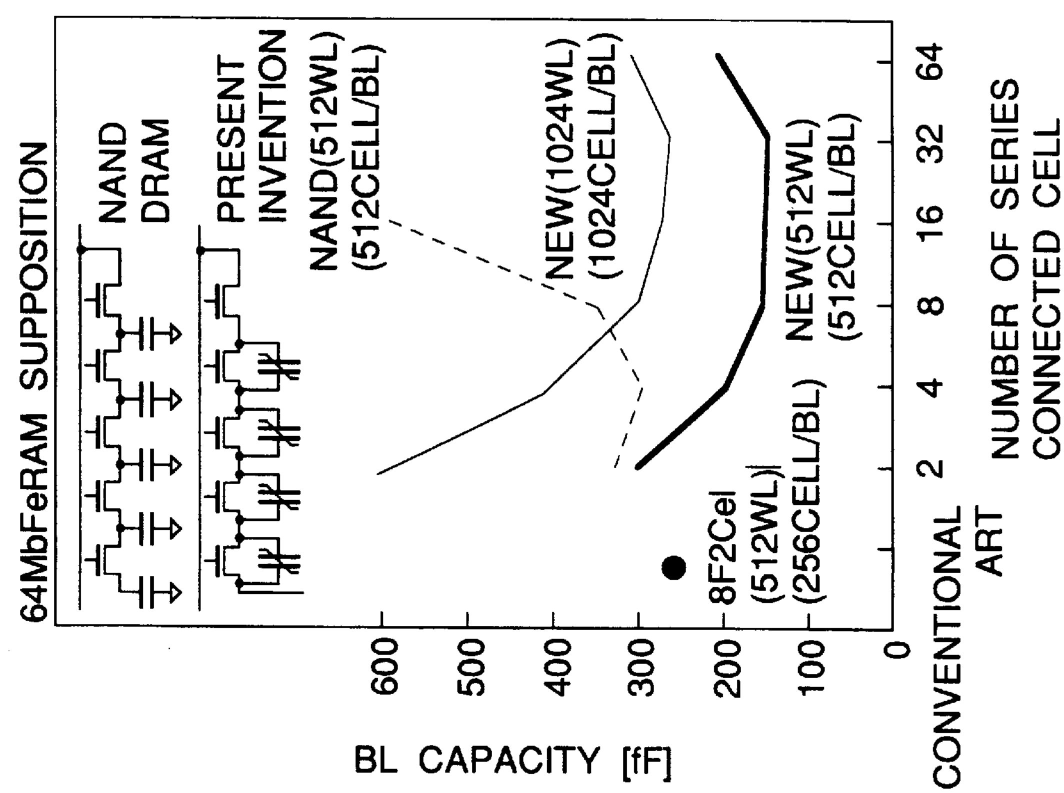

FIG. 79A shows the bit line capacity with respect to the number of series connected cells of the present invention assuming a 64-Mbit FRAM with a 0.45 $\mu$m rule. When the number of word lines connected one bit line is 512, the bit line capacity of the conventional FRAM having a size of $8F^2$ is about 265 fF. In the present invention, as the number of series connected cells increases, the bit line capacity is largely reduced. When the number of series connected cells is about 8, 16, or 32, the bit line capacity can be reduced to about ¼ that of the conventional cell. This is because as the number of series connected cells increases, the number of bit line contacts decreases to reduce the bit line capacity.

In the NAND DRAM shown in FIG. 79A, when the number of series connected cells is increased, and data of the farthest cell from the bit line contact is to be read out, cells on the way seem as a bit line capacity. When the number of series connected cells is larger than 4, the bit line capacity conversely appears. According to the present invention, since cell capacitors of the cells on the way are short-circuited, no voltage is applied between the capacitors, and no capacity appears. Unless the number of series connected cells is 64 or more, no disadvantage occurs. Conversely speaking, even when the number of cells connected to one bit line is increased to four times, i.e., 1,024, the same bit line capacity as in the prior art can be maintained. Consequently, the number of sense amplifiers can be reduced to ¼ that of the prior art, and the chip area can be reduced.

FIG. 79B shows the relationship between the number of series connected cells and the cell data read delay in the present invention. Even when the number of series connected cells is 8 or 16, the cell read delay is as small as 1.5 to 4 ns, as compared to the conventional cell with a size of $8F^2$. When the plate electrode driving scheme is employed for the conventional system to omit the refresh operation, a larger delay is generated. In the scheme of the present invention, the refresh operation is not required even in the scheme of fixing the plate electrode at (½)Vcc. As a result, about 16 cells can be sufficiently connected in series without decreasing the operation speed. When the plate electrode driving scheme is employed, it is faster than the conventional ones because it is easy to snap the Al or Cu wiring the plate.

Figure 80B:
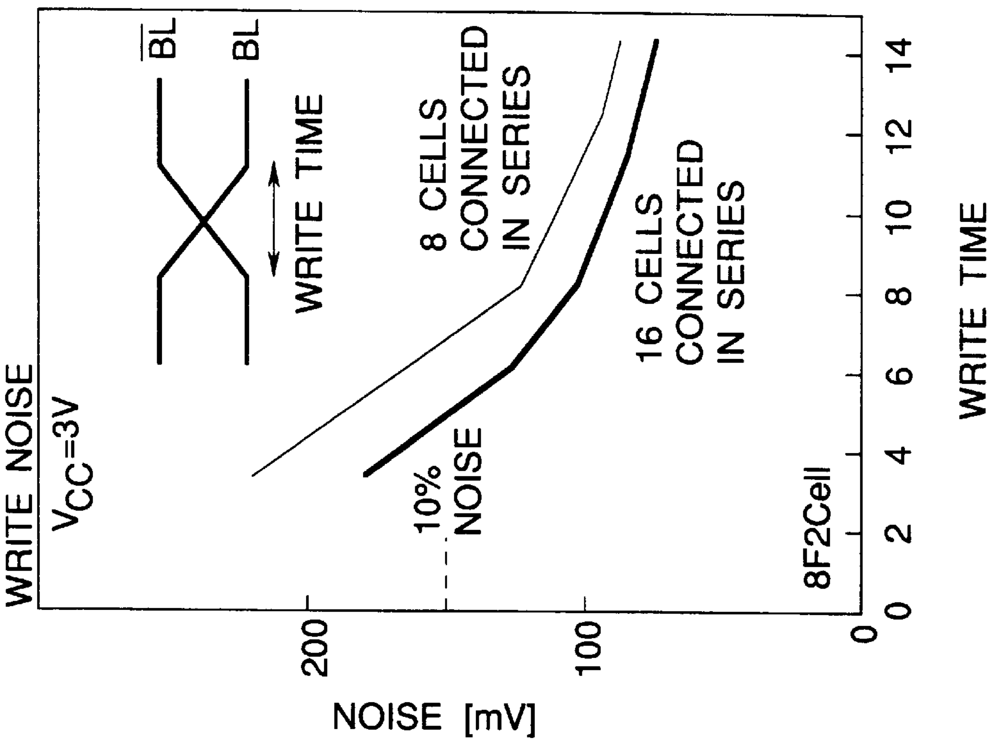
FIG. 80A and FIG. 80B are graphs showing the dependencies of noise in reading/writing in the FRAM on the number of series connected cells and the write speed in the present invention.
Figure 80A:
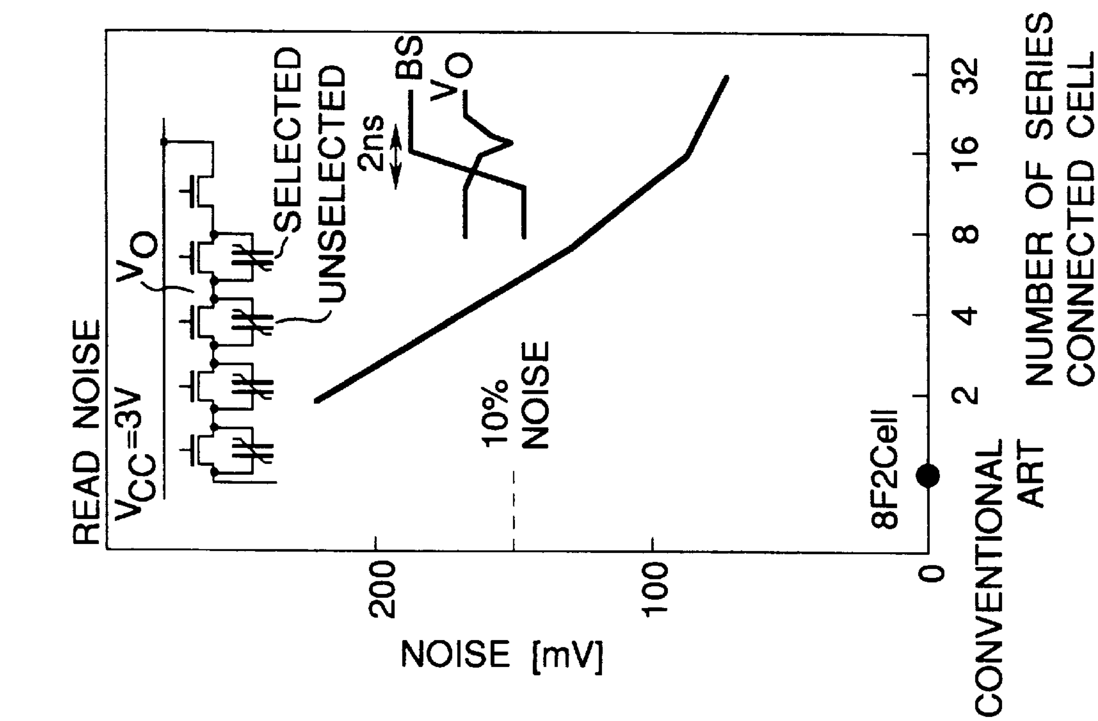

FIG. 80A and FIG. 80B show problems unique to the present invention. In the cell read/write operation of this scheme, unselected memory cells other than a selected memory cell in a selected cell block are theoretically short-circuited because the word line is kept at "H", and no voltage is supposed to be applied between two electrodes of the ferroelectric capacitor of each unselected cell. However, the transistor of the unselected cell has an ON resistance. For this reason, in reading cell data (FIG. 80A) or in writing cell data opposite to cell data read access, a voltage difference may be instantaneously generated, although the time is very short, to destroy the unselected cell data.

However, this problem can also be minimized as the number of series connected cells increases. Even when the number of series connected cells increases, the entire applied voltage does not change. The maximum applied voltage per cell lowers as the ratio (applied voltage/the number of series connected cells) lowers. Therefore, a sufficient margin can be obtained by increasing the number of series connected cells. (Noise can be made lower than 10% of the write voltage of the selected cell). This also applies to writing. As shown in FIG. 80B, as the write time becomes longer, the problem of write noise is also relaxed. Since the unit of the write time is normally several ten ns, the noise can be made lower than 10% with a sufficient margin, as shown in FIG. 80B.

Figure 81A:
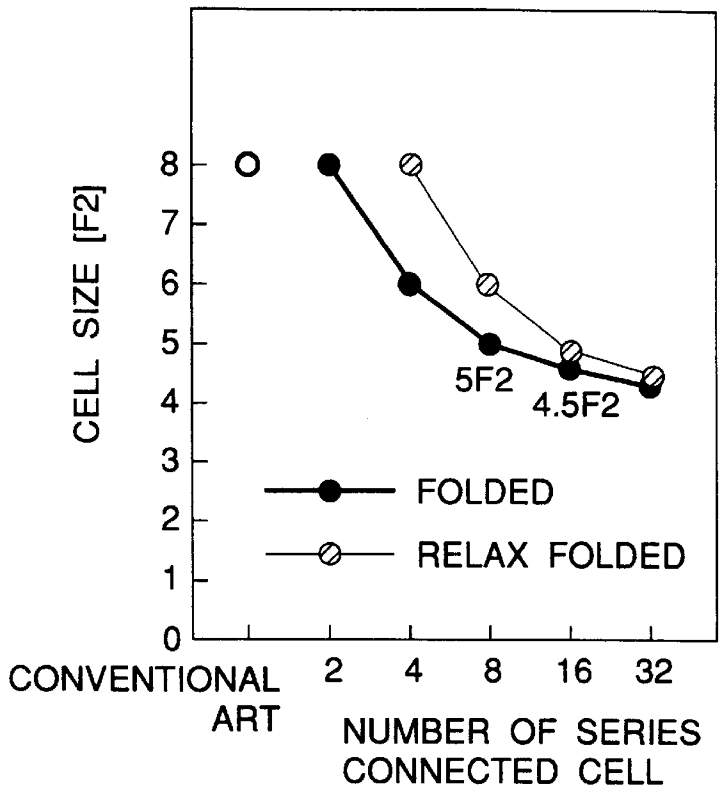
FIG. 81A and FIG. 81B are graphs showing the dependencies of the cell size and chip size of the FRAM on the number of series connected cells in the present invention.
Figure 81B:
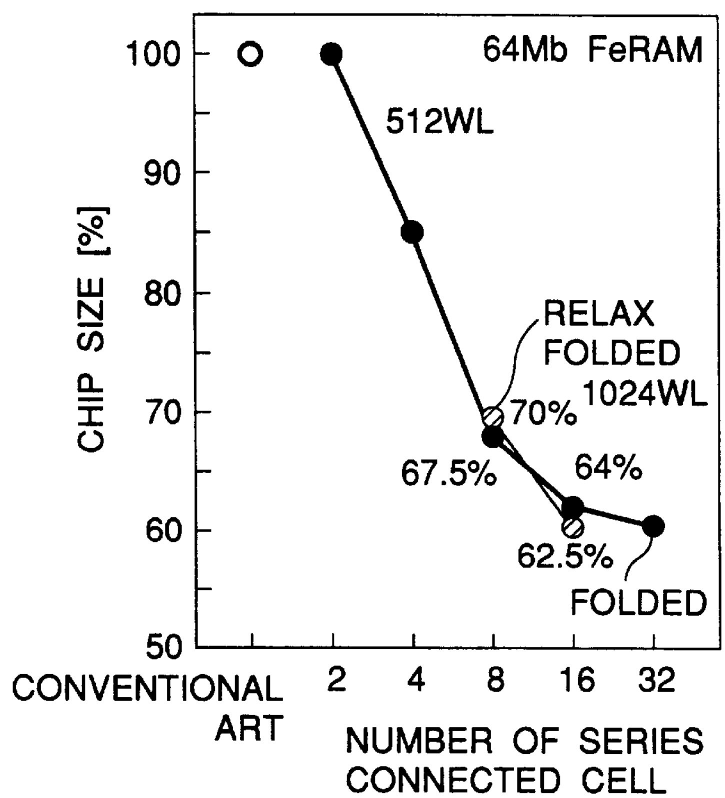

FIG. 81A and FIG. 81B show the dependencies of the cell size and chip size on the number of series connected cells in the present invention. As shown in FIG. 81A, as the number of series connected cells increases, the ratio of select transistors to the cell area lowers and approaches the minimum theoretical value of $4F^2$. From the viewpoint of the read speed, the number of series connected cells can be increased to about 8 to 16. (If a lower read speed is allowed, the cell size can be further reduced). Therefore, a cell size of about $4.5F^2$ to $5F^2$ can be easily realized. As the number of series connected cells increases, the chip size can be reduced.

In the bit line rule relaxation type folded bit line structure, the number of select transistors increases to make the cell block size larger than that of the folded bit line structure. However, the number of sense amplifiers can be halved. Therefore, when the number of series connected cells is 16 or more, the disadvantage of the increase in the number of select transistors is eliminated, and the chip size can be reduced conversely.

52nd Embodiment

Figure 82:
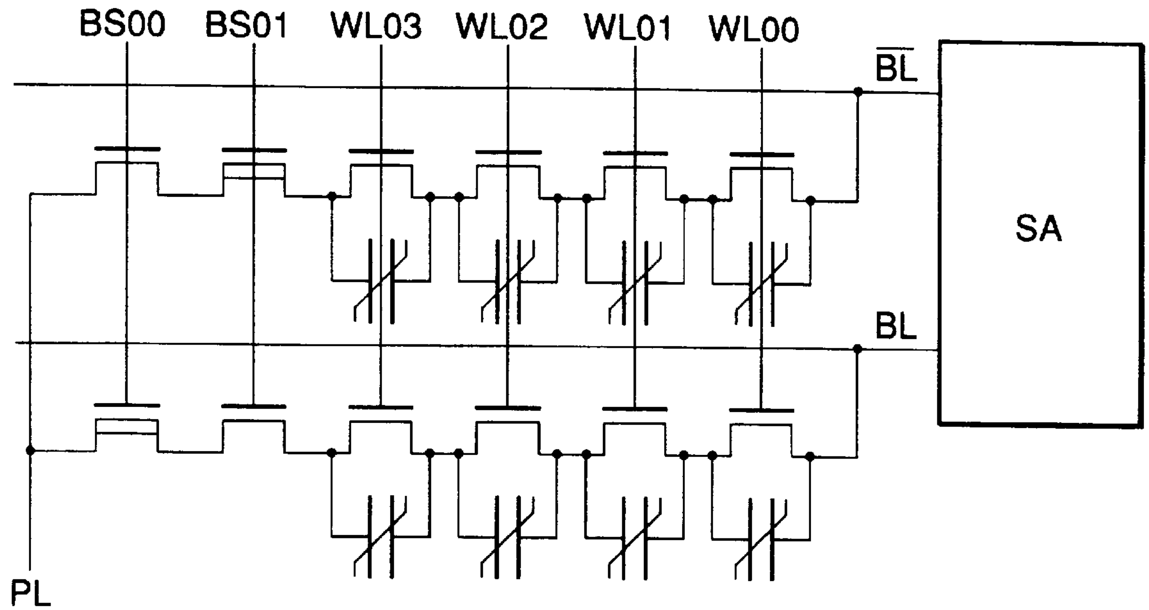
FIG. 82 is an equivalent circuit diagram of an FRAM according to the 52nd embodiment.

FIG. 82 is an equivalent circuit diagram showing the memory cell structure of an FRAM according to the 52nd embodiment of the present invention.

In the above-described embodiments, a ferroelectric capacitor and a cell transistor are connected in parallel. A plurality of such structures are connected in series, and a select transistor is inserted to a connection portion to a bit line.

In the above-described embodiments, the select transistor may be connected to a plate electrode PL side, as shown in FIG. 82. Alternatively, the select transistor may be inserted to the midway of the series connected cells each having the ferroelectric capacitor and the cell transistor connected in parallel. When the select transistor is connected to the plate electrode PL side, the ferroelectric capacitor is short-circuited, and the capacity does not appear. However, the channel capacity generated when the remaining transistors are turned on appears as an increase in bit line capacity.

53rd Embodiment

Figure 83:
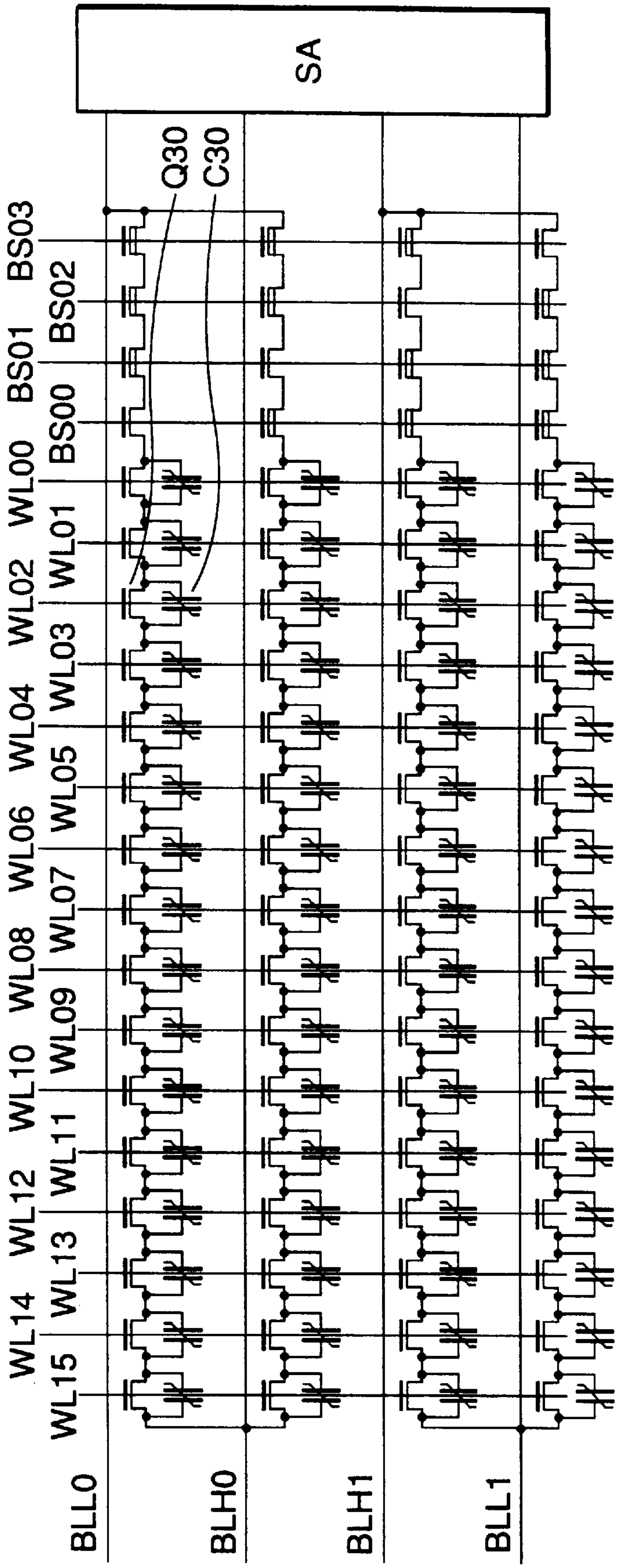
FIG. 83 is an equivalent circuit diagram of an FRAM according to the 53rd embodiment.

FIG. 83 is an equivalent circuit diagram showing the memory cell structure of an FRAM according to the 53rd embodiment of the present invention.

In the above-described embodiments, a ferroelectric capacitor and a cell transistor are connected in parallel. Such structures are connected in series, one terminal is connected to a bit line through a select transistor, and the other terminal is connected to a plate electrode PL. In FIG. 83, one terminal is connected to a bit line (BLL0), and the other terminal is connected to a bit line (BLH0).

With this structure, a potential difference is generated between the bit lines BLL0 and BLH0 to float the bit lines BLL0 and BLH0. The block selection line is set at "H", and the word line is set at "L" to read out cell data. For data "0", charges corresponding to −(Pr+Ps) are read out to the bit line BLH0 side, and charges corresponding to +(Pr+Ps) are read out to the bit line BLL0 side. As compared to the above-described embodiments, a readout charge amount can be obtained about twice. This allows to improve the read margin and reduce the cell capacitor area.

Although the select transistor is connected only to one side, the node potential of an unselected cell is Vcc or more or Vss or less, so the reliability does not degrade. When this system is employed to the conventional cell, the floating cell node is set at Vcc or more or Vss or less through capacitor coupling. However, in this embodiment, the cell transistor of the unselected cell is turned on to short-circuit the ferroelectric capacitor, and no problem is posed.

Bit lines BLH1 and BLL1 serve as reference bit lines, so that a folded bit line structure is constituted. When data is to be read out to the bit lines BLH1 and BLL1, the bit lines BLH0 and BLL0 serve as reference bit lines. The sense amplifier determines data "1" or "0" on the basis of the potential difference (BLH0−BLL0) or (BLH1−BLL1).

54th Embodiment

Figure 84:
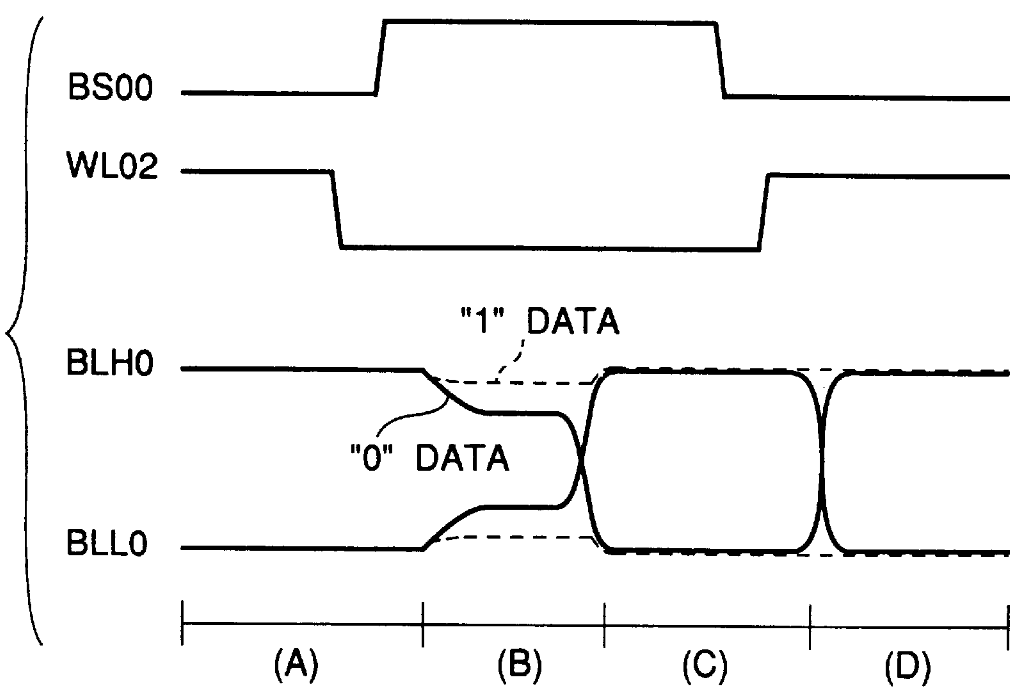
FIG. 84 is a timing chart showing the operation of an FRAM according to the 54th embodiment.

FIG. 84 is a timing chart for explaining the 54th embodiment of the present invention. FIG. 84 shows an example of the operation of the embodiment shown in FIG. 83.

In the precharge operation, a bit line BLH0 is set at Vcc, and a bit line BLL0 is set at Vss. In the active state, the bit lines BLH0 and BLL0 are set in a floating state. A block selection line BS00 is set at "H", and a word line WL02 is set at "L" to read out cell data (Q30, C30) (time (A)).

For data "0", charges corresponding to −(Pr+Ps) are read out to the bit line BLH0 side, and charges corresponding to +(Pr+Ps) are read out to the bit line BLL0 side. As compared to the above-described embodiments, a readout charge amount can be obtained about twice. If the potential difference between the bit lines BLH0 and BLL0 is larger than a reference, the potential difference is amplified by the sense amplifier as data "1". If the potential difference is smaller than the reference, the potential difference is amplified as data "0" (time (B)). In time (C), write (restore) is performed. In time (D), the bit lines BLH0 and BLL0 are precharged to Vcc and Vss, respectively. The solid line in FIG. 84 represents an example of the data "0" read/rewrite operation, and the dotted line represents an example of the data "1" read/rewrite operation.

55th Embodiment

Figure 85:
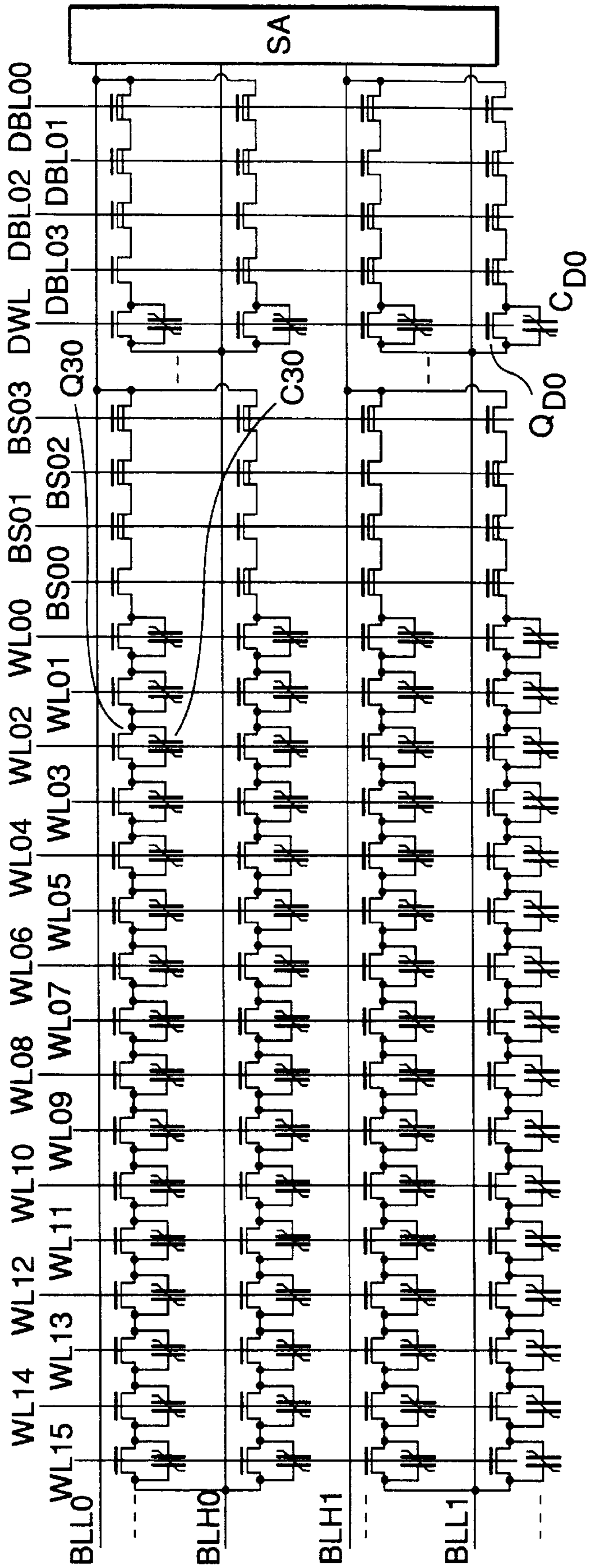
FIG. 85 is an equivalent circuit diagram of an FRAM according to the 55th embodiment.

FIG. 85 is an equivalent circuit diagram showing the memory cell structure of an FRAM according to the 55th embodiment of the present invention. In this embodiment, one of the embodiments of a dummy cell is added to the embodiment shown in FIG. 83.

In this embodiment, dummy cells have the same structure as the cell structure, i.e., one terminal of the dummy cell is connected to a bit line (BLL0) through a select transistor, and the other terminal is connected to an opposite bit line (BLH0).

With this structure, data "1" is necessarily read out from the dummy cell. Charges corresponding to −(Ps'−Pr') are read out to the bit line BLH0 side, and charges corresponding to +(Ps'−Pr') are read out to the bit line BLL0 side. As compared to the above-described embodiments, a readout charge amount can be obtained about twice. When the dummy cell size is increased such that Ps of the cell=Ps'−Pr', intermediate data between data "1" and data "0" of the cell is read out.

56th Embodiment

Figure 86:
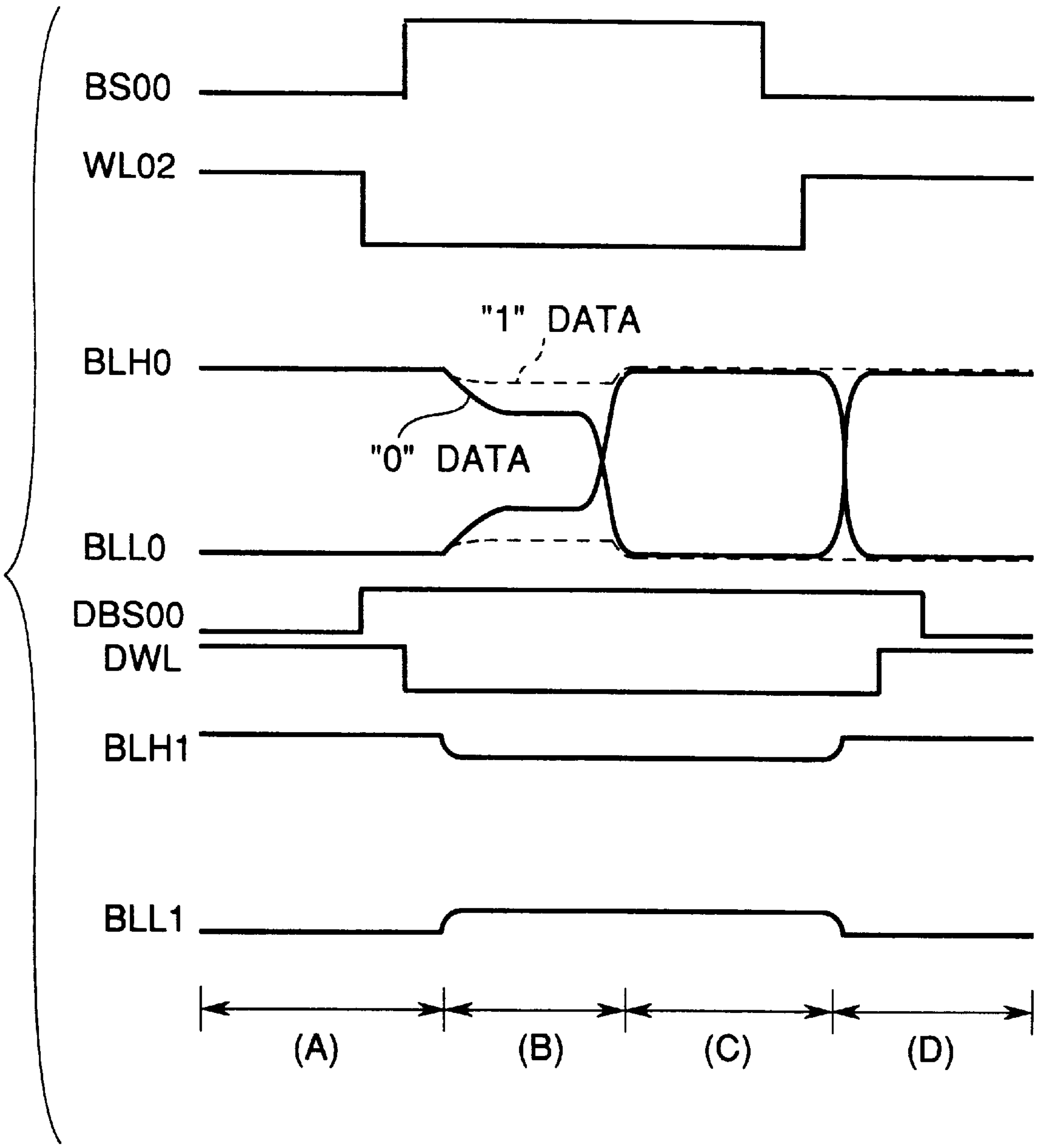
FIG. 86 is a timing chart showing the operation of an FRAM according to the 56th embodiment.

FIG. 86 is a timing chart for explaining the 56th embodiment of the present invention. FIG. 86 shows an example of the operation of the embodiment shown in FIG. 85.

In the precharge operation, a bit line BLH0 is set at Vcc, and a bit line BLL0 is set at Vss. In the active state, the bit lines BLH0 and BLL0 are set in a floating state. A block selection line BS00 is set at "H", and a word line WL02 is set at "L" to read out cell data (Q30, C30). Simultaneously, a selection block line DBS00 for dummy cell is set at "H", and a dummy word line DWL is set at "L" to read out dummy cell data "1" to a bit line BLH1 side and a bit line BLL1 side. The dummy cell size is larger than the normal cell size, so that the signal has an intermediate value between data "1" and data "0" of the normal cell (time (A)).

For data "0", charges corresponding to −(Pr+Ps) are read out to the bit line BLH0 side, and charges corresponding to +(Pr+Ps) are read out to the bit line BLL0 side. As compared to the above-described embodiments, a readout charge amount can be obtained about twice. If the potential difference between the bit lines BLH0 and BLL0 is larger than the potential difference between the reference bit lines BLH1 and BLL1, the potential difference is amplified by the sense amplifier as data "1". If the potential difference is smaller, the potential difference is amplified as data "0" (time (B)). In time (C), write (restore) is performed.

In time (D), the bit lines BLH0 and BLL0 are precharged to Vcc and Vss, respectively, and the bit lines BLH1 and BLL1 to Vcc and Vss, respectively. The original data "1" is written in the dummy cell. The solid line in FIG. 86 represents an example of the data "0" read/rewrite operation, and the dotted line represents an example of the data "1" read/rewrite operation.

57th Embodiment

Figure 87:
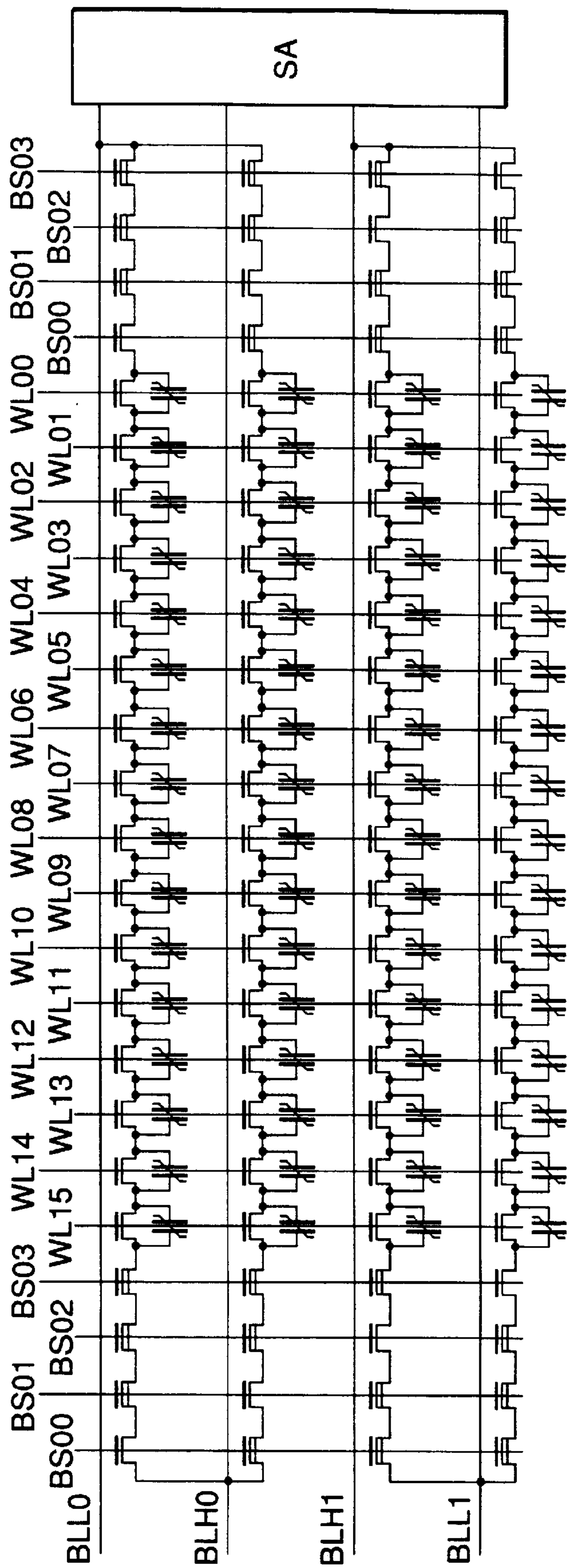
FIG. 87 is an equivalent circuit diagram of an FRAM according to the 57th embodiment.

FIG. 87 is an equivalent circuit diagram showing the memory cell structure of an FRAM according to the 57th embodiment of the present invention.

Unlike the embodiment shown in FIG. 83, select transistors are inserted to both terminals of the series connected cells and connected to bit lines BLH0 and BLL0. In this case, although the cell block size becomes large, the parasitic capacity excluding the capacity of the ferroelectric capacitors in the series connected cells can be made invisible on both sides of the bit lines BLH0 and BLL0.

58th Embodiment

Figure 88:
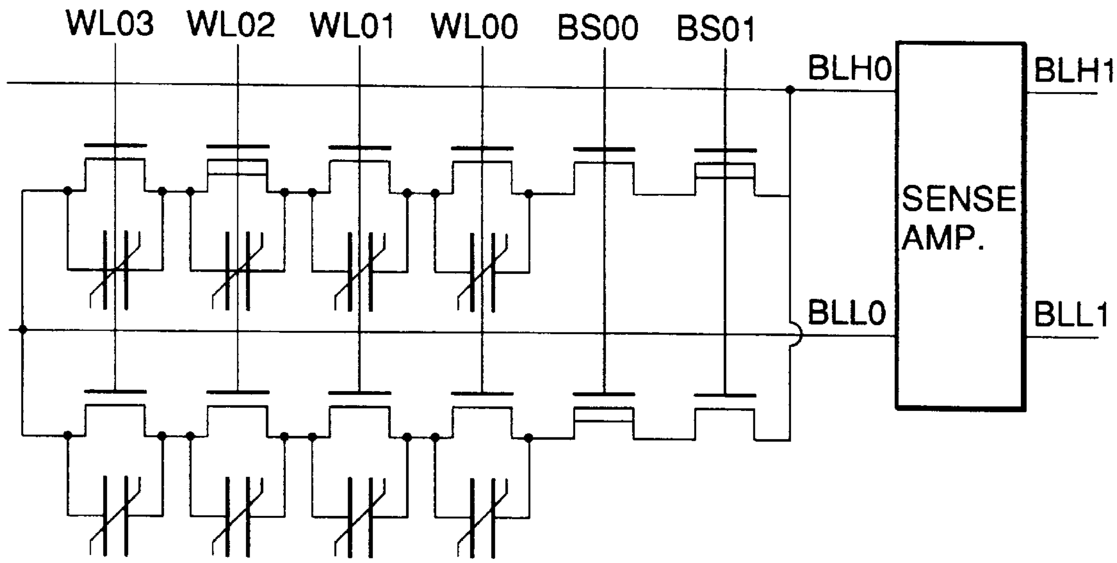
FIG. 88 is an equivalent circuit diagram of an FRAM according to the 58th embodiment.

FIG. 88 is an equivalent circuit diagram showing the memory cell structure of an FRAM according to the 58th embodiment of the present invention.

FIG. 83 to FIG. 87 show a folded bit line structure in which the reference bit lines are arranged on the same cell array mat. FIG. 88 shows an open bit line structure in which the reference bit lines are arranged on a cell array mat on an opposite side of the sense amplifier. In this case, the number of select transistors can be halved.

59th Embodiment

Figure 89:
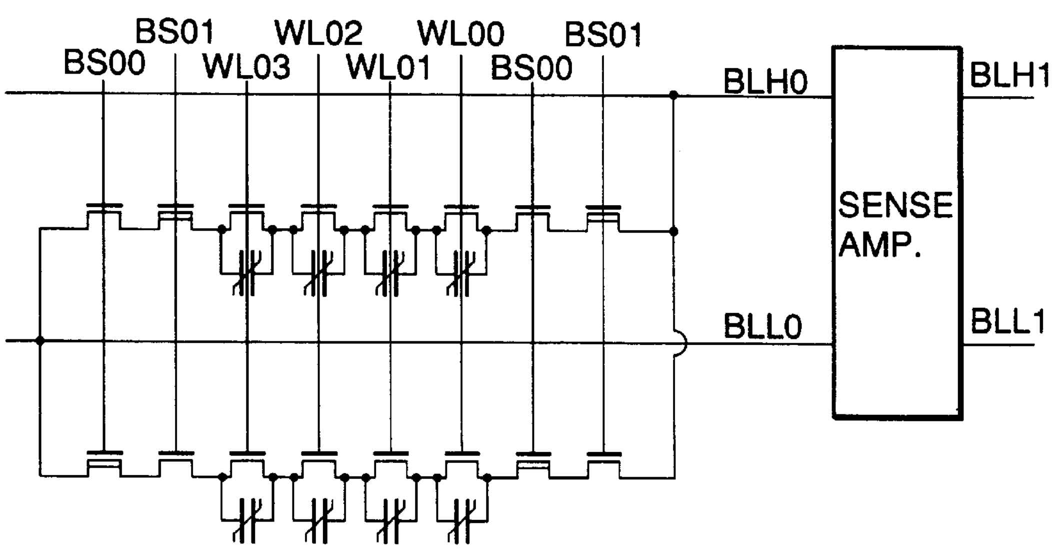
FIG. 89 is an equivalent circuit diagram of an FRAM according to the 59th embodiment.

FIG. 89 is an equivalent circuit diagram showing the memory cell structure of an FRAM according to the 59th embodiment of the present invention.

As in FIG. 88, FIG. 89 shows an open bit line structure in which the reference bit lines are arranged on a cell array mat on an opposite side of the sense amplifier. The select transistors are arranged on both sides of the series connected cells. With this structure, the parasitic capacity in the series connected cells in an unselected block can be made invisible as a bit line capacity.

60th Embodiment

Figure 90A:
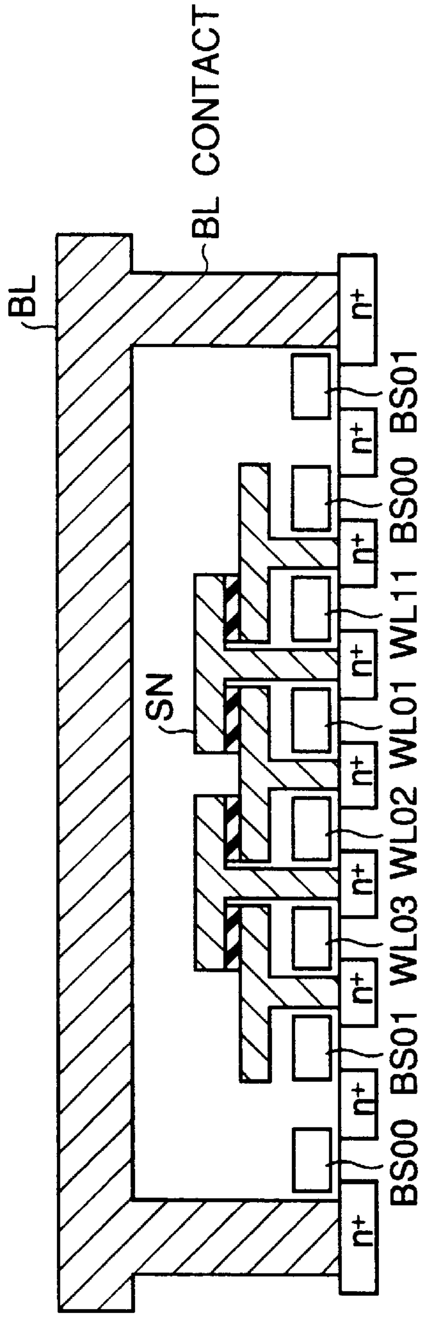
FIG. 90A and FIG. 90B are sectional and plan views, respectively, showing the device structure of an FRAM according to the 60th embodiment.
Figure 90B:
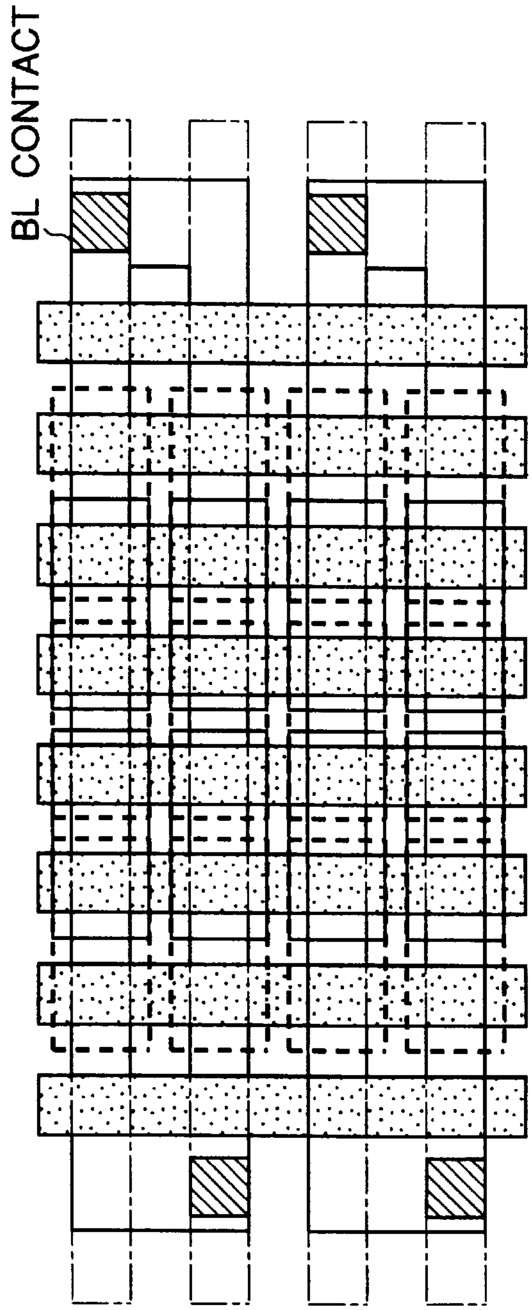

FIG. 90A and FIG. 90B are sectional and plan views, respectively, showing the memory cell structure of an FRAM according to the 60th embodiment of the present invention. This cell structure is equivalent to the circuit shown in FIG. 89.

When the bit line contact between a cell block and a bit line is shifted by a distance corresponding to the cell pitch on both sides of the cell block, as shown in FIG. 90A and FIG. 90B, the cell block can be easily connected to bit lines BLH0 and BLL0. If the select transistor on the left side is omitted, and four select transistors are connected in series on the right side, the structure is equivalent to the circuit shown in FIG. 83.

61st Embodiment

Figure 91:
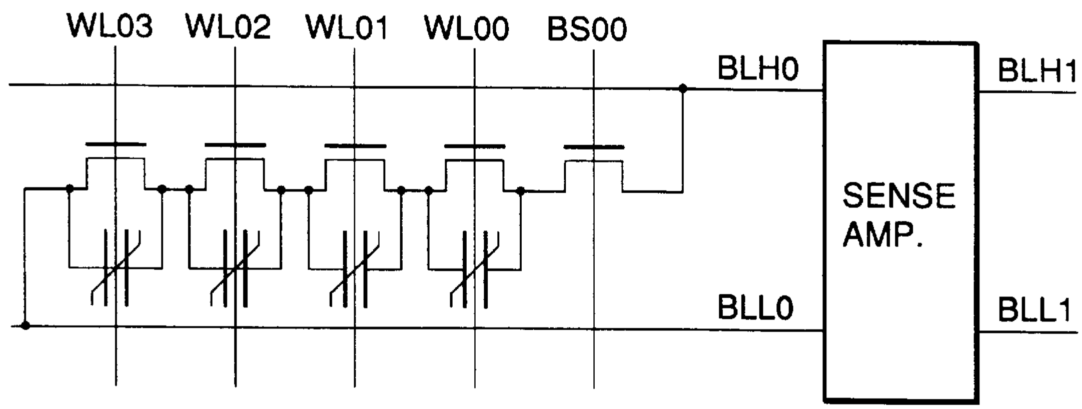
FIG. 91 is an equivalent circuit diagram of an FRAM according to the 61st embodiment.

FIG. 91 is an equivalent circuit diagram showing the memory cell structure of an FRAM according to the 61st embodiment of the present invention.

Structures each having a ferroelectric capacitor and a cell transistor connected in parallel are connected in series. One terminal of the series connected cells is connected to a bit line (BLL0) through only one select transistor, and the other terminal is connected to an opposite bit line (BLH0). With this open bit line structure having a cell size of $8F^2$, a readout charge amount can be obtained about twice.

62nd Embodiment

Figure 92:
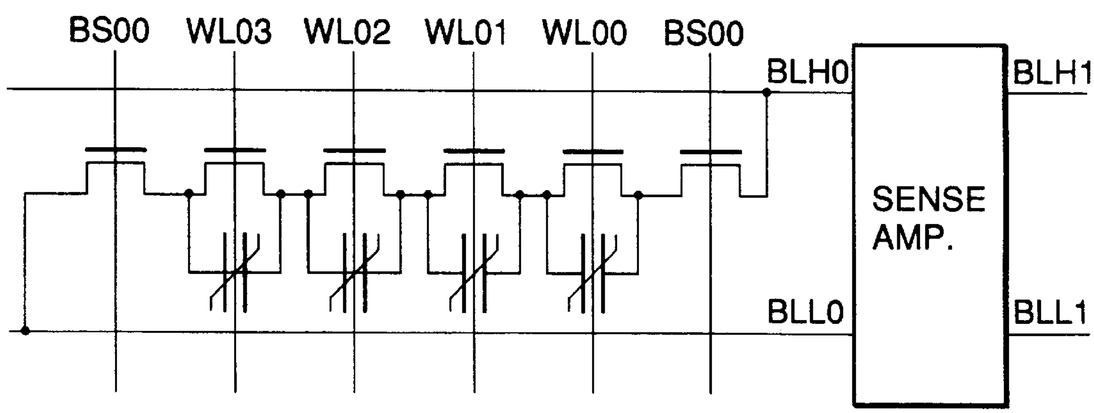
FIG. 92 is an equivalent circuit diagram of an FRAM according to the 62nd embodiment.

FIG. 92 is an equivalent circuit diagram showing the memory cell structure of an FRAM according to the 62nd embodiment of the present invention.

Structures each having a ferroelectric capacitor and a cell transistor connected in parallel are connected in series. One terminal of the series connected cells is connected to a bit line (BLL0) through only one select transistor, and the other terminal is connected to an opposite bit line (BLH0) through only one select transistor. With this open bit line structure having a cell size of $8F^2$, a readout charge amount can be obtained about twice. In addition, the bit line capacity can be prevented from increasing due to the parasitic capacity in the series connected cells.

63rd Embodiment

Figure 93:
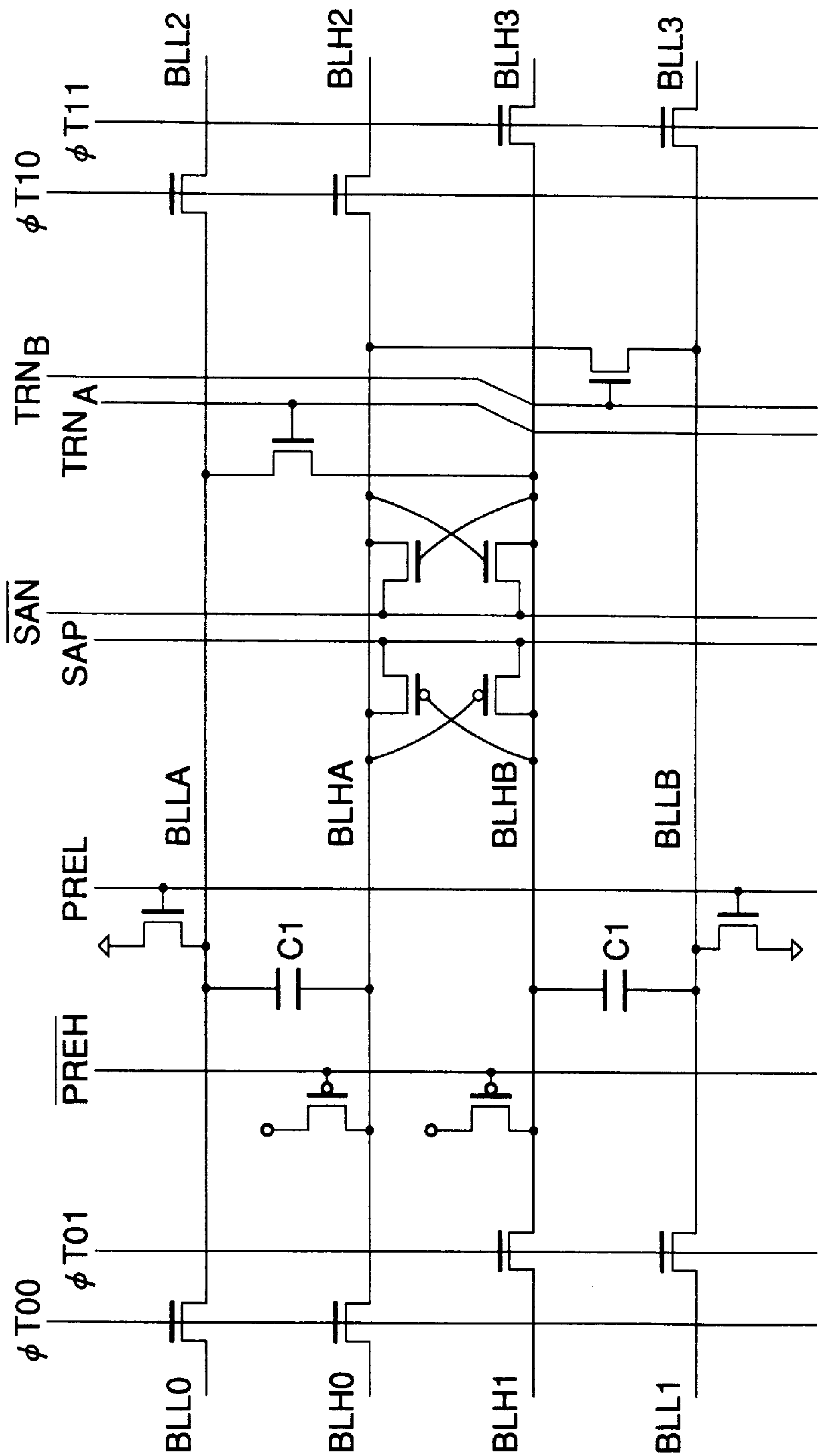
FIG. 93 is a circuit diagram of the sense amplifier of an FRAM according to the 63rd embodiment.
Figure 94:
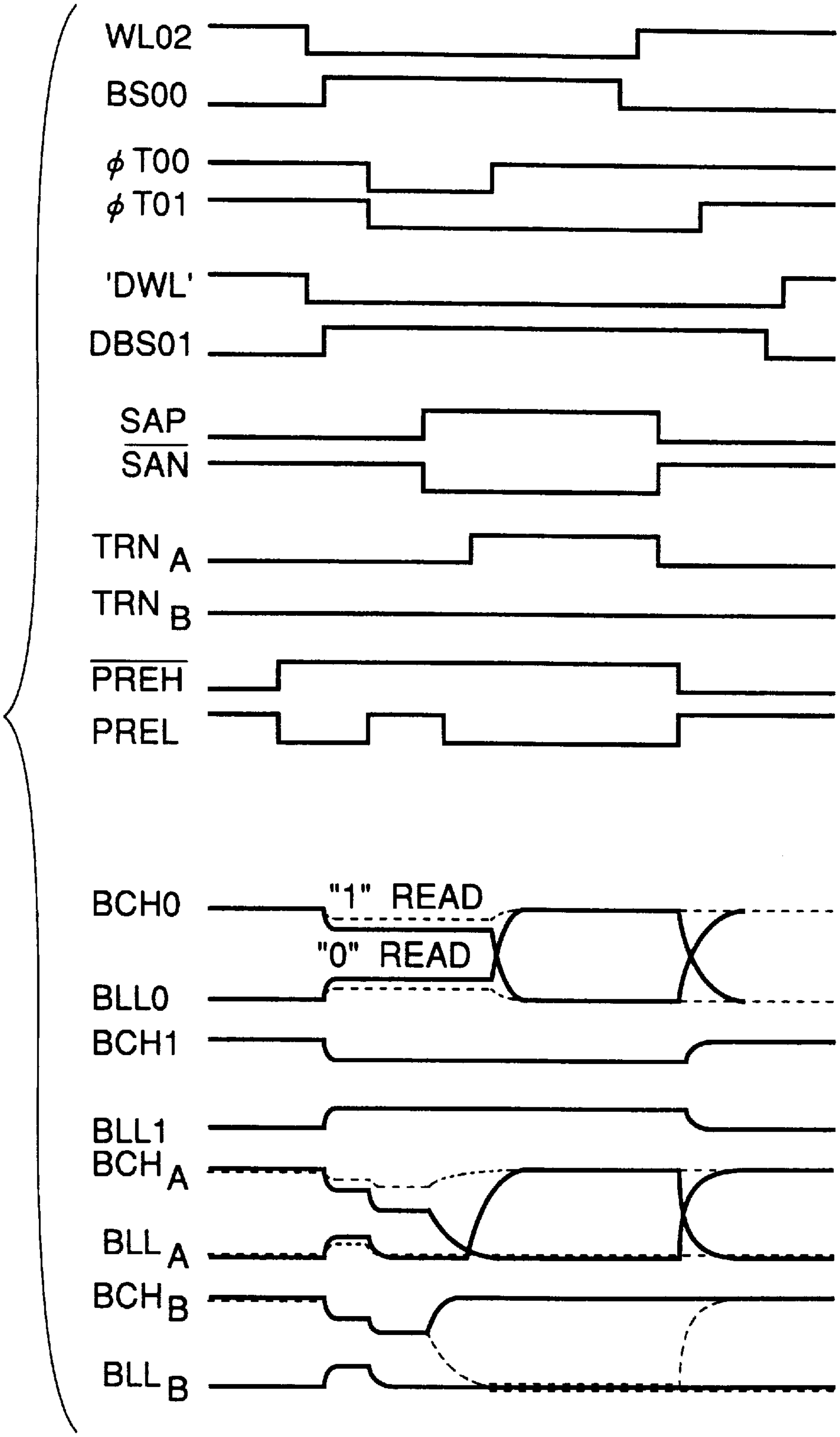
FIG. 94 is a timing chart showing the operation of the FRAM according to the 63rd embodiment.

FIG. 93 is an equivalent circuit diagram showing the sense amplifier structure of an FRAM according to the 63rd embodiment of the present invention. This sense amplifier can be applied to the embodiments shown in FIG. 85 and FIG. 86 in which a signal amount is obtained twice with a folded bit line structure. FIG. 94 shows an example of the operation.

The operation will be described with reference to FIG. 94. $\overline{\text{PREH}}$ is set at "H", and PREL is set at "L" to set the bit lines in a floating state. A word line WL01 is set at "L", and a block selection line BS00 is set at "H" to read out cell data to bit lines BLH0 and BLL0 and transmitted through bit lines BLHA and BLLA in the sense amplifier. Simultaneously, a dummy word line DWL is set at "L", and a selection block line DBS00 for dummy cell is set at "H" to read out dummy cell to bit lines BLH1 and BLL1 and transmitted through bit lines BLHB and BLLB in the sense amplifier. Thereafter, signals ft00 and ft01 are raised to confine the data in the sense amplifier.

PREL is raised to lower the potentials of the bit lines BLLA and BLLB to Vss. As shown in FIG. 93, the potentials of the bit lines BLHA and BLHB lower by a value twice that of the cell readout signal due to the effect of capacitors C1 connected between the bit lines BLLA and BLHA and between the bit lines BLLB and BLHB. Thereafter, an NMOS sense amplifier driving line $\overline{SAN}$ and a PMOS sense amplifier driving line SAP are set at "L"/"H" to activate the sense amplifier, thereby amplifying the difference between the bit line BLHA on the cell read side and the bit line BLHB on the dummy cell side, i.e., the readout signal.

Next, PREL is set at "H" to set the bit lines BLLA and BLLB in the floating state. The TRNA is set at "H" to transmit the amplified data of the bit line BLHB to the bit line BLLA. The signal ϕt00 is set at "H" to transmit the data amplified by the sense amplifier to the bit lines BLL0 and BLH0 and rewrite the data in the cell. The block selection line BS00 is set at "L", and the word line WL02 at "H" to close the cell. The NMOS and PMOS sense amplifier driving lines $\overline{SA}$ and SAP are set in an inactive state. The TRNA is set at "L", $\overline{PREH}$ is set at "L", and PREL is set at "H" such that BLH0=BLHA=BLH1=BLHB=Vcc, and BLL0=BLLA=BLL1=BLLB=Vss. At this time, data "1" is written in the dummy cell. Finally, the selection block line DBS01 for dummy cell is set at "L", and the dummy word line DWL is set at "H" to close the dummy cell.

64th Embodiment

Figure 95:
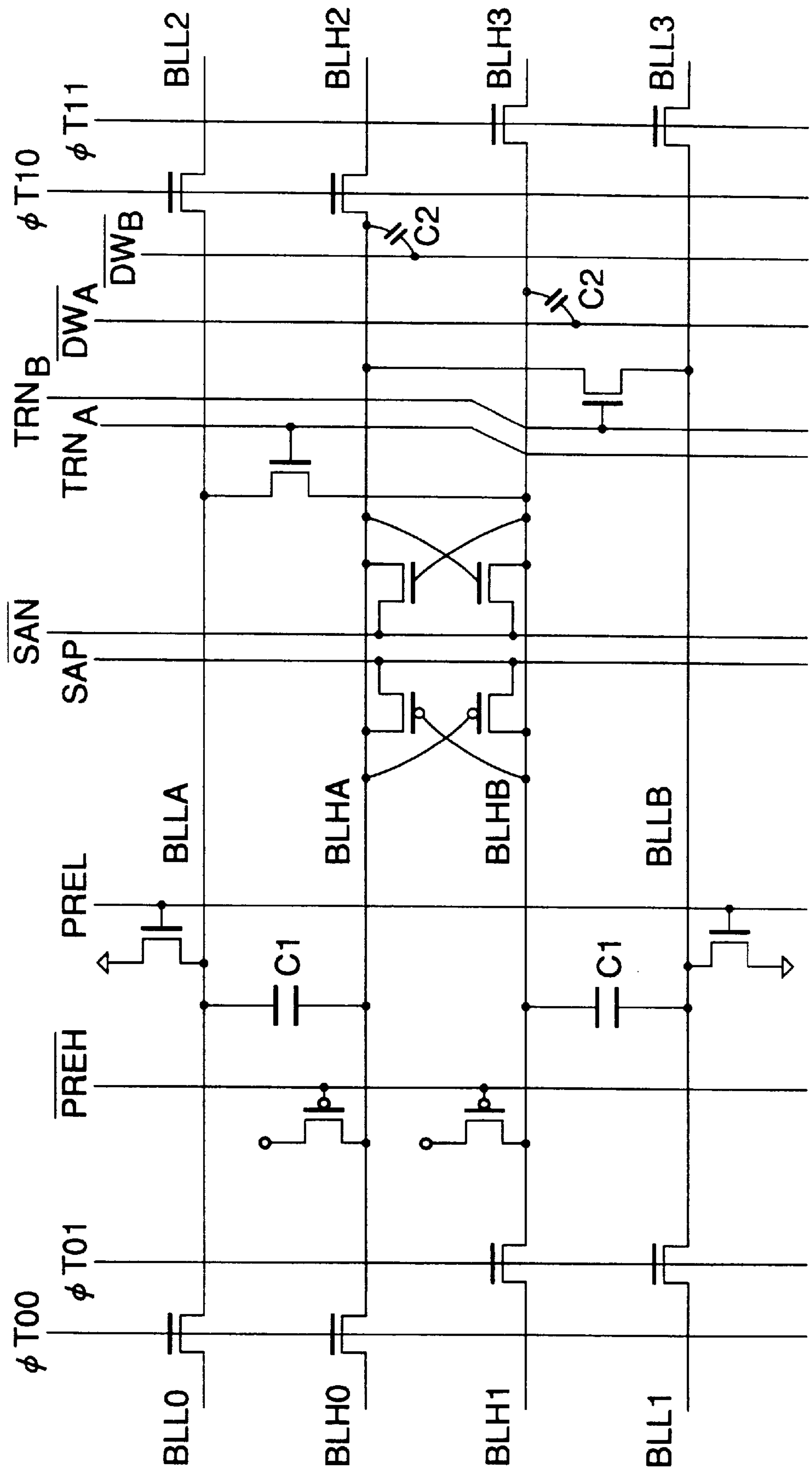
FIG. 95 is a circuit diagram of the sense amplifier of an FRAM according to the 64th embodiment.
Figure 96:
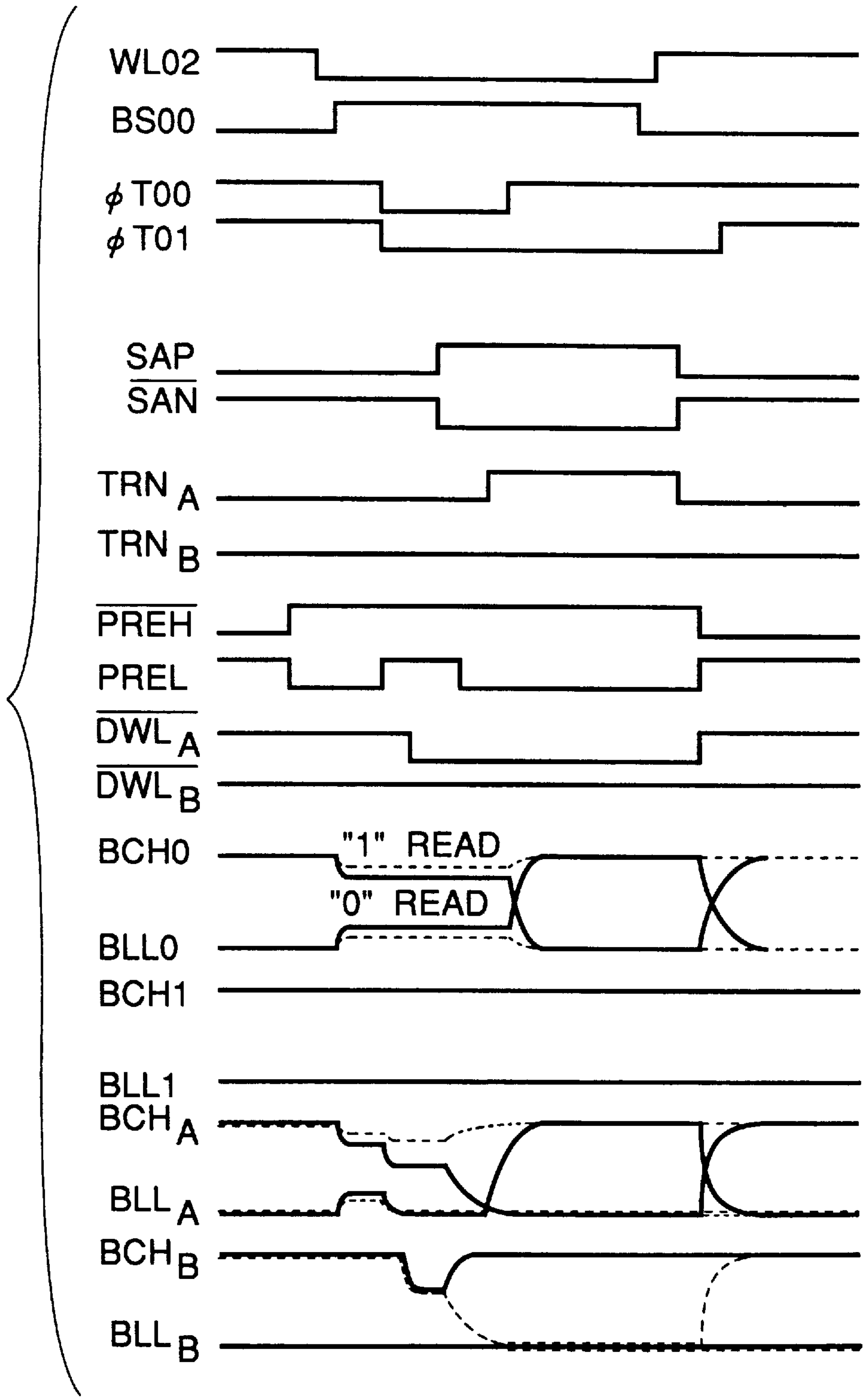
FIG. 96 is a timing chart showing the operation of the FRAM according to the 64th embodiment.

FIG. 95 is an equivalent circuit diagram showing the sense amplifier structure of an FRAM according to the 64th embodiment of the present invention. This sense amplifier can be applied to the embodiments shown in FIG. 83, FIG. 84, and FIG. 87 in which a signal amount is obtained twice with a folded bit line structure. FIG. 96 shows an example of the operation.

FIG. 95 is different from FIG. 93 in that the dummy cell is replaced with a coupling capacitor in the sense amplifier. For the operation, $\overline{PREH}$ is set at "H", and PREL is set at "L" to set the bit lines in a floating state. A word line WL01 is set at "L", and a block selection line BS00 is set at "H" to read out cell data to bit lines BLH0 and BLL0 and transmitted through bit lines BLHA and BLLA in the sense amplifier. Thereafter, signals ϕt00 and ϕt01 are set at "L" to confine the data in the sense amplifier.

The PREL is raised to lower the potentials of the bit lines BLLA and BLLB to Vss. As shown in FIG. 95, the potential of the bit line BLHA lowers by a value twice that of the cell readout signal due to the effect of a capacitor C1 connected between the bit lines BLLA and BLHA. Thereafter, $\overline{DWLA}$ is set at "L" to lower the potential on BLHB side to an intermediate value between data "1" and data "0". An NMOS sense amplifier driving line $\overline{SAN}$ and a PMOS sense amplifier driving line SAP are set at "L"/"H" to activate the sense amplifier, thereby amplifying the difference between the bit line BLHA on the cell read side and the bit line BLHB on the dummy cell side, i.e., the readout signal.

Next, the PREL is set at "L" to set the bit lines BLLA and BLLB in the floating state. The TRNA is set at "H" to transmit the amplified data of the bit line BLHB to the bit line BLLA. The signal ϕt00 is set at "H" to transmit the data amplified by the sense amplifier to the bit lines BLL0 and BLH0 and rewrite the data in the cell. The block selection line BS00 is set at "L", and the word line WL02 at "H" to close the cell. The NMOS and PMOS sense amplifier driving lines $\overline{SAN}$ and SAP are set in an inactive state. The TRNA is set at "L", the $\overline{PREH}$ is set at "L", and the PREL is set at "H" such that BLH0=BLHA=BLH1=BLHB=Vcc, and BLL0=BLLA=BLL1=BLLB=Vss. At this time, the control signal for the capacitor for dummy cell is set at "H" for the precharge operation.

65th Embodiment

Figure 97:
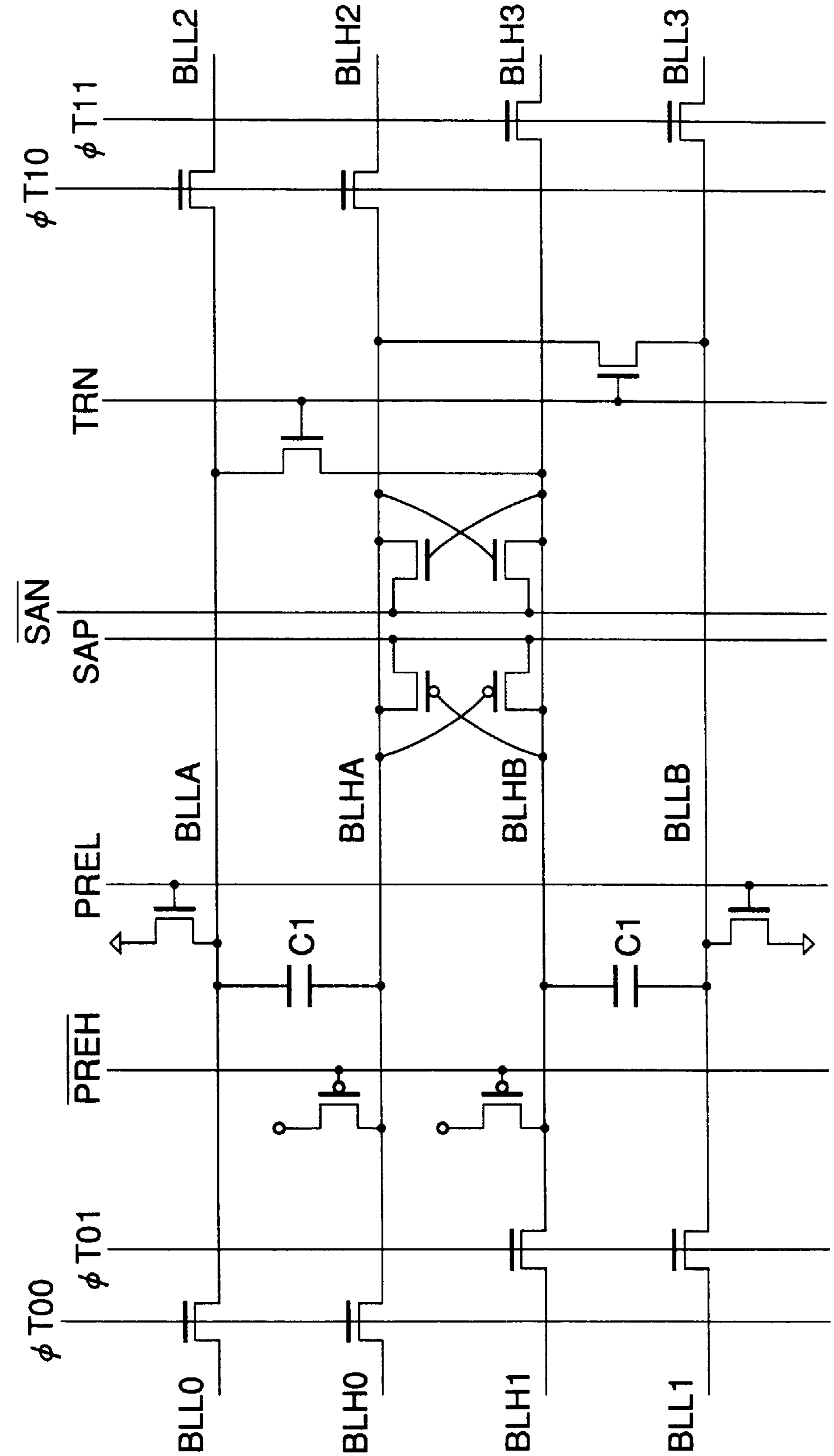
FIG. 97 is a circuit diagram of the sense amplifier of an FRAM according to the 65th embodiment.
Figure 98:
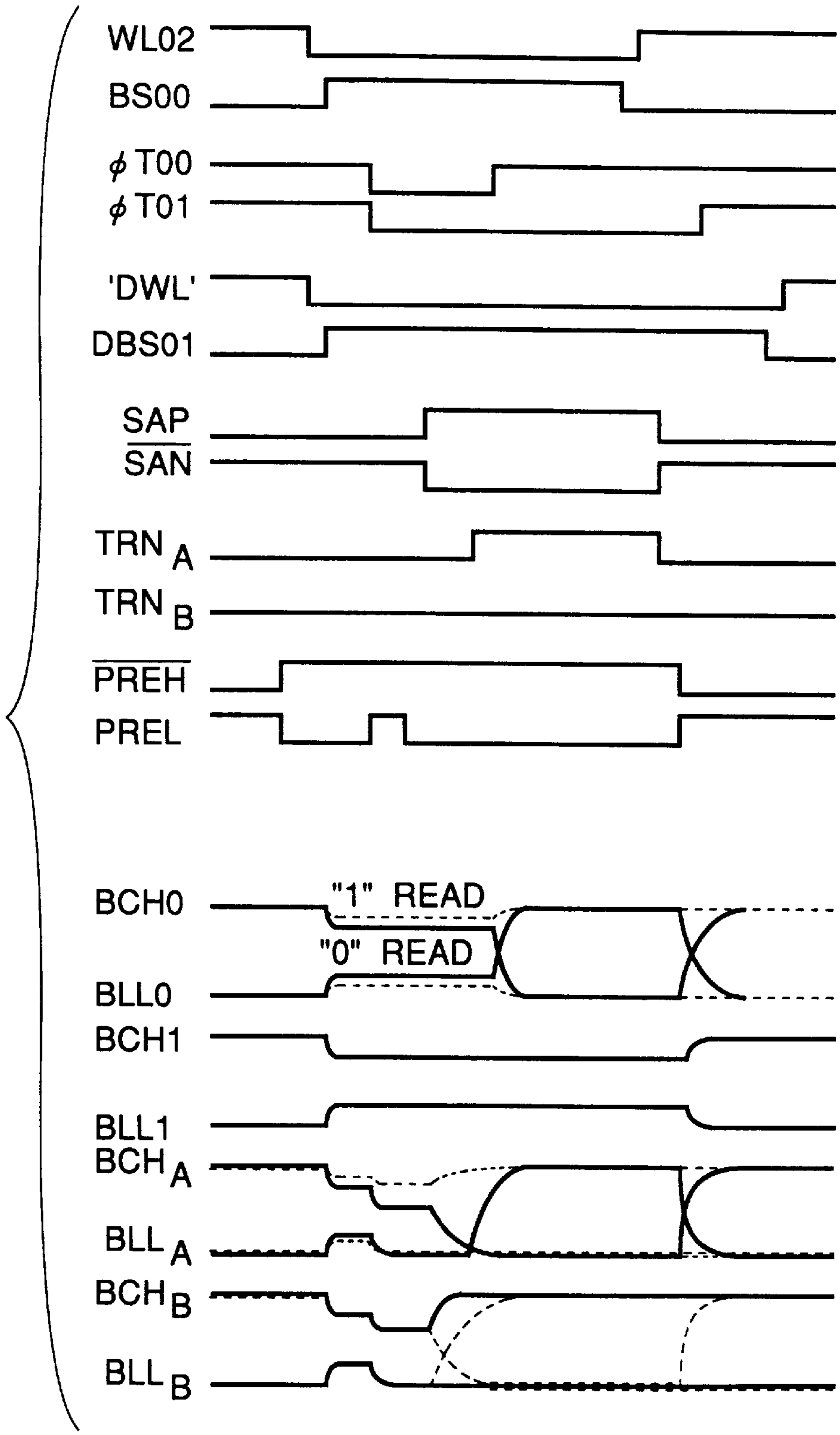
FIG. 98 is a timing chart showing the operation of the FRAM according to the 65th embodiment.

FIG. 97 is an equivalent circuit diagram showing the sense amplifier structure of an FRAM according to the 65th embodiment of the present invention. This sense amplifier can be applied to the embodiments shown in FIG. 85 and FIG. 86 in which a signal amount is obtained twice with a folded bit line structure. FIG. 98 shows an example of the operation.

This structure is different from that shown in FIG. 93 and FIG. 94 in that a TRA is commonly used as the TRNA and TRNB. In this case, the sense amplifier area can be reduced. The disadvantage is that when the TRN is set at "H" after sense amplification, the BLLB side is also restored, and the power consumption slightly increases.

66th Embodiment

Figure 99:
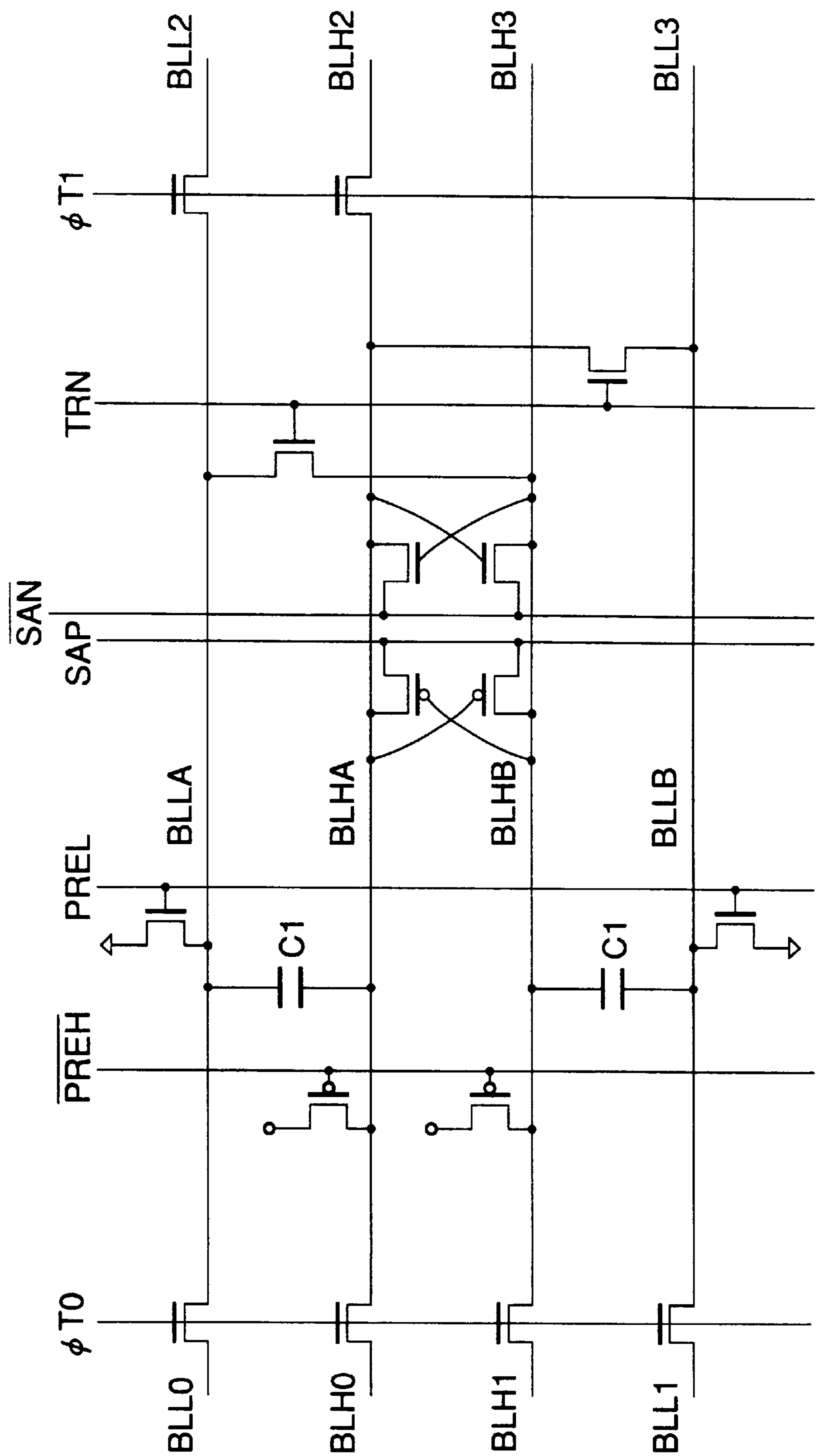
FIG. 99 is a circuit diagram of the sense amplifier of an FRAM according to the 66th embodiment.
Figure 100:
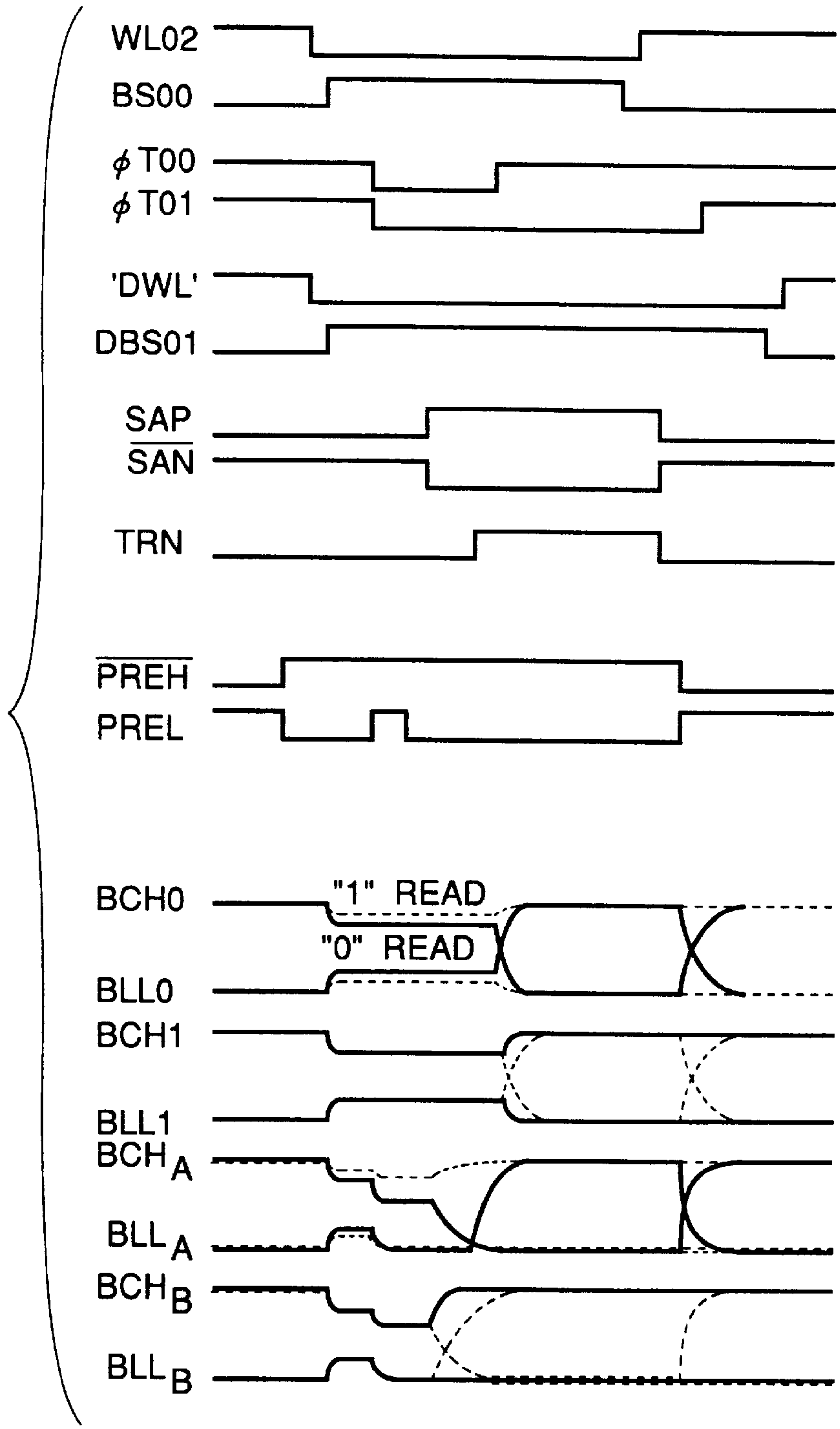
FIG. 100 is a timing chart showing the operation of the FRAM according to the 66th embodiment.

FIG. 99 is an equivalent circuit diagram showing the sense amplifier structure of an FRAM according to the 66th embodiment of the present invention. This sense amplifier can be applied to the embodiments shown in FIG. 85 and FIG. 86 in which a signal amount is obtained twice with a folded bit line structure. FIG. 100 shows an example of the operation.

This structure is different from that shown in FIG. 97 and FIG. 98 in that a signal ϕt0 is commonly used as the signals ϕt00 and ϕt01. In this case, the sense amplifier area can be further reduced. The disadvantage is that when the TRN is set at "H" after sense amplification, not only the BLH0 and BLL0 side but alto the BLH1 and BLL1 side the BLLB side is temporarily restored, and the power consumption increases.

67th Embodiment

Figure 101:
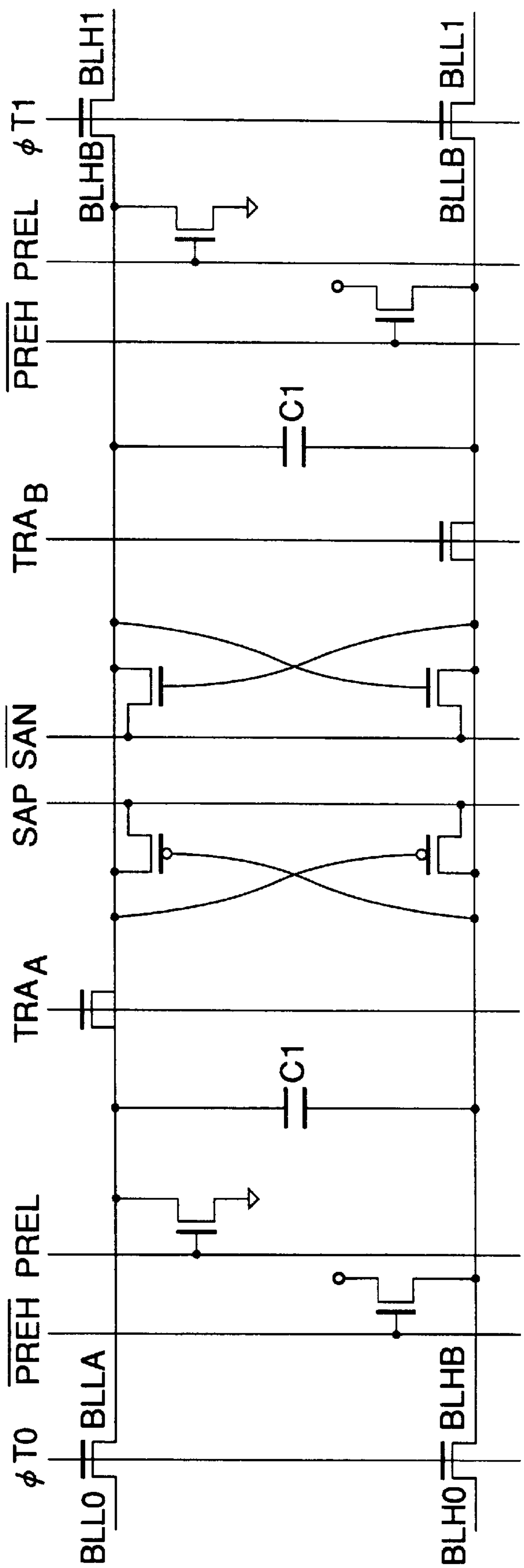
FIG. 101 is a circuit diagram of the sense amplifier of an FRAM according to the 67th embodiment.

FIG. 101 is an equivalent circuit diagram showing the sense amplifier structure of an FRAM according to the 67th embodiment of the present invention. This sense amplifier can be applied to the embodiments shown in FIG. 88 to FIG. 93 in which a signal amount is obtained twice with an open bit line structure.

The structure shown in FIG. 101 is equivalent to that in FIG. 93 except that bit lines BLH1 and BLL1 are arranged on the right side of the sense amplifier, the shared sense amplifier is omitted, and the circuit position is changed.

68th Embodiment

FIG. 102 is an equivalent circuit diagram showing the memory cell structure of an FRAM according to the 68th embodiment of the present invention.

Ferroelectric capacitors (Ca, Cb) having different coercive voltages are connected in parallel to a memory cell transistor to constitute one cell. One terminal of series connected cells is connected to a bit line ($\overline{BL}$, BL) through a select transistor, and the other terminal is connected to a plate electrode (PL), thereby constituting a cell block. With this structure, 2-bit data can be stored in a cell, and a folded bit line structure can be realized.

69th Embodiment

Figure 103:
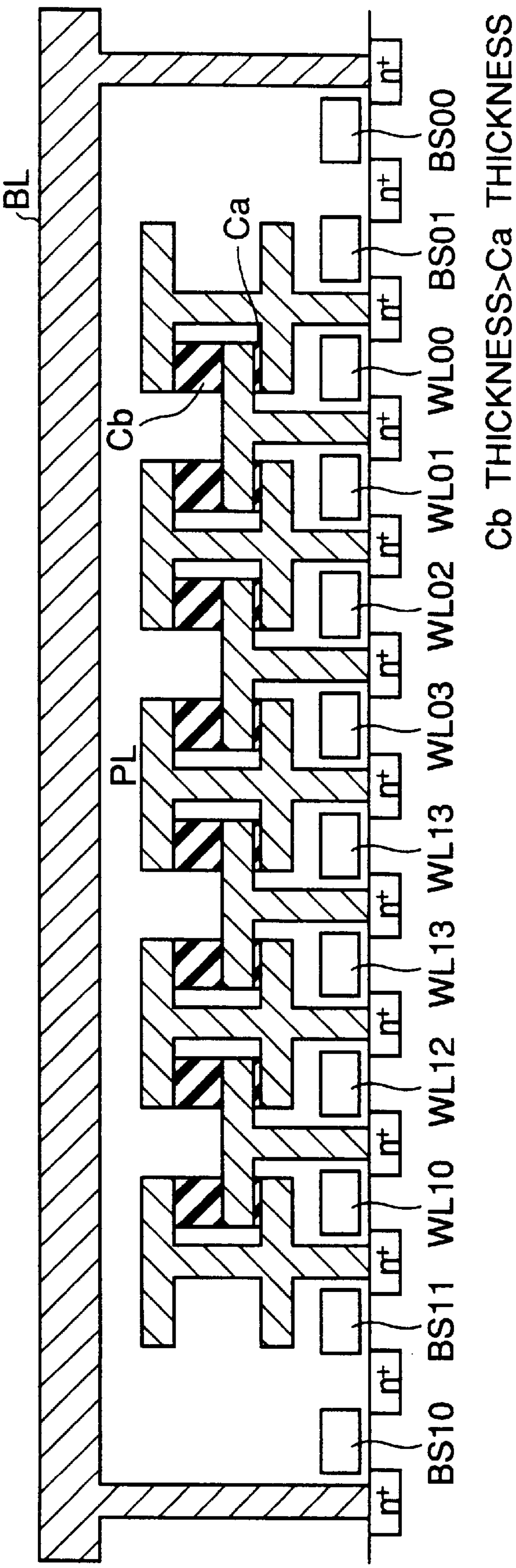
FIG. 103 is a sectional view showing the device structure of an FRAM according to the 69th embodiment.

FIG. 103 is a sectional view showing the memory cell structure of an FRAM according to the 69th embodiment of the present invention. This structure realizes the equivalent circuit of the memory cell shown in FIG. 102.

Ferroelectric capacitors having different thicknesses (thickness of Cb>thickness of Ca) are connected on a memory cell transistor to form one cell. The reason why the film thickness is changed is as follows. The coercive field is almost constant independently of the film thickness because of the characteristic features of the ferroelectric capacitor. When the ferroelectric capacitor is made thin, the coercive voltage lowers. In addition, the remnant polarization amount does not depend on the film thickness. Therefore, both in reading 1-bit data in the thick ferroelectric capacitor Cb and in reading 1-bit data in the thin ferroelectric capacitor Ca, the read margin is almost constant, and a stable operation is enabled.

The cell size is substantially $2F^2$ because the cell transistor and the 2-bit ferroelectric capacitors can be arranged at the intersection of a word line and the bit line BL with a size of $4F^2$. When four or more transistors are stacked in the vertical direction to form a three-dimensional cell array, a cell with a size of $2F^2$ can be realized in the conventional structure. However, from the viewpoint of the device structure, characteristics, process, reliability, and yield, it is very difficult to stacked-type transistors as in a TFT.

In this embodiment, however, such a structure can be easily realized because the transistors are formed in the minimum size of $4F^2$. When multiple passive elements (ferroelectric capacitors, capacitors, resistors, p-n junctions, and the like) which can be relatively easily stacked from the viewpoint of reliability on the area with the size of $4F^2$, a cell having a size of $2F^2$ or less per bit can be realized. Even in the conventional cell having a size of $8F^2$, ferroelectric capacitors can be parallelly connected and stacked to obtain the effect of reducing the cell size. Basically, however, as an optimum method, the cell size is made as small as possible (reduced to $4F^2$) first, and ferroelectric capacitors and the like other than Tr are stacked to increase the bit number. With this method, the random access properties can be maintained even when the cell size is reduced.

To change the coercive voltage of the ferroelectric capacitor, not only the film thickness but also the material may be changed. For example, materials such as SrBiTaO and PbZrTiO which originally have different coercive voltages may be connected in parallel.

70th Embodiment

Figure 104A:
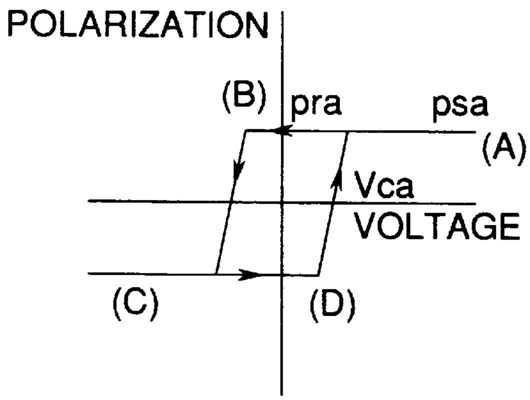
FIG. 104A to FIG. 104C are graphs showing hysteresis loops representing the operating points of an FRAM according to the 70th embodiment.
Figure 104B:
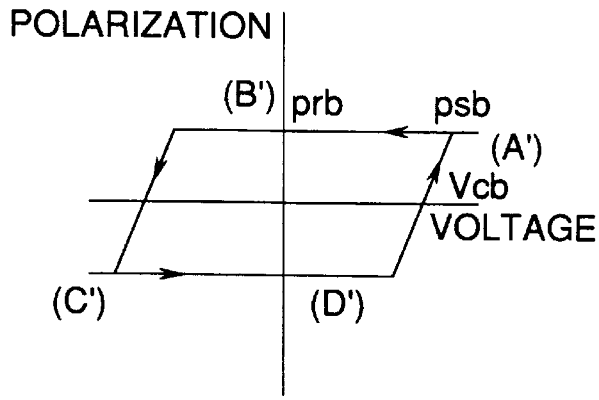
Figure 104C:
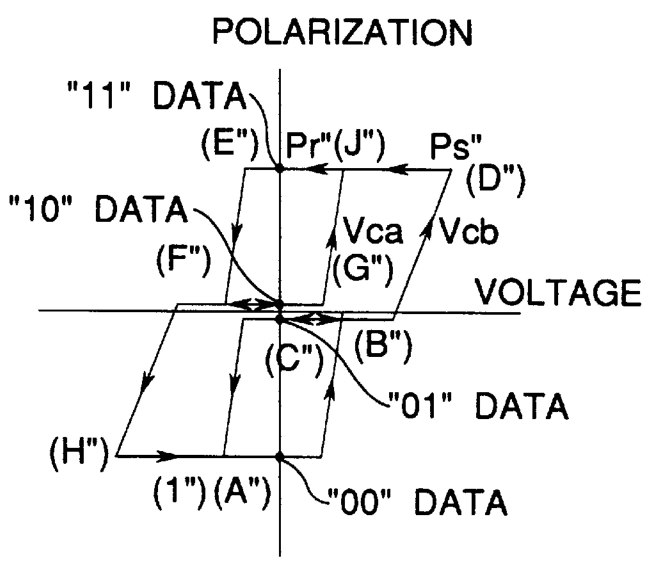

FIG. 104A to FIG. 104C are graphs for explaining the 70th embodiment of the present invention. FIG. 104A to FIG. 104C show an example of the operation of the memory cell shown in FIG. 102 and FIG. 103.

FIG. 104A shows a schematic view (excluding the paraelectric component) of the hysteresis loop of a thin ferroelectric capacitor (Ca) which is connected in parallel. The coercive voltage is represented as Vca; the remnant polarization amount, Pra; and the saturation polarization amount, Psa. FIG. 104B shows a schematic view (excluding the paraelectric component) of the hysteresis loop of a thick ferroelectric capacitor (Cb) which is connected in parallel. The coercive voltage is represented as Vcb; the remnant polarization amount, Prb; and the saturation polarization amount, Psb. FIG. 104C shows a schematic view (excluding the paraelectric component) of an equivalent hysteresis loop obtained when the two ferroelectric capacitors are connected in parallel.

For the basic operation, a low voltage is applied across the ferroelectric capacitors to read out data of the ferroelectric capacitor Ca. Next, a high voltage is applied to read out/rewrite data from/in the ferroelectric transistor Cb. Finally, a low voltage is applied to rewrite the data in the ferroelectric transistor Ca. More specifically, assume that the voltage applied across the ferroelectric capacitors (i.e., between a bit line BL and a plate electrode PL) is V1. First, the small voltage V1 larger than −Vcb and smaller than −Vca is applied such that no polarization inversion occurs in the ferroelectric transistor Cb, and polarization inversion occurs in the ferroelectric transistor Ca, thereby reading out the polarization inversion information of the ferroelectric transistor Ca and temporarily storing the information outside the cell array. Next, the voltage V1 is temporarily reset to 0V.

Second, the voltage V1 smaller than −Vcb is applied such that polarization inversion occurs in the ferroelectric transistor Cb to read out the polarization inversion information of the ferroelectric transistor Cb. After the information is amplified, the voltage V1 smaller than −Vcb (data "0") or larger than Vcb (data "1") is applied such that polarization inversion occurs in the ferroelectric transistor Cb to rewrite the cell data in the ferroelectric capacitor Cb, and the voltage V1 is temporarily reset to 0V.

Third, the temporarily stored data is rewritten in the ferroelectric transistor Ca. More specifically, the voltage V1 larger than −Vcb and smaller than −Vca (data "0") or larger than Vca and smaller than Vcb (data "1") is applied such that no polarization inversion occurs in the ferroelectric transistor Cb, and the data of the ferroelectric transistor Cb is not destroyed, and polarization inversion occurs in the ferroelectric transistor Ca. With this operation, the cell data is rewritten in the ferroelectric transistor Ca. Finally, the voltage V1 is reset to 0V to set the precharge time.

The voltage V1 is reset to 0V a number of times during the operation. However, the voltage V1 may be reset to a predetermined voltage. To read/write data from/in the ferroelectric transistors Ca and Cb with a margin, Vcb/Vca must be 3 to 5. When Vcb/Vca is low, the difference between the voltages Vcb and Vca becomes zero to cause an erroneous operation. When Vcb/Vca is too high, the value of the voltage Vca becomes too small because the voltage Vcb cannot be higher than Vcc. For this reason, the data of the ferroelectric transistor Ca is destroyed due to noise.

Exactly speaking, the coercive voltage has a distribution in the ferroelectric capacitor and causes polarization inversion with a gradient with respect to the applied voltage. When the coercive voltage at which the ferroelectric transistor Ca is almost completely inverted is Vcamax, and the minimum coercive voltage at which the ferroelectric transistor Cb starts to be inverted is Vcbmin, the voltage at the time of read/write data from/in the ferroelectric transistor Ca should be $Vcamax<|V1|<Vcbmin$. Accordingly, the thickness of the ferroelectric capacitor must be set such that $|V1|-Vcamax>\alpha$, and $Vcbmin-|V1|>\alpha$ ($\alpha>0$) to ensure a sufficient margin. For example, the voltage Vca is 0.5V, the voltage Vcb is 2V, the voltage V1 for reading data of the ferroelectric transistor Cb is −3V, and the voltage V1 for reading out data of the ferroelectric transistor Ca is −1V.

Figure 105A:
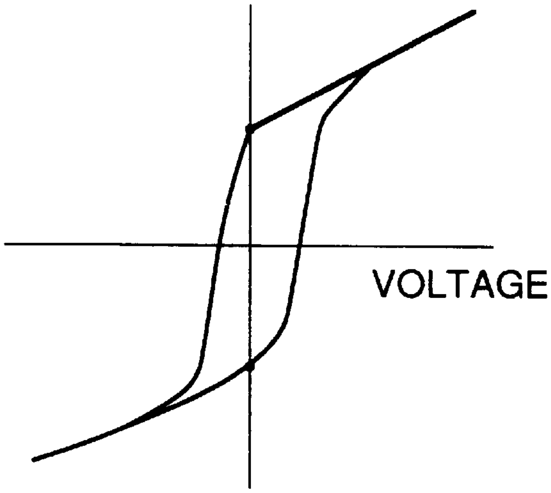
FIG. 105A to FIG. 105C are graphs showing hysteresis loops representing the operating points of the FRAM according to the 70th embodiment.
Figure 105B:
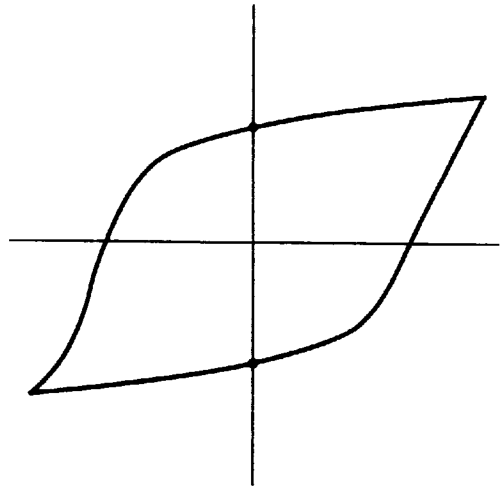
Figure 105C:
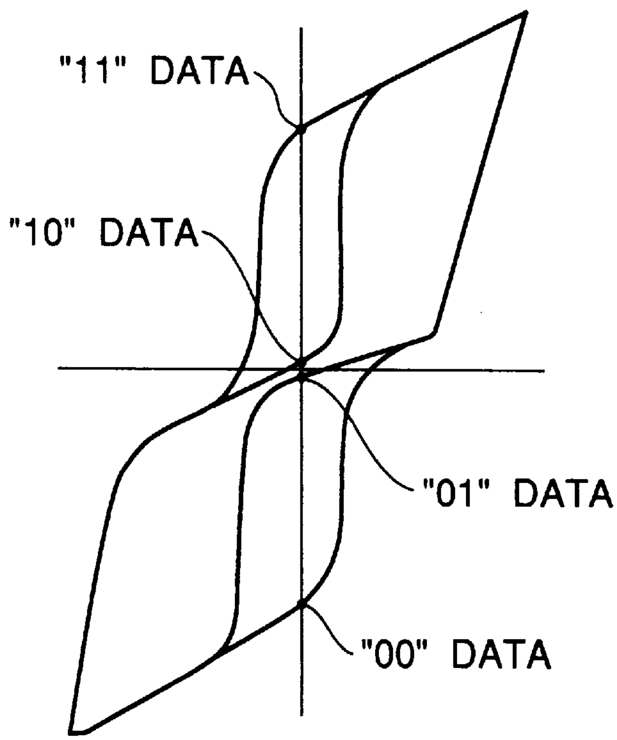

When the voltage V1 for reading out data of the ferroelectric transistor Ca is −1V, $|V1|-Vca=0.5V$, and $Vcb-|V1|=1V$. This is because, in the actual hysteresis loop, the ferroelectric transistor Cb has a larger distribution width of the coercive voltage, as shown in FIG. 105A to FIG. 105C. Actually, the coercive field distribution of the ferroelectric transistor Ca equals that of the ferroelectric transistor Cb.

However, when the electric fields are converted into voltages, the distribution of the ferroelectric transistor Cb becomes wider. When the applied voltage Vcc for reading data of the ferroelectric transistor Cb is 3V, and the applied voltage for reading data of the ferroelectric transistor Ca, i.e., ½Vcc is 1.5V, the voltage Vca may be 0.5 to 0.75V, and the voltage Vcb may be 2 to 2.25V.

As shown in FIG. 104A to FIG. 105C, in this embodiment, data "11" (the first "1" represents data of the ferroelectric transistor Cb, and the second "1" represents data of the ferroelectric transistor Ca) is at a position Pr' (=2Pra=2Prb). Data "00" is at a position −Pr' (=−2Pra=−2Prb). Data "01" and data "10" are at 0V. Although the data "01" and "10" are at the same position, these data exhibit different operation loci upon application of a voltage. Therefore, there are four states in total. The operation margin with respect to the reference will be considered. Since, in the two-layered ferroelectric capacitors as shown in FIG. 103, the polarization amount of each layer is the same as that of the above-described cell having a size of $4F^2$, the margin becomes ½Pr'=(Pra=Prb). That is, the margin equals that of the cell with a size of $4F^2$.

When the ferroelectric capacitor area is doubled to constitute a quaternary memory, information is stored at one of points obtained by dividing the section between −2Pr and 2Pr (at positions 2Pr, ⅔Pr, −⅔Pr, and −2Pr). The operation margin with respect to the reference will be considered. The margin becomes ⅔Pr, i.e., degrades as compared to this embodiment. In addition, since the sense amplifier must read a small voltage value, the circuit becomes bulky, and the margin becomes zero. In the present invention, n-bit data is held in a structure having capacitors and one transistor and a size of $4F^2$. The capacity is proportional to the number n of stacked ferroelectric capacitors. However, in the multi-valued memory, the capacity is proportional to $\mathrm{Log}_2$(m value), resulting in a disadvantage.

The locus of the hysteresis loop will be examined in more detail.

Upon application of the voltage V1=−½Vcc, 2-bit cell data "11" (point E") moves to a point F" to read out data of the ferroelectric transistor Ca. The voltage V1 is temporarily reset. After the data "11" comes to a point G", the voltage V1=−Vcc is applied. The data "11" moves to a point H" to read out data of the ferroelectric transistor Cb. After rewrite, the data "11" returns to a point D". After the voltage V1 is reset, the data "11" returns to the point E". In rewriting the data in the ferroelectric transistor Ca, the data "11" moves to a point J". The data "11" returns to the point E" upon the precharge operation.

Upon application of the voltage V1=−½Vcc, 2-bit cell data "10" (point G") moves to the point F" to read out data of the ferroelectric transistor Ca. The voltage V1 is temporarily reset. After the data "10" comes to the point G", the voltage V1=−Vcc is applied. The data "10" moves to the point H" to read out data of the ferroelectric transistor Cb. After rewrite, the data "10" returns to the point D". After the voltage V1 is reset, the data "10" returns to the point D". In rewriting the data in the ferroelectric transistor Ca, the data "10" moves to a point F". The data "10" returns to the point G" upon the precharge operation.

Upon application of the voltage V1=−½Vcc, 2-bit cell data "01" (point C") moves to a point I" to read out data of the ferroelectric transistor Ca. The voltage V1 is temporarily reset. After the data "01" comes to a point A", the voltage V1=−Vcc is applied. The data "01" moves to the point H" to read out data of the ferroelectric transistor Cb. After rewrite, the data "01" returns to the point H". After the voltage V1 is reset, the data "01" returns to the point A". In rewriting the data in the ferroelectric transistor Ca, the data "01" moves to a point B". The data "01" returns to the point C" upon the precharge operation.

Upon application of the voltage V1=−½Vcc, 2-bit cell data "00" (point A") moves to the point I" to read out data of the ferroelectric transistor Ca. The voltage V1 is temporarily reset. After the data "00" comes to the point A", the voltage V1=−Vcc is applied. The data "00" moves to the point H" to read out data of the ferroelectric transistor Cb. After rewrite, the data "00" returns to the point H". After the voltage V1 is reset, the data "00" returns to the point A". In rewriting the data in the ferroelectric transistor Ca, the data "00" moves to the point I". The data "00" returns to the point A" upon the precharge operation.

As described above, although the points G" and C" are at the same position, the data "01" and "10" exhibit different operation loci, unlike the multivalued memory, so that these data can be recognized as different data.

71st Embodiment

Figure 106:
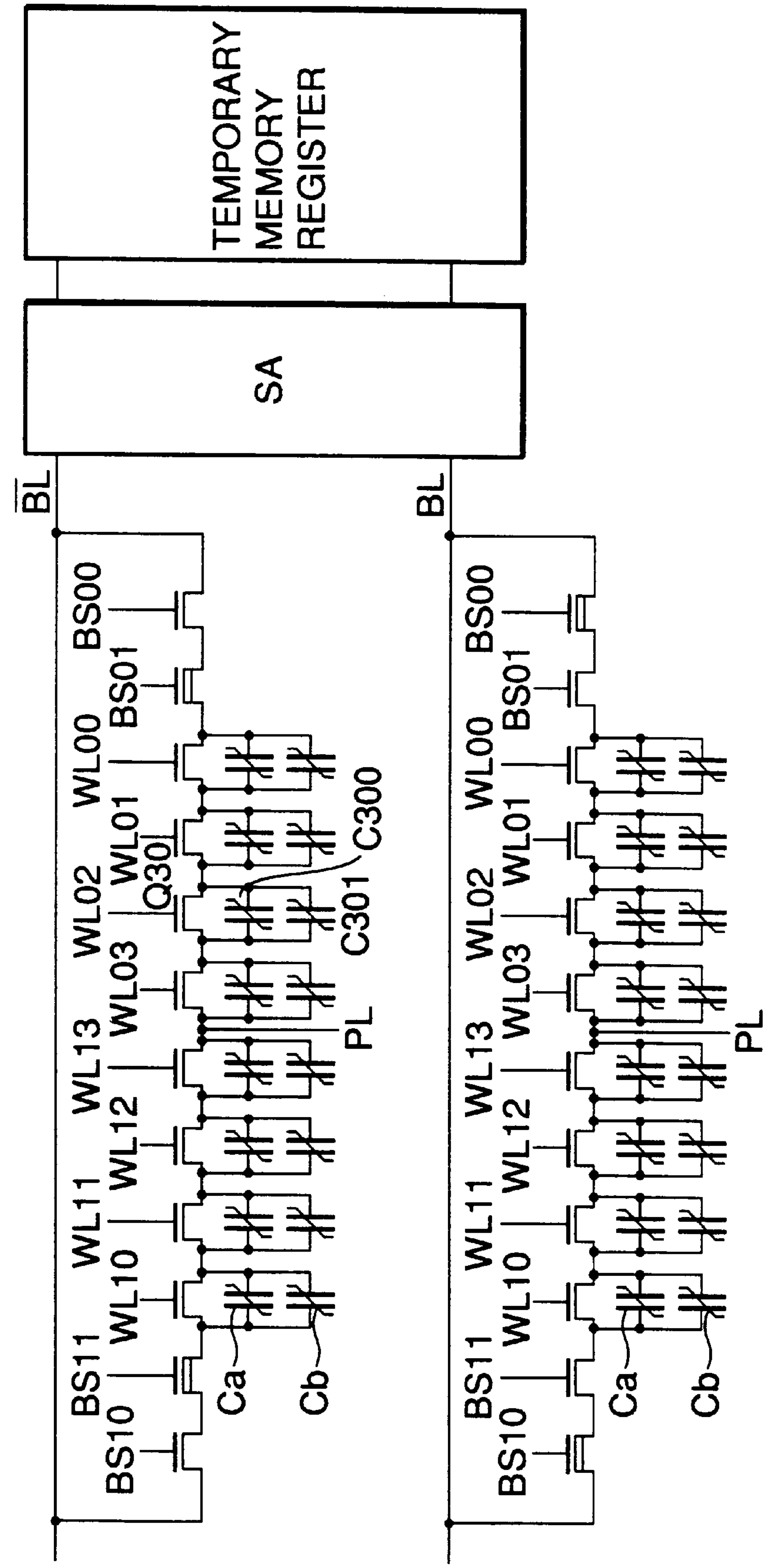
FIG. 106 is an equivalent circuit diagram of an FRAM according to the 71st embodiment.

FIG. 106 is a circuit diagram for explaining the 71st embodiment of the present invention. In FIG. 106, a sense amplifier and a temporary memory register having a folded bit line structure are arranged in the embodiment shown in FIG. 102.

When a block selection line BS00 and a word line WL02 are selected to sequentially read/write data from/in ferroelectric capacitors C300 and C301, a bit line BL is used as a reference bit line. When the data of the ferroelectric capacitor C300 is read out, the readout data is stored in the temporary memory register shown in FIG. 106. Next, after the data of the ferroelectric capacitor C301 is read/written, the data stored in the temporary memory register is rewritten in the ferroelectric capacitor C300.

72nd Embodiment

Figure 107:
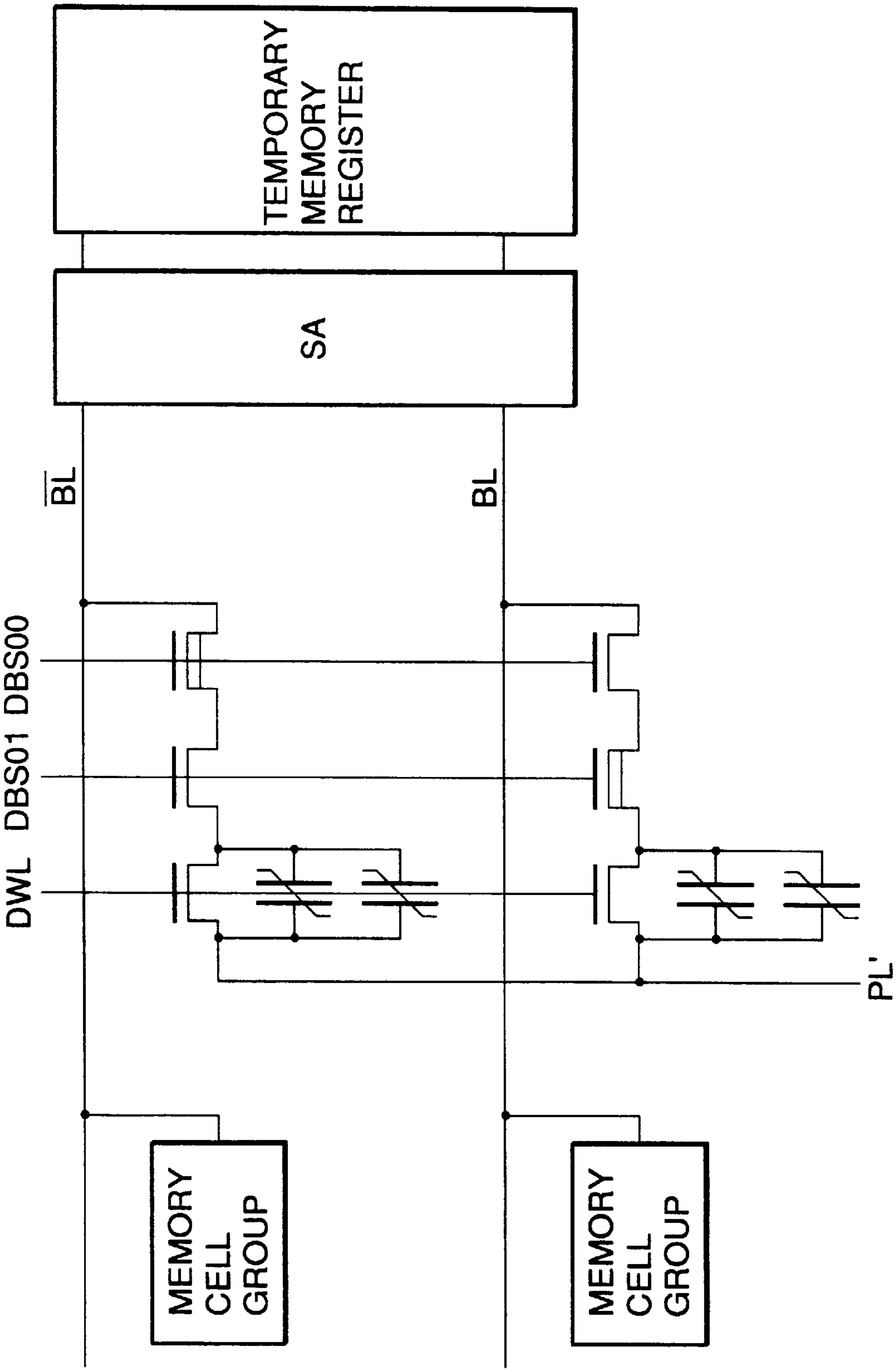
FIG. 107 is an equivalent circuit diagram of an FRAM according to the 72nd embodiment.

FIG. 107 is a circuit diagram for explaining the 72nd embodiment of the present invention. In FIG. 107, a dummy cell for the ferroelectric capacitor is added to the embodiment shown in FIG. 106.

This structure can be realized with the same structure as that of a normal cell structure. When a dummy word line DWL is kept at "L", and a selection block line DBS01 for dummy cell is kept at "H" for a short time after the precharge operation, data "0" is written. In the next cycle, the data "0" is read out. When the dummy cell area is made relatively large, the bit line potential can be set at an intermediate potential between data "1" and "0" of the normal cell.

Figure 108:
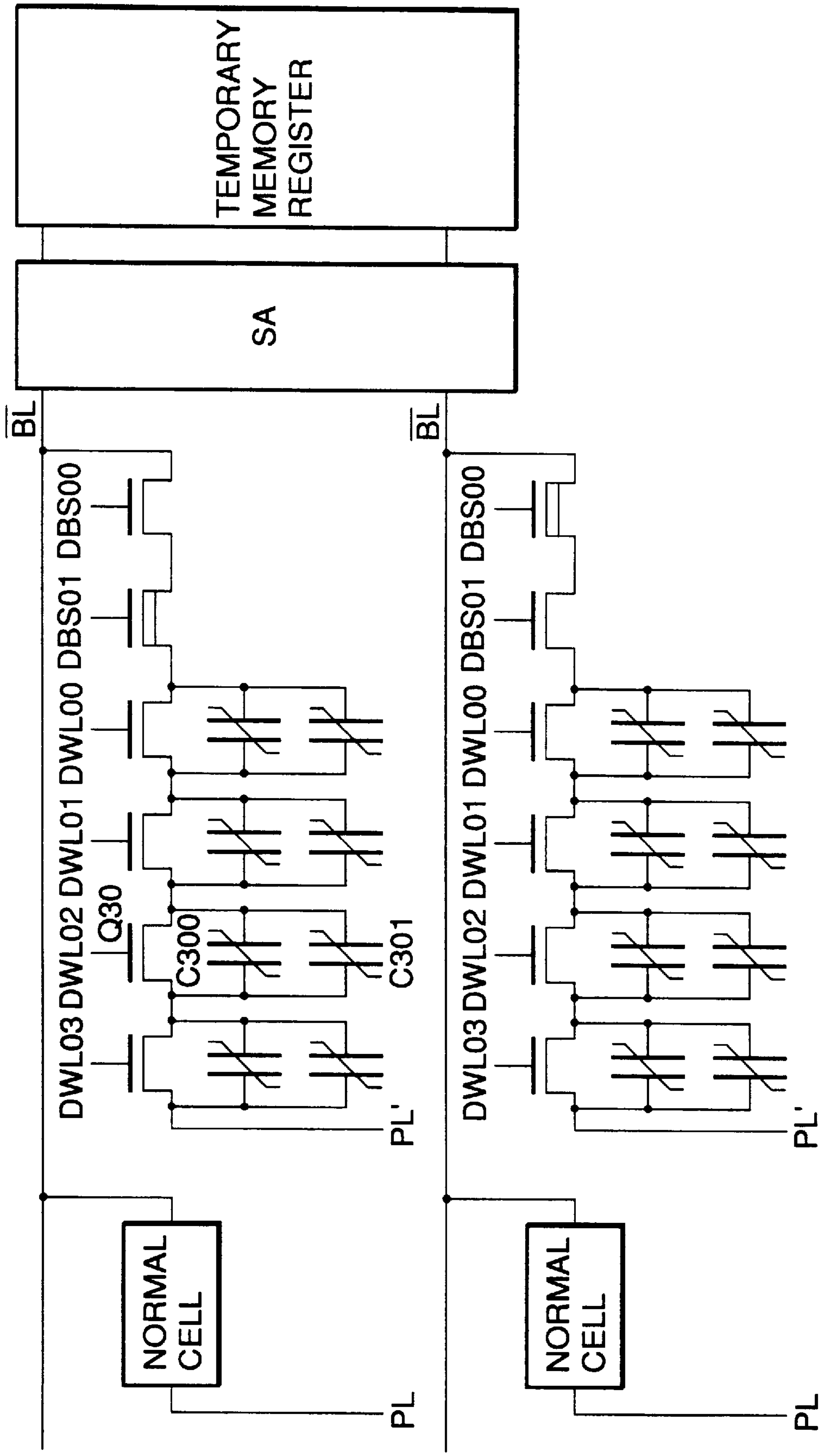
FIG. 108 is a circuit diagram showing a structure in which a plurality of dummy cells according to the embodiment shown in FIG. 107 are connected in series.

In FIG. 108, a plurality of dummy cells shown in the embodiment shown in FIG, 106 are connected in series. With this structure, the same effect as in FIG. 43B or 44A can be obtained.

73rd Embodiment

Figure 109:
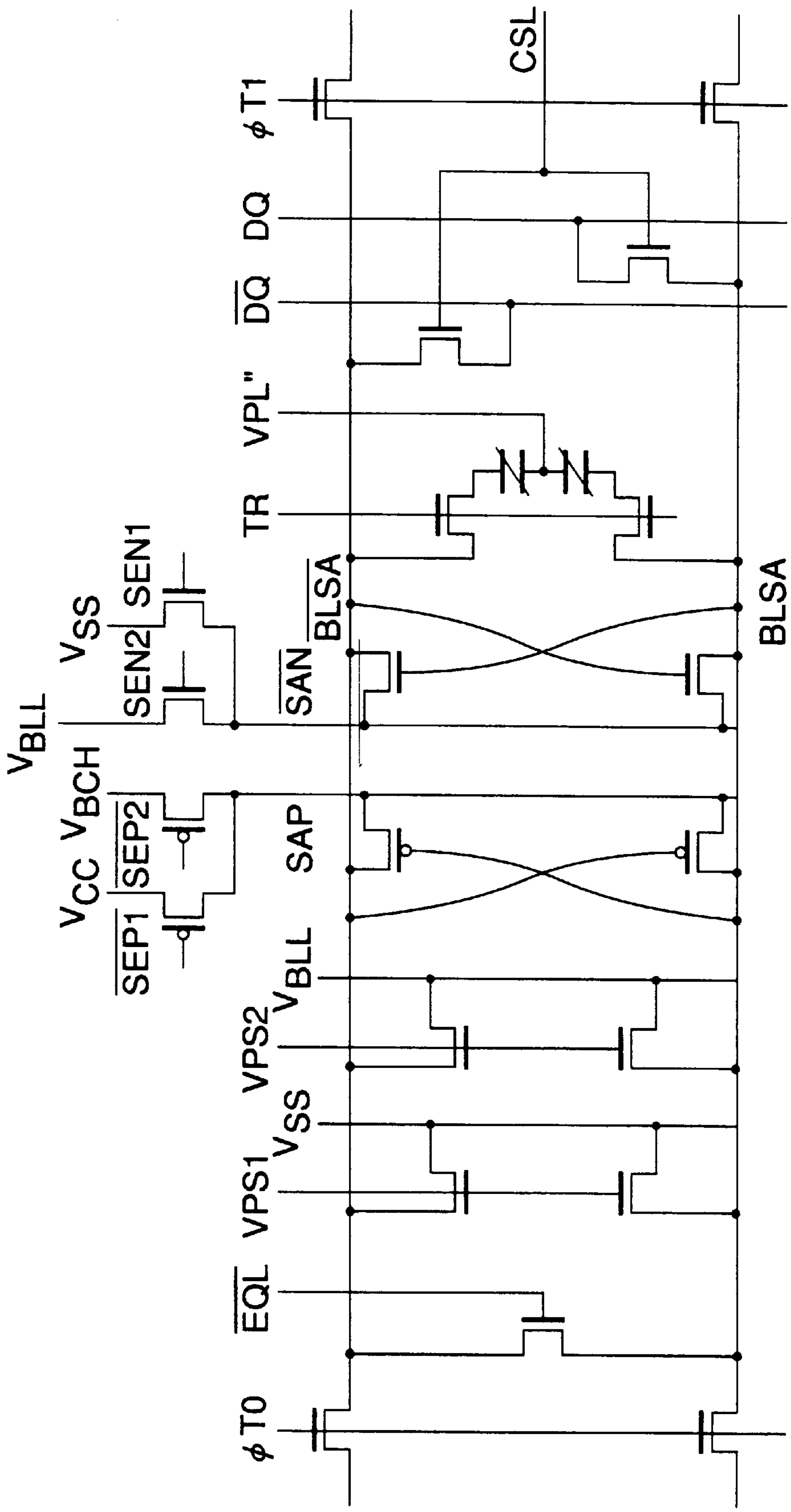
FIG. 109 is a circuit diagram of the sense amplifier of an FRAM according to the 73rd embodiment.

FIG. 109 is a circuit diagram showing a sense amplifier applicable to the structures shown in FIG. 102 to FIG. 107 so as to explain the 73rd embodiment of the present invention. In this case, the plate (PL) voltage is fixed.

This sense amplifier is different from a normal sense amplifier for a ferroelectric capacitor in the following points. (1) A circuit for setting the potentials of a bit line pair ($\overline{\mathrm{BLSA}}$ and BLSA) in the sense amplifier not only at Vss but also at VBLL is arranged. (2) A circuit for setting the potentials of NMOS and PMOS sense amplifier driving lines not only at Vcc and Vss but alto at VBLL and VBLH, respectively, is arranged. (3) The sense amplifier incorporates a register for temporarily storing data read out from a cell.

74th Embodiment

Figure 110:
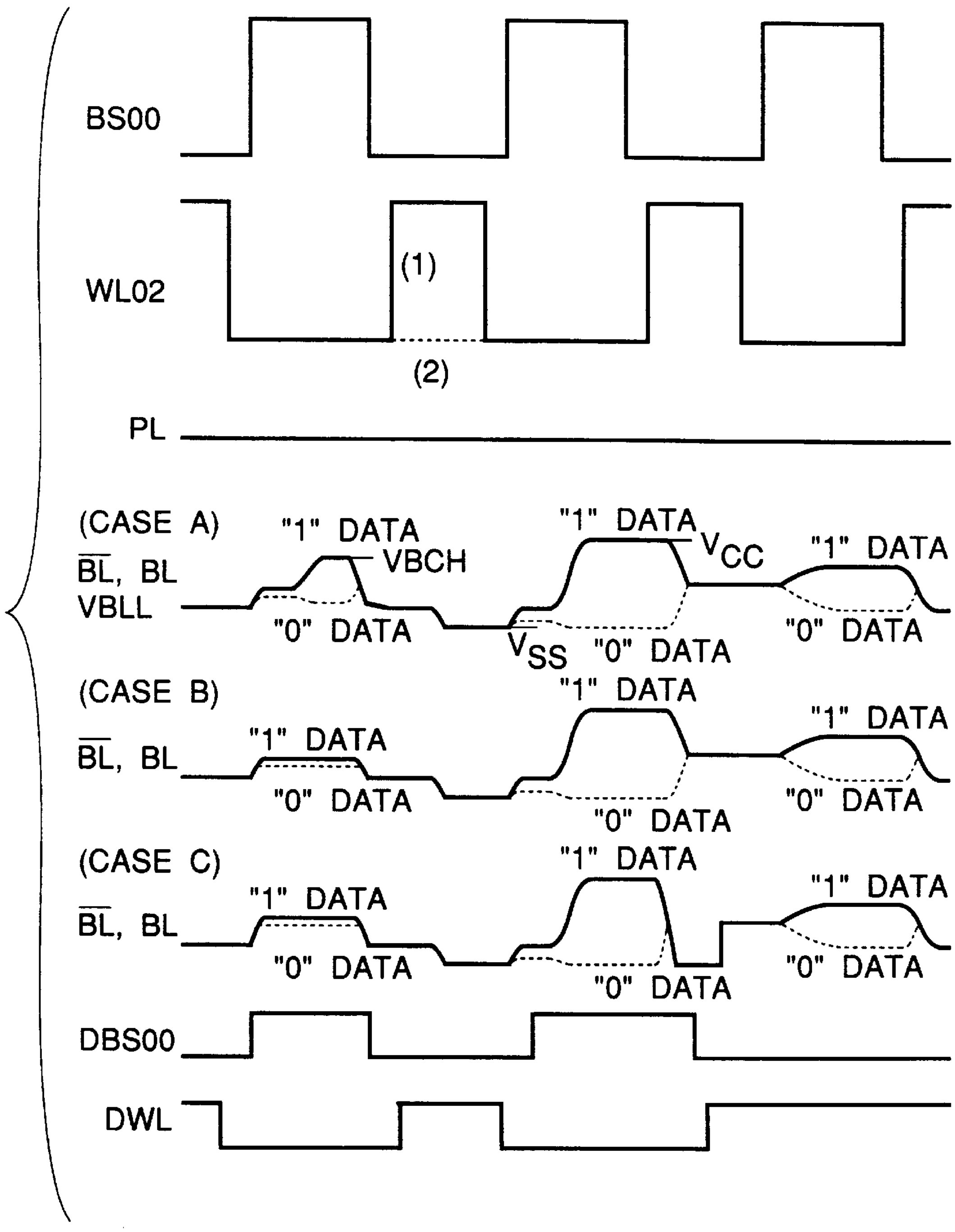
FIG. 110 is a timing chart showing the operation of an FRAM according to the 74th embodiment.

FIG. 110 is a timing chart showing three operations applicable to the cell structures shown in FIG. 102 to FIG. 107 and the sense amplifier shown in FIG. 109 so as to explain the 74th embodiment of the present invention. In this case, the plate (PL) voltage is fixed.

In case A, the plate electrode is fixed at (½)Vcc, and the bit line is precharged to VBLL. When a word line WL02 is set at "L", and a block selection line BS00 is set at "H", a potential corresponding to (½)Vcc−VBLL is applied to the cell to read out the data of a ferroelectric capacitor C300. The sense amplifier is activated to amplify the bit line potentials to VBLL and VBLH, respectively. TR is set at "H" to store this data in the temporary memory register.

Bit lines $\overline{BL}$ and BL are set at VBLL to eliminate the difference in polarization amount between data "1" and data "0" of the ferroelectric capacitor C300. The block selection line BS00 is set at "L", and the word line WL02 is set at "H" to make the potential between the ferroelectric capacitors 0V. The bit lines $\overline{BL}$ and BL are precharged to Vss. The word line WL02 is set at "L", and the block selection line BS00 is set at "H" again to read out data of a ferroelectric capacitor C301. The readout signal is amplified by the sense amplifier. Thereafter, a block selection line BS02 is set at "L", and the word line WL021 is set at "H" to make the potential between the ferroelectric capacitor 0V. The bit lines $\overline{BL}$ and BL are equalized. Thereafter, the word line WL02 is set at "L", the block selection line BS02 is set at "H" to connect the bit line and the cell and rewrite the data in the temporary memory register in the cell. The block selection line BS00 is set at "L", and the word line WL02 is set at "H" to precharge the bit lines $\overline{BL}$ and BL to VBLL, and the operation of one cycle is ended.

In case B, after the data of the ferroelectric capacitor C300 is read out, a signal ϕt0 is set at "L" and amplified by the sense amplifier. For this reason, no excess rewrite in the bit lines $\overline{BL}$ and BL occurs. When the potentials of the bit lines $\overline{BL}$ and BL are lowered to VBLL, the signal ϕt0 is set at "H".

In case C, the dummy cell shown in FIG. 107 is used in case B. The data of the ferroelectric capacitor C301 is rewritten in the cell. After the block selection line BS00 is set at "L", and the word line WL02 is set at "H", the potentials of the bit lines $\overline{BL}$ and BL are temporarily lowered to Vss. At this time, while keeping a selection block line DBS00 for dummy cell at "H", and a dummy word line DWL at "L", data "00" is written in the dummy cell. Thereafter, the selection block line DBS00 for dummy cell is set at "L", and the dummy word line DWL is set at "H", so that the dummy cell can prepare for the operation of the next cycle.

75th Embodiment

Figure 111:
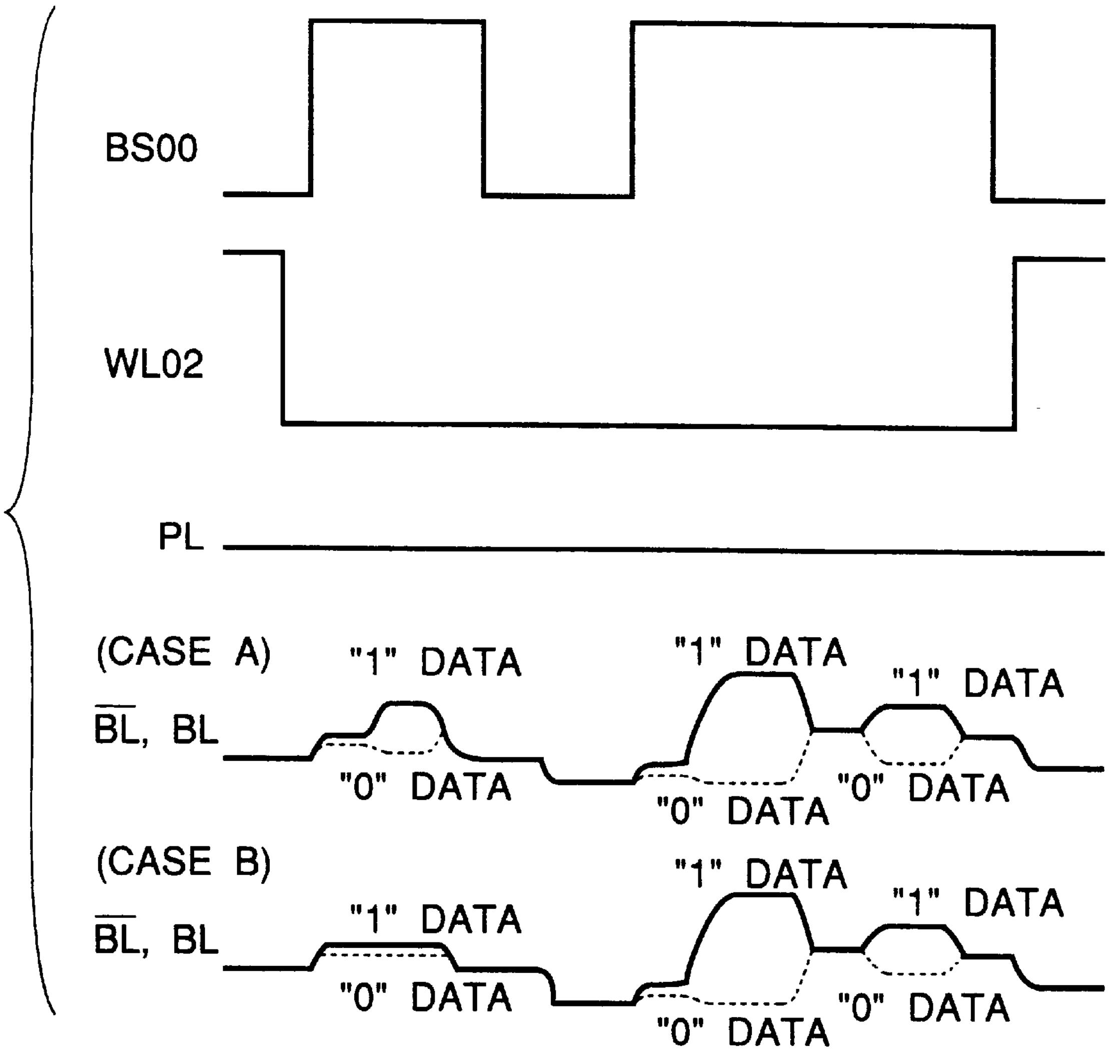
FIG. 111 is a timing chart showing the operation of an FRAM according to the 75th embodiment.

FIG. 111 is a timing chart showing two other operations applicable to the cell structures shown in FIG. 102 to FIG. 107 and the sense amplifier shown in FIG. 108 so as to explain the 75th embodiment of the present invention.

In this case, the plate (PL) voltage is fixed. The number of unnecessary operations of a word line WL02 and that of a block selection line BS00 can be reduced to realize a high-speed operation.

In case A, the plate voltage is set at (½)Vcc. The bit lines are precharged to VBLL. The word line WL02 is set at "L" level and the block selection line BS00 is set at "H" to apply a potential corresponding to (½)Vcc−VBLL so that data of a ferroelectric capacitor C300 is read out. Thereafter, the sense amplifier is activated to amplify the bit line potentials to VBLL and VBLH, respectively. TR is set at "H" to store the data in the temporary memory register.

The potentials of the bit lines $\overline{BL}$ and BL are lowered to VBLL to eliminate the difference in polarization amount between data "1" and data "0" of the ferroelectric capacitor C300. The block selection line BS00 is set at "L" to disconnect the cell and the bit line. The bit lines $\overline{BL}$ and BL are precharged to Vss. The block selection line BS00 is set at "H" again to read out data of a ferroelectric capacitor C301. The readout signal is amplified by the sense amplifier, and the data of the ferroelectric capacitor C301 is rewritten. The bit lines $\overline{BL}$ and BL are equalized. The TR is set at "H" again to rewrite the data of the ferroelectric capacitor C301, which is stored in the temporary memory register, in the cell. The block selection line BS00 is set at "L", and the word line WL02 is set at "H" to precharge the bit lines $\overline{BL}$ and BL to VBLL, and the operation of one cycle is ended.

In case B, after the data of the ferroelectric capacitor C300 is read out, a signal ϕt0 is set at "L" and amplified by the sense amplifier. For this reason, no excess rewrite in the bit lines $\overline{BL}$ and BL occurs. When the potentials of the bit lines $\overline{BL}$ and BL are lowered to VBLL, the signal ϕt0 is set at "H". Above described operation can be realized by operating in a range of $0V \leqq PL \leqq Vcc/3$ and $0V \leqq BL \leqq Vcc/3$ in a case of reading out the C300, and by operating in a range of $0V \leqq PL \leqq Vcc$ and $0V \leqq BL \leqq Vcc$ in a case of reading out the C301, using the plate driving scheme.

76th Embodiment

Figure 112:
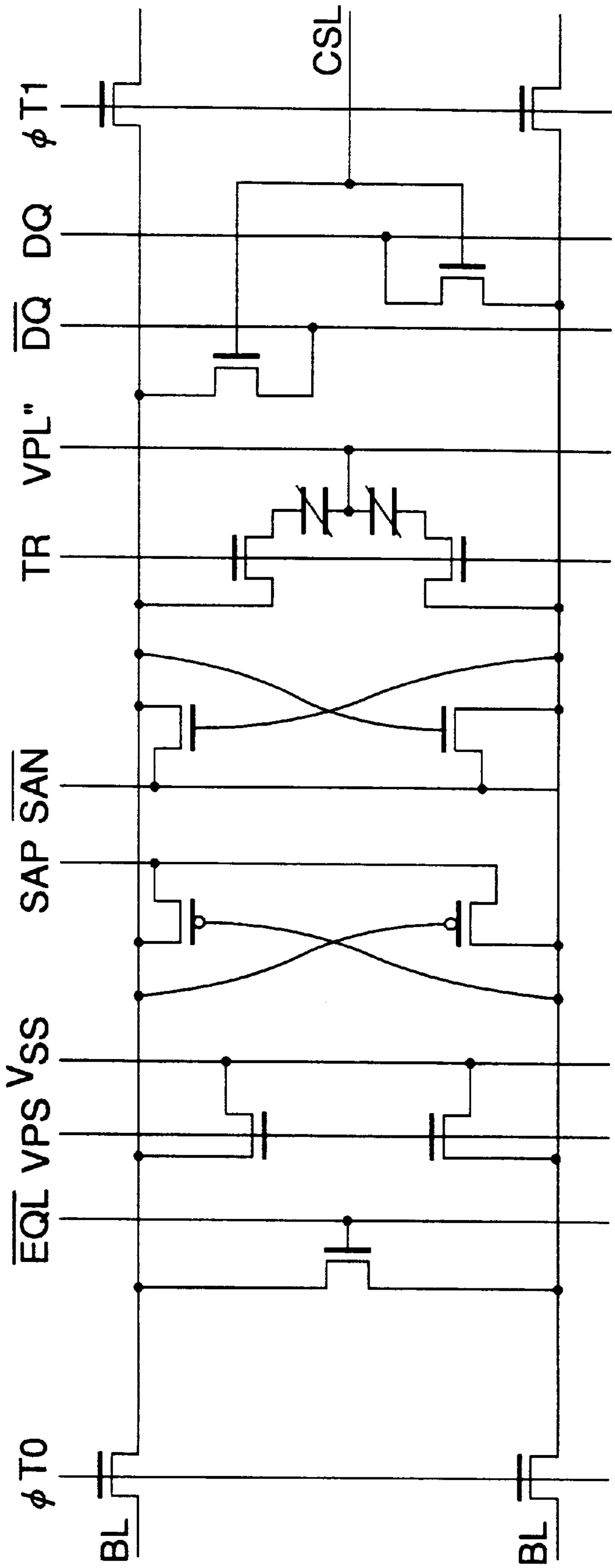
FIG. 112 is a circuit diagram of the sense amplifier of an FRAM according to the 76th embodiment.

FIG. 112 is a circuit diagram showing a sense amplifier applicable to the structures shown in FIG. 102 to FIG. 107 so as to explain the 76th embodiment of the present invention. In this case, the plate (PL) voltage is partially driven.

The sense amplifier is different from the normal sense amplifier for a ferroelectric memory in that the sense amplifier incorporates a register for temporarily storing data read out from the cell. No precharge and sense circuits of VBLL and VBLH, which may be complex and unstably operate, can be omitted.

77th Embodiment

Figure 113:
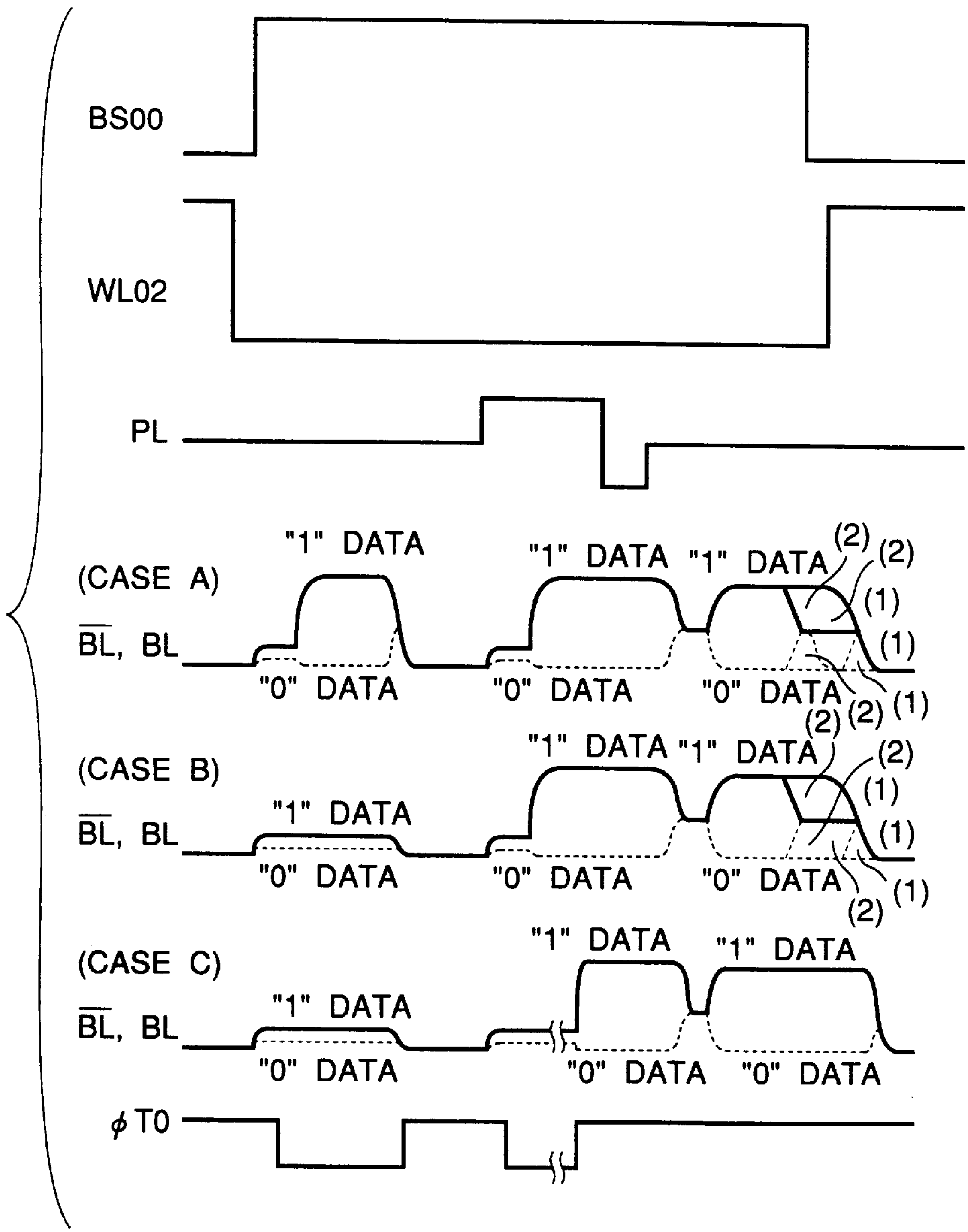
FIG. 113 is a timing chart showing the operation of an FRAM according to the 77th embodiment.

FIG. 113 is a timing chart showing three operations applicable to the cell structures shown in FIG. 102 to FIG. 107 and the sense amplifier shown in FIG. 112 so as to explain the 77th embodiment of the present invention. In this case, the plate (PL) voltage is partially driven.

Briefly speaking, when data of a cell C300 having a small coercive voltage value is to be read out, the scheme of fixing the plate electrode at (½)Vcc is used. The |maximum voltage| applied to the cell is (½)Vcc. When data of a cell C301 having a large coercive voltage value is to be read out, the PL driving scheme is used. The |maximum voltage| applied to the cell is Vcc. With these operations, the maximum amplitude of a bit line pair $\overline{BL}$ and BL can be maintained at Vcc, so no excess circuit is necessary.

In case A, the plate electrode is set at (½)Vcc. The bit lines are precharged to Vss. A word line WL02 is set at "L", and a block selection line BS00 is set at "H" to apply a potential of −(½)Vcc to the cell. The data of the ferroelectric capacitor C300 is read out. The sense amplifier SA is activated to amplify the potentials of the bit lines to Vcc and Vss, respectively. TR is set at "H" to store the data in the temporary memory register. The potentials of the bit lines $\overline{BL}$ and BL are lowered to Vss to eliminate the difference in polarization amount between data "1" and data "0" of the ferroelectric capacitor C300. After the bit lines $\overline{BL}$ and BL are set in a floating state, the plate electrode voltage is raised to Vcc. The data of the ferroelectric capacitor C301 is read out to the bit line. The readout signal is amplified by the sense amplifier. The bit lines are set at Vss and Vcc, respectively. When the data of the ferroelectric capacitor C301 is data "0", rewrite is performed. The plate electrode voltage is lowered to Vss. When the data of the ferroelectric capacitor C301 is data "1", rewrite is performed.

The plate electrode voltage is returned to (½)Vcc to equalize the bit line pair to (½)Vcc. Accordingly, no polarization inversion of the data of the ferroelectric capacitor C301 occurs. Next, the plate electrode is kept at (½)Vcc. The TR is set at "H" to rewrite the data of the ferroelectric capacitor C300, which is stored in the temporary memory register, in the cell. The block selection line BS00 is set at "L", and the word line WL02 is set at "H" to precharge the bit lines $\overline{BL}$ and BL to Vss. As represented by (2), after the bit lines $\overline{BL}$ and BL are set at (½)Vcc, the block selection line BS00 may be set at "L", and the word line WL02 is set at "H". The operation of one cycle is ended.

When the ferroelectric capacitor is used as the temporary memory register, the data can be temporarily stored by charges due to the paraelectric component even when VPL" is kept fixed.

In case B, after the data of the ferroelectric capacitor C301 is read out, a signal ϕt0 is set at "L" and amplified by the sense amplifier. For this reason, no excess rewrite in the bit lines $\overline{BL}$ and BL occurs. When the potentials of the bit lines $\overline{BL}$ and BL is lowered to VBLL, the signal ϕt0 is set at "H".

In case C, after the data of the ferroelectric capacitor C301 is read out, the signal ϕt0 is set at "L" in (case B). In this case, two temporary memory registers are prepared for the ferroelectric capacitors C300 and C301, respectively. This is suitable for a case wherein, after the data of the ferroelectric capacitors C300 and C301 are stored in the temporary memory registers, the data of the ferroelectric capacitors C300 and C301 are read out externally through the temporary memory registers, and the data are externally written in the temporary memory registers. This method is suitable for High-Bnad FRAM which transmits a large quantity of data to an external device.

78th Embodiment

Figure 114:
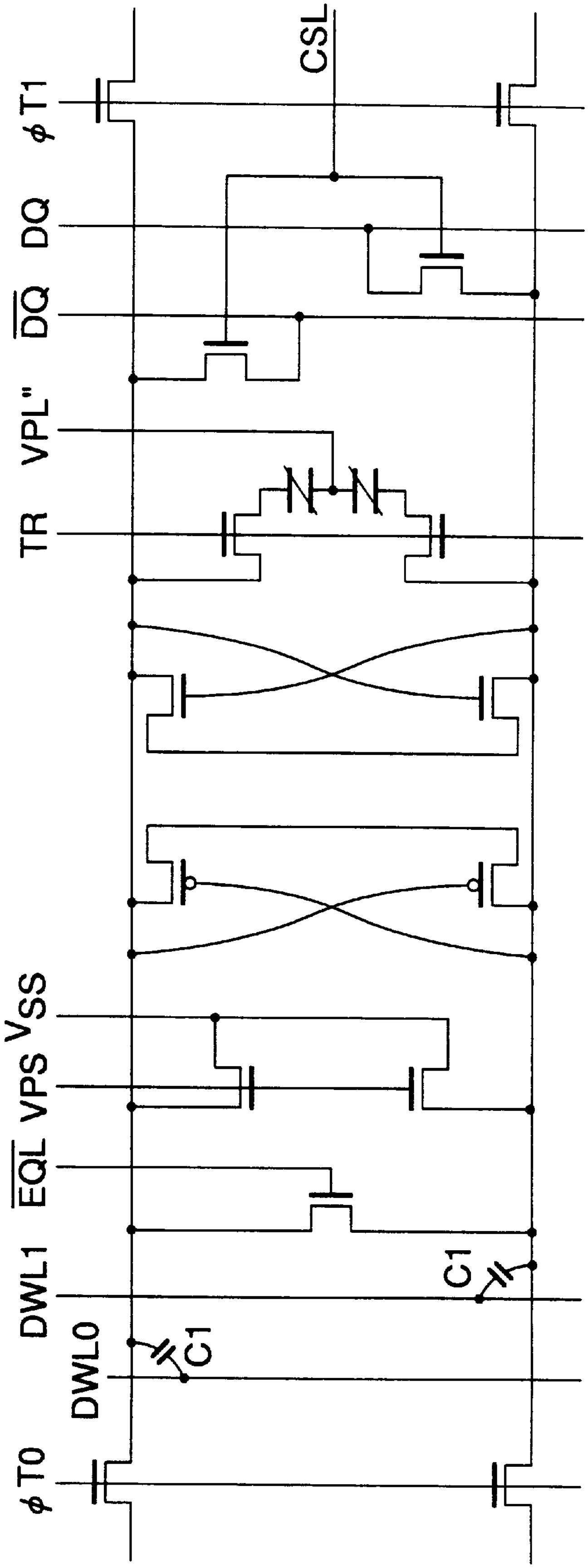
FIG. 114 is a circuit diagram of the sense amplifier of an FRAM according to the 78th embodiment.

FIG. 114 is a circuit diagram showing a sense amplifier applicable to the structures shown in FIG. 102 to FIG. 107 so as to explain the 78th embodiment of the present invention.

In this case, the plate (PL) voltage is partially driven. As shown in FIG. 114, a coupling type dummy cell is arranged in the sense amplifier, in addition to the structure shown in FIG. 112.

79th Embodiment

Figure 115:
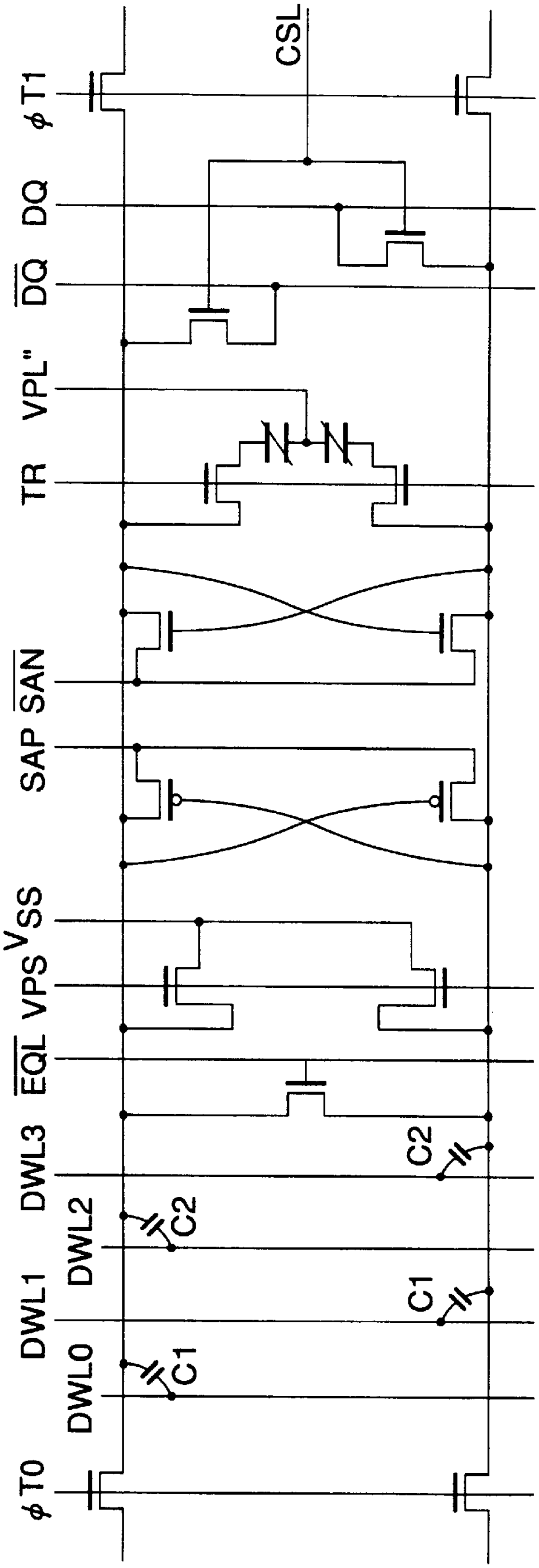
FIG. 115 is a circuit diagram of the sense amplifier of an FRAM according to the 79th embodiment.

FIG. 115 is a circuit diagram showing a sense amplifier applicable to the structures shown in FIG. 102 to FIG. 107 so as to explain the 79th embodiment of the present invention. In this case, the plate (PL) voltage is partially driven.

Two coupling type dummy cells are arranged in the sense amplifier, in addition to the structure shown in FIG. 114. Basically, even when the ferroelectric capacitors have different thicknesses, the remnant polarization amount does not change, although the paraelectric component changes. Therefore, the coupling type dummy cell is convenient to a case wherein the coupling capacity is finely changed and optimized. The number of capacitors may be increased in correspondence with the effect shown in FIG. 46.

80th Embodiment

Figure 116:
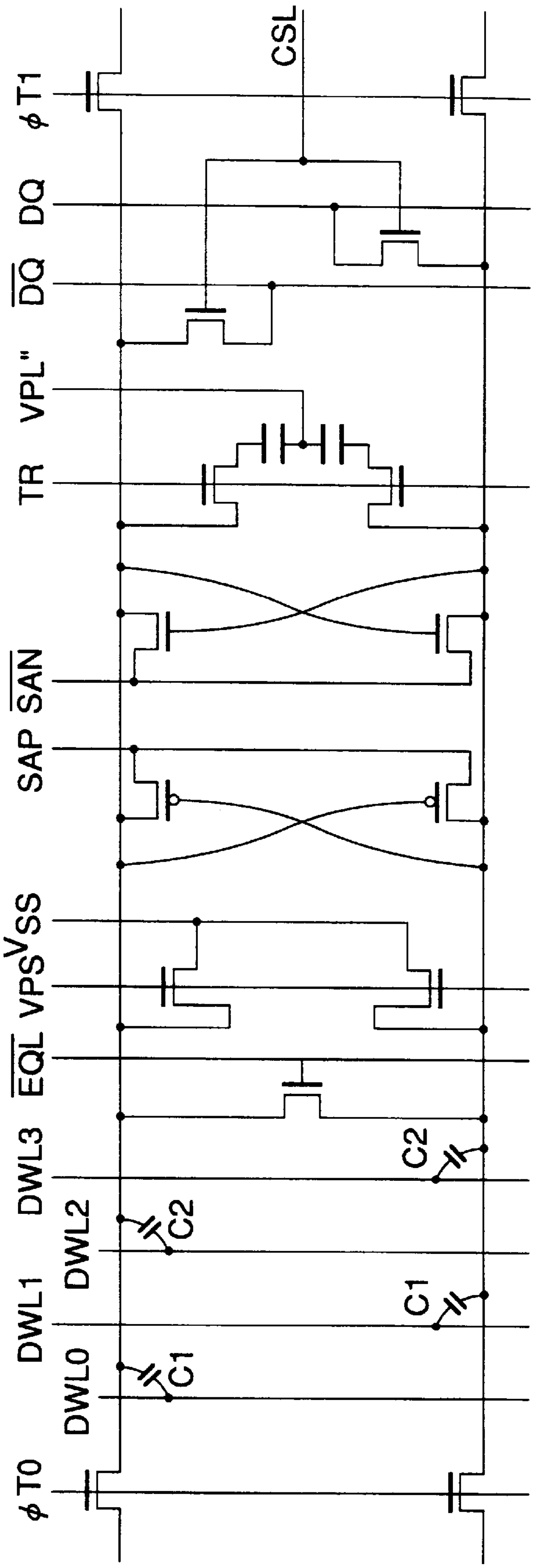
FIG. 116 is a circuit diagram of the sense amplifier of an FRAM according to the 80th embodiment.

FIG. 116 is a circuit diagram showing a sense amplifier applicable to the structures shown in FIG. 102 to FIG. 107 so as to explain the 80th embodiment of the present invention. In this case, the plate (PL) voltage is partially driven.

This sense amplifier is different from that shown in FIG. 115 in that the sense amplifier uses a paraelectric capacitor as a temporary memory register, in place of the ferroelectric capacitor. Another storage device such as a flip-flop may be used.

81st Embodiment

Figure 117:
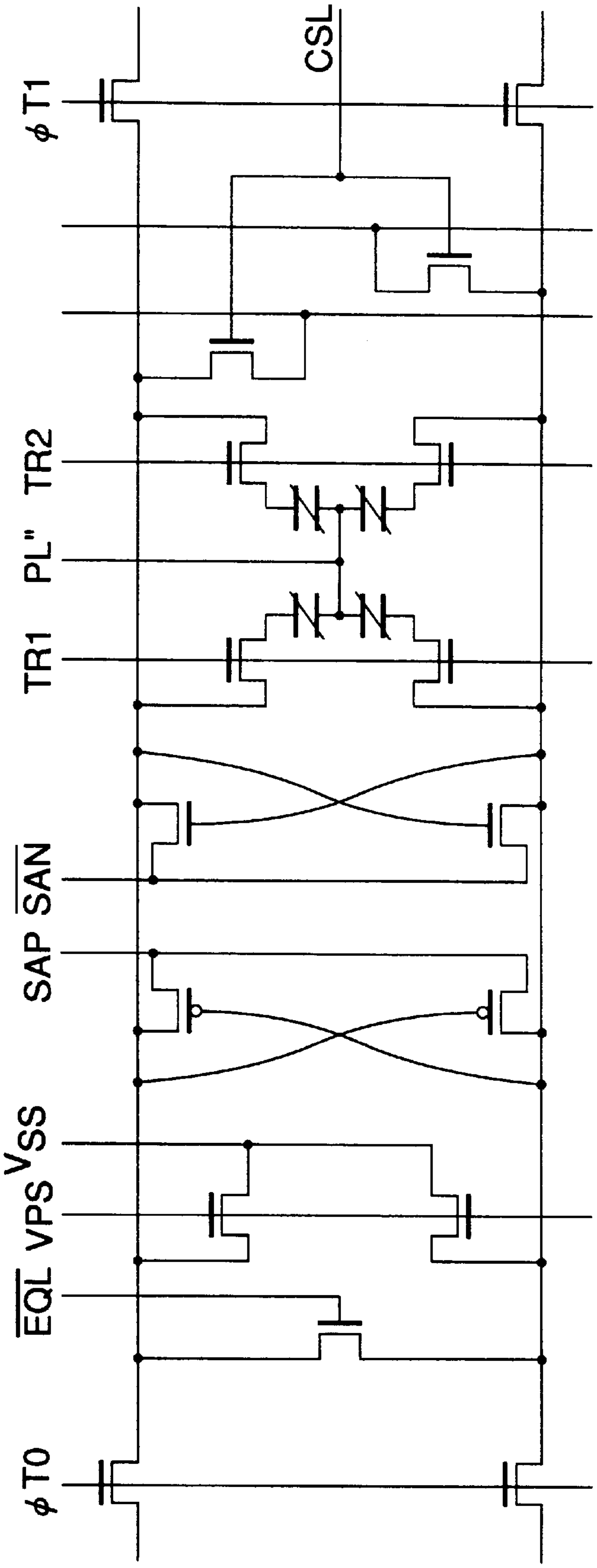
FIG. 117 is a circuit diagram of the sense amplifier of an FRAM according to the 81st embodiment.

FIG. 117 is a circuit diagram showing a sense amplifier applicable to the structures shown in FIG. 102 to FIG. 107 so as to explain the 81st embodiment of the present invention. In this case, the plate (PL) voltage is partially driven.

The sense amplifier is different from that shown in FIG. 114 in that the temporary memory register has 2-bit data. One bit data is for a cell with a low coercive voltage, and the other bit data is for a cell with a high coercive voltage. This sense amplifier can be used for, e.g., case C in FIG. 114.

The scheme of partially driving the plate electrode voltage shown in FIG. 113 and the technique of changing the bit line amplitude shown in FIG. 109 can be combined to operate multi-bit cells shown in FIG. 102 to FIG. 107, as a matter of course.

The (½)Vdd plate and the small bit line amplitude are combined to read out the first bit data, and the Vdd amplitude plate and the large bit line amplitude are combined to read out the next bit data. In this case, the ratio of the bit line amplitudes can be ½ the value in FIG. 110 or 111, and control can be easily performed. The Vdd amplitude plate scheme can also be applied to the scheme of changing the bit line amplitude shown in FIG. 109.

When the operation shown in FIG. 113 is applied to the cell structures shown in FIG. 102 to FIG. 107, the sense amplifier easily operates. However, the plate electrode voltage must be changed to Vss, Vcc, and (½)Vcc. The plate electrode can be set at Vss or Vcc by connecting the plate electrode to a Vss or Vcc line. To set the plate electrode at (½)Vcc, a (½)Vcc power supply voltage generated by the (½)Vcc generation circuit in the chip must be used. When the plate electrode voltage is to be returned from Vss to (½)Vcc, the (½)Vcc power supply voltage undesirably lowers.

Figure 118:
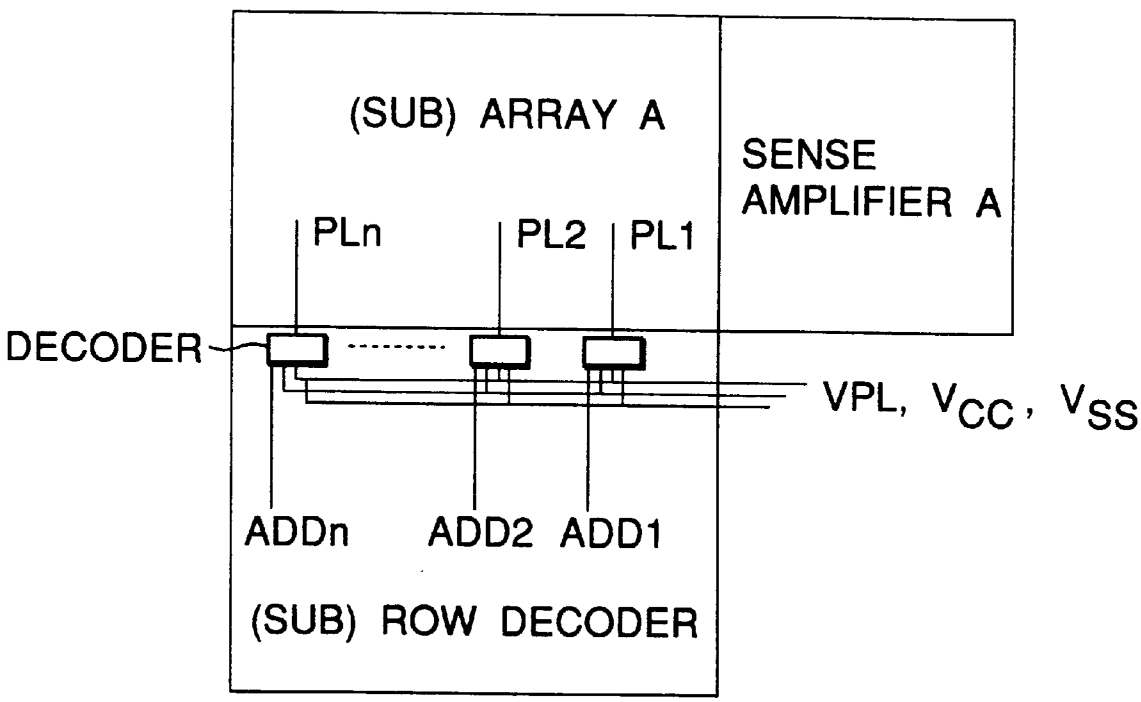
FIG. 118 is a circuit diagram showing a plate electrode driving scheme applicable to the cells shown in FIG. 102 to FIG. 107.

As shown in FIG. 118, when only the plate electrode arranged every two cell blocks in a selected block is driven, the plate load capacity is largely decreased, and the variations in (½)Vcc power supply can be suppressed. In FIG. 118, the plate is divided into n plates, i.e., plates PL1 to PLn, and only the plate in a block selected by a decoder is driven.

Figure 119A:
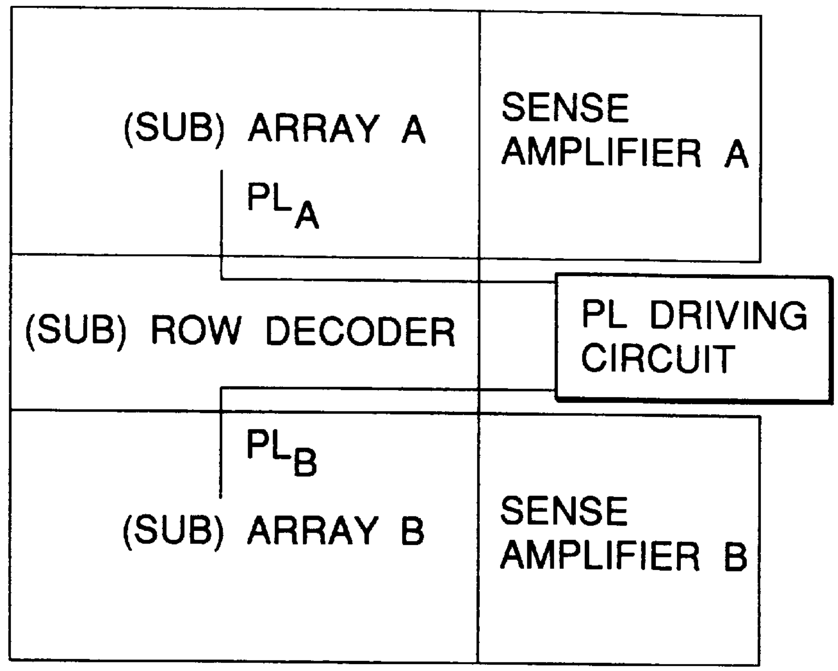
Figure 119B:
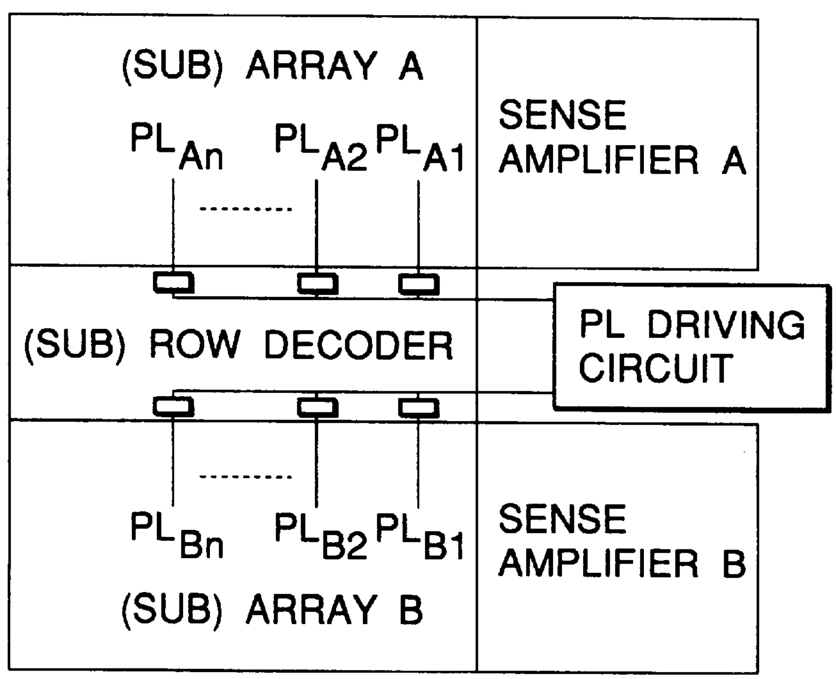

In FIG. 119A and FIG. 119B, two plate signals are used. The PL driving circuit sets a plate signal PLB at Vss when a plate signal PLA is at Vcc, or the PLB at Vcc when the PLA is at Vss. With this operation, the PLA and PLB are short-circuited to automatically generate (½)Vcc. When a cell array A (or a sub-cell array) is activated, a cell array B can be realized by driving the dummy plate. FIG. 120A and FIG. 120B are a detailed circuit diagram and a timing chart of this PL driving circuit, respectively. When a signal PLEQL is set at "H", the PLA and PLB are short-circuited, and (½)Vcc is automatically generated. In addition, the charge consumption can be halved.

Figure 121A:
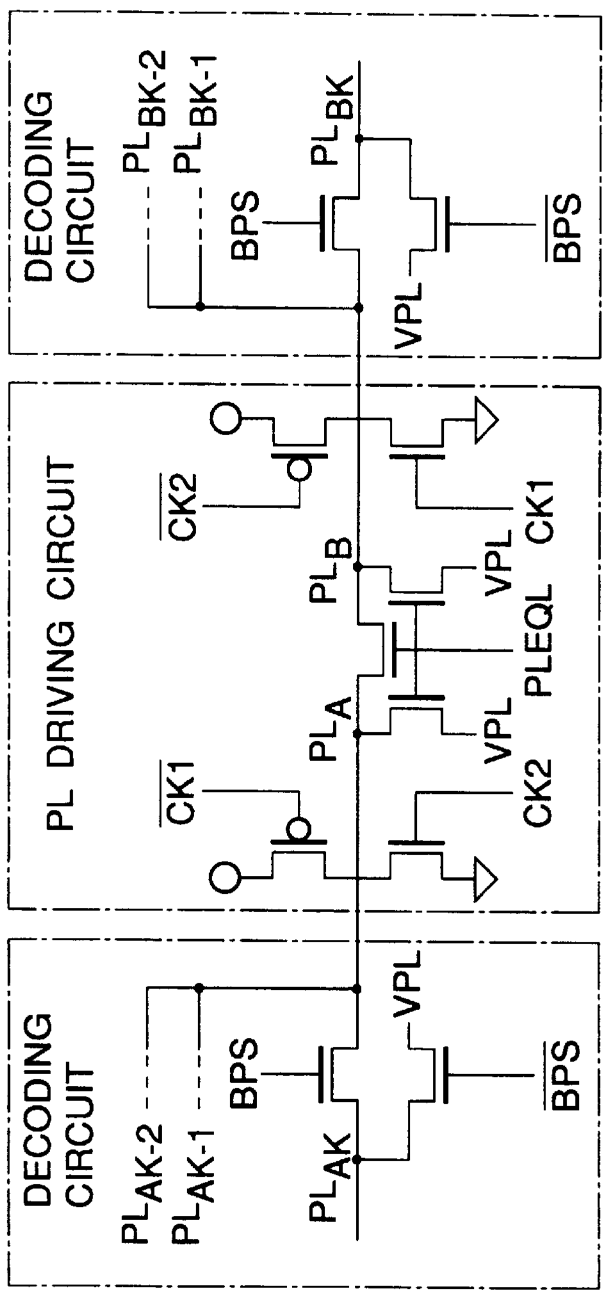
Figure 121B:
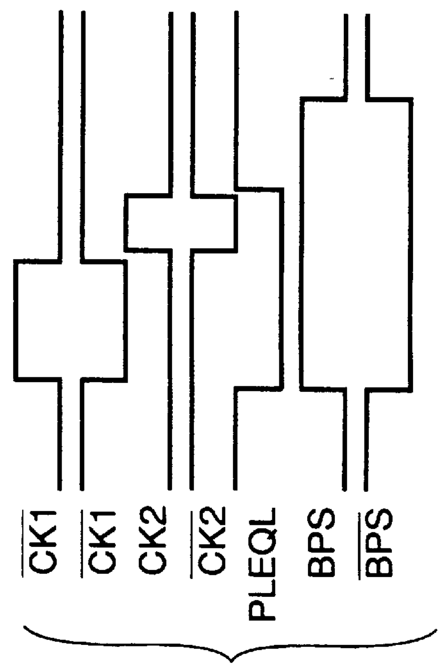

In FIG. 119B, the plate signal is decoded by an address to further reduce the power consumption, in addition to the structure shown in FIG. 119A. In this case as well, (½)Vcc can be automatically generated. FIG. 121A and FIG. 121B are a detailed circuit diagram and a timing chart of this PL driving circuit shown in FIG. 119B, respectively.

Figure 122A:
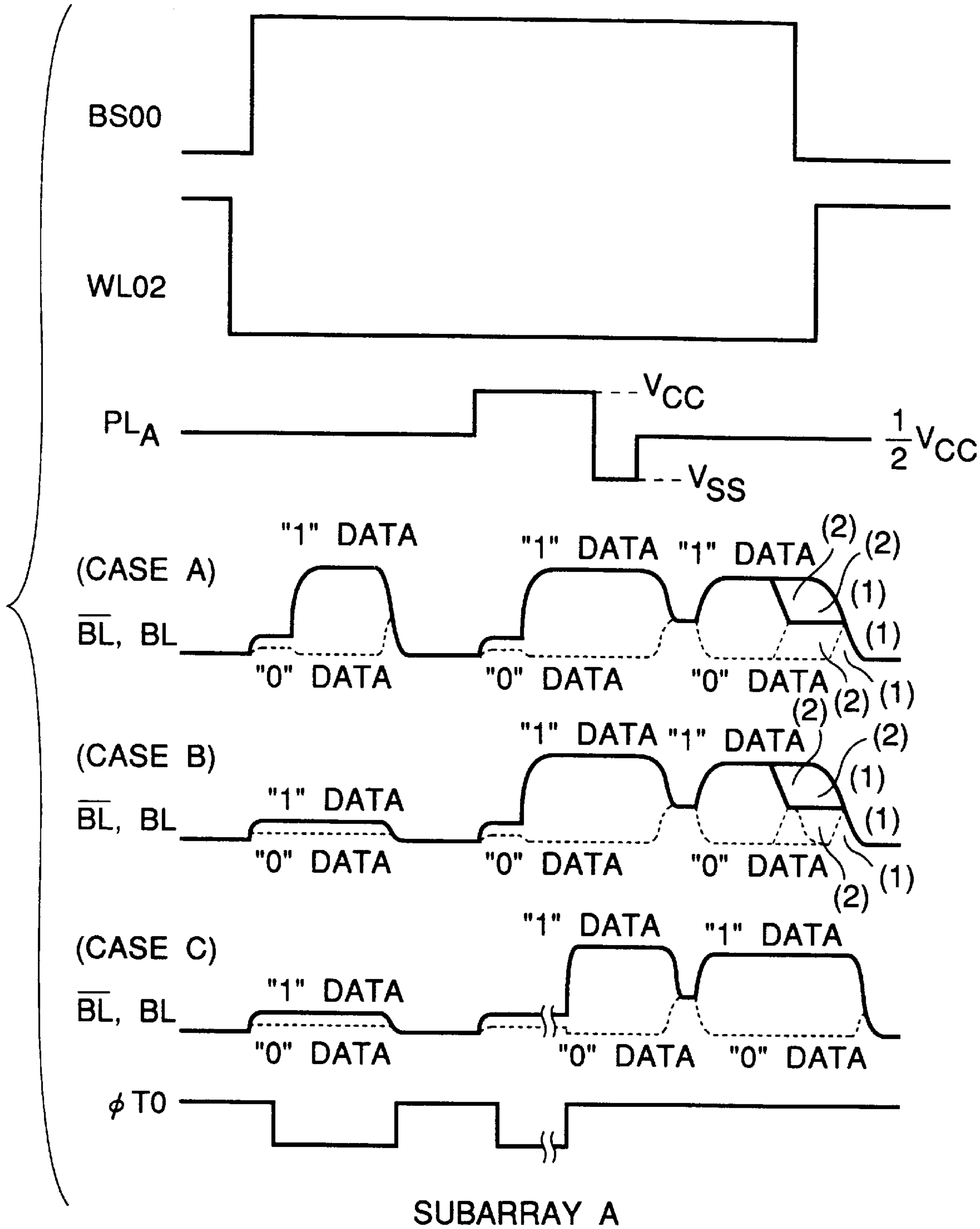
Figure 122B:
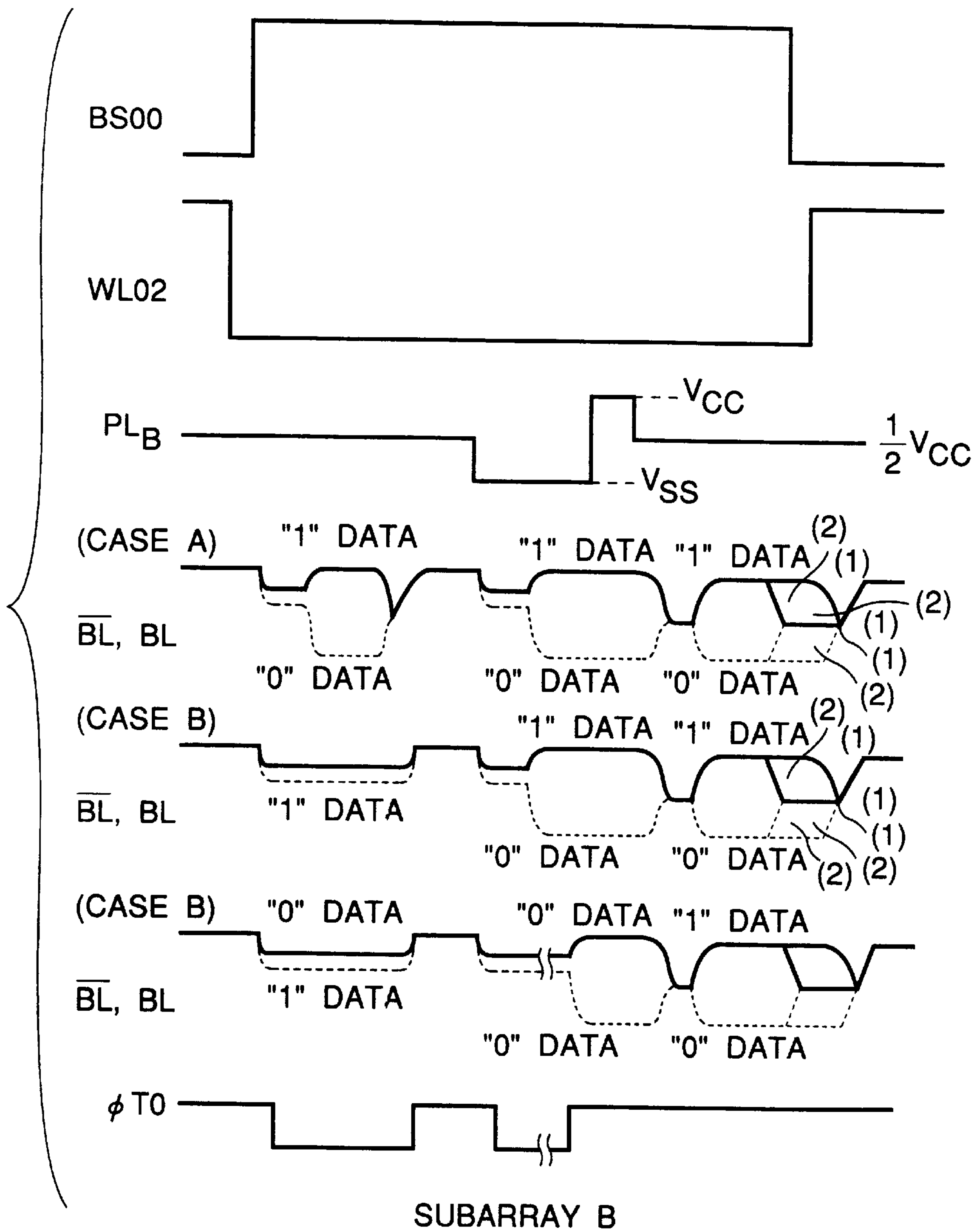
Figure 123A:
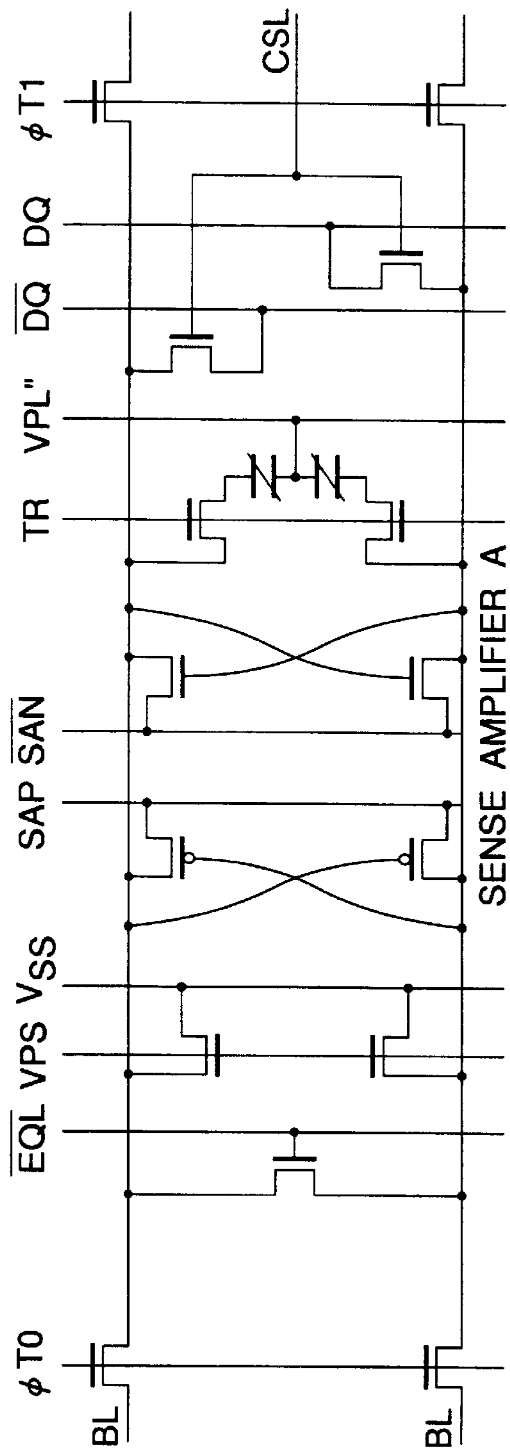
Figure 123B:
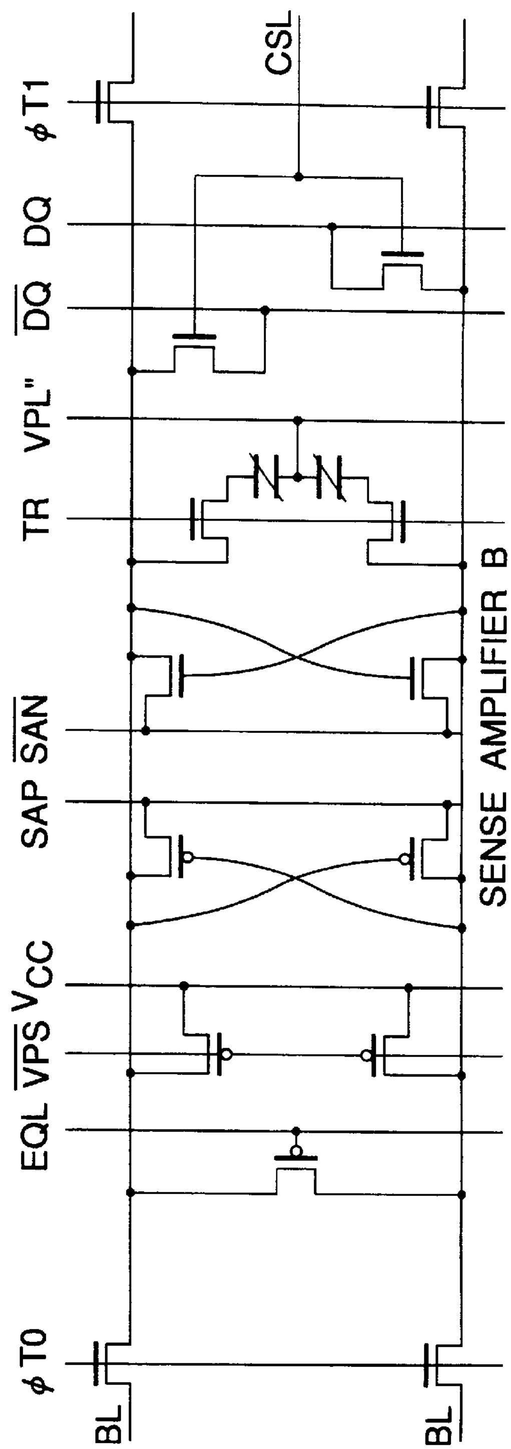
Figure 124A:
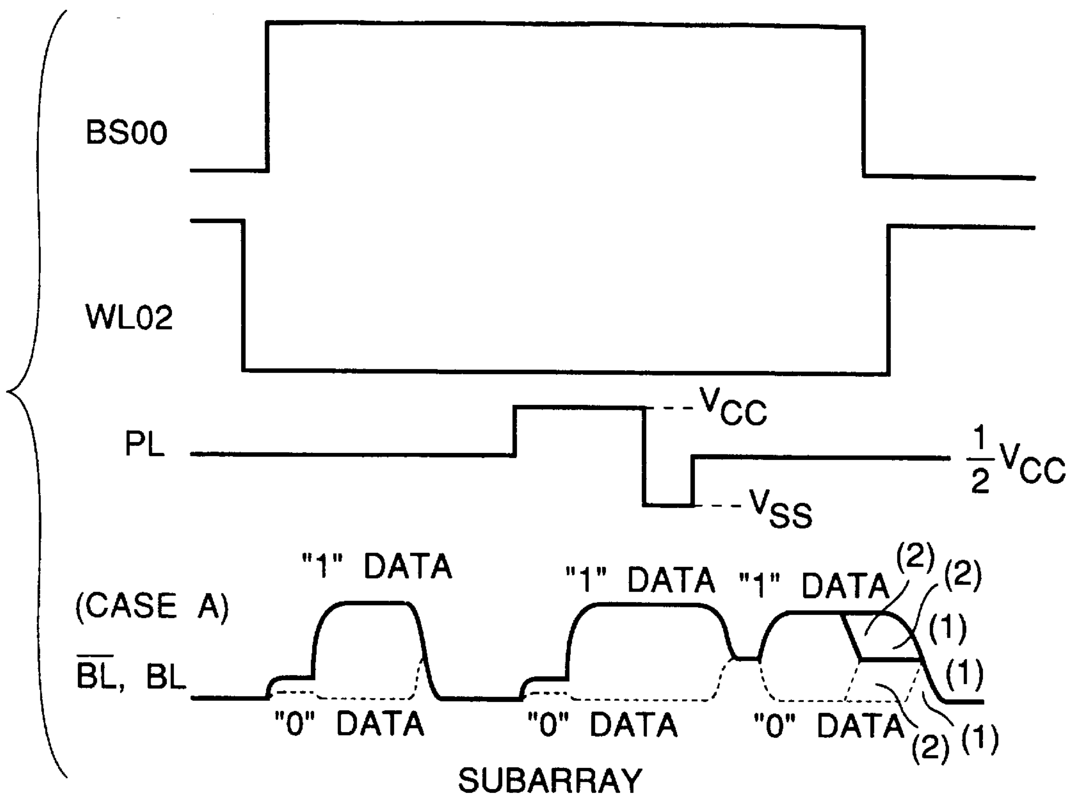
Figure 124B:
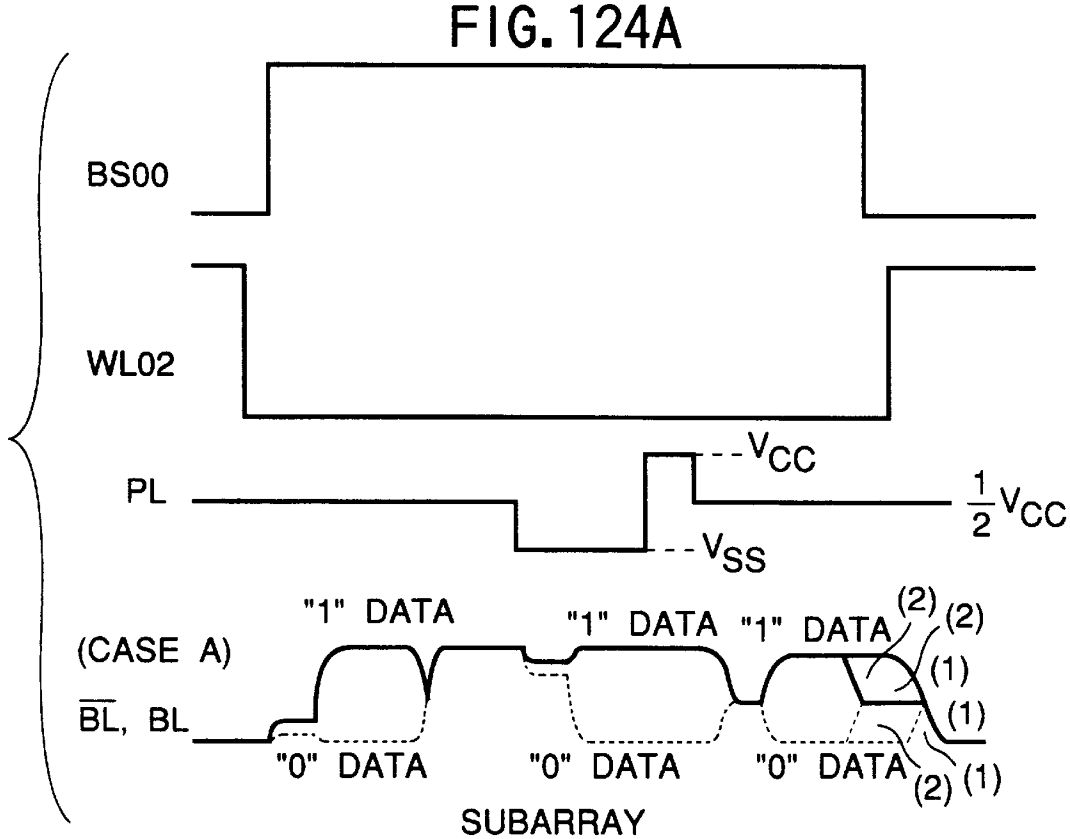

Referring to FIG. 119A and FIG. 119B, not only the (sub)array A but also the (sub)array B is activated. Not only the PLB but also the bit line BL is precharged to Vcc to reversely operate the (sub)array B with respect to the (sub) array A, as shown in FIG. 122A and FIG. 122B. With this operation, the plate electrode can be easily set at (½)Vcc. FIG. 123A and FIG. 123B are timing charts of the sense amplifier at this time. A Vss precharge circuit is mounted in a sense amplifier A, and a Vcc precharge circuit is mounted in a sense amplifier B. In FIG. 124A and FIG. 124B, the former half of 2-bit cell data is read out while precharging both cell arrays to Vss, and the latter half of the 2-bit cell data is read out while precharging the array A to Vss and the array B to Vcc.

82nd Embodiment

Figure 125:
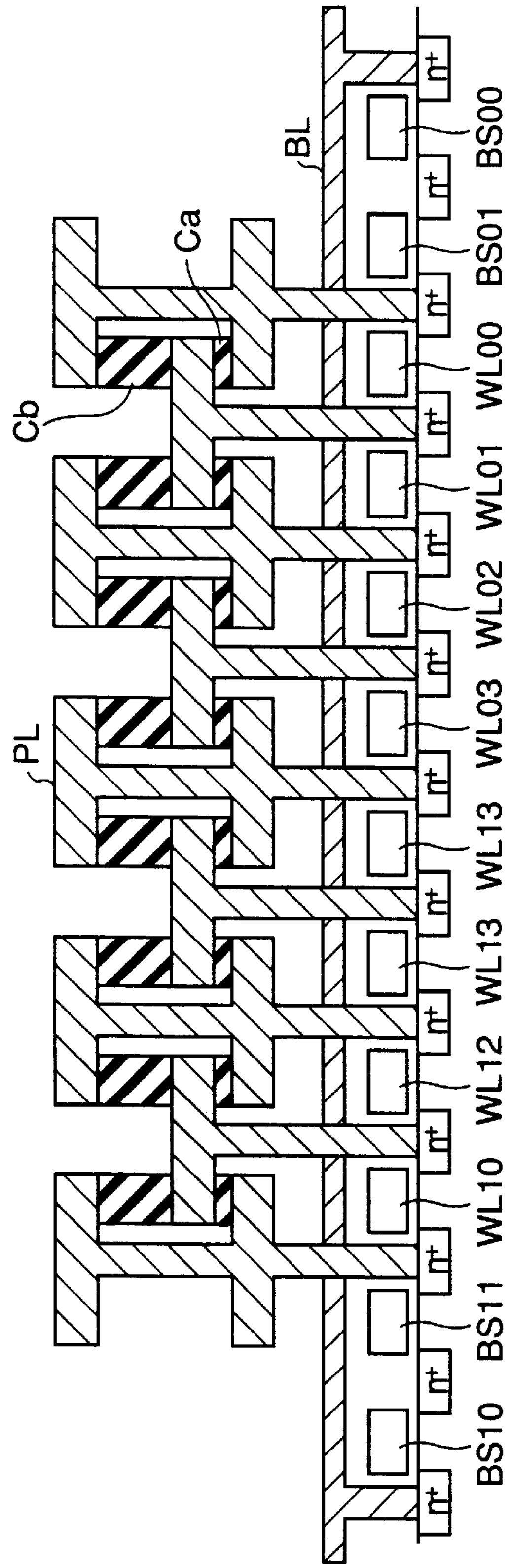

FIG. 125 is a sectional view showing a memory cell structure for realizing the equivalent circuit diagram of the memory cell shown in FIG. 102 so as to explain the 82nd embodiment of the present invention. FIG. 125 shows a modification of the structure shown in FIG. 103.

In this embodiment, ferroelectric capacitors having different thicknesses are stacked after formation of bit lines.

83rd Embodiment

Figure 126:
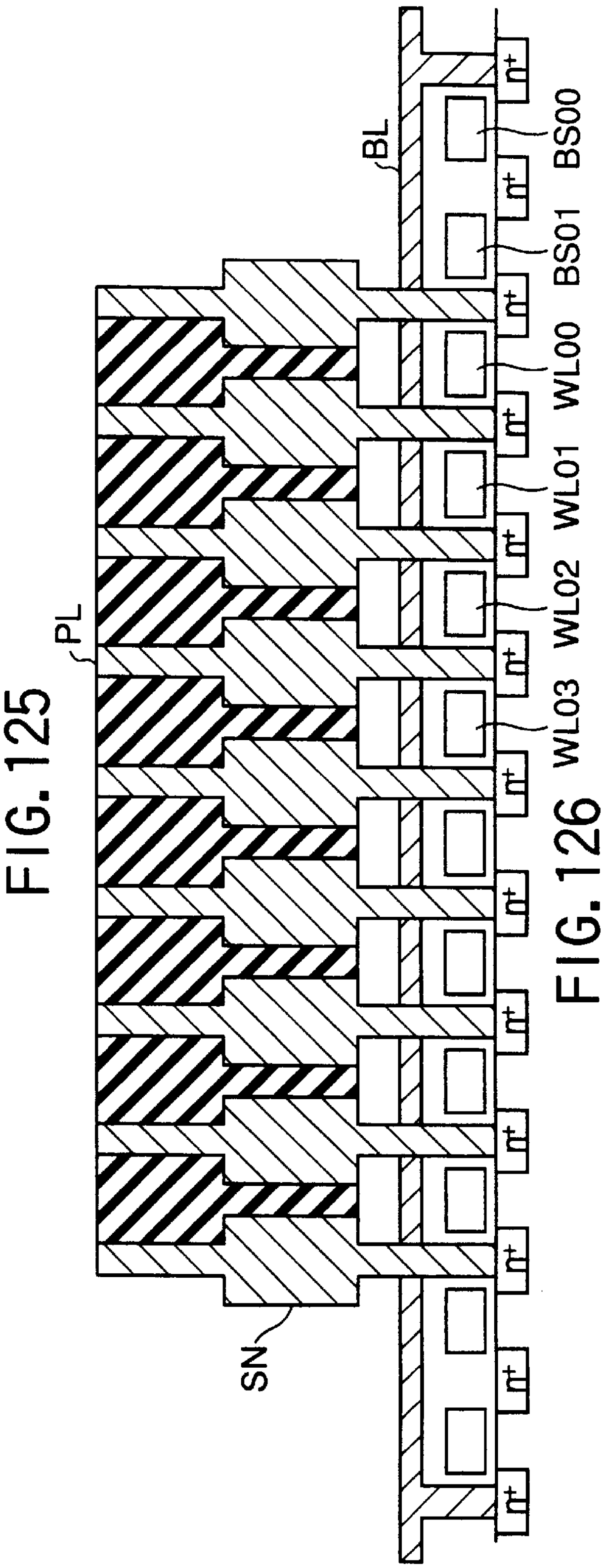

FIG. 126 is a sectional view showing a memory cell structure for realizing the equivalent circuit diagram of the memory cell shown in FIG. 102 so as to explain the 83rd embodiment of the present invention. FIG. 126 shows a modification of the structure shown in FIG. 103. In this embodiment, ferroelectric capacitors having different thicknesses are vertically stacked on an Si surface after formation of bit lines. In this embodiment, the electrode need not be sandwiched between the ferroelectric capacitors, unlike FIG. 125, and an excess process is omitted. The electrodes of the storage nodes can be simultaneously extracted from the diffusion layer and formed. When the region between the storage nodes is divided into two regions, and the ferroelectric capacitors are formed between the storage nodes, two ferroelectric capacitors having different coercive voltages can be automatically formed.

84th Embodiment

FIG. 127A and FIG. 127B are sectional views showing a memory cell structure for realizing the equivalent circuit diagram of the memory cell shown in FIG. 102 so as to explain the 84th embodiment of the present invention. FIG. 127A and FIG. 127B show a modification of the structure shown in FIG. 103.

Grooves or holes having two widths are formed in the lower electrode, ferroelectric capacitors are formed, and the upper electrode is formed. In this case, the ferroelectric capacitor area can be easily increased.

85th Embodiment

Figure 128A:
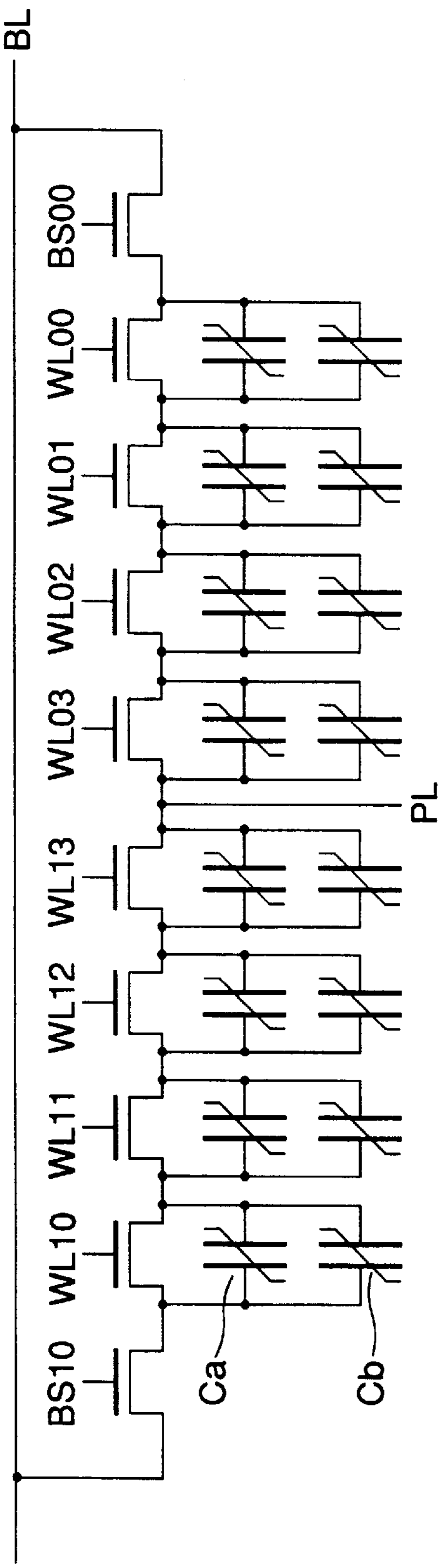
Figure 128B:
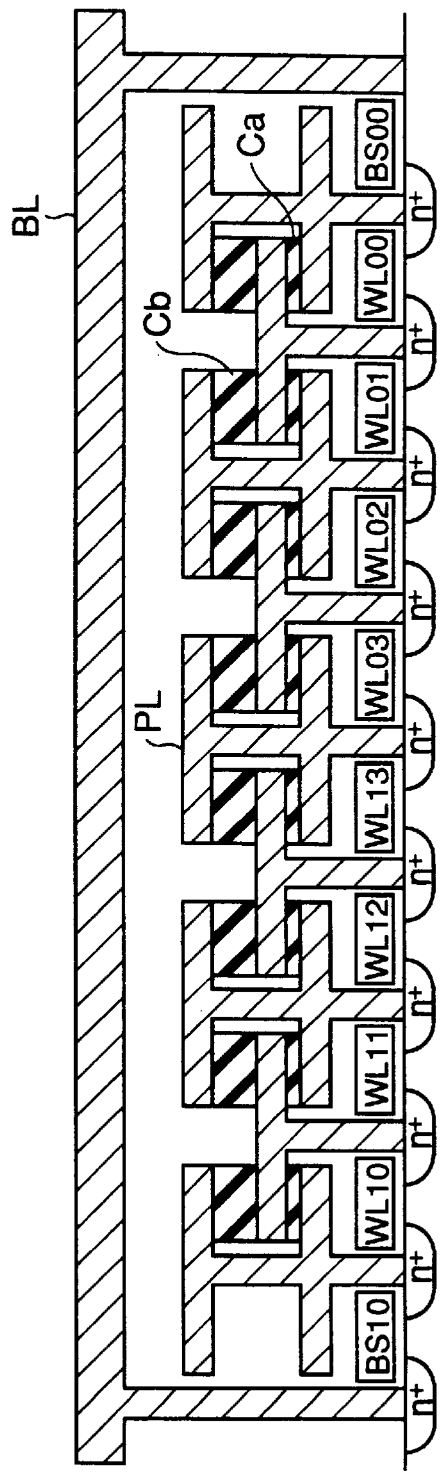

FIG. 128A and FIG. 128B are an equivalent circuit diagram of a cell structure for an open bit line structure or 2-transistors/2-capacitors structure, although FIG. 102 shows a structure for a folded bit line structure, and a sectional view of the cell taken along a line 127B—127B, respectively.

In this case, the cell structure can be realized by connecting only one select transistor to the series connected cells.

86th Embodiment

Figure 129:
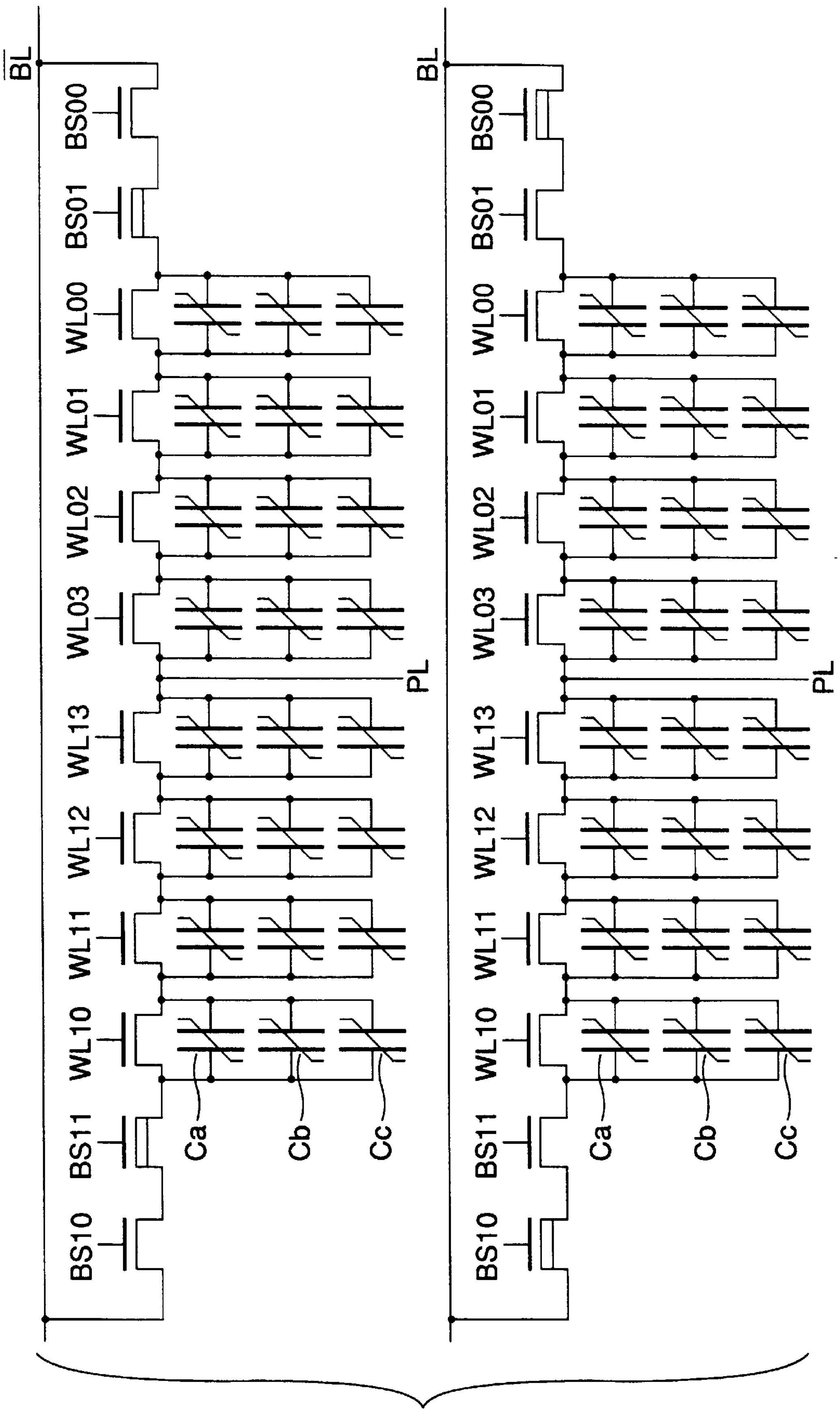

FIG. 129 is an equivalent circuit diagram for explaining the 86th embodiment of the present invention.

In FIG. 102, 2-bit cell data is held in a cell with a size of $4F^2$. In this embodiment, however, cells each having three ferroelectric capacitors having different coercive voltages and a cell transistor connected in parallel are connected in series. One terminal of the series connected cells is connected to a bit line through a select transistor, and the other terminal is connected to a plate electrode. Three-bit data can be held in one cell, so that the storage capacity can be increased.

87th Embodiment

Figure 130:
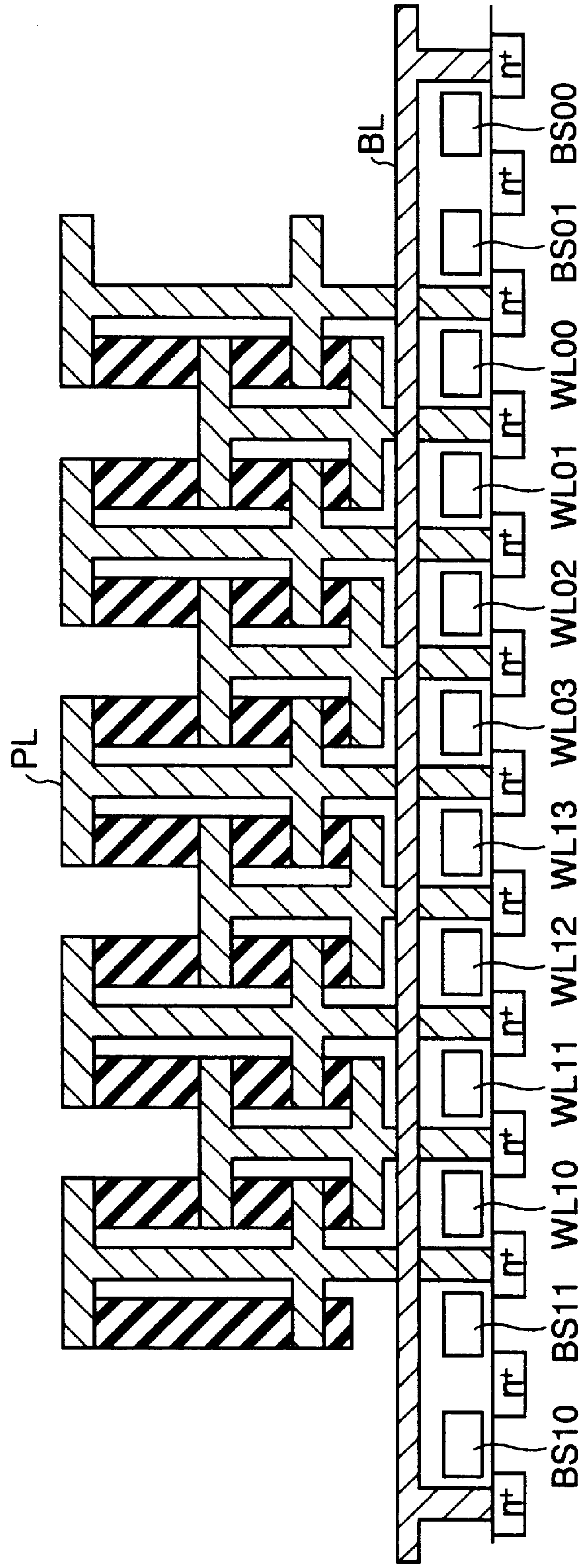

FIG. 130 is a sectional view showing a cell structure for realizing the equivalent circuit in FIG. 129 so as to explain the 87th embodiment of the present invention.

By staking a cell transistor and three ferroelectric capacitors having different coercive voltages and formed on the cell transistor in an area with a size of $4F^2$, 3-bit data can be held in a cell with a size of $4F^2$.

88th Embodiment

FIG. 131 is an equivalent circuit diagram for explaining the 88th embodiment of the present invention.

In FIG. 102, 2-bit cell data is held in a cell with a size of $4F^2$. In this embodiment, however, cells each having four ferroelectric capacitors having different coercive voltages and a cell transistor connected in parallel are connected in series. One terminal of the series connected cells is connected to a bit line through a select transistor, and the other terminal is connected to a plate electrode. Four-bit data can be held in one cell, so that the storage capacity can be increased. In addition, by increasing the number of parallel connected ferroelectric capacitors, the capacity can be increased.

89th Embodiment

FIG. 132 is a sectional view showing a cell structure for realizing the equivalent circuit in FIG. 131 so as to explain the 89th embodiment of the present invention.

By stacking a cell transistor and four ferroelectric capacitors having different coercive voltages and formed on the cell transistor in an area with a size of $4F^2$, 4-bit data can be held in a cell with a size of $4F^2$. As a result, an integration $2\times4=8$-times that of the conventional FRAM having a size of $8F^2$ can be realized.

90th Embodiment

FIG. 133 is a circuit diagram showing a combination of the n-capacitors/1-transistor structure shown in FIG. 102 and the structure shown in FIG. 83 so as to explain the 90th embodiment of the present invention.

Information of at least two bits is stored in a cell with a size of $4F^2$. In the folded bit line structure, the noise is reduced, the bit line pitch is relaxed, and the number of sense amplifiers is decreased, thereby reducing the chip size.

91st Embodiment

FIG. 134A and FIG. 134B are an equivalent circuit diagram and a graph of characteristics, respectively, for explaining the 91st embodiment of the present invention.

Unlike the n-capacitors/1-transistor cell structure shown in FIG. 102, in which ferroelectric capacitors having different coercive voltages are connected in parallel, cells having the same coercive voltage are connected. The ferroelectric capacitor close to the cell transistor is directly connected in parallel to the ferroelectric capacitor, although the ferroelectric capacitor far from the cell transistor is connected in series to a voltage drop element, and then connected in parallel to the cell transistor.

As shown in FIG. 134B, as the voltage drop element, a device which exhibits characteristics representing that a current flows in both directions when the bias value exceeds a predetermined value is used. With this structure, the cell far from the cell transistor is applied with a low voltage obtained by subtracting a predetermined voltage from the voltage applied to the cell transistor. Apparently, the cell exhibits almost the same behavior as that observed when the ferroelectric capacitor far from the cell transistor has a high coercive voltage.

92nd Embodiment

Figure 135B:
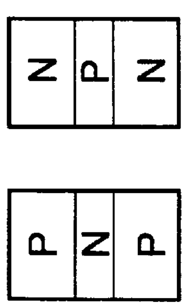
Figure 135C:
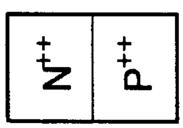
Figure 135D:
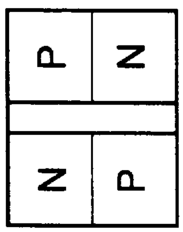
Figure 135E:
Figure 135A:
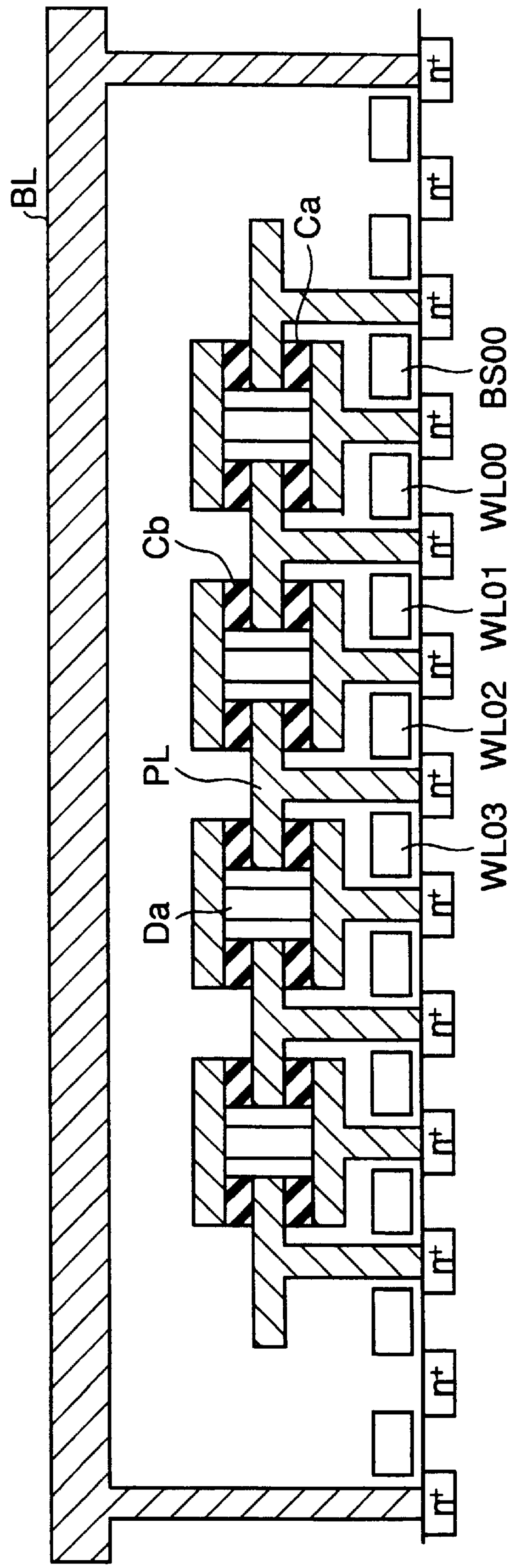

FIG. 135A is a sectional view showing a device structure for realizing the equivalent circuit shown in FIG. 134A so as to explain the 92nd embodiment of the present invention. With this structure, the coercive voltage of a ferroelectric transistor=the coercive voltage of a ferroelectric transistor Cb can be realized.

For the voltage drop element (Da), various structures shown in FIG. 135B to FIG. 135E are available. In FIG. 135B, the voltage drop element is constituted by a pnp or npn junction and realized by a punch-through structure from p to p through n or n to n through p. In FIG. 135C, the voltage drop element is realized by a Zener diode using a heavily doped p-n junction. In FIG. 135D, the voltage drop element is realized by connecting a p-n junction and an n-p junction in parallel. In FIG. 135E, a fact that, when a paraelectric capacitor and a ferroelectric capacitor are connected in parallel, the apparent coercive voltage rises in accordance with the capacity ratio. Especially, in FIG. 135E, a structure can be realized by inserting a paraelectric capacitor in a part of the ferroelectric capacitor shown in FIG. 28A and FIG. 28B unlike the structure shown in FIG. 135A.

93rd Embodiment

FIG. 136 is an equivalent circuit diagram for explaining the 93rd embodiment of the present invention.

Unlike the n-capacitors/1-transistor cell structure shown in FIG. 102, in which ferroelectric capacitors having different coercive voltages are connected in parallel, cells having the same coercive voltage are connected. The ferroelectric capacitor (Ca) close to the cell transistor is directly connected in parallel to the ferroelectric capacitor, although the ferroelectric capacitor (Cb) far from the cell transistor is connected in series to a resistor (Ra), and then connected in parallel to the cell transistor. With this structure, when the resistance of the resistor Ra is set to be sufficiently large, data of the ferroelectric transistor Ca can be immediately read/written in reading/writing. However, data of the ferroelectric transistor Cb is slowly read/written in accordance with the RC time constant determined by the resistor Ra and the capacity of the ferroelectric transistor Cb itself.

For the operation, after the data of the ferroelectric transistor Ca is read out and stored in the temporary memory register, the data of the ferroelectric transistor Cb is sufficiently slowly read/written, and finally, the data stored in the temporary memory register is rewritten in the ferroelectric transistor Ca. With this operation, 2-ferroelectric capacitors/1-cell transistor cell can be realized.

94th Embodiment

FIG. 137 is a sectional view showing a device structure for realizing the equivalent circuit shown in FIG. 136 so as to explain the 94th embodiment of the present invention.

When resistance elements are formed at positions shown in FIG. 137, the equivalent circuit shown in FIG. 136 can be realized. Assume that data is read/written in a ferroelectric transistor Ca in a time shorter than 50 ns. When the capacity of the ferroelectric transistor Ca is 100 fF, R=C/t=100 fF/50 ns=2 MΩ because t=RC. Accordingly, a resistance element having a large resistance value with a sufficient margin to 20 MΩ may be used as a resistance element Ra.

95th Embodiment

FIG. 138 is an equivalent circuit diagram for explaining the 95th embodiment of the present invention.

In this embodiment, a sense amplifier and a temporary memory register for temporarily storing data read out from a ferroelectric transistor Ca are added to the structure of the embodiment shown in FIG. 136. In this embodiment, a folded bit line structure is formed.

96th Embodiment

FIG. 139 is a timing chart showing an operation of the structure shown in FIG. 138 so as to explain the 96th embodiment of the present invention. In this case, the plate (PL) voltage is fixed.

In case A, the plate electrode is set at (½)Vcc. The bit lines are precharged to Vss. When a word line WL02 is set at "L", and a block selection line BS00 is set at "H", data of a ferroelectric capacitor C300 is read out to a bit line $\overline{BL}$. At this time, data of a ferroelectric capacitor C301 is not immediately read out because of a resistance element R30. Thereafter, the sense amplifier is activated to store the data of the ferroelectric capacitor C300 in the temporary memory register. The potentials of bit lines $\overline{BL}$ and BL are lowered to Vss to eliminate the difference in polarization amount between data "1" and data "0" of the ferroelectric capacitor C300. The word line WL02 is set at "H", and the block selection line BS00 is set at "L" to make the potential between the ferroelectric capacitors 0V. The bit lines $\overline{BL}$ and BL are precharged to Vss. The word line WL02 is set at "L", an the block selection line BS00 is set at "H" again to read out the data of the ferroelectric capacitor C301. At this time, a sufficient time is set until activation of the sense amplifier. The data is amplified by the sense amplifier and rewritten. This rewrite time is also set to be sufficiently long.

Next, the bit lines $\overline{BL}$ and BL are equalized. The data stored in the temporary memory register is rewritten in the ferroelectric capacitor C301. Next, the bit lines $\overline{BL}$ and BL are equalized. A block selection line BS02 is set at "L", and the word line WL02 is set at "H" to precharge the bit lines $\overline{BL}$ and BL to Vss. One cycle is ended. After the bit lines are equalized, the word line WL01 is set at "L", and the block selection line BS02 is set at "H" to connect the bit line and the cell. The data stored in temporary memory register is rewritten in the ferroelectric capacitor C300. The block selection line BS00 is set at "L", and the word line WL02 is set at "H" to precharge the bit lines $\overline{BL}$ and BL to VBLL. Accordingly, one cycle is ended.

In case B, after the data of the ferroelectric capacitor C301 is read out, a signal $\phi t0$ is set at "L" and amplified by the sense amplifier. For this reason, no excess rewrite in the bit lines $\overline{BL}$ and BL occurs. When the potentials of the bit lines $\overline{BL}$ and BL are lowered to VBLL, the signal $\phi t0$ is set at "H".

In case C, after the data of the ferroelectric capacitor C301 is read out, the signal ft0 is set at "L" in case B. In this case, two temporary memory registers are prepared for the ferroelectric capacitors C300 and C301, respectively. This is suitable for a case wherein, after the data of the ferroelectric capacitors C300 and C301 are stored in the temporary memory registers, the data of the ferroelectric capacitors C300 and C301 are read out externally through the temporary memory registers, and the data are externally written in the temporary memory registers. This method is suitable for High-Bnad FRAM which transmits a large quantity of data to an external device.

97th Embodiment

FIG. 140A and FIG. 140B are an equivalent circuit diagram and a sectional view, respectively, for explaining the 97th embodiment of the present invention.

The equivalent circuit in FIG. 136 and the device structure in FIG. 137 have a folded bit line structure. FIG. 140A and FIG. 140B show an open bit line structure.

98th Embodiment

FIG. 141A and FIG. 141B are an equivalent circuit diagram and a sectional view, respectively, for explaining the 98th embodiment of the present invention.

The electrodes of nodes are formed on opposite sides of those in FIG. 140A and FIG. 140B. Resistance elements are formed on ferroelectric capacitors. In addition, the order of series connection of the resistance elements and the ferroelectric capacitors is reversed to that in FIG. 140A and FIG. 140B. This structure can also be realized by the folded bit line structure shown in FIG. 136 and FIG. 137.

99th Embodiment

FIG. 142A and FIG. 142B are an equivalent circuit diagram and a sectional view, respectively, for explaining the 99th embodiment of the present invention.

Resistance elements are connected to both sides of a ferroelectric transistor Cb, unlike FIG. 141A and FIG. 141B. This structure can also be realized by the folded bit line structure shown in FIG. 136 and FIG. 137.

100th Embodiment

FIG. 143 is an equivalent circuit diagram for explaining the 100th embodiment of the present invention.

Three ferroelectric capacitors (Ca, Cb, Cc) are arranged for one memory cell transistor. A resistance element Rb and the ferroelectric capacitor Cc are connected in series. A resistance element Ra and the ferroelectric transistor Cb are connected in series. Reading is performed in the order of the ferroelectric capacitors Ca, Cb, and Cc. Rewriting is performed in the order of the ferroelectric capacitors Cc, Cb, and Ca.

101st Embodiment

FIG. 144 is a sectional view showing a cell structure for realizing the equivalent circuit of the cell structure shown in FIG. 143 so as to explain the 101st embodiment of the present invention.

A bulk cell transistor, and three layers of ferroelectric capacitors and two resistance elements which are formed on the cell transistor are stacked in a region with a size of $4F^2$, thereby holding 3-bit data. This is a folded bit line structure. An open bit line structure can also be easily realized. In addition, a bit line rule relaxation type structure in which the bit line rule is relaxed to twice can also be realized.

102nd Embodiment

FIG. 145 is an equivalent circuit diagram for explaining the 102nd embodiment of the present invention.

Some of the resistance element insertion positions are different from those of the equivalent circuit of the cell structure shown in FIG. 143. Although not illustrated, when a plurality of capacitors are connected in parallel in the structures shown in FIG. 136 to FIG. 145, the structures shown in FIG. 102 to FIG. 133 are combined, so that the storage capacity can be further increased.

In all the above-described embodiments, the word line capacity increases relative to that of the conventional structure having a size of $8F^2$. This means that the RC delay of the block selection line increases because, in the present invention, cell transistors exist at all intersections of the word lines and the bit lines. In the present invention, however, the refresh operation is omitted, unlike the DRAM. Accordingly, a stack word line structure as shown in FIG. 33A and FIG. 33B can be used to divide a cell array along the word line to make the active region as small as possible. That is, the subword line can be made short. With this structure, the word line delay can be made small.

When the stack word line structure is employed for the conventional cell having a size of $8F^2$, this stack word line structure adversely affects the word line delay. In the conventional stack word line structure, a metal interconnection is used for the main word line. The main word line is connected to a subrow decoder. A subword line is formed from the subrow decoder to a sub-cell array using a gate interconnection, thereby constituting the gate electrode of each memory cell transistor. One main word line is connected to four or eight subrow decoders. With this structure, the metal pitch of the main word lines can be relaxed to four to eight times that of a conventional shunt structure. Therefore, the metal rule which is difficult in process can be relaxed, and DOF of metal process by cell steps can be relaxed.

In this case as well, a high-resistance interconnection of polysilicon, WSi, MSi, TiSi, or the like is used for the subword line. For this reason, when the number of cells connected to the subword line increases, the RC delay becomes large. Particularly, in the above-described embodiments of the present invention, this RC delay becomes about twice.

In the following embodiments, this problem is solved.

103rd Embodiment

FIG. 146 is a block diagram showing the basic structure of an FRAM according to the 103rd embodiment of the present invention. This structure can be applied to all the above-described embodiments.

In this embodiment, the RC delay can be reduced to ¼. Consequently, the word line delay of the present invention can be reduced to ½ (=¼×2) that of the conventional cell structure with a size of $8F^2$. In this embodiment, this structure is applied to an FRAM.

M×R/D denotes a main row decoder; S×R/D, a subrow decoder; and MWL, a main word line, i.e., a metal interconnection. This structure is different from the conventional stack word line structure in the following point. In the conventional subword line, the gate interconnection is directly extracted. In this embodiment, however, the subword line of the metal interconnection is formed to the central point of the sub-cell array and shunted with the gate interconnection at that portion. The metal interconnection for the subword line does not cross even when it is extracted from both sides of the subarray. Since the metal resistor has a much smaller resistance than that of a gate interconnection resistor, the RC delay of the subword line in the sub-cell array can be reduced to ¼ because R is ½, and C is ½ that of the conventional structure.

When this structure is applied to the ferroelectric capacitor of the present invention, the RC delay can be ½ because R is ½, and C does not substantially change. In the example shown in FIG. 146, since four subword lines are arranged for a main word line, the main word line and two metal interconnections for subword lines, i.e., a total of three word lines are formed for four subword lines. Accordingly, the metal interconnection rule can be relaxed to 4/3 as that of the shunt structure, as shown in the sectional view of the lower right portion of FIG. 146.

104th Embodiment

FIG. 147 is a block diagram showing the basic structure of an FRAM according to the 104th embodiment of the present invention. This structure can be applied to all the above-described embodiments.

In this embodiment, the metal pitch is further relaxed while keeping the small RC delay, unlike FIG. 146. Since eight subword lines are formed for one main row word line, one interconnection for the subrow main word line and four interconnections for the subword lines, i.e., a total of five interconnections are formed. As is shown in the sectional view of the right lower portion of FIG. 147, the metal interconnections rule can be relaxed to 8/5 that of the shunt structure.

105th Embodiment

FIG. 148A and FIG. 148B are block diagrams showing the basic structure of an FRAM according to the 105th embodiment of the present invention. This structure can be applied to all the above-described embodiments.

In the structure shown in FIG. 146, the metal pitch is relaxed while keeping the small RC delay. However, the gate interconnection is formed to the very limit of the pitch (2F) in the subword line shunt region, so the shunt contact from the metal interconnection must be obtained on this gate interconnection. Basically, the contact size is F, and the underlayer margin of the gate interconnection with respect to the contact is zero.

The structure shown in FIG. 148A and FIG. 148B solves this problem. As shown in FIG. 148A, the connection form of the subword line changes every other line. One subword line is shunted near the metal interconnection and the driving circuit for the subrow decoder, switched to the bit line at the central portion of the subarray, and shunted to the gate interconnection far from the subrow decoder. With this structure, the gate interconnection can be separated at the central portion of the subarray. For the other subword line, the metal interconnection for the subword line is extended to the center of the subarray and shunted to the gate interconnection at a portion where the gate interconnection has a margin. In FIG. 148B, the positions of the two connection structures are replaced with each other.

106th Embodiment

FIG. 149A and FIG. 149B are plan views showing two examples of the layout at the central portion of the sub-cell array having the structure shown in FIG. 148A or 147B so as to explain the 106th embodiment of the present invention.

FIG. 149A corresponds to FIG. 148A, and FIG. 149B corresponds to FIG. 148B. FIG. 149A and FIG. 149B show metal interconnections, gates, bit lines, contacts between the metal and bit lines, and contacts between the bit lines and the gates.

In this embodiment, the margin between the gate interconnection and the contact and the contact size are large. In addition, the remaining interconnections, the contact size, and the margin of the contact size are large.

FIG. 150A and FIG. 150B show only the gates and the contacts between the bit lines and the gates in FIG. 149A and FIG. 149B. FIG. 151A and FIG. 151B show only the gates, the bit lines, and the contacts between the bit lines and the gates in FIG. 149A and FIG. 149B. FIG. 152A and FIG. 152B show only the metal, the bit lines, and the contacts between the metal interconnections and the bit lines in FIG. 149A and FIG. 149B.

107th Embodiment

FIG. 153 is a circuit diagram showing a CMOS circuit as a subrow decoder so as to explain the 107th embodiment of the present invention. This embodiment can also be applied to all the above-described embodiments.

When a block selection line BS00 is to set at "H", an signal MBS may be set at "L", and a bit line $\overline{BL}$ may be set at "L". When a word line WL01 is to be set at "L", a main word line MWL0 may be set at "H", a signal $\overline{WSL00}$ may be set at "L", and a signal WSL00 may be set at "H".

108th Embodiment

FIG. 154 is a block diagram showing an example of the cell array arrangement and a spare cell array arrangement so as to explain the 108th embodiment of the present invention. This embodiment can also be applied to all the above-described embodiments.

One of disadvantages of the present invention is that, the structure of one cell block is larger than that of the conventional perfect 1-transistor/1-capacitor structure. When a spare cell block array is arranged for every cell array, the area is largely adversely affected. The structure shown in FIG. 154 solves this problem. In FIG. 154, spare cell arrays including spare blocks are arranged only at terminals of the cell array of one chip in the row and columns directions. The spare cell is replaced in large units. With this structure, the unit of the spare cell array can be freely set, thus increasing the remedy efficiency.

109th Embodiment

FIG. 155 is a block diagram including a redundancy spare circuit in a chip so as to explain the 109th embodiment of the present invention.

A row spare memory and a column spare memory are arranged for defective rows and columns, respectively. A row address and column address are stored in the row spare memory and the column spare memory, respectively, and compared to the spare memories. For an address without any redundancy, an enable signal is issued from the spare memory to the normal row decoder or column decoder.

For an address with a redundancy, a disable signal is issued from the spare memory to the normal row decoder or column decoder, so the normal row decoder or column decoder does not operate. The enable signal and mapped spare rows and spare columns are selected in the spare row decoder and spare column decoder. The spare memory may be a conventional memory using a fuse, or a memory using a ferroelectric capacitor.

110th Embodiment

FIG. 156 is a circuit diagram showing a method of repairing a defect memory cell in the 110th embodiment of the present invention.

When the circuit shown in FIG. 155 is used, a cell block shown in FIG. 156 can be directly replaced. In this case, an upper address larger than that of the cell block can be used to designate mapping of the spare block. Although the remedy efficiency lowers, the spare memory capacity can be small. This replacement can cope with a plurality of defective cells, or a DC defect such as a short-circuit between a word line and a cell node.

111th Embodiment

FIG. 157 is a circuit diagram showing a method of repairing a defect memory cell in the 111th embodiment of the present invention.

This method can be realized by the block structure shown in FIG. 155. For a defect such as destruction of a ferroelectric capacitor connected to a word line WL03 of a normal cell, the cell transistor may be short-circuited while always keeping the word line WL03 at "H". When a spare word line SWL03 is selected to select the word line WL03, replacement can be performed without influencing reading/writing of remaining cell data in the same cell block. In this case, only the address of the selected block which is to be replaced need be stored in the spare memory corresponding to the spare word line SWL03.

112th Embodiment

FIG. 158 is a circuit diagram showing a method of repairing a defect memory cell in the 112th embodiment of the present invention.

This method can be realized by the block structure shown in FIG. 155. A plurality of word lines are set into a group. For a defect such as destruction of ferroelectric capacitors across word lines WL03 and WL02, or only for the word line WL02 or WL03 of a normal cell, the word line group is directly replaced with a corresponding spare word line group (SWL03 and SWL02). In this case, only the address of the selected block which is to be replaced need be stored in the spare memory corresponding to the spare word line group. Because the spare word lines are handled as a group, the number of spare memories can be reduced, as compared to the structure shown in FIG. 157.

113th Embodiment

FIG. 159 is a circuit diagram showing a method of repairing a defect memory cell in the 113th embodiment of the present invention.

This method can be realized by the block structure shown in FIG. 155. A plurality of word lines are set into a group. For a defect such as destruction of ferroelectric capacitors across word lines WL04 and WL05, or only for the word line WL04 or WL05 of a normal cell, the word line group is replaced with an arbitrary spare word line group (e.g., spare word lines SWL03 and SWL02). In this case, only the address of the selected block which is to be replaced and the address representing the group in the cell block need be stored in the spare memory corresponding to the spare word line group. The number of spare memories increases, as compared to FIG. 157 and FIG. 158. However, the remedy efficiency largely increases because, when a number of cells at the same position in different cell blocks become defective, the cells can be remedied.

The spare cell array shown in FIG. 156 to FIG. 159 may be arranged in the same cell array as that of normal cells, or arranged in another cell array to increase the remedy efficiency.

114th Embodiment

FIG. 160 is a sectional view showing a cell structure so as to explain the 114th embodiment of the present invention.

In the above-described structures, when the cell size is $4F^2$, the capacitor size is also $4F^2$. In conversion of this size into a planar area, the ferroelectric capacitor area inevitably decreases. In the cell structure shown in FIG. 160, the ferroelectric capacitor area can be increased to $3F^2$, i.e., equal to or larger than that of the conventional cell with a size of $8F^2$. The ferroelectric capacitor area can also be increased in the structures shown in FIG. 61 and FIG. 62. In these structure, however, three layers of ferroelectric capacitors are stacked. The structure of this embodiment, in which two layers of ferroelectric capacitors are stacked, can be more easily manufactured. Even in the multilayered structures shown in FIG. 55C and FIG. 55D, the capacity can be increased. However, the ferroelectric capacitor must be divided into small pieces.

In the structure shown in FIG. 160, one ferroelectric capacitor can be formed without being separated and can be easily manufactured. In a modification shown in FIG. 161, bit lines are formed before formation of ferroelectric capacitors.

FIG. 162 is an equivalent circuit diagram of FIG. 160 and FIG. 161. This structure is different from the above-described structures. Two block select transistors are connected in series because of the folded bit line structure. For the operation, the random access properties partially degrade. For example, when word lines WL3 and WL4 are to be selected, the word line WL4 is selected to read out cell data and stored in a temporary memory register. At this time, the cell of the word line WL5 is short-circuited, so the cell data is not destroyed. Next, the word line WL5 is selected to read/write cell information of the word line WL5. Finally, the word line WL4 is selected to write the information in the temporary memory register in the cell of the word line WL4.

Similarly, when word lines WL0 and WL1, WL2 and WL3, WL6 and WL7 are selected, data is read out from the word line WL0, WL3, or WL7. With this operation, arbitrary cell data can be read/written. FIG. 163 shows the operation in units of 2 bits. The plate electrode may be fixed at (½)Vcc or changed within the range of Vss to Vcc.

115th Embodiment

FIG. 164A to FIG. 164D are plan views showing the cell structures of an FRAM according to the 115th embodiment of the present invention. FIG. 164A to FIG. 164D show the layouts of four cells having different cell structures, although the equivalent circuit does not change, i.e., cells each constituted by connecting a ferroelectric capacitor and a cell transistor in parallel are connected in series.

Each of these structures has a size larger than $4F^2$, and can be applied to inexpensive low-integration FRAMs including a 1-Mbit FRAM and a 16-Mbit FRAM. Although the cell size is large, the characteristic features of the present invention, i.e., a high-speed operation in the scheme of fixing the plate electrode at (½)Vcc and the omission of the refresh operation can be held.

FIG. 164A to FIG. 164D show word line layers, bit line layers, diffusion layers, contacts between the diffusion layers and the bit line layers, contacts between the bit line layers and metal layers, contacts between the bit line layers and lower electrodes, contacts between the metal layers and upper electrodes, contacts between the metal layers and the lower electrodes, and upper bit line layers.

Of FIG. 164A to FIG. 164D, FIG. 165A to FIG. 165D show only the word line layers, the bit line layers, the diffusion layers, and the contacts between the diffusion layers and bit line layers. FIG. 166A to FIG. 166D show only the contacts between the bit line layers and the metal layers, the contacts between the bit line layers and the lower electrodes, the contacts between the metal layers and the upper electrodes, the contacts between the metal layers and the lower electrodes, and the upper bit line layers.

Figure 164D:
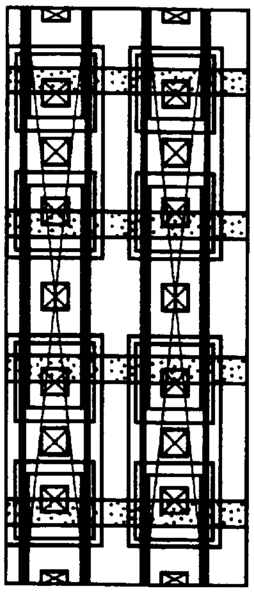
Figure 164C:
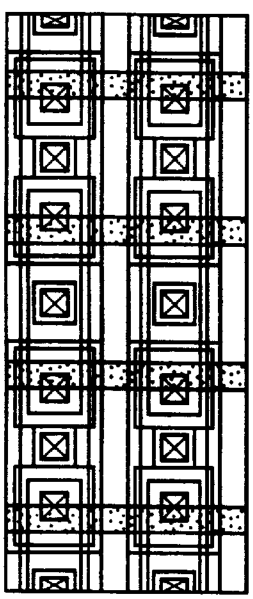
Figure 164B:
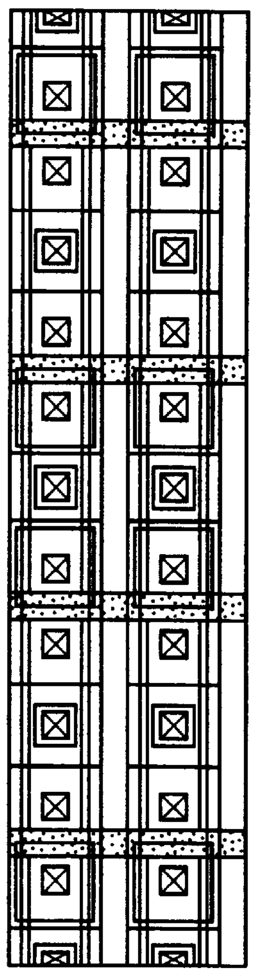
Figure 164A:
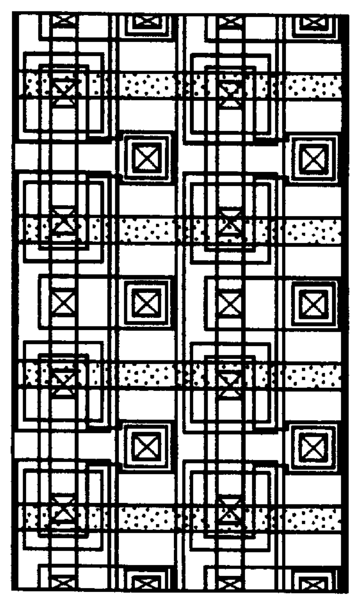
Figures 165A, 165B, 165C, 165D:
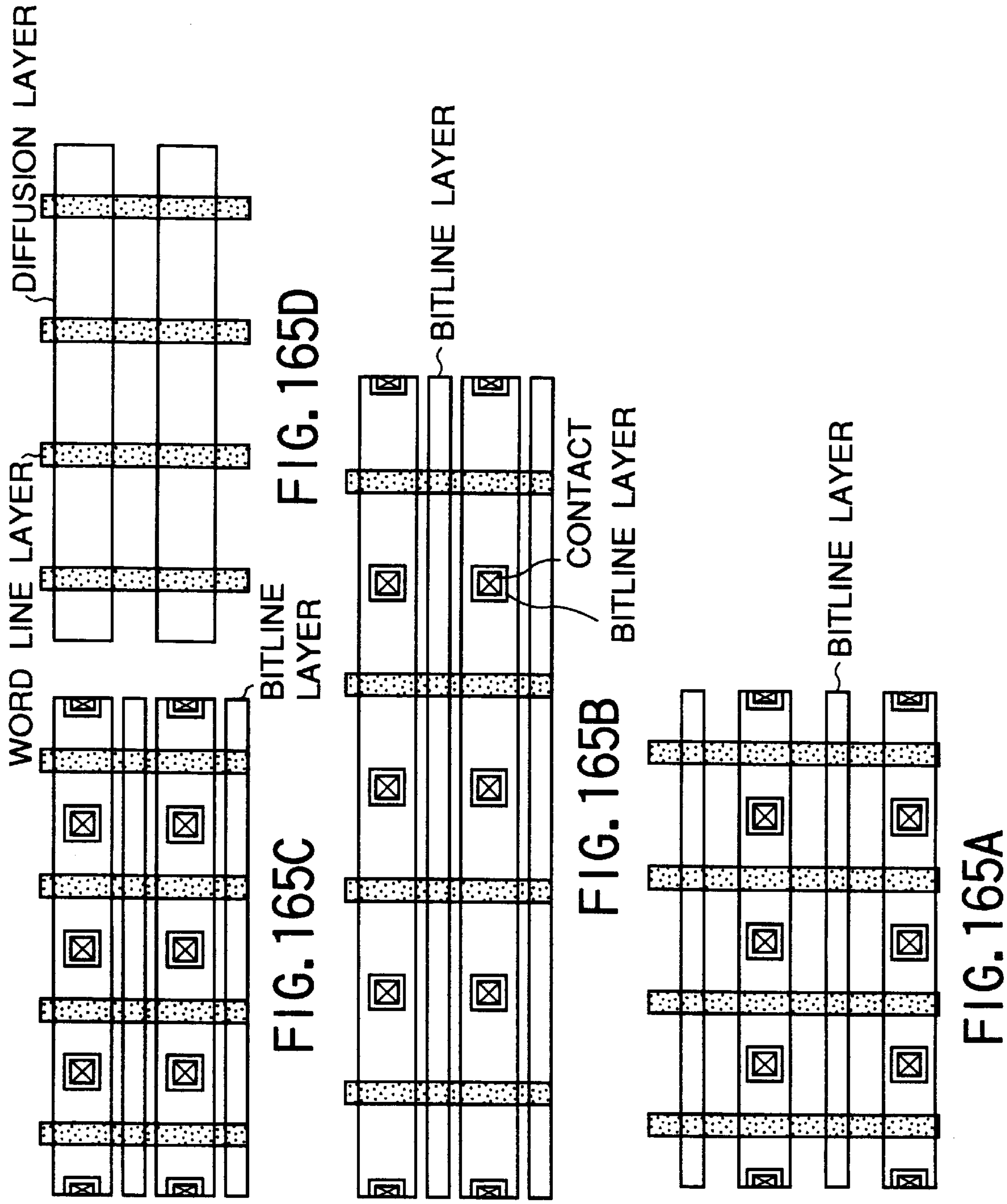
Figures 166A, 166B, 166C, 166D:
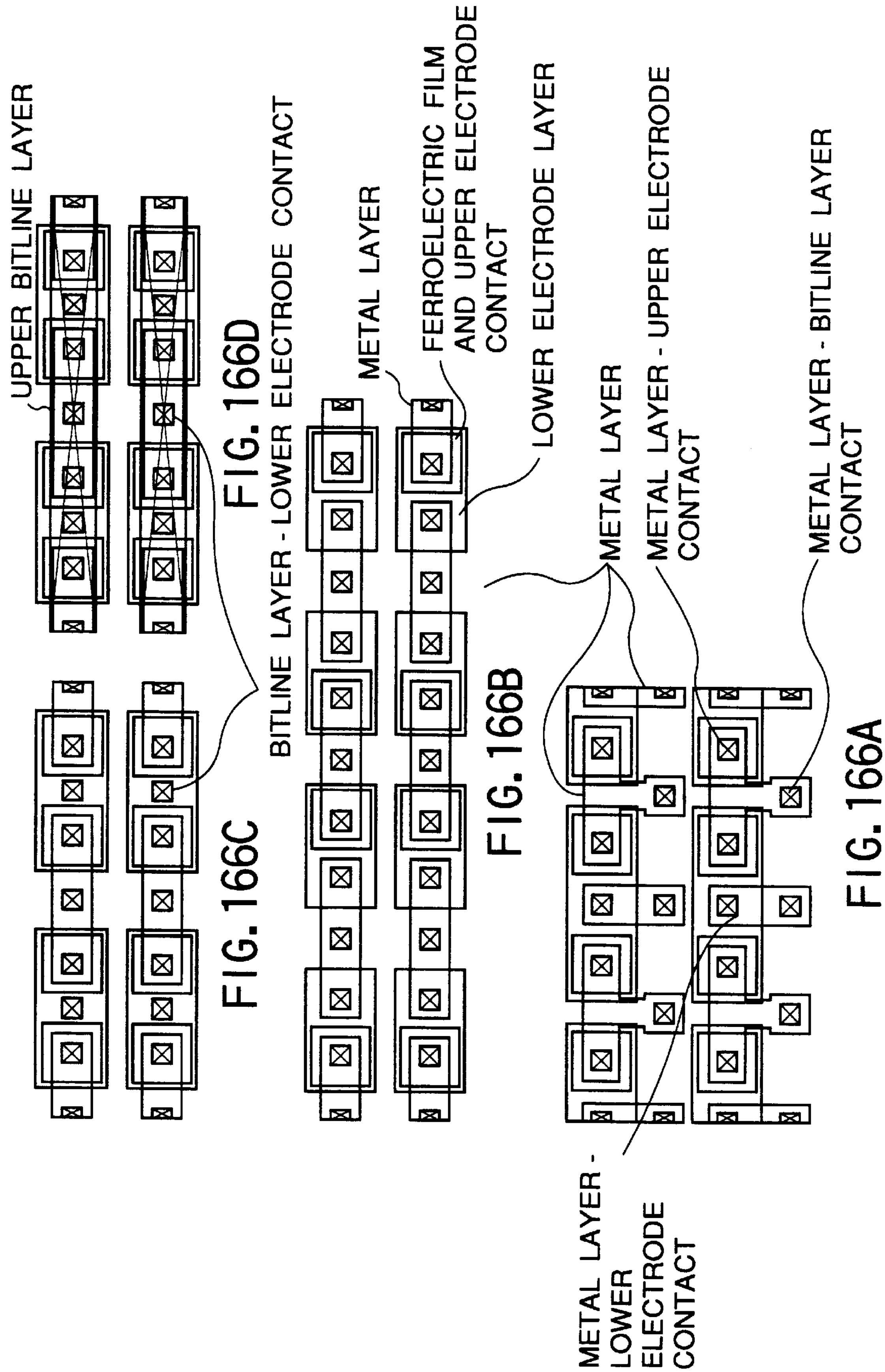

In FIG. 164A, ferroelectric capacitors and cell transistors are shifted by a ½ pitch along the word line, and the bit line layers as bit lines are formed under the ferroelectric capacitors. The node of the diffusion layer of the source or drain of the cell transistor is temporarily extracted above the bit line layer (the bit line layer is not a bit line although it is formed of the same layer as the bit lines) through the contact between the diffusion layer and the bit line layer and connected to the metal layer through the contact between the bit line layer and the metal layer. The metal layer is extended along the word line and connected to the upper and lower electrodes through the contact between the metal layer and the upper electrode and the contact between the metal layer and the lower electrode.

FIG. 167A is a plan view of the cell in FIG. 164A viewed along the word line. FIG. 167B is a sectional view taken along a line 166B—166B, and FIG. 167C is a sectional view taken along a line 166C—166C. FIG. 167B shows connection from the node of the diffusion layer to the lower electrode. FIG. 167C shows connection from the node of the diffusion layer to the upper electrode. As shown in FIG. 167D, the diffusion layer may be directly connected to the metal layer via the bit line layer, unlike FIG. 167B.

The cell structure in FIG. 164A is characterized in that the lower electrode need not be directly formed on an Si plug, a Ti layer, or a TiN layer from the diffusion layer, and the electrode node is connected from the upper side through a metal layer or the like after formation of the lower electrode. With this structure, problems of planarization of the Si plug, formation of silicide due to reaction of the lower electrode of Pt and Si in annealing, and formation of an oxide film between the Si plug and the Ti or TiN film due to oxidation of Ti in formation of ferroelectric capacitors can be avoided. In addition, since the bit lines are covered with cells, coupling noise between the bit lines due to the capacity between the bit lines can be reduced.

In the cell shown in FIG. 164B, the cell transistor is arranged under the ferroelectric capacitor. Bit lines are formed between the ferroelectric capacitor and the cell transistor while being shifted by a ½ pitch along the word line. FIG. 168 is a sectional view of the structure shown in FIG. 164B. The node of the source or drain of the cell transistor is connected to the metal layer directly or through the bit line layer. The metal layer is extended along the bit line and brought into contact with the upper or lower electrode of the ferroelectric capacitor from the upper side.

The cell shown in FIG. 164C has almost the same structure as that shown in FIG. 8, in which the ferroelectric capacitor and the cell transistor are formed on the upper and lower sides, and the bit line is formed under the ferroelectric capacitor while being shifted by a ½ pitch. The structure in FIG. 164C is different from that shown in FIG. 8 in that the diffusion layer is connected to the electrode through the same interconnection (bit line layer) as that of the bit line, and the ferroelectric capacitor size is set to be relatively large. By interposing the bit line layer, the depth of the contact is reduced.

The cell shown in FIG. 164D has almost the same structure as that shown in FIG. 7A and FIG. 7B, in which the ferroelectric capacitor and the cell transistor are formed on the upper and lower sides, and the bit line (upper bit line layer) is formed on the ferroelectric capacitor. The structure in FIG. 164D is different from that shown in FIG. 7A and FIG. 7B in that the diffusion layer is connected to the electrode through the bit line layer, and the ferroelectric capacitor size is set to be relatively large. By interposing the bit line layer, the depth of the contact is reduced. When the ferroelectric capacitor is increased, the bit line capacity increases. However, since, in the present invention, the bit line capacity is large, the increase in bit line capacity poses no serious problem.

116th Embodiment

FIG. 169A is a plan view showing the cell structure of an FRAM according to the 116th embodiment of the present invention.

FIG. 169A shows word line layers, bit line layers, diffusion layers, contacts between the diffusion layers and the bit line layers, contacts between the bit line layers and metal layers, contacts between the bit line layers and lower electrodes, contacts between the metal layers and upper electrodes, contacts between the metal layers and the lower electrodes, and upper bit line layers, as in FIG. 164A to FIG. 164D. FIG. 169B shows, of this structure, only the word line layers, the bit line layers, the diffusion layers, and the contacts between the diffusion layers and the bit line layers. FIG. 169C shows only the contacts between the bit line layers and the metal layers, the contacts between the bit line layers and the lower electrodes, the contacts between the metal layers and the upper electrodes, the contacts between the metal layers and the lower electrodes, and the upper bit line layers. An advantage of the cell shown in FIG. 164A to FIG. 169C is to be able to operate in a high speed in the PL driving scheme. The reason is why a delay of the RC is suppressed because a contact to the electrode of the PL portion can be formed from upper portion by using the metal. In the conventional cell, when the upper electrode is connected to the storage node by using the metal, since the lower electrode of the PL side can not be connected to the metal in the array, the RC is large.

117th Embodiment

FIG. 170A and FIG. 170B are an equivalent circuit diagram and a sectional view, respectively, showing the memory structure according to the 117th embodiment of the present invention.

This embodiment is an improvement of FIG. 55A, in which the surface of the lower electrode is formed into a tapered shape, and an upper electrode having a V-shaped section is formed between adjacent lower electrodes. More specifically, in all cell nodes, the ferroelectric capacitors are formed after formation of the lower electrodes, and adjacent cells are connected through the upper electrodes.

This structure is also equivalent to a structure in which two ferroelectric capacitors are connected in series, as shown in FIG. 170A. Although the cell capacity is halved, the upper electrode need be connected only to the ferroelectric capacitor, resulting in easy manufacturing process. Particularly, this structure can be easily manufactured by MOCVD.

With the above-mentioned structure, in a nonvolatile ferroelectric memory, the following three advantages are simultaneously achieved: (1) a memory cell having a small size of $4F^2$, (2) a planar transistor which is easily manufactured and (3) a general-purpose random access function. Moreover, it is possible to achieve a semiconductor memory device which can maintain data even at stand-by and allow the omission of the refresh operation, while keeping high speeds with the PL potential fixed.

However, in the above-mentioned embodiment, there is a problem in one part of the operation modes. In the conventional FRAM, in both of the 2T/2C cell and 1T/1C cell, only the PL driving scheme whose operation is slow can be applied, and in the (½)Vdd fixed PL scheme, the refresh operation is required. In contrast, in the cell scheme of the above-mentioned embodiment, the high-speed (½)Vdd fixed PL scheme as well as the PL driving scheme can be applied in both of the 2T/2C cell and 1T/1C cell. However, in the case of the PL driving scheme, a problem is encountered in that high noise is generated upon operation in the 1T/1C cell.

An explanation will be given of this problem by reference to FIG. 171A through FIG. 171C. For example, when an attempt is made to read and write MC1 by selecting WL2, WL2 is lowered from High to Low so as to turn on the cell transistor, while BS0 is raised from Low to High so as to turn on the block select transistor Q1, thereafter, PL is raised from Low to High.

The PL potential is applied to one end of the ferroelectric capacitor MC1 and the potential of bit line ($\overline{BL}$) is applied to the other end of the ferroelectric capacitor MC1; therefore, when BL is precharged to Vss, the potential difference Vdd−Vss is applied across the ferroelectric capacitor by shifting PL from Vss to Vdd, thereby making it possible to read polarization data. In this case, BS1 is at Low level, and the block select transistor Q2 remains in OFF state; therefore, cell information MC2 is not read out by the bit line BL. Thus, the fall dead BL scheme is applied by using the BL side as the reference bit line.

However, since one end of the ferroelectric capacitor MC2 is connected to PL, one end of the ferroelectric capacitor MC2 is also raised from Vss to Vdd. At this time, the nodes n2 and n3, which are connected to the other end (n1) MC2 and the on-state unselected cell transistor, are floating since the cell transistor connected to WL2 is off. Consequently, since n1, through n3 always have parasitic capacities (the total thereof is represented by Ctot), the potential difference of not 0V, but Ctot/(CMC2+Ctot)×Vdd is generated across the ferroelectric capacitor when PL changes from Vss to Vdd with respect to these nodes. In other words, due to the parasitic capacities the potentials of n1 through n3 are not changed from Vss to Vdd and are lowered slightly, thereby causing noise, which poses a problem in which one portion of polarization data is destroyed.

As described in the previous embodiments, in the (½)Vdd fixed scheme also, n1, through n3 are floating in the same manner; however, since the PL potential is fixed, no problem is raised if no change occurs in the potential of n1, through n3 due to leakage, etc. only during an active time. Since the active time is normally tR Cmax=10 μs, this short time raises no problem.

As described above, in the case when the plate driving scheme is applied with the construction of 1 transistor+1 capacitor, noise exists due to floating.

118th Embodiment

FIG. 172 is a circuit diagram showing an FRAM according to the 118th embodiment of the present invention, and FIG. 173A and FIG. 173B are signal waveform diagrams that show a specific example of the operation of the present embodiment. In the same manner as the aforementioned respective embodiments, in the present embodiment, one memory cell is constituted by a cell transistor and a ferroelectric capacitor that are connected in parallel with each other, one memory cell block is constituted by series-connecting a plurality of these memory cells connected in parallel, one end is connected to a bit line through a block select transistor, and the other end is connected to a plate. This construction makes it possible to realize a memory cell having a size of $4F^2$ by using a planar transistor.

As shown in FIG. 172, two block select transistors are connected, with one of them being a D-type transistor, and when either of the block select transistors (BS0, BS1) is made High, only data of one of the two cell blocks is read out by the bit line; thus, it is possible to realize the fall dead BL scheme with the other of the bit line pair serving as the reference bit line, and consequently to construct a 1T/1C cell for storing data of 1 bit by using one cell transistor and one ferroelectric capacitor.

The present embodiment is different from the aforementioned respective embodiments in that the plate line, which is one kind in the aforementioned embodiments, is divided into two kinds of plate lines (PLBBL, PLBL) in the present embodiment. The plate line PLBBL is connected to the cell block is connected to the cell block connected to the BBLi (BBL0, BBL1) side of the bit line pair, and the plate line PLBL is connected to the cell block connected to the BLi (BL0, BL1) side of the bit line pair.

As shown in FIG. 173B, by dividing the plate line in this manner, when upon operation, the cell inside the cell block on the BBLi side is selected, only PLBBL is driven to shift from 0V→Vdd→0V, thereby reading and writing cell data, while the plate line PLBL, which serves as the reference bit line and is connected to the cell block connected to the BLi side, remains at 0V. Therefore, the cell node, which is in a floating state, remains at 0V; thus, the present embodiment makes it possible to avoid the problem of polarization data being partially destroyed, which occurs in the aforementioned embodiments.

Even in the case when the cell node is floating, if the plate line is 0V, the cell node is always set at 0V due to leakage of the pn junction between the cell node and the substrate (or well) biased to 0V; therefore, the potential difference across the ferroelectric capacitor remains at 0V and polarization data is reserved. The present embodiment makes it possible to adopt the high-density 1T/1C structure in the PL driving scheme allowing low-voltage operation, and also to avoid the problem of polarization data destruction due to floating.

In the arrangement of the present invention, not only the 1T/1C structure, but also 2T/2C structure is realized. As shown in FIG. 173A, in order to realize this structure, both of the block selection signals BS0 and BS1 are set at High level, both of the cell blocks connected to the bit line pair BBLi and BLi are selected, and both of the plate lines PLBBL and PLBL are operated.

Moreover, the scheme of FIG. 173A and FIG. 173B may be realized inside the same chip. With this arrangement, for example, in the case of selling a product having the 2T/2C structure, tests are performed through operations in the 1T/1C structure so that the evaluation can be made for each of the ferroelectric capacitors. When two plate lines are connected to each cell block, the chip area increases correspondingly; however, as shown in the Figure, when one plate line is shared by two cell blocks that are adjacent in the bit-line direction, one plate-line connection is virtually made for each cell block, thereby making it possible to suppress the increase of the area.

119th Embodiment

FIG. 174 is a circuit diagram showing an FRAM according to the 119th embodiment of the present invention. This embodiment is different from the 118th embodiment shown in FIG. 172 in that the number of cells connected to a cell block is increased from four to eight. In this case also, the same effects as those of the 118th embodiment are obtained. In the same manner, the number of cells can be preferably set to 4, 8, 16, 32 and 64. The greater the number of cells in a cell block, the smaller the influence of the increased chip area due to the plate division.

FIG. 175, which is a modified example of FIG. 174, shows a case in which, without using the transistor of D-type, this transistor is eliminated and the source side and the drain side are directly connected. In this case also, the operation is the same as that shown in FIG. 173A and FIG. 173B, and the same effects as those of FIG. 172 and FIG. 174 are obtained. Moreover, the capacity of the D-type transistor portion of the unselected cell block does not appear as the bit line capacity; this provides the advantage of reduction in the bit line capacity.

FIG. 176 through FIG. 184B, which show embodiments according to the 120th through 124th embodiments of the present invention, are embodiments in which a dummy cell portion is added to the structure of FIG. 172, and these embodiments, of course, make it possible to avoid the problem of polarization data destruction due to floating in the same manner as FIG. 172. The structure as shown in FIG. 174 and FIG. 175 is of course applied thereto, and the number of cells inside a cell block is also preferably designed.

120th Embodiment

FIG. 176 is a circuit diagram showing an FRAM according to the 120th embodiment of the present invention, and shows a ferroelectric memory cell block and a dummy cell structure. The dummy cell is also constituted by parallel-connecting a ferroelectric capacitor and a cell transistor in the same manner as the memory cell, and a dummy cell block is formed by parallel-connecting a plurality of these dummy cells in the same manner as the memory cells. In the present embodiment, one dummy cell block is shared by the bit line pair (BBLi, BLi). For example, in the case when cell data is read out to BBLi, if DBS0 is set at High level, the dummy cell is connected to BLi on the reference bit line side, and in the case when cell data is read out to BLi, if DBS1 is set at High level, the dummy cell is connected to BBLi on the reference bit line side.

FIG. 177A and FIG. 177B show an example of the operation of the FIG. 176. FIG. 177A shows a case of the plate driving scheme in the 1T/1C structure. WL2 and DWL2 are set at Low level, while BS0 and DBS0 are set at High level, and after connecting the memory cell and the dummy cell to the bit line, one of the plate lines (PLBB, PLBL) for memory cell block and the plate line (DPL) for dummy cell block are driven so that cell data and dummy cell data are read out to the bit line. After the read/write of data, BS0 is lowered, and WL2 is raised, and after precharging the bit line to Vss, DWL is maintained at Low and DBS0 is maintained at High so that "0" data is re-written in the dummy cell. Thereafter, DBS0 is lowered and DWL2 is raised, thereby completing the active operation.

When the area of the ferroelectric capacitor of the dummy cell is designed to be greater than the area of the ferroelectric capacitor of the memory cell, "0" data of the dummy cell is placed between "0" data of the memory cell and "1" data of the memory cell; thus, it is possible to form a standard.

FIG. 177B shows a case of the operation of the (½)Vdd fixed plate scheme; in this case, the operation is the same as that of FIG. 177A except that the plate is fixed.

121st Embodiment

FIG. 178 is a circuit diagram showing an FRAM according to the 121st embodiment of the present invention, and shows a ferroelectric memory cell block and a dummy cell structure. The present embodiment is different from that of FIG. 176 in that reset transistors (Q3, Q4) and a reset signal (RST) are added to the dummy cell block. The effect of the present embodiment is that cycle time is shortened as compared with that of FIG. 176. FIG. 179A and FIG. 179B show an example of the operation.

FIG. 179B shows a case of the plate driving scheme in the 1T/1C structure. WL2 and DWL2 are set at Low level, while BS0 and DBS0 are set at High level, and after connecting the memory cell and the dummy cell to the bit line, one of the plate lines (PLBB, PLBL) for memory cell block and the plate line (DPL) for dummy cell block are driven so that cell data and dummy cell data are read out to the bit line.

Thereafter, prior to the sense amplifier operation or after the sense amplifier operation, DBS0 is lowered and the dummy cell block and the bit line are separated, and, while the plate line of one end of the dummy cell blocks that are connected in series with one another is kept at High, the RST line is raised, and the other end is dropped to Vss1, "0" data is re-written in the dummy cell by applying the potential difference Vdd across the ferroelectric capacitor of the selected dummy cell. Here, the reference potential can be set not only by adjusting the area of the ferroelectric capacitor of the dummy cell, but also by freely designing the reset potential (Vss1).

Then, the RST line is lowered, the plate line (DPL) is lowered and DWL2 is raised so that the active operation is complete. The (re-)writing operation of the memory cell and the resetting operation of WL2 and BS0 are carried out in parallel with the dummy cell operation; thus, as shown in FIG. 177A and FIG. 177B, after the resetting of WL2 and BS0, the re-writing operation of the dummy cell is not required, thereby making it possible to shorten the cycle time.

FIG. 179A shows the case of the operation of the (½)Vdd fixed plate scheme, the operation is the same as that shown in FIG. 179B except that the plate is fixed.

122nd Embodiment

FIG. 180 is a circuit diagram showing an FRAM according to the 122nd embodiment of the present invention, and shows a ferroelectric memory cell block and a dummy cell structure. In the present embodiment, a paraelectric capacitor is used as the dummy cell.

In the case of application of a paraelectric capacitor as shown in the present embodiment, although there is a disadvantage of a large area of the dummy cell capacitor, the advantages are that there is less (or no) degradation in films, such as fatigue, relaxation (depolarization) and imprint, and that the reference potential becomes stable. The dummy cell of FIG. 180 is constituted by a paraelectric capacitor, transistors (Q5, Q6) for short-circuiting the capacitor, a signal line (RST) for controlling these, select transistors (Q7, Q8) that are connected to one of the bit line pair, their control lines (DWL0, DWL1), and a plate line (DPL).

123rd Embodiment

FIG. 181 is a circuit diagram showing an FRAM according to the 123rd embodiment of the present invention, and shows a ferroelectric memory cell block and a dummy cell structure. In the present embodiment, the dummy cell using a paraelectric capacitor is adopted in the same manner as FIG. 180.

The dummy cell of the present embodiment is different from that of FIG. 180 in that instead of short-circuiting the paraelectric capacitor by using the RST signal, one end of the paraelectric capacitor is connected to the plate, and the other end is connected to a predetermined potential Vss1 by raising the RST signal to High level so that the paraelectric capacitor is reset to the potential difference DPL−Vss1. First, in FIG. 180 and FIG. 181, the same operation is available as shown in FIG. 182A and FIG. 182B.

FIG. 182A shows a case in which the plate driving scheme is carried out in the 1T/1C structure. WL2 is set at Low level, while BS0 is set at High level, and the memory cell is connected to the bit line, while DWL0 is set at High level; thus, the dummy cell is connected to the reference bit line. Thereafter, one of the cell-block plate lines (PLBBL, PLBL) is driven so that cell data is read out to the bit line, while the dummy cell allows the reference bit line to be set at a predetermined potential by driving the dummy cell plate line (DOPL) so as to make a capacitor coupling. Thereafter, DWL0 is lowered, the DPL line is set at Vss and the RST line is set at High level so that the potential difference of the paraelectric capacitor of the dummy cell is reset to 0V, thereby completing the active operation.

FIG. 182B shows a case of the operation of the (½)Vdd fixed plate scheme, and the operation is the same as that of FIG. 182A except that the plate is fixed. Here, the plate of the dummy cell is driven since capacitor coupling is made. Additionally, the dummy cell plate line may be fixed to (½)Vdd (or a predetermined potential); for example, in FIG. 180, at stand-by, in the case when RST is lowered while DP1 is set at (½)Vdd, since both of the ends of the paraelectric capacitor are set at (½)Vdd, the reference bit line potential automatically rises due to capacitor coupling when DWL0 is raised, thereby making it possible to carry out the operation.

Additionally, in the example as shown in FIG. 181, in order to keep both of the ends of the paraelectric capacitor at (½)Vdd at stand-by, not only DPL, but also Vss1 needs to be set at (½)Vdd.

124th Embodiment

FIG. 183 is a circuit diagram showing an FRAM according to the 124th embodiment of the present invention, and shows a ferroelectric memory cell block and a dummy cell structure. In the present embodiment, in the same manner as FIG. 180 and FIG. 181, the dummy cell using a paraelectric capacitor is adopted; however, the dummy cell is constituted by a plate line (DPL), a paraelectric capacitor and a select transistor, and the reset transistor is omitted. The advantage of the arrangement of FIG. 183 is that neither the reset transistor nor the reset signal is required, ant that it is only necessary to provide the fewest number of elements. FIG. 184A and FIG. 184B show an example of this operation.

FIG. 184A shows a case in which the plate driving scheme is carried out in the 1T/1C structure. WL2 is set at Low level, while BS0 is set at High level, and the memory cell is connected to the bit line. Simultaneously, of the dummy-cell selection lines DWL0 and DWL1 both of which have been set at High level at stand-by, only the selection line on the side of the bit to which cell data is to be read is lowered from High level to Low level so that the paraelectric capacitor is only connected to the reference bit line.

Thereafter, one of the cell-block plate lines (PLBBL, PLBL) is driven so that cell data is read out to the bit line, while the dummy cell allows the reference bit line to be set at a predetermined potential by driving the dummy cell plate line (DPL) so as to make a capacitor coupling. After the sense operation, DPL is lowered, and then both of the dummy-cell selection lines DWL0 and DWL1 are returned to High. When ,after writing cell data, the bit line is precharged to Vss, since DWL1 and DWL0 are High, both of the ends of the paraelectric capacitor becomes 0V, and are reset.

FIG. 184B shows a case of the operation of the (½)Vdd fixed plate scheme, and the operation is the same as that of FIG. 184 except that the plate is fixed. However, the plate line of the dummy cell has to be driven.

125th Embodiment

FIG. 185A and FIG. 185B are signal waveform diagrams that show an operation scheme of an FRM according to the 125th embodiment of the present invention.

In the same manner as mentioned above embodiments, the present embodiment is applied to a memory cell structure in which: one memory cell is constituted by a cell transistor and a ferroelectric capacitor that are parallel-connected, and one memory cell block is formed by series-connected a plurality of these memory cells that are parallel-connected, with one end being connected to the bit line through the block select transistor and the other end being connected to the plate. As compared with the scheme as mentioned above, the present embodiment allows for a high-speed operation while controlling dispersion in the paraelectric component of the ferroelectric capacitor.

Figure 4A:
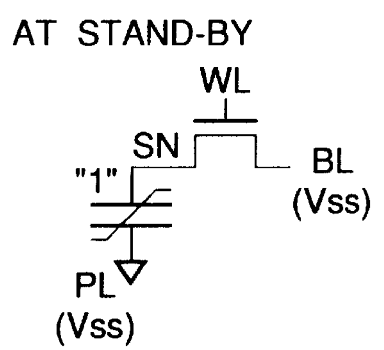
FIG. 4A to FIG. 4E are charts showing signal waveforms so as to explain the operation of the conventional FRAM.
Figure 4B:
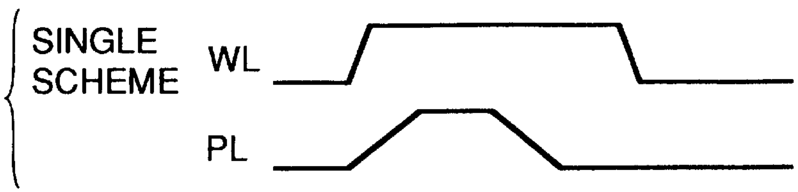
Figure 4C:
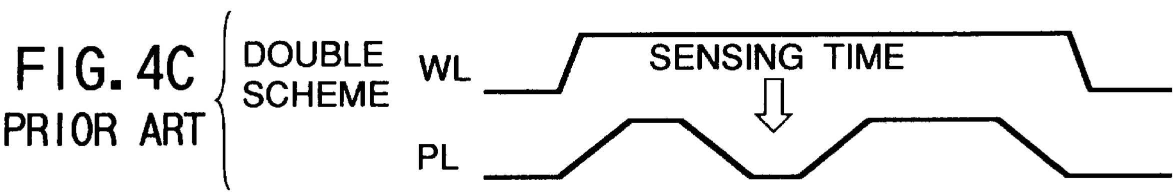
Figure 4D:
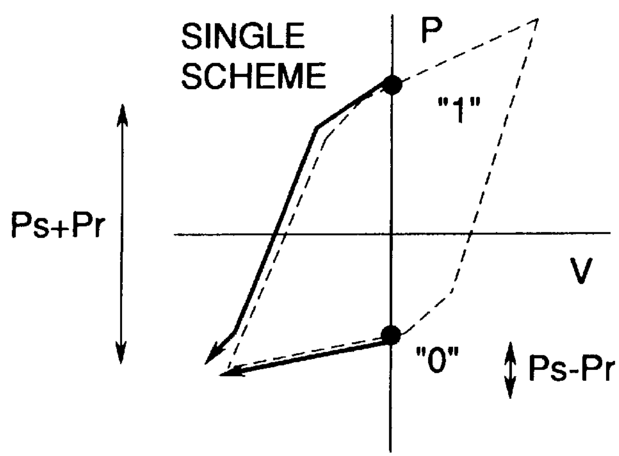

As shown in FIG. 4A through FIG. 4E, in the single plate scheme (FIG. 4B), upon operation, the plate electrode is operated in a manner Vss→Vdd→Vss only once; and as shown in FIG. 4D, assuming that the amount of saturation polarization is Ps and the amount of remnant polarization is Pr, "1" data is represented by Ps+Pr and "0" data is represented by Ps−Pr; thus, the difference represents the amount of signal (half in the case of 1T/1C). However, the ferroelectric capacitor has great dispersion in its paraelectric component due to dispersion in manufacturing processes, etc.; and this degrades the read-out margin to a great degree.

Figure 4E:
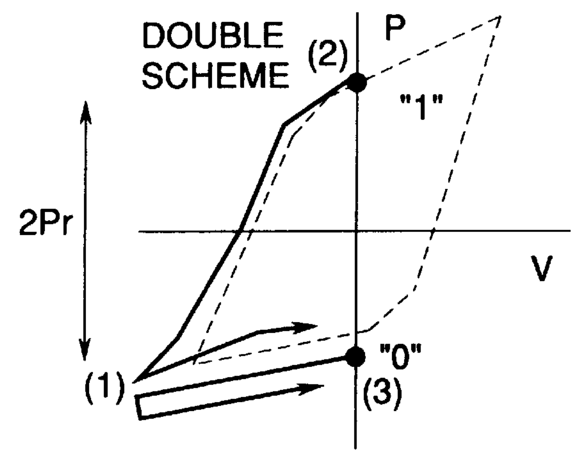

Moreover, in the conventional double plate scheme (FIG. 4C) for solving this problem, upon operation, the plate voltage is operated twice in a manner Vss→Vdd→Vss→Vdd→Vss; and as shown in FIG. 4E, the paraelectric component can be cancelled by the go and return processes, thereby making it possible to cancel the problem of dispersion. In contrast, PL has to be raised and lowered twice, with the result that read/write access and cycle take a very long time.

In contrast, in FIG. 185A and FIG. 185B, plate driving of only once makes it possible to cancel the paraelectric component in the same manner as the plate driving operated twice. Two kinds of operations are available, and FIG. 185A shows a case in which the plate (PL) is precharged to 0V and the bit line (BLs) to Vdd in a reverse manner. Thus, only by lowering WL2 as well as lowering BS0, the potential Vdd is applied across the selected ferroelectric capacitor without driving the plate.

In the memory cell of the conventional scheme, the cell transistor and the ferroelectric capacitor are series-connected, and at stand-by, since the cell node is floating, the cell polarization data will be destroyed due to junction leakage unless the plate is set at 0V, and the cell polarization data will also be destroyed due to transistor leakage unless the bit line potential is set at 0V. However, in the memory cell structure of the present invention, at stand-by, the cell transistor is turned on, while the ferroelectric capacitor is always short-circuited; this is advantageous in that no limitation is imposed on the plate potential and the bit line potential. The reverse precharges of the plate potential and the bit line potential at stand-by of the present embodiment utilize this advantage.

With the above-mentioned readout scheme, "1" data is shifted from point (2) to point (1), while "0" data is shifted from point (3) to transition point (1) in FIG. 4E, thereby allowing the bit line to read polarization data (in FIG. 4E, the polarity on x-axis is reversed to that of the conventional scheme as explained). Thereafter, when PL is first raised to Vdd, "1" data is shifted from point (1) to point (3), while "0" data is also shifted from point (1) to transition point (3) in FIG. 4E. Thus, "1" data has its paraelectric component cut during going and returning processes, thereby allowing only the remnant polarization component: 2Pr to be read out to the bit line as a signal. Since "0" data goes from point (3) to point (1) and merely returns to point (3); therefore, no signal is read out. Consequently, only the polarization component 2Pr, which is free from the paraelectric component having dispersions, forms a signal, thereby eliminating noise.

Thereafter, the potential difference of the bit line pair is amplified by the sense amplifier circuit. If the plate is kept at Vdd, "0" data, which has been lowered to 0V is re-written, and then, when the plate is lowered to Vss, "1" data, which has been raised to Vdd, is re-written, thereby completing the re-writing operation. Thereafter, BS0 is lowered, WL2 is raised and the bit line is precharged to Vdd, thereby completing the active operation. In other words, in the present embodiment, the plate requires only one raising and lowering operation; thus, a high-speed operation and a cancellation of dispersion are simultaneously realized.

FIG. 185B shows a case in which in FIG. 185A, the potentials of the plate and the bit line are operated completely in a reversed manner. In this scheme also, the plate driving of only one time can cancel the paraelectric component in the same manner as the plate driving of two times. Upon precharge, the plate (PL) is precharged to Vdd and the bit line (BLs) to Vss in the reversed manner. Thus, only by lowering WL2 as well as lowering BS0, the potential vdd is applied across the selected ferroelectric capacitor without driving the plate.

With such a readout scheme, "1" data is shifted from point (2) to point (1), while "0" data is shifted from point (3) to transition point (1) in FIG. 4E, thereby allowing the bit line to read polarization data. Thereafter, when PL is first raised to Vss, "1" data is shifted from point (1) to point (3), while "0" data is shifted from point (1) to transition point (3) in FIG. 4E.

Thus, "1" data has its paraelectric component cut during going and returning processes, thereby allowing only the remnant polarization component: 2Pr to be read out to the bit line as a signal. Since "0" data goes from point (3) to point (1) and merely returns to point (3); therefore, no signal is read out. Consequently, only the polarization component 2Pr, which is free from the paraelectric component having dispersions, forms a signal, thereby eliminating noise.

Thereafter, the potential difference of the bit line pair is amplified by the sense amplifier circuit. If the plate is kept at Vss, "1" data, which has been raised to Vdd is re-written, and then, when the plate is lowered to Vdd, "0" data, which has been lowered to Vss, is re-written, thereby completing the re-writing operation. Thereafter, BS0 is lowered, WL2 is raised and the bit line is precharged to Vss, thereby completing the active operation. In other words, in the present invention, the plate requires only one raising and lowering operation; thus, a high-speed operation and a cancellation of dispersion are simultaneously realized.

The schema as shown in FIG. 185A and FIG. 185B are also applied to the 2T/2C scheme (FIG. 32) as mentioned above, and are also applied to the scheme (FIG. 172) of the present invention in which the plate electrode is separated. In this case, both of the schema, 1T/1C and 2T/2C, are realized.

126th Embodiment

FIG. 186A and FIG. 186B are signal waveform diagrams that show the operation of an FRAM according to the 126th embodiment of the present invention. These Figures show the operation sequence upon power on and power off at the time of application of the reversed precharge scheme of the plate and bit line as shown in FIG. 185A and FIG. 185B as well as FIG. 32 and FIG. 172. FIG. 186A represents the case of FIG. 185A, and FIG. 186B represents the case of FIG. 185B.

In FIG. 186A, after, upon power on, power has been completely effected and the inner node has become stable while keeping the plate potential at Vss, the bit line potential (bit line precharge power: VBL) is set at Vdd; thus, the cell data is not destroyed. Upon power off, the bit line potential (bit line precharge power: VBL) is lowered to Vss before Vdd has been lowered to Vccmin; thus, the cell data is not destroyed.

In FIG. 186B, after, upon power on, power has been completely effected and the inner node has become stable while keeping the bit line potential (bit line precharge power: VBL) at Vss, the plate potential is set at Vdd; thus, the cell data is not destroyed. Upon power off, the plate potential is lowered to Vss before Vdd has been lowered to Vccmin; thus, the cell data is not destroyed.

127th Embodiment

FIG. 187 is a drawing that shows the structure of a sense amplifier portion of an FRAM according to the 127th embodiment of the present invention. FIG. 187 shows a sense amplifier circuit which can be applied to the scheme in which, upon precharge, the plate is set at Vss and the bit line is set at Vdd as shown in FIG. 185A.

A transistor for precharging the bit line is installed independent of the sense amplifier, and by setting the EQL signal at Low level, the bit line pair is precharged to Vdd.

128th Embodiment

FIG. 188 is a drawing that shows the structure of a sense amplifier of an FRAM according to the 128th embodiment of the present invention. FIG. 188 shows a sense amplifier circuit which can be applied to the scheme in which, upon precharge, the plate is set at Vdd and the bit line is set at Vss as shown in FIG. 185B. In this example, by setting the EQL signal at High level, the bit line pair can be precharged to Vss.

129th Embodiment

As mentioned above, in the case when the precharge scheme of the plate potential and the bit line potential is applied to the scheme for storing information having multi-bits not less than 2 bits in one memory cell wherein the memory cell structure is made so that one memory cell is constituted by parallel-connecting a cell transistor and a plurality of ferroelectric capacitors having different coercive voltages, and one memory cell block is constituted by series-connecting these memory cells with one end being connected to the bit line through a block select transistor and the other end being connected to the plate, enhanced reliability in readout and a high-speed operation are simultaneously achieved with high degree. This is because in the multi-bit cell scheme as mentioned above, the dispersion in the paraelectric component of the ferroelectric capacitor is observed greatly as compared with the one-bit scheme as mentioned above, and to suppress this is an important factor.

In the 68th embodiment, with respect to the ferroelectric capacitors Ca and Cb, supposing that the coercive voltage of Ca is Vca and the coercive voltage of Cb is Vcb, the relationship Vca<Vcb is satisfied. FIG. 189 shows one example of a sectional view of the two-cell structure of FIG. 102. In terms of Ca and Cb, this is achieved by making the film thickness of the ferroelectric capacitor Ca thinner than that of Cb. FIG. 190A through FIG. 190C show theoretical hysteresis curves that show the operation of the multi-bit/cell scheme of FIG. 102, and FIG. 191A through FIG. 191C show actual hysteresis curves.

The operation will be briefly explained by reference to FIG. 190A through FIG. 190C. FIG. 190A shows the hysteresis curve of the ferroelectric capacitor Ca, and FIG. 190B shows the hysteresis curve of the ferroelectric capacitor Cb. FIG. 190C shows a hysteresis curve obtained when Ca and Cb are parallel-connected. Information of one bit is stored in each of Ca and Cb.

In FIG. 190C, point E" shows a point in which Ca and Cb store 1 data and 1 data (=11) respectively; and in the same manner, point F" represents 10, C" represents 01, and A" represents 00, thereby forming four states so that 2-bit data is stored.

With respect to read/write operations, a voltage not more than the coercive voltage of Cb is applied to the parallel ferroelectric capacitors so that data of Ca is read out, and then a voltage not less than the coercive voltage of Cb is applied to the parallel ferroelectric capacitors so that data of Cb is read out, and re-written. Thereafter, a voltage not more than Cb is applied to the parallel ferroelectric capacitor so that a re-writing operation is carried out on Ca.

However, in the multi-bit/cell scheme as mentioned above, in an attempt to achieve Vca<Vcb, as shown by the actual hysteresis curves of Ca and Cb in FIG. 191A and 191B, when Ca and Cb are formed by alternating the film thicknesses of ferroelectric capacitor materials having the same electric field resistance, their dielectric constants differ correspondingly with the different thicknesses, thereby increasing the paraelectric capacitor component. As a result, in the hysteresis curve (FIG. 191C) with the parallel-connected Ca and Cb, two kinds of the paraelectric capacitor components are mixed, with the result that the readout margin deteriorates. In particular, upon reading Cb, the large paraelectric capacitor component of Ca is mixed, causing dispersion in the paraelectric capacitor component, which poses a large problem.

In the multi-bit/cell structure as described above, in the case when the plate driving scheme is adopted with the fall dead BL structure, if the dummy cell is utilized, it is possible to eliminate noise due to the cell node being in a floating state by dividing the plate line into two kinds as shown in the aforementioned FIG. 172. FIG. 192 is a sectional view that shows a ferroelectric memory cell block of an FRAM according to the 129th embodiment of the present invention, and shows a case in which the plate is divided into two kinds (PLBBL, PLBL) with 2 bits/cell.

This embodiment shows a case in which ferroelectric capacitors having different film thicknesses and different coercive voltages are forming in the longitudinal direction. As mentioned above, the plate can be easily divided also in the case when ferroelectric capacitors having different film thicknesses and different coercive voltages are laminated in the lateral direction.

130th Embodiment

FIG. 193 shows an example of specific operation timing of the multi-bit/cell operation to which the plate driving scheme as explained as mentioned above is applied. When WL02 comes to Low level for the first time, the plate (PL) and the bit line ($\overline{BL}$, BL) are operated with a small amplitude so that data of Ca is read out and temporarily stored in the outside of the array. Thereafter, in order to eliminate the difference between the two cases, that is, "1" data and "0" data of Ca, a constant voltage is applied to the ferroelectric capacitor so that "0" data is written in Ca.

When WL02 comes to Low level for the second time, the plate (PL) and the bit line ($\overline{BL}$, BL) are driven with a large amplitude so that data of Cb is read and written, and lastly, when WL02 comes to Low level for the third time, the Ca data temporarily stored is re-written in Ca. In this case, noise of the paraelectric capacitor component, explained in FIG. 191A through FIG. 191C, of course remains with a large size. Here, even in the case where, during the first through third times shown in (1) of the Figure, WL02 is maintained at Low and BS0 is maintained at High without resetting WL02 and BS0 for each time, the operation is available.

FIG. 194 is a drawing that shows operation timing of the driving scheme according to the 130th embodiment of the present invention. In the present embodiment, WL02 is maintained at Low and BS0 is maintained at High for the first through three times, and further, after Ca data has been read out for the first time, EQL is set at High while the bit line pair ($\overline{BL}$, BL) are lowered to Vss so that the plate (PL) is maintained at High with a small amplitude even after resetting the Ca data, and after the equalization of the bit lines has been released by setting EQL at Low, PL is raised to High potential with a large amplitude, thereby reading out Cb data. Thus, excessive plate operations can be eliminated as compared with FIG. 193, thereby making it possible to achieve a high-speed operation.

131st Embodiment

Figure 195A:
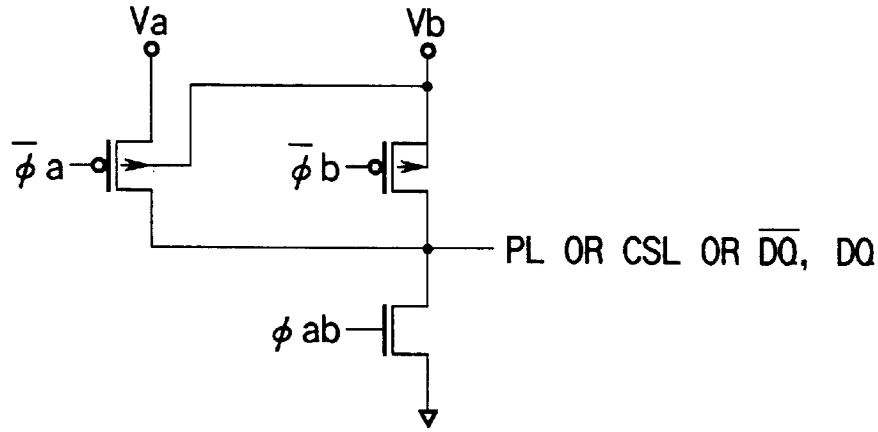
Figure 195B:
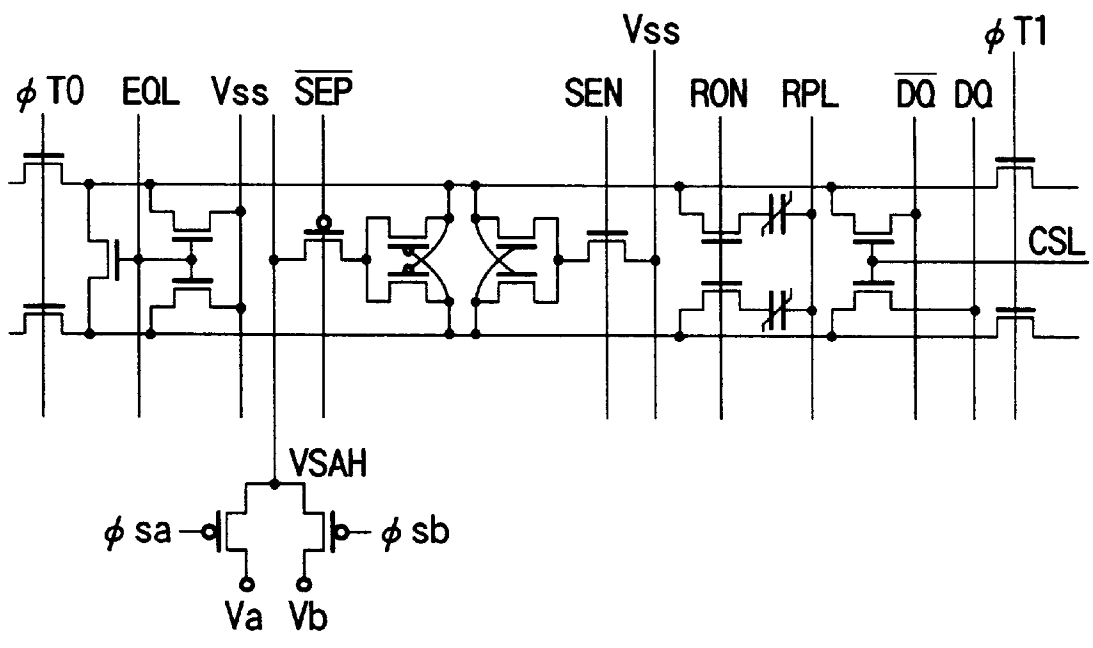

FIG. 195A and FIG. 195B, which explain the 131st embodiment of the present invention, show the structure of a core portion circuit for realizing the operation of FIG. 194 and operations of other examples of multi-bit/cell operations.

As shown in FIG. 195A, by using two power sources Va and Vb and switching ϕa and ϕb, the plate operation with small and large amplitudes, as shown in FIG. 194, is realized. In the same manner, as shown in FIG. 195B, by switching ϕsa and ϕsb of the power source line (VSAH) of the pMOS sense amplifier circuit, connection is made to the two power sources Va and Vb so that the bit line operation with small and large amplitudes as shown in FIG. 194 is realized. By using the transistor connected to a signal RON and the ferroelectric capacitor, a temporary register for storing Ca data for the first time is easily realized.

As shown in FIG. 194, after the bit line has been amplified at the time of the readout operation of Ca data for the first time, RON is set at High so that Ca data is written in the capacitor within the register, and RON is set at Low and held. For example, if the RPL line is set at Va, the ferroelectric capacitor connected to the bit line of the "0" data side is polarity-inverted, while that on the "1" data side is non-polarity-inverted; thus, it is possible to maintain the data. For the writing operation of Ca data for the third time, after completion of reading and writing of Cb data for the second time, EQL is set at High so that the bit line pair is lowered to Vss, and then after EQL is set at Low so that the bit line pair is precharged to Vss, RON is set at High so that register data is read out to the bit line. At this time, for example, if the RPL line is set at Va potential, one of the two ferroelectric capacitors carries out a polarization-inverted reading operation, and the other carries out a non-polarization-inverted reading operation.

Thereafter, Ca data is re-written in the memory cell by amplifying the bit line. For the PL operation in re-writing data, as shown in FIG. 194(2), after the amplification of the bit line, PL may be raised and lowered, or as shown in FIG. 194(1), with EQL being set at High after reading and writing for the second time, PL is preliminarily raised, and then PL may be lowered after the amplification of the bit line. Moreover, upon reading Ca for the first time, the bit line may be amplified with ϕti in FIG. 195B being raised, or as shown in FIG. 194(4), ϕti may be lowered once, and then the bit line may be amplified only within the sense amplifier. This eliminates the need for amplifying the bit line within the sell array, thereby making it possible to provide a high-speed operation.

FIG. 194 shows an example of the operation of a column selection line (CSL). The bit line in the sense amplifier portion has small and large amplitudes by the present multi-bit/cell scheme; and as shown in FIG. 194, in the case of large amplitudes of /DQ and DQ lines, in the case of High of CSL, and in the case of a writing operation of external data for the first time, a potential greater than the small amplitude is written in the bit line of the sense amplifier. This is avoidable by providing two kinds of CLS potentials with small and large amplitudes, as shown in FIG. 194(5) by using the circuit of FIG. 195A. Moreover, this is also avoidable by providing two kinds of amplitudes at the time of writing for /BDQ and DQ lines in a circuit as shown in FIG. 195A with CSL having the large amplitude remaining as it is as shown in FIG. 194(6).

Figure 195C:
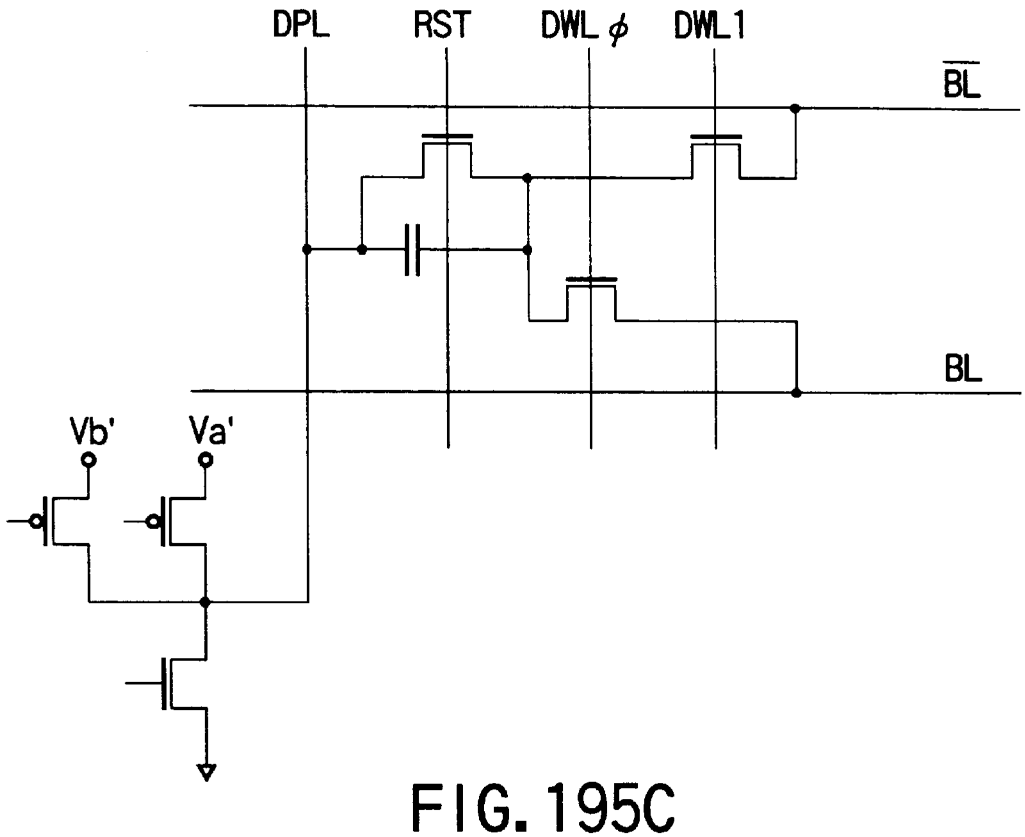
Figure 195D:
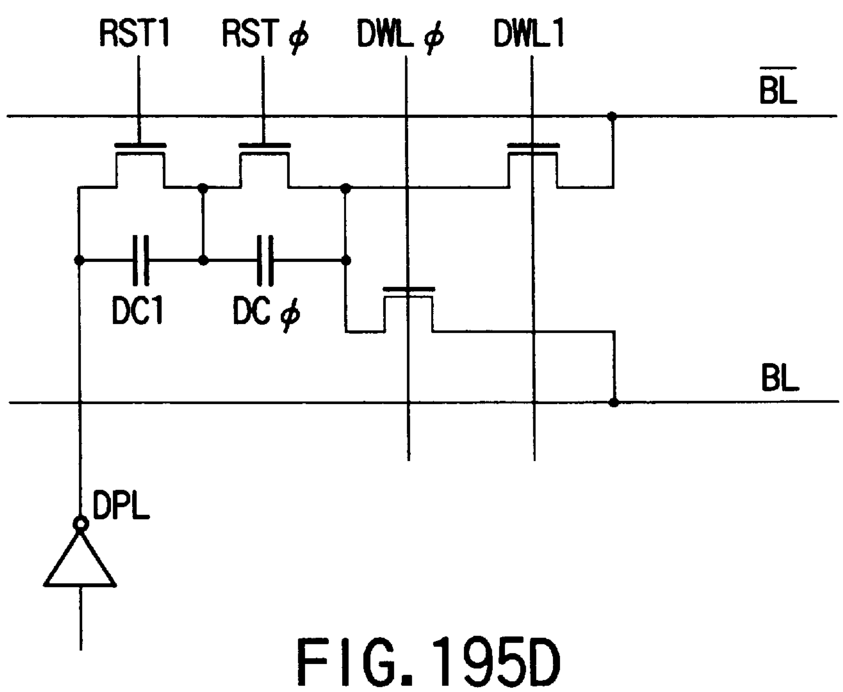

With respect to the dummy cell, a ferroelectric capacitor may be used, or a paraelectric capacitor as shown in FIG. 195C and FIG. 195D may be used. In the example of FIG. 195C, by changing the amplitude potential of the dummy plate line (DPL) to Va' and Vb' for each of the first and second reading operations, the dummy cell potential can be tuned in accordance with the respective cells of Ca and Cb. In the example of FIG. 195D, the dummy cell potential may be changed without varying the DPL potential for each of the first and second operations.

For example, paraelectric capacitors DC0 and DC1 having different capacities are provided, and at the time of the first reading operation, while RST1 is set at High and RST0 is set at Low, DPL is raised to High so that the paraelectric capacitor CD0 is read out to the bit line. At the time of the third reading operation, while RST0 is set at High and RST1 is set at Low, DPL is raised to High so that the paraelectric capacitor DC1 is read out to the bit line; thus, it is possible to change the bit line potential on the REFERENCE side. AS a modified example, parallel capacities may be used with RST1 and RST0 are set at High.

FIG. 196 is a drawing that shows another operation timing for explaining the operation of a FRAM according to the 131st embodiment of the present invention. This arrangement is different from that of FIG. 193 in that the plate electrode is raised and lowered twice in the first and second operations. After the plate has been raised and lowered once, readout data is amplified by a sense amplifier; thus, it becomes possible to cancel the paraelectric capacitor component, and particularly to cancel noise due to two kinds of paraelectric capacitor components in the multi-bit/cell scheme, and it becomes possible to greatly improve the reliability of the reading operation. Here, in the same manner as FIG. 193, even in the case where, during the first through third times shown in (1) of the FIG. 196, WL02 is maintained at Low and BS0 is maintained at High without resetting WL02 and BS0 for each time, the operation is available. When WL0 is lowered for the third time, it is merely necessary to raise and lower the plate only once for carrying out a re-writing operation on Ca.

As described above, the combination as mentioned above and the double plate scheme makes it possible to realize a memory cell having a size smaller than $2F^2$ per one bit that is achieved as mentioned above, and also to solve its problems, that is, noise due to two kinds of paraelectric capacitor components, and noise dispersion components of the paraelectric capacitor components. Thus, it becomes possible to provide high reliability.

132nd Embodiment

FIG. 197 and FIG. 198 are drawings that show operation timing for explaining the operation of an FRAM according to the 132nd embodiment of the present invention, and shows an operation which achieves the following advantages: In the multi-bit/cell scheme as mentioned above, a high-speed operation is realized with a reduced number of plate driving operations, and noise due to two kinds of paraelectric capacitor components and noise due to dispersion components of the paraelectric capacitor components are cancelled; thus, it is possible to provide high reliability. In principle, this is achieved by reversely precharging the plate and the bit line of FIG. 185A and FIG. 185B.

In the example of FIG. 197, at stand-by, the bit line is precharged to High level with a small amplitude so that the plate is precharged to Vss. After selection of WL02 and BS0, the plate is not driven, and a voltage is applied to the ferroelectric capacitor Ca so that data of Ca is read out. Thereafter, when the plate is raised to High level with a small amplitude, the paraelectric capacitor component can be cancelled.

Then, while PL is set at Low and BL is set at High, a constant voltage is applied to Ca so that the difference of "0"

and "1" data is eliminated, and BS0 is set at Low level so that the cell block and the bit line is separated. During this time, the bit line is precharged to High level with a large amplitude so that, even for the second time, the polarization data of the ferroelectric capacitor Cb is read to the bit line merely by shifting BS0 to High level. Then, PL is set at High level so that the paraelectric capacitor component is eliminated, and then a sense operation is carried out and PL is set at Low level so as to re-write data. For the third time, in order to carry out a re-writing operation on Ca, it is merely necessary to raise and lower PL only once. Here, as indicated by line (1) of the Figure, it is possible to omit the re-raising process for WL02 in the first through third operations.

In the same manner as FIG. 198 and FIG. 197, this is achieved by a scheme for reversely precharging the plate and the bit line in FIG. 185A and FIG. 185B. The example of FIG. 198 is the same as that of FIG. 197 except that the potentials of the plate and the bit line are reversed. At stand-by, the bit line is precharged to Low level and the plate is precharged to High level with a small amplitude. After selection of WL02 and BS0, the plate is not driven and a voltage is applied to the ferroelectric capacitor Ca so that data of Ca is read out. Thereafter, when the plate is set at Vss, the paraelectric capacitor component can be cancelled.

Then, while PL is set at High and BL is set at Low, a constant voltage is applied to Ca so that the difference of "0" and "1" data is eliminated, and BS0 is set at Low level so that the cell block and the bit line is separated. During this time, the bit line is precharged to High level with a large amplitude so that, even for the second time, the polarization data of the ferroelectric capacitor Cb is read to the bit line merely by shifting BS0 to High level. Then, PL is set at Low level so that the paraelectric capacitor component is eliminated, and then a sense operation is carried out and PL is set at High level so as to rewrite data. For the third time, in order to carry out a re-writing operation on Ca, it is merely necessary to raise and lower PL only once. Here, as indicated by line (1) of the Figure, it is possible to omit the re-raising process for WL02 in the first through third operations.

133rd Embodiment

FIG. 199 and FIG. 200 are drawings that show operation timing for explaining the operation of an FRAM according to the 133rd embodiment of the present invention, in which the effects of FIG. 197 and FIG. 198 are also realized and further, the number of PL driving operations is reduced so as to realize high speeds.

In the example of FIG. 199, at stand-by, the bit line is precharged to High level with a small amplitude so that the plate is precharged to Vss. After selection of WL02 and BS0, the plate is not driven, and a voltage is applied to the ferroelectric capacitor Ca so that data of Ca is read out. Thereafter, when the plate is raised to High level with a small amplitude, the paraelectric capacitor component can be cancelled.

Then, while PL is kept at High and the BL pair is set at Low, a constant voltage is applied to Ca so that the difference of "0" and "1" data is eliminated, and BS0 is set at Low level so that the cell block and the bit line is separated. During this time, the plate line is raised to High level with a large amplitude so that, even for the second time, the polarization data of the ferroelectric capacitor Cb is read to the bit line merely by shifting BS0 to High level. Then, PL is set at Low level so that the paraelectric capacitor component is eliminated, and then a sense operation is carried out and PL is set at High level so as to re-write data. Successively, while BS0 is set at Low, the bit line is precharged to Vss, and the plate is set at High level with a small amplitude. The third operation is carried out by setting BS0 at High level. Here, it is possible to carry out a re-writing operation on Ca merely by shifting PL from High with a small amplitude to Vss. Here, as indicated by line (1) of the Figure, it is possible to omit the re-raising process for WL02 in the first through third operations.

In the example of FIG. 200, at stand-by, the plate line is set at High level with a small amplitude so that the bit line is precharged to Vss. After selection of WL02 and BS0, the plate is not driven, and a voltage is applied to the ferroelectric capacitor Ca so that data of Ca is read out. Thereafter, when the plate is set at Vss level, the paraelectric capacitor component can be cancelled.

Then, while PL is maintained at Low and the BL pair is set at High level with a small amplitude, a constant voltage is applied to Ca so that the difference of "0" and "1" data is eliminated, and BS0 is set at Low level so that the cell block and the bit line is separated. During this time, the bit line pair are set at High level with a large amplitude so that, even for the second time, the polarization data of the ferroelectric capacitor Cb is read to the bit line merely by shifting BS0 to High level. Then, PL is set at High level so that the paraelectric capacitor component is eliminated, and then a sense operation is carried out and PL is set at Vss level so as to re-write data. Successively, while BS0 is set at Low, the bit line is precharged to High level with a small amplitude, and the plate is set at High level with a small amplitude. The third operation is carried out by setting BS0 at High level. Here, it is possible to carry out a re-writing operation on Ca merely by shifting PL from Vss to High level with a small amplitude. Here, as indicated by line (1) of the Figure, it is possible to omit the re-raising process for WL02 in the first through third operations.

134th Embodiment

FIG. 201 is a drawing that shows operation timing for explaining the operation of an FRAM according to the 134th embodiment of the present invention. This embodiment shows a case in which the reversed precharging scheme of the bit line and the plate line and the double plate scheme are combined.

In FIG. 201, with respect to the reading operation of Ca, the scheme in which the bit line is precharged to High level with a small amplitude and the plate line is reversely precharged to Vss is adopted, and with respect to the reading/writing operations of Cb, the double plate scheme in which the operations are carried out after bit line and the plate line has been precharged to Vss is adopted. With respect to the re-writing operation of Ca, it is carried out by raising and lowering the plate. The feature of the present embodiment is that, during the first time through the third time, raising and lowering processes of BS0 and WL02 can be omitted.

135th Embodiment

FIG. 202 is a drawing that shows operation timing for explaining the operation of an FRAM according to the 135th embodiment of the present invention. This embodiment shows a case in which the reversed precharging scheme of the bit line and the plate line and the double plate scheme are combined.

In FIG. 202, with respect to the reading operation of Ca, the scheme in which the bit line is precharged to High level with a small amplitude and the plate line is reversely precharged to Vss is adopted, and with respect to the reading/writing operations of Cb, the double plate scheme in which the operations are carried out after bit line and the plate line has been precharged to Vss is adopted. With respect to the re-writing operation of Ca, it is carried out by only raising the plate. The feature of the present embodiment is that, during the first time through the third time, raising and lowering processes of BS0 and WL02 can be omitted.

136th Embodiment

In FIG. 80B, in an arrangement in which one memory cell is constituted by parallel-connecting a cell transistor and a ferroelectric capacitor and one memory cell block is constituted by series-connecting a plurality of these memory cells, when data reversed to readout data is written, it is supposed that, in principle, in a non-selection memory cell within a selected cell block, the non-selection ferroelectric capacitor is short-circuited by the unselected cell transistor that is turned on and is kept in a stable state. However, actually, since ON resistance exists in the unselected cell transistor that is turned on, a voltage is applied across the non-selection ferroelectric capacitor slightly for a short period of time.

Although the above mentioned embodiments describe that noise is reduced by increasing the number of memory cells within the cell block, only using this method is insufficient. FIG. 80B shows the relationship between this type of noise and the rise-to-fall transition time of the bit line upon writing reverse data as mentioned above. In this manner, in order to stably hold non-selection memory cell data, it is always necessary to make the writing time longer to a certain extent.

FIG. 203, which explains the 136th embodiment of the present invention that has solved the above-mentioned problem, shows a writing-time alleviation scheme. This embodiment contains two schema.

The first scheme is a scheme in which transistors (Q9, Q10) are inserted between bit lines (BBL, BL) inside the memory array and bit lines (BBLSA, BLSA) of the sense amplifier portion. When reverse data is written from a write buffer (Write Bufer) of a main amplifier (Main Amp), the flipflop of the sense amplifier (Sense Amp) portion is inverted so that inverted data is written in BBL and BL through BDQ and DQ lines. In this case, the transition time in writing in BBL and BL is alleviated by RC time constant between the ON resistances of the transistors (Q9, Q10) and the capacity of the bit lines (BBL, BL) on the cell array side having a large size. Consequently, noise can be reduced.

The second scheme is a scheme in which, when reverse data is written from the write buffer (Write Bufer) of the main amplifier (Main Amp), the write buffer is allowed to have two or more kinds of drivers having different driving capability and the two or more kinds of drivers are offset in their driving time. In the example of the present embodiment, BDQ and DQ lines are first driven by weak power with the driver having a small driving capability, and the High level of the bit lines (BBLSA, BLSA, BBL, BL) is lowered and the Low level thereof is raised to a certain extent. Next, the greater driver is operated with a time gap so that the bit lines are inverted; thus, the bit lines are gradually inverted so as to write data, making it possible to reduce the above-mentioned writing noise.

Besides these schema, the application of three kinds or more buffers or the application of buffers of the same size with offset time is also advantageous. Moreover, one kind of buffer is used, and the gate voltage of the driving transistor for the buffer may be raised gradually or in a stepped manner. Furthermore, prior to writing reverse data, BDQ, DQ or bit lines may be once short-circuited, and then reverse data is written, or the above-mentioned respective schema may be combined.

137th Embodiment

FIG. 204A through FIG. 204C are drawings for explaining the 137th embodiment of the present invention. These show more specific structural examples of the write buffer of FIG. 203. FIG. 204A shows two kinds of clocked inverters having different transistor sizes, FIG. 204B shows an example of a delay circuit for a signal line, which drives the inverters with delay time. Further, FIG. 204C shows a timing chart thereof.

138th Embodiment

FIG. 205, which explains an FRAM according to the 138th embodiment of the present invention, is a drawing that shows a specific layout of a memory cell block for realizing an equivalent circuit of the embodiment of FIG. 174. FIG. 205 shows a bit line (M2 layer), a word line (GC layer), a diffusion layer (AA layer), a cell wiring layer (M1 layer), a lower electrode (BE layer) of a ferroelectric capacitor, an upper electrode (TE layer), a D-type transistor ion injection layer (Dimp layer), an M1-M2 contact, a TE-M1 contact and a BE-M1 contact.

FIG. 206 and FIG. 207 show the layout of FIG. 205 in a separate manner for ease of understanding. FIG. 208A through FIG. 208D respectively show examples of cross sections taken along lines 208A—208A, 208B—208B, 208C—208C, and 208D—208D of the layout of FIG. 205. TE and BE are connected from the M1 layer formed thereon through TE-M1 contact and BE-M1 contact. The M1 layer is connected to the AA layer through AA-M1 contact.

As shown in FIG. 205, M2 and M1 are connected through AA-M1 contact, M1-M2 contact and the M1 layer. In FIG. 205 through FIG. 208D, the cell inner node connecting wiring M1 is formed after formation of the ferroelectric capacitor; therefore, a metal wire with a low resistance can be adopted, and this M1 wiring is also adopted as the plate wiring. In the plate driving scheme, it is necessary to form the plate wiring by a metal since the plate line having a large load capacity has to be driven. This cell structure makes it possible to easily reduce the resistance of the plate wiring, and also to shorten the plate driving time.

In particular, in the structures of FIGS. 205 through 208D, M1 may be provided as Al wiring or Cu wiring so that it is possible to shorten access time and cycle time to a great degree. The main reason for this is explained as follows: In the conventional memory cell in which a cell transistor and a ferroelectric capacitor are series-connected, plate wiring is required for each cell, and it is not advantageous to share the cell inner node connecting wiring layer and the plate wiring layer within the cell in terms of areas; however, if the plate line is constituted by a BE layer, etc. without sharing, the plate driving time becomes very long because of its high resistance. Installation of metal wiring dedicated to the plate poses a problem of increased process costs.

In the memory cell as mentioned above, the plate wiring only needs to be installed by 0.5 (shared with the adjacent one), 1 or 2 lines for each cell block. As in the plate wiring portion shown in FIG. 205 through FIG. 208D, when the M1 layer having the two plate lines PLBBL and PLBL makes a BE-M1 contact with the lower electrode (BE) for each one bit line, the equivalent circuit of FIG. 174 is easily realized. As shown in sectional views of FIG. 208A through FIG. 208D, the BE layer is connected to the adjacent cell block in the bit line direction so that the plate line can be easily shared between the adjacent cell blocks.

139th Embodiment

FIG. 209, which explains an FRAM according to the 139th embodiment of the present invention, shows a case in which, in the layer construction and the device structure of FIG. 205, the plate is not divided, that is, a specific layout of a memory cell block for realizing the equivalent circuit of FIG. 171A. This embodiment is the same as that of FIG. 205 except for the plate line and the proximity of its connecting portion, and has the same advantages.

FIG. 209 shows a bit line (M2 layer), a word line (GC layer), a diffusion layer (AA layer), a cell wiring layer (M1 layer), a lower electrode (BE layer) of a ferroelectric capacitor, an upper electrode (TE layer), a D-type transistor ion injection layer (Dimp layer), an M1-M2 contact, a TE-M1 contact and a BE-M1 contact.

FIG. 210 and FIG. 211 show the layout of FIG. 209 in a separate manner for ease of understanding. FIG. 212A and FIG. 212B respectively show examples of cross sections taken along lines 212A—212A and 212B—212B of the layout of FIG. 209. TE and BE are connected from the M1 layer formed thereon through TE-M1 contact and BE-M1 contact. The M1 layer is connected to the AA layer through AA-M1 contact.

As shown in FIG. 205, M2 and M1 are connected through AA-M1 contact, M1-M2 contact and the M1 layer. In FIG. 209 through FIG. 212B, the cell inner node connecting wiring M1 is formed after formation of the ferroelectric capacitor; therefore, a metal wire with a low resistance can be adopted, and this M1 wiring is also adopted as the plate wiring. In the plate driving scheme, it is necessary to form the plate wiring by a metal since the plate line having a large load capacity has to be driven. This cell structure makes it possible to easily reduce the resistance of the plate wiring, and also to shorten the plate driving time.

In particular, in the structures of FIG. 210 through FIG. 212D, M1 may be provided as Al wiring or Cu wiring so that it is possible to shorten access time and cycle time to a great degree. The main reason for this is explained as follows: In the conventional memory cell in which a cell transistor and a ferroelectric capacitor are series-connected, plate wiring is required for each cell, and it is not advantageous to share the cell inner node connecting wiring layer and the plate wiring layer within the cell in terms of areas; however, if the plate line is constituted by a BE layer, etc. without sharing, the plate driving time becomes very long because of its high resistance. Installation of metal wiring dedicated to the plate poses a problem of increased process costs.

In the memory cell as mentioned above, the plate wiring only needs to be installed by 0.5 (shared with the adjacent one), 1 line for each cell block. As in the plate wiring portion shown in FIG. 210 through FIG. 212B, when the M1 layer having one plate line PL makes a BE-M1 contact with the lower electrode (BE), the equivalent circuit of FIG. 174A is easily realized. As shown in sectional views of FIG. 212A through FIG. 212B, the BE layer is connected to the adjacent cell block in the bit line direction so that the plate line can be easily shared between the adjacent cell blocks.

140th Embodiment

FIG. 213, which explains an FRAM according to the 140th embodiment of the present invention, shows a case in which, in the layer construction and the device structure of FIG. 205, the plate is not divided in the same manner as FIG. 209, that is, a specific layout of a memory cell block for realizing the equivalent circuit of FIG. 171A. This embodiment also provides the same effects as those of FIG. 209. FIG. 213 shows a bit line (M2 layer), a word line (GC layer), a diffusion layer (AA layer), a cell wiring layer (M1 layer), a lower electrode (BE layer) of a ferroelectric capacitor, an upper electrode (TE layer), a D-type transistor ion injection layer (Dimp layer), an M1–M2 contact, a TE-M1 contact and a BE-M1 contact.

FIG. 214 and FIG. 215 show the layout of FIG. 213 in a separate manner for ease of understanding. Although the cell block connected to the bit line BBL is the same as that of FIG. 209, FIG. 213 is different from FIG. 209 in that, in the cell block connected to the bit line BL, the positions of the upper electrode (TE) and the lower electrode (BE) are offset from each other by one cell in the bit line direction. With respect to adjacent cell blocks, FIG. 213 provides farther distances between the lower electrodes, between the upper electrodes and between the contacts, as compared with FIG. 209; therefore, when the cell size is regulated by these factors, the construction of FIG. 213 can further minimizes the cell size.

141st Embodiment

FIG. 216, which explains an FRAM according to the 141st embodiment of the present invention, shows a specific layout for realizing an equivalent circuit of the dummy cell block of the 176th embodiment. It has the same layer construction and cell structure as those of FIG. 205. FIG. 216 shows a bit line (M2 layer), a word line (GC layer), a diffusion layer (AA layer), a cell wiring layer (M1 layer), a lower electrode (BE layer) of a ferroelectric capacitor, an upper electrode (TE layer), a D-type transistor ion injection layer (Dimp layer), an M1–M2 contact, a TE-M1 contact and a BE-M1 contact.

FIG. 217 and FIG. 218 show the layout of FIG. 216 in a separate manner for ease of understanding. In FIG. 216 through FIG. 218, the cell inner node connecting wiring M1 is formed after formation of the ferroelectric capacitor; therefore, a metal wire with a low resistance can be adopted. Since this M1 wiring is also adopted as the plate wiring for the dummy cell block, it is possible to drive the dummy cell at high speeds.

142nd Embodiment

FIG. 219, which explains an FRAM according to the 142nd embodiment of the present invention, shows a specific layout for realizing an equivalent circuit of the memory cell block of the embodiment of FIG. 175. FIG. 219 shows a bit line (M2 layer), a word line (GC layer), a diffusion layer (AA layer), a cell wiring layer (M1 layer), a lower electrode (BE layer) of a ferroelectric capacitor, an upper electrode (TE layer), a D-type transistor ion injection layer (Dimp layer), an M1–M2 contact, a TE-ML contact and a BE-M1 contact.

FIG. 220 and FIG. 221 show the layout of FIG. 219 in a separate manner for ease of understanding.

FIG. 222A through FIG. 222D respectively show examples of cross sections taken along lines 222A—222A, 222B—222B, 222C—222C, and 222D—222D of the layout of FIG. 219. TE and BE are connected from the M1 layer formed thereon through TE-M1 contact and BE-M1 contact. The M1 layer is connected to the AA layer through AA-M1 contact. As shown in FIG. 219, M2 and M1 are connected through AA-M1 contact, M1–M2 contact and the M1 layer.

In FIG. 219 through FIG. 222D, the cell inner node connecting wiring M1 is formed after formation of the ferroelectric capacitor; therefore, a metal wire with a low resistance is adopted so that high-speed plate driving is available. In FIG. 219 through FIG. 222D, the D-type iron injection mask is not required. This is because, as shown in FIG. 222A through FIG. 222D, the source and drain of the passing block select transistor are connected by the M1 wiring. Since no inversion layer capacity of the D-type transistor exists, the bit line capacity of the unselected cell block portion can be reduced. Moreover, as shown in FIG. 222A through FIG. 222D, by providing the passing block select transistor as a field transistor, the capacity can be even more reduced.

143rd Embodiment

FIG. 223A and FIG. 223B are sectional views showing the construction of a memory cell block of an FRAM according to the 143rd embodiment of the present invention. In terms of equivalent circuit, this is the same as FIG. 174. Metal wires made of Al, Cu, etc. (Metal1 in the Figures) are placed on a word line with the same pitch, and make shunts (also referred to as snaps) with the word line with predetermined intervals so that the word line delay due to a word line material with high resistance can be reduced. The metal wires used for word-line shunts, as they are, can be used as plate wires. Moreover, by connecting the upper electrodes with the adjacent cell blocks, PLBBL and PLBL can be shared between the adjacent cell blocks.

FIG. 223A and FIG. 223B show examples of the scheme of FIG. 174 wherein the plate is divided into two kinds, that is, PLBBL and PLBL. FIG. 223A and FIG. 223B are alternated for every one bit line or for every two bit lines. This makes it possible to reduce the plate driving delay without increasing process costs. The application of the scheme for fixing the plate to (½)Vdd also contributes to stability of the potential of the plate electrode.

144th Embodiment

FIG. 224A and FIG. 224B are sectional views showing the construction of a memory cell block of an FRAM according to the 144th embodiment of the present invention. In terms of equivalent circuit, this is the same as FIG. 174. FIG. 224A and FIG. 224B are different from FIG. 223A and FIG. 223B in that the formation processes of the bit line metal wiring (Metal2) and the metal wiring (Metal1) are reversed.

145th Embodiment

FIG. 225A and FIG. 225B are sectional views showing the construction of a memory cell block of an FRAM according to the 145th embodiment of the present invention. In terms of equivalent circuit, this is the same as FIG. 174. FIG. 225A and FIG. 225B are different from FIG. 223A and FIG. 223B in that a ferroelectric capacitor is formed after formation of a bit line layer and then, a metal wiring layer, which is used for both the ward line shunt and the plate wiring.

146th Embodiment

FIG. 226A and FIG. 226B are sectional views showing the construction of a memory cell block of an FRAM according to the 146th embodiment of the present invention. In terms of equivalent circuit, this is the same as FIG. 174. FIG. 226A and FIG. 226B are different from FIG. 225A and FIG. 225B in that, instead of using a word-line shunt scheme, a hierarchical word-line scheme is adopted by using a main row decoder and sub row decoder. Thus, the metal wiring (Metal1) is used as a main word line so that the pitch of the metal 1 is alleviated by two times to eight times the word-line pitch (4 times in the example of the Figures). In this case also, the Metal1 can be sharedly used as the main word line and the plate wiring.

147th Embodiment

FIG. 227A through FIG. 227C are sectional views showing the construction of a memory cell block of an FRAM according to the 147th embodiment of the present invention. This is an equivalent circuit of FIG. 171A, and an example in which a word-line shunt metal wiring (Metal1) is adopted. In this case also, Metal1 is utilized as the plate wiring.

FIG. 227B and FIG. 227C show sectional views (227B—227B, 227C—227C) in the word-line direction of FIG. 237A when it is cut at two portions (word-line portion and plate portion). The word line allows the word line layer and the Metal1 layer to contact at the shunt portion, and the plate section allows the Metal1 and the plate electrode to contact at each 1 bit line.

148th Embodiment

FIG. 228A through FIG. 228C are sectional views showing the construction of a memory cell block of an FRAM according to the 148th embodiment of the present invention. This is an equivalent circuit of FIG. 171A, and an example in which a word-line shunt metal wiring (Metal1) is adopted. These Figures are different from FIG. 227A through FIG. 227C in that a bit line layer is formed between the Metal1 and the ferroelectric capacitor. In this case also, Metal1 is utilized as the plate wiring.

FIG. 228B and FIG. 228C show sectional views (228B—228B, 228C—228C) in the word-line direction of FIG. 228A when it is cut at two portions (word-line portion and plate portion). The word line allows the word line layer and the Metal1 layer to contact at the shunt portion, and the plate section also allows the Metal1 and the plate electrode to contact at the shunt portion.

149th Embodiment

FIG. 229 and FIG. 230 are sectional views showing the construction of a memory cell block of an FRAM according to the 149th embodiment of the present invention.

FIG. 229 is an equivalent circuit of FIG. 171A, and an example in which a hierarchical word-line and a column selection line metal wiring layer (CSL) are added thereto. Of course, it is possible to achieve the plate division scheme of FIG. 174. FIG. 230 is an equivalent circuit of FIG. 171A, and an example in which a word-line shunt scheme and a column selection line metal wiring layer (CSL) are added thereto. Of course, it is possible to achieve the plate division scheme of FIG. 174.

150th Embodiment

Figure 231A:
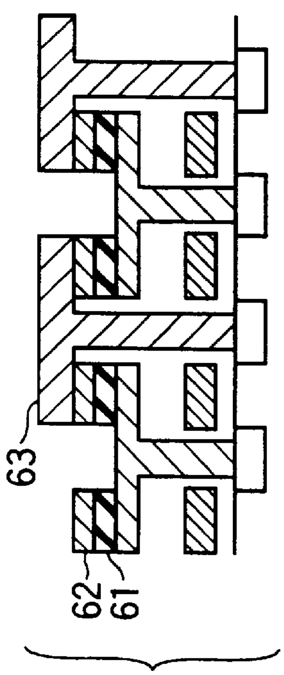
Figure 231B:
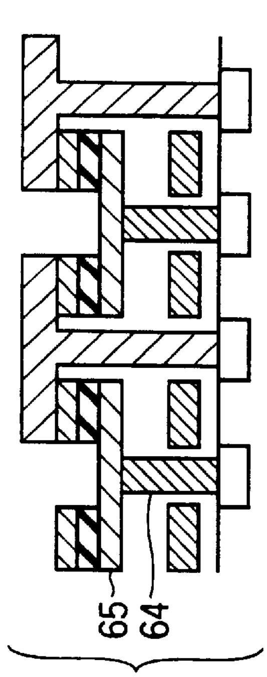
Figure 231C:
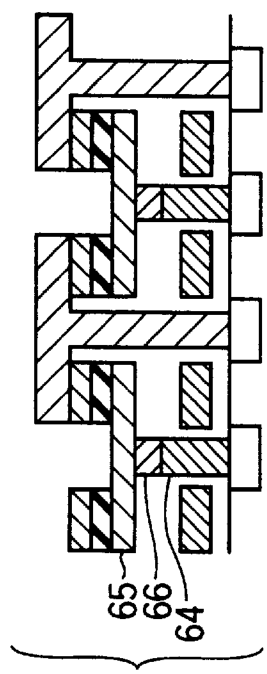
Figure 231D:
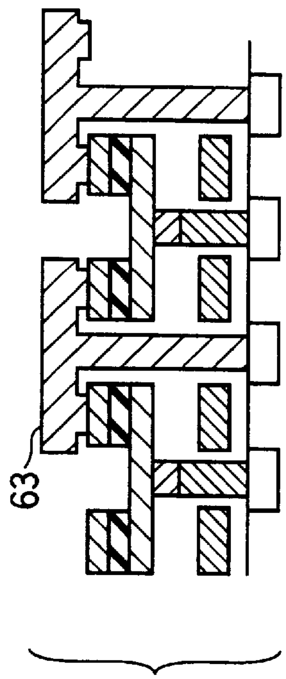
Figure 231E:
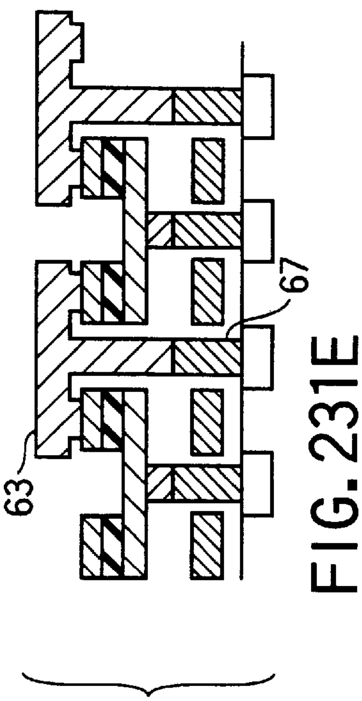
Figure 231F:
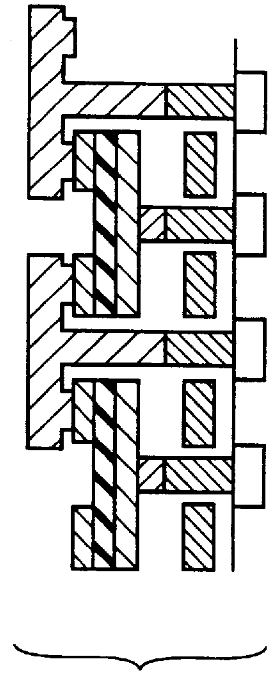

FIG. 231A though FIG. 231F are sectional views showing the cell construction of an FRAM according to the 150th embodiment of the present invention. Although examples of FIG. 223A through FIG. 230 merely show conceptual drawings of the construction and the wiring connection of a ferroelectric capacitor portion, FIG. 241A through FIG. 231F of the present embodiment show a detailed wiring construction of a ferroelectric capacitor portion that can be applied to the examples of FIG. 223A through FIG. 230 and the aforementioned embodiments.

FIG. 231A shows a case in which: an upper electrode 62 is formed on a ferroelectric film 61, and then a wiring 63 for connecting a cell transistor and the upper electrode is formed. FIG. 231B shows a case in which, in addition to the construction of FIG. 231A, a plug 64 such as an Si plug, a W plug, etc. is formed after formation of the transistor, and a lower electrode 65 is formed thereon. FIG. 231C shows a case in which, in addition to the construction of FIG. 231B, a barrier layer 66 for preventing diffusion, etc. of the ferroelectric material is formed between the plug and the lower electrode 65.

In the examples of FIG. 231A through 231C, after formation of the upper electrode 62, it is coated with an insulating film. The connection of the upper electrode 62 and the wiring 63 is made as follows: After opening a contact with a cell transistor or before opening it, the insulating film is grooved by etch bag, CMP, etc. so that the upper electrode is exposed, and the wiring 63 is formed, and then the wiring 63 and the upper electrode 62 are connected. In contrast, in the example of FIG. 231D, after formation of the insulating film, contact holes are formed in the upper electrode and the diffusion layer of the central transistor, and contact is made by the wiring 63.

In the example of FIG. 231E, after formation of the plug of FIG. 231C, a plug 67 is also formed at a connecting portion between the wiring 63 and the diffusion layer of the transistor so that the aspect ratio of the contact hole is minimized. In the example of FIG. 231F, in addition to the example of FIG. 231E, the ferroelectric capacitor film is connected between the adjacent cells. This is applied to a case in which the ratio of distance between the thickness of the ferroelectric film/the upper electrode and a case in which the anisotropy of the amount of polarization is large. FIG. 231A through FIG. 231F show examples in which various modifications are applied in succession; however, the present invention is not limited by these, and various modifications are freely combined.

151st Embodiment

FIG. 232A through FIG. 232H are sectional views that shows the construction of a memory cell block of a FRAM according to the 151st embodiment of the present invention.

Figure 232A:
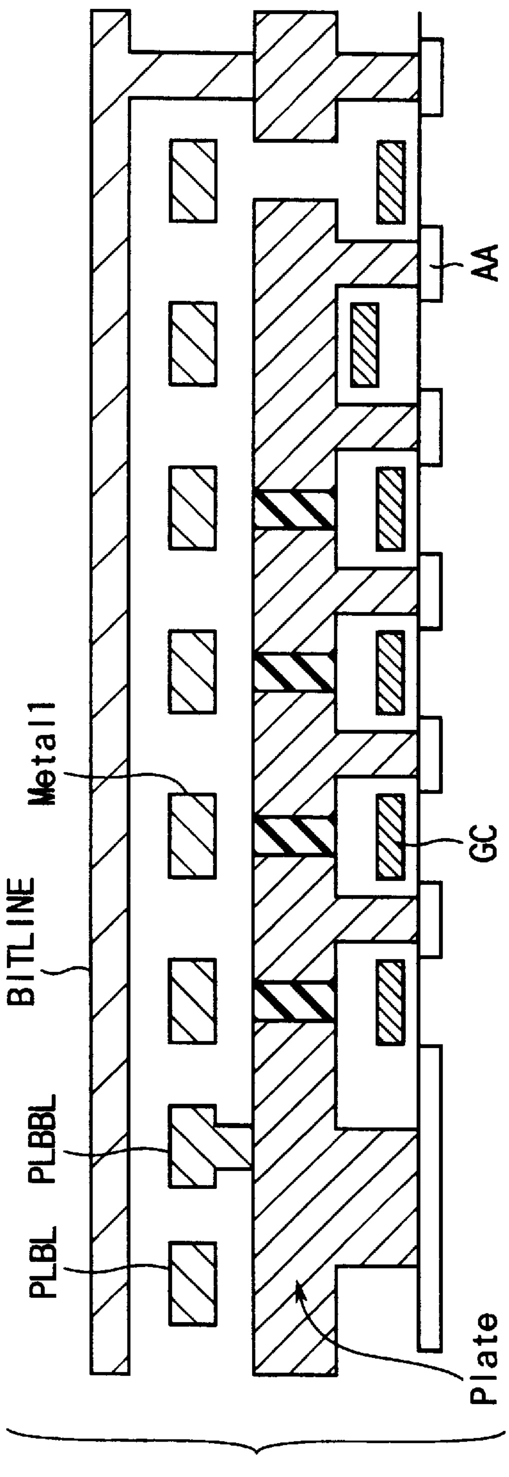
Figure 232B:
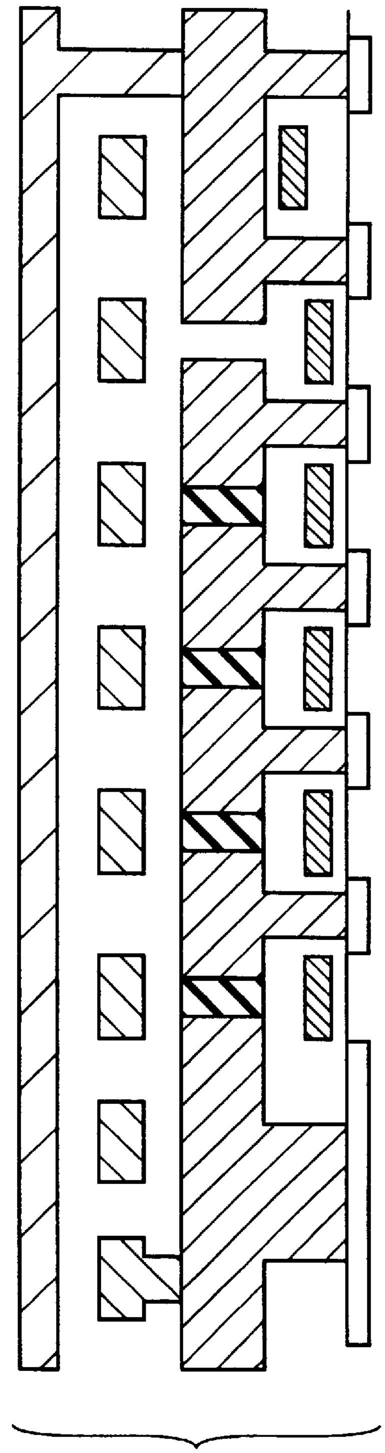
Figure 232C:
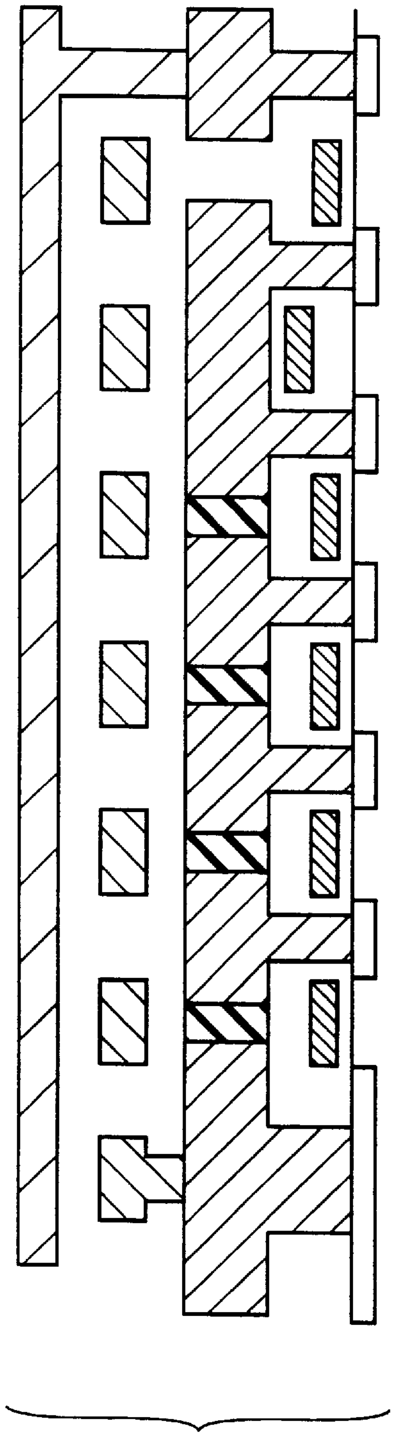
Figure 232D:
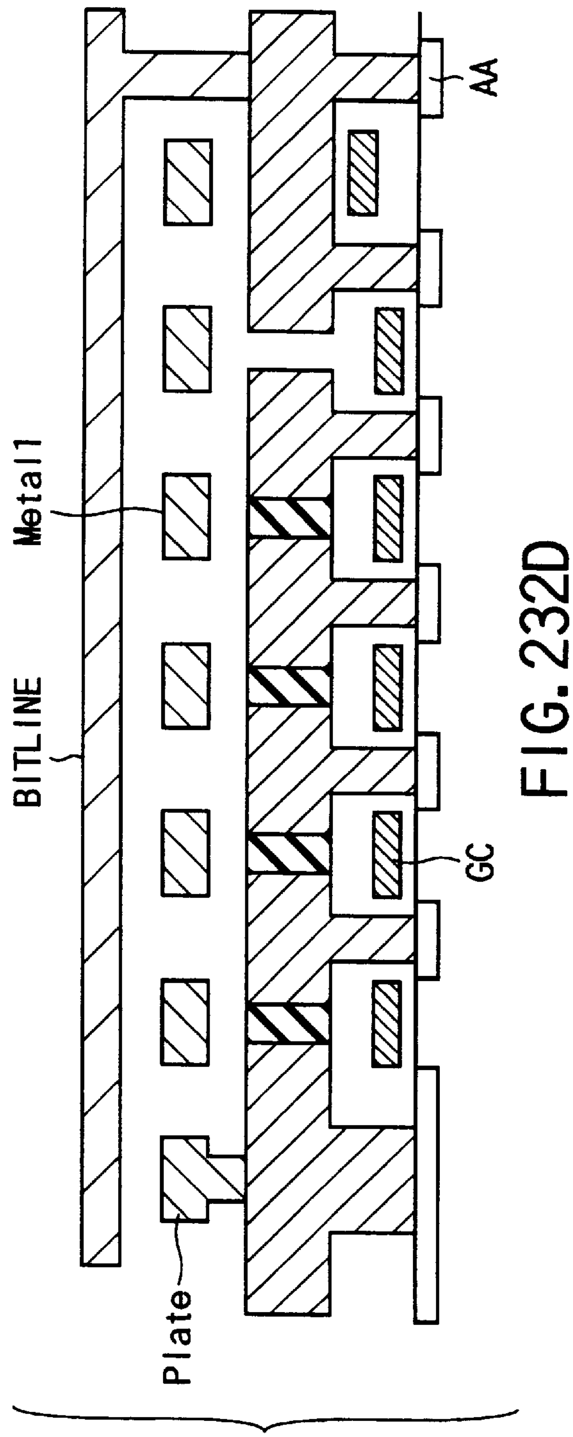

FIG. 232A and FIG. 232B, which show an equivalent circuit of FIG. 175, are examples in which adjacent cell nodes are simultaneously formed and a ferroelectric capacitor is formed between them, and metal wiring sharedly used as the word-line shut and the plate wiring is further formed. FIG. 232C and FIG. 232D, which show an equivalent circuit of FIG. 171A, are examples in which adjacent cell nodes are simultaneously formed and a ferroelectric capacitor is formed between them, and metal wiring sharedly used as the word-line shut and the plate wiring is further formed.

Figure 232E:
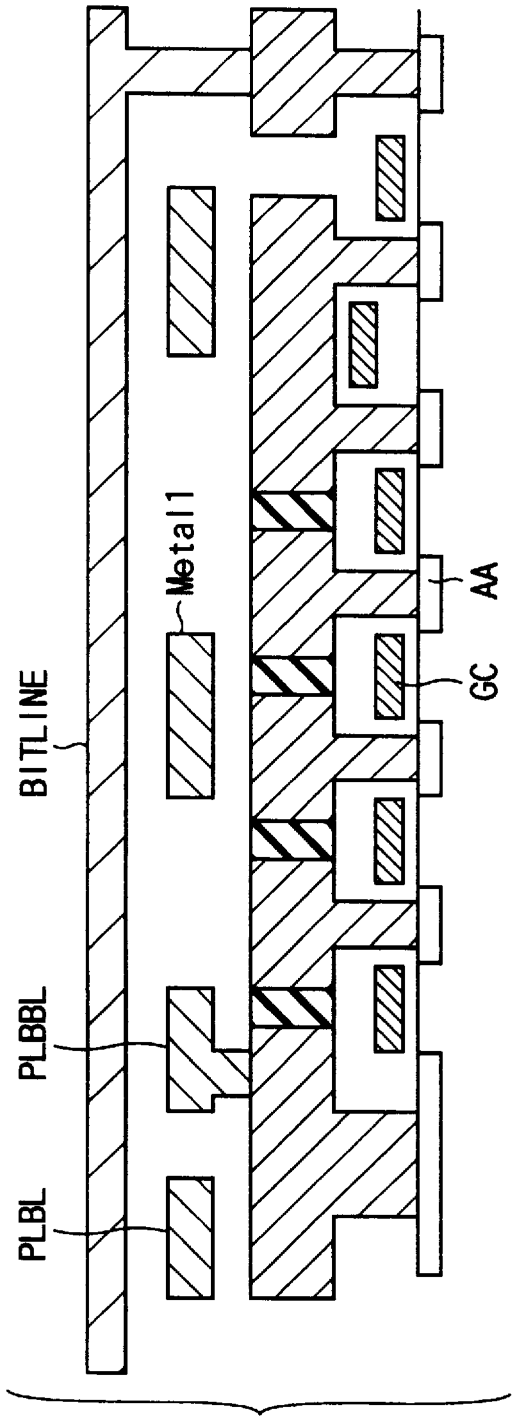
Figure 232F:
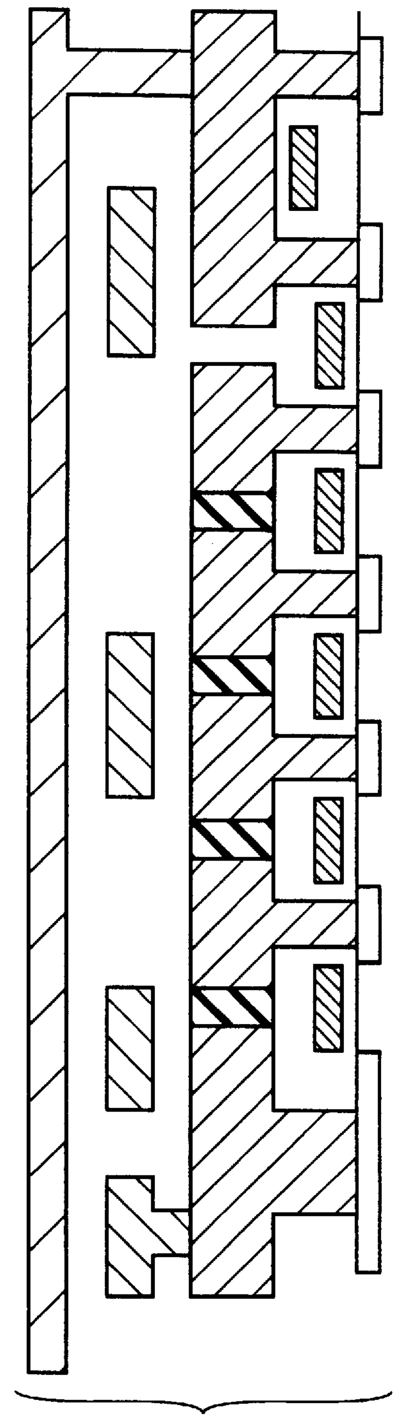
Figure 232G:
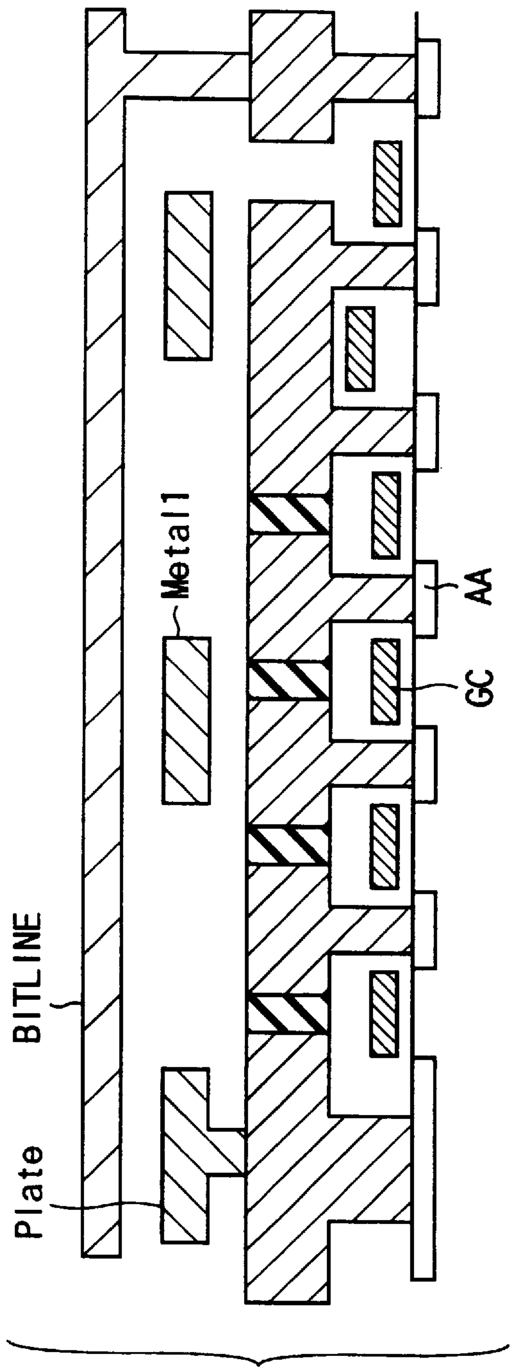
Figure 232H:
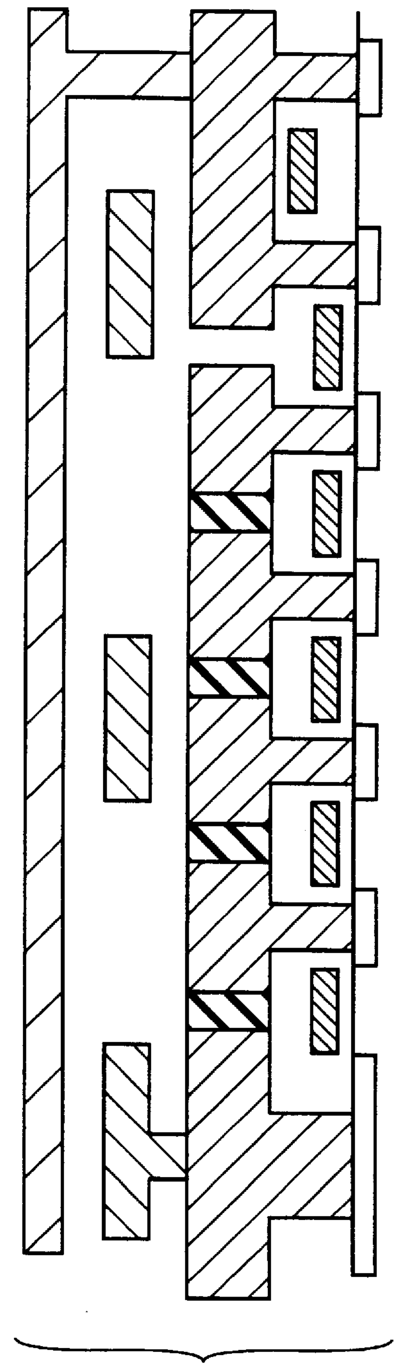

FIG. 232E and FIG. 232F, which show an equivalent circuit of FIG. 175, are examples in which adjacent cell nodes are simultaneously formed and a ferroelectric capacitor is formed between them, and metal wiring sharedly used as the main word line of the hierarchical word-line and the plate wiring is further formed. FIG. 232G and FIG. 232H, which show an equivalent circuit of FIG. 171A, are examples in which adjacent cell nodes are simultaneously formed and a ferroelectric capacitor is formed therebetween, and metal wiring sharedly used as the main word line of the hierarchical word-line and the plate wiring is further formed.

152nd Embodiment

FIG. 233, which explains an FRAM according to the 152nd embodiment of the present invention, shows a memory cell array and a block diagram of plate driving circuits. This is applied to the scheme of FIG. 174. Two of the plate driving circuits are required for one cell block, and the adjacent cell blocks sharedly use a plate line; consequently, only one plate driving circuit is required for one cell block. As compared with the conventional divided plate scheme which requires one plate driving line for one word line, this construction makes it possible to reduce the number of the plate driving circuits to a great degree, thereby reducing the chip size.

In addition to the advantage of a reduction in the plate delay achieved by a great reduction in the plate wiring resistance as shown in FIG. 205 through FIG. 232H, the present embodiment further reduces the plate driving delay. The plate delay is determined by the load capacity and the RC delay in resistance, and the load capacity is also determined by the capacity of the ferroelectric capacitor having a great capacity, rather than by the parasitic capacity inside the cell. In other words, the load capacity does not make much difference in the conventional cell, in the above mentioned embodiments having a plurality of series-connected cells, or in the cell of the present invention. This is because in the cells as mentioned above and the present invention, the unselected cell is short-circuited, and so the capacity is not observed. In contrast, the resistant component is determined by the wiring resistance of the plate line and the ON resistance of the driver transistor at the last stage of the plate line drive in the plate driving circuit.

In the present embodiment, the effect of the low resistance of the plate line wiring and the great reduction in the plate driving circuit make it possible to provide a large-size driver transistor for the plate driving circuit, and also to reduce the ON resistance to a great degree. Consequently, although C of the RC delay does not change so much, R is allowed to decrease to a great degree.

153rd Embodiment

FIG. 234, which explains an FRAM according to the 153rd embodiment of the present invention, shows a memory array, a row decoder and a plate driving circuit. This embodiment is applied to a case in which plate driving is made in the 2T/2C scheme without plate division. As compared with FIG. 233rd number of the plate driving circuits is cut to half, and they are placed at a ratio of one to two cell blocks; thus, it is possible to increase the size of the driver transistor of the plate driving circuit, and consequently to realize high speeds.

154th Embodiment

FIG. 235 is a drawing that shows the circuit structure of an FRAM according to the 154th embodiment of the present invention. This shows a case in which the memory cell transistor and the block select transistor are constructed not by the conventional nMOS, but by parallel-connected nMOS and pMOS.

In this construction, the word line and the block selection line can be operated without the need for applying a voltage not less than Vdd; therefore, this is advantageous for use in low-voltage operation and integrated memory with logical devices, etc. This example shows a scheme in which two ferroelectric capacitors enable one bit data storage, and one kind of block selection line is used. Here, /WLi and WLi and /BS and BS represent complementary signals with reversed voltages.

155th Embodiment

FIG. 236 is a drawing that shows the circuit structure of an FRAM according to the 155th embodiment of the present invention. This shows a case in which the memory cell transistor and the block select transistor are constructed not by the conventional nMOS, but by parallel-connected nMOS and pMOS.

In this construction, the word line and the block selection line can be operated without the need for applying a voltage not less than Vdd; therefore, this is advantageous for use in low-voltage operation and integrated memory with logical devices, etc. This example shows a scheme in which one ferroelectric capacitor enables one bit data storage, and two kinds of block selection lines are used. Here, /WLi and WLi and /BS and BS represent complementary signals with reversed voltages. With respect to the plate line, one kind as shown in FIG. 171A ((½)Vdd fixed plate scheme) and two kinds in a divided structure as shown in FIG. 175 (plate driving scheme) are adopted.

156th Embodiment

FIG. 237A and FIG. 237B are drawings that show the circuit structure of an FRAM according to the 156th embodiment of the present invention. This shows a case in which a small memory with the cell block having only one array in the word line direction is provided. In this case, the block select transistor can be omitted.

The present invention is not limited to the above-described embodiments, and various changes and modifications can be made within the spirit and scope of the invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device comprising:

a plurality of memory cells each having a source terminal and a drain terminal and a ferroelectric capacitor having a first terminal connected to said source terminal, wherein said plurality of memory cells are connected in series, and one or more selected transistors connected to at least one terminal of said series connected memory cells to constitute a memory cell block, said memory cell block having one terminal connected to a bitline and another terminal connected to a plate electrode, and wherein two memory cell blocks, which are respectively connected to two bit lines forming a bit line pair and also connected to the same word line, are respectively connected to a first plate electrode and a second plate electrode.

2. A semiconductor memory device according to claim 1, wherein a gate electrode of said transistor is connected to said word lines, and a predetermined number of said memory cell blocks are arranged in a word-line direction to constitute a cell block unit; said first plate electrode and second plate electrode are connected to said memory cell blocks of said cell block unit alternately for every one or for every two memory cell blocks.

3. A semiconductor memory device according to claim 2, wherein said first and second plate electrodes are respectively connected to two memory cell blocks which are connected to the same bit line.

4. A semiconductor memory device comprising:

a plurality of memory cells each having a source terminal and a drain terminal and a ferroelectric capacitor having a first terminal connected to said source terminal, wherein said plurality of memory cells are connected in series, and one or more selected transistors connected to at least one terminal of said series connected memory cells to constitute a memory cell block, said memory cell block having one terminal connected to a bitline and another terminal connected to a plate electrode, and wherein a wiring of said plate electrode is formed by the same metal wiring layer such as Al and Cu that constitutes a wiring for connecting said cell transistor and said ferroelectric capacitor of said memory cell.

5. A semiconductor device comprising:

a plurality of memory cells each having a source terminal and a drain terminal and a ferroelectric capacitor having a first terminal connected to said source terminal and a second terminal connected to said drain terminal, and a gate electrode of said cell transistor connected to a word line, wherein said plurality of memory cells are connected in series, and one or more selected transistors connected to at least one terminal of said series connected memory cells to constitute a memory cell block, said memory cell block having one terminal connected to a bitline and another terminal connected to a plate electrode, and wherein a metal wiring layer connected with said plate electrode via a contact hole is the same layer as metal wiring layer connected with said word line via a contact hole with predetermined interval.

6. A semiconductor memory device comprising:

a plurality of memory cells each having a source terminal and a drain terminal and a ferroelectric capacitor having a first terminal connected to said source terminal, wherein said plurality of memory cells are connected in series, and one or more selected transistors connected to at least one terminal of said series connected memory cells to constitute a memory cell block, said memory cell block having one terminal connected to a bitline and another terminal connected to a plate electrode, and wherein a driving circuit for driving said plate electrode is placed in a bit line direction for every one or for every two memory cell blocks.

7. A semiconductor memory device comprising:

a plurality of memory cells each having a first transistor having a first source terminal and a first drain terminal and a ferroelectric capacitor having a first terminal connected to said first source terminal and a second terminal connected to said first drain terminal, wherein said plurality of memory cells are connected in series; and a dummy cell having a second transistor having a second source terminal and a second drain terminal and a ferroelectric capacitor or paraelectric capacitor having a third terminal connected to said second source terminal and a fourth terminal connected to said second drain terminal.

8. A semiconductor memory device, comprising:

a plurality of memory cells;

each of said plurality of memory cells, including, a source terminal, a drain terminal, and a ferroelectric capacitor having a first terminal connected to said source terminal, wherein said plurality of memory cells are connected in series, one or more selected transistors are connected to at least one terminal of said series connected memory cells to constitute a memory cell block, said memory cell block has one terminal connected to a bitline and another terminal connected to a plate electrode, a voltage of said plate electrode is Vss, and a voltage of said bitline is one of Vdd and a high logic level of said bitline at a standby state after power is supplied to said semiconductor memory device.

9. The semiconductor memory device according to claim 8, wherein, in one cycle of operation, a voltage of said plate electrode rises from one of said Vss to said Vdd and said high logic level of said bitline once and thereafter said voltage of said plate line falls to Vss.

10. A semiconductor memory device, comprising:

a plurality of memory cells;

each of said plurality of memory cells, including, a source terminal, a drain terminal, and a ferroelectric capacitor having a first terminal connected to said source terminal, wherein said plurality of memory cells are connected in series, one or more selected transistors are connected to at least one terminal of said series connected memory cells to constitute a memory cell block, said memory cell block has one terminal connected to a bitline and another terminal connected to a plate electrode, a voltage of said plate electrode is one of Vdd and a high logic level of said bitline, and a voltage of said bitline is Vss at a standby state after power is supplied to said semiconductor memory device.

11. The semiconductor memory device according to claim 7, wherein, in one cycle of operation, a voltage of said plate electrode falls from one of Vdd and a high logic level of said bitline to Vss only once and thereafter rises to one of said Vdd and said high logic level of said bitline.

12. A semiconductor memory device, comprising:

a plurality of memory cells;

each of said plurality of memory cells, including, a source terminal, a drain terminal, a ferroelectric capacitor, and a first terminal, wherein said first terminal is connected to said source terminal, said plurality of memory cells are connected in series, one or more selected transistors are connected to at least one terminal of said series connected memory cells to constitute memory cell blocks, and said memory cell blocks have one terminal connected to a bitline and another terminal connected to a plate electrode and are arranged to constitute a memory cell array; and further comprising a write buffer to write data to said memory cell array from an external device, wherein said write buffer comprises a first write transistor having small size and a second write transistor having large size, and a start or driving of said second write transistor delays a start or driving said first write transistor.

13. A semiconductor memory device, comprising:

a plurality of memory cells;

each of said plurality of memory cells, including, an nMOS transistor, a pMOS transistor, and a ferroelectric capacitor; and one or more selected transistors, each of which comprises an nMOS transistor and a pMOS transistor connected in parallel, connected in series, wherein said nMOS transistor, said pMOS transistor and said ferroelectric capacitor of each of said plurality of memory cells are connected in parallel, said plurality of memory cells are connected in series, said one or more selected transistors are connected to at least one terminal of said series connected memory cells to constitute a memory cell block, and said memory cell block has one terminal connected to a bitline and another terminal connected to a plate electrode.

14. A semiconductor memory device, comprising:

a plurality of memory cells;

each of said plurality of memory cells, including, a transistor having a source terminal and a drain terminal, and a ferroelectric capacitor having a first terminal connected to said source terminal, wherein said plurality of memory cells are connected in series, said ferroelectric capacitor comprises a ferroelectric film sandwiched between an upper electrode and a lower electrode, a position of a contact, which connects said upper electrode with one of said source and drain terminals of said transistor one of directly and through a wiring layer, is arranged so as to be shifted in a bitline direction by one memory cell size, when said contact is arranged between adjacent memory cell blocks along a wordline direction.

15. A semiconductor memory device, comprising:

a plurality of memory cells;

each memory cell, including, a source terminal, a drain terminal, and a ferroelectric capacitor having a first terminal connected to said source terminal, wherein said plurality of memory cells are connected in series, each of said plurality of memory cells has a shape such that each channel direction thereof is arranged in a same direction, and said plurality of memory cells are arranged so as to be shifted in a bitline direction by one pitch of a wordline, when a memory cell is arranged between adjacent memory cell blocks along wordline a direction.

* * * * *